US012052916B2

(12) United States Patent
Kang et al.

(10) Patent No.: US 12,052,916 B2
(45) Date of Patent: Jul. 30, 2024

(54) ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING APPARATUS

(71) Applicant: Samsung Electronics Co., Ltd., Suwon-si (KR)

(72) Inventors: Byungjoon Kang, Suwon-si (KR); Seungyeon Kwak, Suwon-si (KR); Kum Hee Lee, Suwon-si (KR); Aram Jeon, Suwon-si (KR); Kyuyoung Hwang, Suwon-si (KR); Banglin Lee, Suwon-si (KR); Shingo Ishihara, Suwon-si (KR); Yuri Cho, Suwon-si (KR); Byoungki Choi, Suwon-si (KR); Seokhwan Hong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 239 days.

(21) Appl. No.: 17/036,769

(22) Filed: Sep. 29, 2020

(65) Prior Publication Data

US 2022/0131085 A1 Apr. 28, 2022

(30) Foreign Application Priority Data

Jan. 20, 2020 (KR) ........................ 10-2020-0007377

(51) Int. Cl.
*H01L 51/00* (2006.01)
*C07F 15/00* (2006.01)
(Continued)

(52) U.S. Cl.
CPC ....... *H10K 85/656* (2023.02); *C07F 15/0033* (2013.01); *C09K 11/06* (2013.01);
(Continued)

(58) Field of Classification Search
CPC ............. H01L 51/0085; H01L 51/0069; C07F 15/0033; C09K 2211/185; C09K 2211/1022; H10K 85/342; H10K 85/656
See application file for complete search history.

(56) References Cited

U.S. PATENT DOCUMENTS

| | | | |
|---|---|---|---|
| 6,687,266 | B1 | 2/2004 | Ma et al. |
| 10,211,413 | B2 | 2/2019 | Ma et al. |

(Continued)

FOREIGN PATENT DOCUMENTS

| | | | |
|---|---|---|---|
| CN | 101200478 | A | 6/2008 |
| CN | 105294772 | A | 2/2016 |
| JP | 2003252888 | A | 9/2003 |

OTHER PUBLICATIONS

EP Search Report mailed May 10, 2021 of EP Patent Application No. 21151992.1.

(Continued)

*Primary Examiner* — Alexander C Kollias
(74) *Attorney, Agent, or Firm* — CANTOR COLBURN LLP

(57) ABSTRACT

An organometallic compound represented by Formula 1:

$$M(L_1)_{n1}(L_2)_{n2} \quad \text{Formula 1}$$

wherein, in Formula 1, M, $L_1$, $L_2$, n1, and n2 may be understood by referring to the descriptions of M, $L_1$, $L_2$, n1, and n2 respectively as disclosed herein.

13 Claims, 1 Drawing Sheet

(51) Int. Cl.

| | |
|---|---|
| ***C09K 11/06*** | (2006.01) |
| ***H10K 85/60*** | (2023.01) |
| *H10K 50/15* | (2023.01) |
| *H10K 50/16* | (2023.01) |
| *H10K 50/17* | (2023.01) |
| *H10K 50/18* | (2023.01) |

(52) U.S. Cl.
CPC ........ *C09K 2211/185* (2013.01); *H10K 50/15* (2023.02); *H10K 50/167* (2023.02); *H10K 50/171* (2023.02); *H10K 50/18* (2023.02)

(56) References Cited

U.S. PATENT DOCUMENTS

| | | | | |
|---|---|---|---|---|
| 2013/0338362 | A1 | 12/2013 | Oshiyama et al. | |
| 2015/0214494 | A1 | 7/2015 | Xia et al. | |
| 2017/0237018 | A1* | 8/2017 | Lu | H01L 51/0085 257/40 |
| 2020/0099000 | A1* | 3/2020 | Zhang | C07F 15/0033 |

OTHER PUBLICATIONS

Li Wanga et al., "Color tuning from red to green of bis-cyclometalated iridium(III)emitters based on benzoimidazole ligands in OLEDs: A DFT andTD-DFT investigation," Synthetic Metals, 2014, pp. 160-169, vol. 194.

Wei-Sheng Huang et al., "Highly Phosphorescent Bis-Cyclometalated Iridium Complexes Containing Benzoimidazole-Based Ligands," Chem. Mater., 2004, pp. 2480-2488, vol. 16.

* cited by examiner

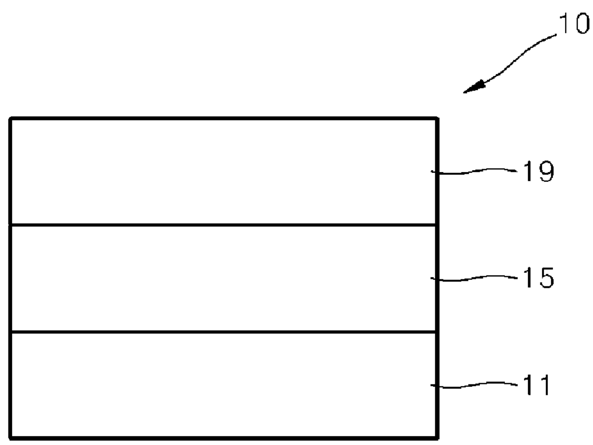
10
19
15
11

ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING APPARATUS

CROSS-REFERENCE TO RELATED APPLICATION

This application claims the benefit of and priority to Korean Patent Application No. 10-2020-0007377, filed on Jan. 20, 2020, in the Korean Intellectual Property Office, and all the benefits accruing therefrom under 35 U.S.C. § 119, the entire content of which is incorporated herein by reference.

BACKGROUND

1. Field

One or more embodiments of the present disclosure relate to an organometallic compound, an organic light-emitting device including the organometallic compound, and an electronic apparatus including the organic light-emitting device.

2. Description of Related Art

Organic light-emitting devices (OLEDs) are self-emission devices which produce full-color images. In addition, OLEDs have wide viewing angles and exhibit excellent driving voltage and response speed characteristics.

OLEDs include an anode, a cathode, and an organic layer disposed between the anode and the cathode and including an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

SUMMARY

Provided are a novel organometallic compound, an organic light-emitting device including the organometallic compound, and an electronic apparatus including the organic light-emitting device.

Additional aspects will be set forth in part in the description which follows and, in part, will be apparent from the description, or may be learned by practice of the presented embodiments of the disclosure.

According to an aspect of an embodiment, an organometallic compound may be represented by Formula 1:

$$M(L_1)_{n1}(L_2)_{n2} \quad \text{Formula 1}$$

wherein, in Formula 1,

M may be a transition metal, $L_1$ may be a ligand represented by Formula 2, n1 may be 1, 2, or 3, and when n1 is 2 or greater, at least two $L_1$ groups may be identical to or different from each other, $L_2$ may be a monodentate ligand, a bidentate ligand, a tridentate ligand, or a tetradentate ligand, n2 may be 0, 1, 2, 3, or 4, and when n2 is 2 or greater, at least two $L_2$ groups may be identical to or different from each other, $L_1$ may be different from $L_2$, Formula 2

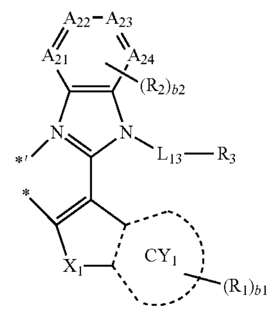

wherein, in Formula 2, $A_{21}$ to $A_{24}$ may each independently be N or C, $X_1$ may be O or S, $L_{13}$ may be a single bond, a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, ring $CY_1$ may be a $C_5$-$C_{30}$ carbocyclic group or a $C_1$-$C_{30}$ heterocyclic group, $R_1$ to $R_3$ may each independently be hydrogen, deuterium, —F, —C, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q)$, —$P(=O)(Q_8)(Q_9)$, or —$P(Q)(Q_9)$, b1 may be an integer from 0 to 20, b2 may be an integer from 0 to 4, at least two groups from a plurality of $R_1$ groups may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two groups from a plurality of $R_2$ groups may optionally be bonded together to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_1$ and $R_2$ may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ may be understood by referring to the description of $R_1$ provided herein,

* and *' each indicate a bonding site to M in Formula 1, and substituents of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{60}$ heterocycloalkyl group, the substituted $C_3$-$C_{10}$ cycloalkenyl group, the substituted $C_1$-$C_{60}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may each independently be:

deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or a combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group, a $C_1$-$C_{60}$ heteroaryl group; a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group; or a monovalent non-aromatic condensed heteropolycyclic group.

According to an aspect of another embodiment, an organic light-emitting device may include: a first electrode; a second electrode; and an organic layer disposed between the first electrode and the second electrode and including an emission layer, wherein the organic layer may include at least one organometallic compound represented by Formula 1.

The organometallic compound may be included in the emission layer, and the organometallic compound included in the emission layer may serve as a dopant.

According to an aspect of another embodiment, an electronic apparatus may include the organic light-emitting device.

BRIEF DESCRIPTION OF THE DRAWINGS

The above and other aspects, features, and advantages of certain embodiments of the disclosure will be more apparent from the following description taken in conjunction with the FIGURE, which is a schematic cross-sectional view of an organic light-emitting device according to one or more exemplary embodiments.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to a cross section illustration that is a schematic illustration of one or more idealized embodiments. As such, variations from the shapes of the illustration as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figure are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 30%, 20%, 10%, or 5% of the stated value.

An aspect of the present disclosure provides an organometallic compound represented by Formula 1:

$$M(L_1)_{n1}(L_2)_{n2} \quad \text{Formula 1}$$

wherein, in Formula 1, M may be a transition metal.

In some embodiments, M may be a first-row transition metal, a second-row transition metal, or a third-row transition metal of periodic table of elements.

In some embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In an embodiment, M may be Ir, Pt, Os, or Rh.

In Formula 1, $L_1$ may be a ligand represented by Formula 2:

Formula 2

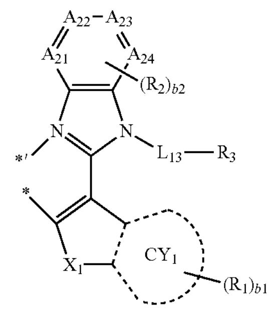

Formula 2 may be understood by referring to the description thereof provided herein.

In Formula 1, n1 indicates the number of $L_1$ groups, and n1 may be 1, 2, or 3. When n1 is 2 or greater, at least two $L_1$ groups may be identical to or different from each other. In some embodiments, n1 may be 1 or 2.

$L_2$ in Formula 1 may be any suitable organic ligand. In some embodiments, $L_2$ may be a monodentate ligand, a bidentate ligand, a tridentate ligand, or a tetradentate ligand. $L_2$ may be understood by referring to the description of $L_2$ provided herein.

In Formula 2, n2 indicates the number of $L_2$ groups, and n2 may be 0, 1, 2, 3, or 4. When n2 is 2 or greater, at least two $L_2$ groups may be identical to different from each other. In some embodiments, n2 may be 1 or 2.

In Formula 1, $L_1$ and $L_2$ may be different from each other.

In an embodiment, in Formula 1, M may be Ir or Os, and the sum of n1 and n2 may be 3 or 4, or M may be Pt, and the sum of n1 and n2 may be 2.

In one or more embodiments, in Formula 1, M may be Ir, n1 and n2 may each independently be 1 or 2, and the sum of n1 and n2 may be 3.

In one or more embodiments, in Formula 1, M may be Ir, n1 may be 3, and n2 may be 0. In this embodiment, three $L_1$ groups may be identical to one another.

In Formula 2, $A_{21}$ to $A_{24}$ may each independently be N or C. In some embodiments, $A_{21}$ to $A_{24}$ may each be C.

In Formula 2, $X_1$ may be O or S.

In Formula 2, $L_{13}$ may be a single bond, a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

In some embodiments, $L_{13}$ in Formula 2 may be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each independently unsubstituted or substituted with at least one $R_{10a}$.

In an embodiment, $L_{13}$ in Formula 2 may be:

a single bond; or a benzene group, a naphthalene group, a pyridine group, a dibenzofuran group, a dibenzothiophene group, or a carbazole group, each unsubstituted or substituted with at least one $R_{10a}$.

In Formula 2, ring $CY_1$ may be a $C_5$-$C_{30}$ carbocyclic group or a $C_1$-$C_{30}$ heterocyclic group.

In some embodiments, in Formula 2, ring $CY_1$ may be i) a first ring, ii) a second ring, iii) a condensed ring in which at least two first rings are condensed with each other, iv) a condensed ring in which at least two second rings are condensed with each other, or v) a condensed ring in which at least one first ring and at least one second ring are condensed with each other, wherein the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an iso-thiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

In an embodiment, in Formula 2, ring $CY_1$ may be i) the first ring or ii) the second ring.

In one or more embodiments, in Formula 2, ring $CY_1$ may be a condensed ring in which at least two rings are condensed with each other.

In some embodiments, in Formula 2, ring $CY_1$ may be iii) a condensed ring in which at least two first rings are condensed with each other, iv) a condensed ring in which at least two second rings are condensed with each other, or v) a condensed ring in which at least one first ring and at least one second ring are condensed with each other.

In some embodiments, in Formula 2, ring $CY_1$ may be a cyclopentane group, a cyclohexane group, a cycloheptane group, a cyclopentene group, a cyclohexene group, a cycloheptene group, an adamantane group, a norbornane group, a norbornene group, a bicyclo[1.1.1]pentane group, a bicyclo[2.1.1]hexane group, a bicyclo[2.2.2]octane group, a benzene group, a naphthalene group, an anthracene group, a phenanthrene group, a triphenylene group, a pyrene group, a chrysene group, a 1,2,3,4-tetrahydronaphthalene group, a pyrrole group, borole group, a phosphole group, a cyclopentadiene group, a silole group, a germole group, a thiophene group, a selenophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a benzoquinoline group, a benzoisoquinoline group, a quinoxaline group, a quinazoline group, a phenanthroline group, a pyrazole group, an imidazole group, a triazole group, an azaborole group, an azaphosphole group, an azacyclopentadiene group, an azasilole group, an azagermole group, an azaselenophene group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In one or more embodiments, in Formula 2, ring $CY_1$ may be a benzene group, a naphthalene group, an anthracene group, a phenanthrene group, a triphenylene group, a pyrene group, a chrysene group, a pyridine group, a pyrimidine group, a pyrazine group, a pyridazine group, a quinoline group, an isoquinoline group, a benzoquinoline group, a benzoisoquinoline group, a quinoxaline group, a quinazoline group, or a phenanthroline group.

In Formula 2, $R_1$ to $R_3$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group (e.g., a substituted or unsubstituted $C_2$-$C_{10}$ heterocycloalkenyl group), a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$). $Q_1$ to $Q_9$ may respectively be understood by referring to the descriptions of $Q_1$ to $Q_9$ provided herein.

In some embodiments, in Formula 2, $R_1$ to $R_3$ may each independently be: hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkenyl group, a $C_1$-$C_{20}$ alkoxy group, or a $C_1$-$C_{20}$ alkylthio group; a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), wherein $Q_1$ to $Q_9$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{60}$ alkyl group, a phenyl group, or a combination thereof.

In some embodiments, in Formula 2, $R_1$ to $R_3$ may each independently be hydrogen, deuterium, —F, —$CH_3$, —$CD_3$, —$CD_2H$, —$CDH_2$, —$CF_3$, —$CF_2H$, —$CFH_2$, a $C_1$-$C_{10}$ alkyl group, a $C_2$-$C_{10}$ alkenyl group, a $C_1$-$C_{60}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-236, a group represented by one of Formulae 9-201 to 9-236 in which at least one hydrogen is substituted with deuterium, a group represented by one of Formulae 9-201 to 9-236 in which at least one hydrogen is substituted with —F, a group represented by one of Formulae 10-1 to 10-130, a group represented by one of Formulae 10-1 to 10-130 in which at least one hydrogen is substituted with deuterium, a group represented by one of Formulae 10-1 to 10-130 in which at least one hydrogen is substituted with —F, a group represented by one of Formulae 10-201 to 10-358, a group represented by one of Formulae 10-201 to 10-358 in which at least one hydrogen is substituted with deuterium, a group represented by one of Formulae 10-201 to 10-358 in which at least one hydrogen is substituted with —F, —Si($Q_3$)($Q_4$)($Q_5$), or —Ge($Q_3$)($Q_4$)($Q_5$), wherein $Q_3$ to $Q_5$ may respectively be understood by referring to the descriptions of $Q_3$ to $Q_5$ provided herein:

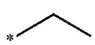
9-1

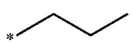
9-2

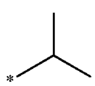
9-3

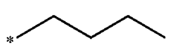
9-4

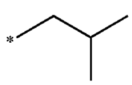
9-5

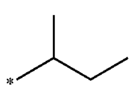
9-6

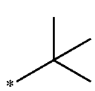
9-7

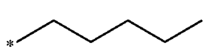
9-8

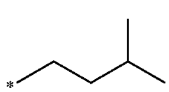
9-9

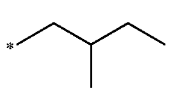
9-10

-continued

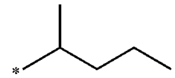
9-11

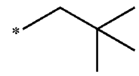
9-12

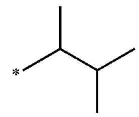
9-13

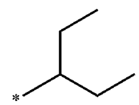
9-14

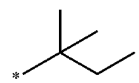
9-15

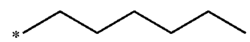
9-16

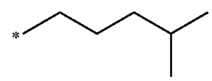
9-17

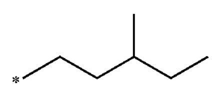
9-18

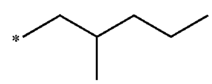
9-19

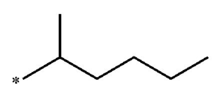
9-20

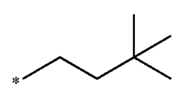
9-21

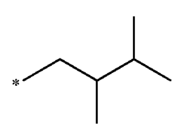
9-22

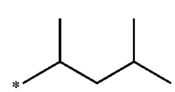
9-23

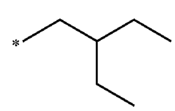
9-24

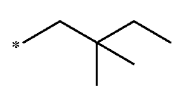
9-25

-continued
9-26
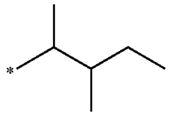
9-27
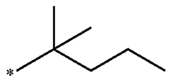
9-28
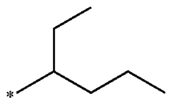
9-29
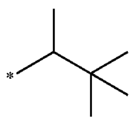
9-30
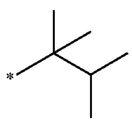
9-31
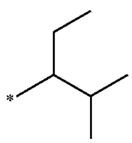
9-32
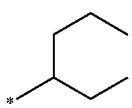
9-33
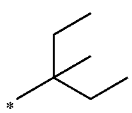
9-34
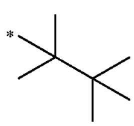
9-35
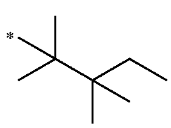
9-36
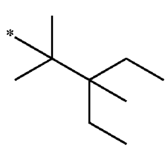
9-37
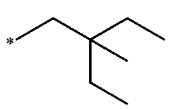
-continued
9-38
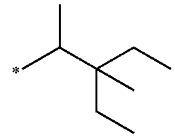
9-39
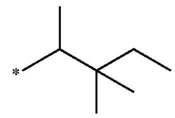
9-201
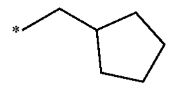
9-202
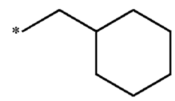
9-203
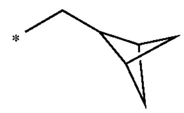
9-204
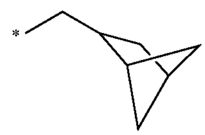
9-205
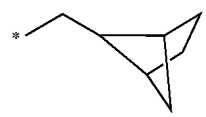
9-206
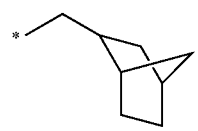
9-207
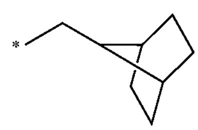
9-208
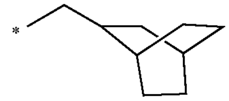
9-209
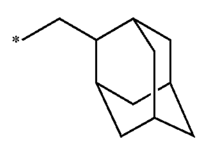
9-210
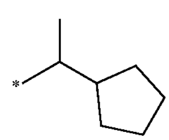

-continued
9-211
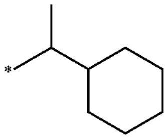
9-212
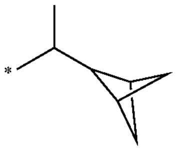
9-213
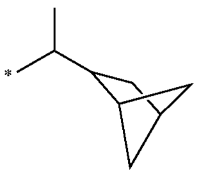
9-214
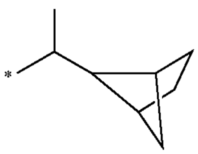
9-215
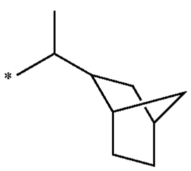
9-216
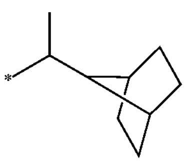
9-217
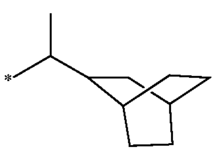
9-218
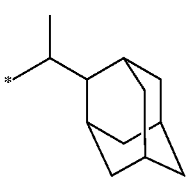
9-219
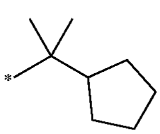
9-220
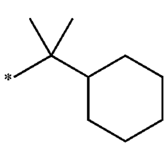
-continued
9-221
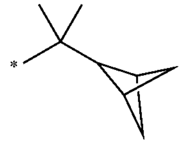
9-222
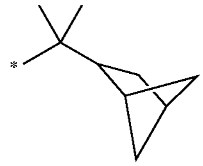
9-223
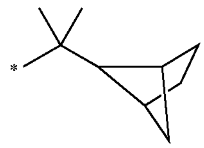
9-224
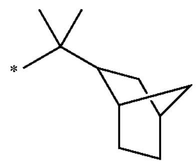
9-225
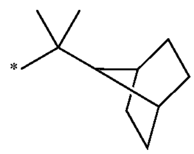
9-226
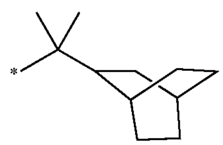
9-227
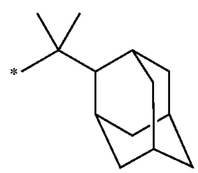
9-228
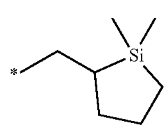
9-229
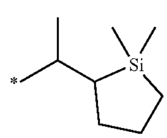
9-230
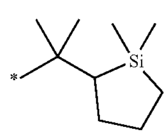

-continued
9-231
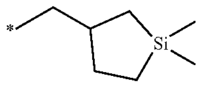
9-232
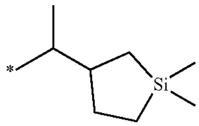
9-233
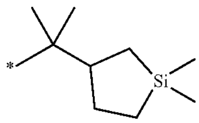
9-234
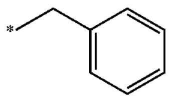
9-235
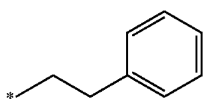
9-236
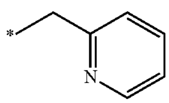
10-1
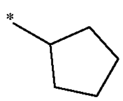
10-2
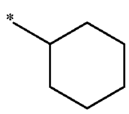
10-3
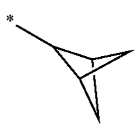
10-4
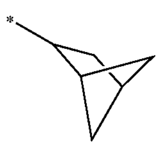
10-5
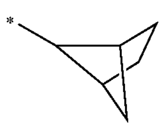
10-6
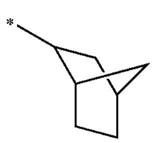
-continued
10-7
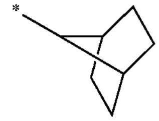
10-8
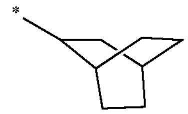
10-9
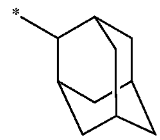
10-10
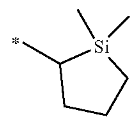
10-11
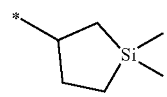
10-12
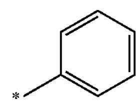
10-13
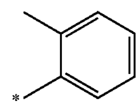
10-14
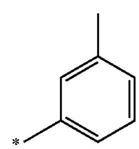
10-15
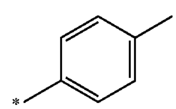
10-16
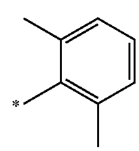
10-17
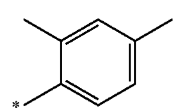
10-18
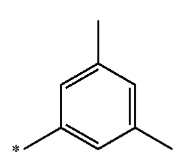

-continued
10-19
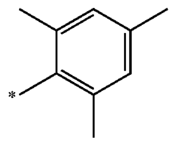
10-20
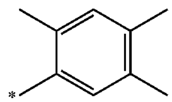
10-21
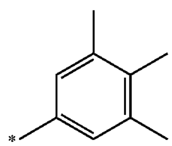
10-22
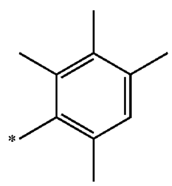
10-23
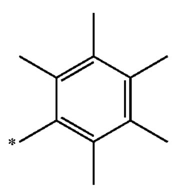
10-24
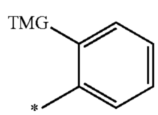
10-25
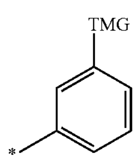
10-26
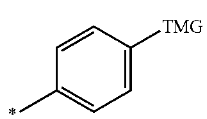
10-27
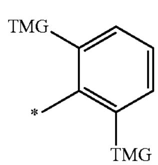
10-28
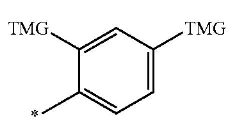
-continued
10-29
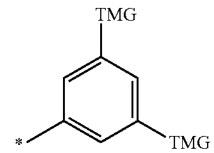
10-30
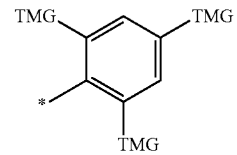
10-31
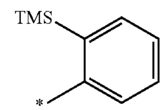
10-32
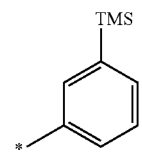
10-33
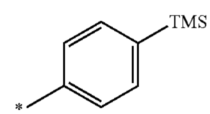
10-34
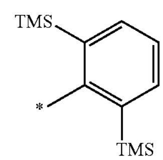
10-35
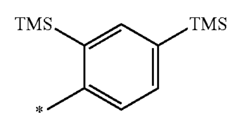
10-36
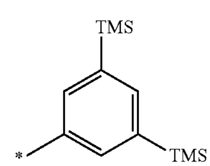
10-37
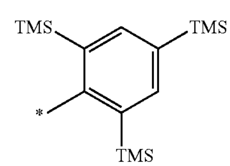
10-38
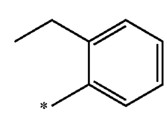

-continued
10-39
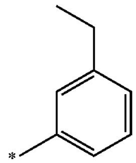
10-40
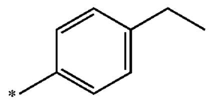
10-41
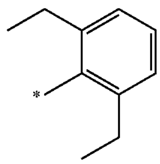
10-42
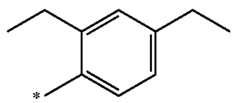
10-43
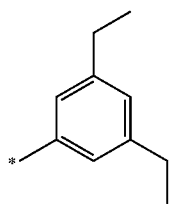
10-44
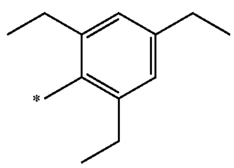
10-45
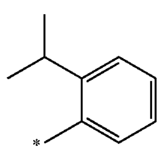
10-46
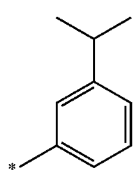
10-47
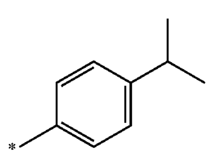
-continued
10-48
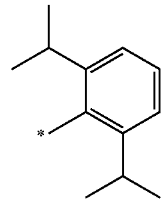
10-49
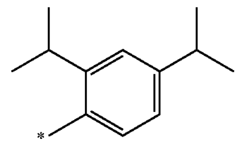
10-50
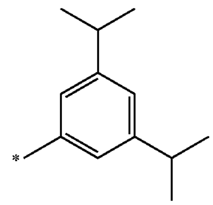
10-51
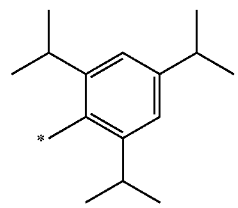
10-52
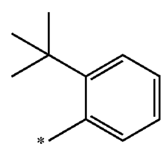
10-53
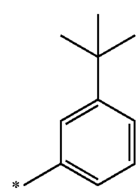
10-54
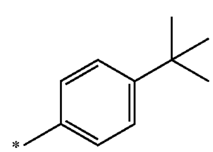
10-55
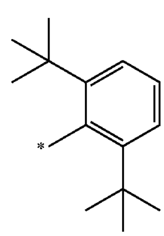

10-56
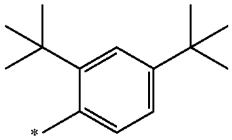
10-57
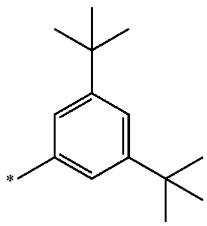
10-58
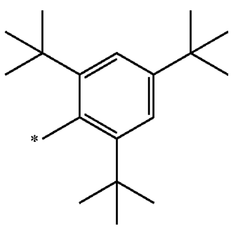
10-59
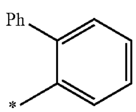
10-60
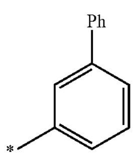
10-61
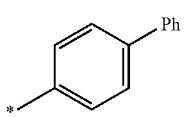
10-62
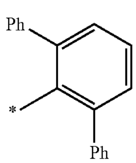
10-63
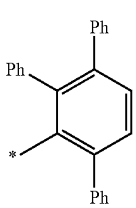
10-64
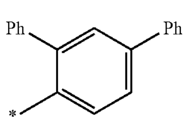
10-65
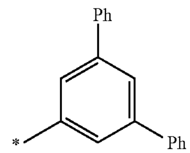
10-66
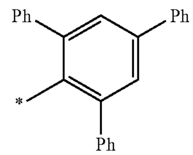
10-67
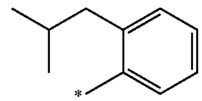
10-68
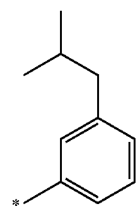
10-69
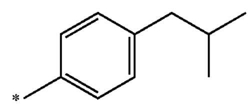
10-70
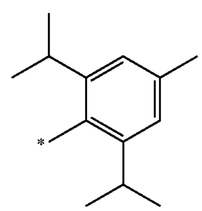
10-71
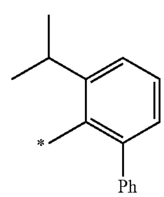
10-72
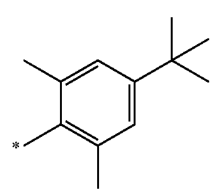
10-73
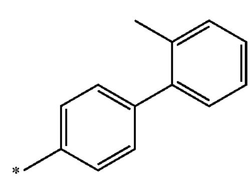

-continued
10-74
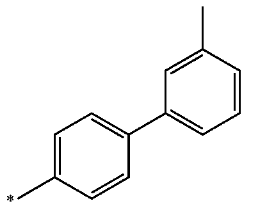
10-75
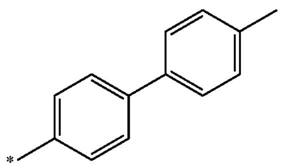
10-76
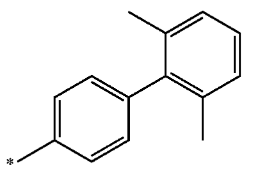
10-77
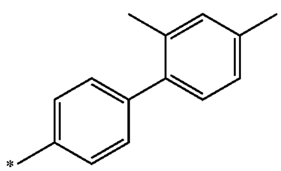
10-78
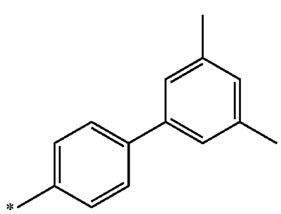
10-79
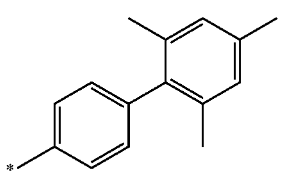
10-80
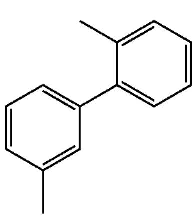
-continued
10-81
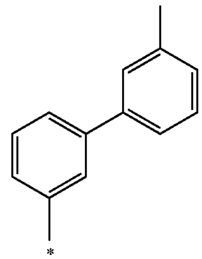
10-82
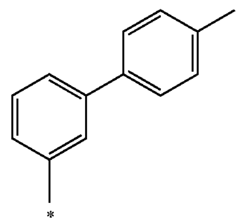
10-83
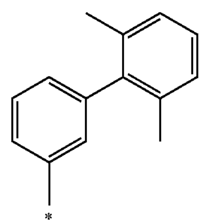
10-84
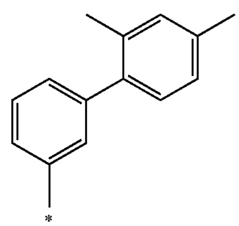
10-85
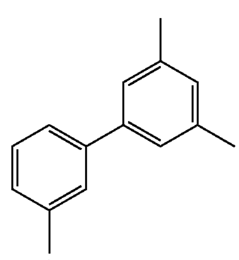
10-86
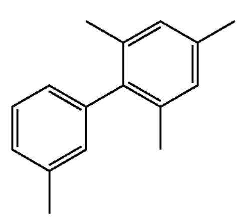

-continued
10-87
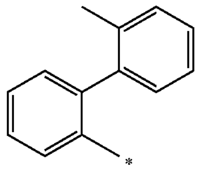
10-88
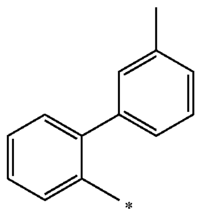
10-89
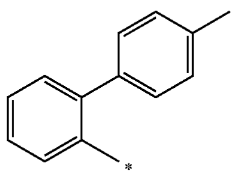
10-90
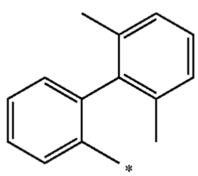
10-91
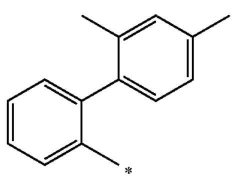
10-92
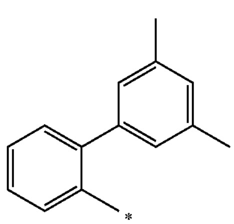
10-93
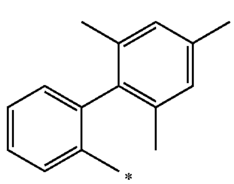
-continued
10-94
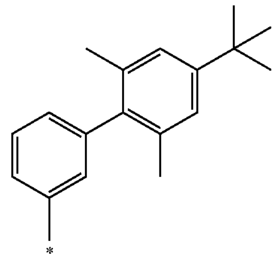
10-95
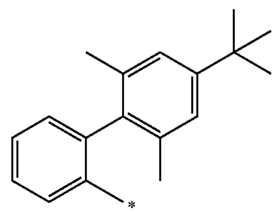
10-96
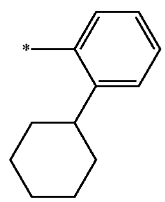
10-97
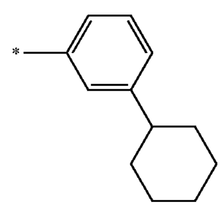
10-98
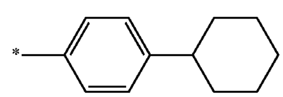
10-99
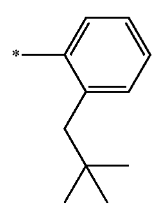
10-100
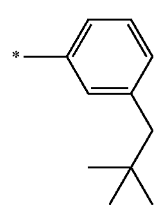
10-101
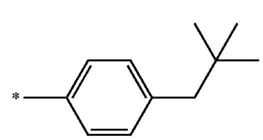

-continued
10-102
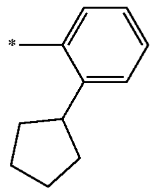
10-103
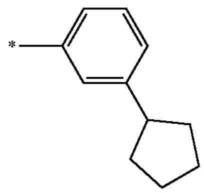
10-104
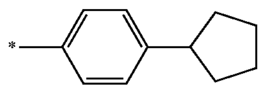
10-105
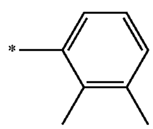
10-106
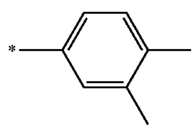
10-107
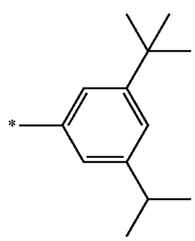
10-108
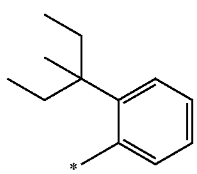
10-109
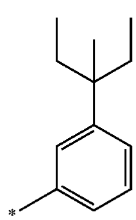
10-110
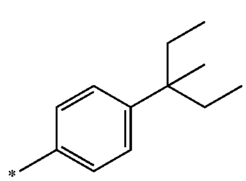
-continued
10-111
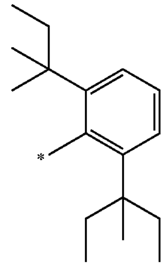
10-112
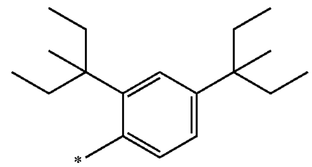
10-113
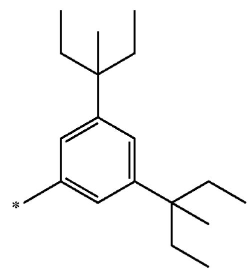
10-114
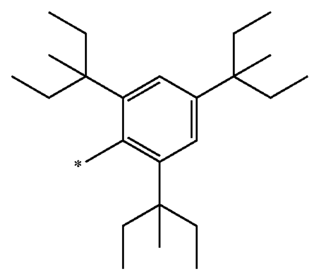
10-115
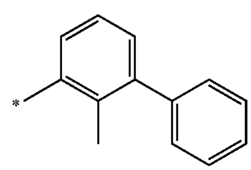
10-116
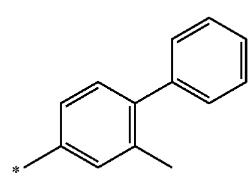
10-117
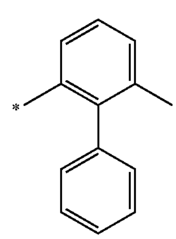

-continued
10-118
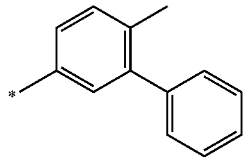
10-119
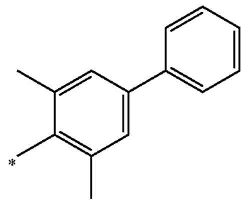
10-120
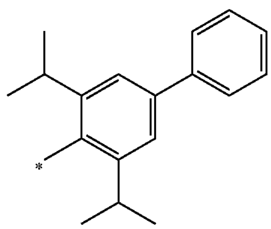
10-121
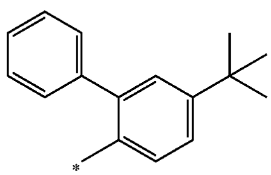
10-122
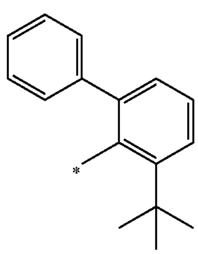
10-123
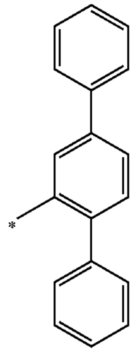
-continued
10-124
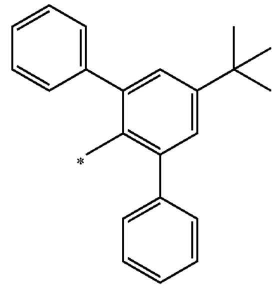
10-125
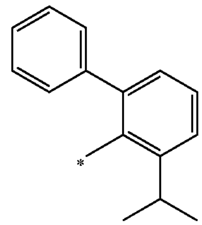
10-126
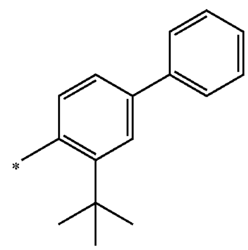
10-127
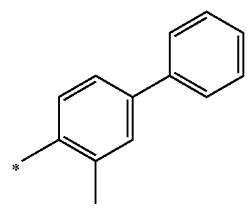
10-128
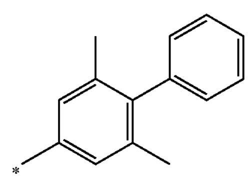
10-129
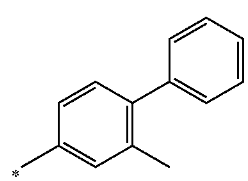
10-130
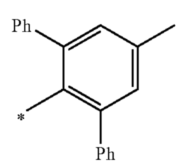

-continued
10-201
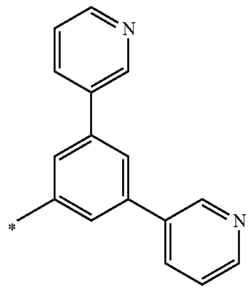
10-202
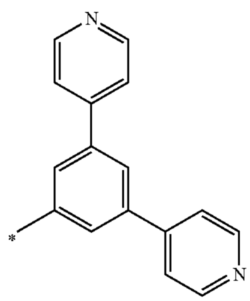
10-203
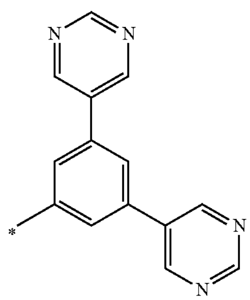
10-204
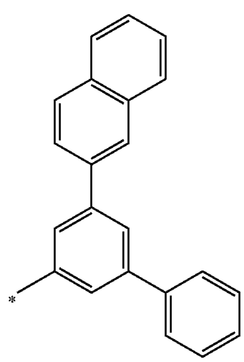
10-205
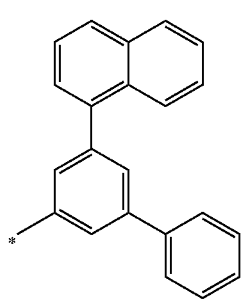
-continued
10-206
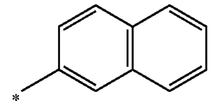
10-207
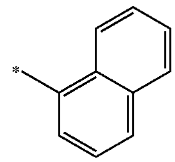
10-208
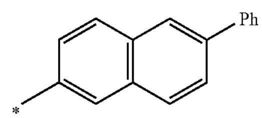
10-209
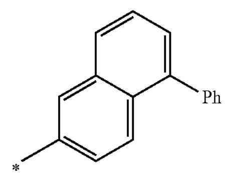
10-210
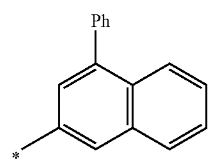
10-211
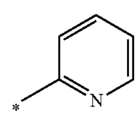
10-212
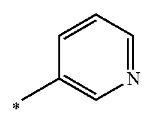
10-213
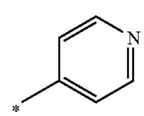
10-214
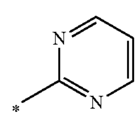
10-215
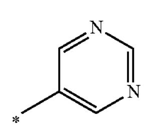
10-216
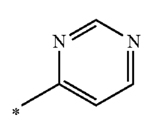

10-217
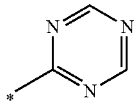
10-218
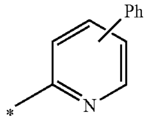
10-219
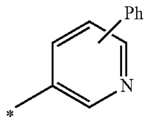
10-220
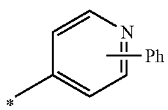
10-221
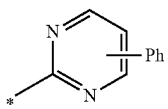
10-222
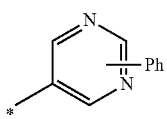
10-223
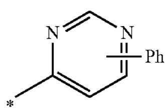
10-224
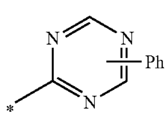
10-225
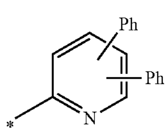
10-226
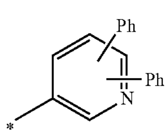
10-227
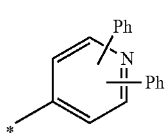
10-228
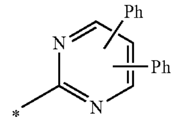
10-229
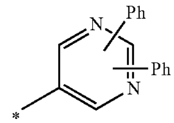
10-230
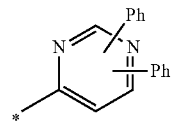
10-231
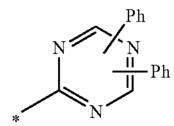
10-232
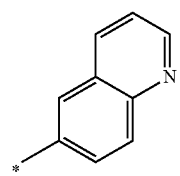
10-233
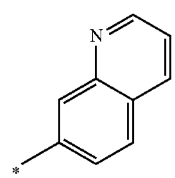
10-234
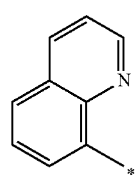
10-235
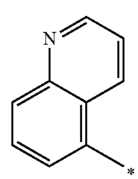
10-236
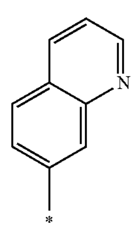

-continued
10-237
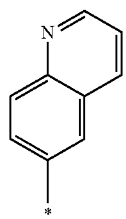
10-238
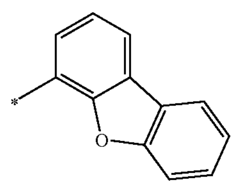
10-239
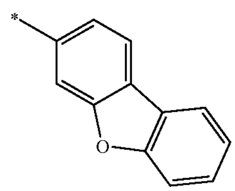
10-240
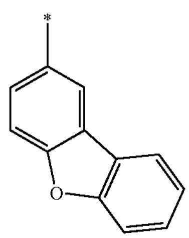
10-241
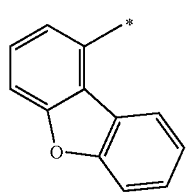
10-242
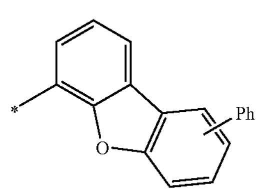
10-243
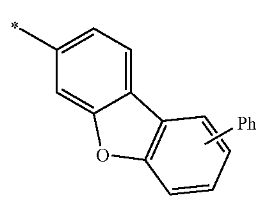
-continued
10-244
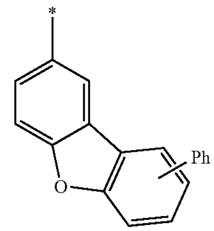
10-245
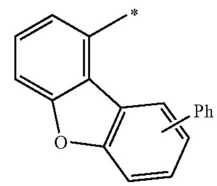
10-246
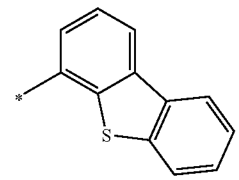
10-247
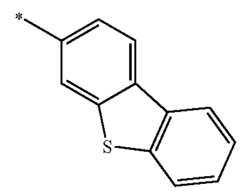
10-248
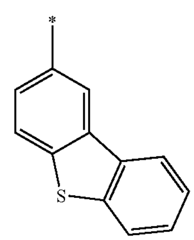
10-249
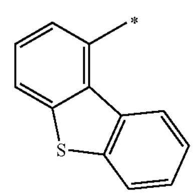
10-250
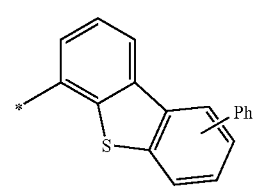
10-251
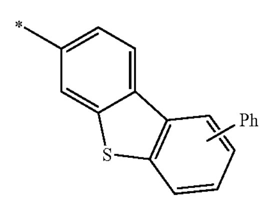

-continued
10-252
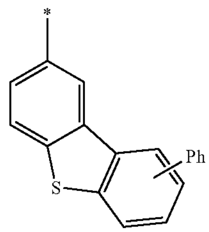
10-253
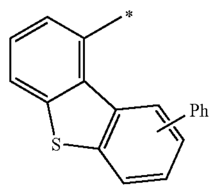
10-254
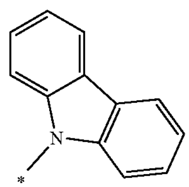
10-255
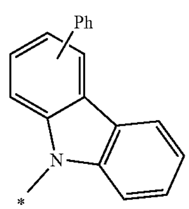
10-256
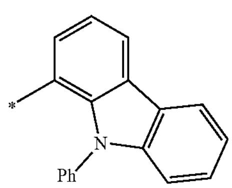
10-257
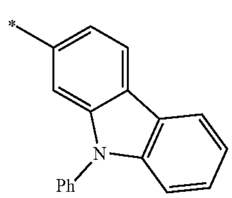
10-258
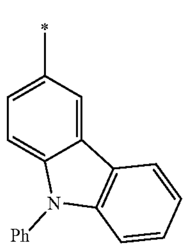
-continued
10-259
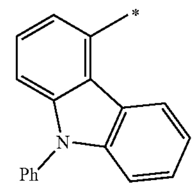
10-260
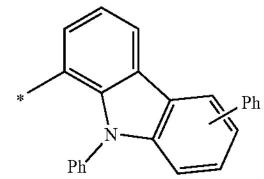
10-261
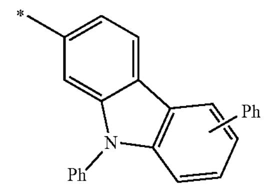
10-262
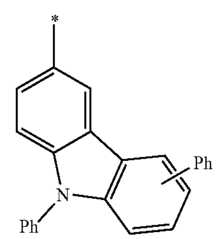
10-263
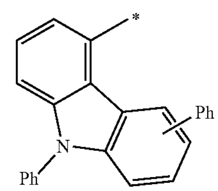
10-264
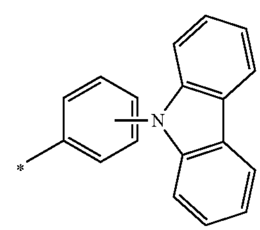
10-265
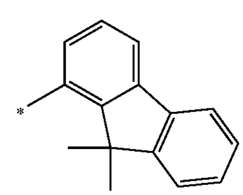
10-266
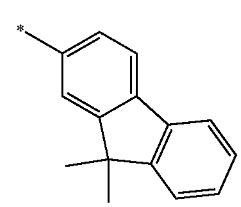

-continued
10-267
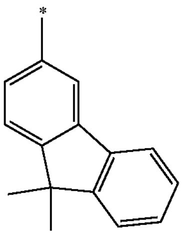
10-268
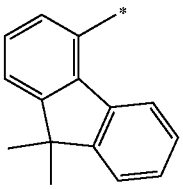
10-269
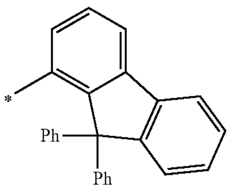
10-270
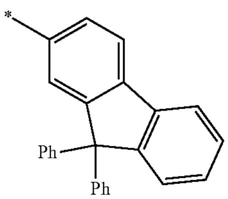
10-271
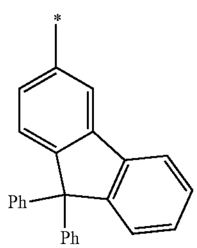
10-272
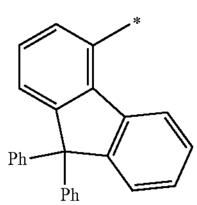
10-273
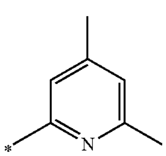
10-274
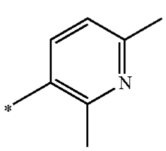
-continued
10-275
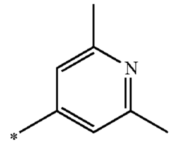
10-276
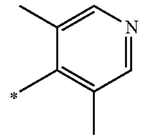
10-277
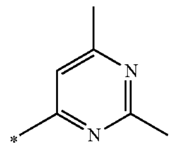
10-278
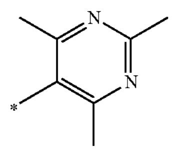
10-279
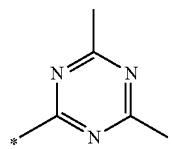
10-280
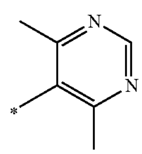
10-281
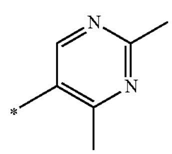
10-282
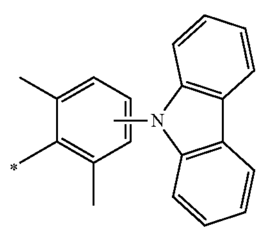
10-283
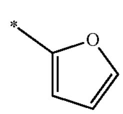
10-284
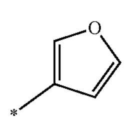

-continued
10-285
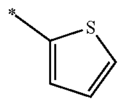
10-286
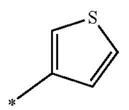
10-287
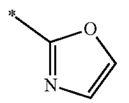
10-288
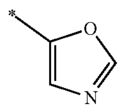
10-289
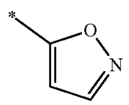
10-290
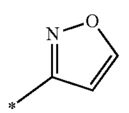
10-291
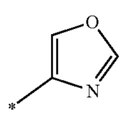
10-292
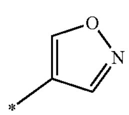
10-293
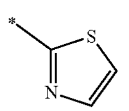
10-294
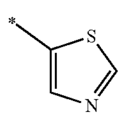
10-295
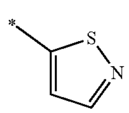
10-296
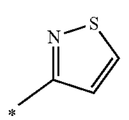
10-297
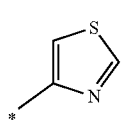
-continued
10-298
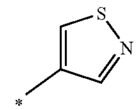
10-299
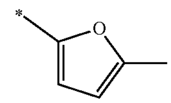
10-300
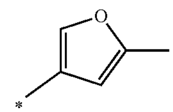
10-301
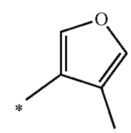
10-302
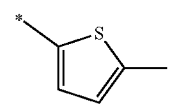
10-303
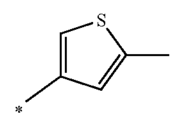
10-304
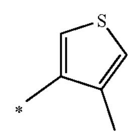
10-305
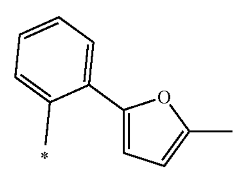
10-306
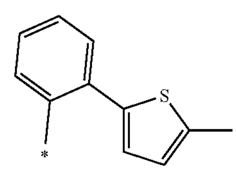
10-307
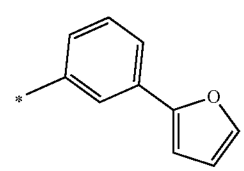
10-308
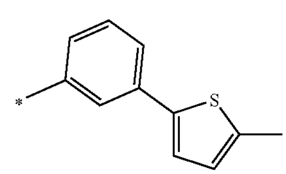

-continued
10-309
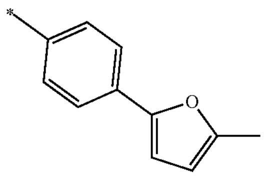
10-310
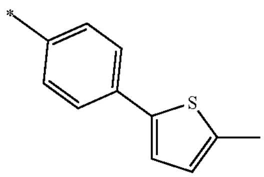
10-311
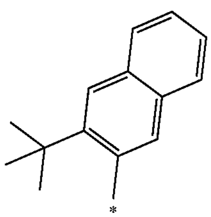
10-312
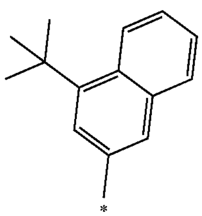
10-313
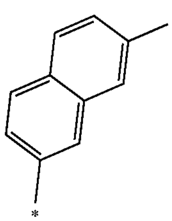
10-314
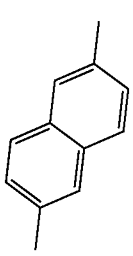
10-315
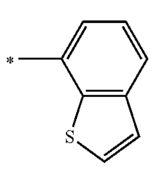
-continued
10-316
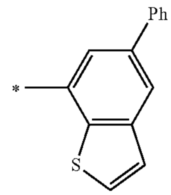
10-317
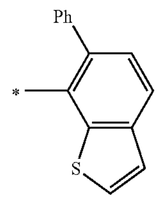
10-318
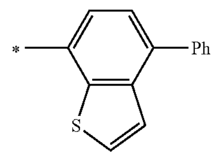
10-319
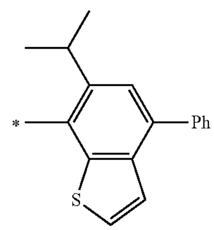
10-320
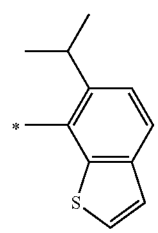
10-321
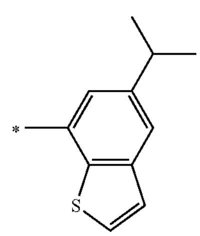
10-322
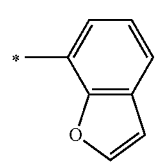
10-323
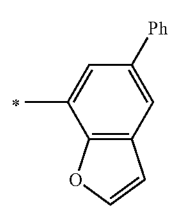

-continued
10-324
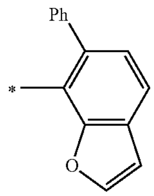
10-325
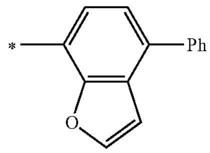
10-326
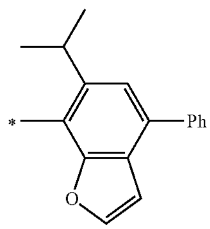
10-327
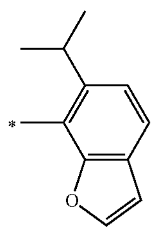
10-328
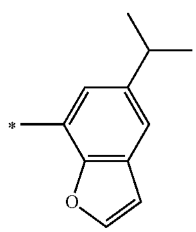
10-329
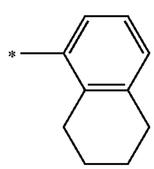
10-330
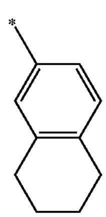
-continued
10-331
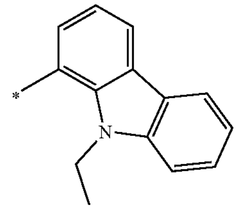
10-332
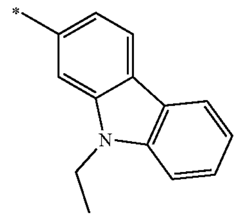
10-333
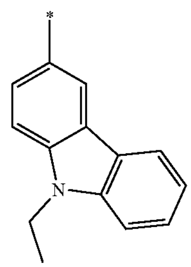
10-334
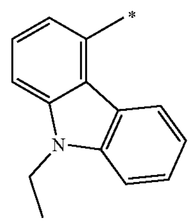
10-335
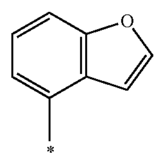
10-336
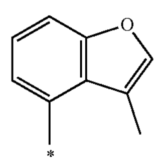
10-337
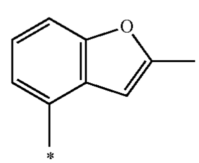
10-338
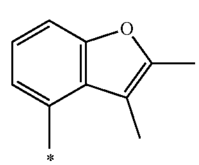

-continued
10-339
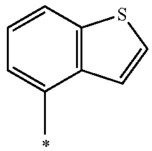
10-340
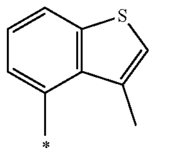
10-341
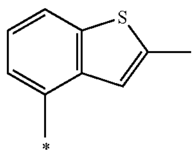
10-342
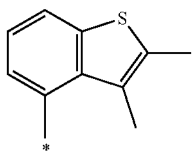
10-343
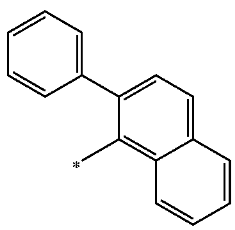
10-344
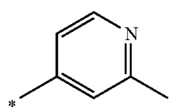
10-345
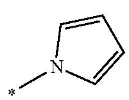
10-346
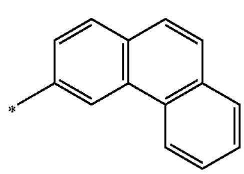
10-347
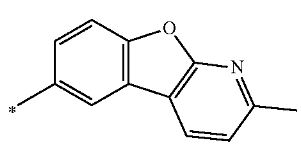
10-348
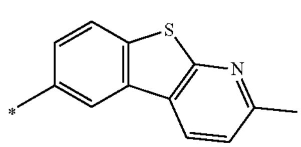
-continued
10-349
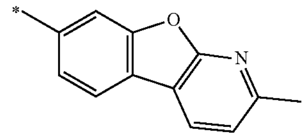
10-350
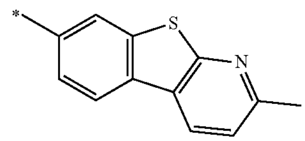
10-351
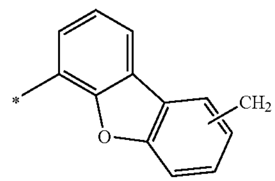
10-352
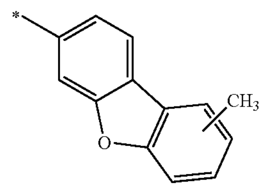
10-353
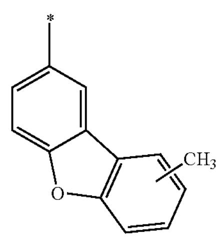
10-354
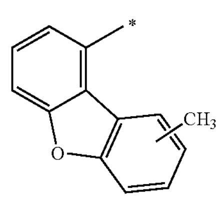
10-355
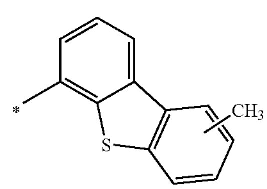
10-356
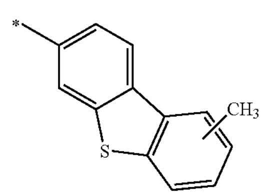

-continued 10-357

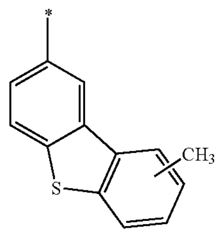

10-358

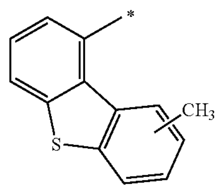

In Formulae 9-1 to 9-39, 9-201 to 9-236, 10-1 to 10-130, and 10-201 to 10-358, * indicates a bonding site to an adjacent atom, "Ph" represents a phenyl group, "TMS" and "$SiMe_3$" each represent a trimethylsilyl group, and "TMG" and "$GeMe_3$" each represent a trimethylgermyl group.

The "group represented by one of Formulae 9-1 to 9-39 in which at least one hydrogen is substituted with deuterium" and the "group represented by one of Formulae 9-201 to 9-236 in which at least one hydrogen is substituted with deuterium" may each be, for example, a group represented by one of Formulae 9-501 to 9-514 and 9-601 to 9-636:

9-501

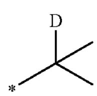

9-502

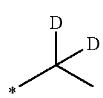

9-503

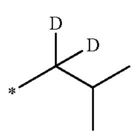

9-504

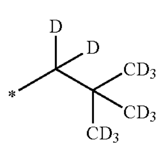

9-505

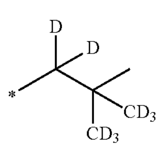

9-506

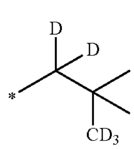

-continued 9-507

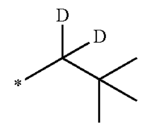

9-508

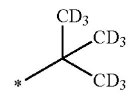

9-509

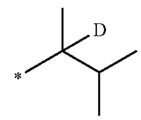

9-510

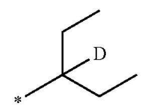

9-511

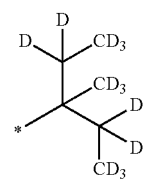

9-512

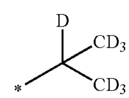

9-513

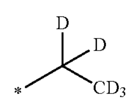

9-514

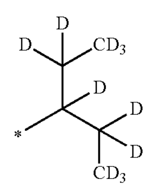

9-601

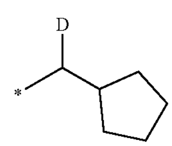

9-602

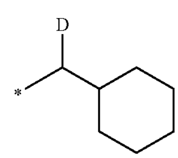

9-603

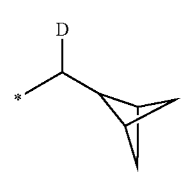

9-604
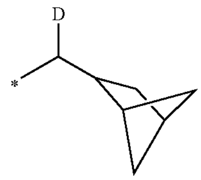
9-605
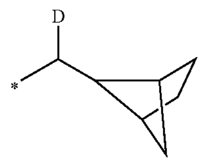
9-606
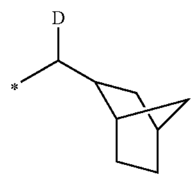
9-607
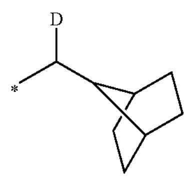
9-608
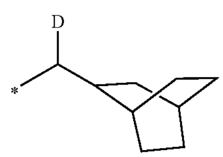
9-609
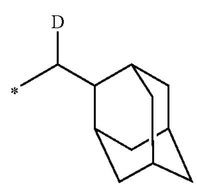
9-610
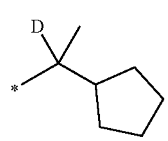
9-611
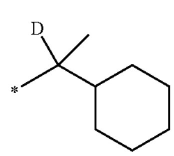
9-612
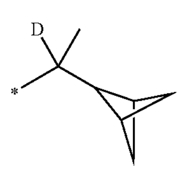
9-613
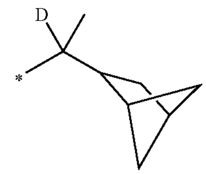
9-614
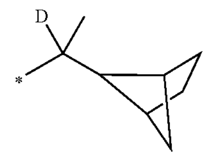
9-615
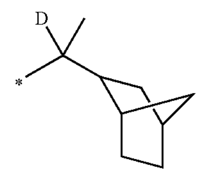
9-616
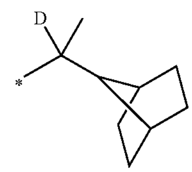
9-617
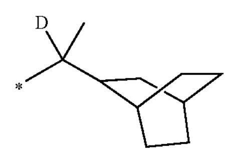
9-618
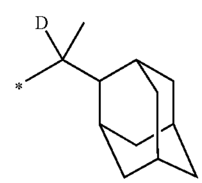
9-619
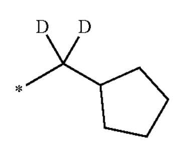
9-620
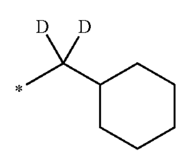
9-621
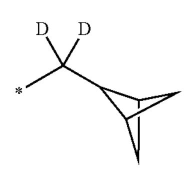

-continued
9-622
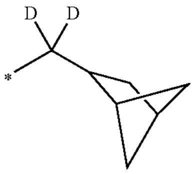
9-623
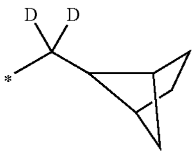
9-624
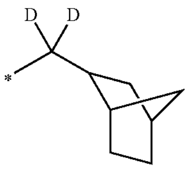
9-625
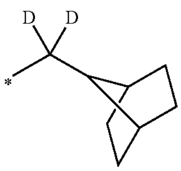
9-626
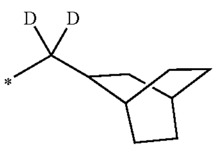
9-627
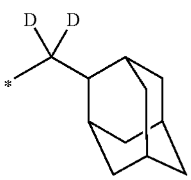
9-628
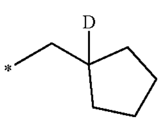
9-629
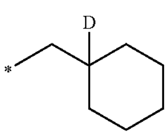
9-630
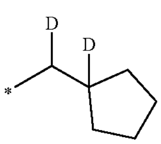
9-631
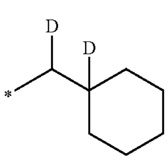
-continued
9-632
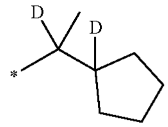
9-633
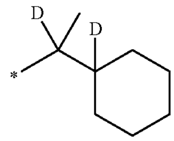
9-634
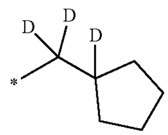
9-635
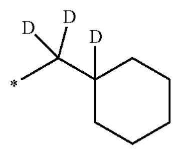
9-636
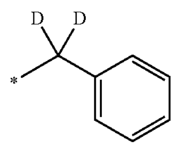
The "group represented by one of Formulae 9-1 to 9-39 in which at least one hydrogen is substituted with —F" and the "group represented by one of Formulae 9-201 to 9-236 in which at least one hydrogen is substituted with —F" may each be, for example, a group represented by one of Formulae 9-701 to 710:
9-701
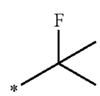
9-702
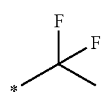
9-703
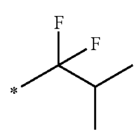
9-704
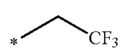
9-705
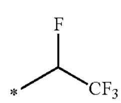
9-706
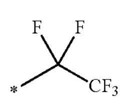

-continued
9-707
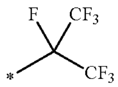
9-708
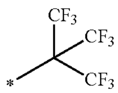
9-709
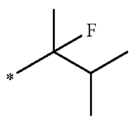
9-710
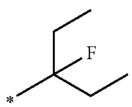
The "group represented by one of Formulae 10-1 to 10-130 in which at least one hydrogen is substituted with a deuterium" and the "group represented by one of Formulae 10-201 to 10-358 in which at least one hydrogen is substituted with deuterium" may each be, for example, a group represented by one of Formulae 10-501 to 553:
10-501
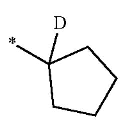
10-502
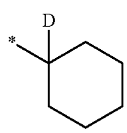
10-503
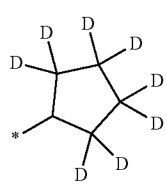
10-504
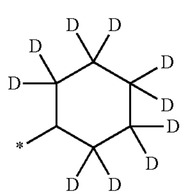
10-505
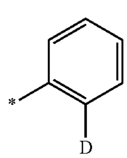
10-506
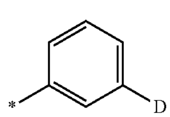
-continued
10-507
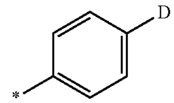
10-508
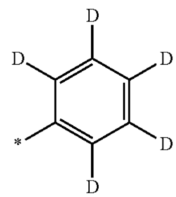
10-509
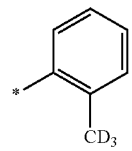
10-510
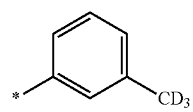
10-511
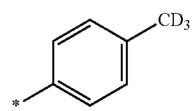
10-512
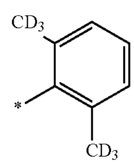
10-513
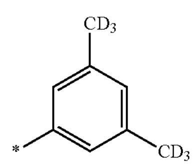
10-514
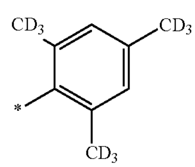
10-515
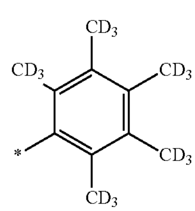
10-516
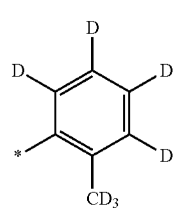

-continued
10-517
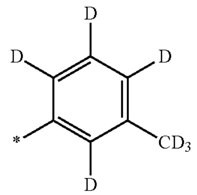
10-518
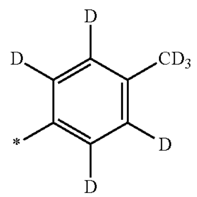
10-519
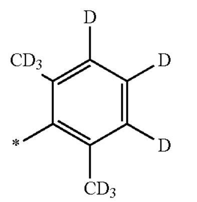
10-520
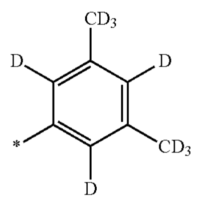
10-521
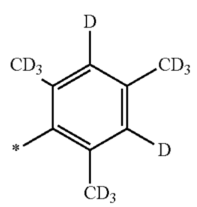
10-522
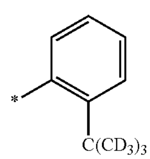
10-523
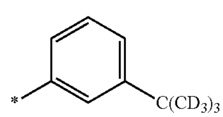
10-524
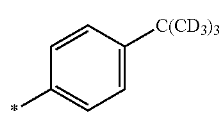
10-525
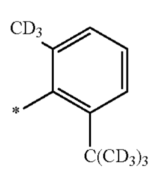
-continued
10-526
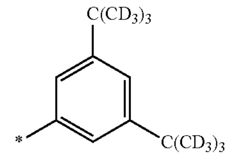
10-527
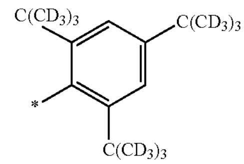
10-528
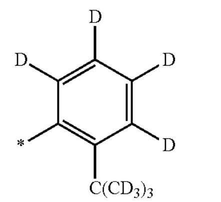
10-529
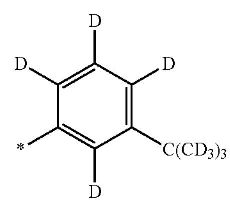
10-530
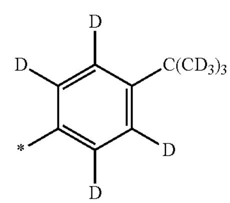
10-531
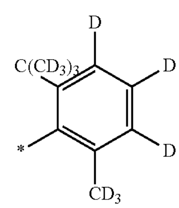
10-532
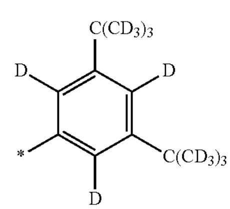
10-533
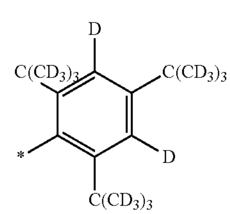

-continued
10-534
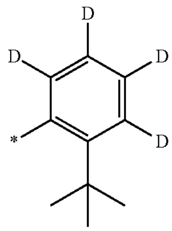
10-535
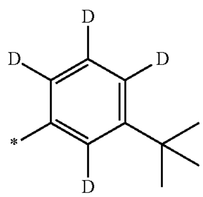
10-536
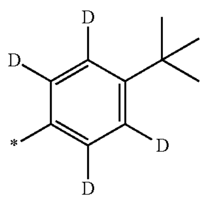
10-537
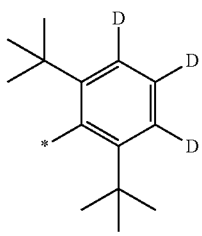
10-538
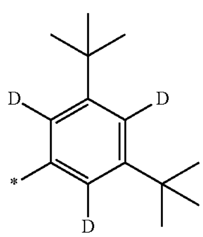
10-540
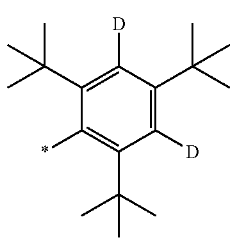
10-541
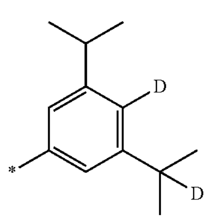
-continued
10-542
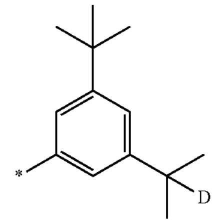
10-543
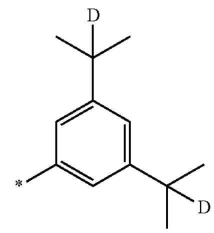
10-544
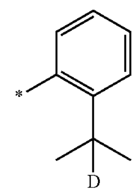
10-545
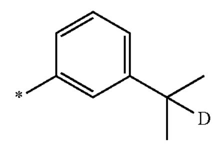
10-546
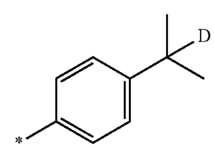
10-547
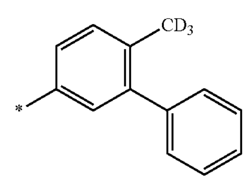
10-548
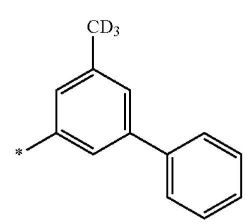
10-549
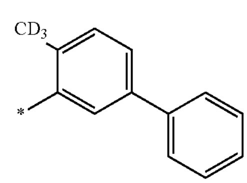

-continued
10-550
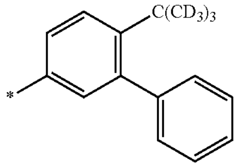
10-551
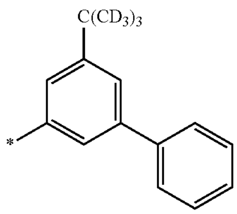
10-552
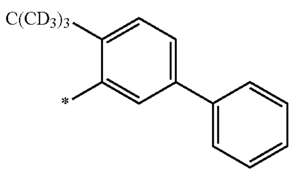
10-553
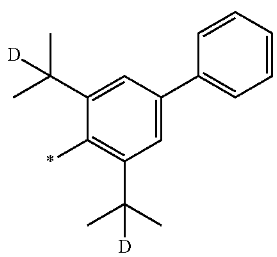
The "group represented by one of Formulae 10-1 to 10-130 in which at least one hydrogen is substituted with —F" and the "group represented by one of Formulae 10-201 to 10-358 in which at least one hydrogen is substituted with —F" may each be, for example, a group represented by one of Formulae 10-601 to 617:
10-601
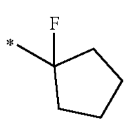
10-602
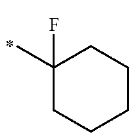
10-603
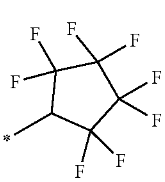
-continued
10-604
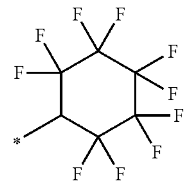
10-605
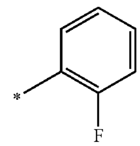
10-606
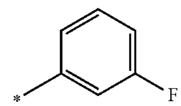
10-607
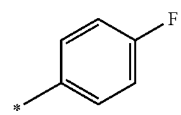
10-608
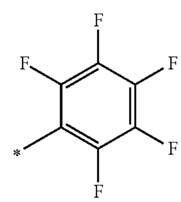
10-609
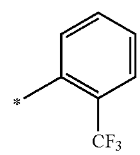
10-610
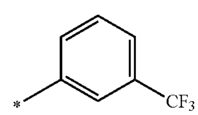
10-611
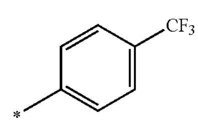
10-612
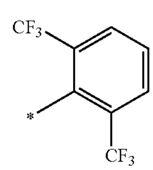
10-613
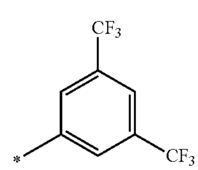

-continued 10-614

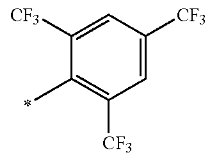

10-615

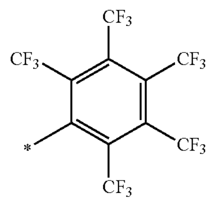

10-616

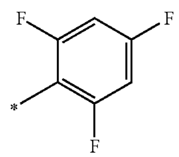

10-617

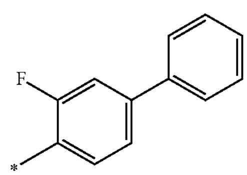

In some embodiments, in Formula 2, $R_2$ may be hydrogen, deuterium, —F, a cyano group, a substituted or unsubstituted $C_1$-$C_{60}$ alkyl group, a substituted or unsubstituted $C_3$-$C_{10}$ cycloalkyl group, —Si($Q_3$)($Q_4$)($Q_5$), or —Ge($Q_3$)($Q_4$)($Q_5$), $R_3$ may be a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, or a combination thereof.

In Formula 2, b1 indicates the number of $R_1$ groups, and b1 may be an integer from 0 to 20. When b1 is an integer of 2 or greater, at least two $R_1$ groups may be identical to or different from each other. In some embodiments, b1 may be an integer from 0 to 10.

In Formula 2, b2 indicates the number of $R_2$ groups, and b2 may be an integer from 0 to 4. When b2 is 2 or greater, at least two $R_2$ groups may be identical to different from each other. In some embodiments, b2 may be 0, 1, or 2.

In an embodiment, a group represented by

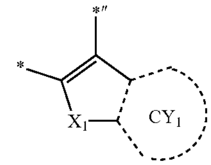

in Formula 2 may be represented by one of Formulae 2(1) to 2(31):

2(1)

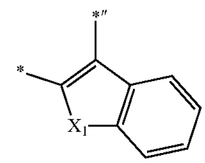

2(2)

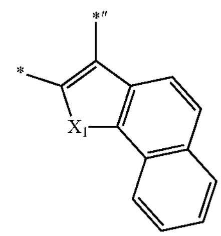

2(3)

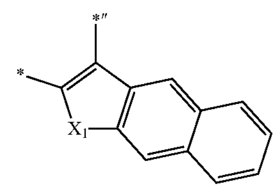

2(4)

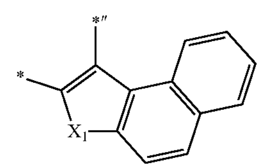

2(5)

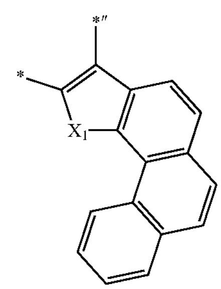

2(6)

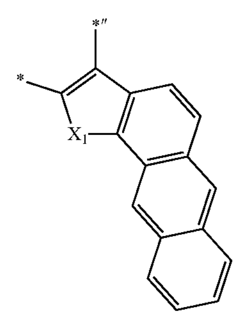

-continued
2(7)
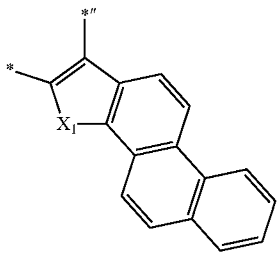
2(8)
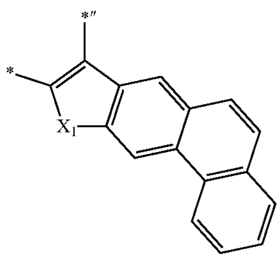
2(9)
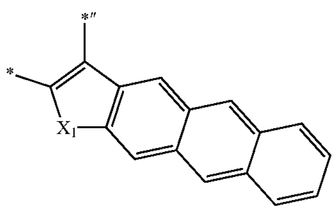
2(10)
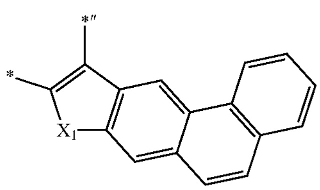
2(11)
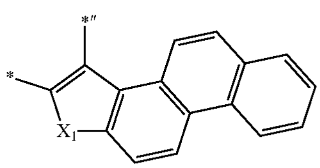
2(12)
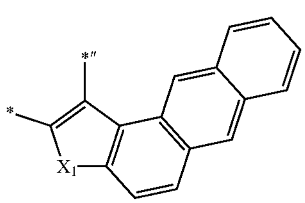
2(13)
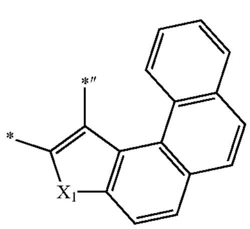
-continued
2(14)
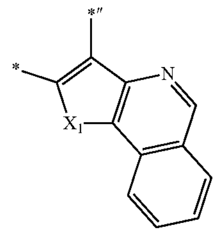
2(15)
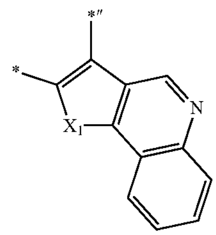
2(16)
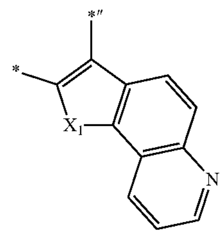
2(17)
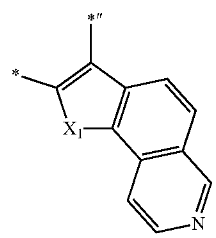
2(18)
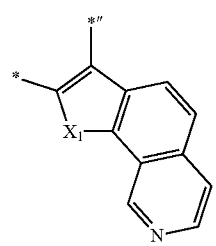
2(19)
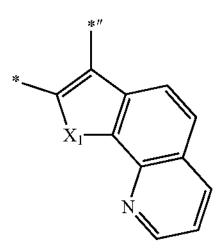
2(20)
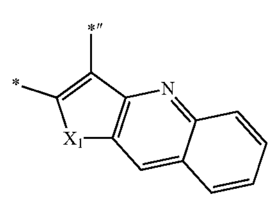

-continued
2(21)
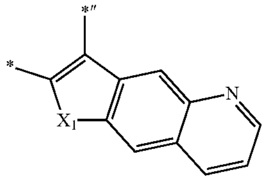
2(22)
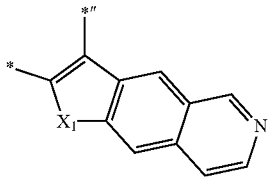
2(23)
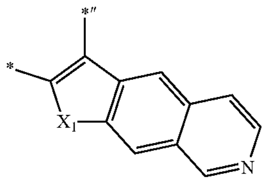
2(24)
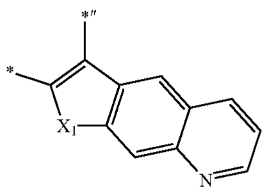
2(25)
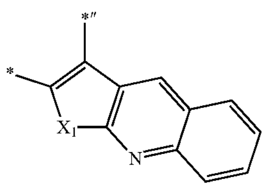
2(26)
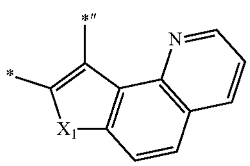
2(27)
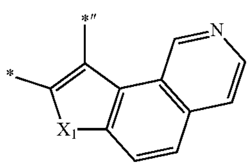
2(28)
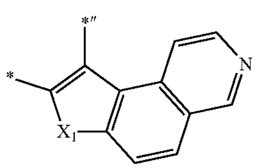
2(29)
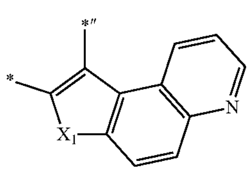
-continued
2(30)
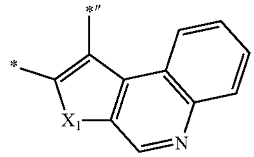
2(31)
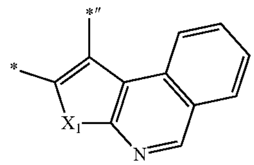
wherein, in Formulae 2(1) to 2(31),
$X_1$ may be understood by referring to the description of $X_1$ provided herein,
* indicates a bonding site to M in Formula 1, and
*" indicates a bonding site to an adjacent carbon atom.
In one or more embodiments, a group represented by
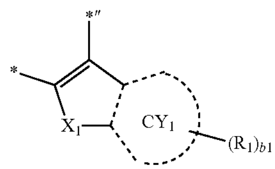
in Formula 2 may be represented by one of Formulae 2-1 to 2-57:
2-1
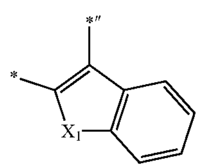
2-2
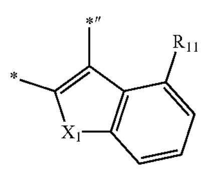
2-3
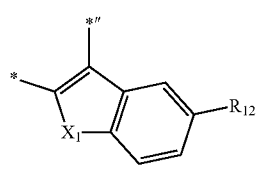
2-4
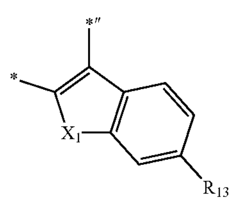

-continued
2-5
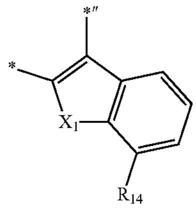
2-6
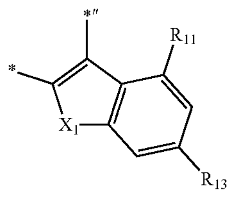
2-7
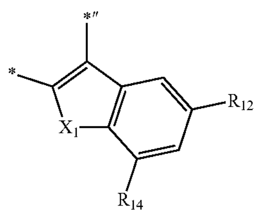
2-8
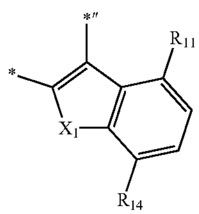
2-9
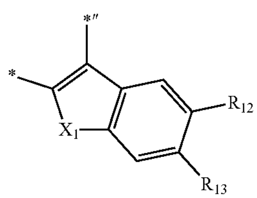
2-10
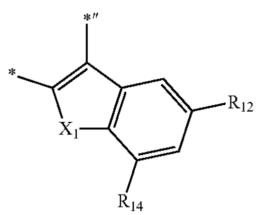
2-11
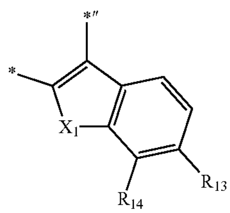
-continued
2-12
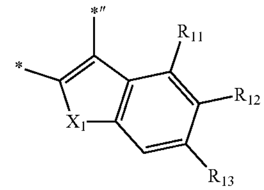
2-13
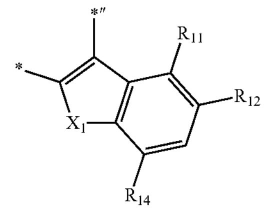
2-14
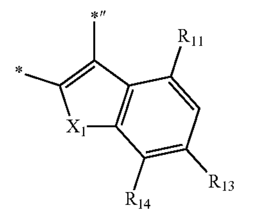
2-15
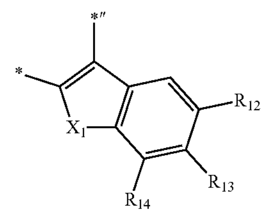
2-16
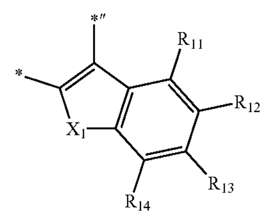
2-17
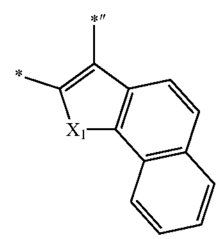
2-18
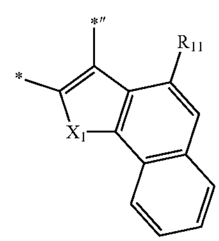

-continued
2-19
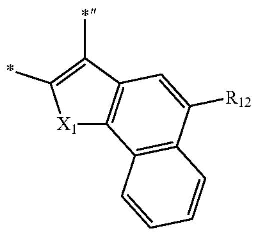
2-20
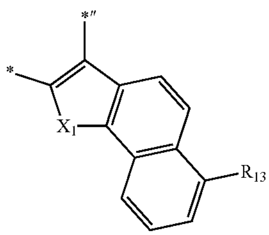
2-21
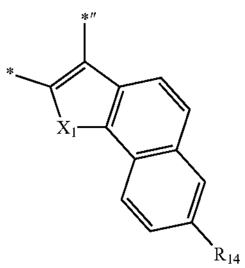
2-22
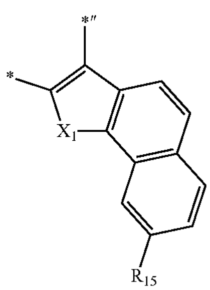
2-23
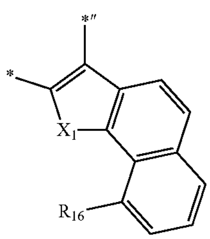
2-24
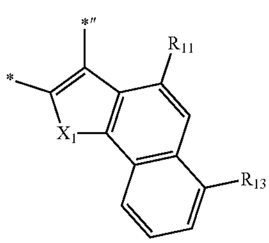
-continued
2-25
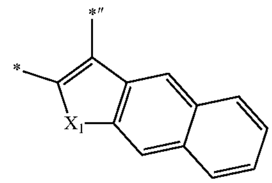
2-26
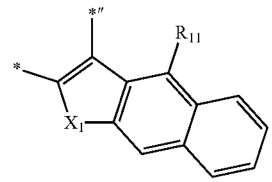
2-27
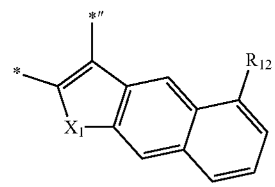
2-28
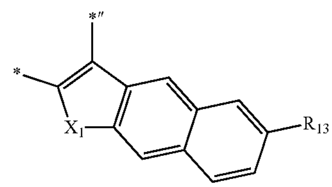
2-29
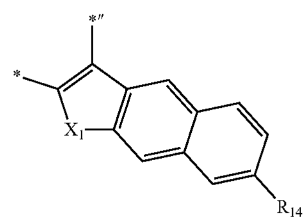
2-30
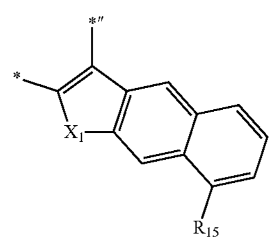
2-31
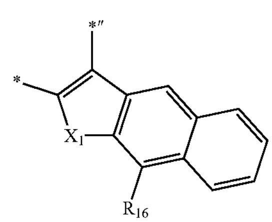

-continued
2-32
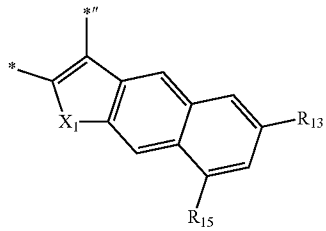
2-33
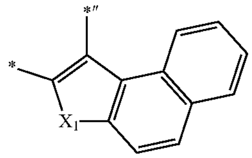
2-34
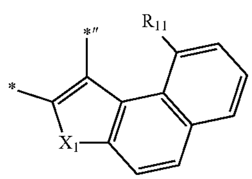
2-35
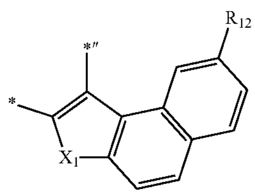
2-36
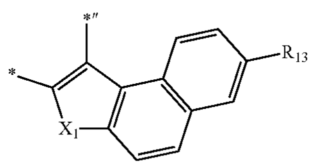
2-37
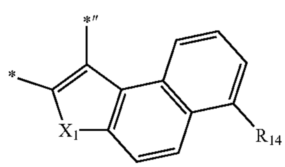
2-38
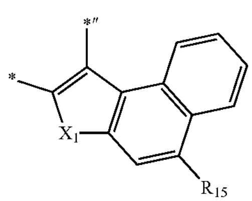
2-39
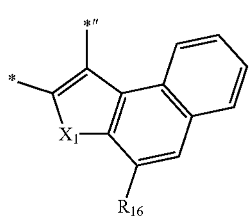
-continued
2-40
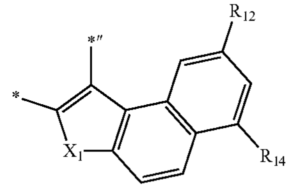
2-41
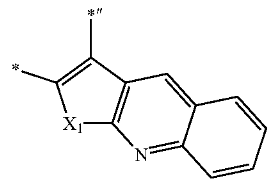
2-42
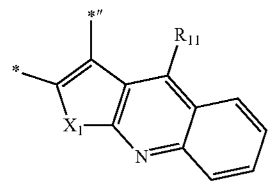
2-43
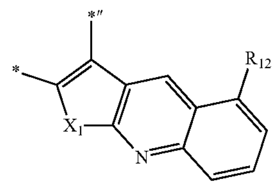
2-44
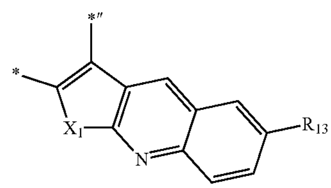
2-45
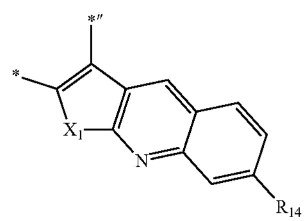
2-46
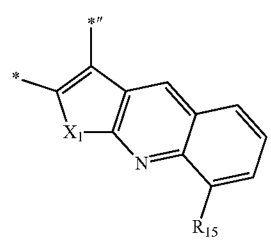
2-47
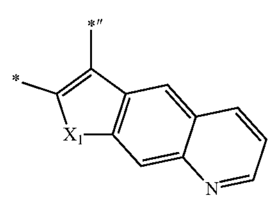

-continued 2-48

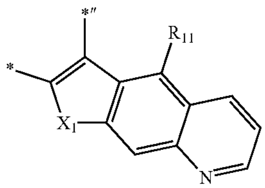

2-49

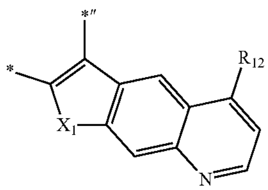

2-50

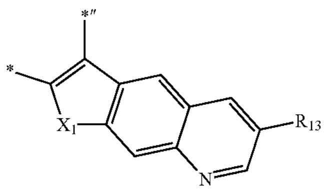

2-51

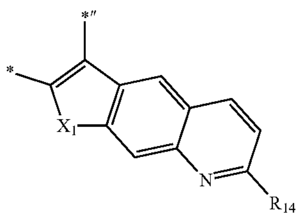

2-52

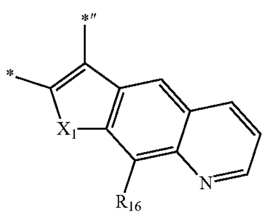

2-53

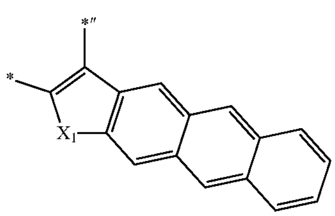

2-54

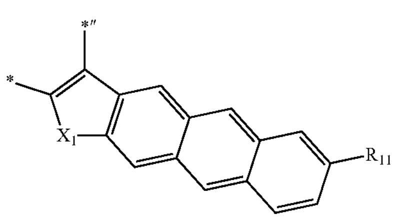

-continued 2-55

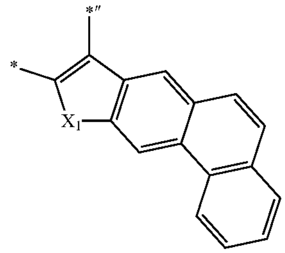

2-56

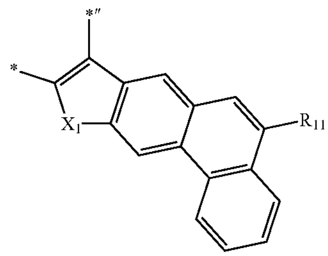

2-57

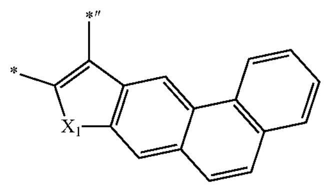

wherein, in Formulae 2-1 to 2-57, $X_1$ may be understood by referring to the description of $X_1$ provided herein, $R_{11}$ to $R_{16}$ may each be understood by referring to the description of $R_1$ provided herein, wherein $R_{11}$ to $R_{16}$ may each not be hydrogen,

* indicates a bonding site to M in Formula 1, and

*" indicates a bonding site to an adjacent carbon atom.

In some embodiments, $L_2$ in Formula 1 may be a bidentate ligand each bonded to M in Formula 1 via O, S, Se, N, C, P, Si, As, or a combination thereof.

In some embodiments, $L_2$ in Formula 1 may be a bidentate ligand each bonded to M in Formula 1 via N and C or a bidentate ligand each bonded to M in Formula 1 via two O atoms.

In one or more embodiments, $L_2$ in Formula 1 may be a group represented by one of Formulae 3A to 3F:

3A

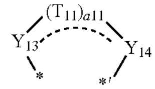

3B

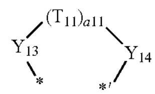

3C

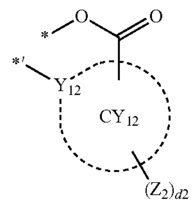

-continued

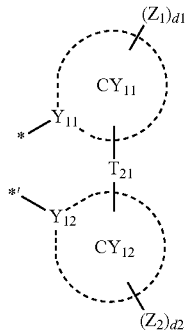

3D

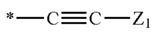

3E

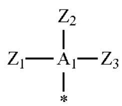

3F wherein, in Formulae 3A to 3F, $Y_{13}$ may be O, N, $N(Z_1)$, $P(Z_1)(Z_2)$, or $As(Z_1)(Z_2)$, $Y_{14}$ may be O, N, $N(Z_3)$, $P(Z_3)(Z_4)$, or $As(Z_3)(Z_4)$, $T_{11}$ may be a single bond, a double bond, *—$C(Z_{11})(Z_{12})$—*', *—$C(Z_{11})$=$C(Z_{12})$—*', *=$C(Z_{11})$—*', *—$C(Z_{11})$=*', *=$C(Z_{11})$—$C(Z_{12})$=$C(Z_{13})$—*', *—$C(Z_{11})$=$C(Z_{12})$—$C(Z_{13})$=*', *—$N(Z_{11})$—*', or a $C_5$-$C_{30}$ carbocyclic group unsubstituted or substituted with at least one $Z_{11}$, a11 may be an integer from 1 to 10, and when a11 is 2 or greater, at least two $T_{11}$ groups may be identical to or different from each other, $Y_{11}$ and $Y_{12}$ may each independently be C or N, $T_{21}$ may be a single bond, a double bond, O, S, $C(Z_{11})(Z_{12})$, $Si(Z_{11})(Z_{12})$, or $N(Z_{11})$, ring $CY_{11}$ and ring $CY_{12}$ may each independently be a $C_5$-$C_{30}$ carbocyclic group or a $C_1$-$C_{30}$ heterocyclic group, $A_1$ may be P or As, $Z_1$ to $Z_4$ and $Z_{11}$ to $Z_{13}$ may each be understood by referring to the descriptions of $R_1$ provided herein, d1 and d2 may each independently be an integer from 0 to 20, and

* and *' each indicate a bonding site to M in Formula 1.

In some embodiments, a group represented by

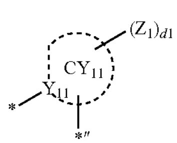

in Formula 3D may be represented by one of Formulae CY11-1 to CY11-34, and/(or), a group represented by

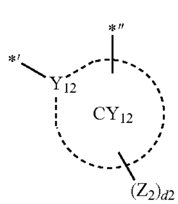

in Formulae 3C and 3D may be represented by one of Formulae CY12-1 to CY12-34:

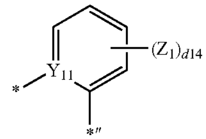

CY11-1

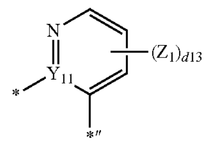

CY11-2

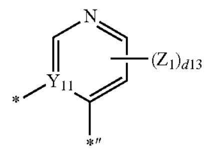

CY11-3

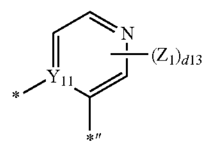

CY11-4

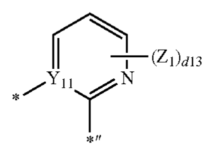

CY11-5

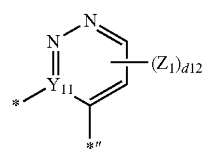

CY11-6

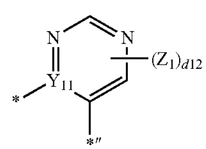

CY11-7

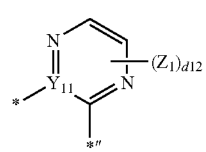

CY11-8

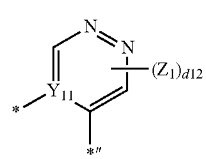

CY11-9

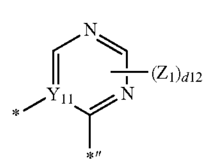

CY11-10

-continued
CY11-11
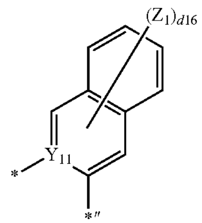
CY11-12
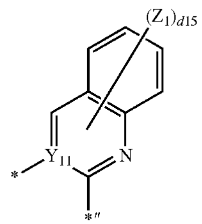
CY11-13
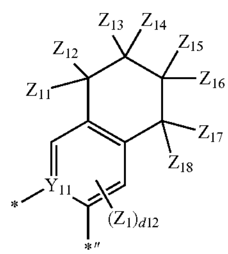
CY11-14
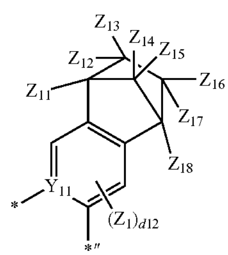
CY11-15
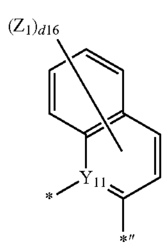
CY11-16
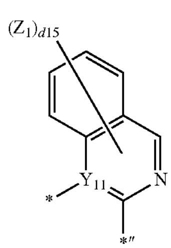
-continued
CY11-17
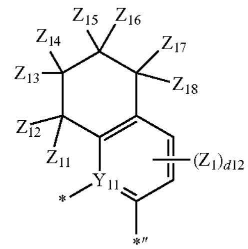
CY11-18
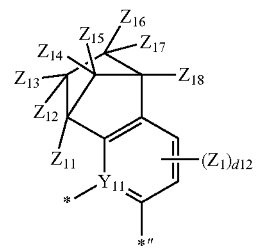
CY11-19
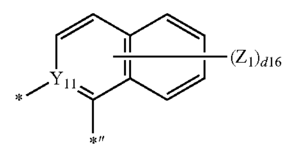
CY11-20
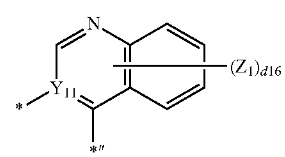
CY11-21
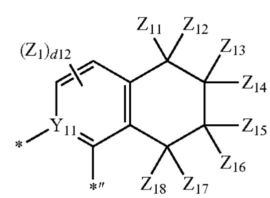
CY11-22
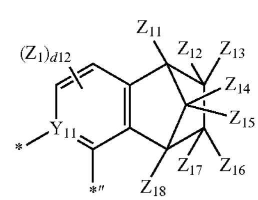
CY11-23
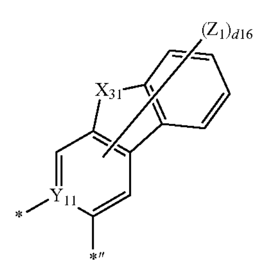

-continued
CY11-24
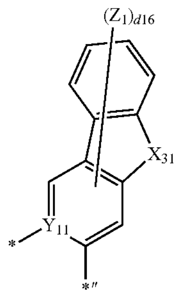
CY11-25
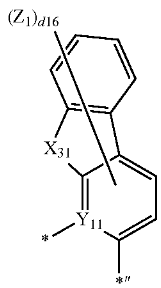
CY11-26
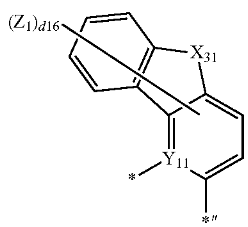
CY11-27
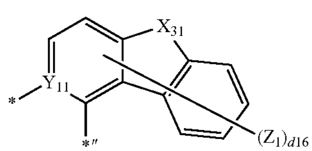
CY11-28
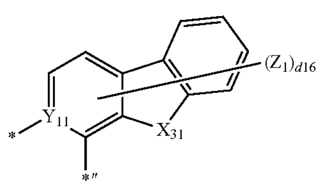
CY11-29
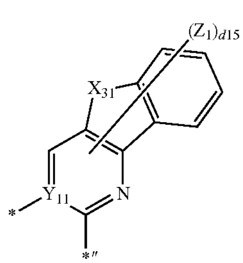
-continued
CY11-30
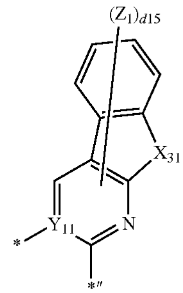
CY11-31
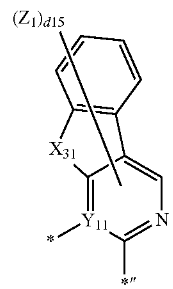
CY11-32
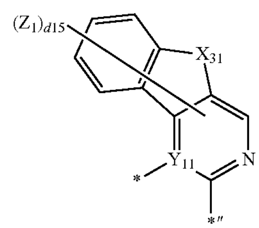
CY11-33
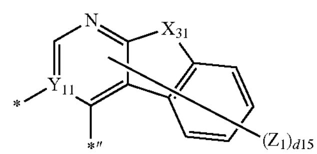
CY11-34
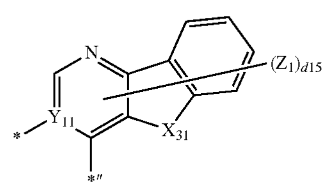
CY12-1
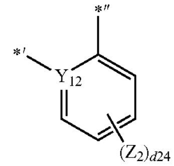
CY12-2
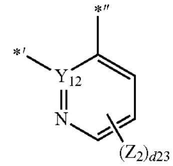

-continued
CY12-3
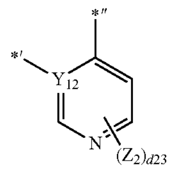
CY12-4
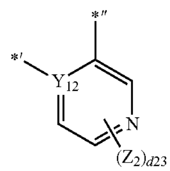
CY12-5
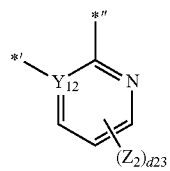
CY12-6
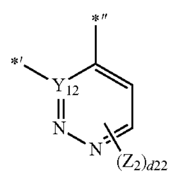
CY12-7
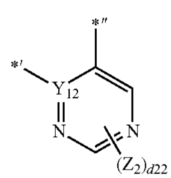
CY12-8
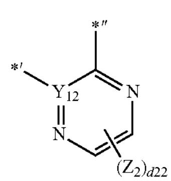
CY12-9
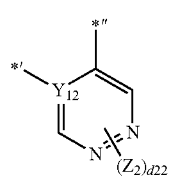
CY12-10
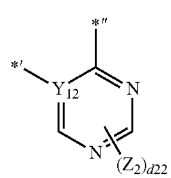
-continued
CY12-11
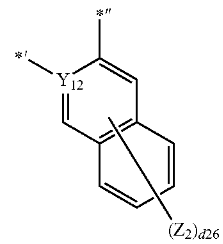
CY12-12
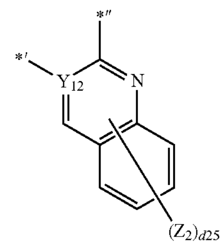
CY12-13
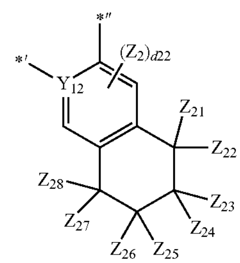
CY12-14
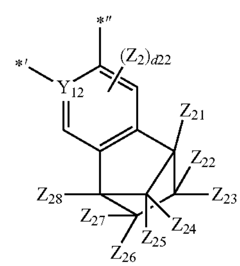
CY12-15
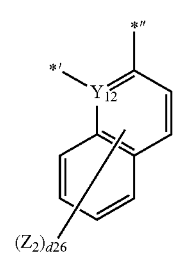
CY12-16
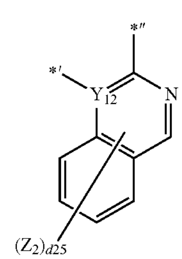

-continued
CY12-17
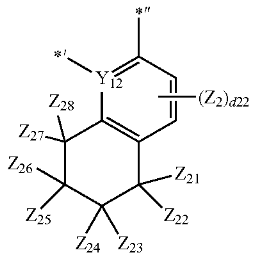
CY12-18
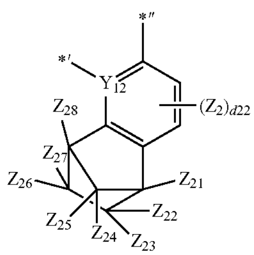
CY12-19
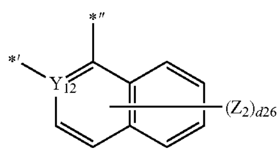
CY12-20
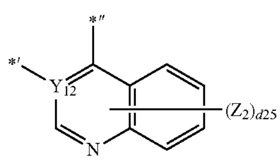
CY12-21
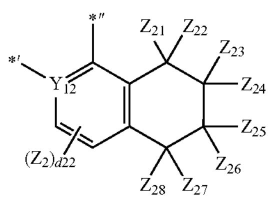
CY12-22
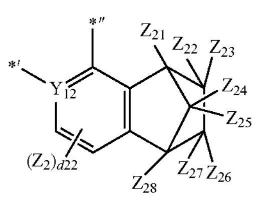
CY12-23
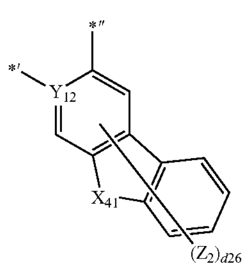
-continued
CY12-24
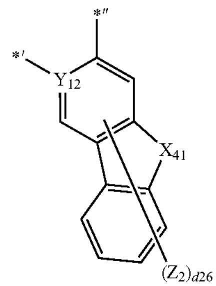
CY12-25
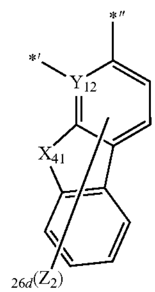
CY12-26
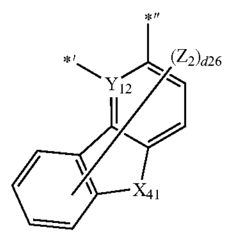
CY12-27
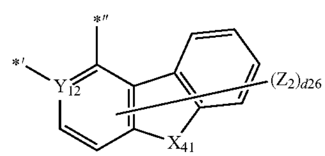
CY12-28
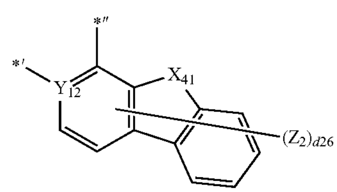
CY12-29
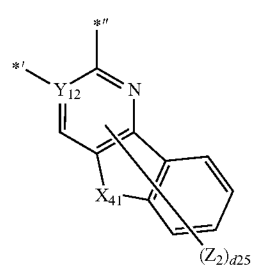

-continued

CY12-30

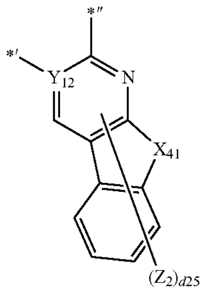

CY12-31

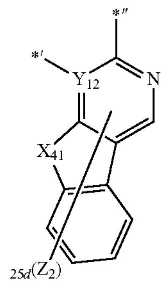

CY12-32

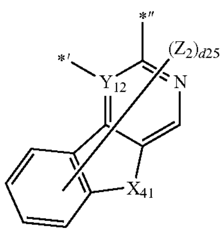

CY12-33

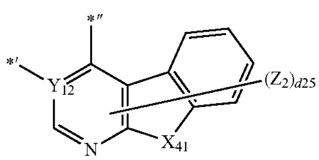

CY12-34

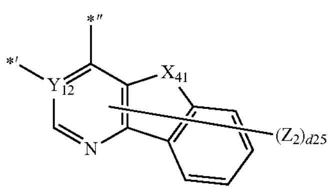

wherein, in Formulae CY11-1 to CY11-34 and CY12-1 to CY12-34, $X_{31}$ may be O, S, $N(Z_{11})$, $C(Z_{11})(Z_{12})$, or $Si(Z_{11})(Z_{12})$, $X_{41}$ may be O, S, $N(Z_{21})$, $C(Z_{21})(Z_{22})$, or $Si(Z_{21})(Z_{22})$, $Y_{11}$, $Y_{12}$, $Z_1$, and $Z_2$ may respectively be understood by referring to the descriptions of $Y_{11}$, $Y_{12}$, $Z_1$, and $Z_2$ provided herein, $Z_{11}$ to $Z_{18}$ and $Z_{21}$ to $Z_{28}$ may each be understood by referring to the descriptions of $R_1$ provided herein, d12 and d22 may each independently be an integer from 0 to 2, d13 and d23 may each independently be an integer from 0 to 3, d14 and d24 may each independently be an integer from 0 to 4, d15 and d25 may each independently be an integer from 0 to 5, d16 and d26 may each independently be an integer from 0 to 6, in the Formulae CY11-1 to CY11-34 and CY12-1 to CY12-34, * and *' each indicate a bonding site to M in Formula 1, and *" indicates a bonding site to an adjacent atom in Formula 3C or $T_{21}$ in Formula 3D.

In one or more embodiments, $L_2$ in Formula 1 may be a ligand represented by Formula 3D, and at least one of $Z_1$ and $Z_2$ in Formula 3D may each independently be deuterium; —$Si(Q_3)(Q_4)(Q_5)$; —$Ge(Q_3)(Q_4)(Q_5)$; or a $C_1$-$C_{60}$ alkyl group substituted with at least one deuterium.

In one or more embodiments, $L_2$ in Formula 1 may be a ligand represented by one of Formulae 3-1 and 3-101 to 3-112:

3-1

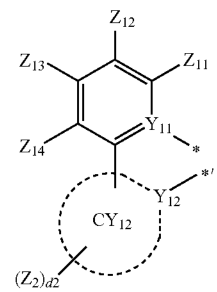

3-101

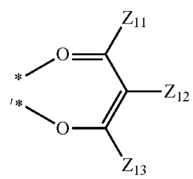

3-102

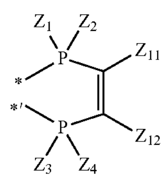

3-103

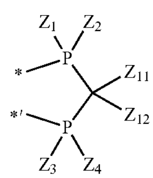

3-104

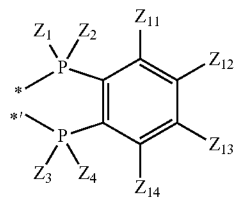

3-105

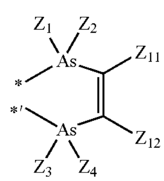

-continued 3-106

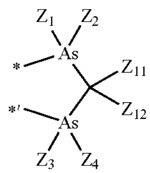

3-107

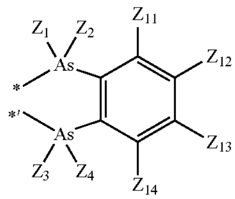

3-108

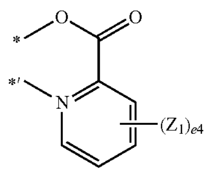

3-109

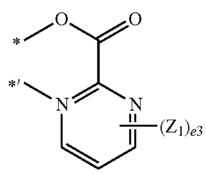

3-110

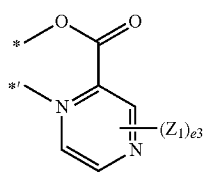

3-111

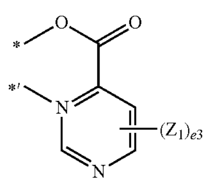

3-112

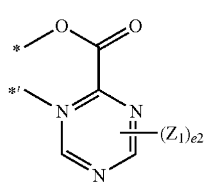

wherein, in Formulae 3-1 and 3-101 to 3-112, $Y_{11}$, $Y_{12}$, ring $CY_{12}$, $Z_1$ to $Z_4$, $Z_{11}$ to $Z_{13}$, and d2 may respectively be understood by referring to the descriptions of $Y_{11}$, $Y_{12}$, ring $CY_{12}$, $Z_1$ to $Z_4$, $Z_{11}$ to $Z_{13}$, and d2 provided herein, $Z_{14}$ may be understood by referring to the descriptions for $Z_1$ provided herein, e2 may be an integer from 0 to 2, e3 may be an integer from 0 to 3, e4 may be an integer from 0 to 4, and

* and *' each indicate a bonding site to M in Formula 1.

In some embodiments, in Formula 3-1, $Y_{11}$ may be N, and $Y_{12}$ may be C.

In some embodiments, $Z_{12}$ in Formula 3-1 may be —Si($Q_3$)($Q_4$)($Q_5$); —Ge($Q_3$)($Q_4$)(Q); or a $C_1$-$C_{10}$ alkyl group substituted with at least one deuterium.

In some embodiments, $Z_{12}$ in Formula 3-1 may be —Si($Q_3$)($Q_4$)(Q) or —Ge($Q_3$)($Q_4$)(Q), and $Z_{13}$ may not be hydrogen and a methyl group.

In some embodiments, a group represented by

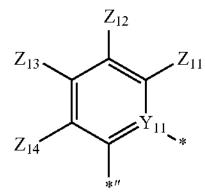

in Formula 3-1 may be represented by one of Formulae 3-1-1 to 3-1-16, and/(or)

a group represented by

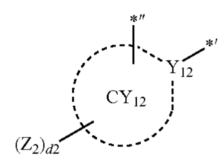

in Formula 3-1 may be represented by one of Formulae 3-1(1) to 3-1(16):

3-1-1

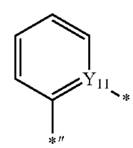

3-1-2

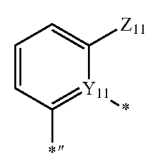

3-1-3

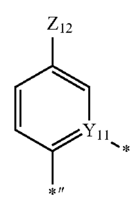

3-1-4

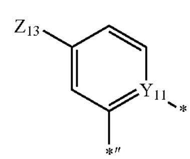

3-1-5

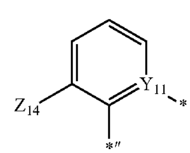

-continued
3-1-6
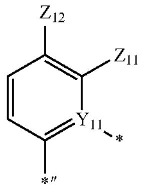
3-1-7
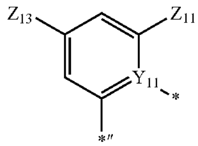
3-1-8
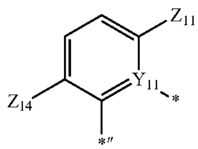
3-1-9
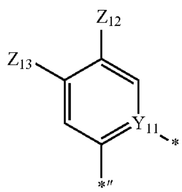
3-1-10
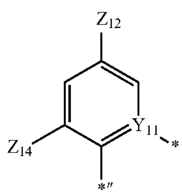
3-1-11
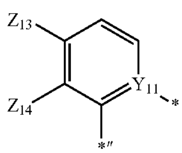
3-1-12
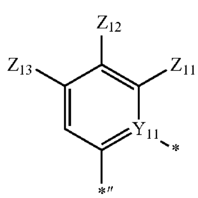
3-1-13
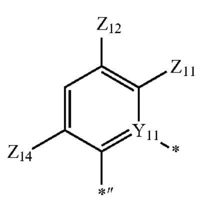
3-1-14
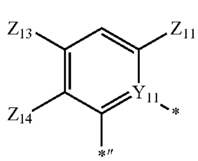
-continued
3-1-15
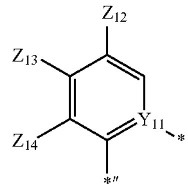
3-1-16
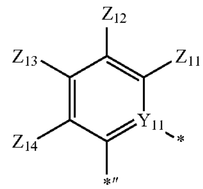
3-1(1)
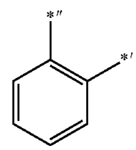
3-1(2)
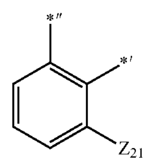
3-1(3)
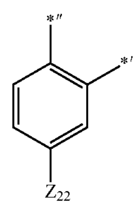
3-1(4)
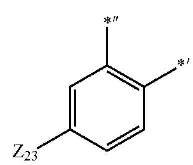
3-1(5)
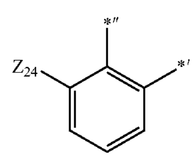
3-1(6)
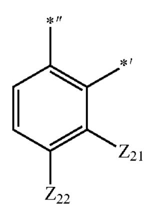
3-1(7)
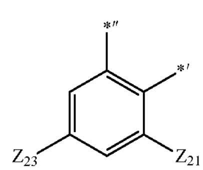

-continued 3-1(8)

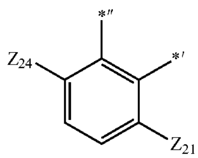

3-1(9)

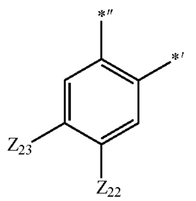

3-1(10)

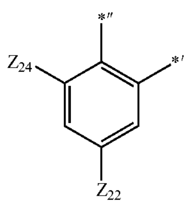

3-1(11)

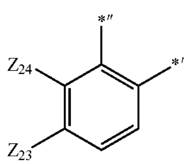

3-1(12)

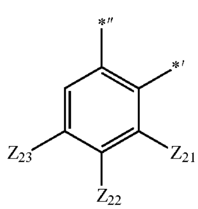

3-1(13)

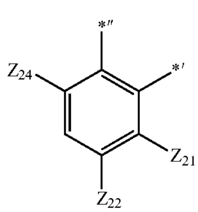

3-1(14)

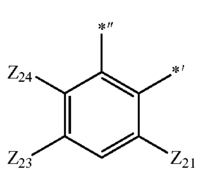

-continued 3-1(15)

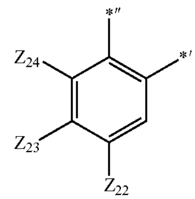

3-1(16)

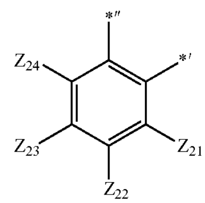

wherein, in Formulae 3-1-1 to 3-1-16 and 3-1(1) to 3-1(16), $Z_{11}$ to $Z_{14}$ may respectively be understood by referring to the descriptions of $Z_{11}$ to $Z_{14}$ provided herein, $Z_{21}$ to $Z_{24}$ may each be understood by referring to the descriptions of $Z_2$ provided herein, wherein $Z_{11}$ to $Z_{14}$ and $Z_{21}$ to $Z_{24}$ may not each be hydrogen,

* and *' each indicate a bonding site to M in Formula 1, and

*" indicates a bonding site to an adjacent atom.

In Formula 2, i) at least two groups from a plurality of $R_1$ groups may optionally be bonded to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, ii) at least two groups from a plurality of $R_2$ groups may optionally be bonded to from a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and iii) $R_1$ and $R_2$ may optionally be bonded to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

$R_{10a}$ as used herein may be understood by referring to the description of $R_1$ provided herein.

In Formula 2, * and *' each indicate a bonding site to M in Formula 1.

In one or more embodiments, the organometallic compound represented by Formula 1 may include at least one deuterium.

In some embodiments, $L_1$ in Formula 1 may include at least one deuterium.

In some embodiments, in Formula 1, n2 may not be 0, and $L_2$ may include at least one deuterium.

In some embodiments, the organometallic compound represented by Formula 1 may be one of Compounds 1 to 2023:

1
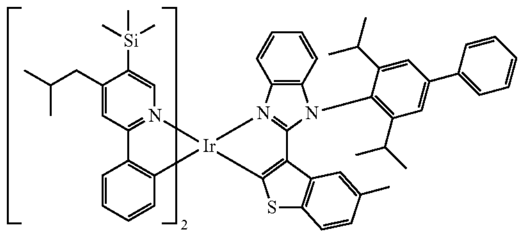
2
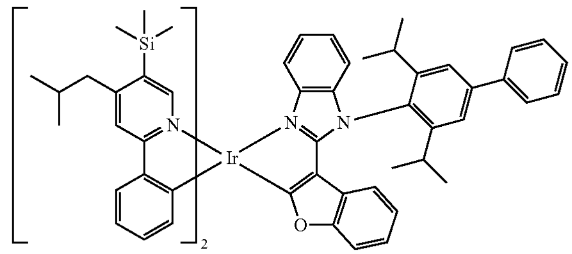
3
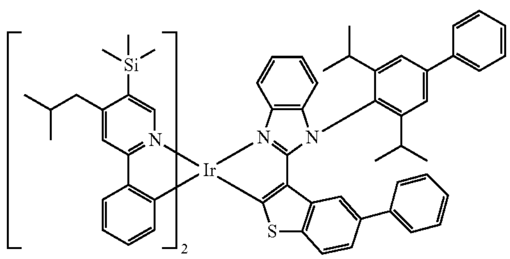
4
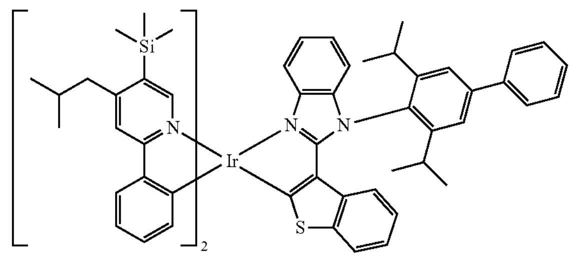
5
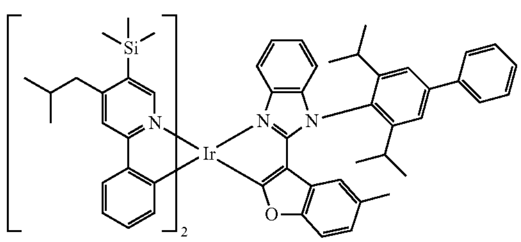
6
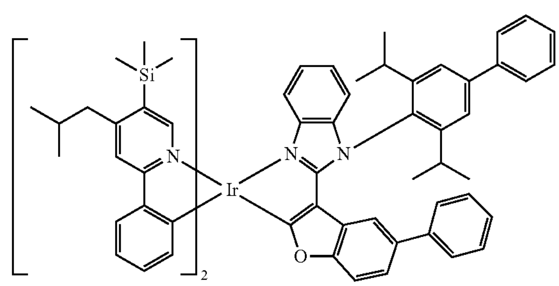
7
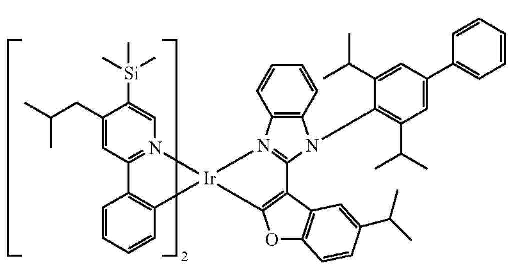
8
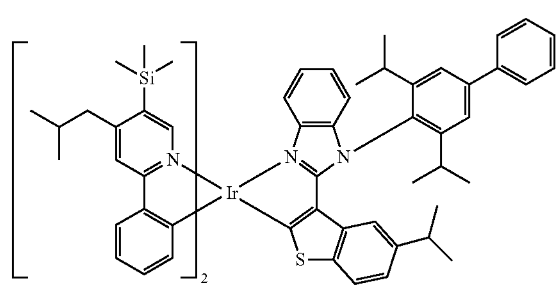
9
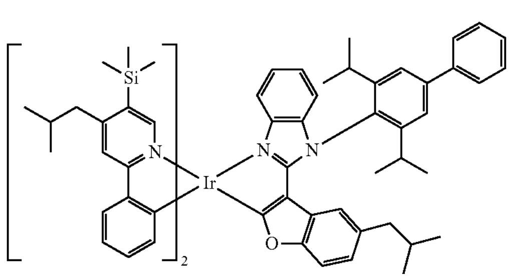
10
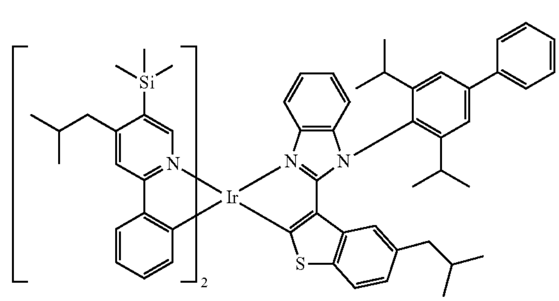

-continued
11
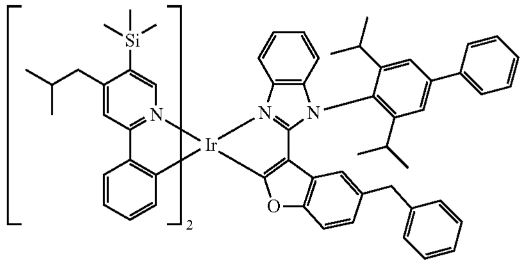
12
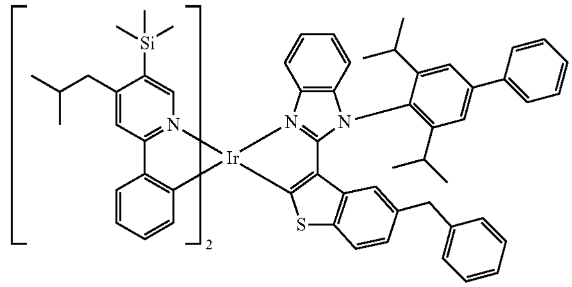
13
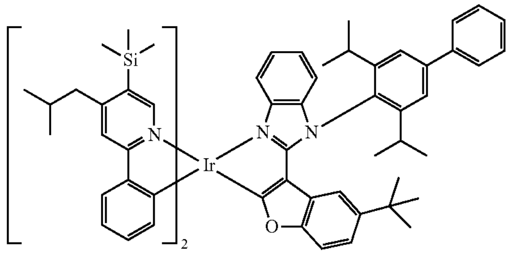
14
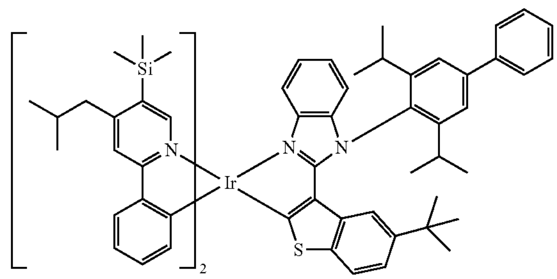
15
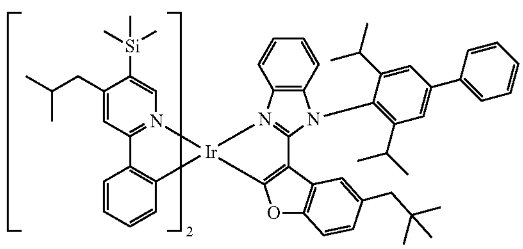
16
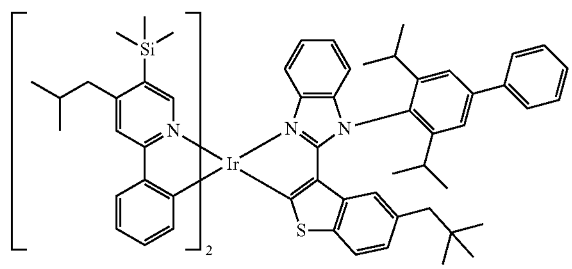
17
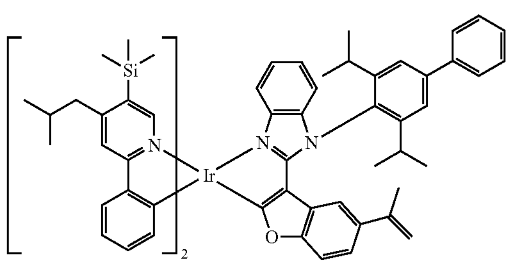
18
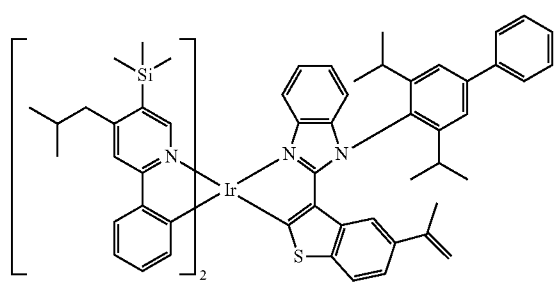
19
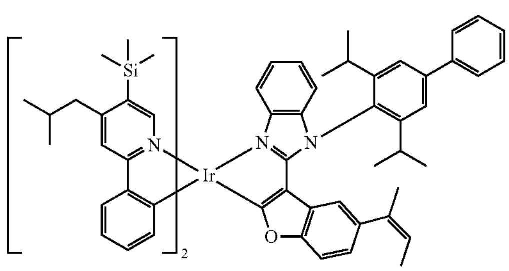
20
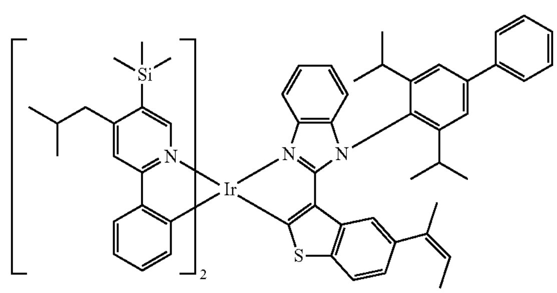

-continued
21
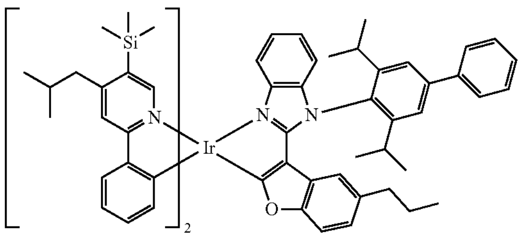
22
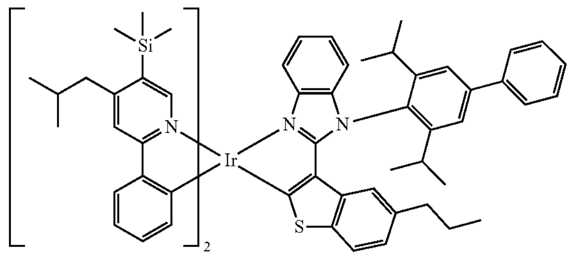
23
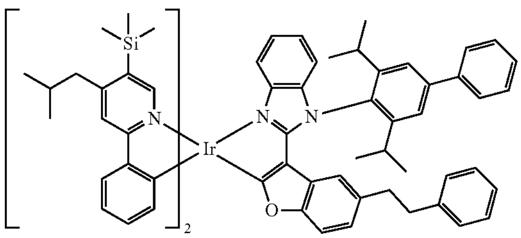
24
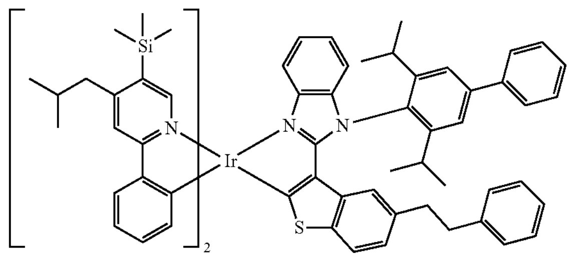
25
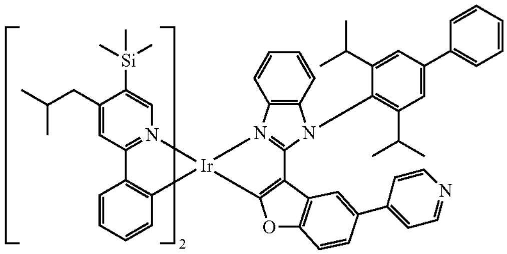
26
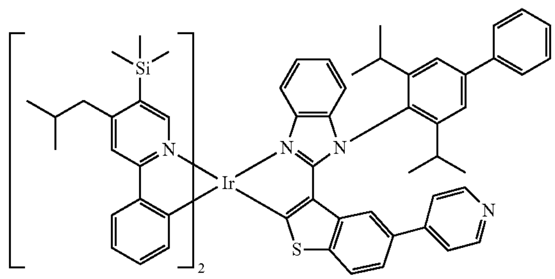
27
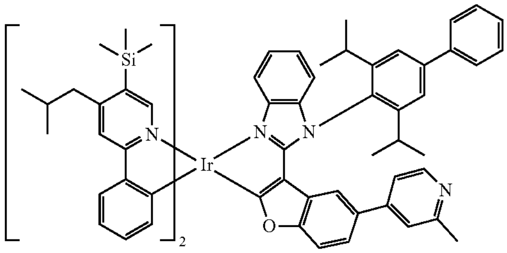
28
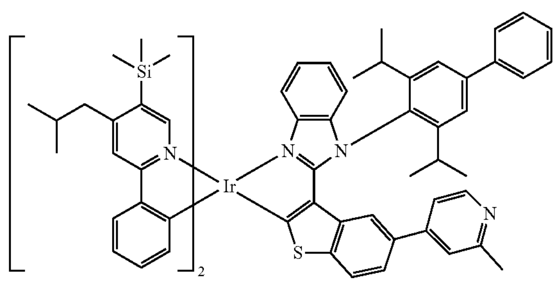
29
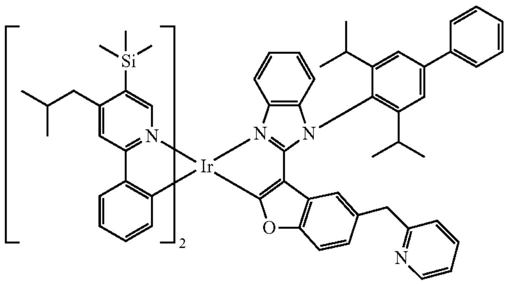
30
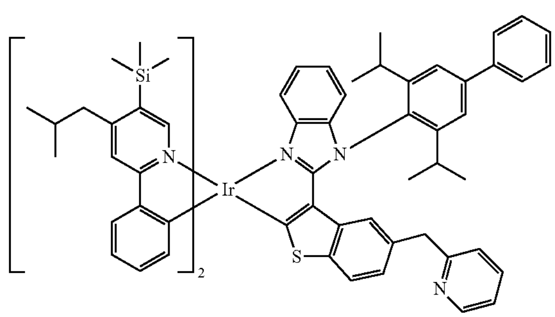

-continued
31
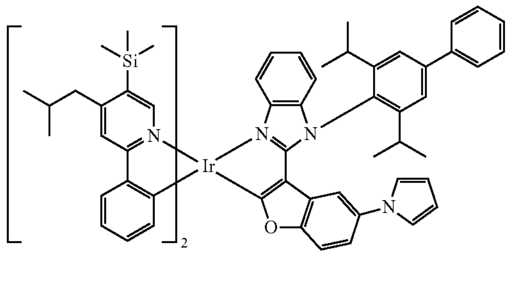
32
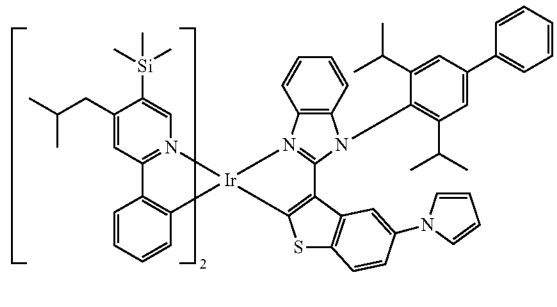
33
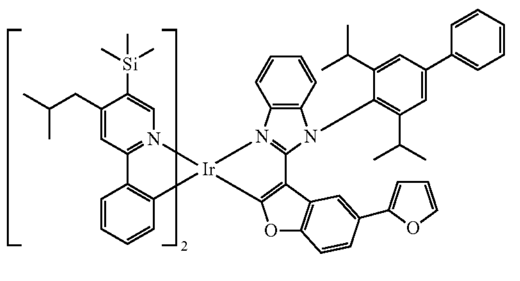
34
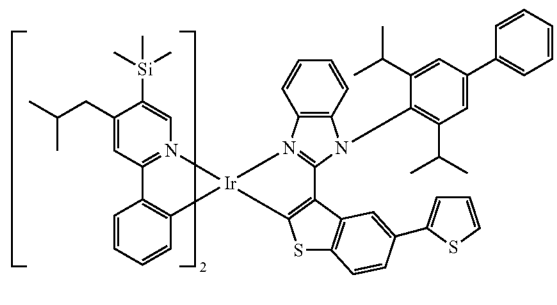
35
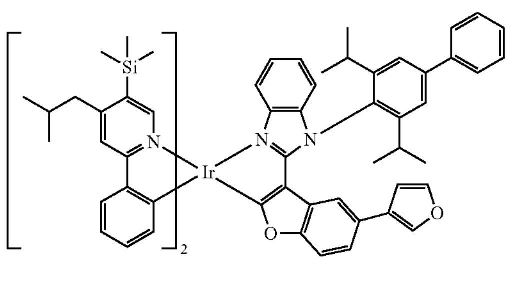
36
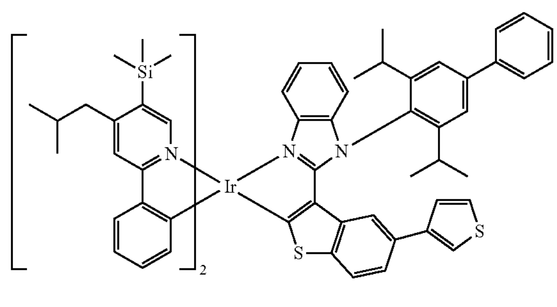
37
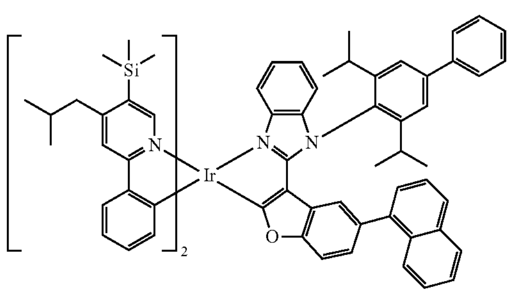
38
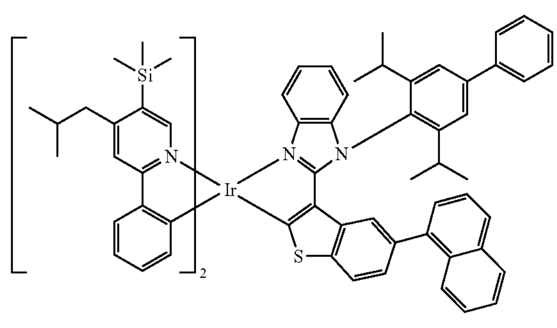
39
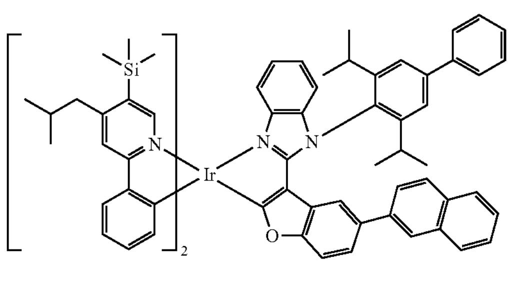
40
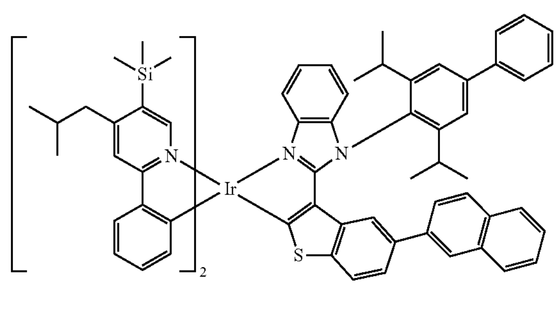

-continued
41
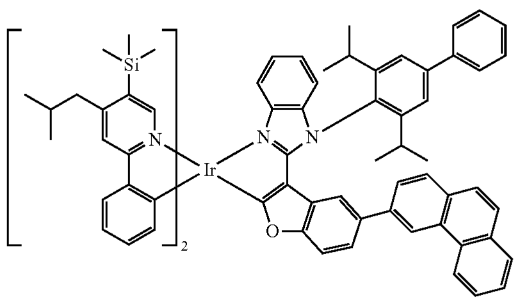
42
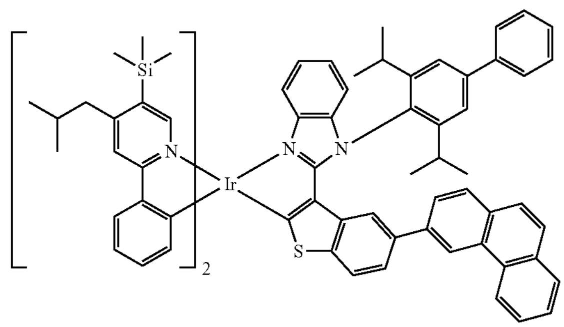
43
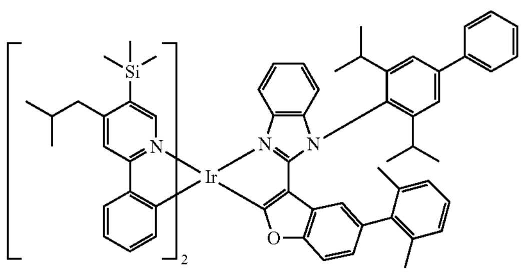
44
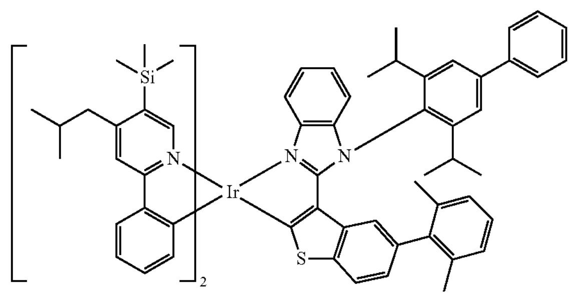
45
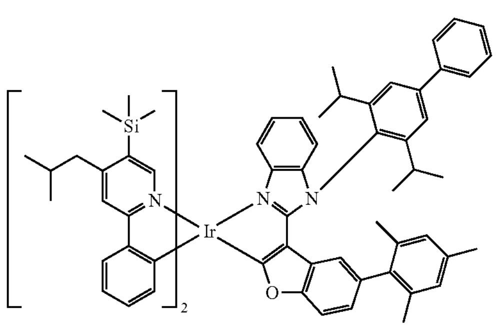
46
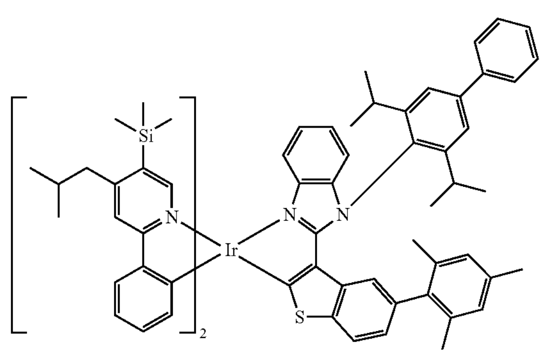
47
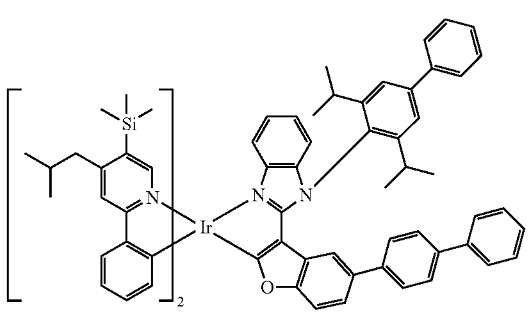
48
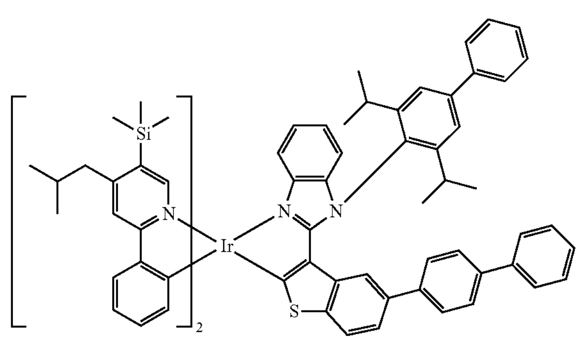

-continued
49
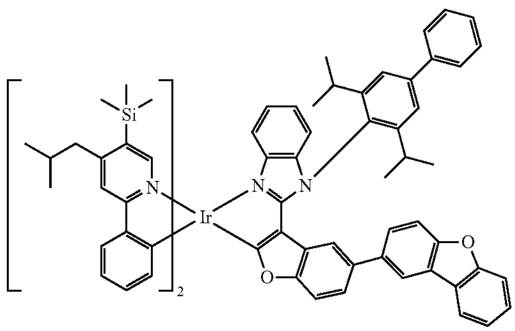
50
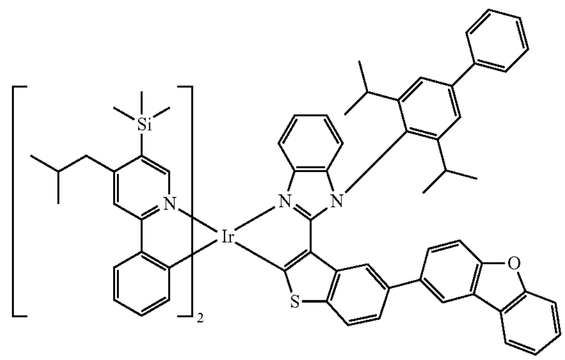
51
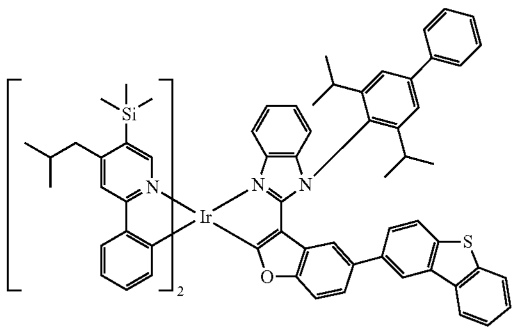
52
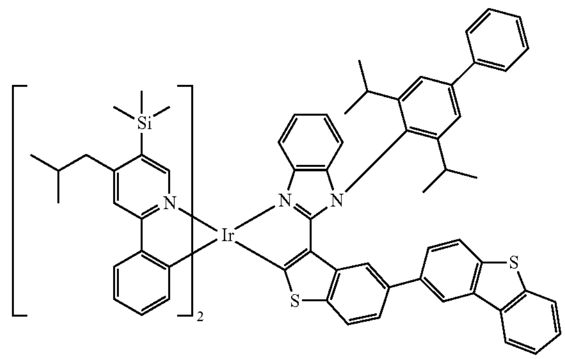
53
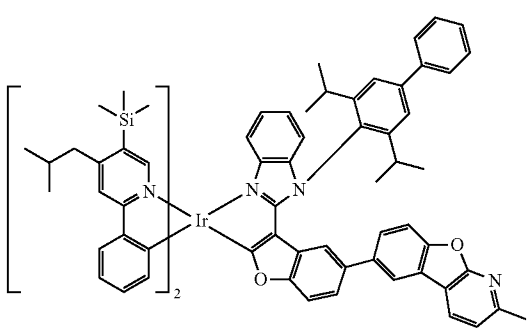
54
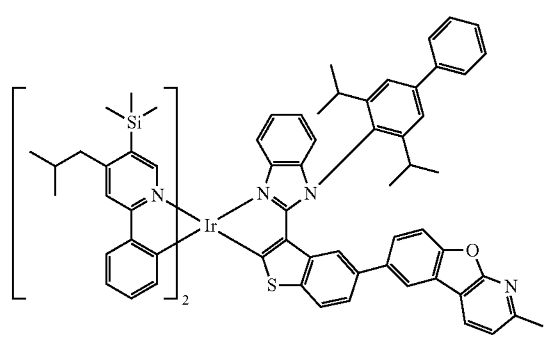
55
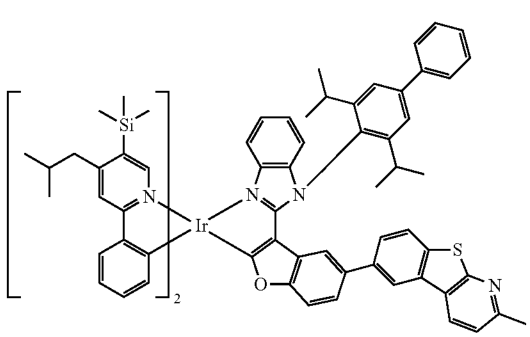
56
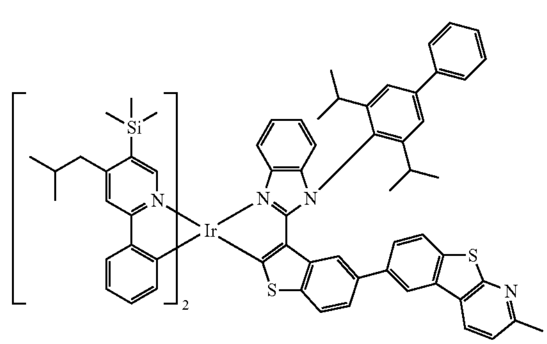

-continued
57
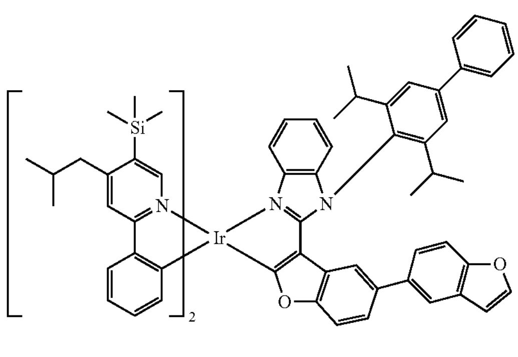
58
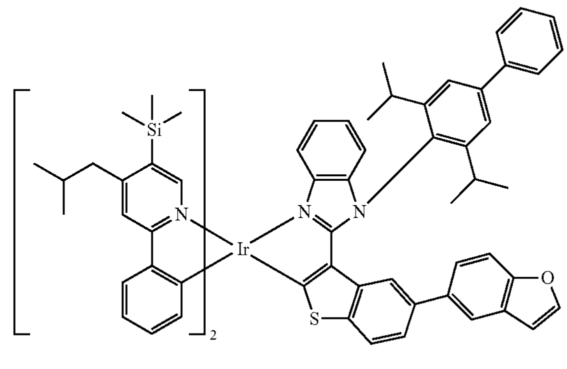
59
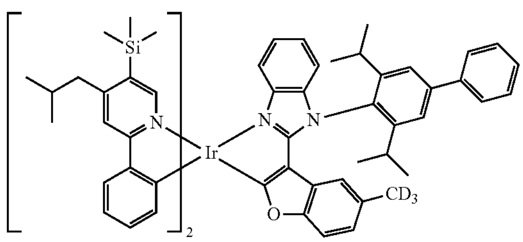
60
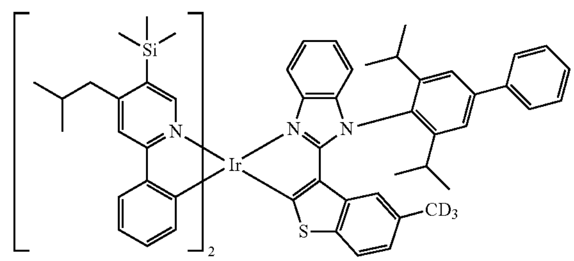
61
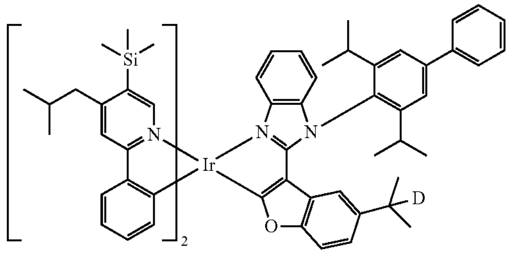
62
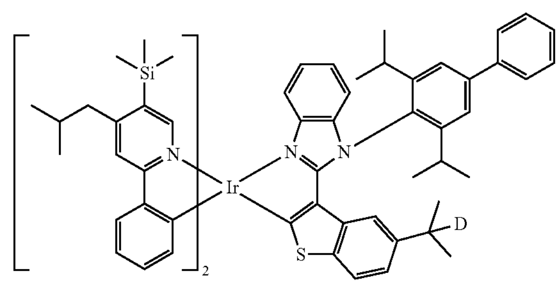
63
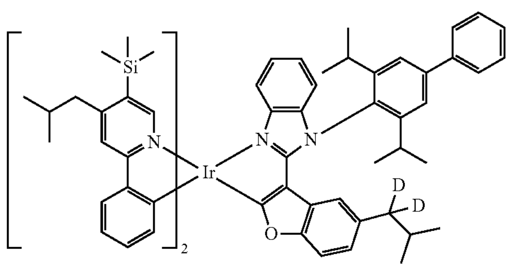
64
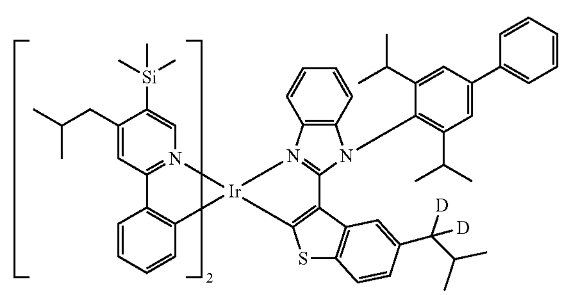
65
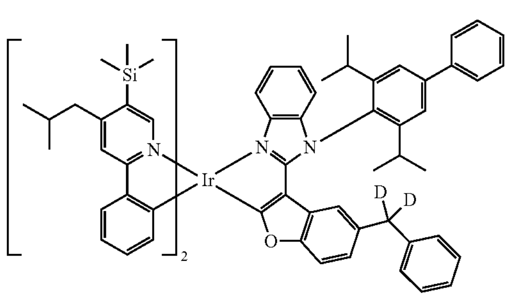
66
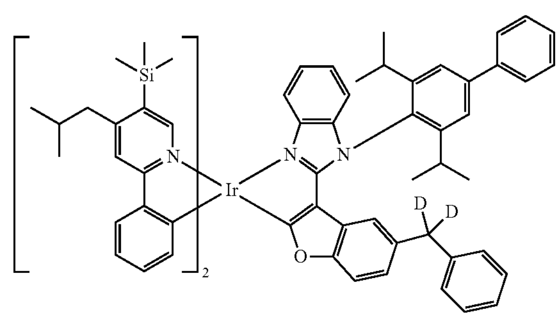

-continued
67
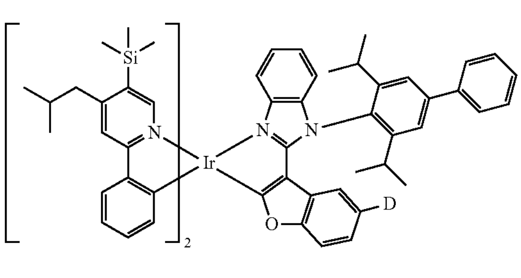
68
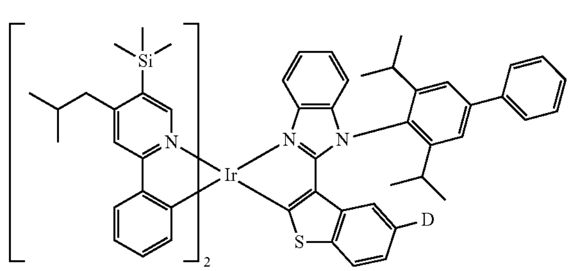
69
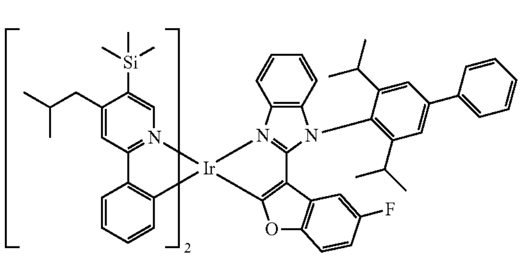
70
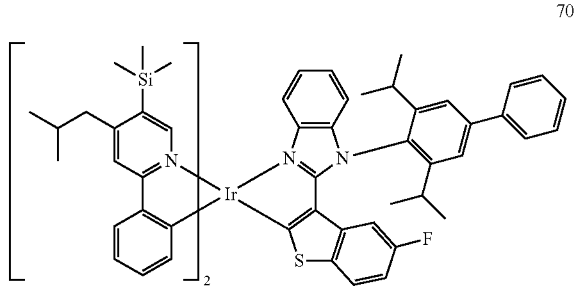
71
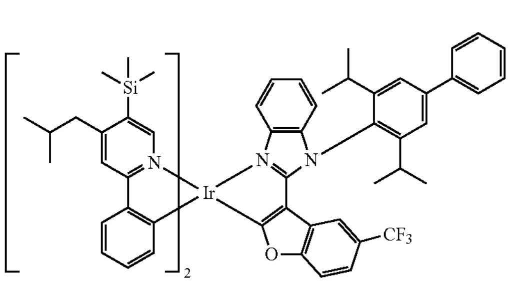
72
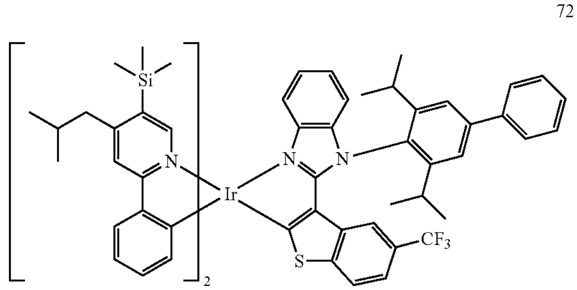
73
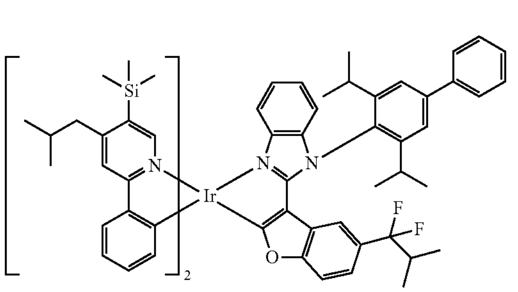
74
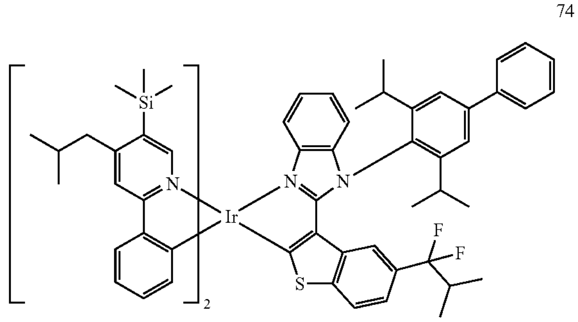
75
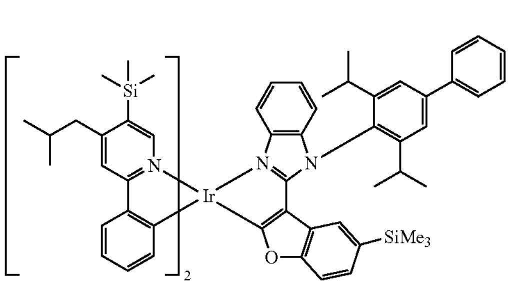
76
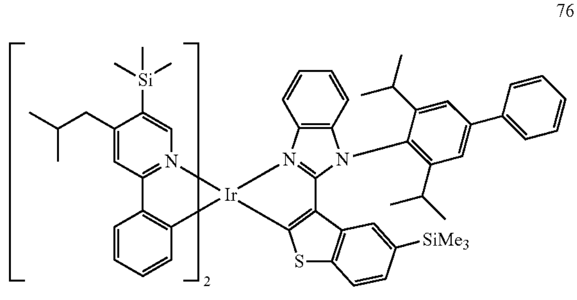

-continued
77
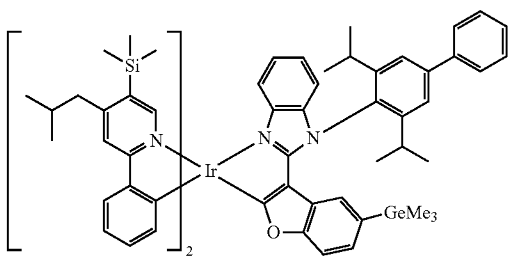
78
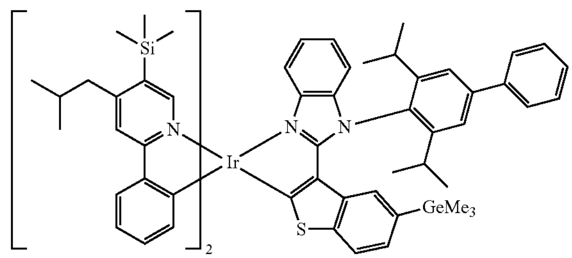
79
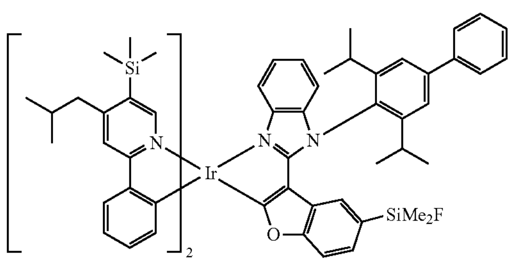
80
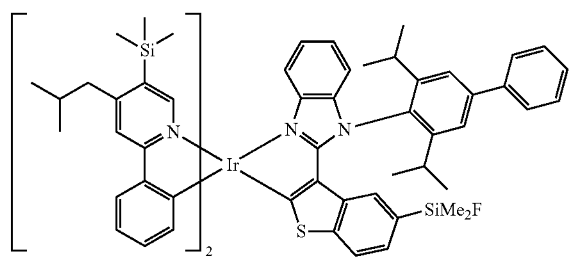
81
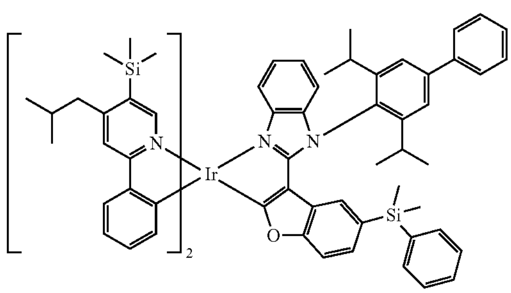
82
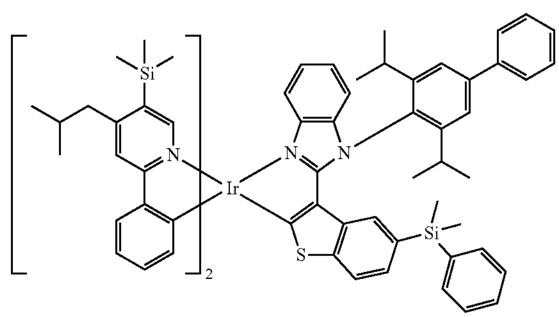
83
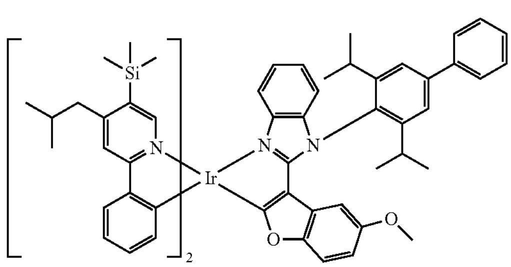
84
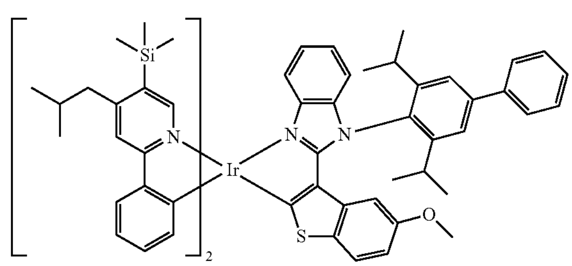
85
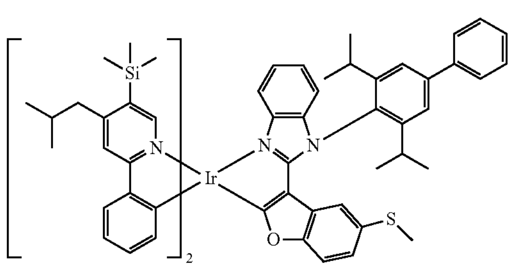
86
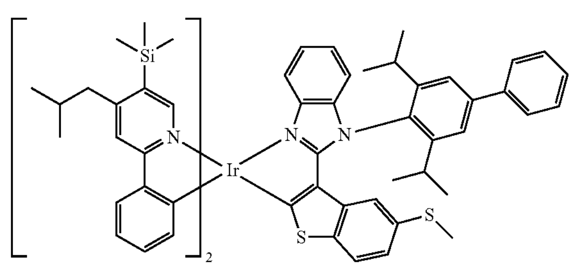

-continued
87
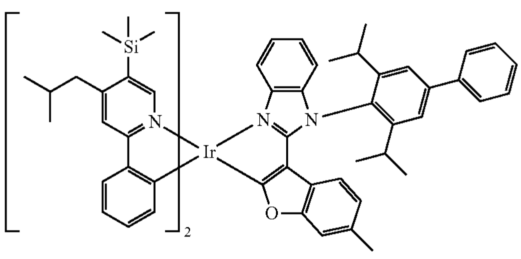
88
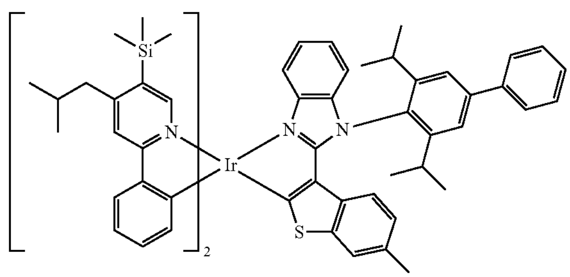
89
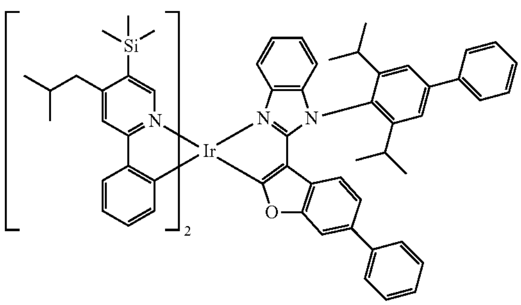
90
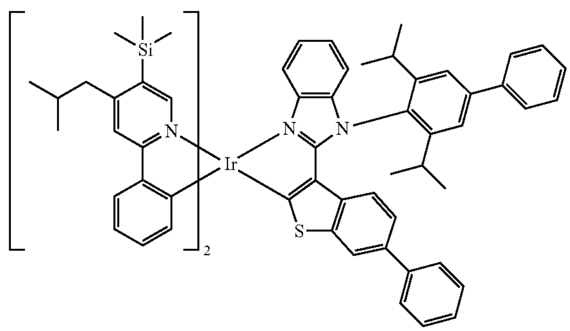
91
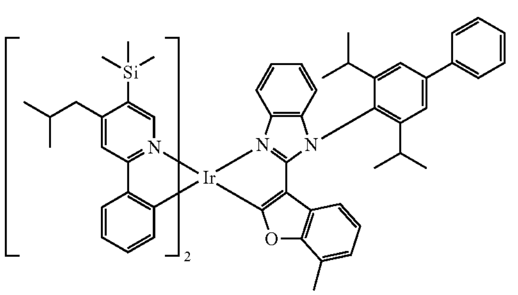
92
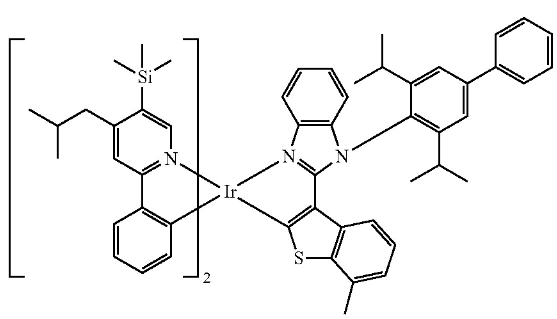
93
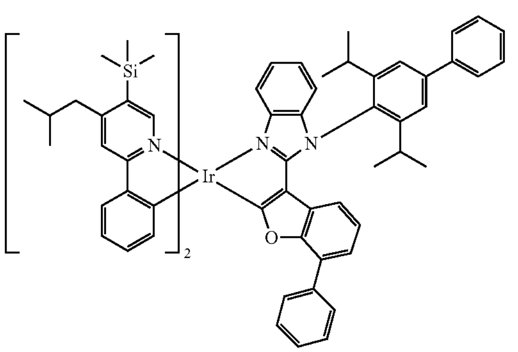
94
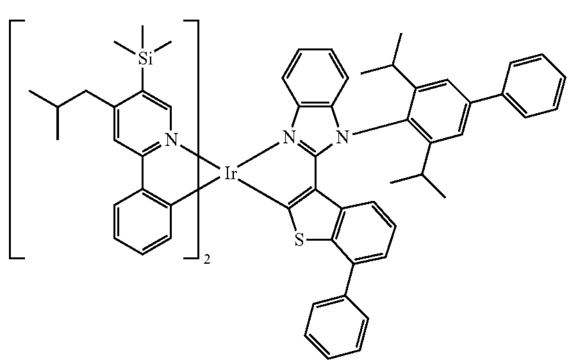

-continued
95
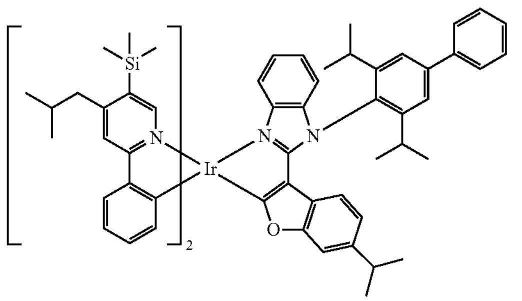
96
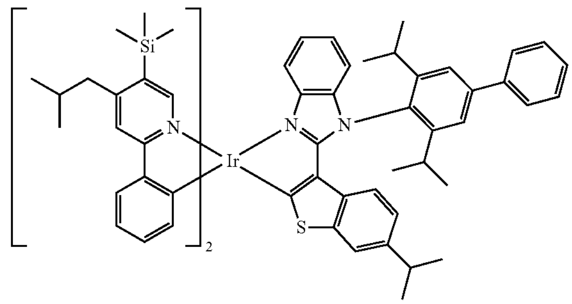
97
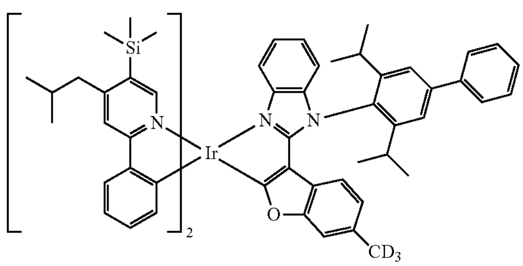
98
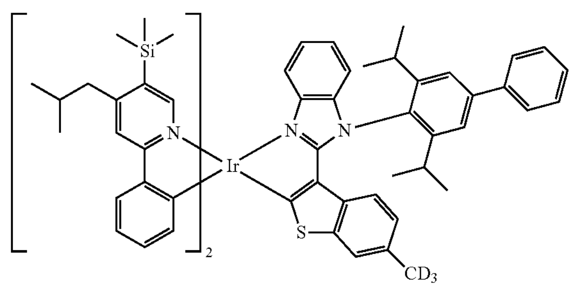
99
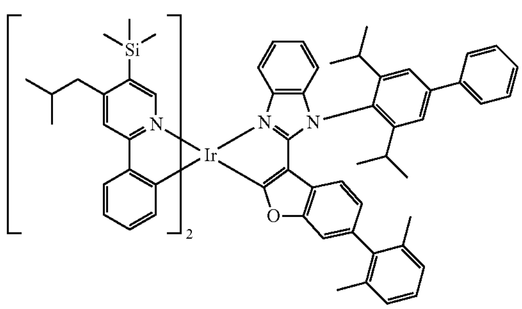
100
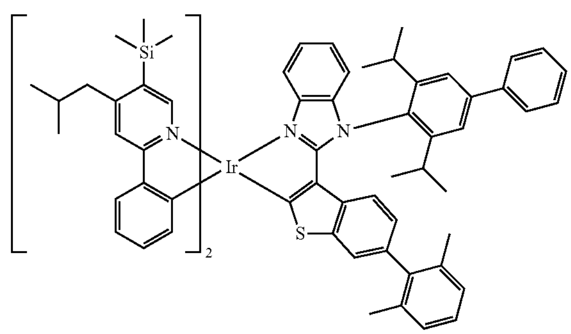
101
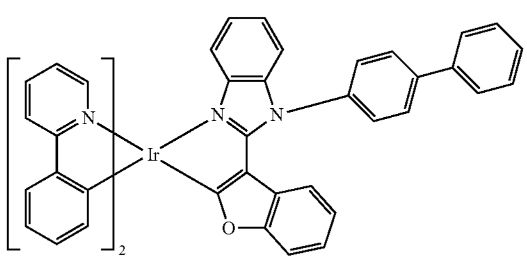
102
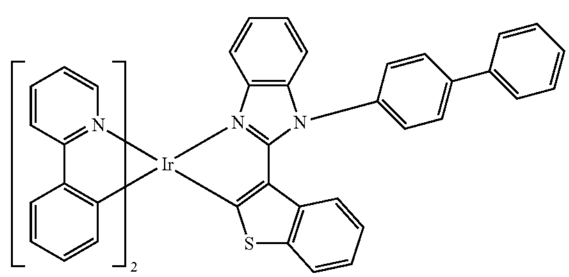
103
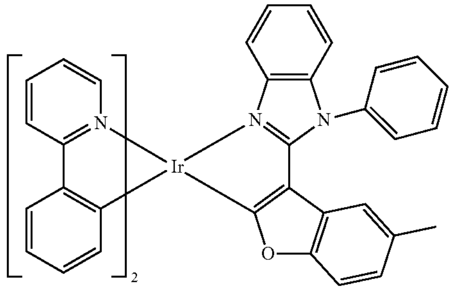
104
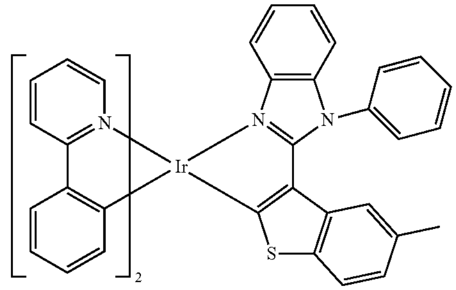

-continued
105
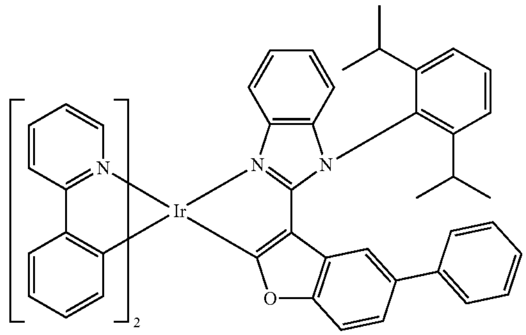
106
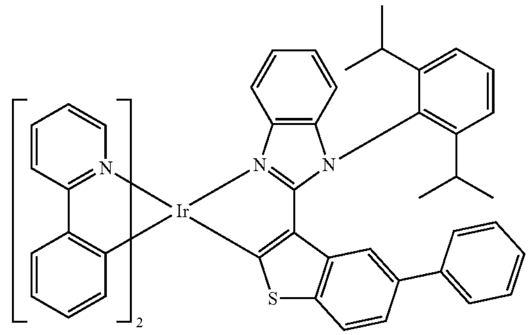
107
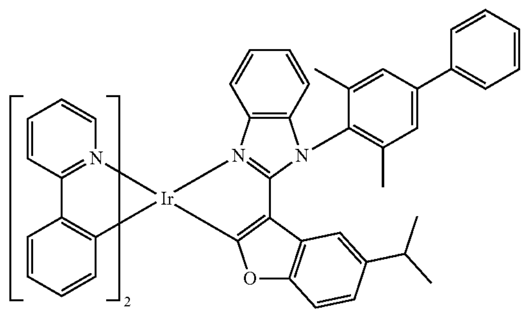
108
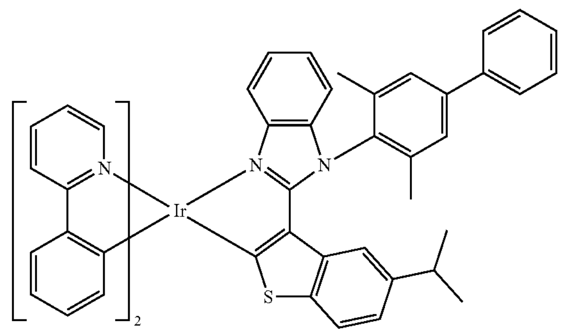
109
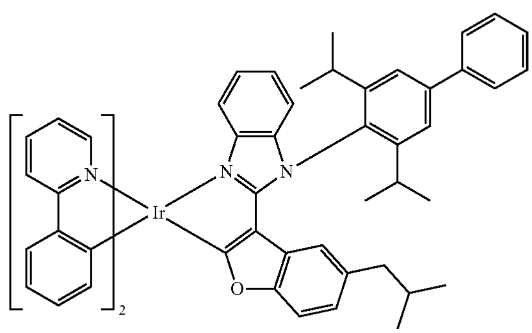
110
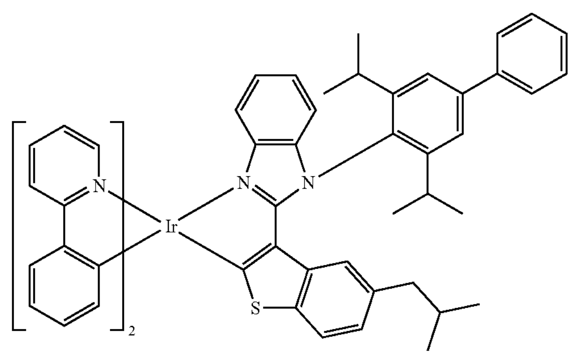
111
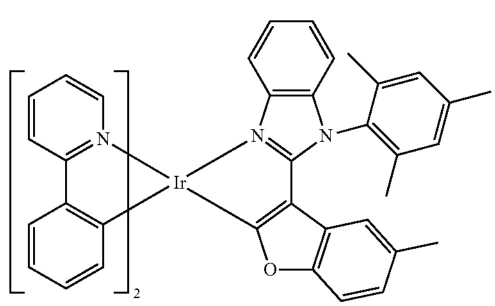
112
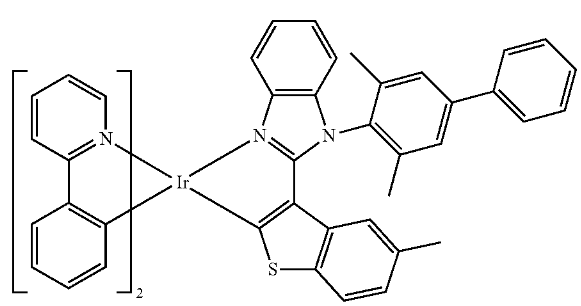

-continued
113
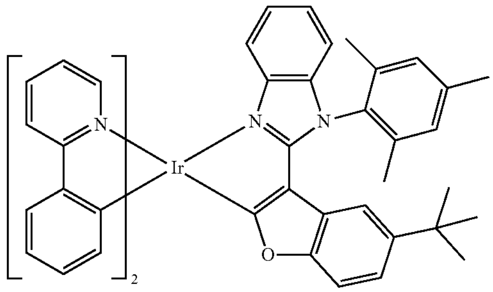
114
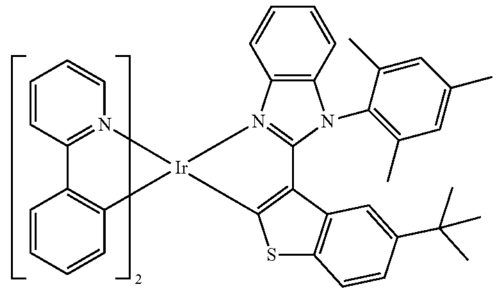
115
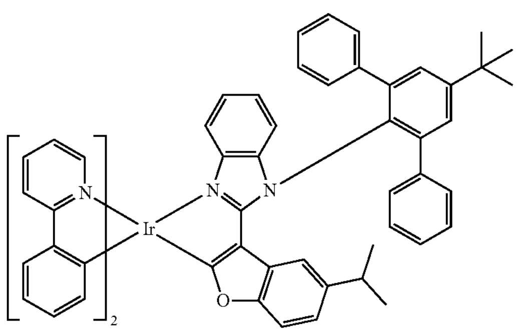
116
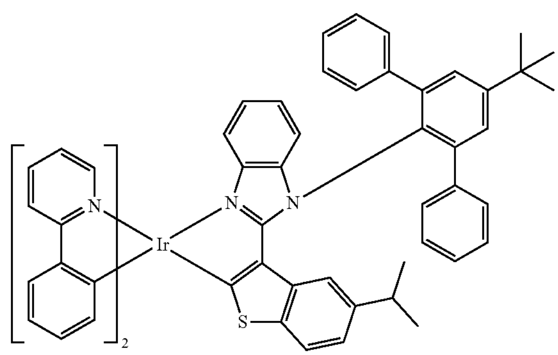
117
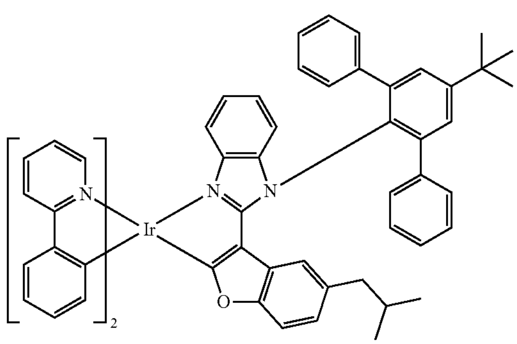
118
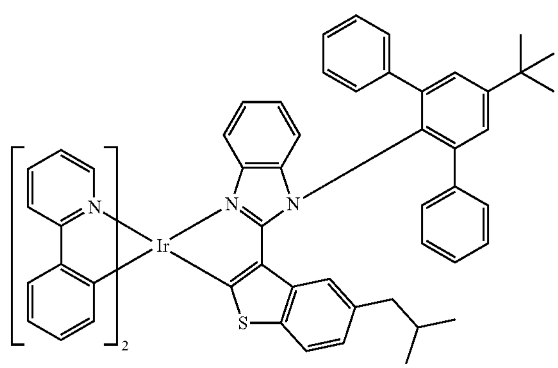
119
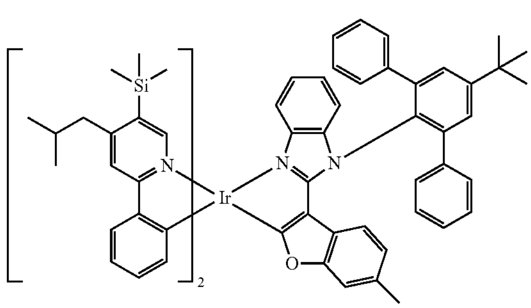
120
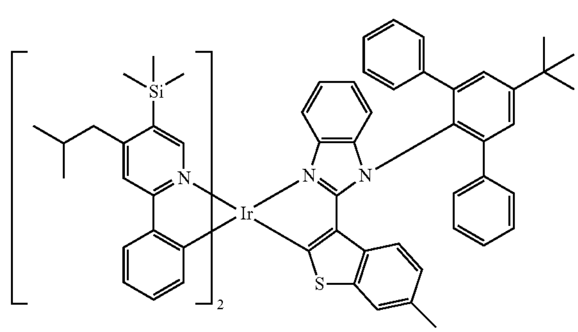

-continued
121
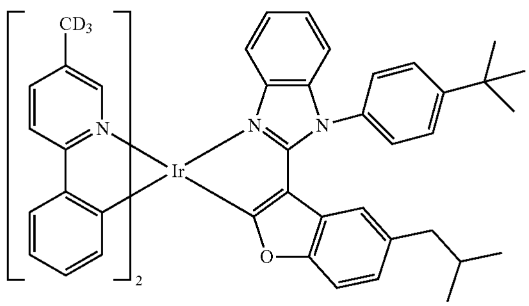
122
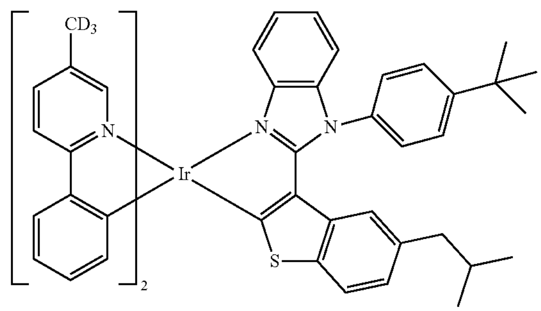
123
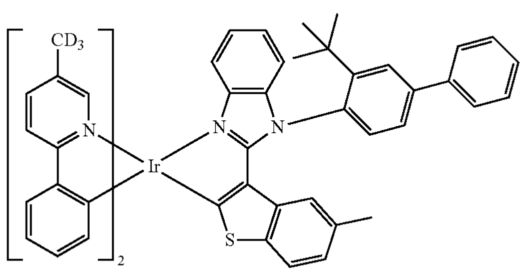
124
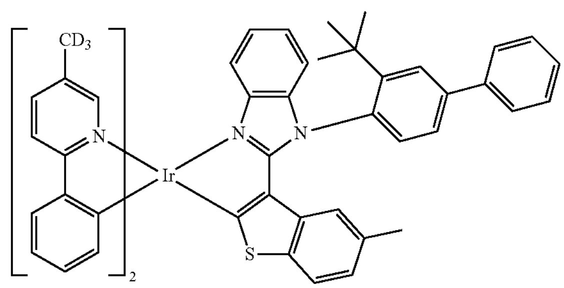
125
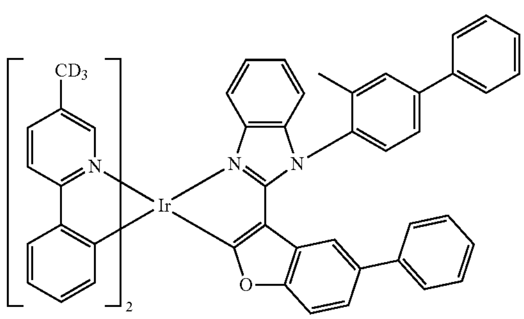
126
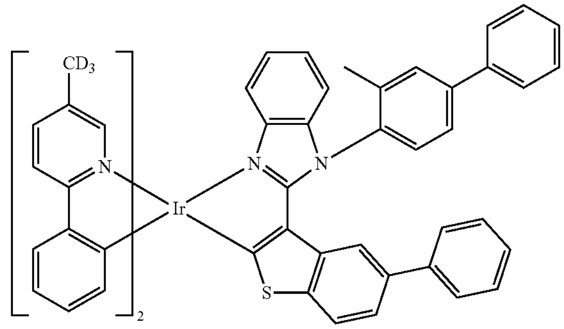
127
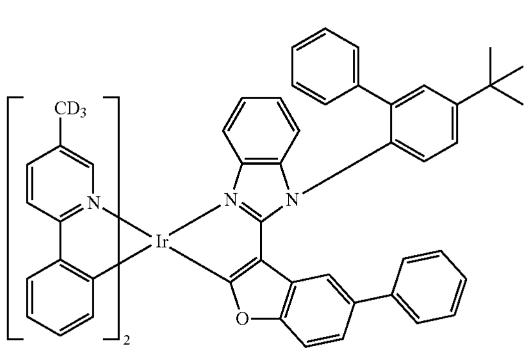
128
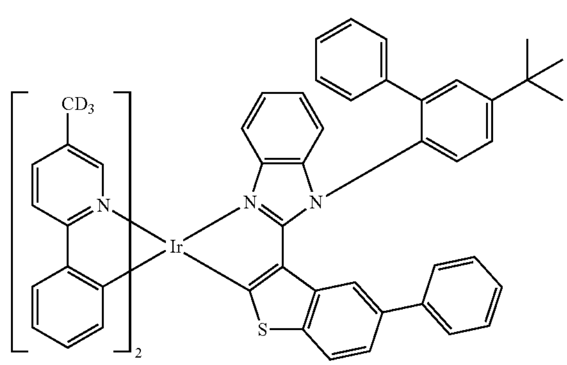

-continued
129
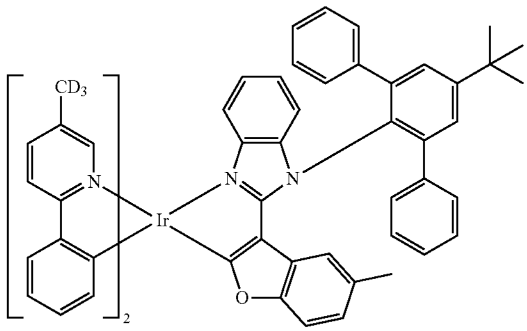
130
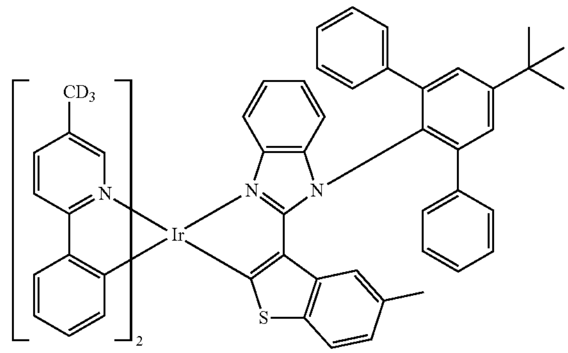
131
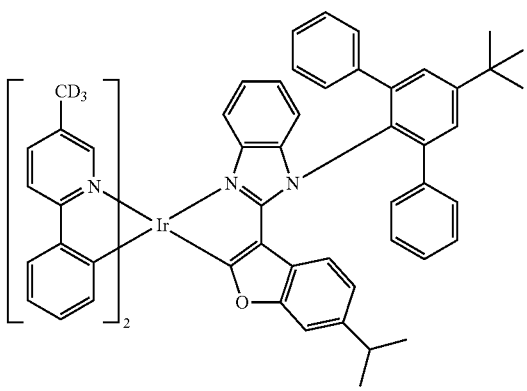
132
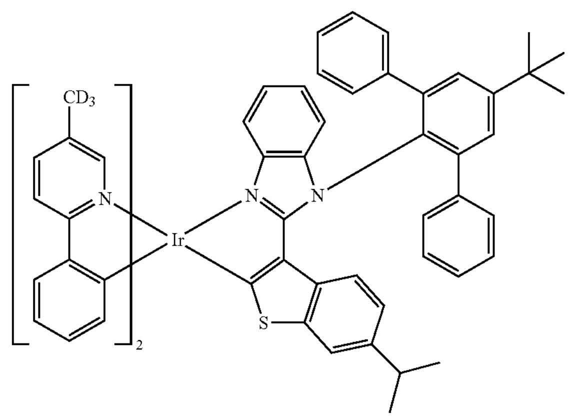
133
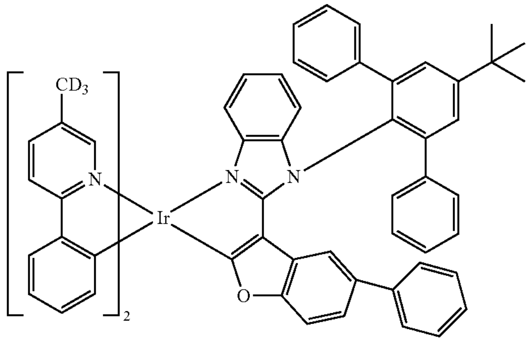
134
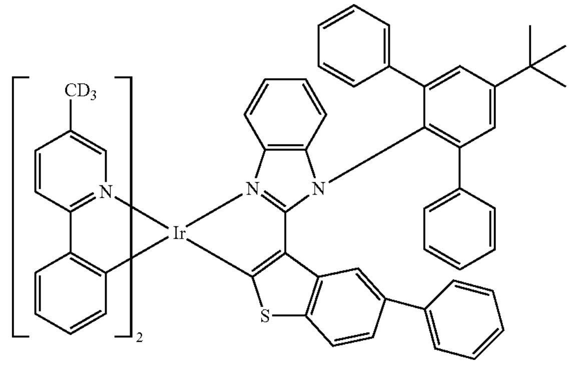

-continued
135
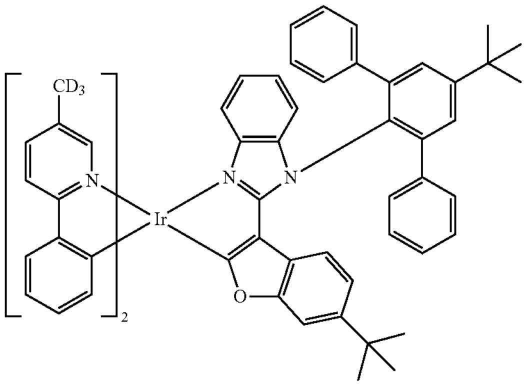
136
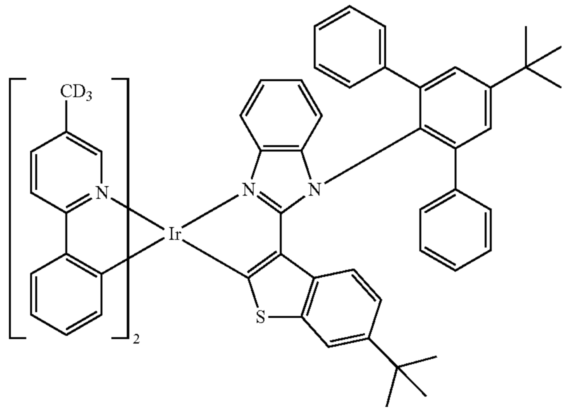
137
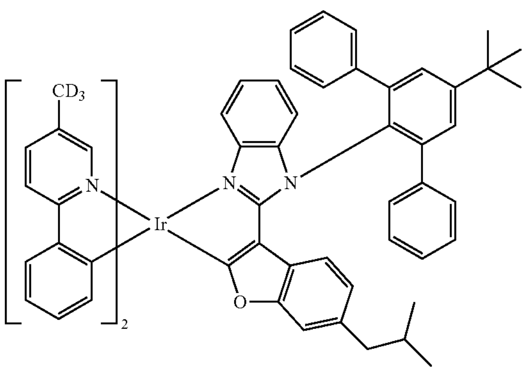
138
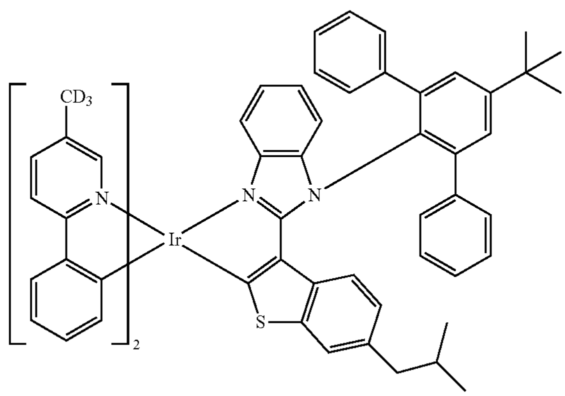
139
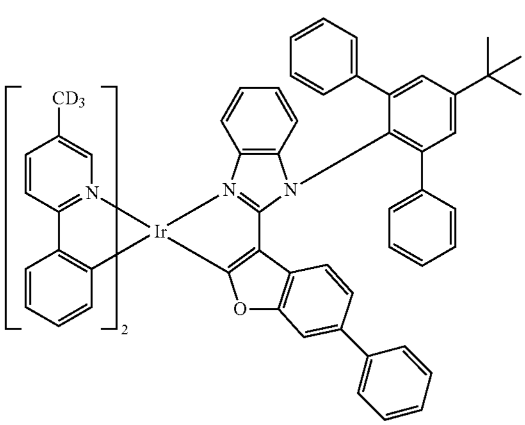
140
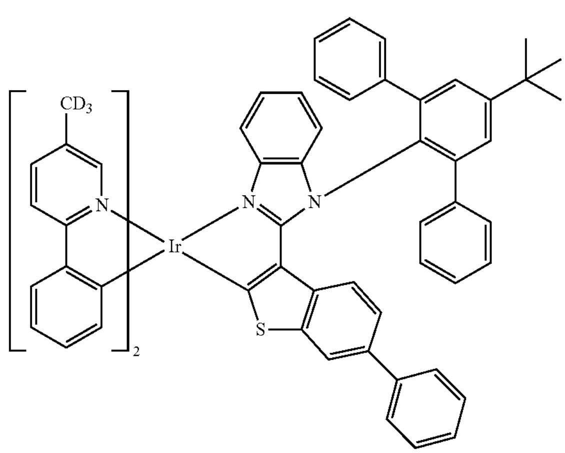

-continued
141
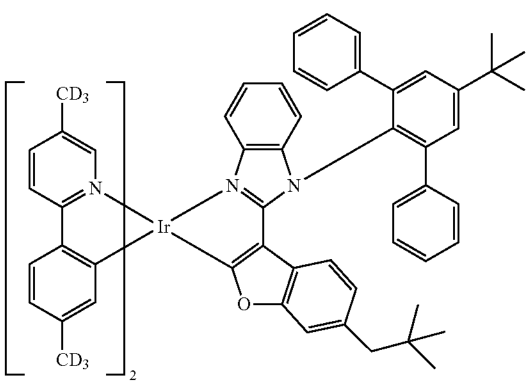
142
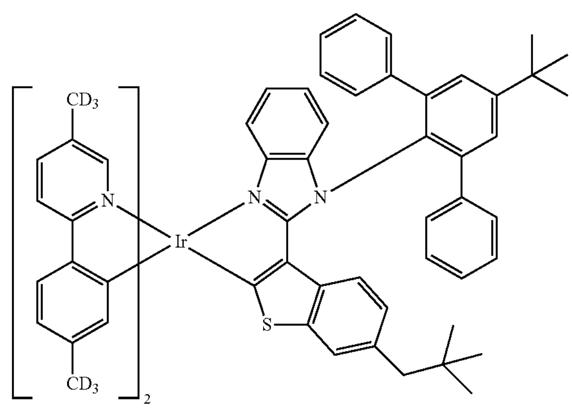
143
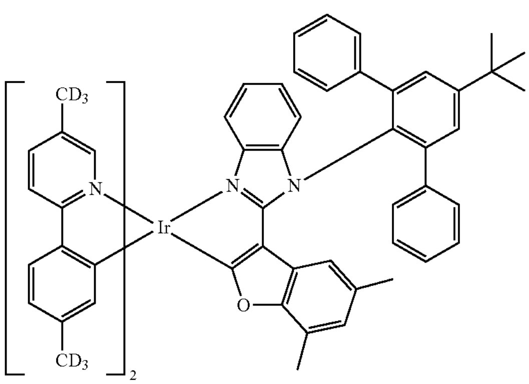
144
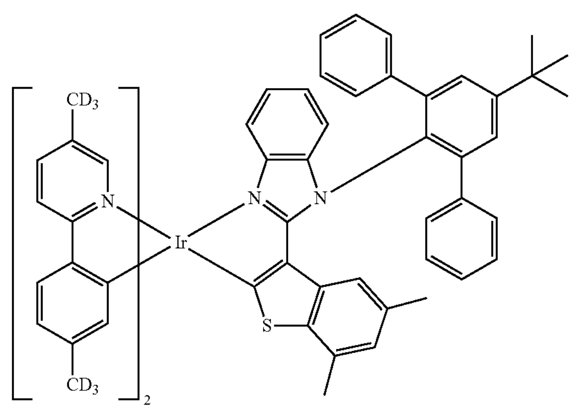
145
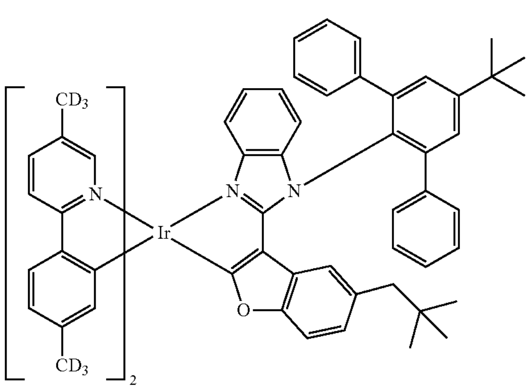
146
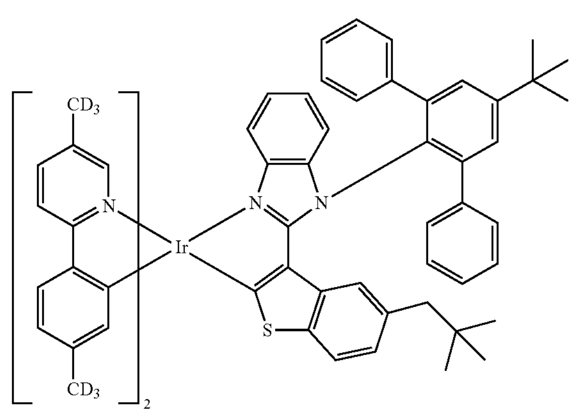

-continued
147
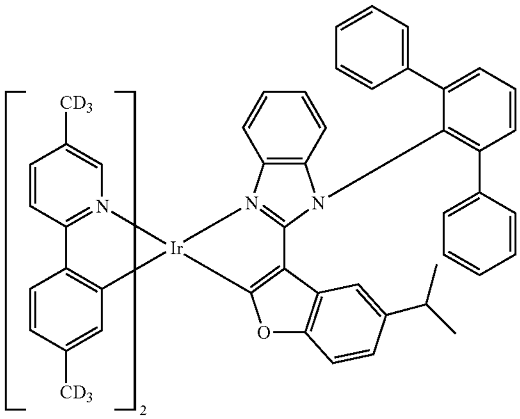
148
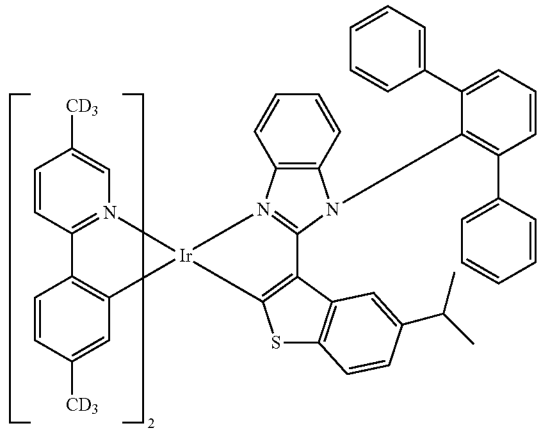
149
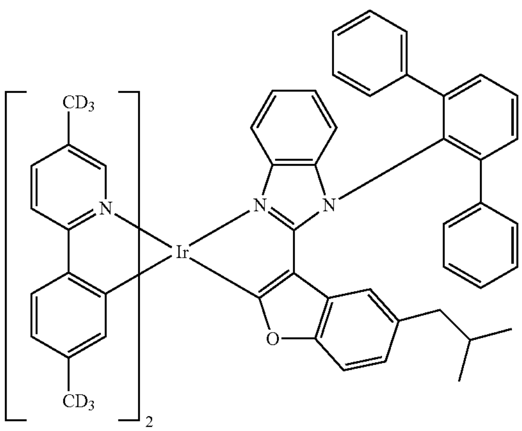
150
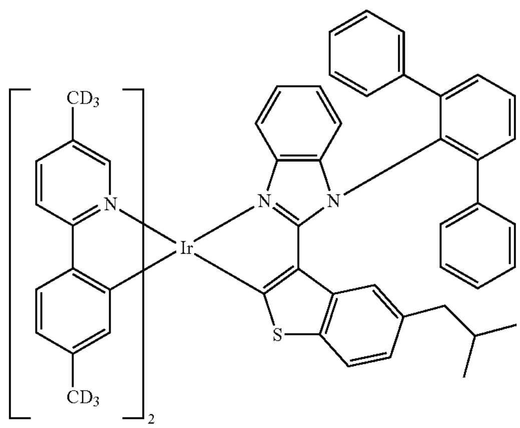
151
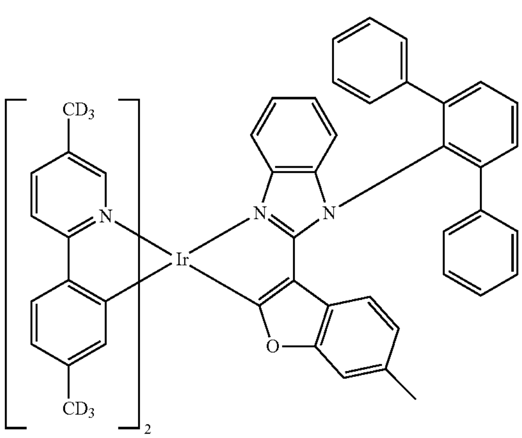
152
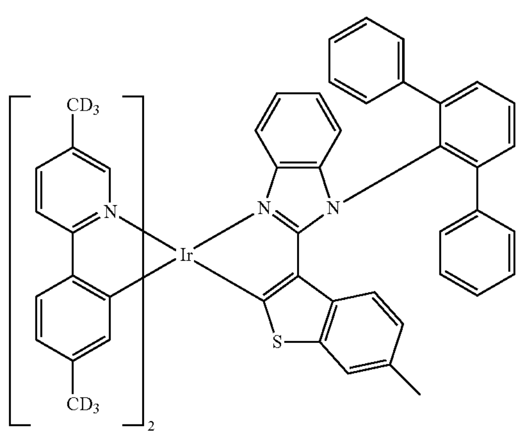

-continued
153
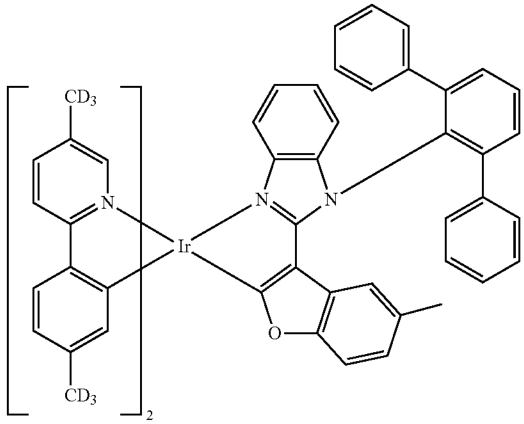
154
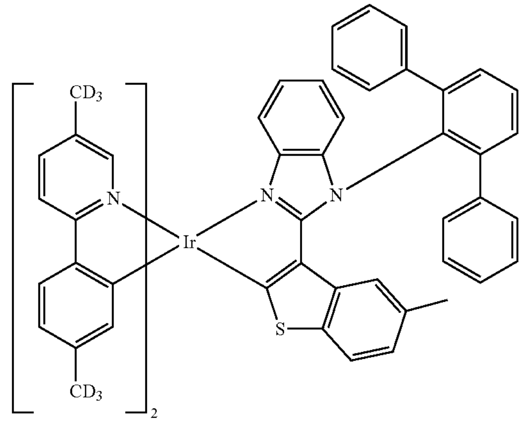
155
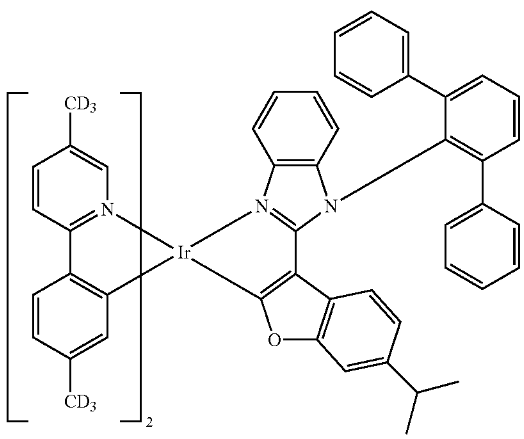
156
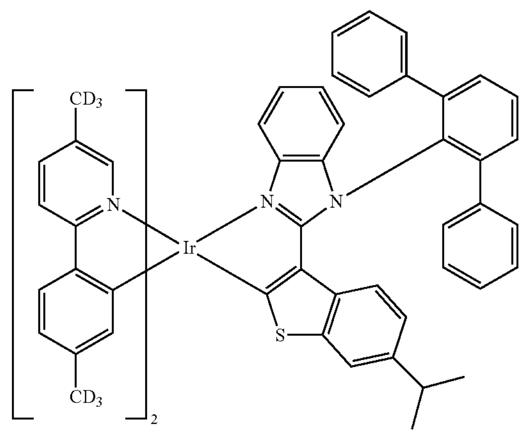
157
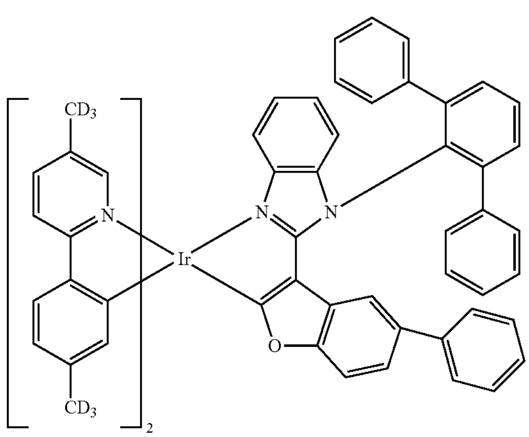
158
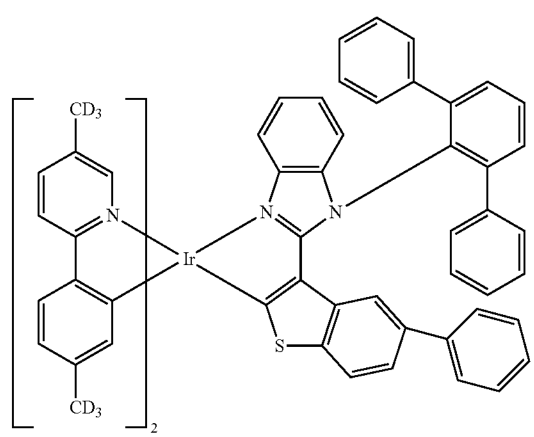

-continued
159
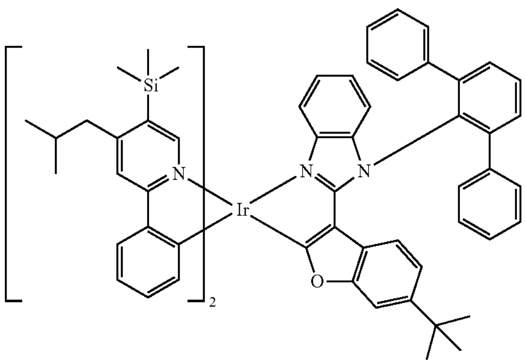
160
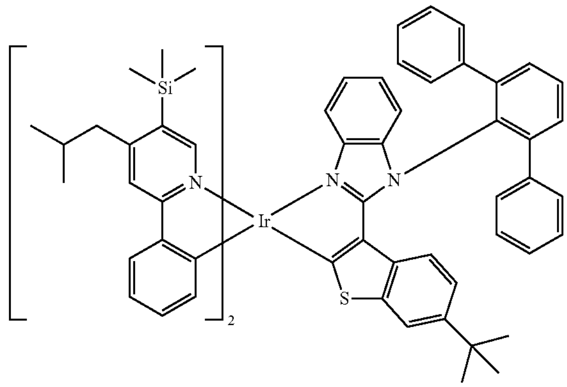
161
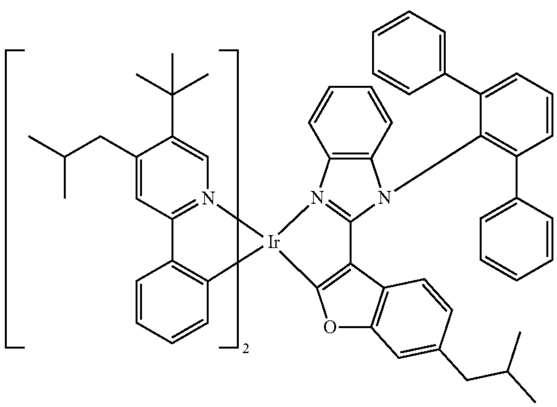
162
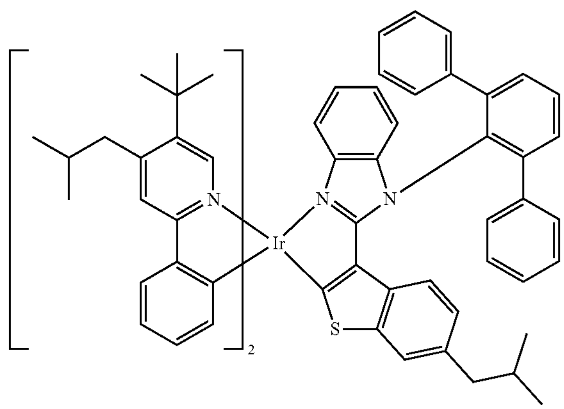
163
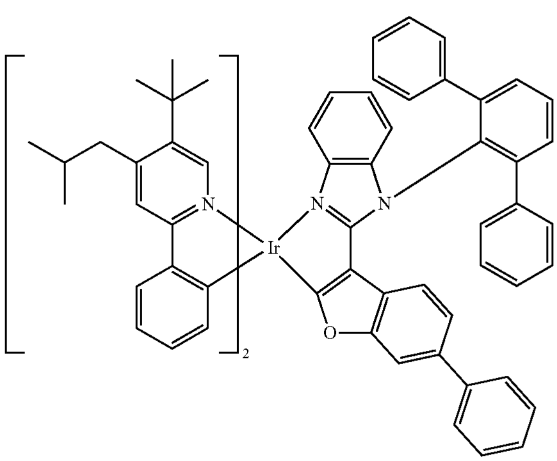
164
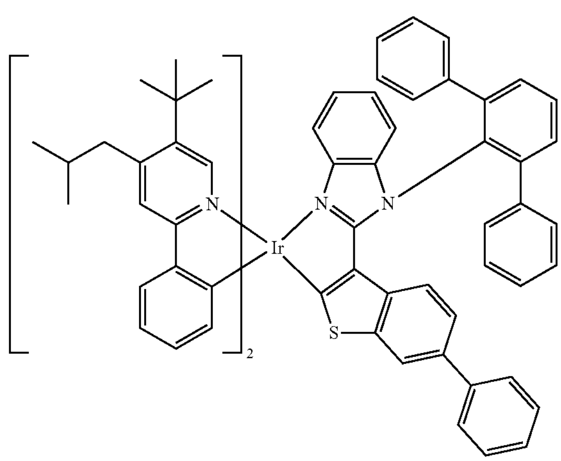

-continued
165
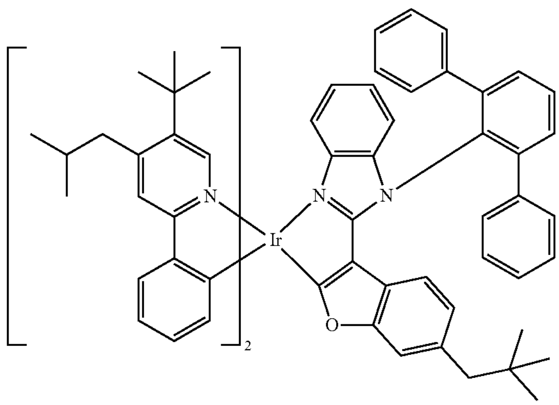
166
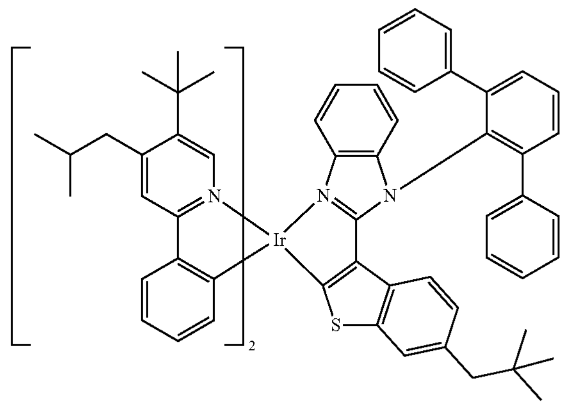
167
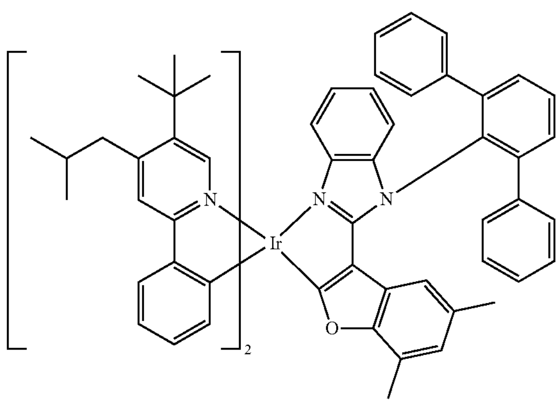
168
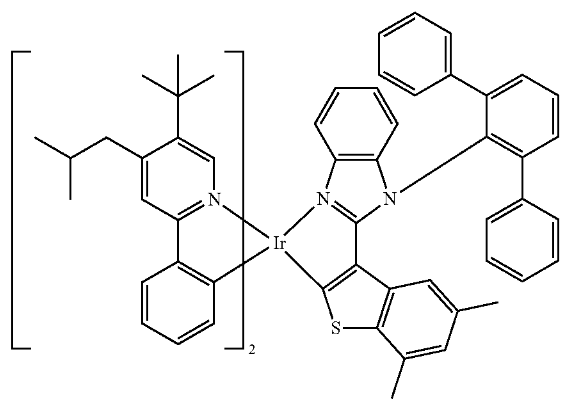
169
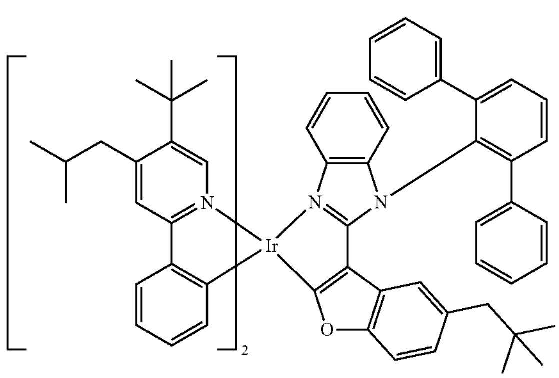
170
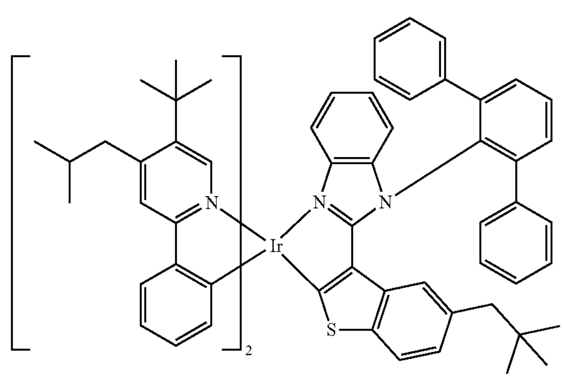
171
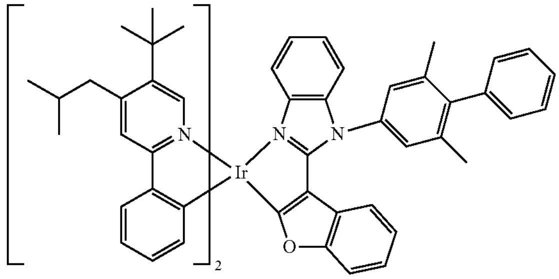
172
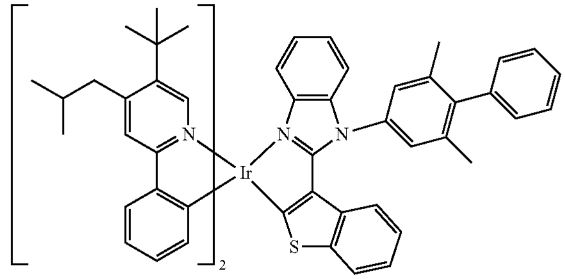

-continued
173
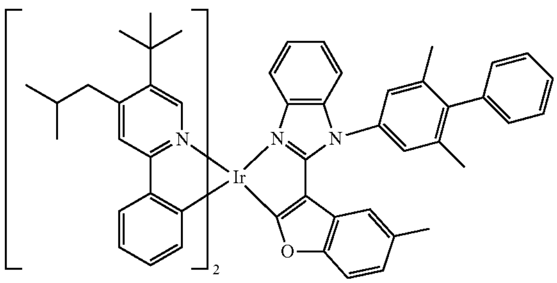
174
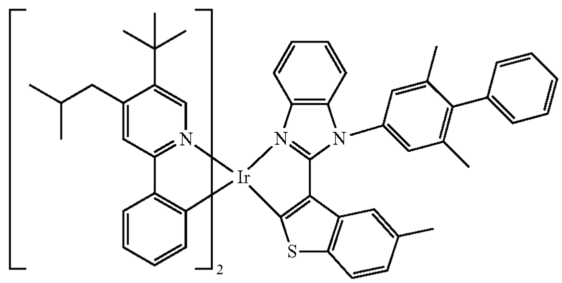
175
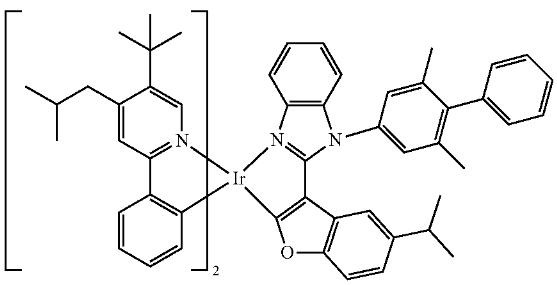
176
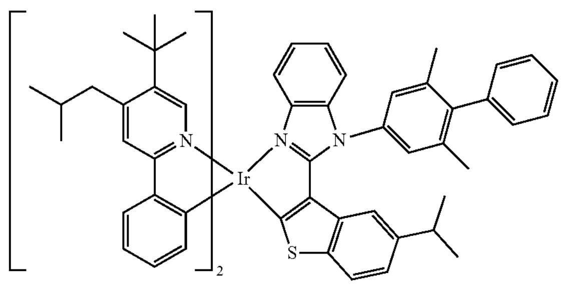
177
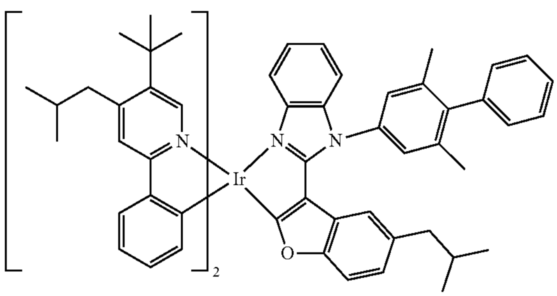
178
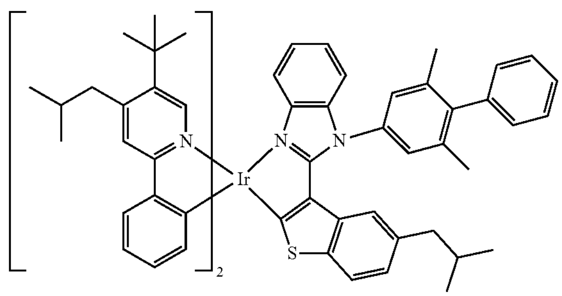
179
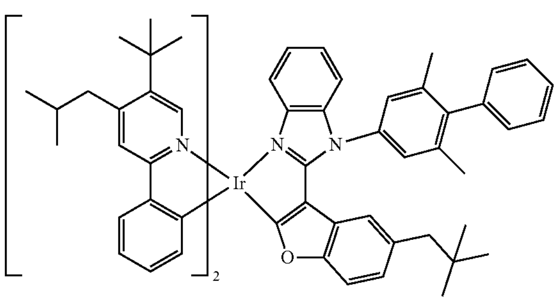
180
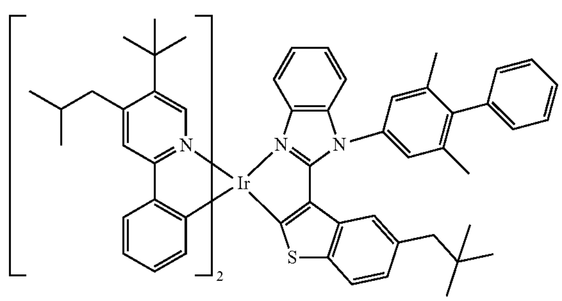
181
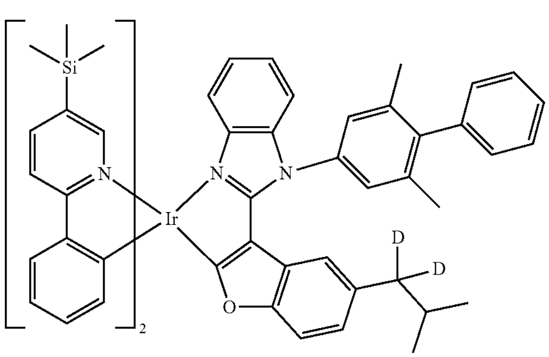
182
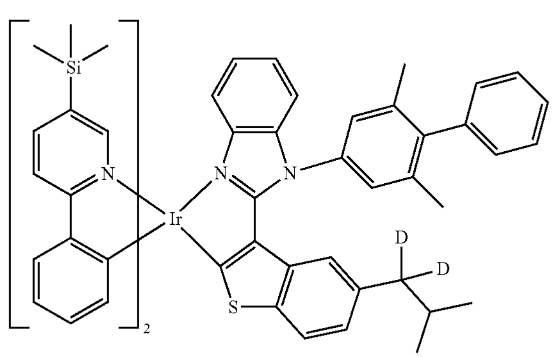

-continued
183
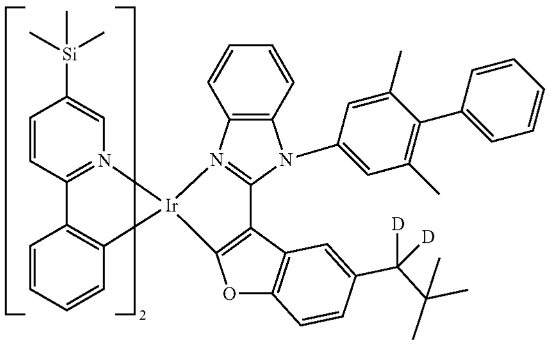
184
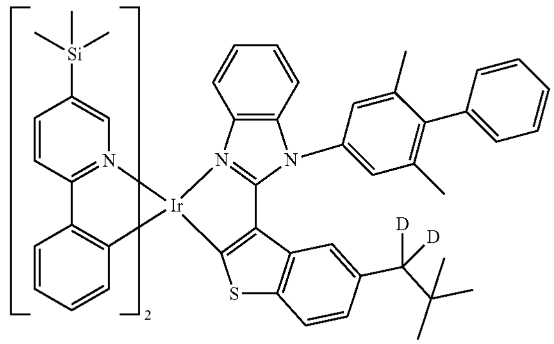
185
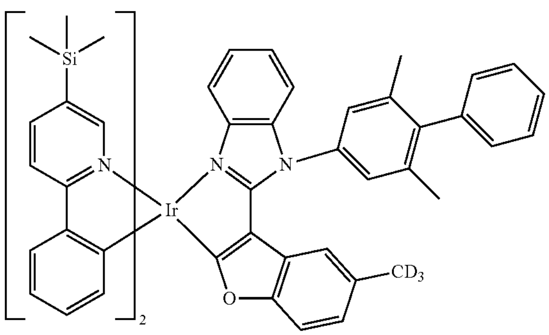
186
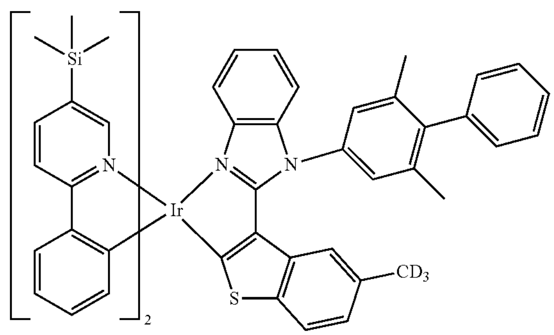
187
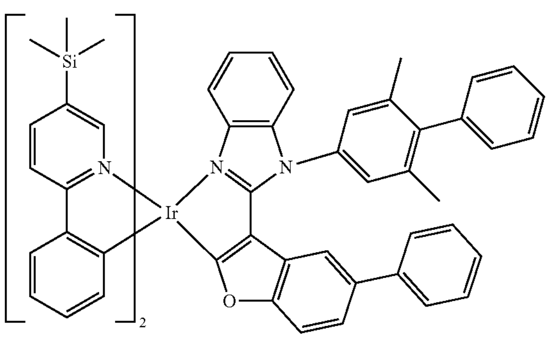
188
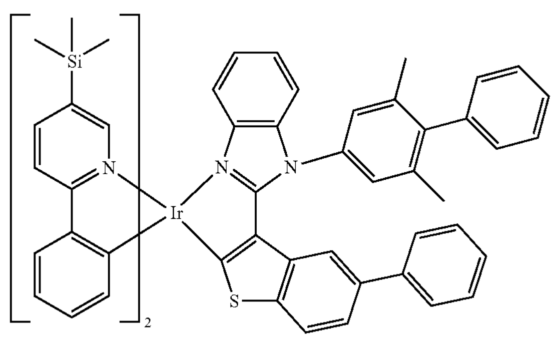
189
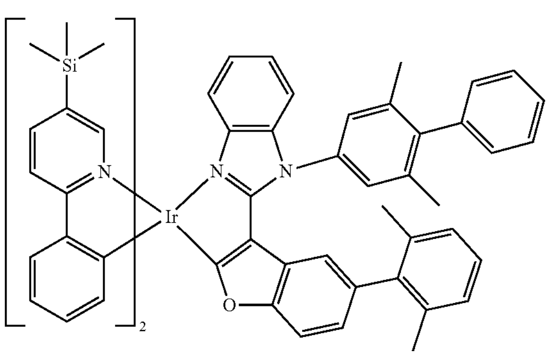
190
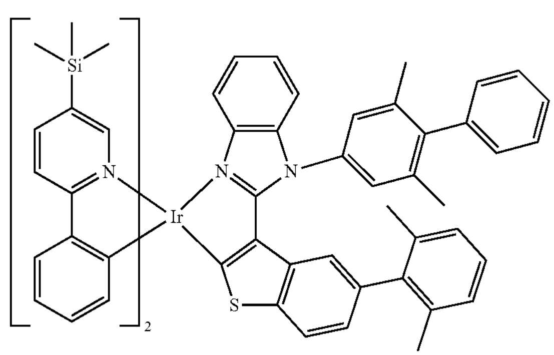

-continued
191
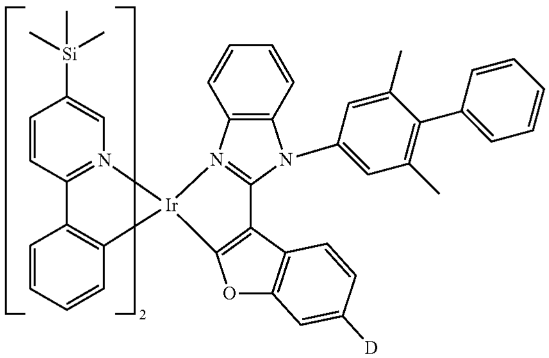
192
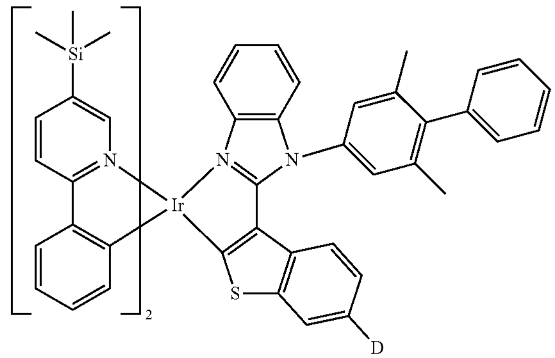
193
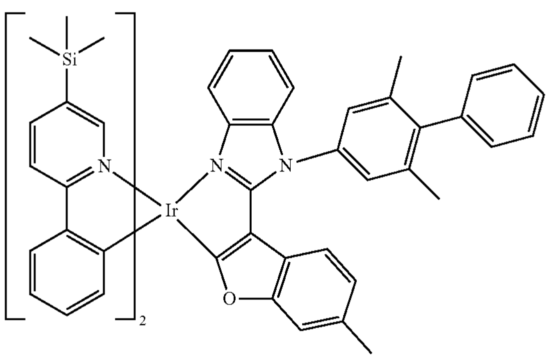
194
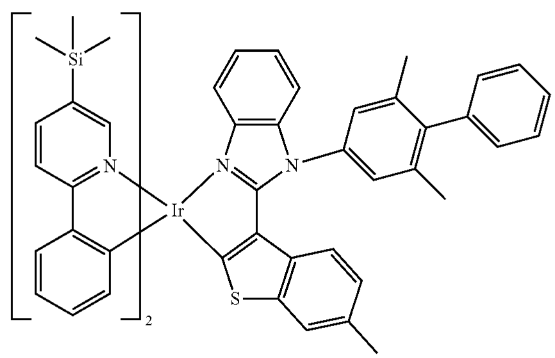
195
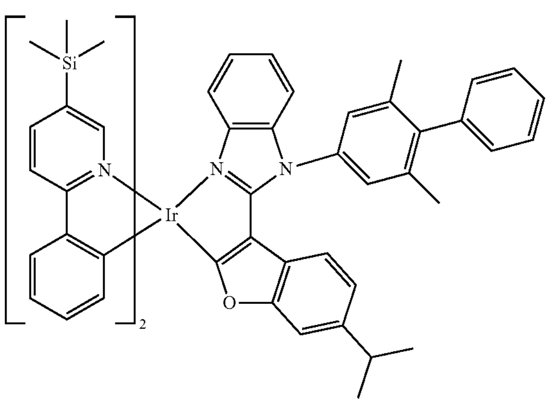
196
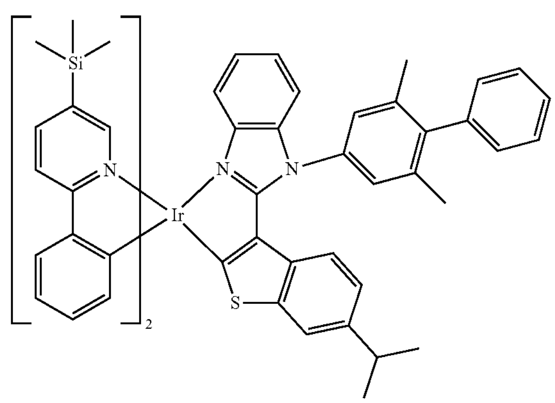
197
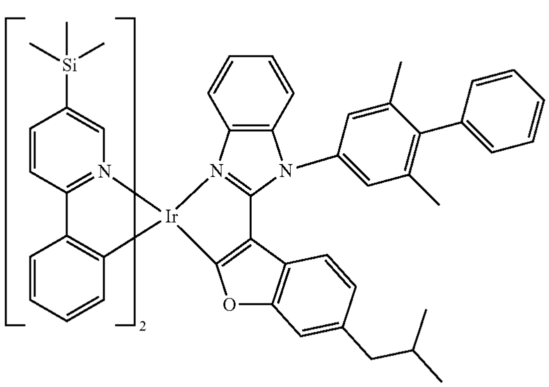
198
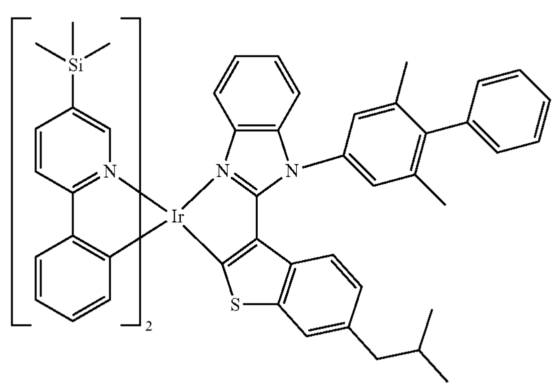

-continued
199
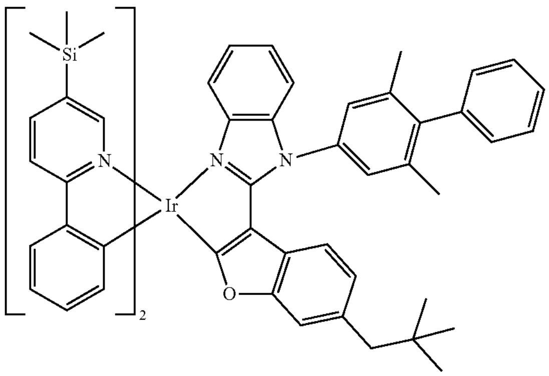
200
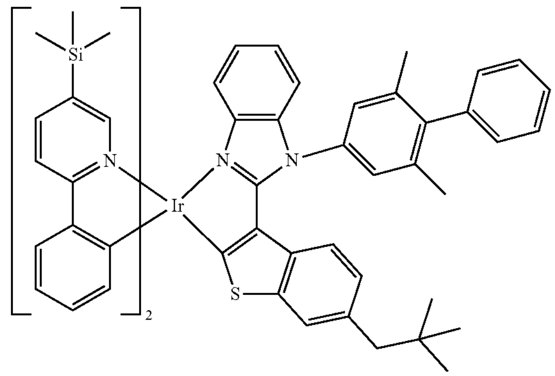
201
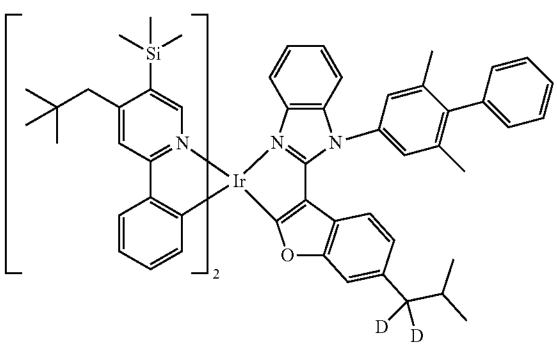
202
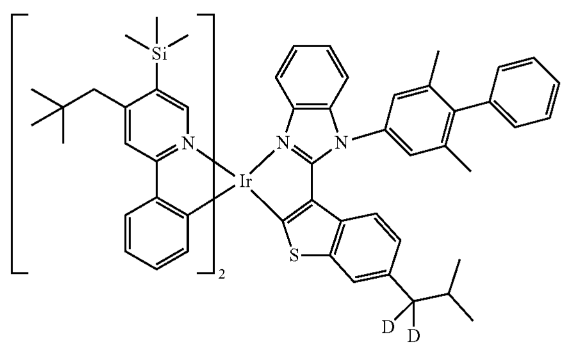
203
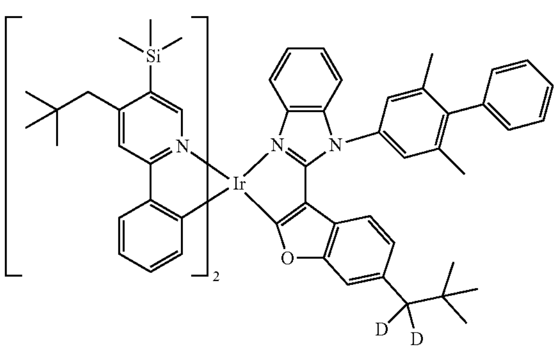
204
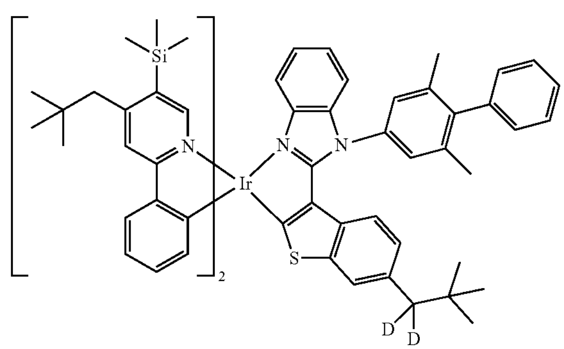
205
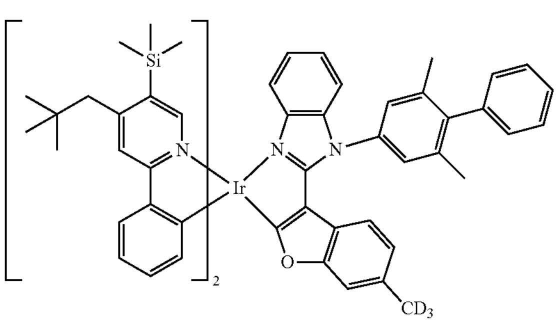
206
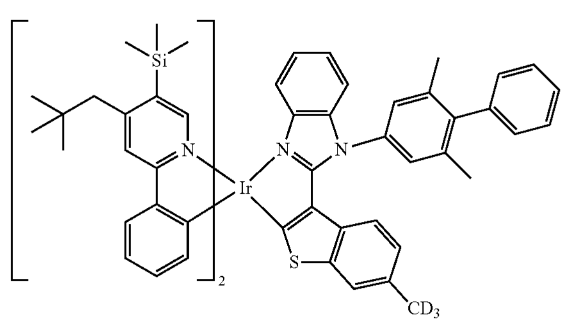

-continued
207
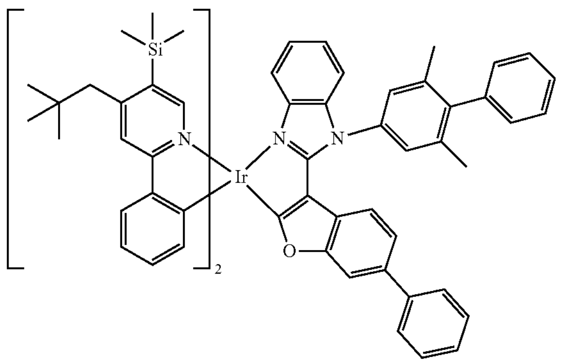
208
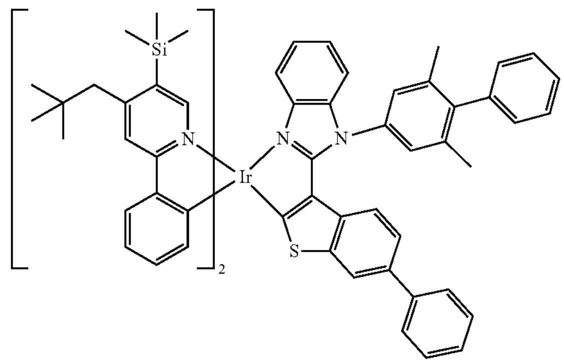
209
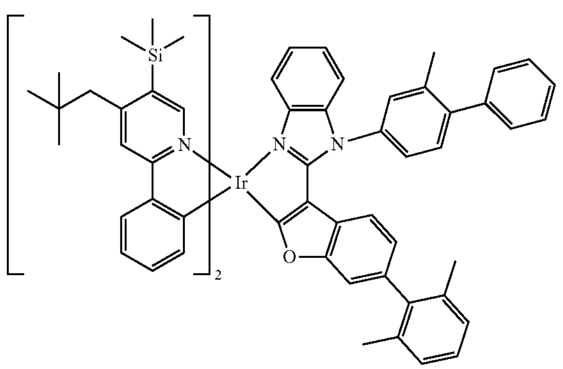
210
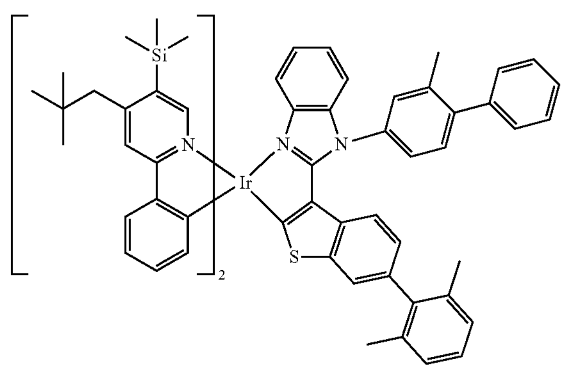
211
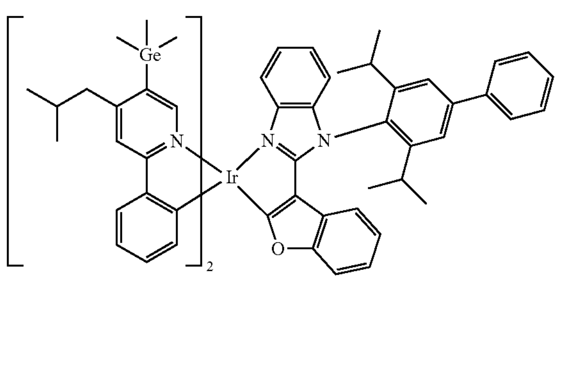
212
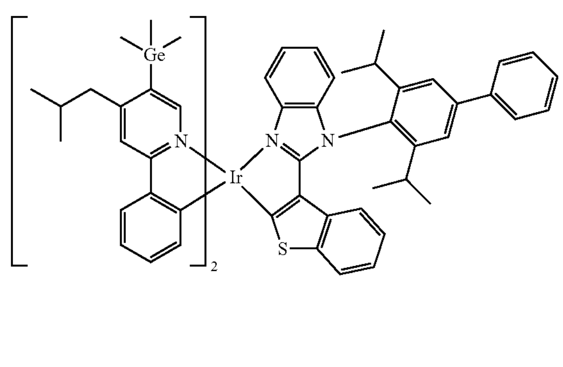
213
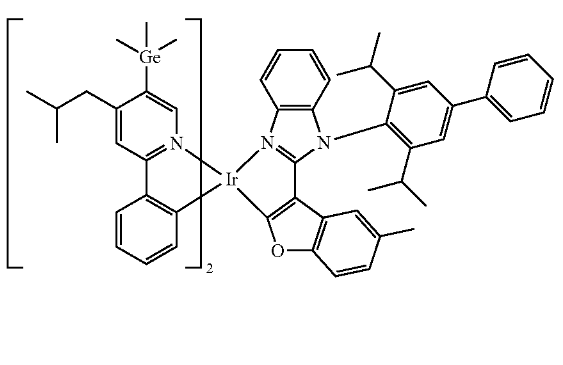
214
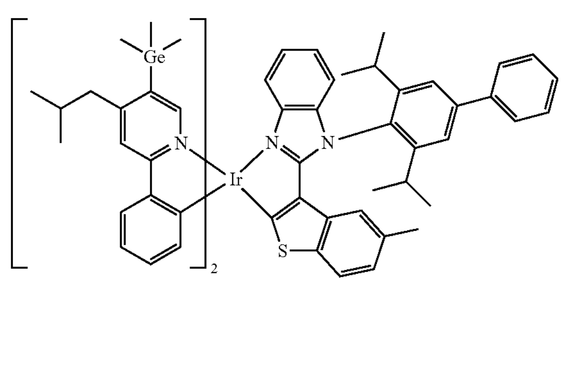

-continued
215
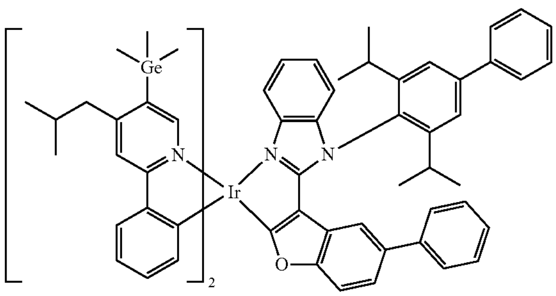
216
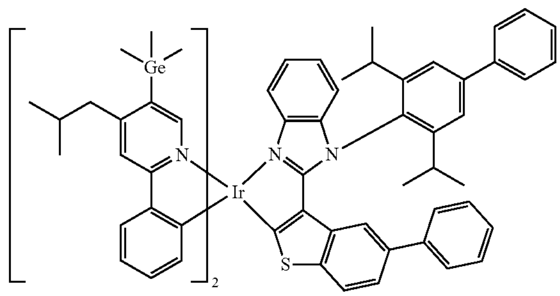
217
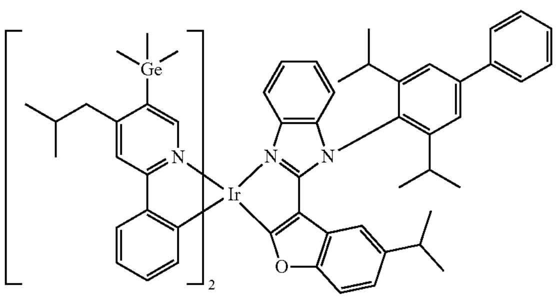
218
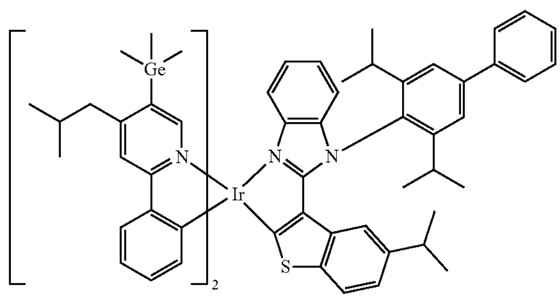
219
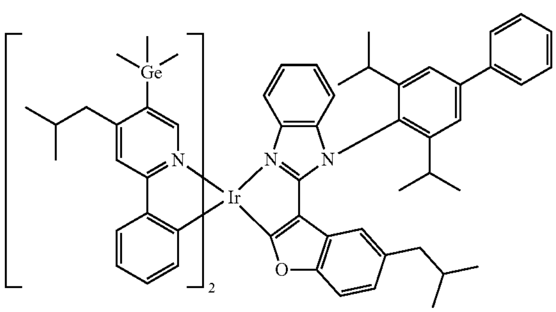
220
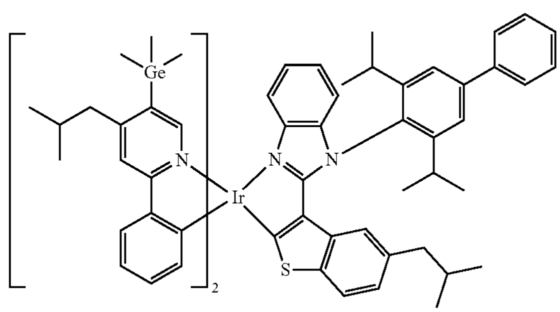
221
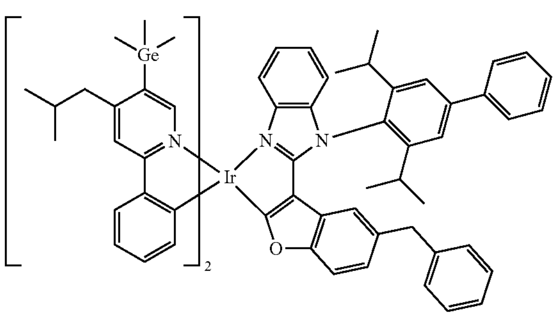
222
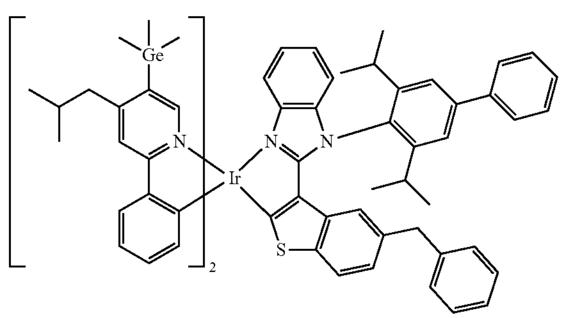
223
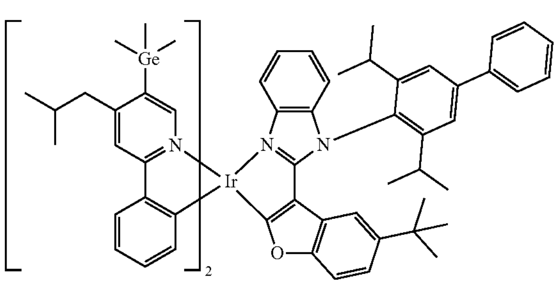
224
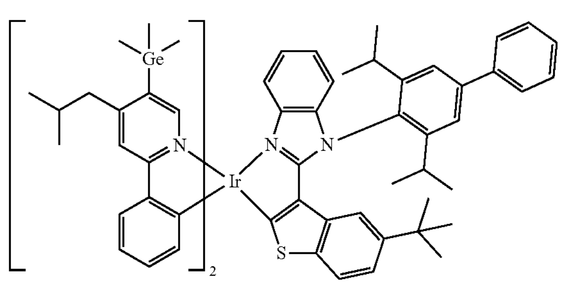

-continued
225
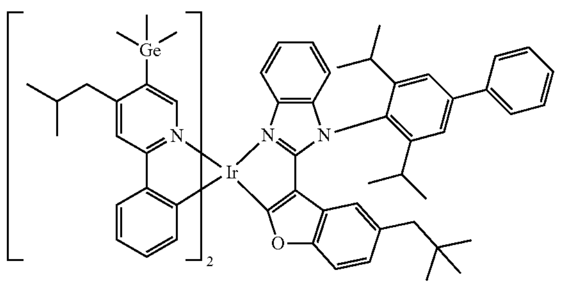
226
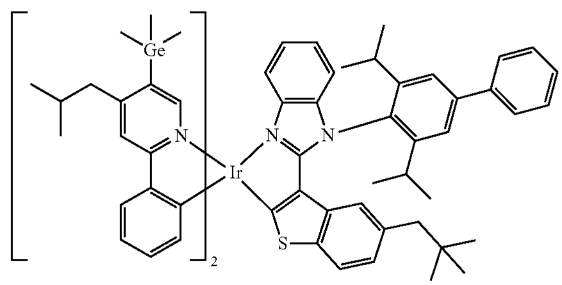
227
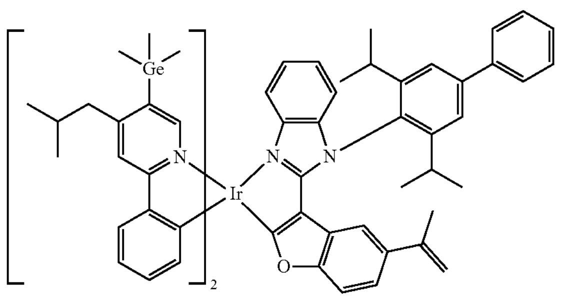
228
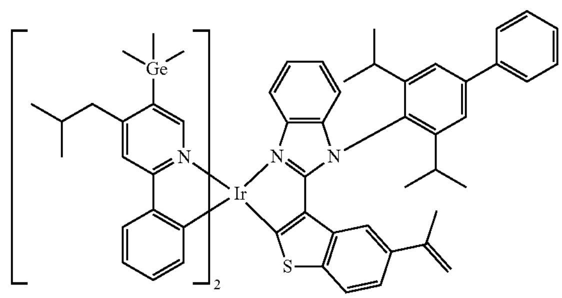
229
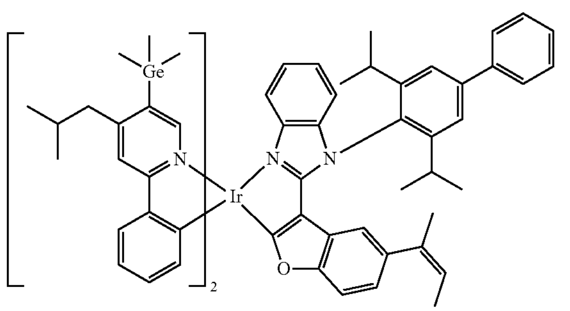
230
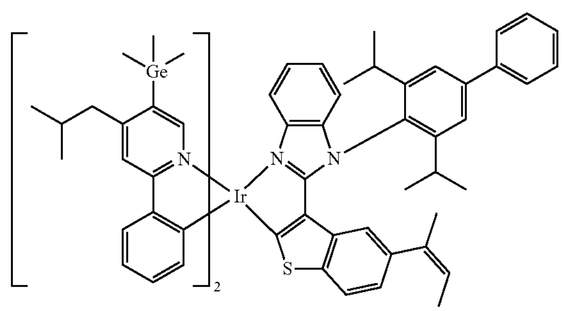
231
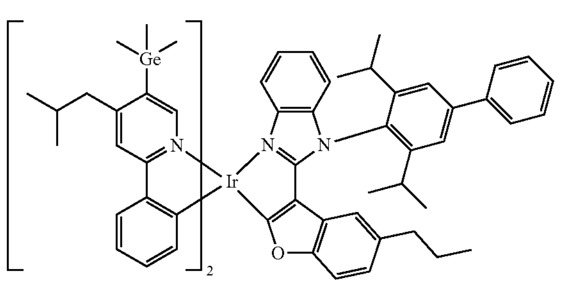
232
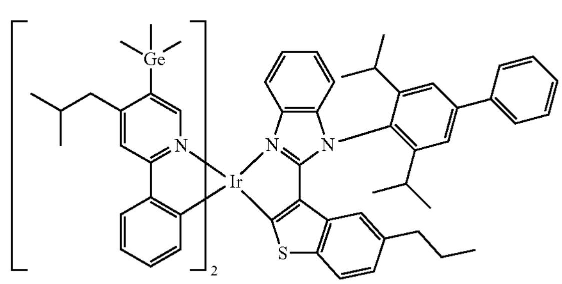
233
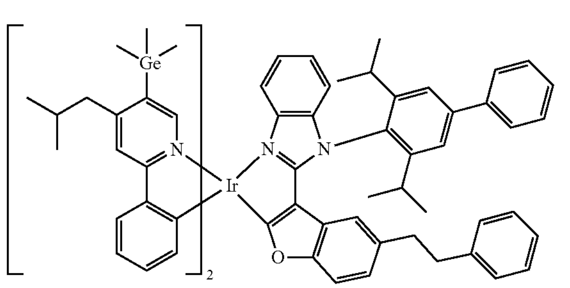
234
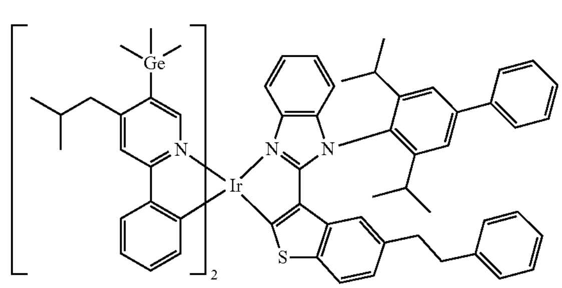

-continued
235
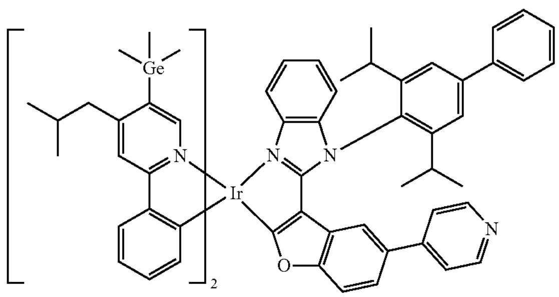
236
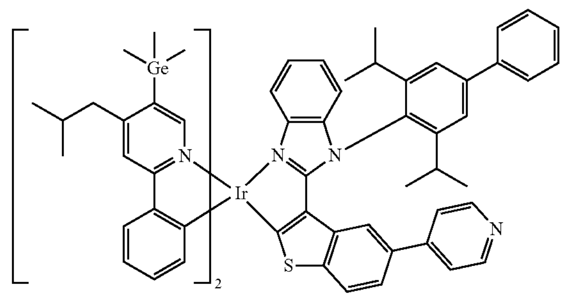
237
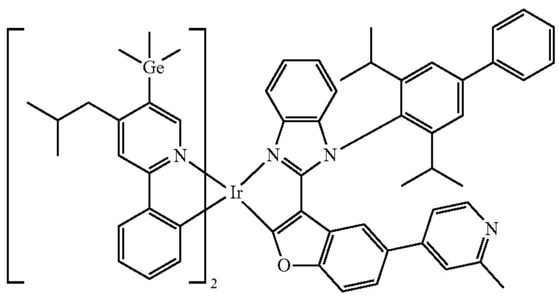
238
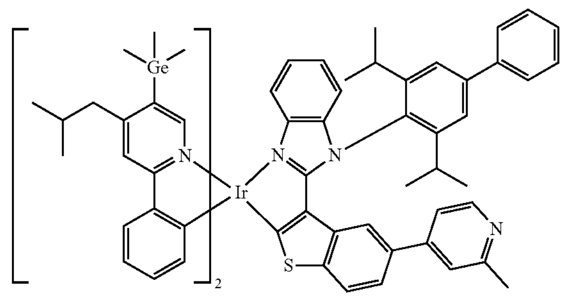
239
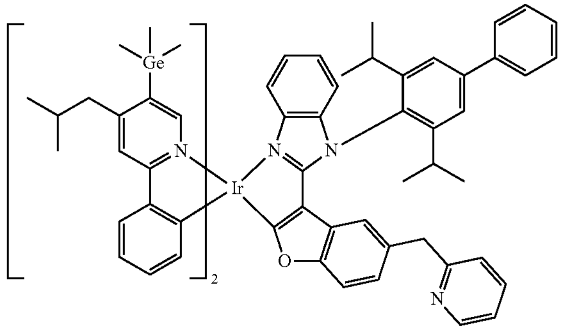
240
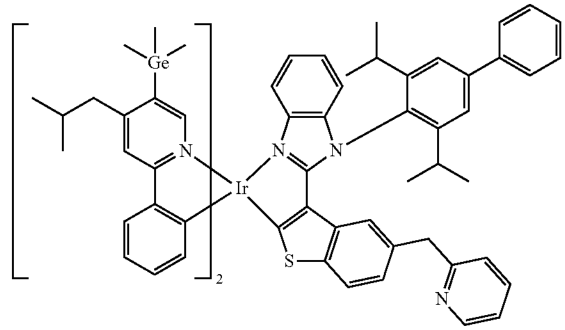
241
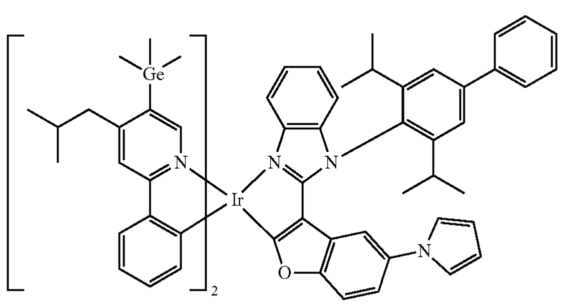
242
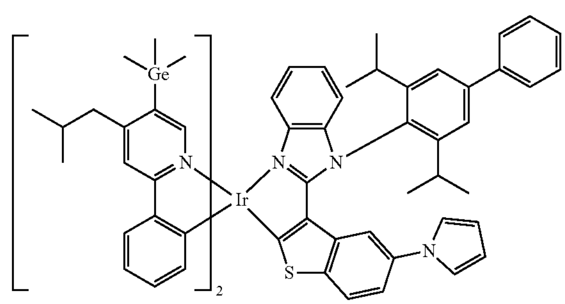
243
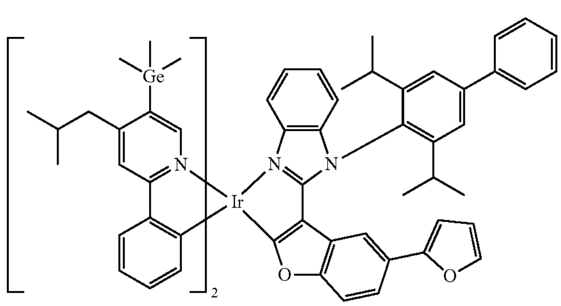
244
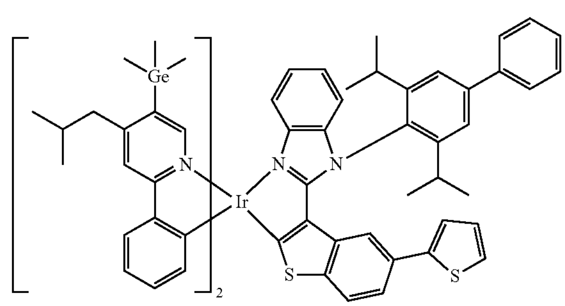

-continued
245
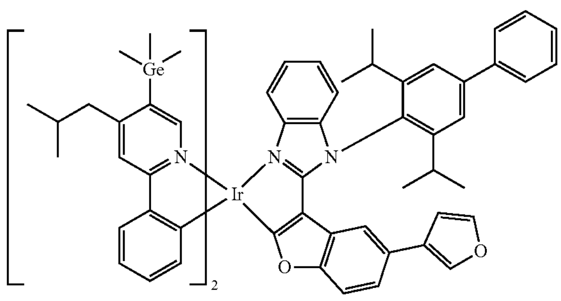
246
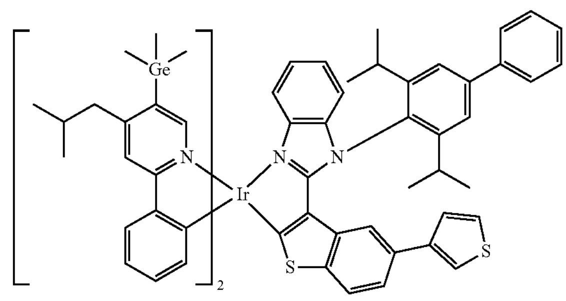
247
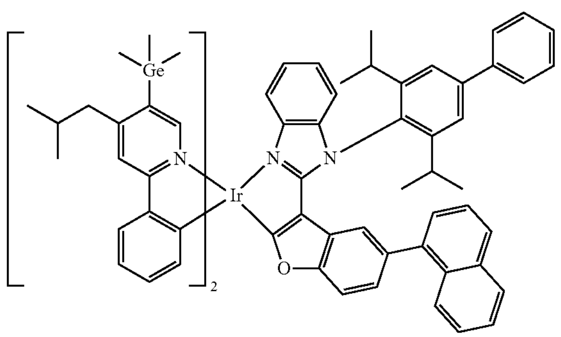
248
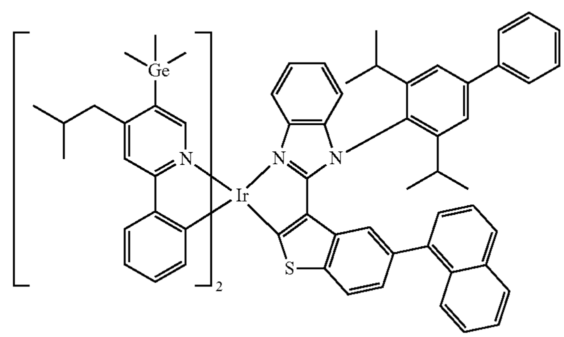
249
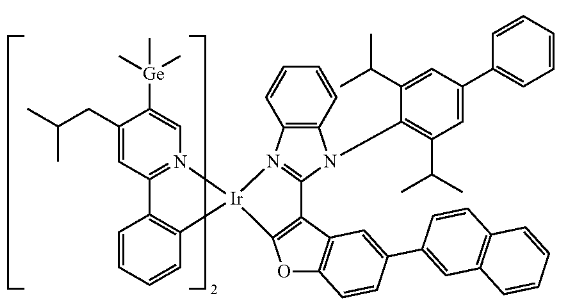
250
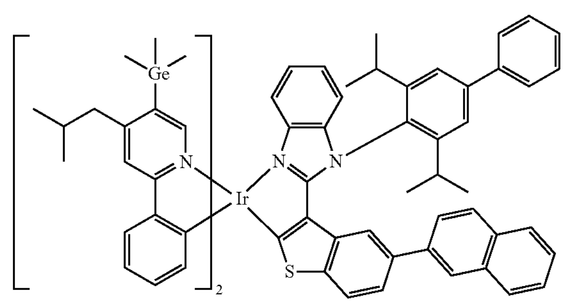
251
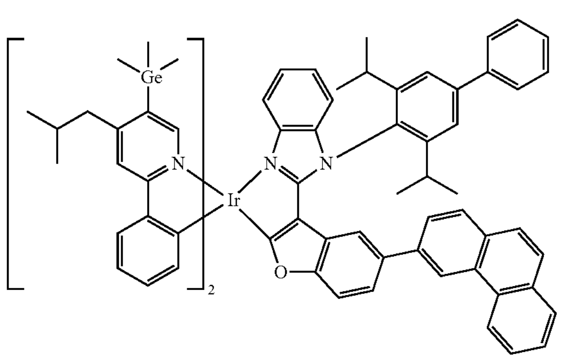
252
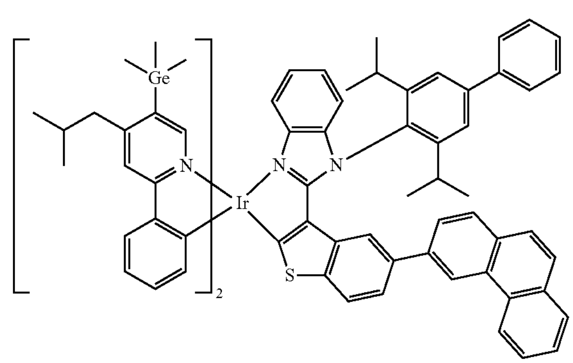

-continued
253
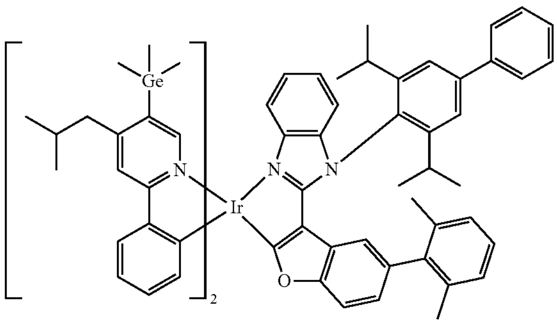
254
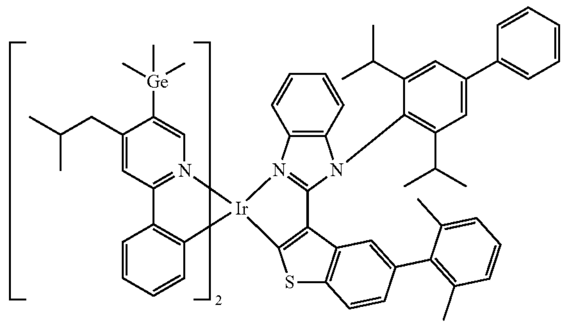
255
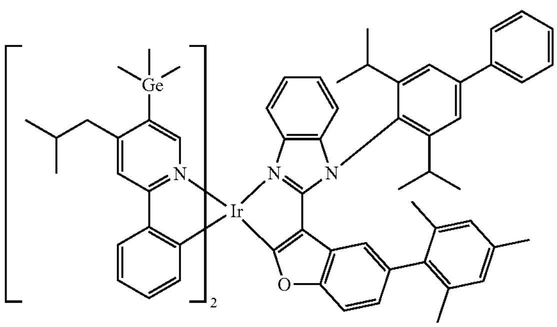
256
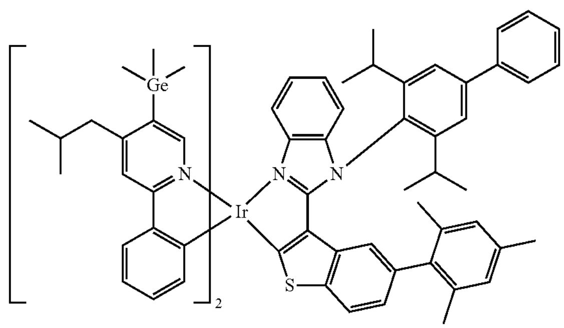
257
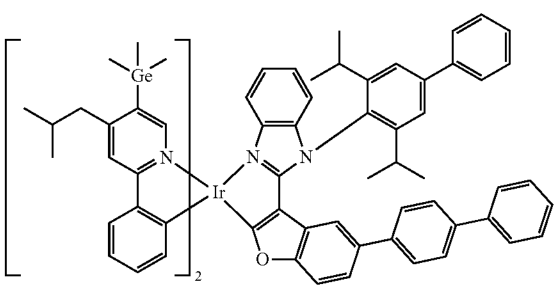
258
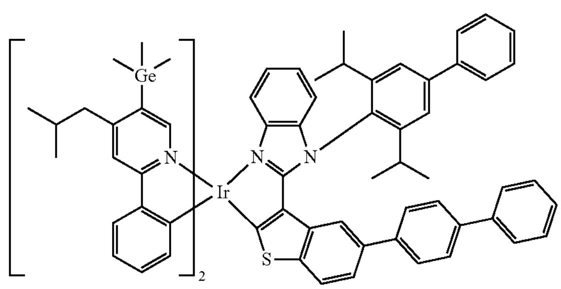
259
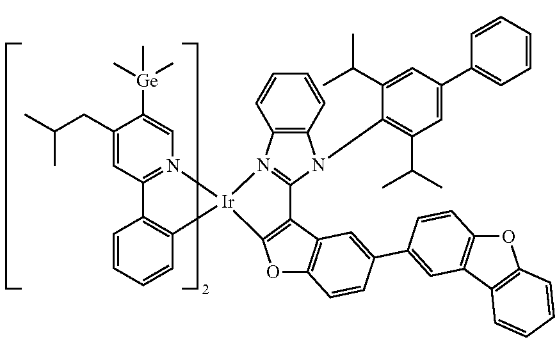
260
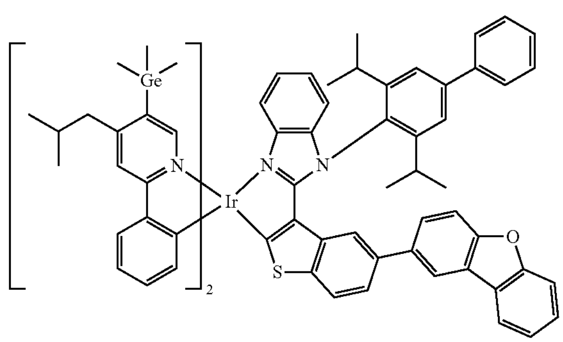

-continued
261
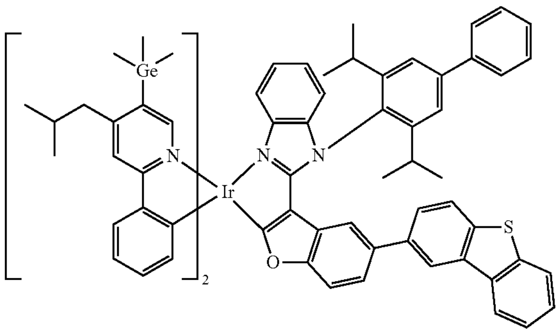
262
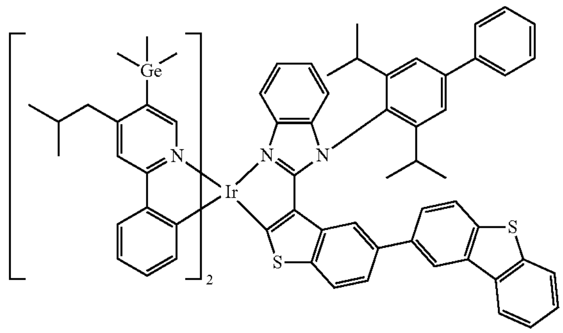
263
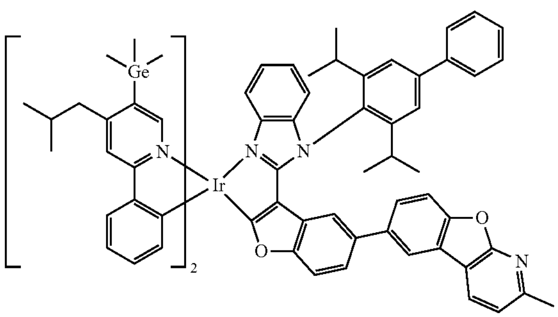
264
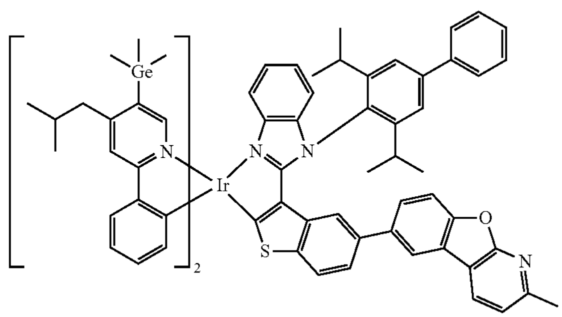
265
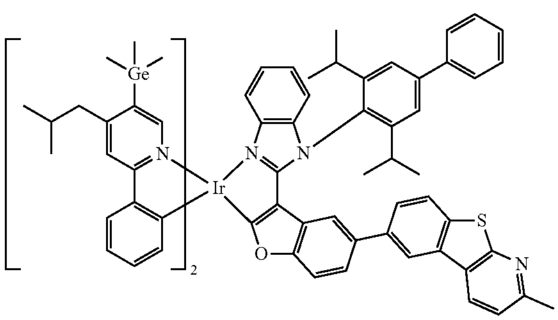
266
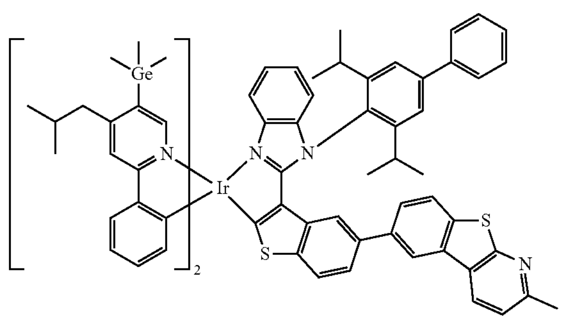
267
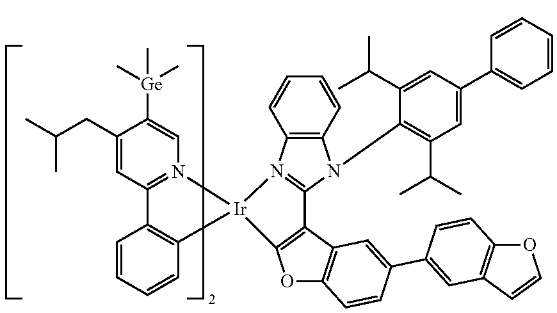
268
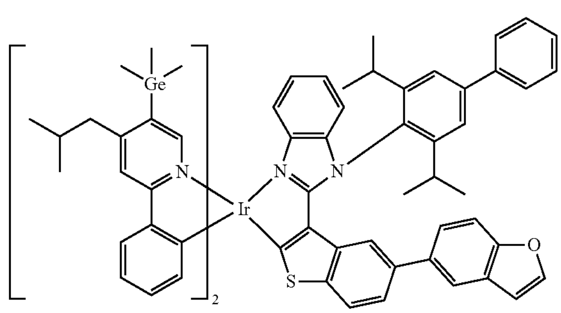

-continued
269
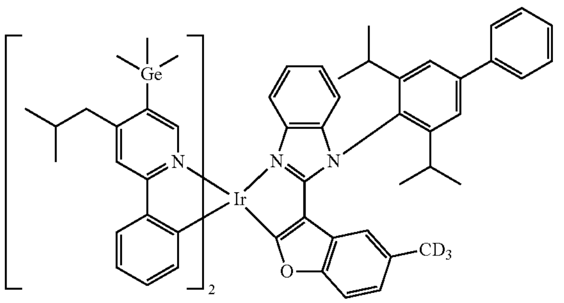
270
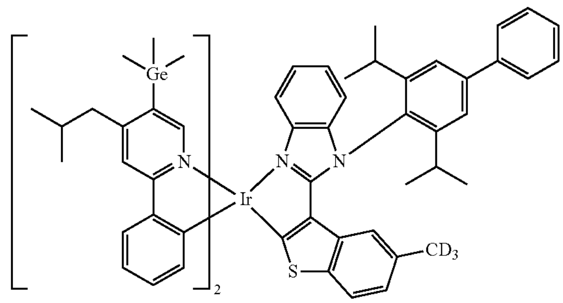
271
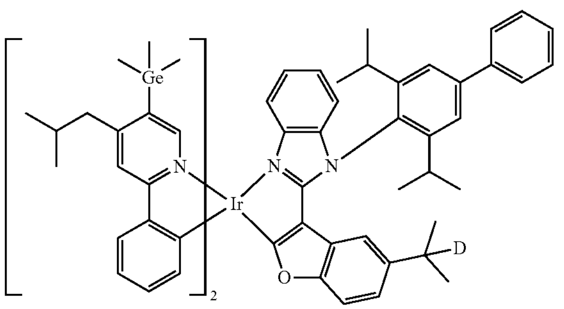
272
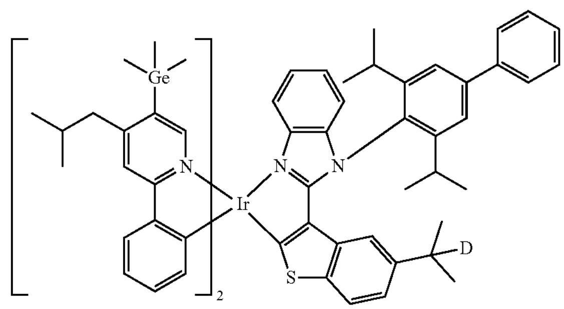
273
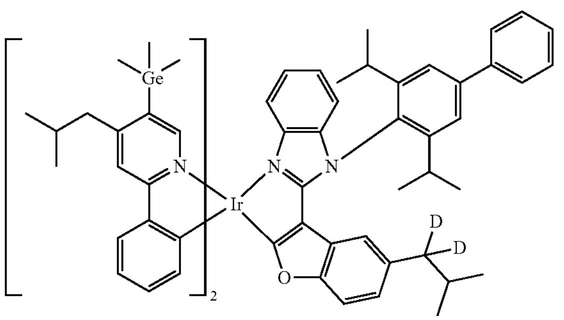
274
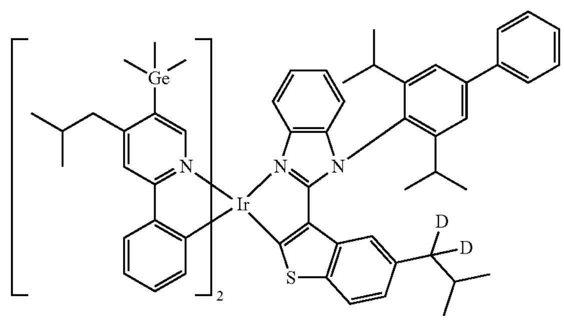
275
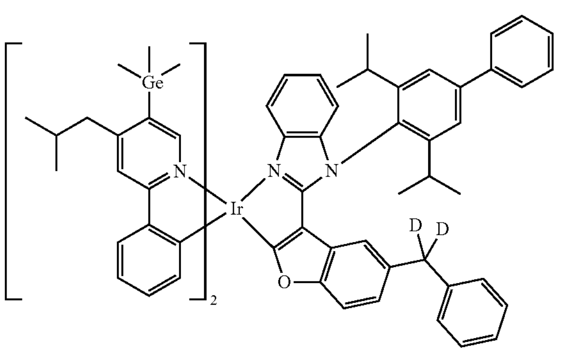
276
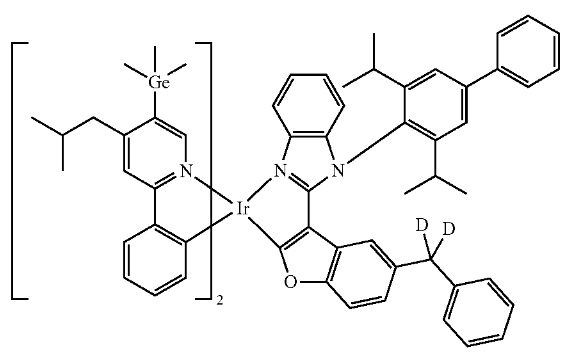
277
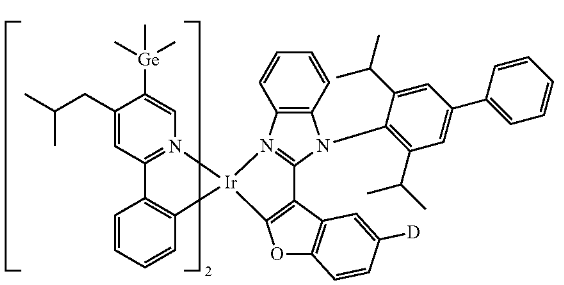
278
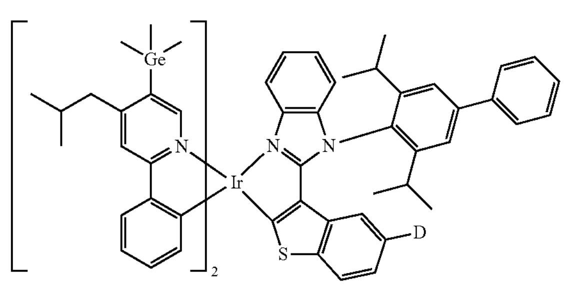

-continued
279
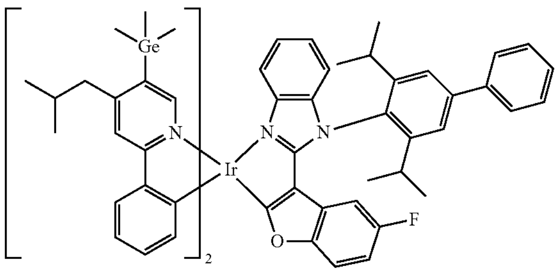
280
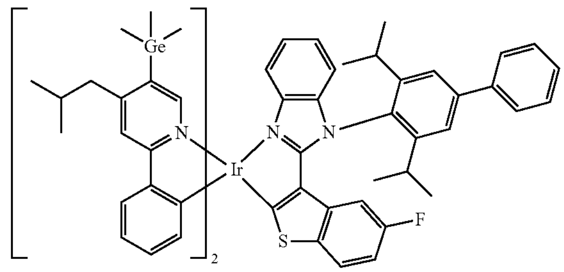
281
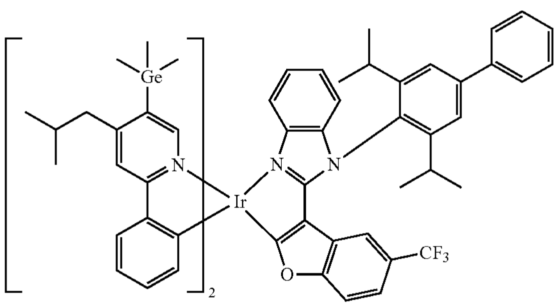
282
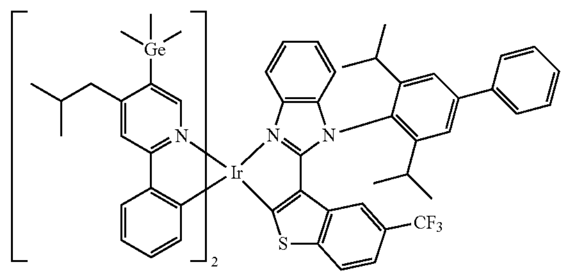
283
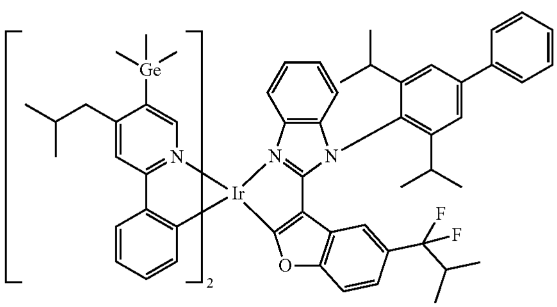
284
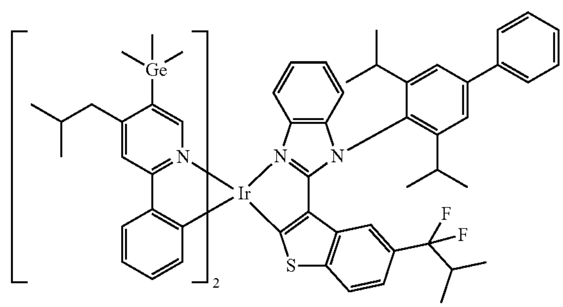
285
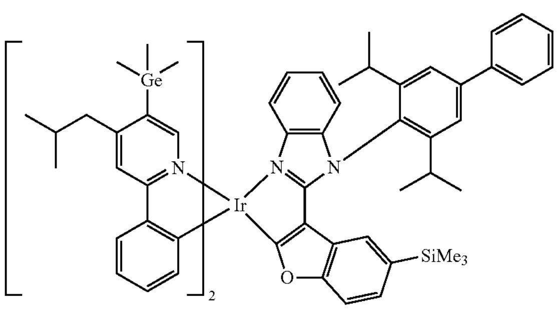
286
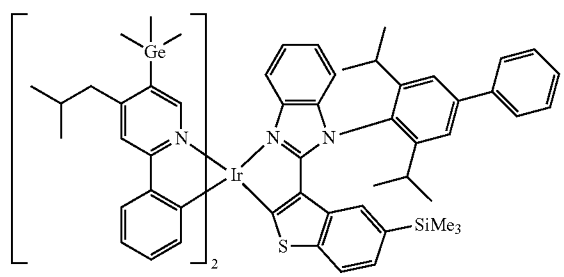
287
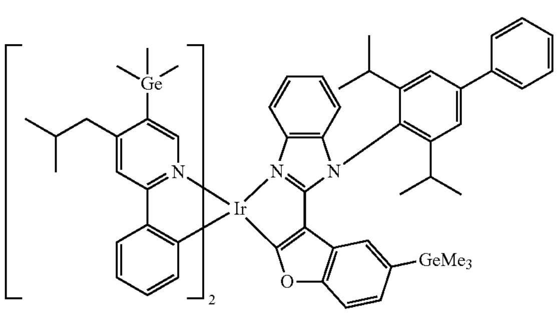
288
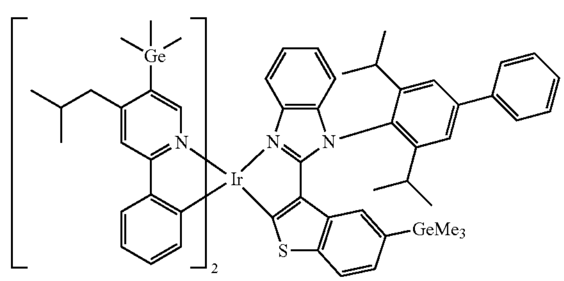

-continued
289
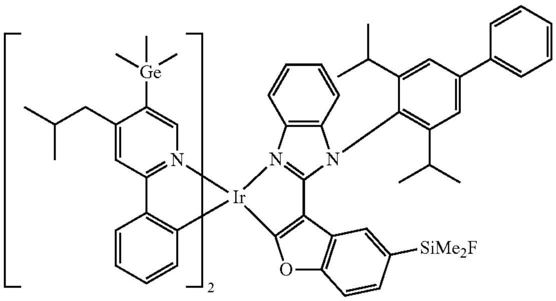
290
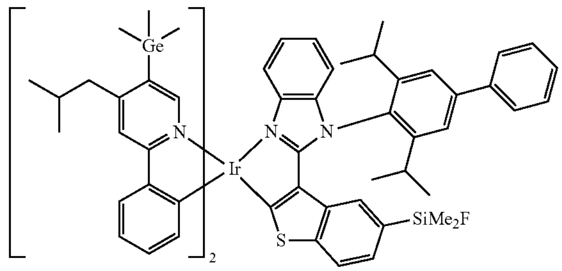
291
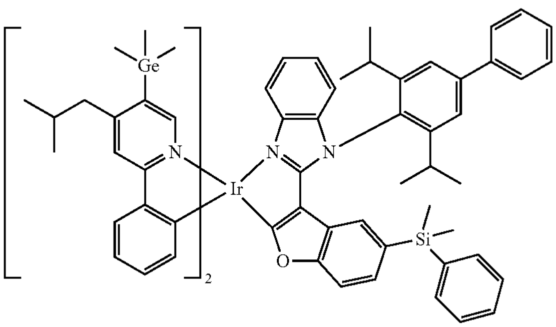
292
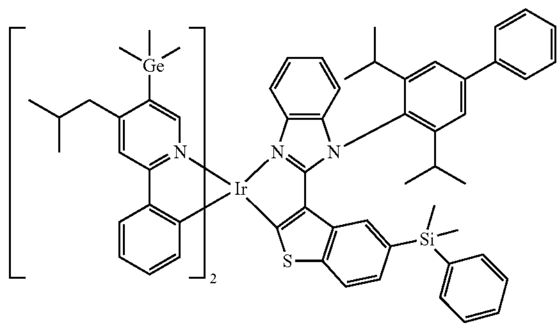
293
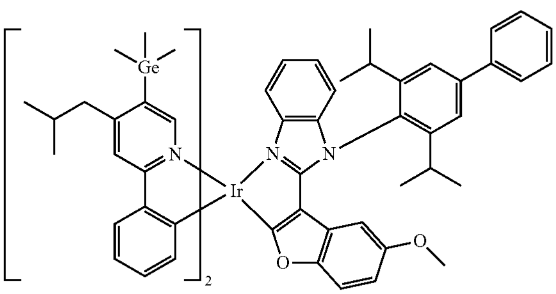
294
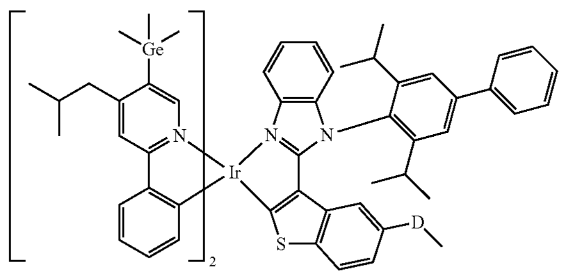
295
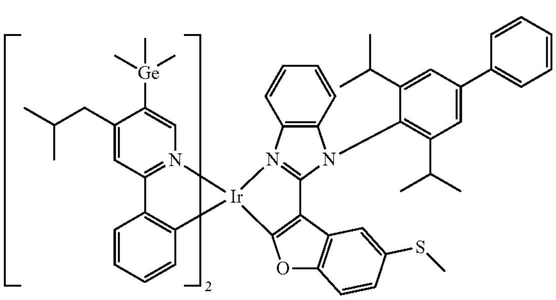
296
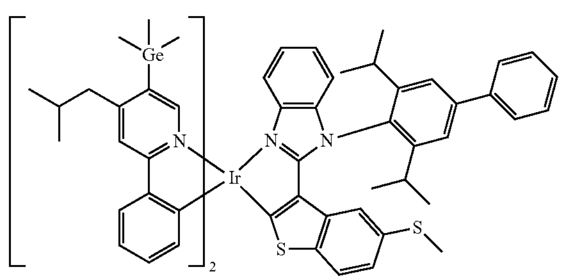
297
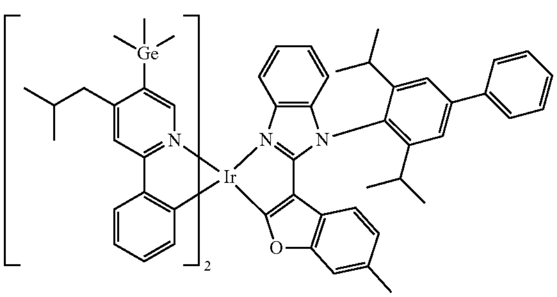
298
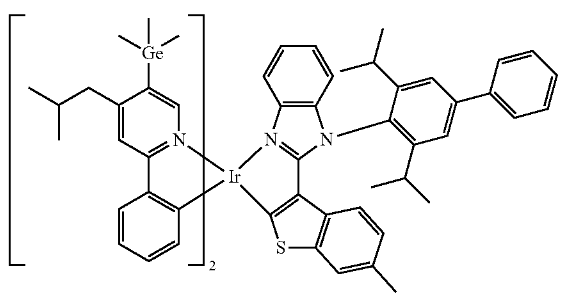

-continued
299
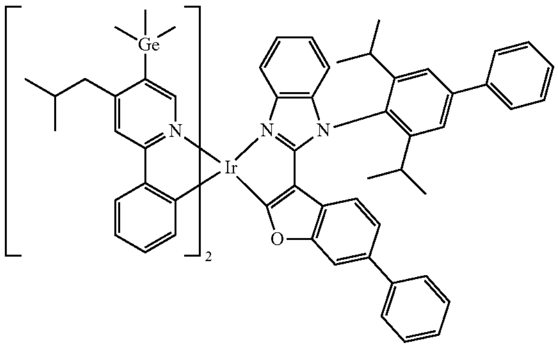
300
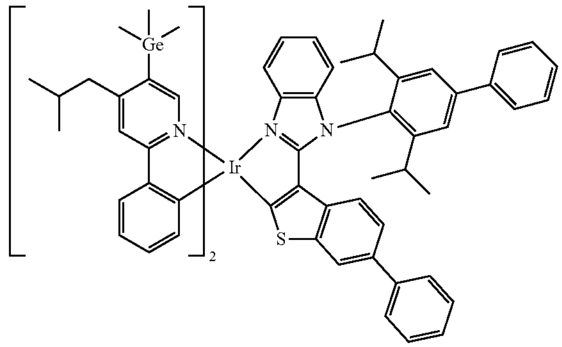
301
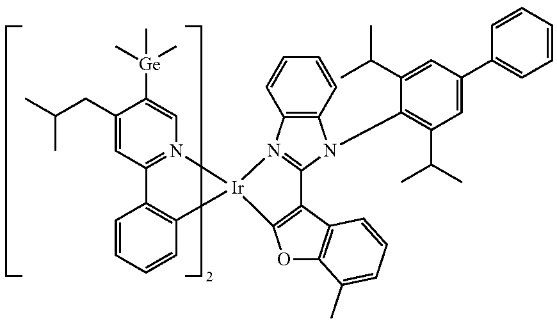
302
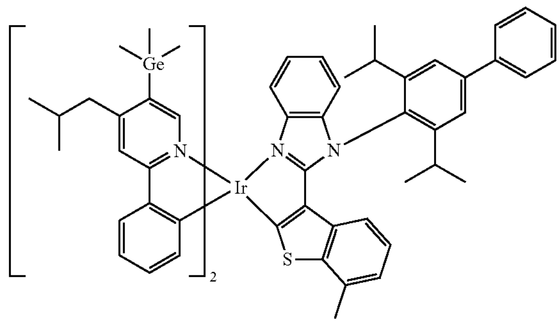
303
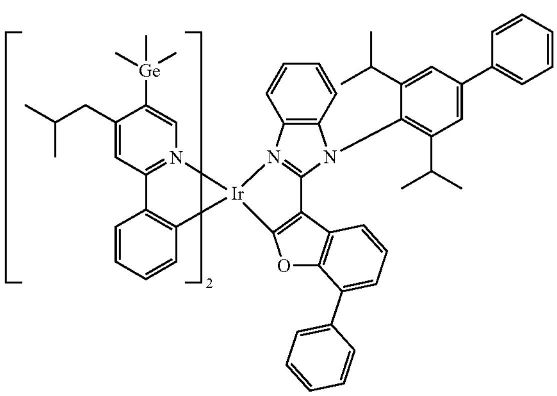
304
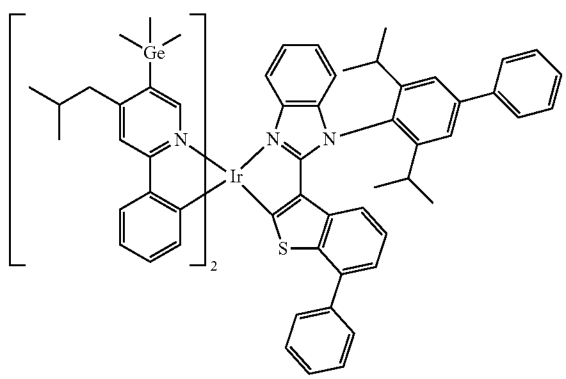
305
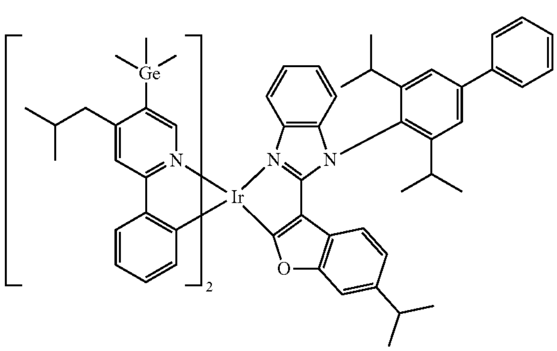
306
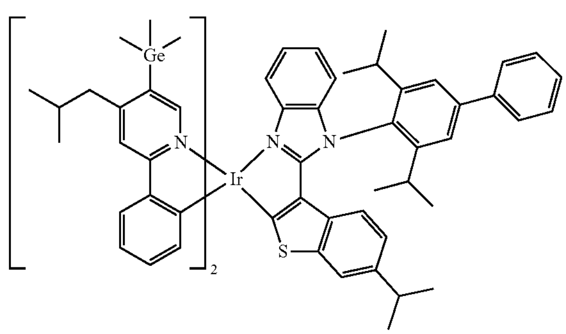

-continued
307
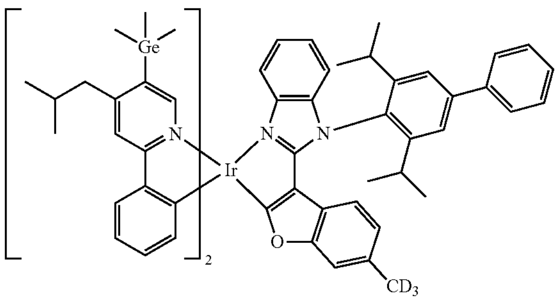
308
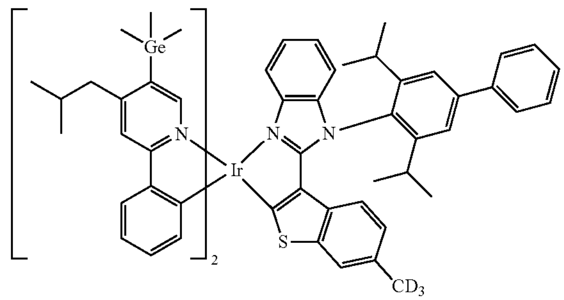
309
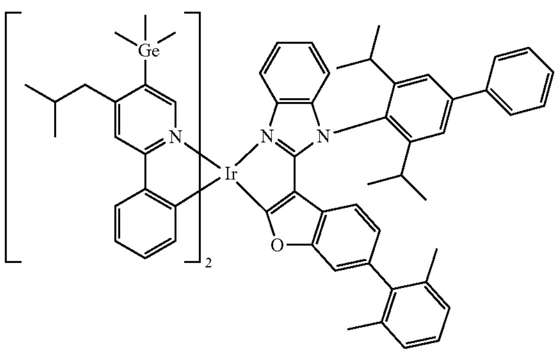
310
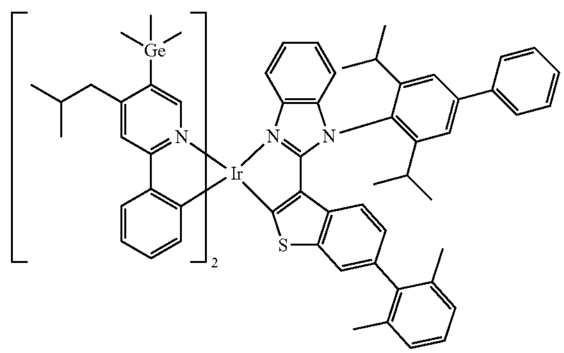
311
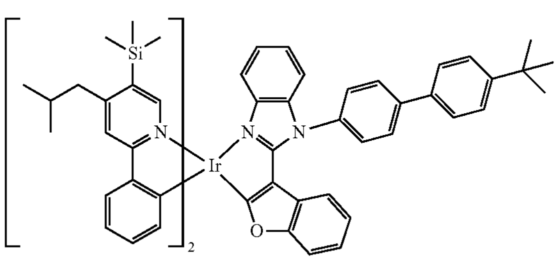
312
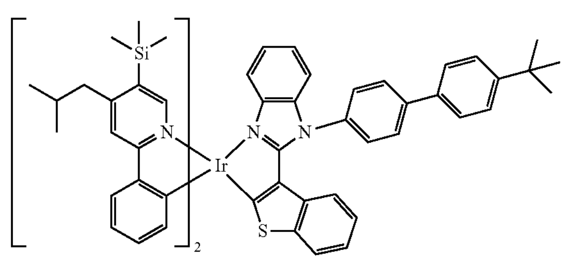
313
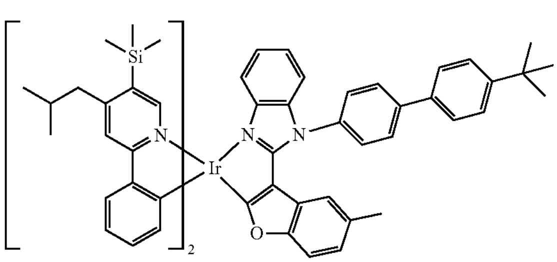
314
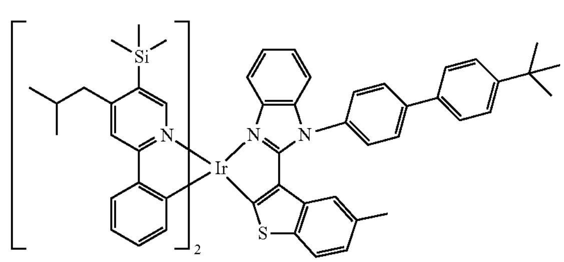
315
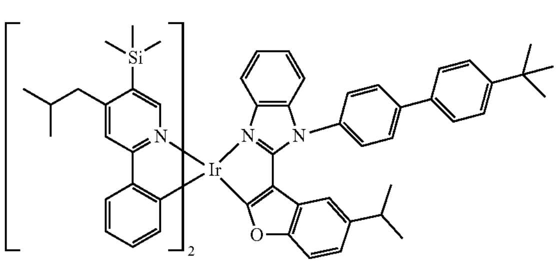
316
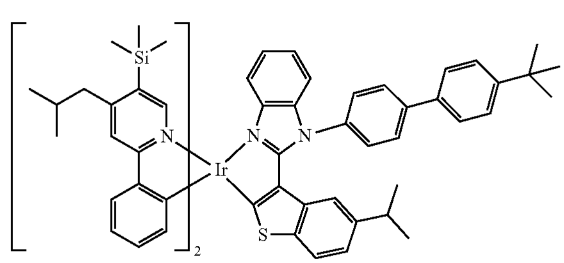

-continued
317
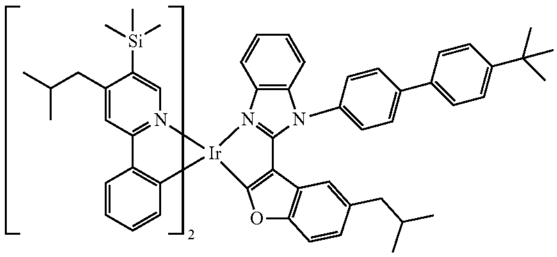
318
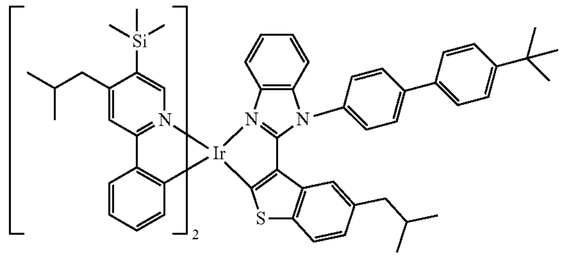
319
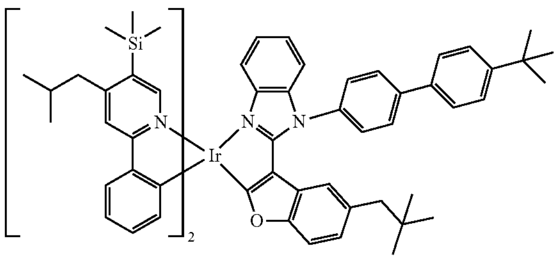
320
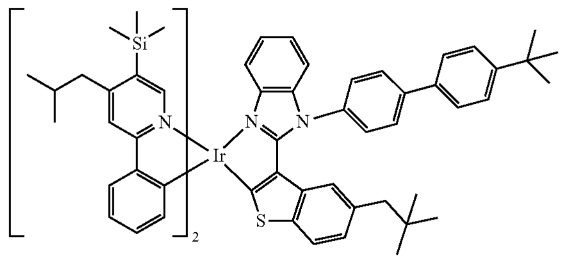
321
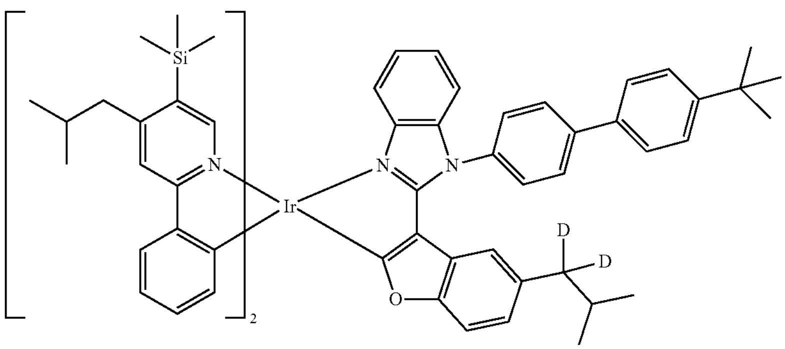
322
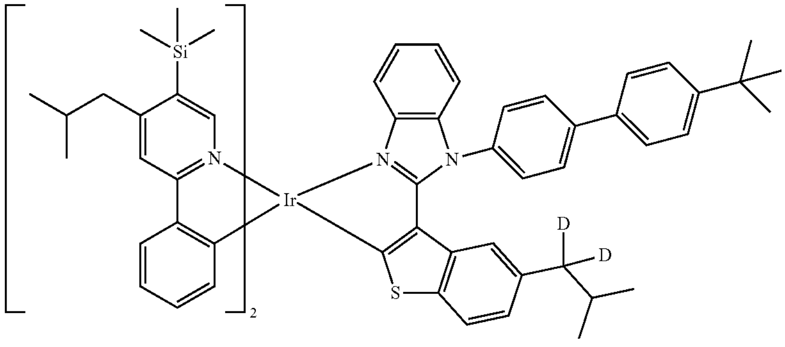

-continued
323
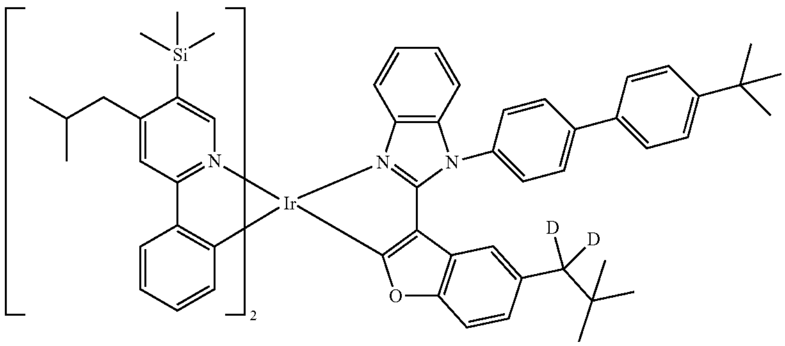
324
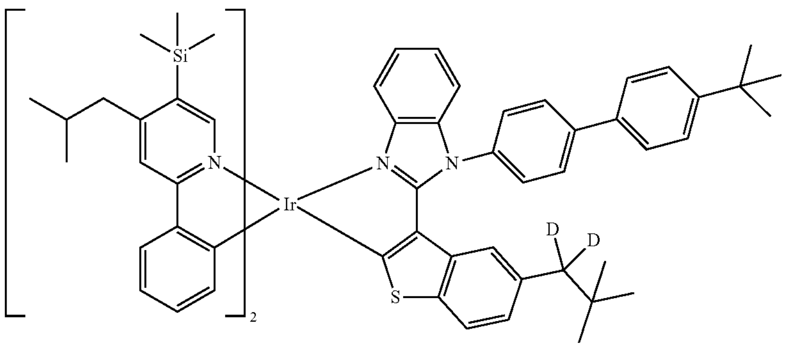
325
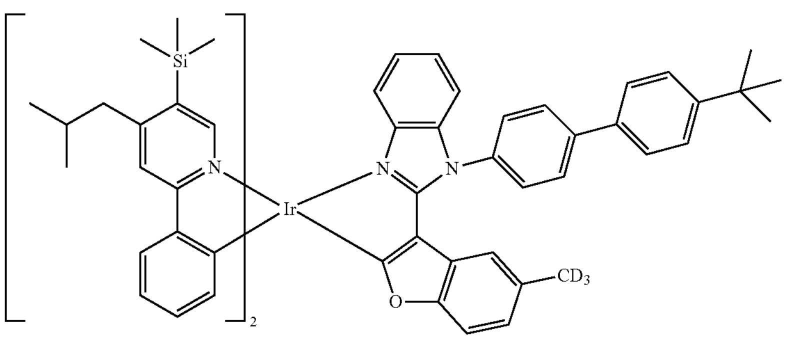
326
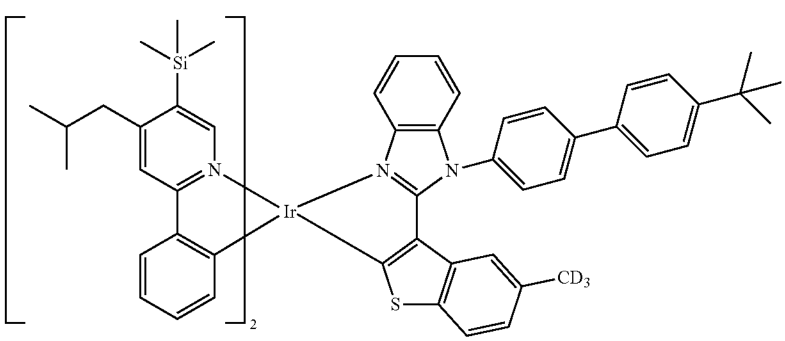

-continued
327
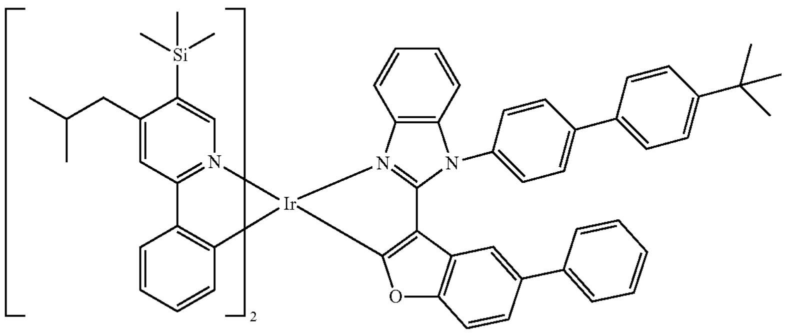
328
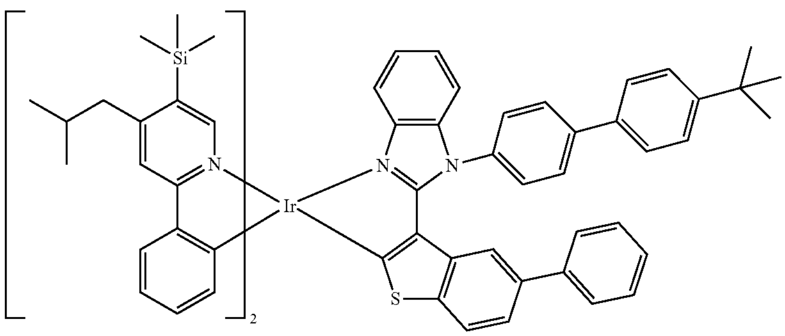
329
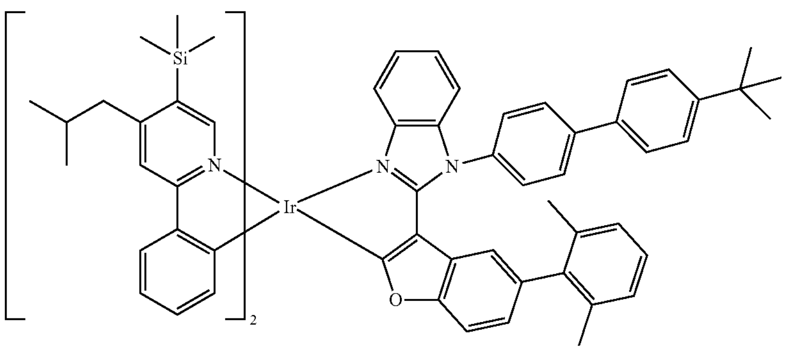
330
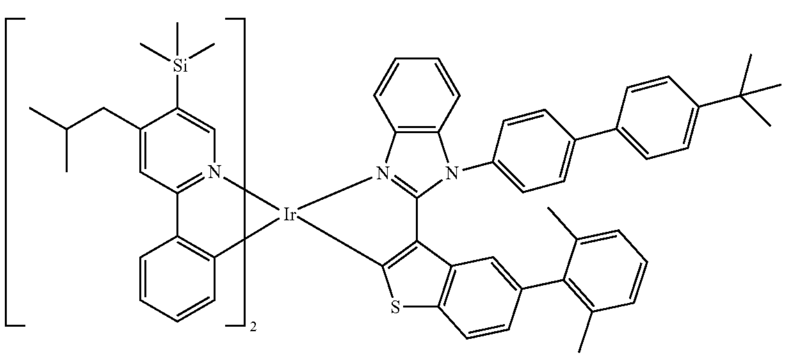

-continued
331
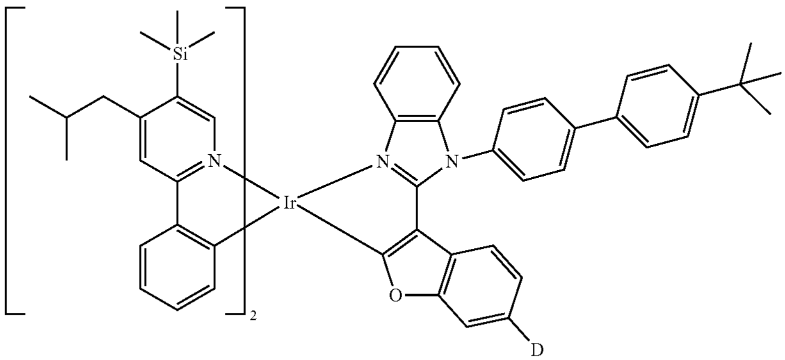
332
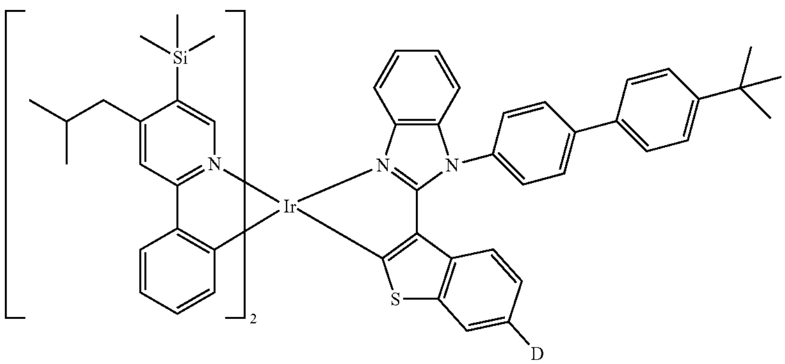
333
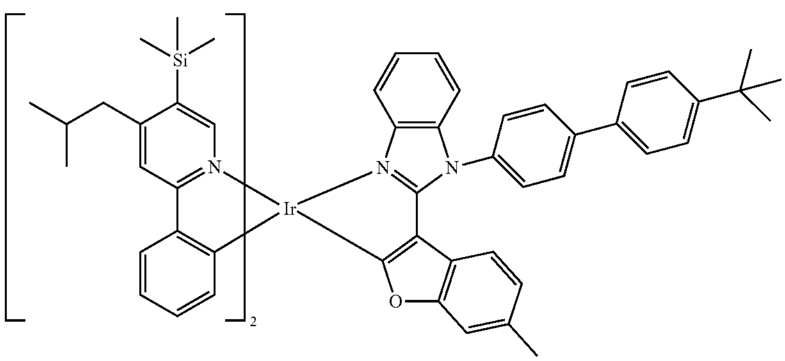
334
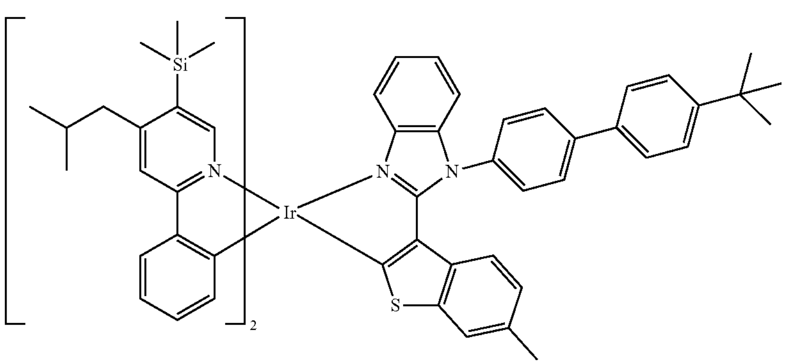

-continued
335
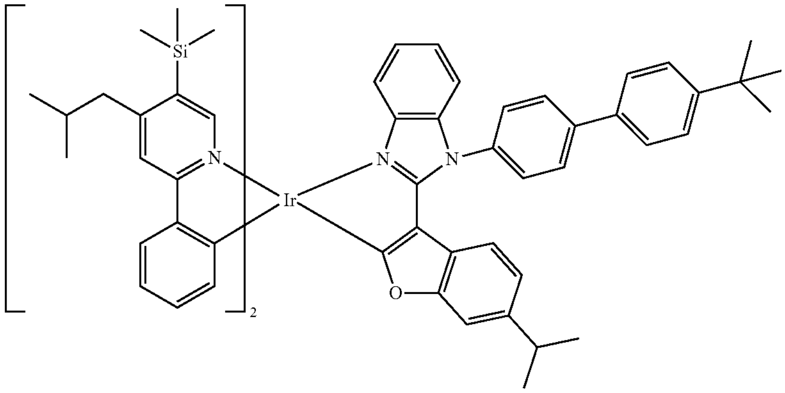
336
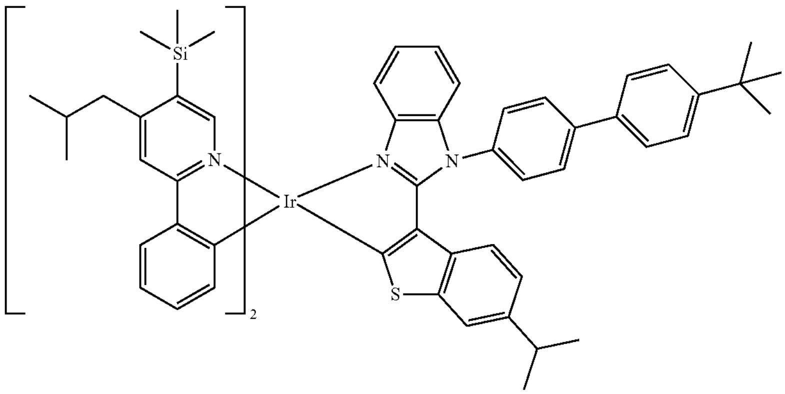
337
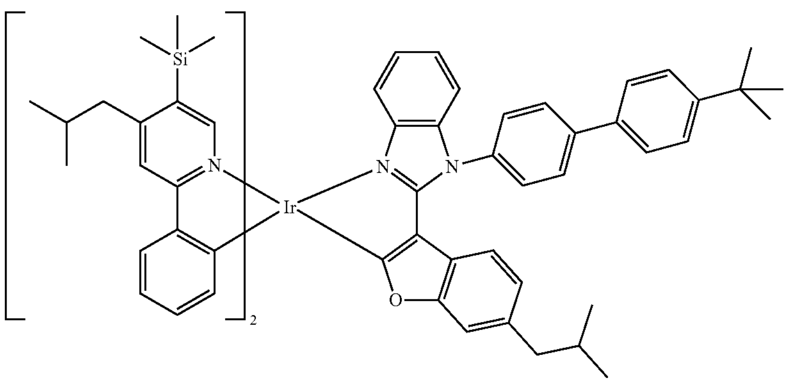
338
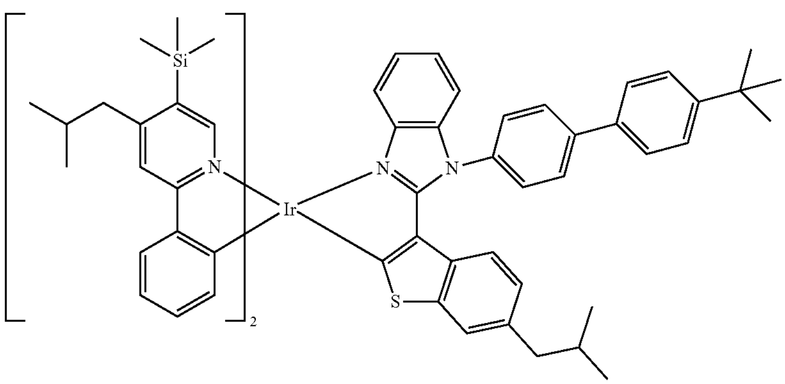

-continued
339
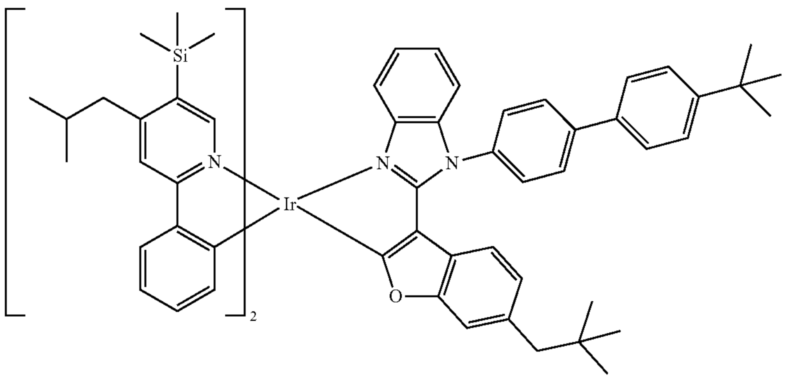
340
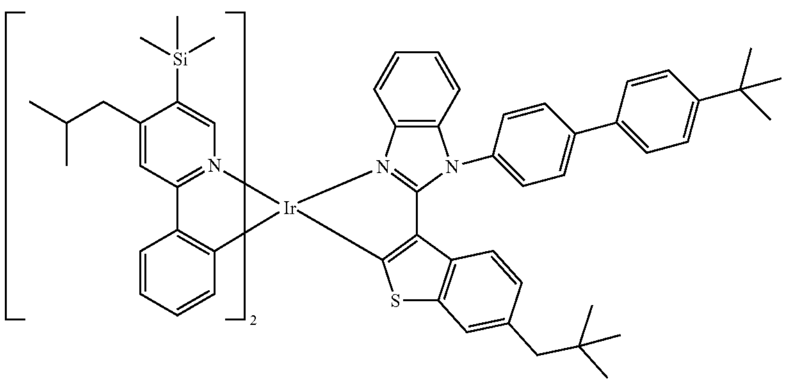
341
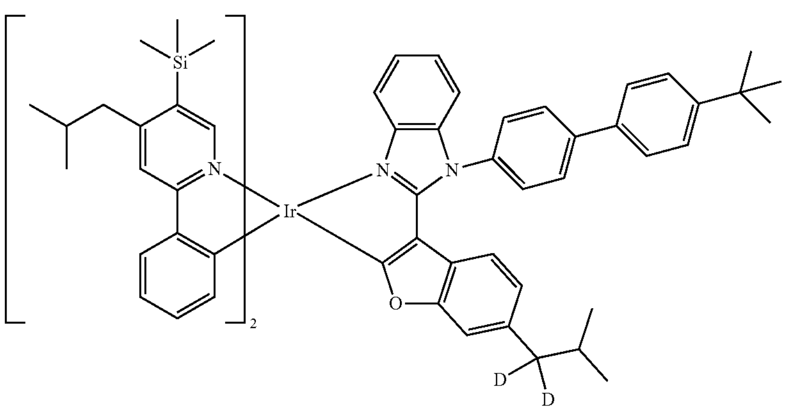
342
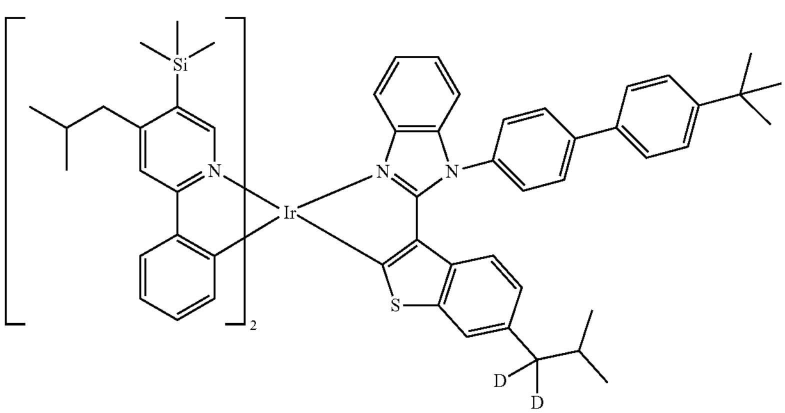

-continued
343
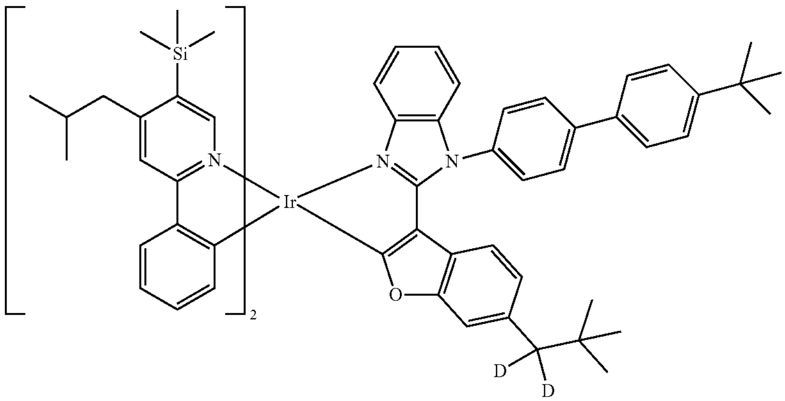
344
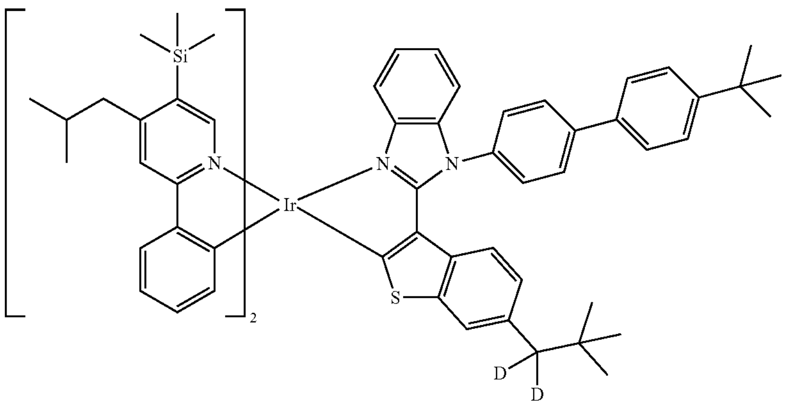
345
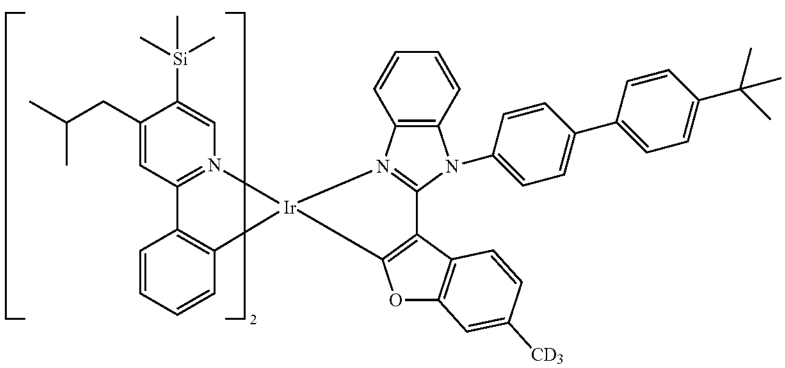
346
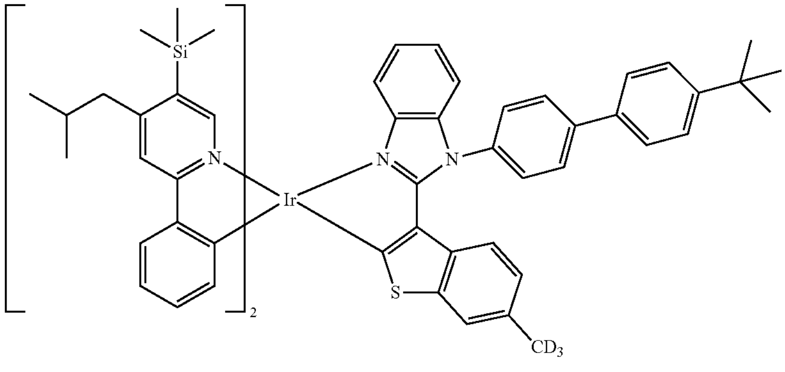

-continued
347
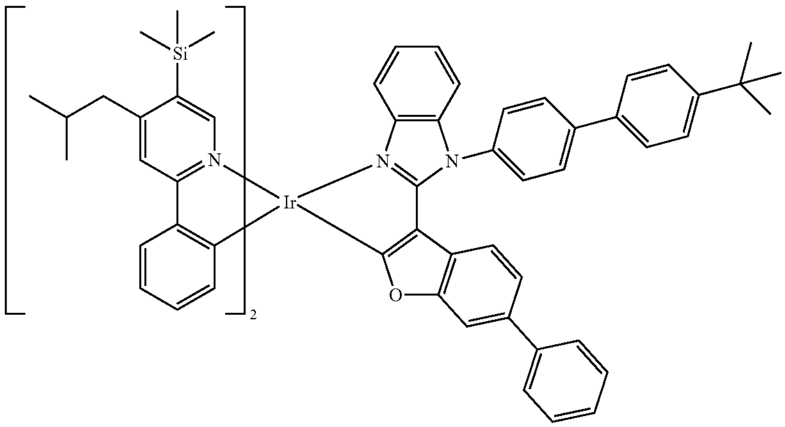
348
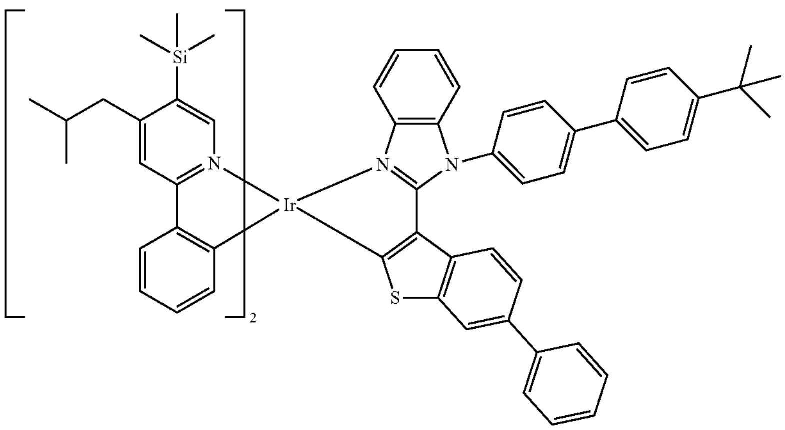
349
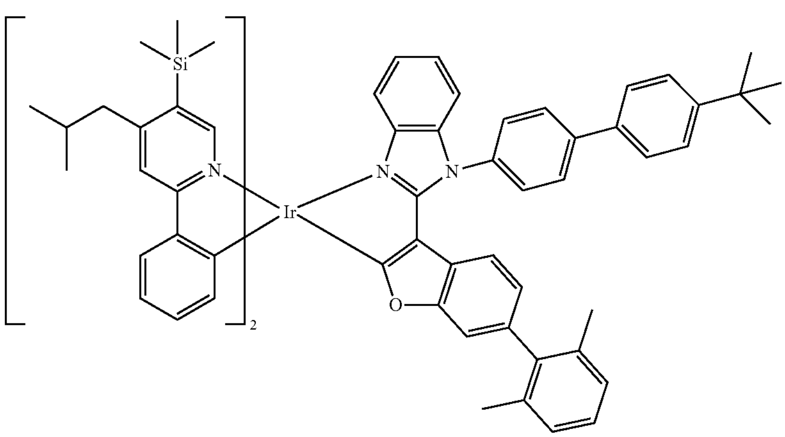

-continued
350
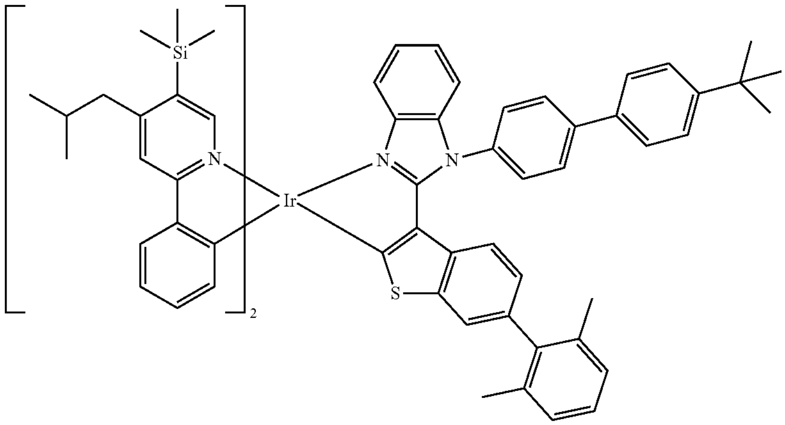
351
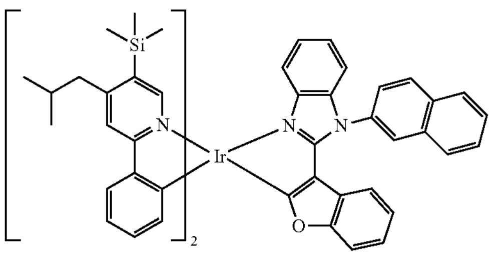
352
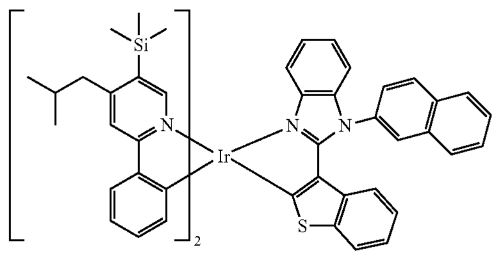
353
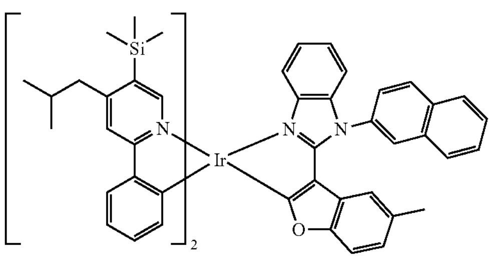
354
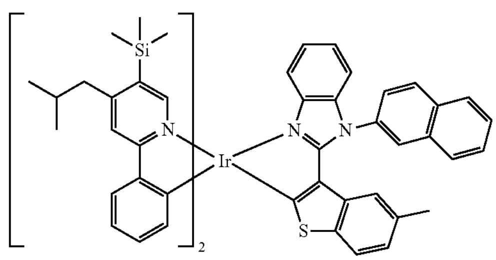
355
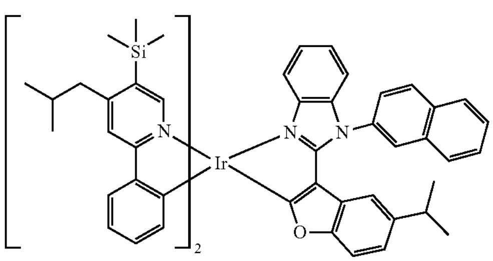
356
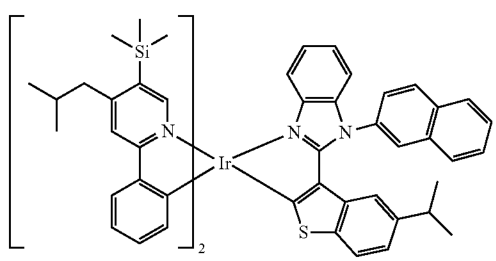
357
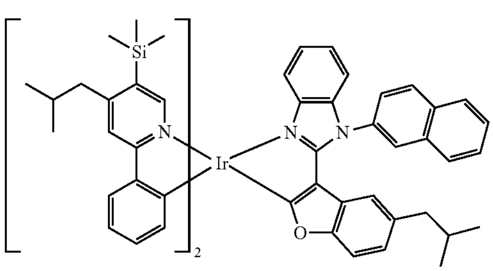
358
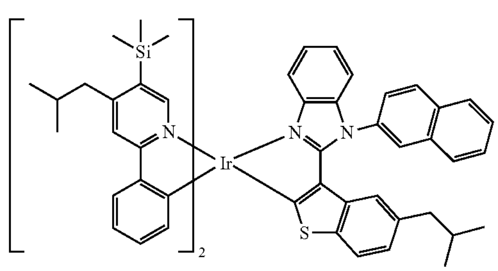

-continued
359
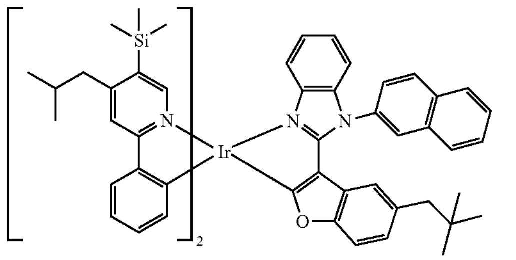
360
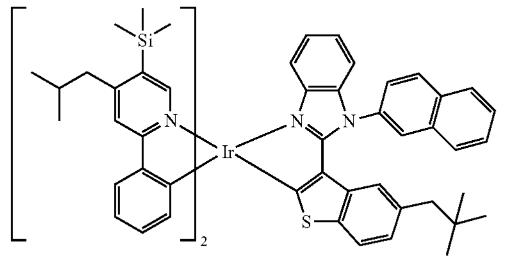
361
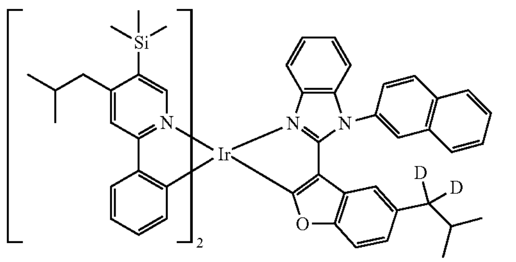
362
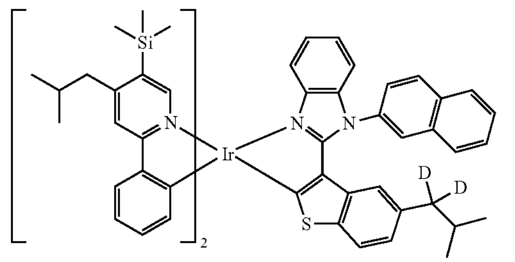
363
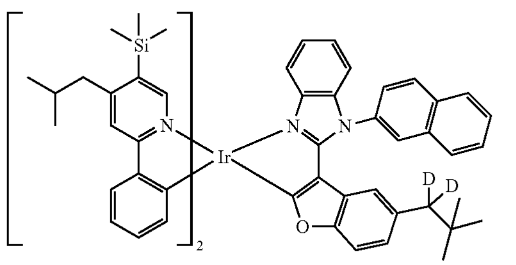
364
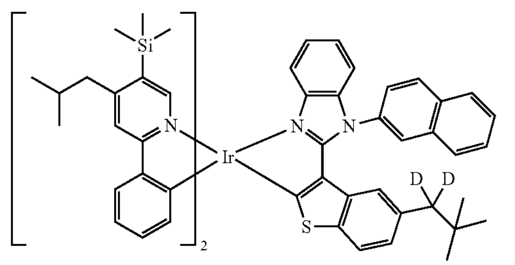
365
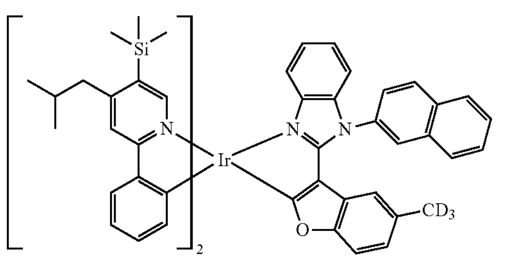
366
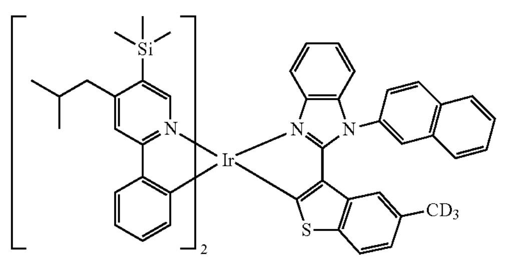
367
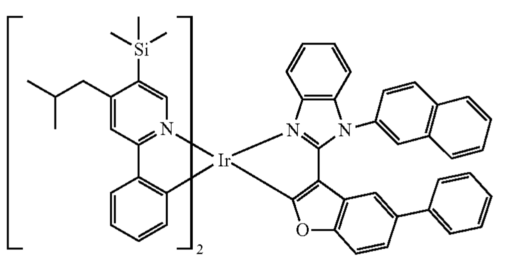
368
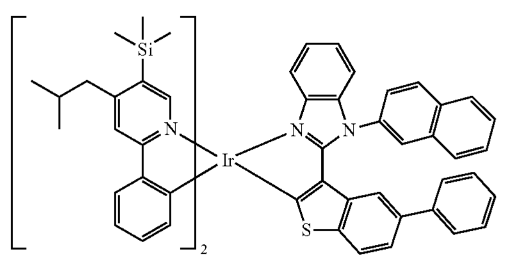
369
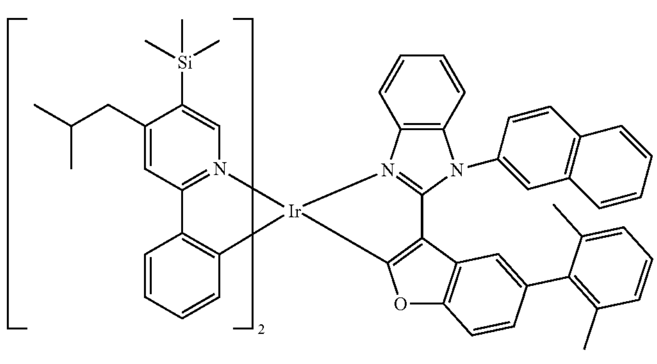

-continued
370
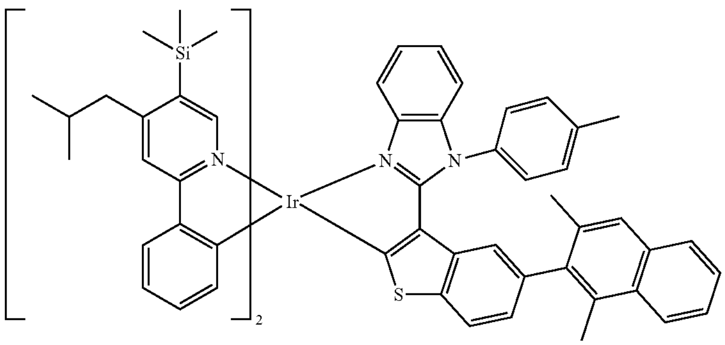
371
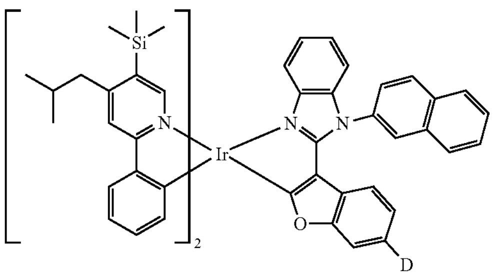
372
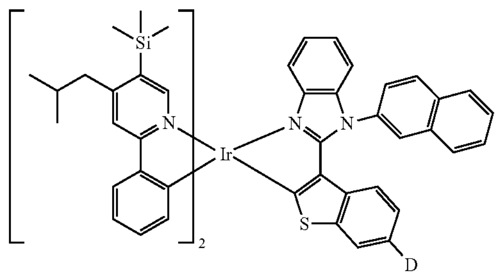
373
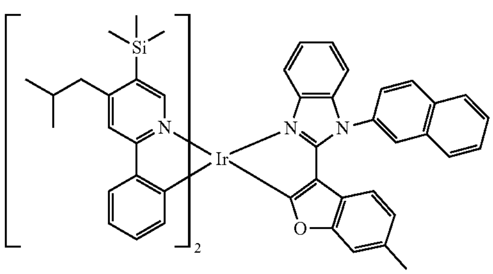
374
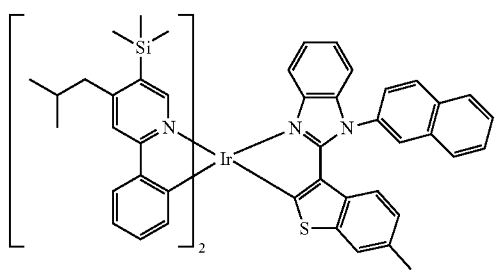
375
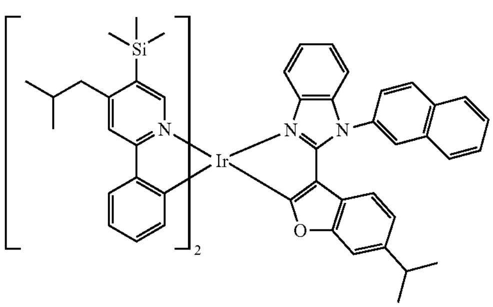
376
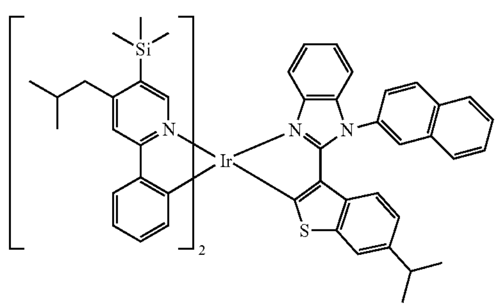
377
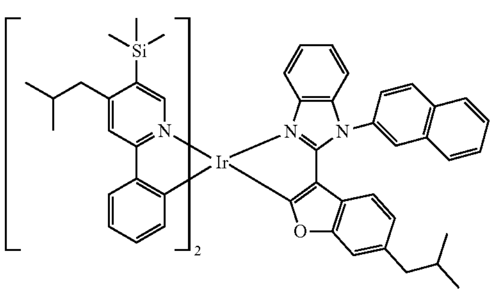
378
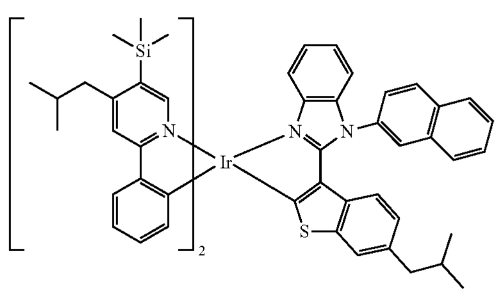

-continued
379
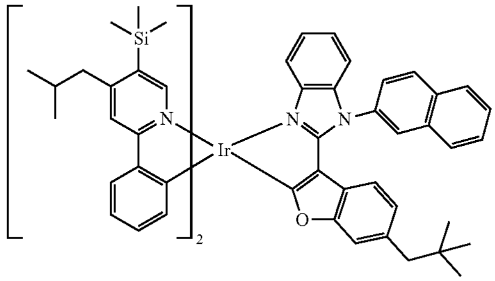
380
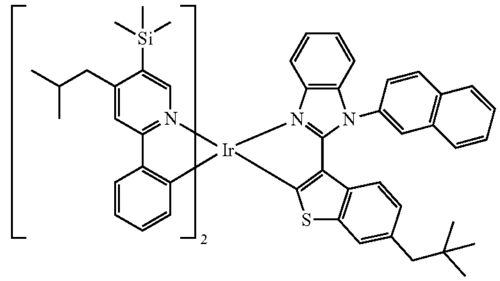
381
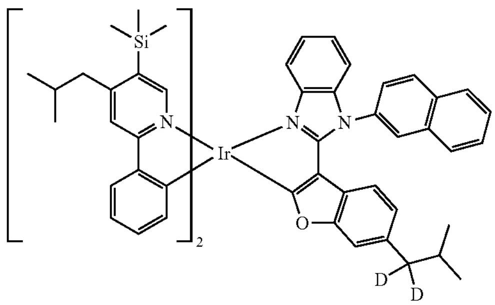
382
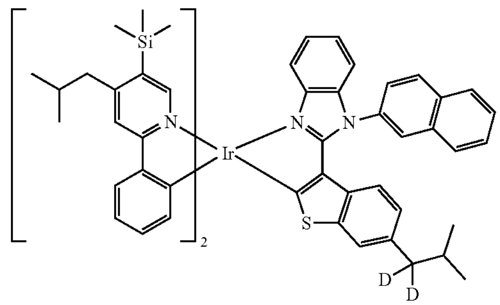
383
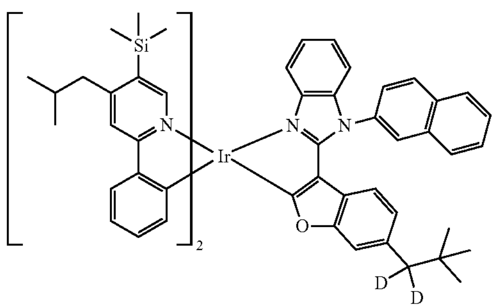
384
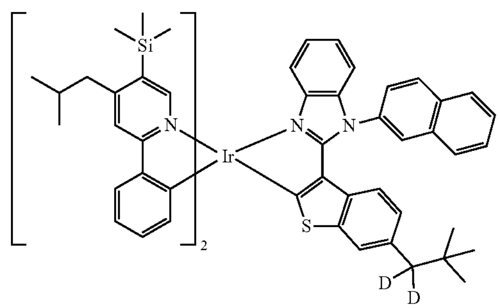
385
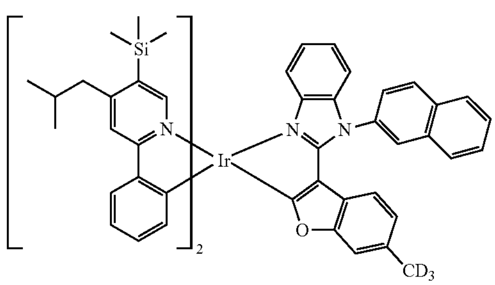
386
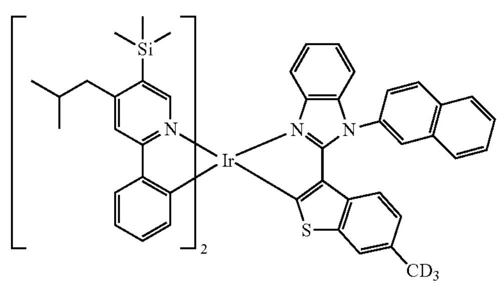
387
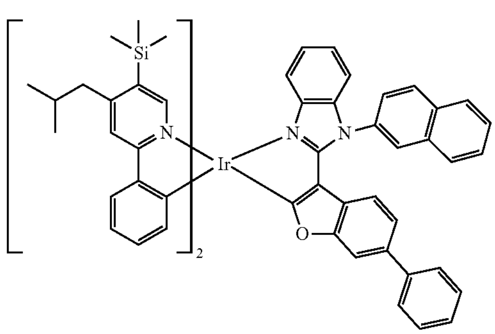
388
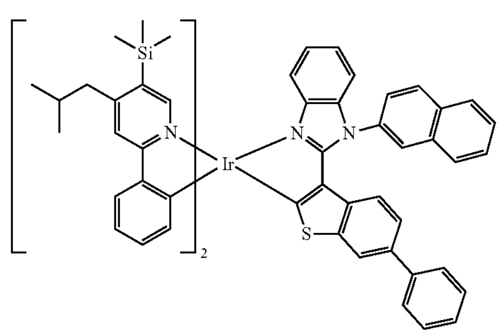

-continued
389
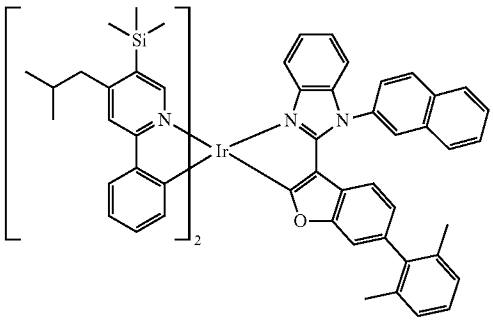
390
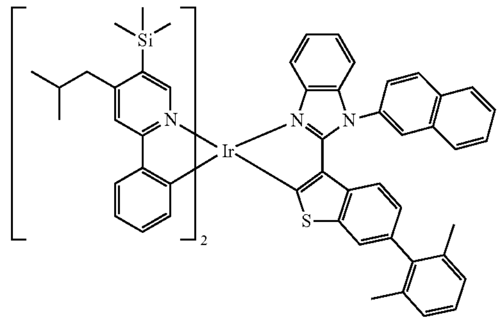
391
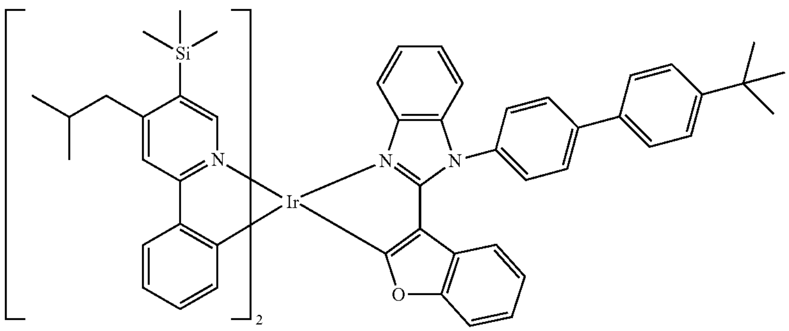
392
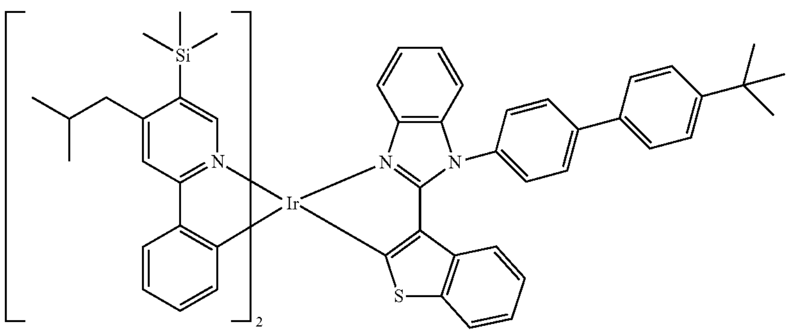
393
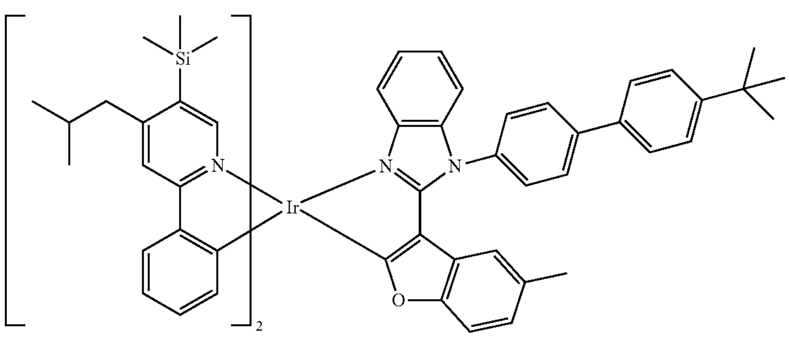
394
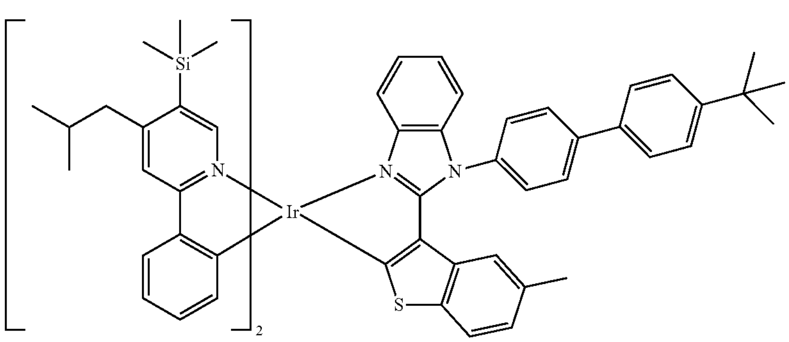

-continued
395
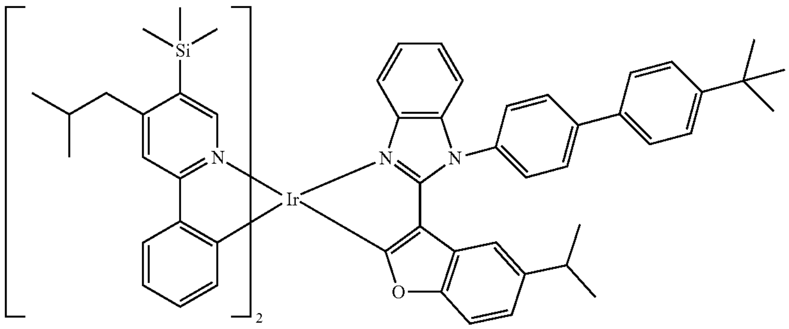
396
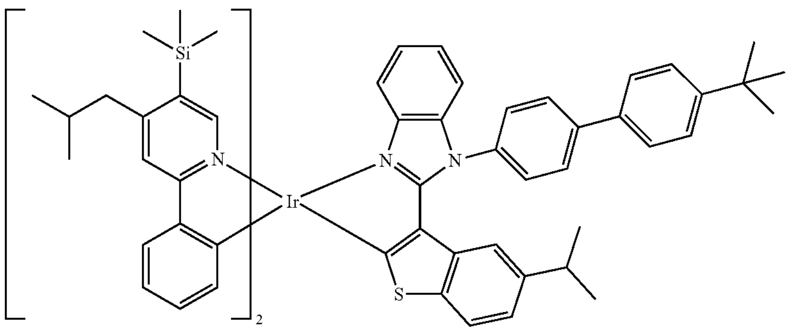
397
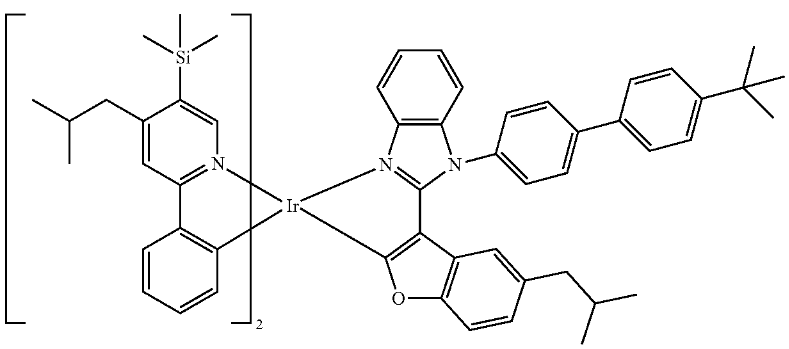
398
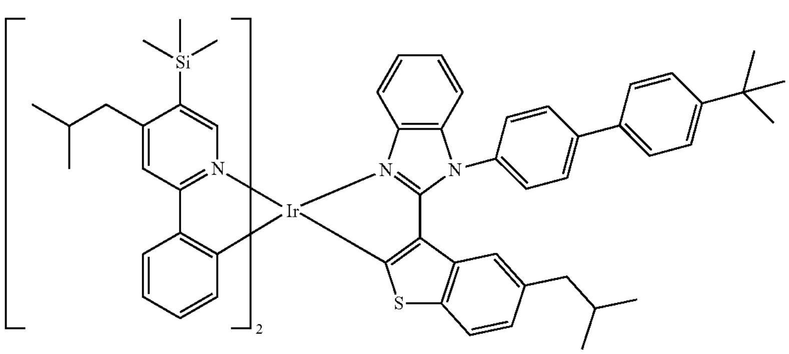

-continued
399
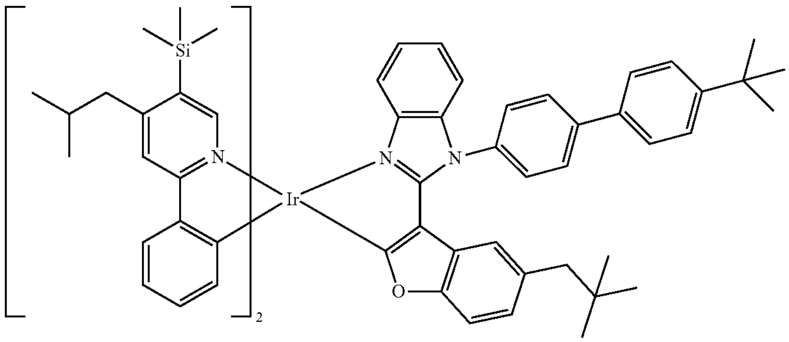
400
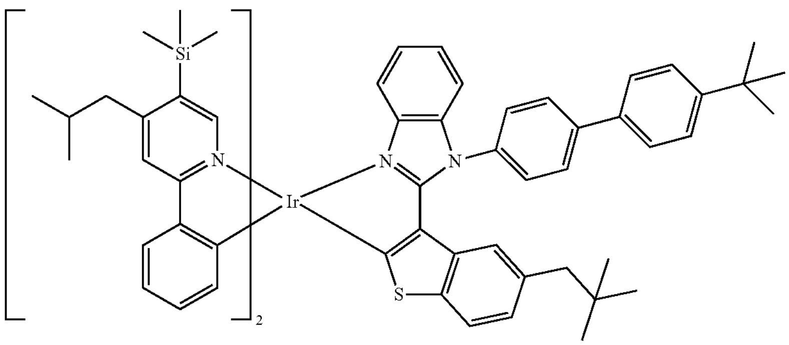
401
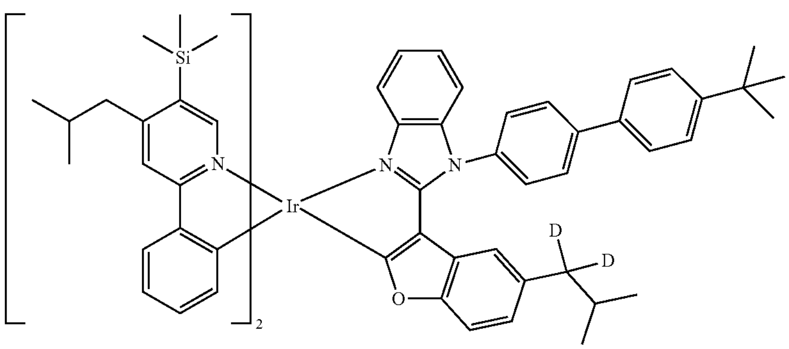
402
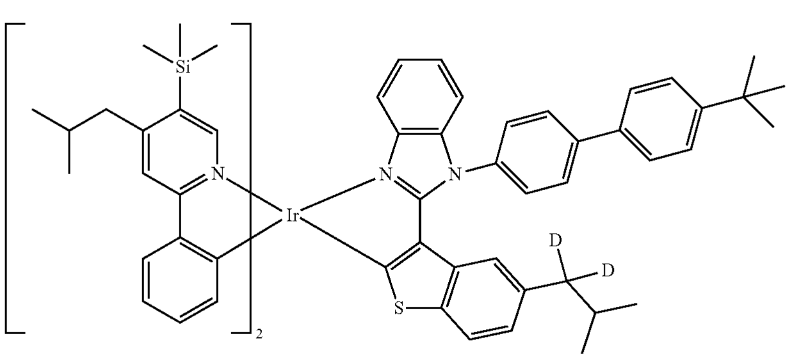

-continued
403
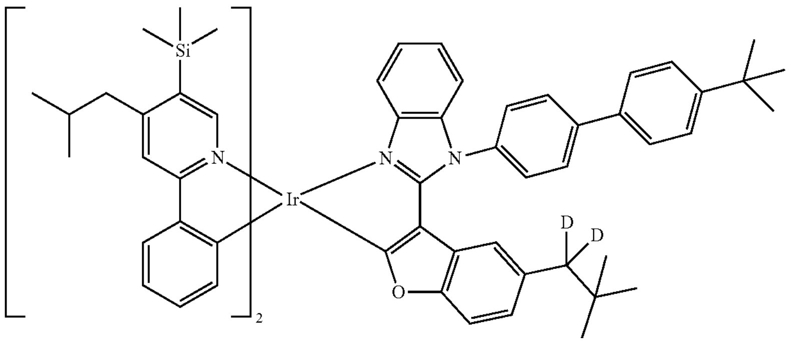
404
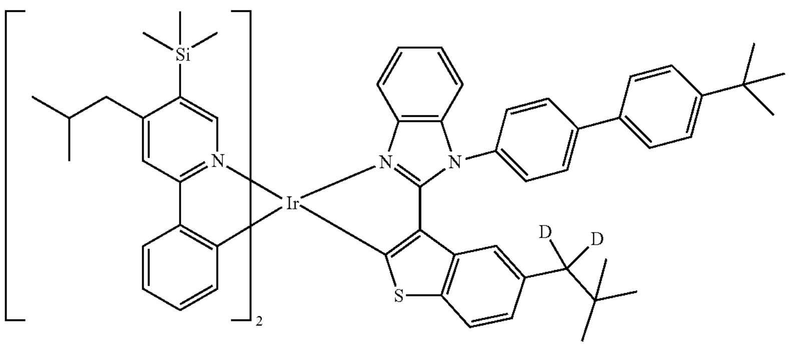
405
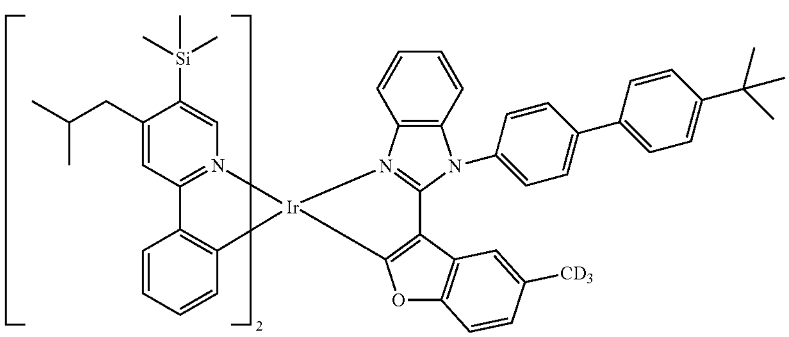
406
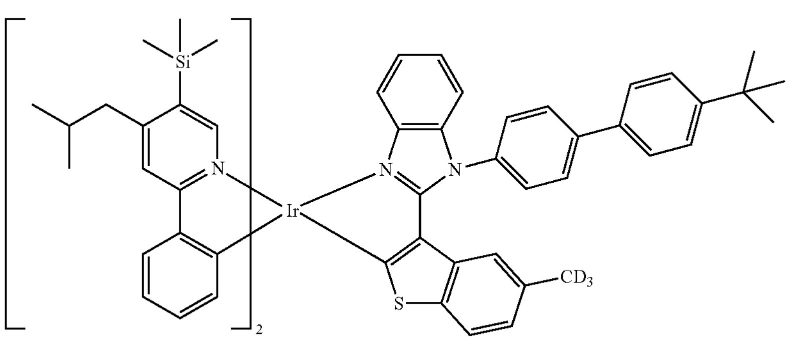

-continued
407
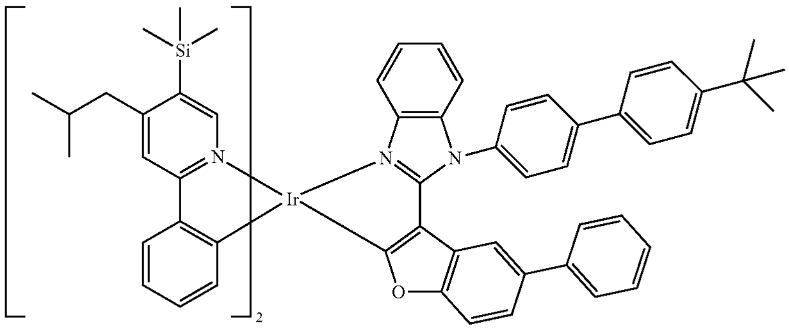
408
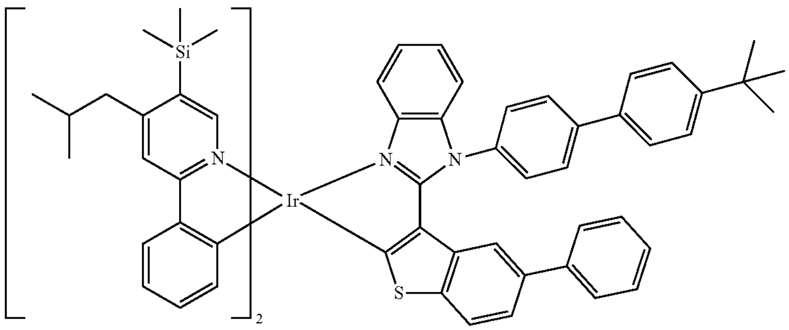
409
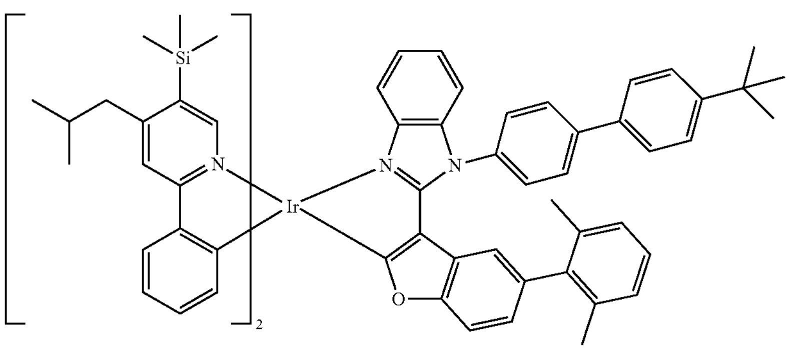
410
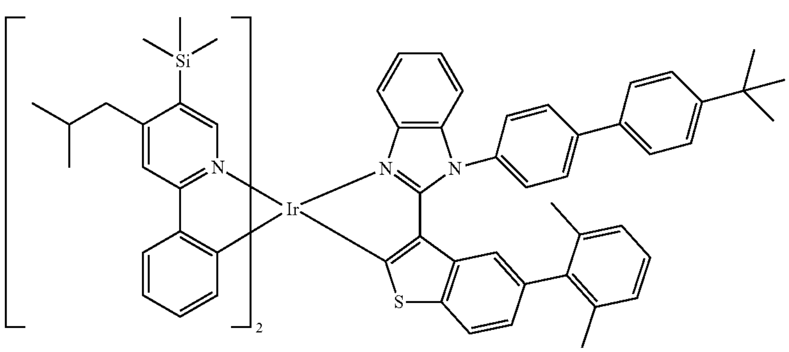

-continued
411
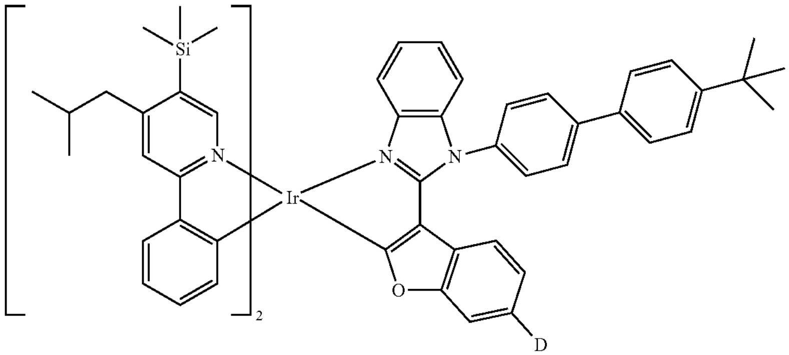
412
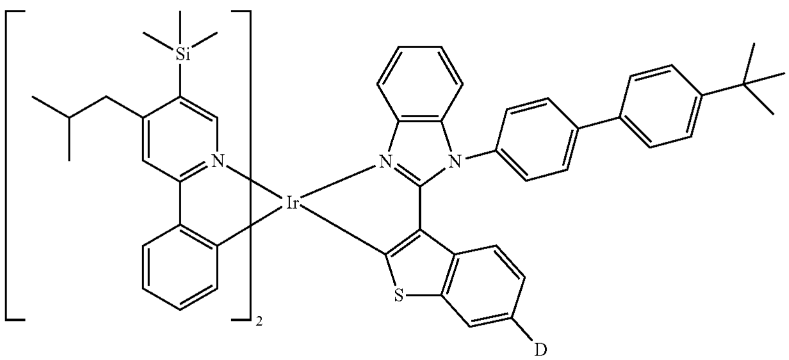
413
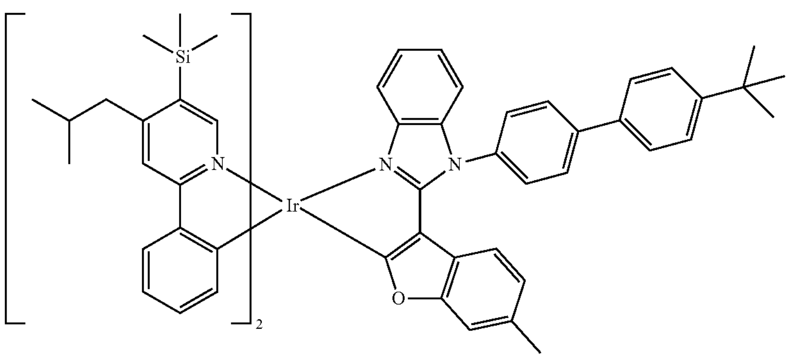
414
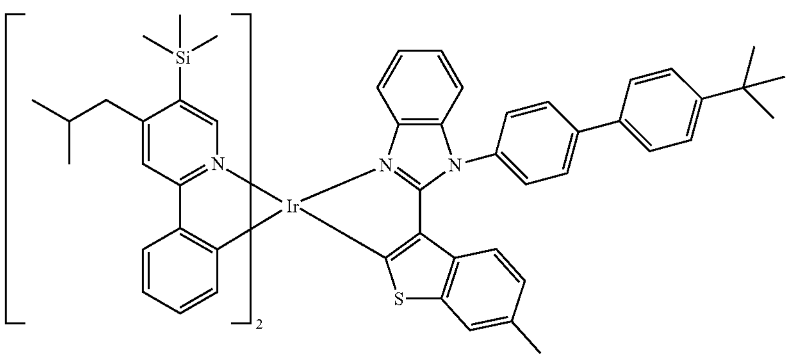

-continued
415
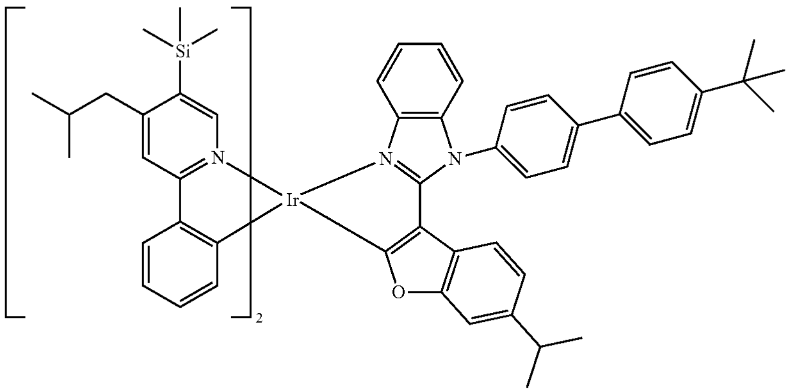
416
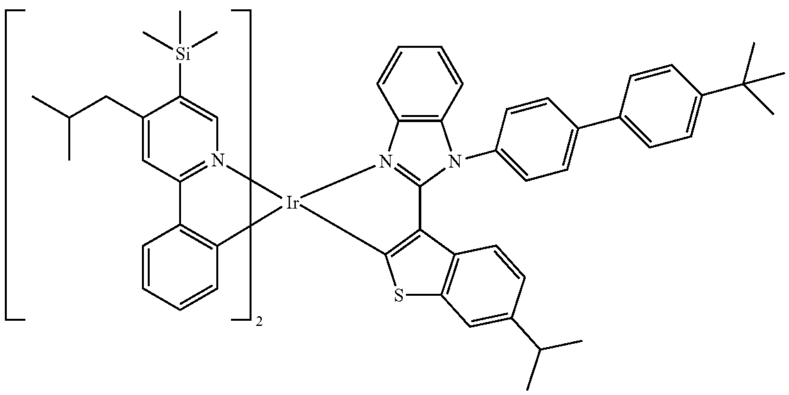
417
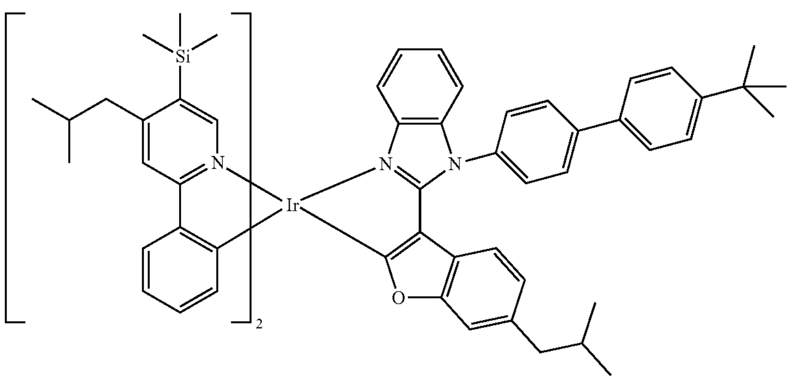
418
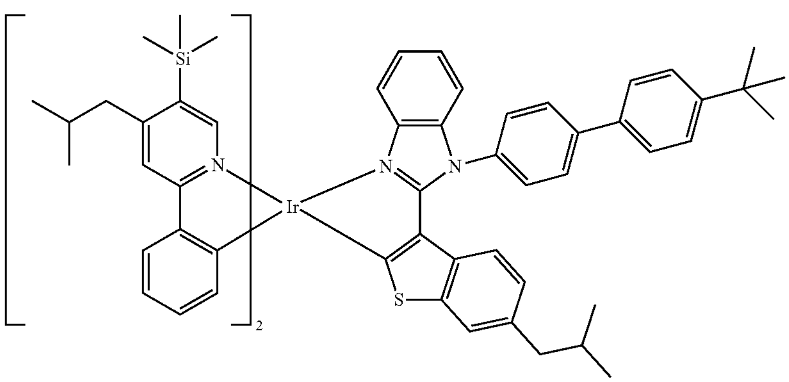

-continued
419
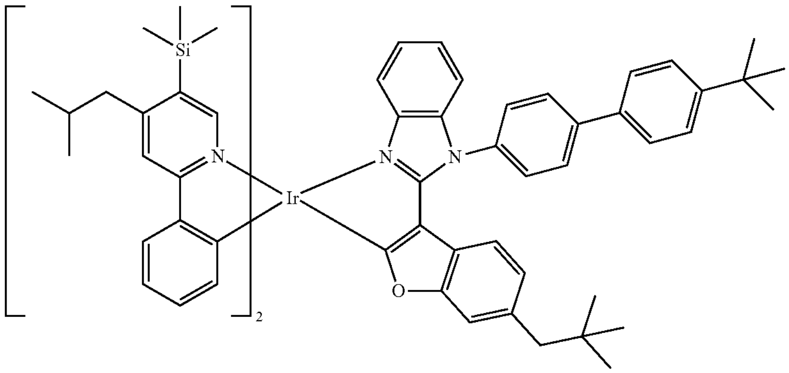
420
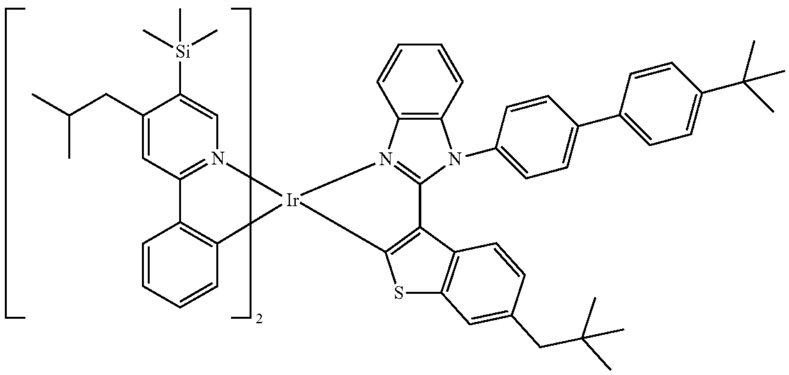
421
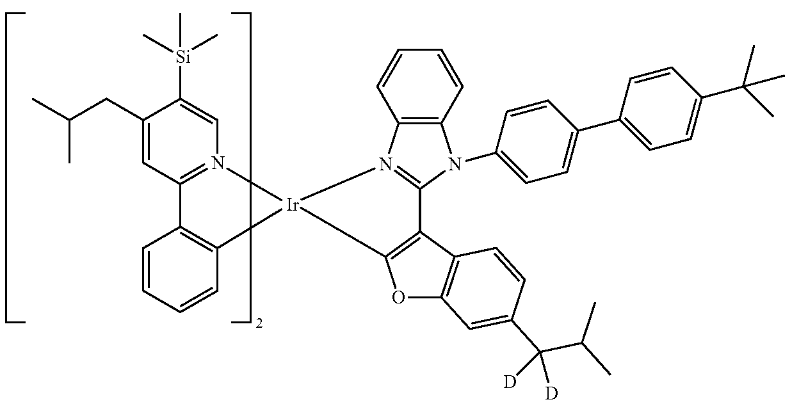
422
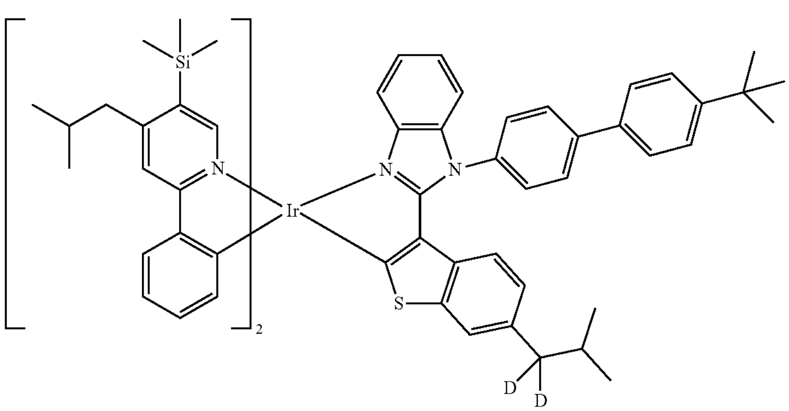

-continued
423
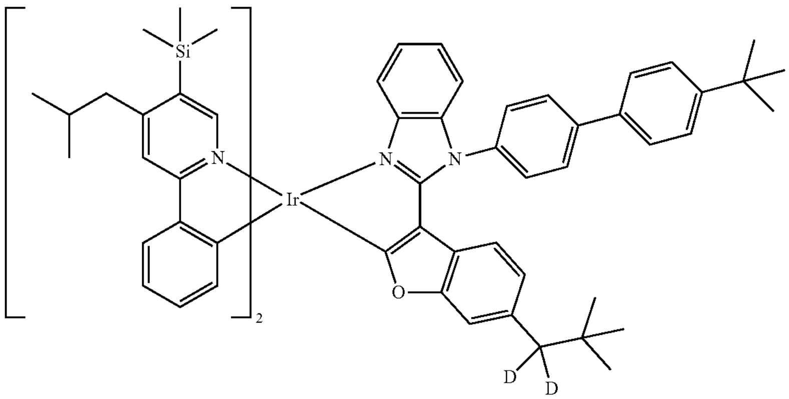
424
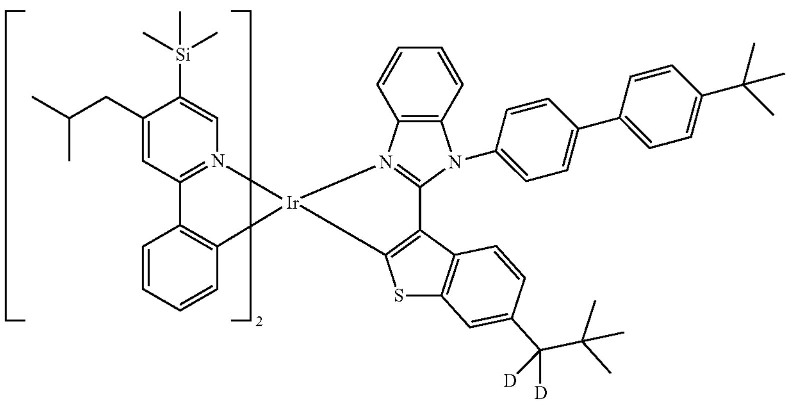
425
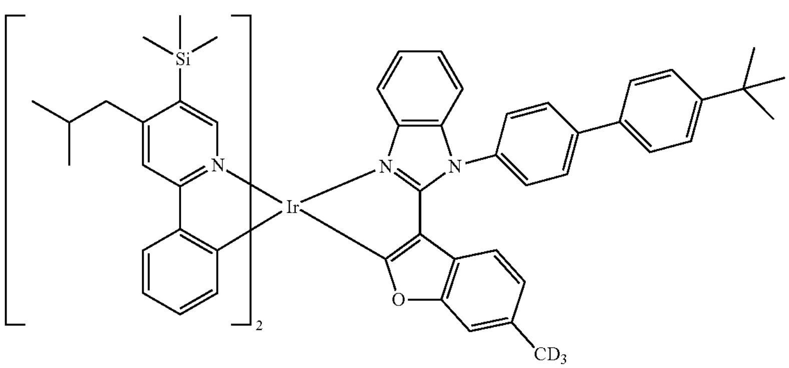
426
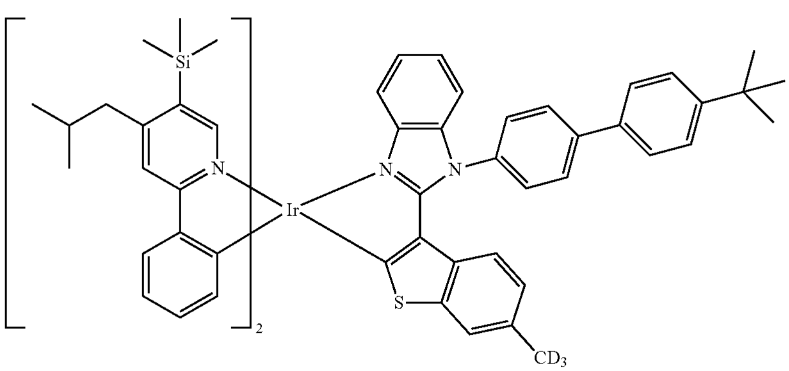

-continued
427
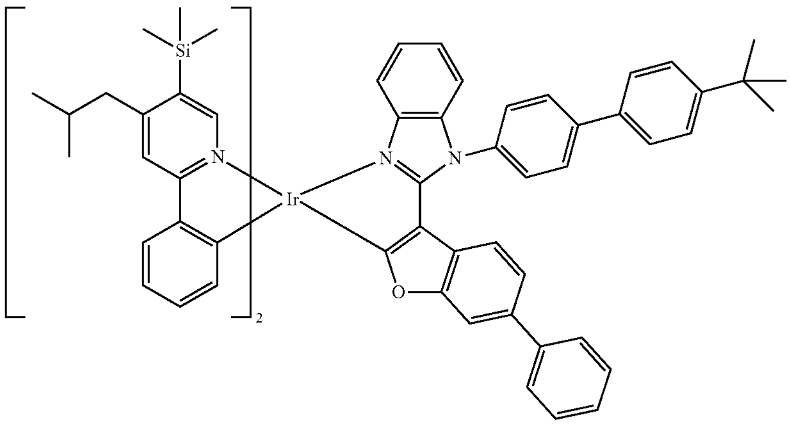
428
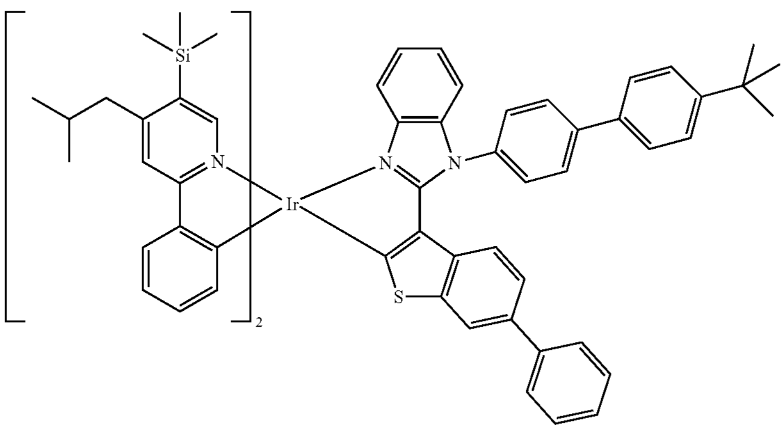
429
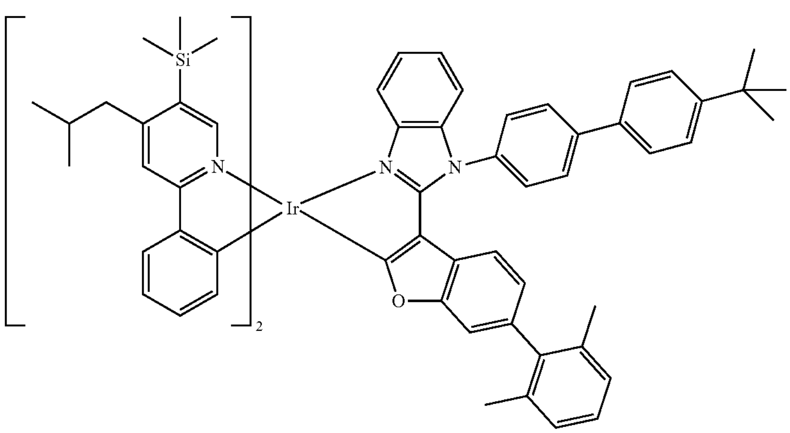

-continued
430
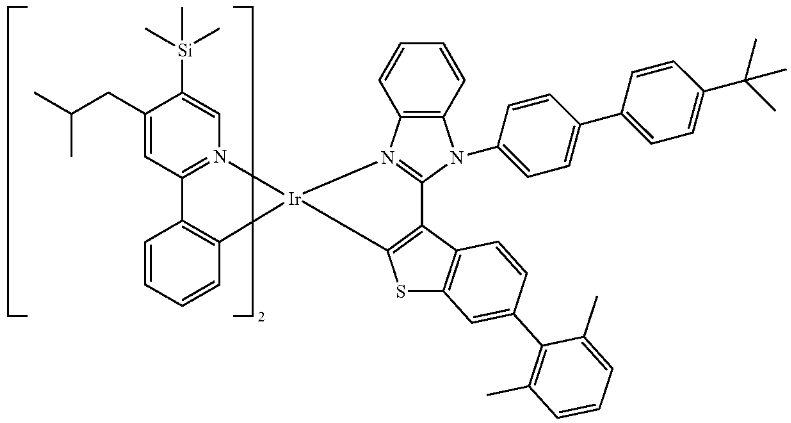
431
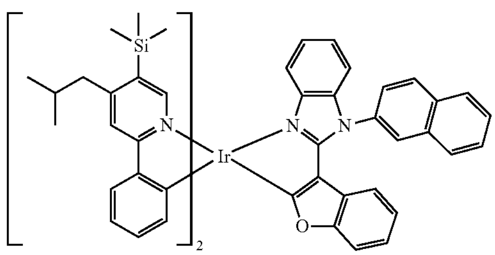
432
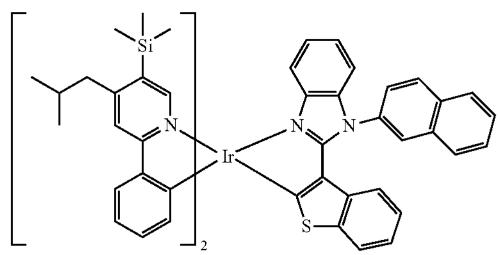
433
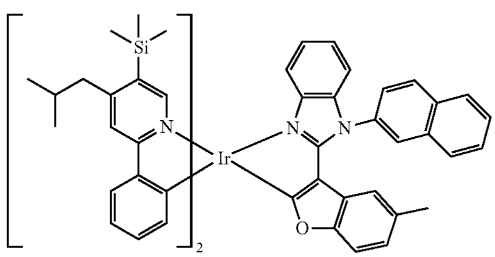
434
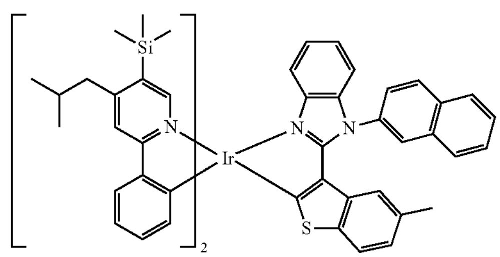
435
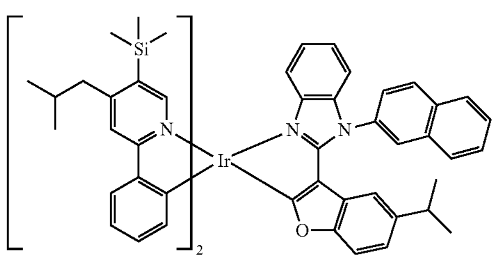
436
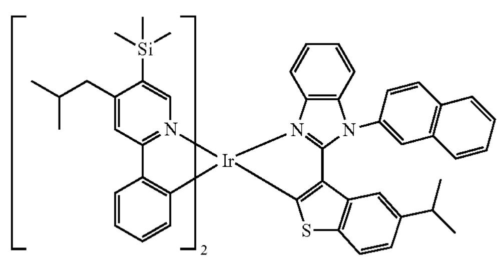
437
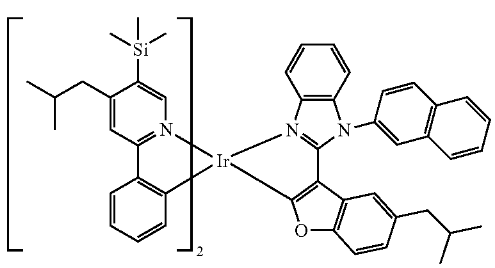
438
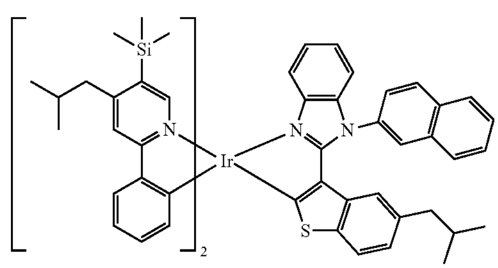

-continued
439
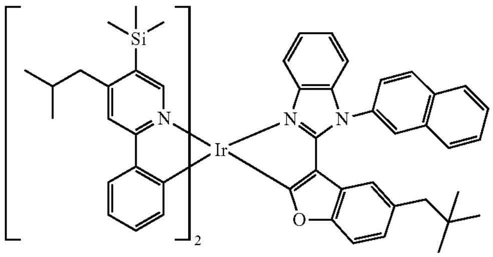
440
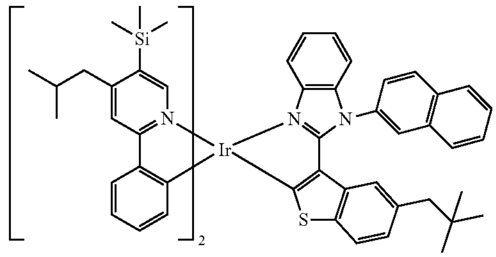
441
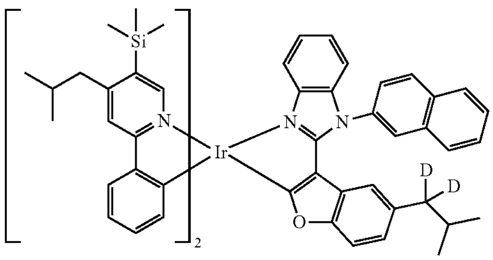
442
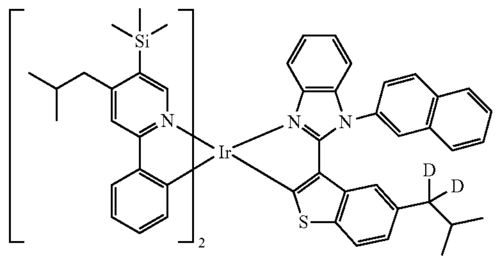
443
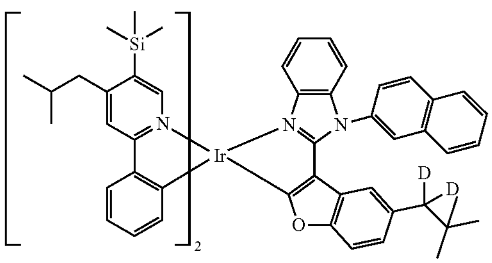
444
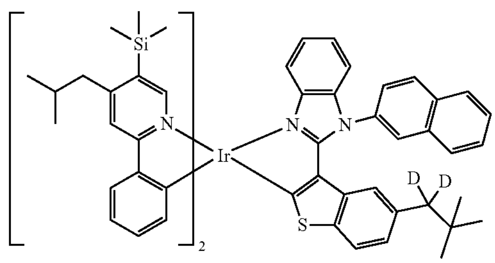
445
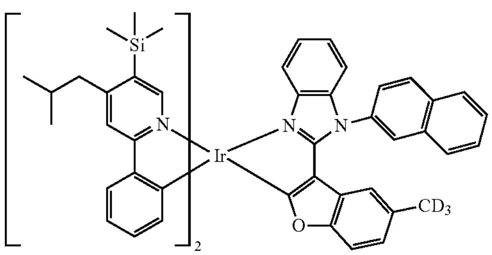
446
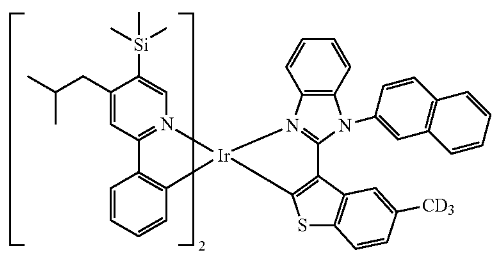
447
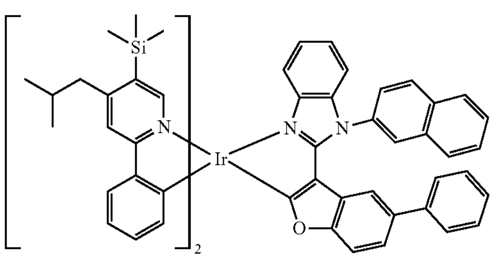
448
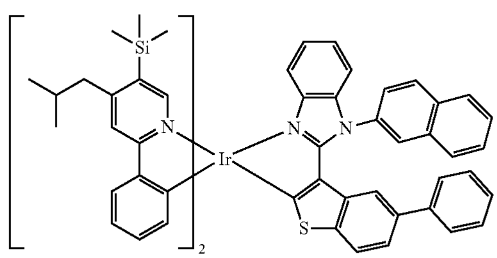
449
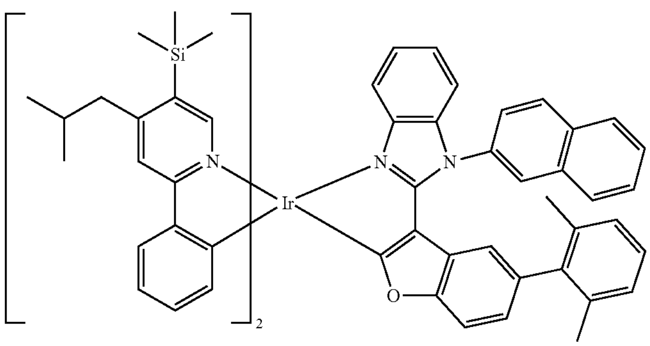

-continued
450
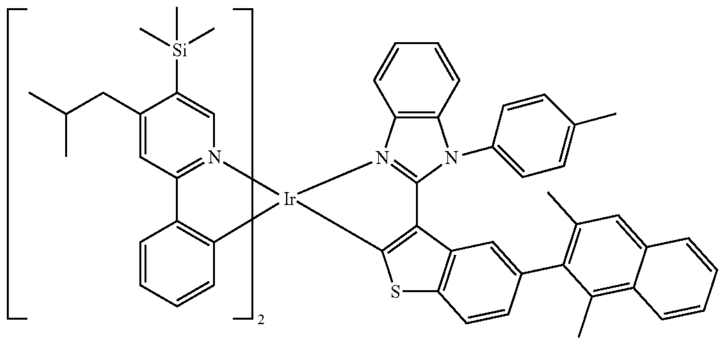
451
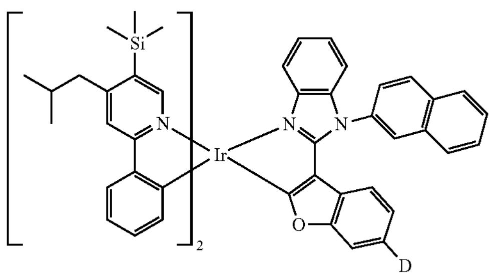
452
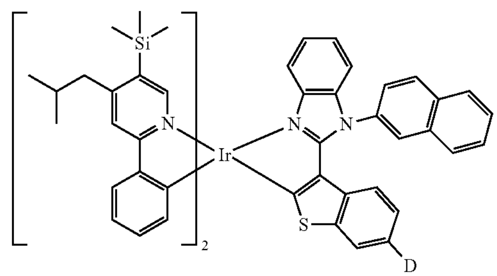
453
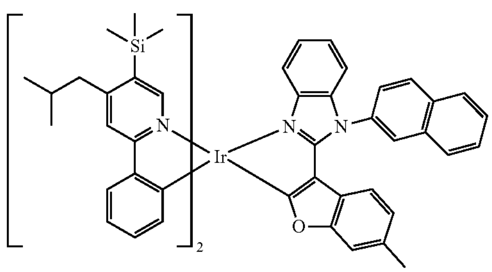
454
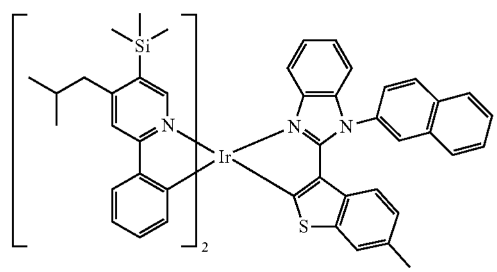
455
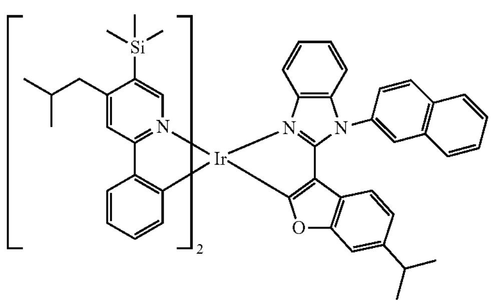
456
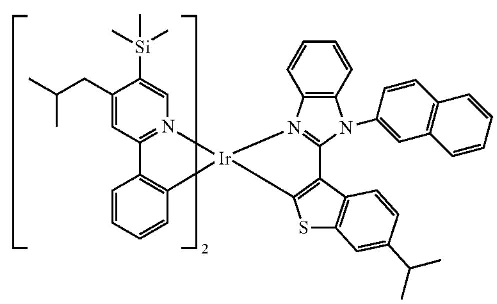
457
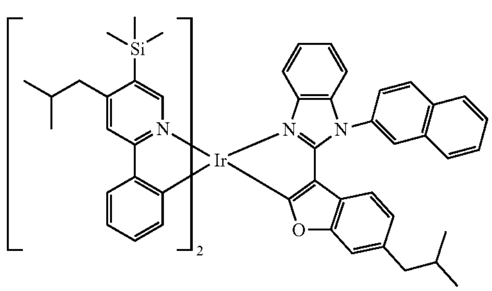
458
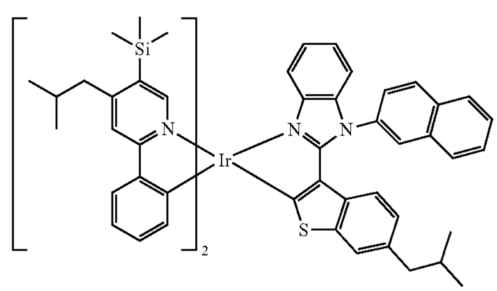

-continued
459
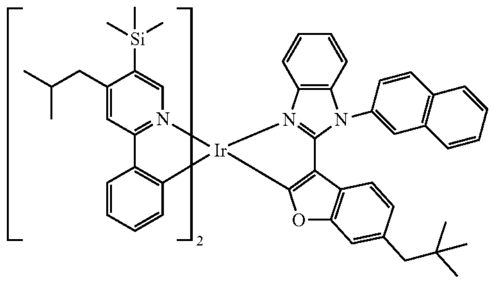
460
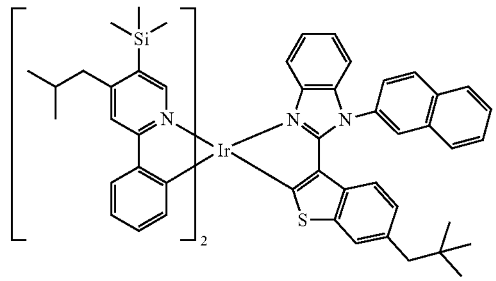
461
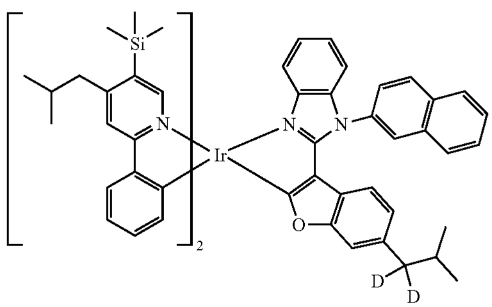
462
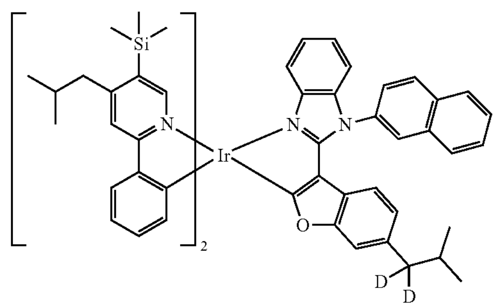
463
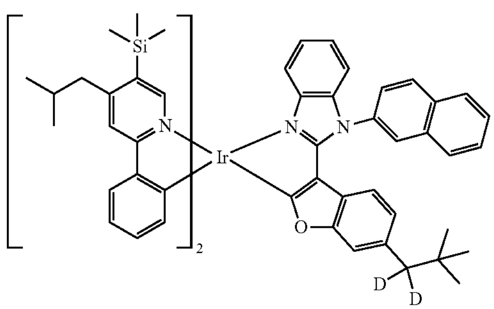
464
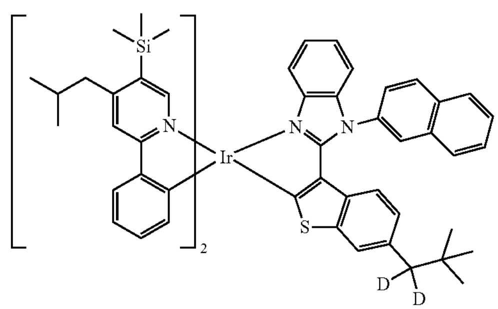
465
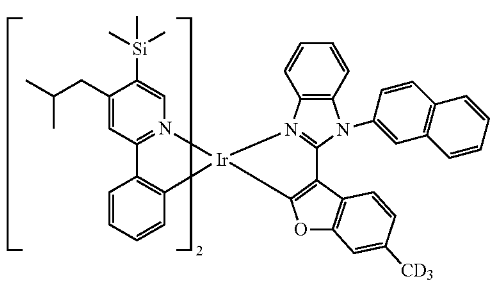
466
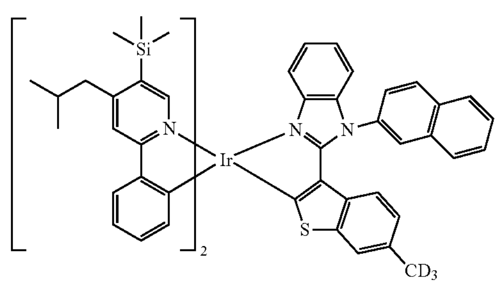
467
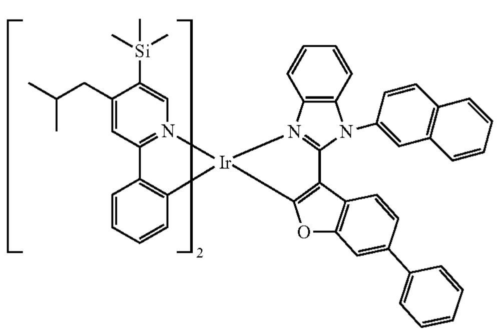
468
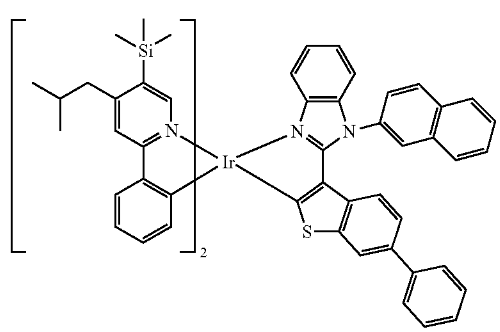

-continued
469
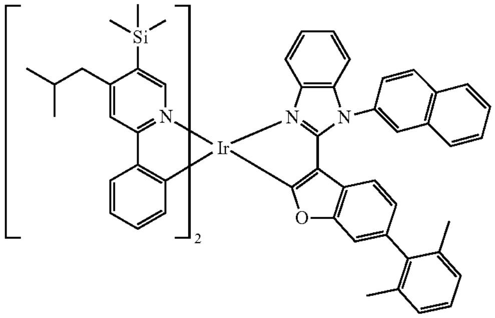
470
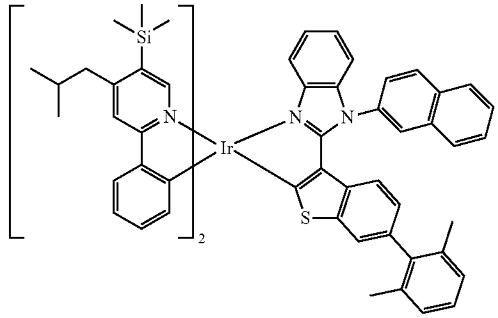
471
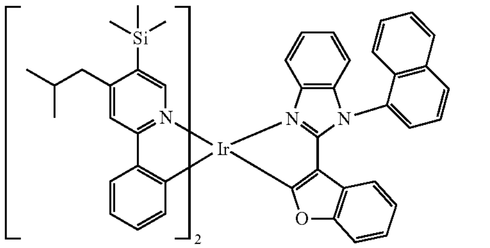
472
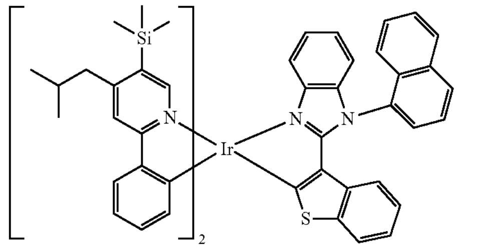
473
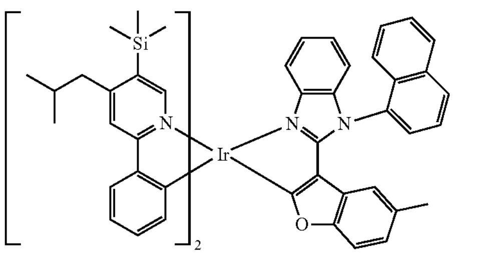
474
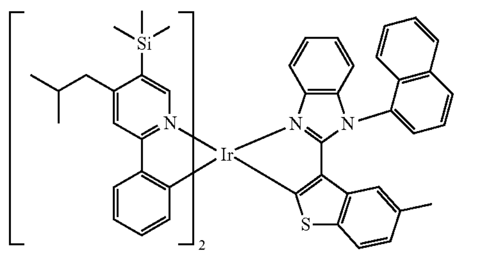
475
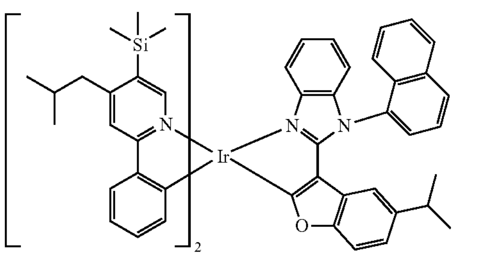
476
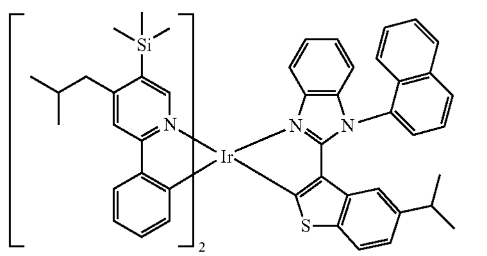
477
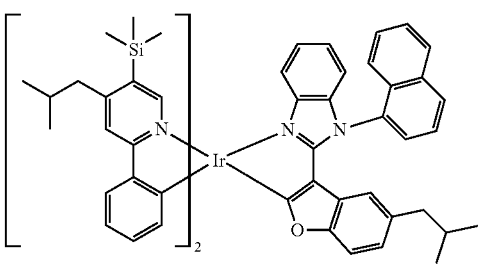
478
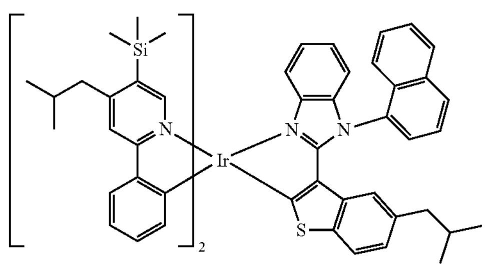
479
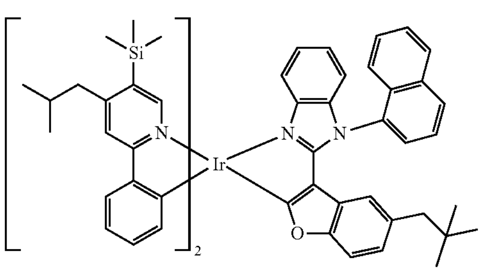
480
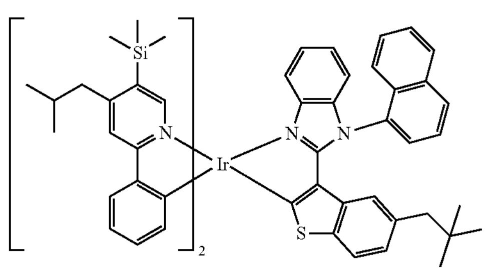

481
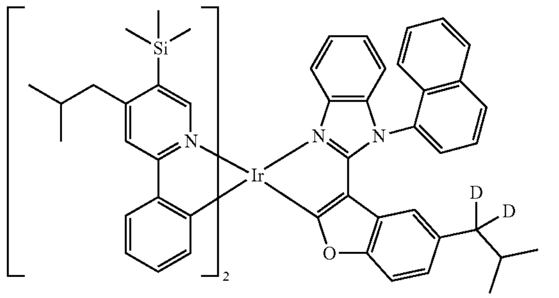
482
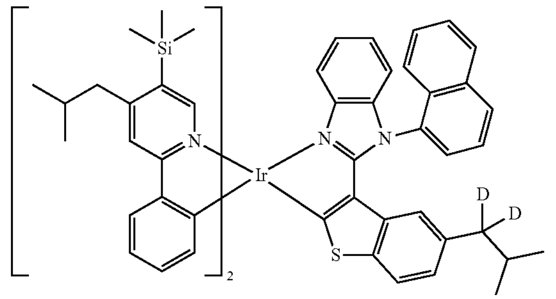
483
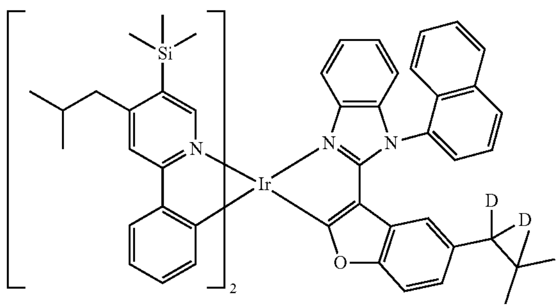
484
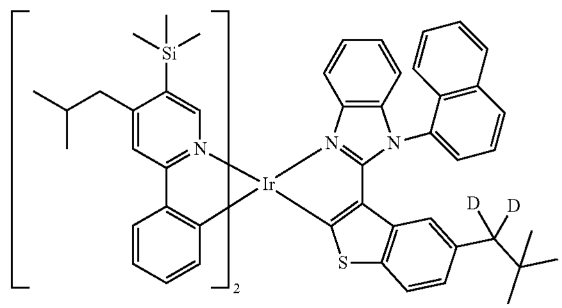
485
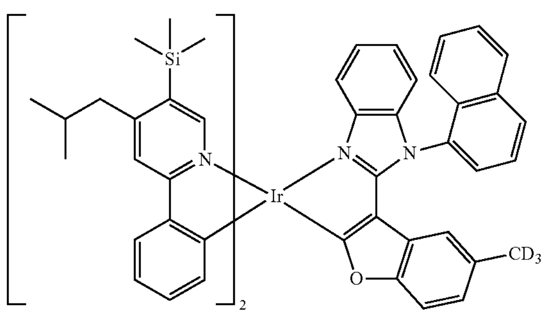
486
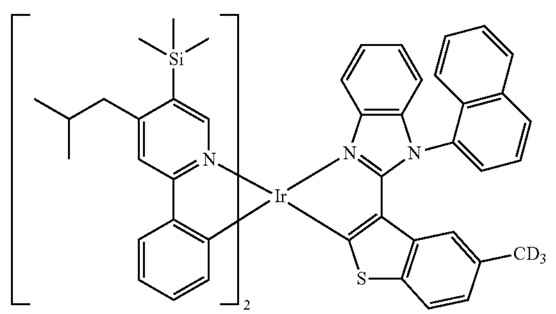
487
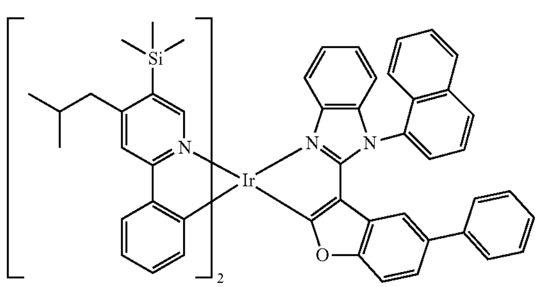
488
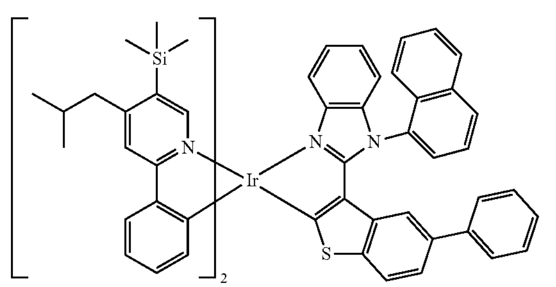
489
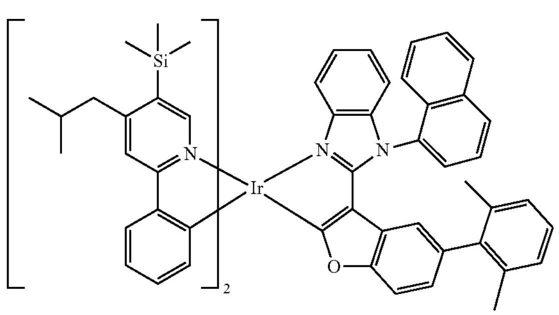
490
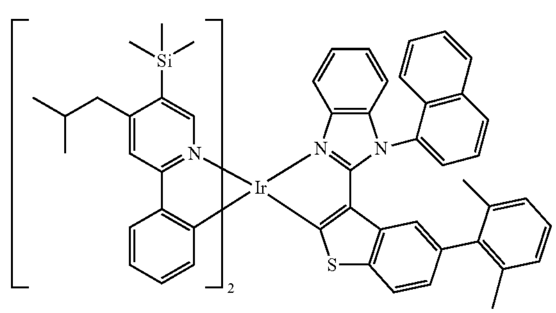

-continued
491
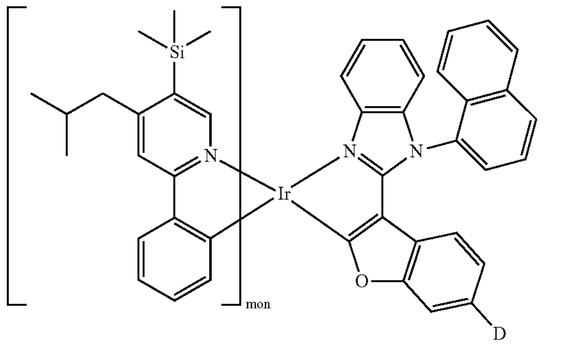
492
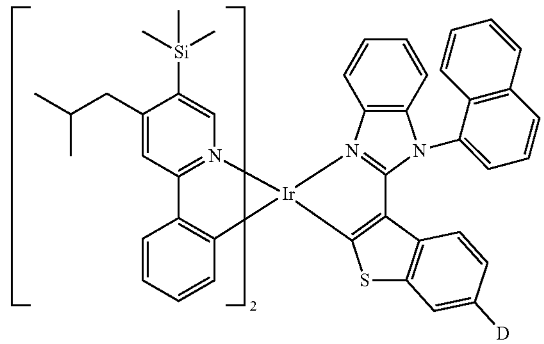
493
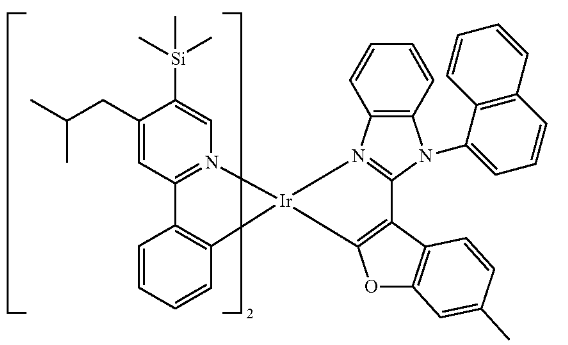
494
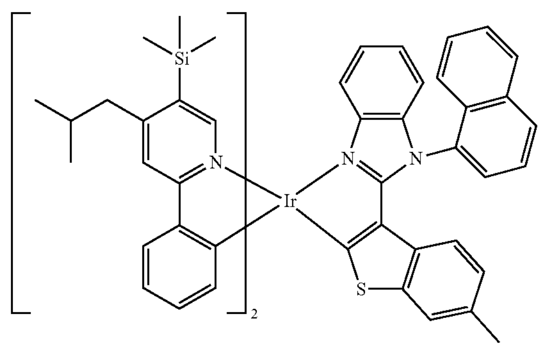
495
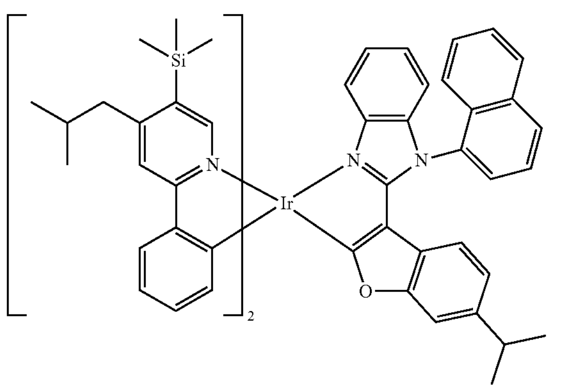
496
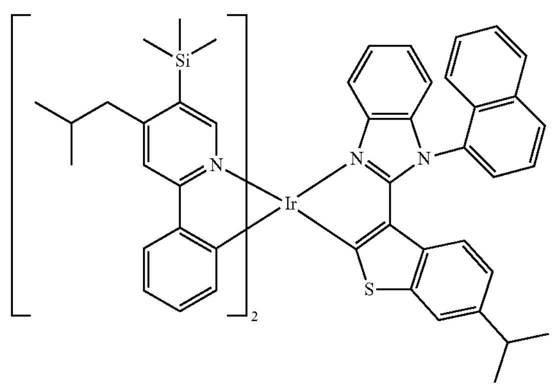
497
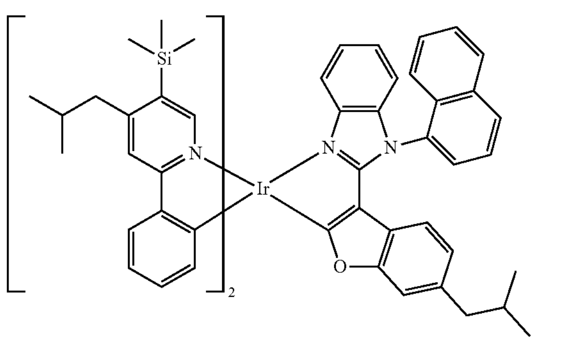
498
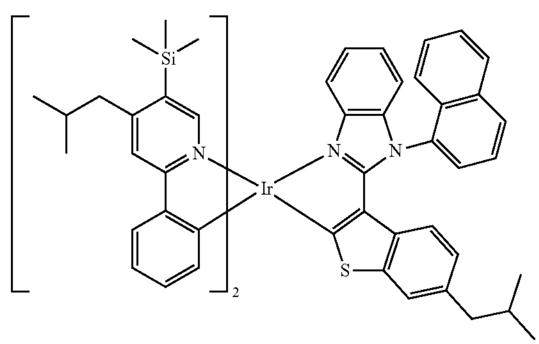

-continued
499
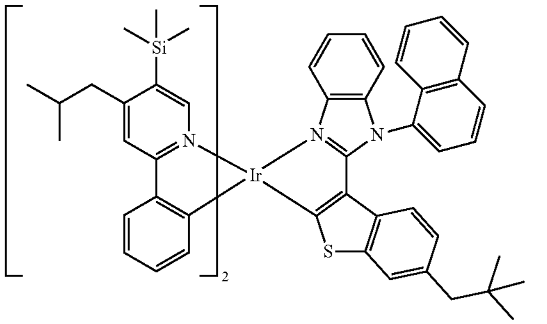
500
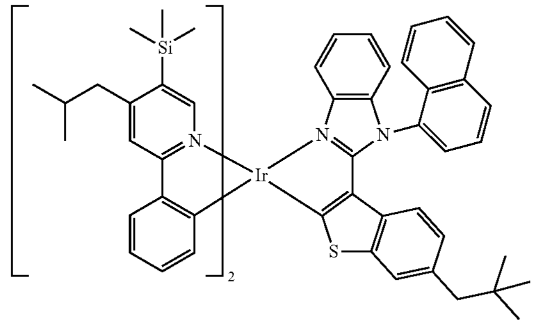
501
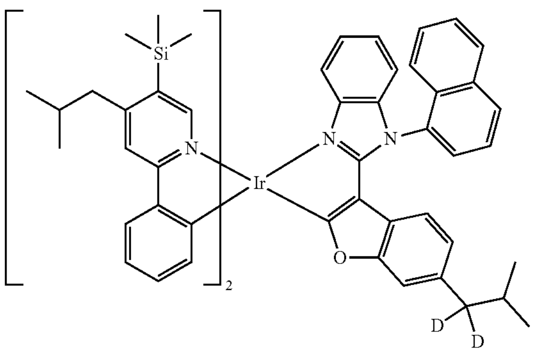
502
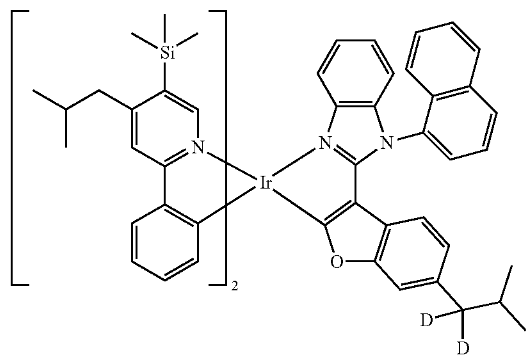
503
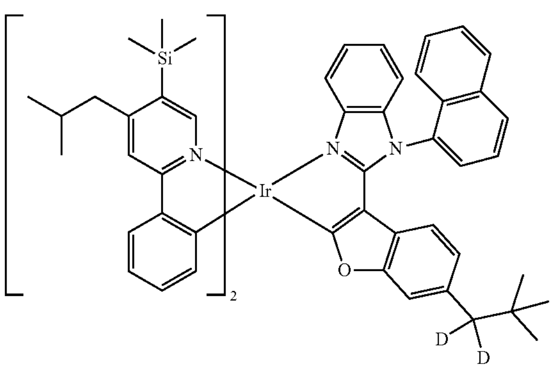
504
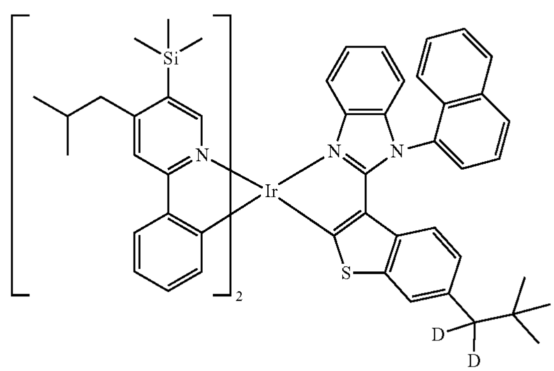
505
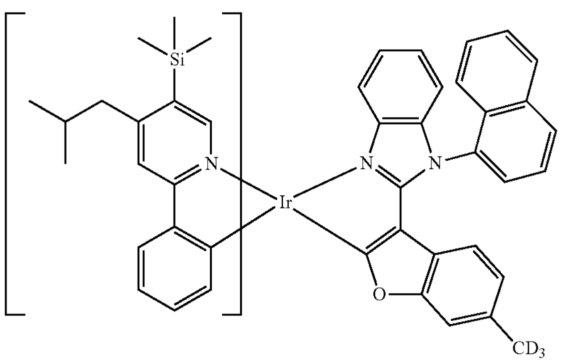
506
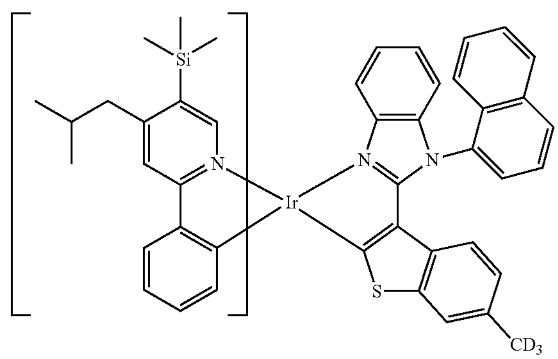

-continued
507
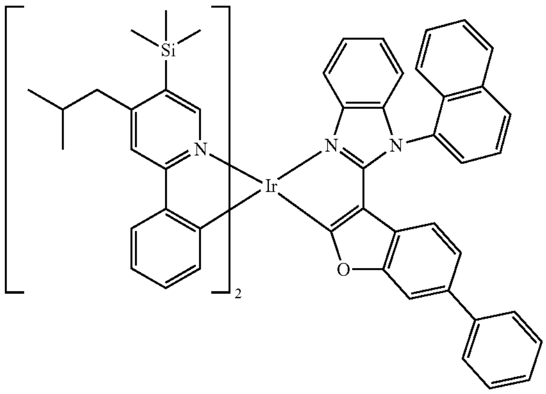
508
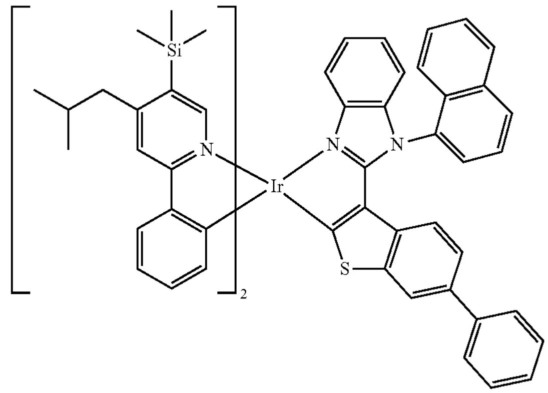
509
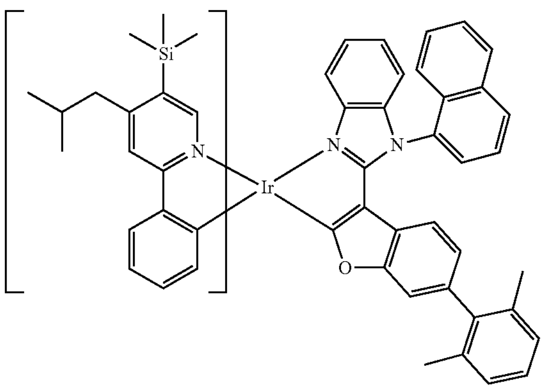
510
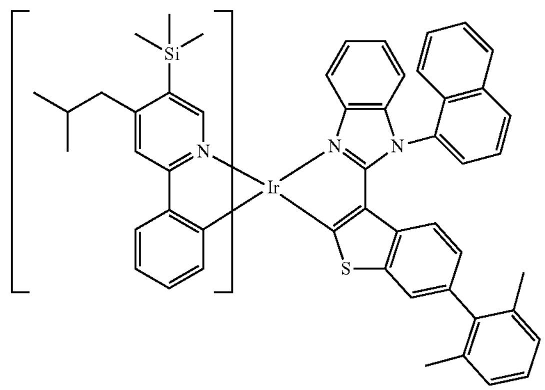
511
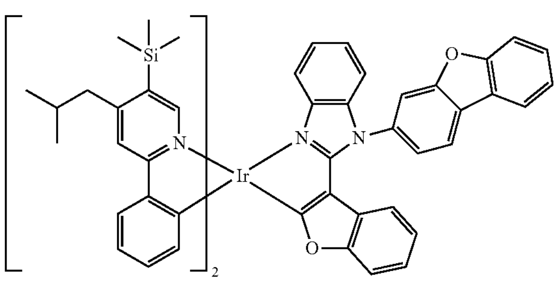
512
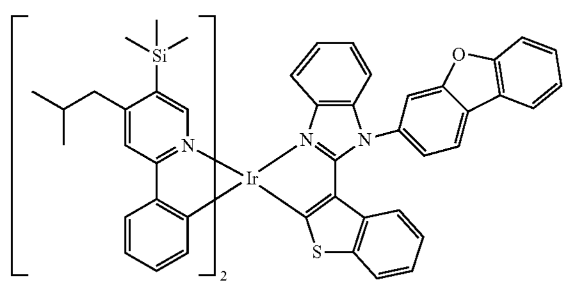
513
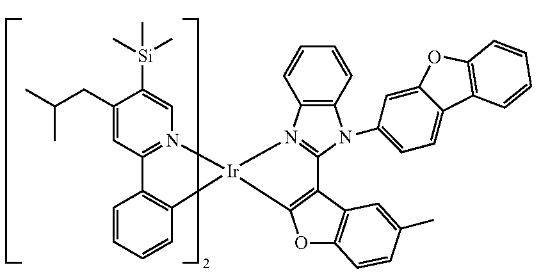
514
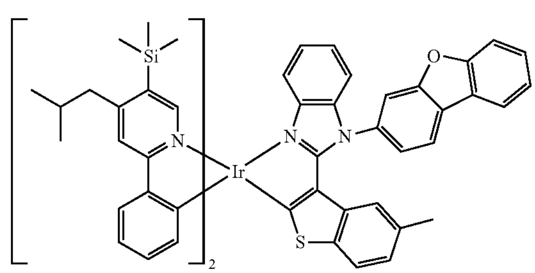

-continued
515
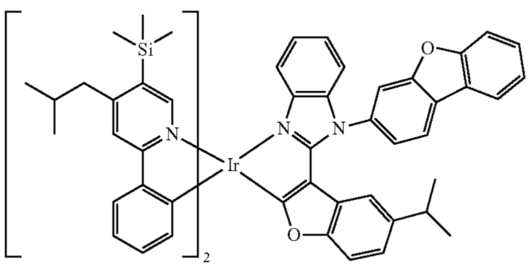
516
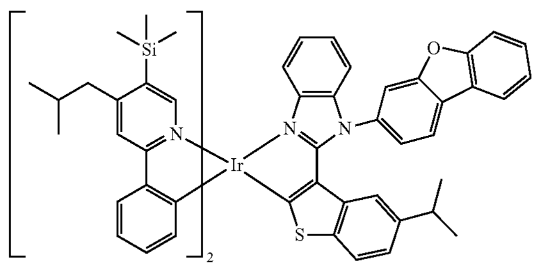
517
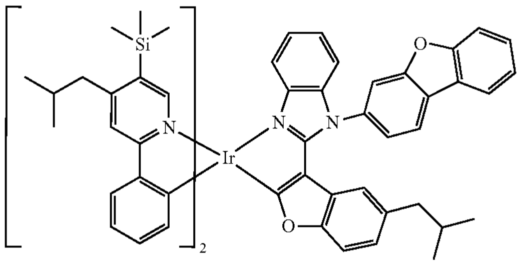
518
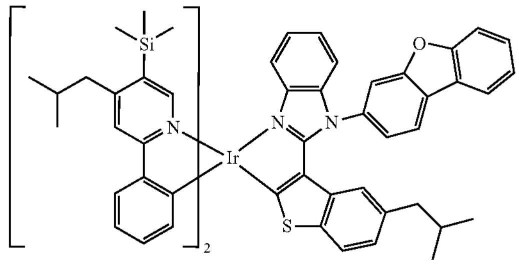
519
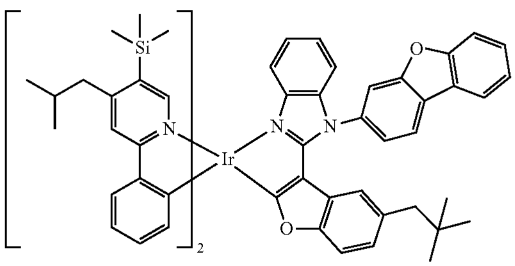
520
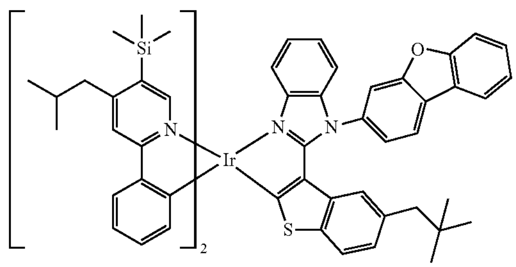
521
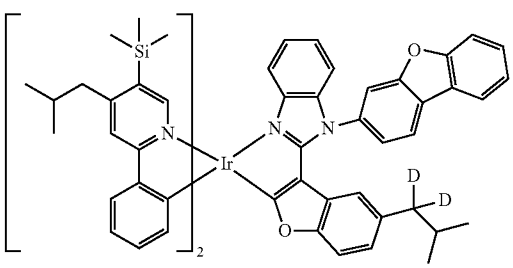
522
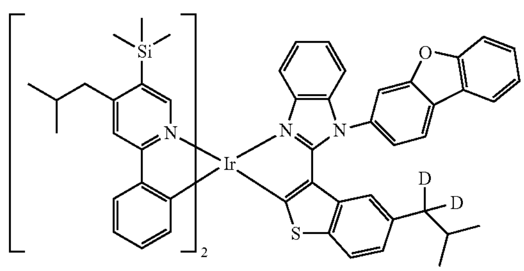
523
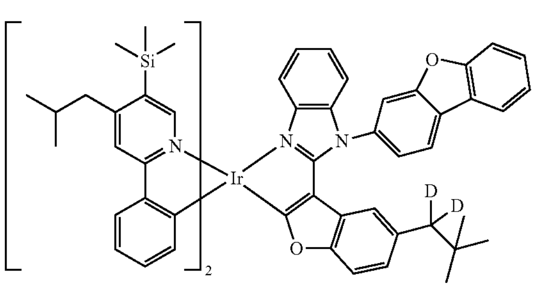
524
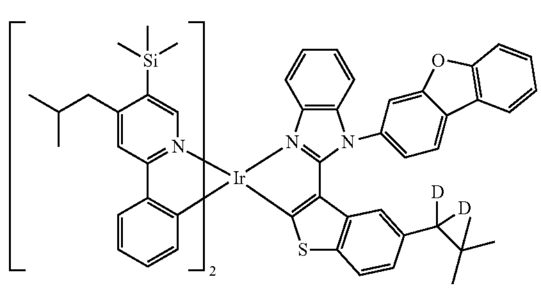

-continued
525
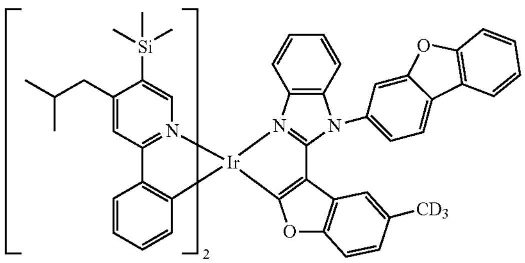
526
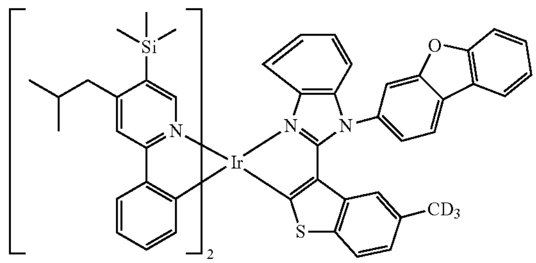
527
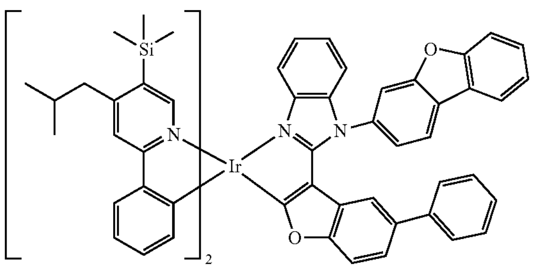
528
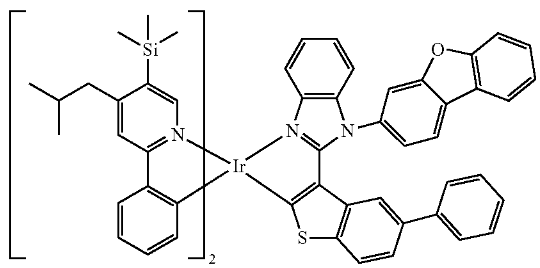
529
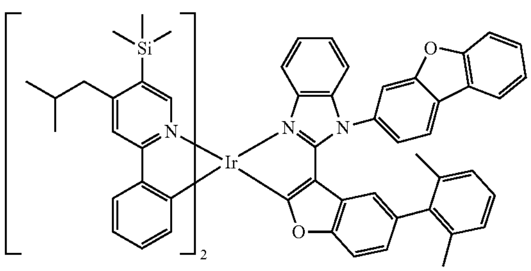
530
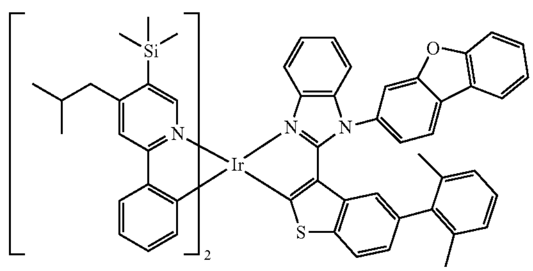
531
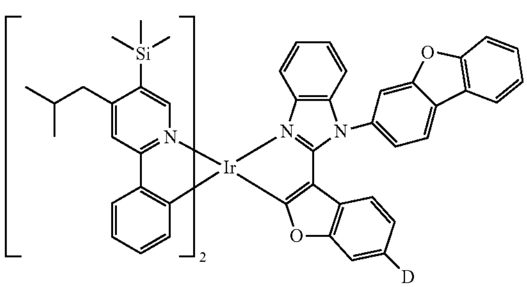
532
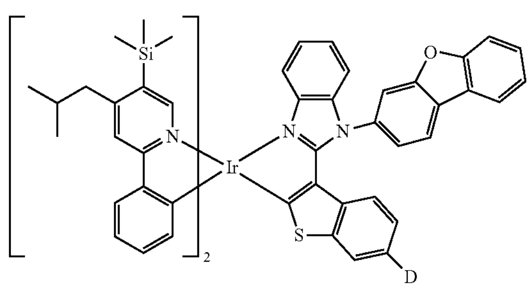
533
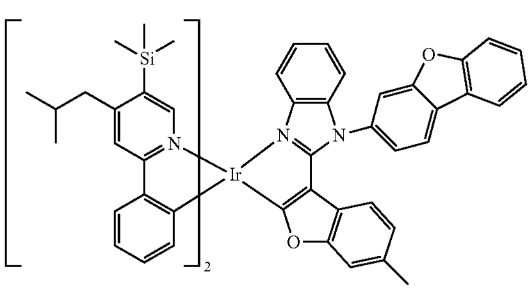
534
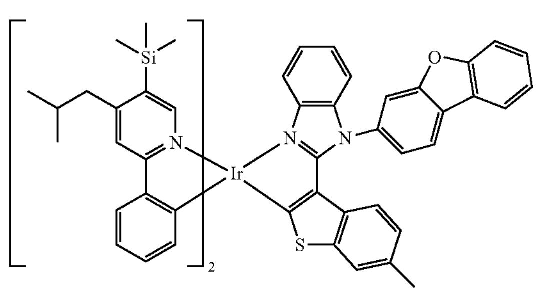

-continued
535
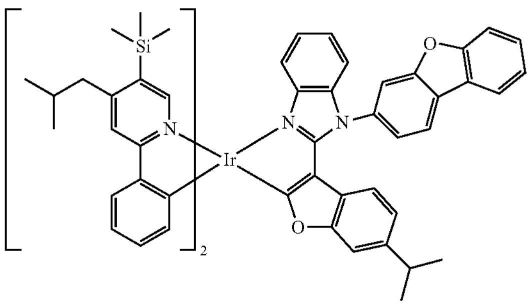
536
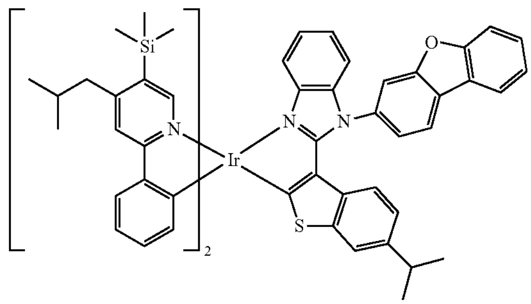
537
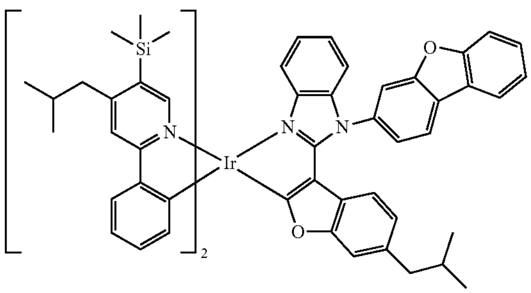
538
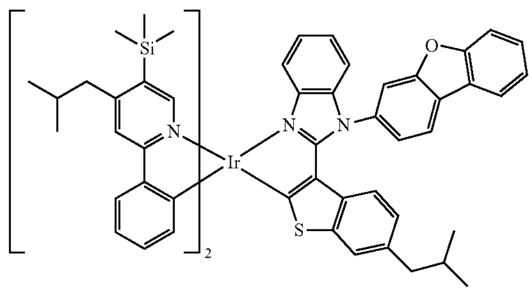
539
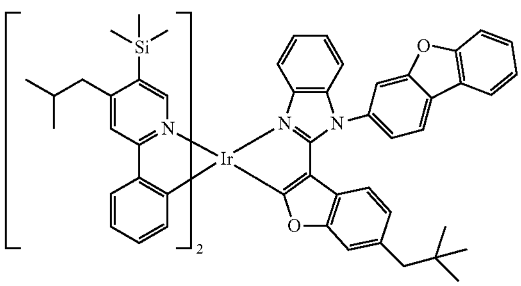
540
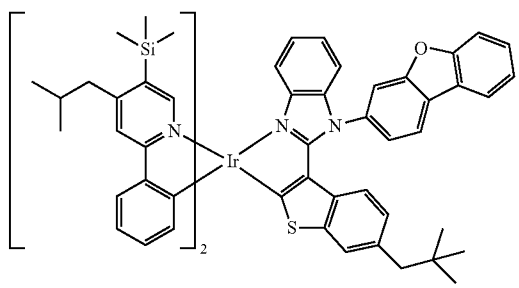
541
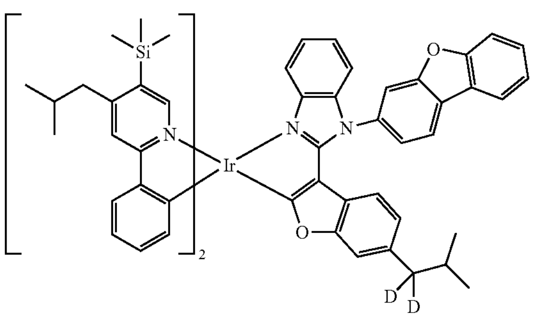
542
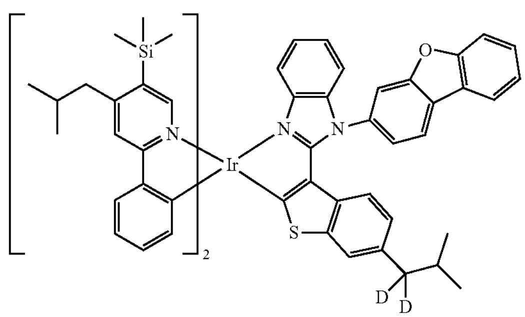
543
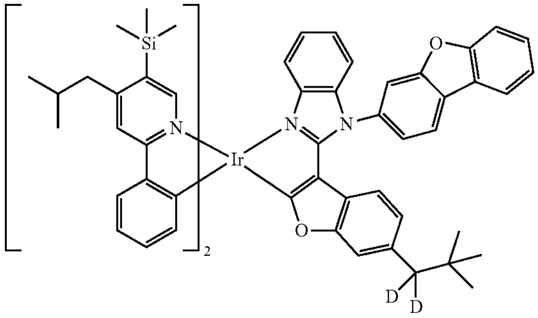
544
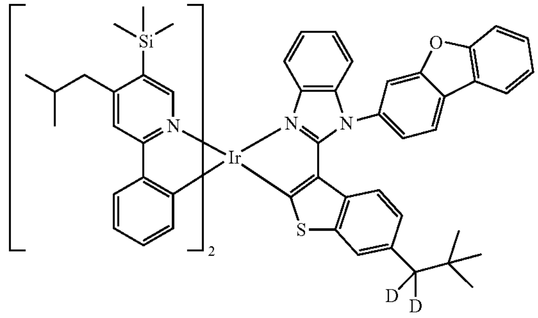

-continued
545
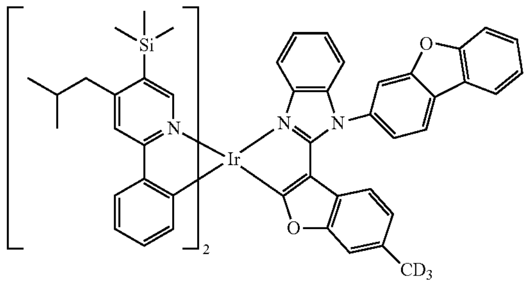
546
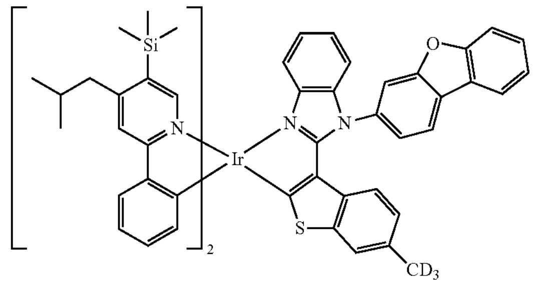
547
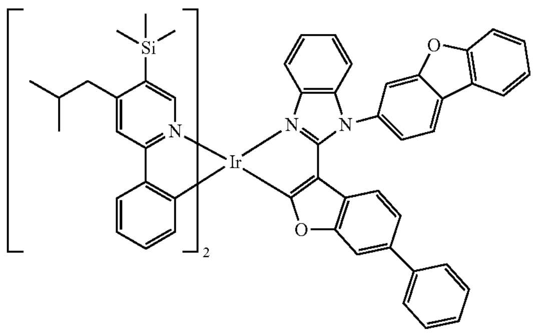
548
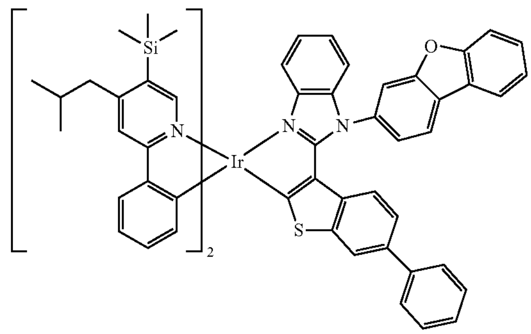
549
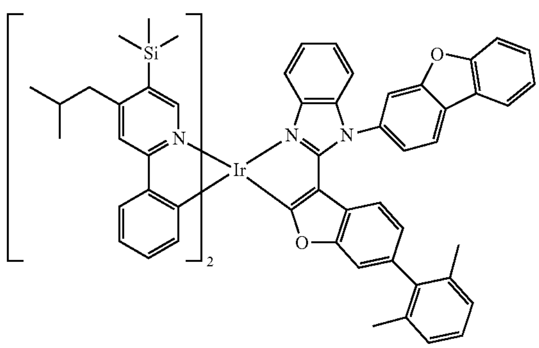
550
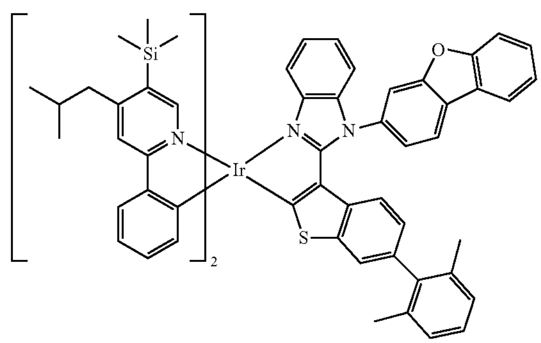
551
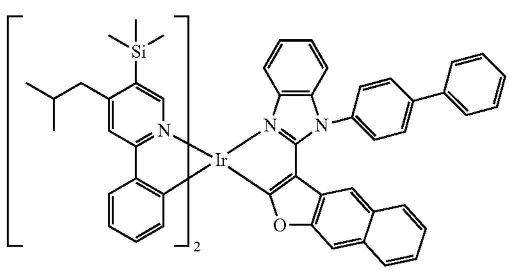
552
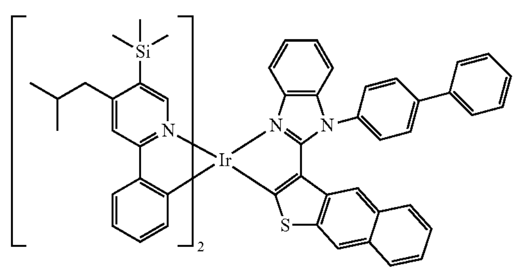
553
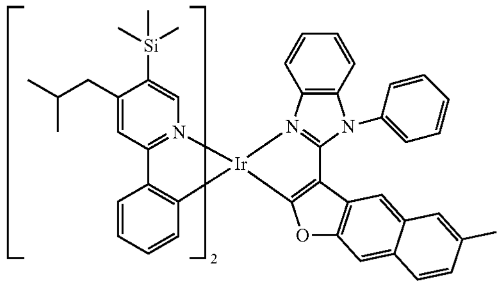
554
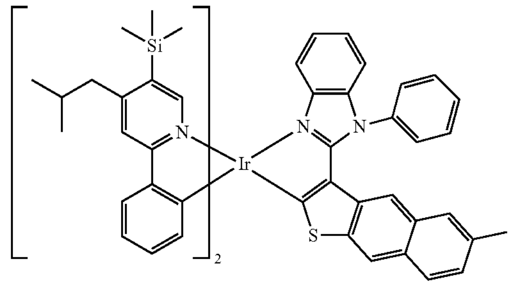

-continued
555
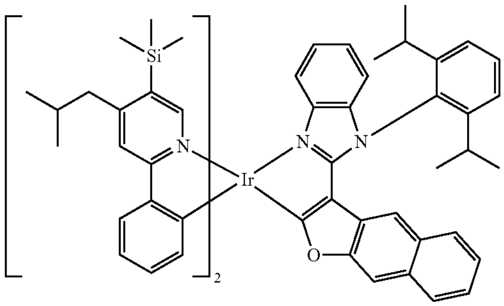
556
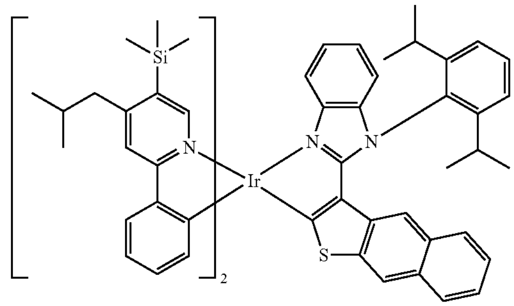
557
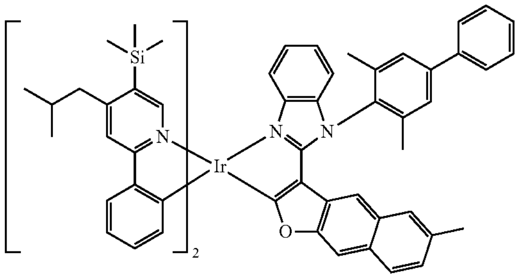
558
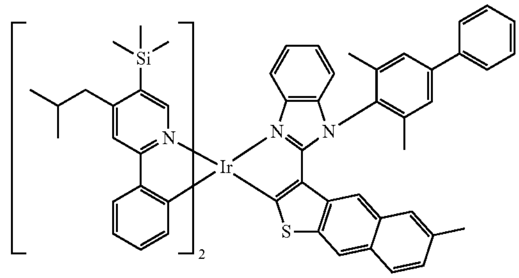
559
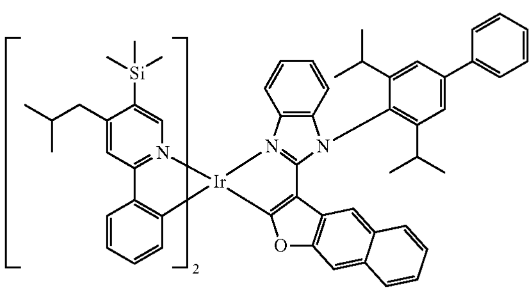
560
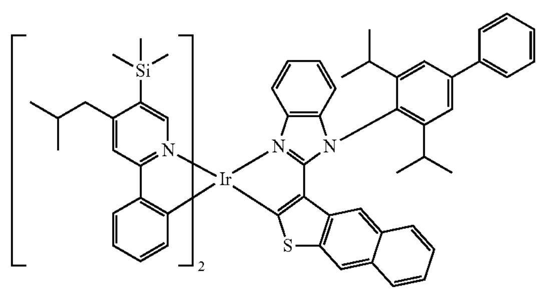
561
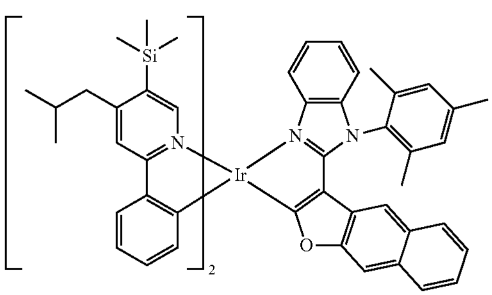
562
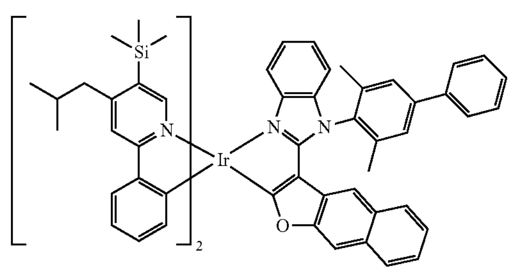
563
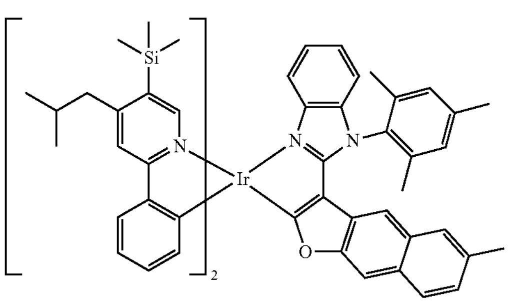
564
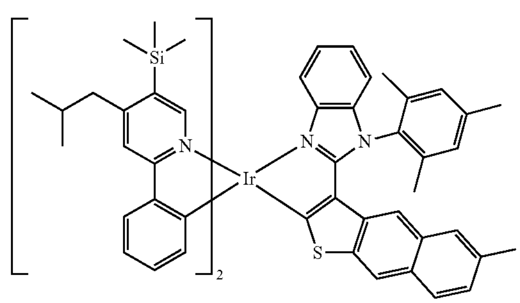

-continued
565
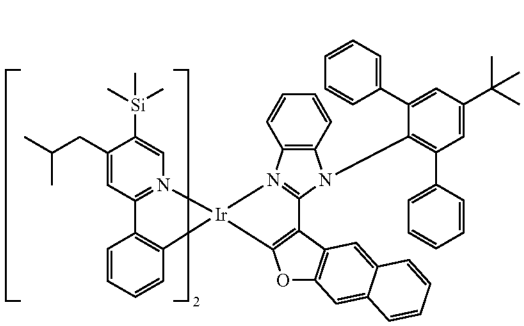
566
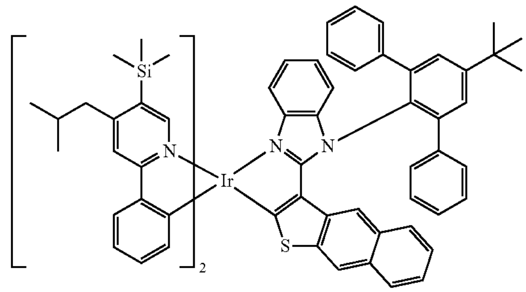
567
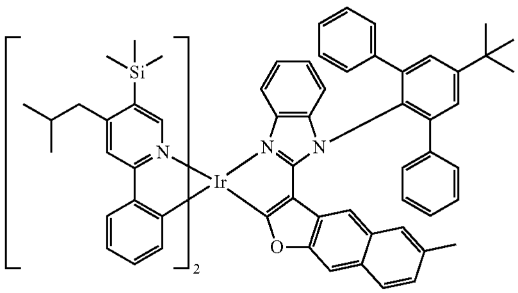
568
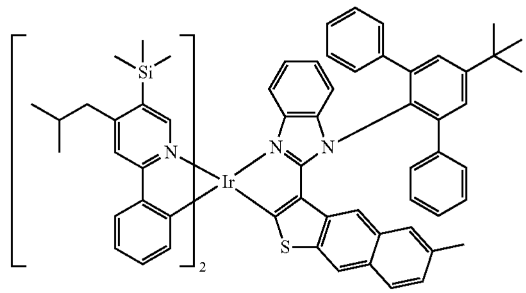
569
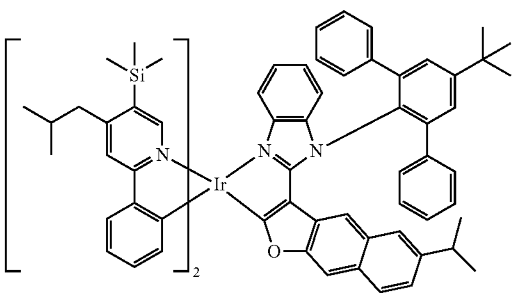
570
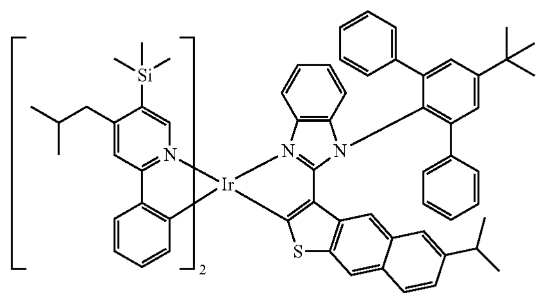
571
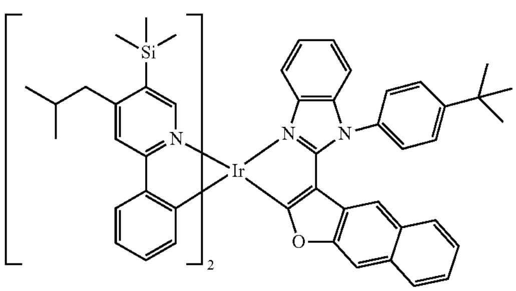
572
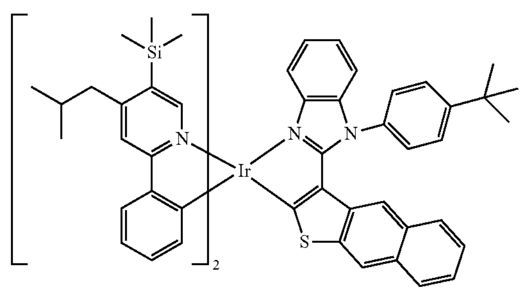
573
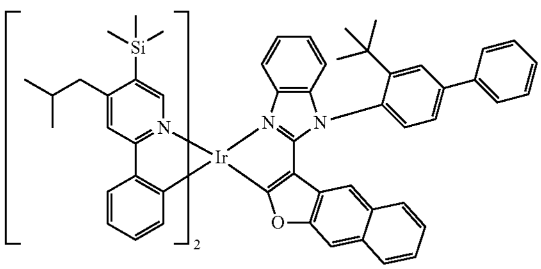
574
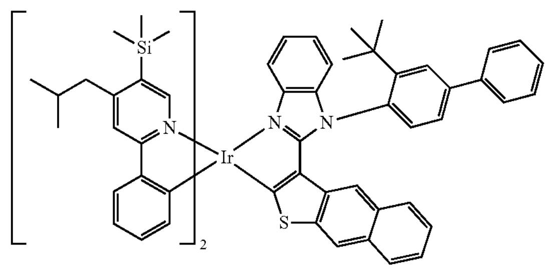

-continued
575
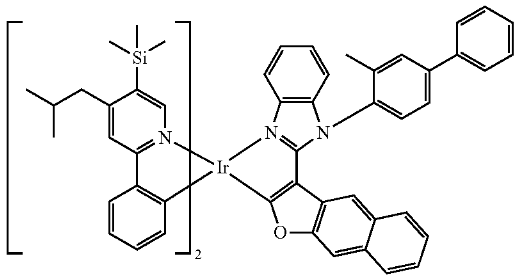
576
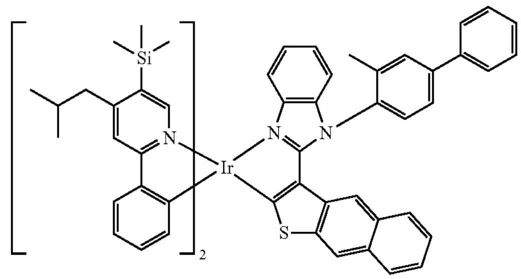
577
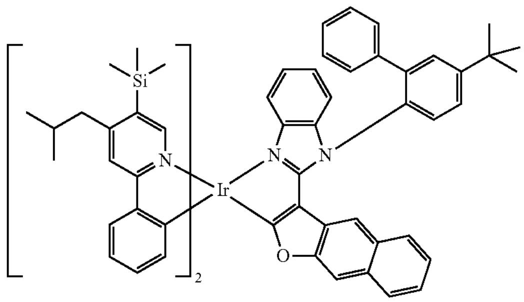
578
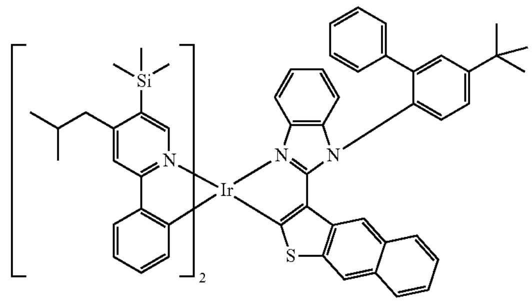
579
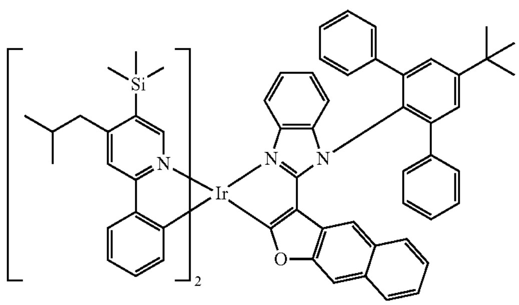
580
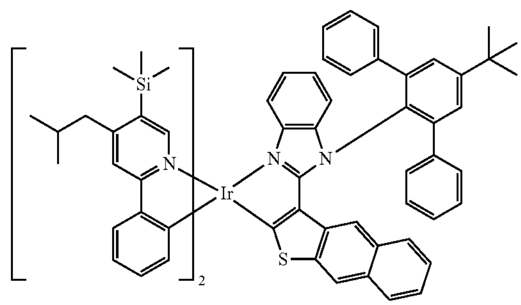
581
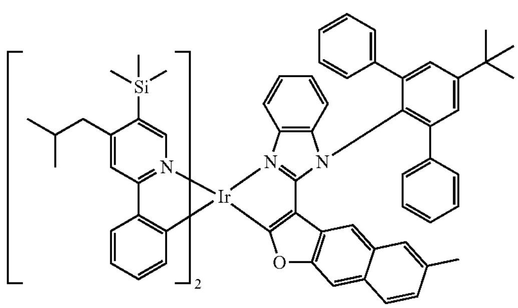
582
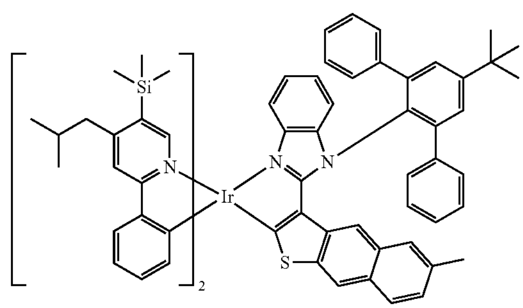
583
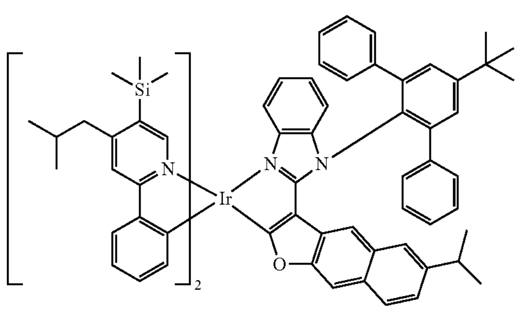
584
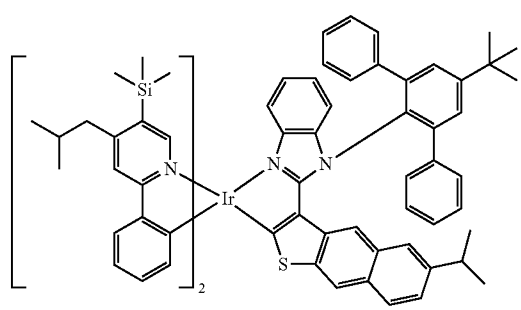

-continued
585
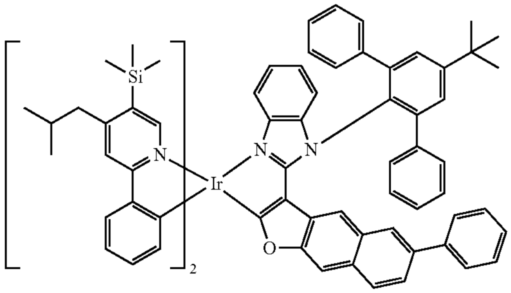
586
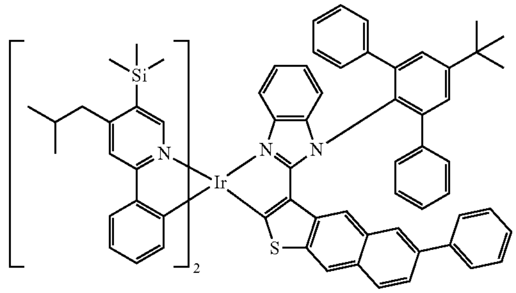
587
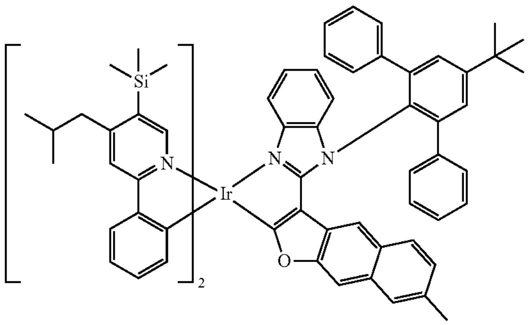
588
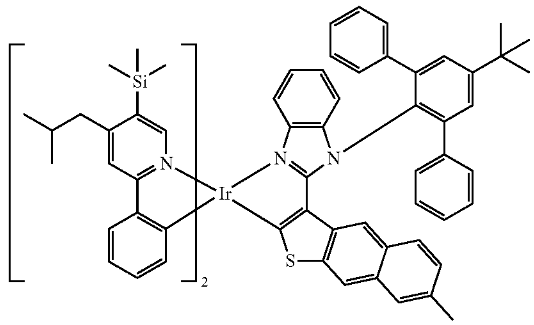
589
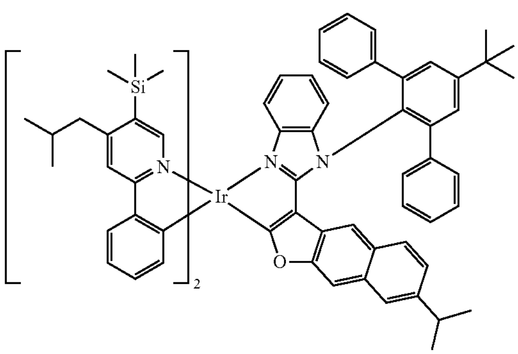
590
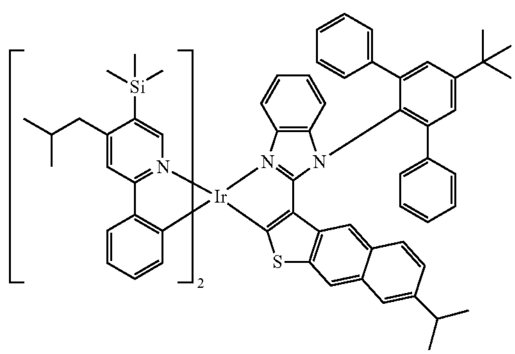
591
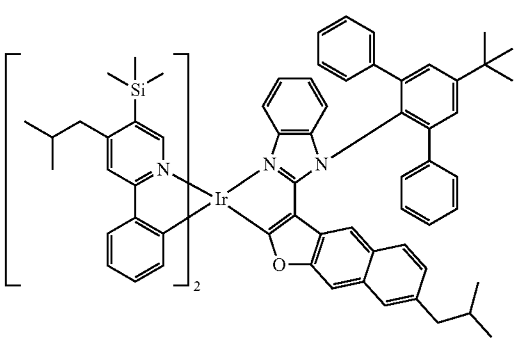
592
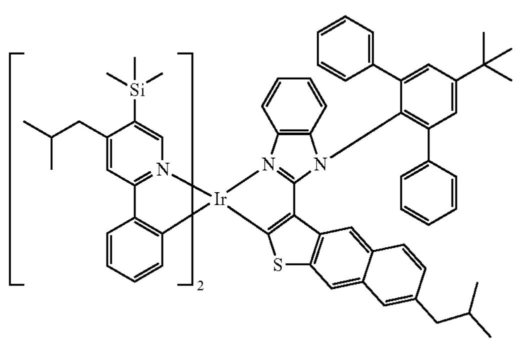

-continued
593
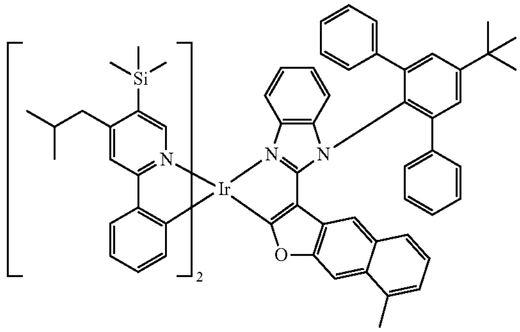
594
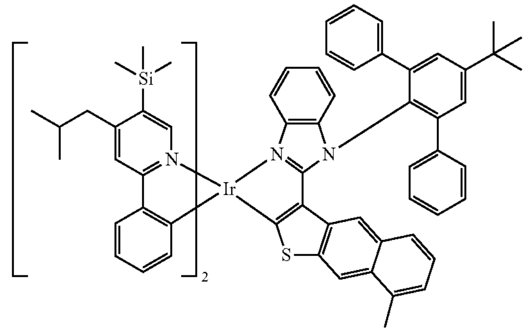
595
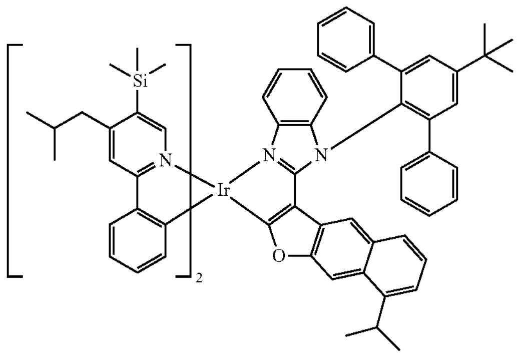
596
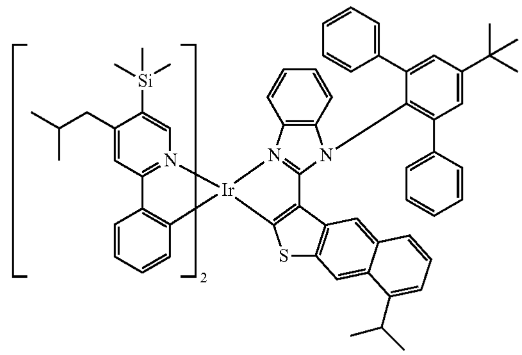
597
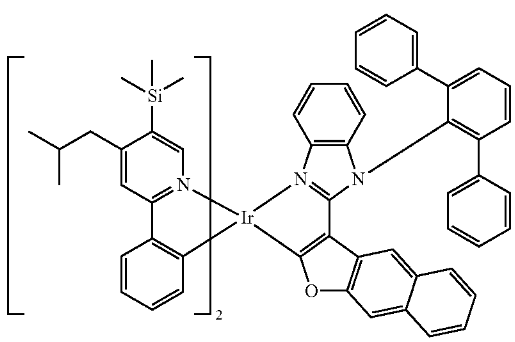
598
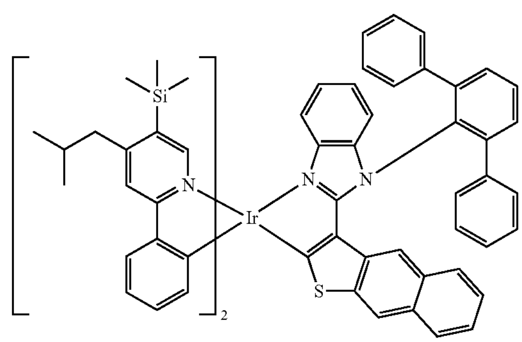
599
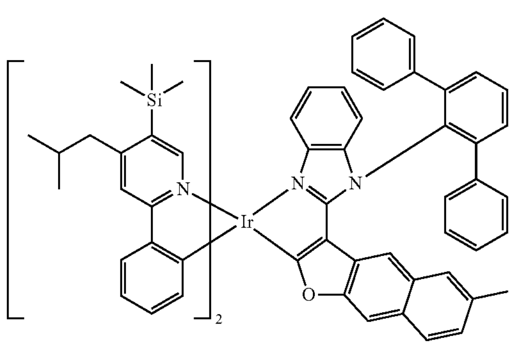
600
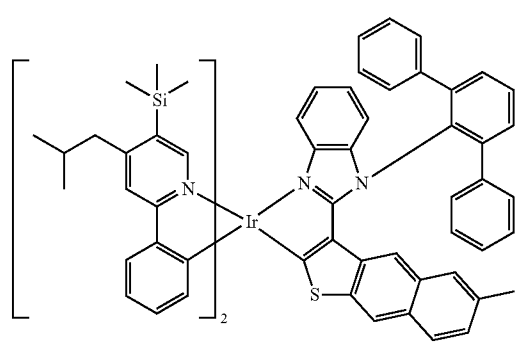

-continued
601
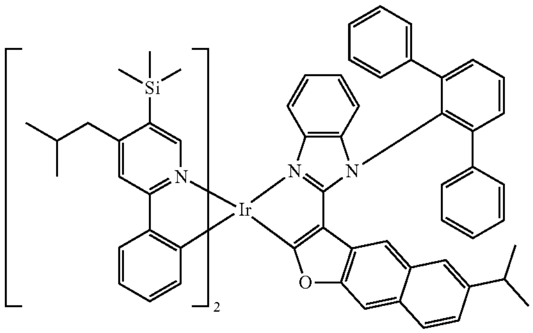
602
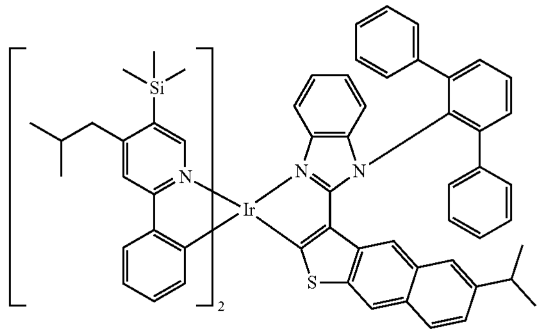
603
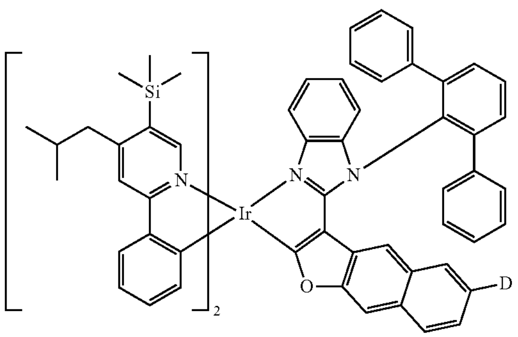
604
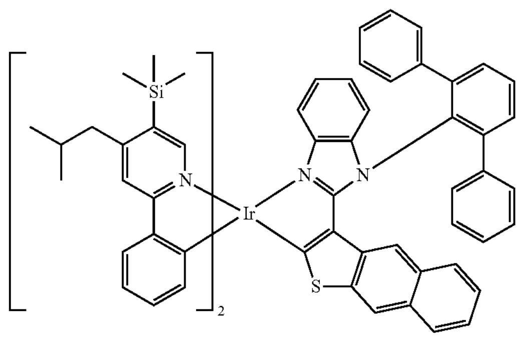
605
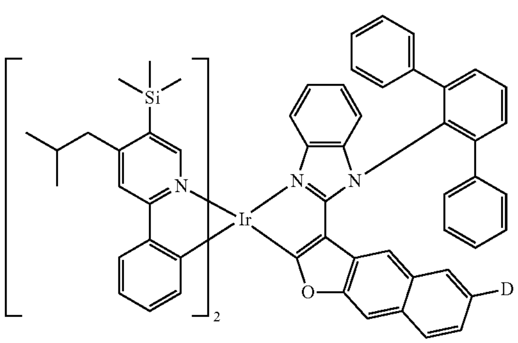
606
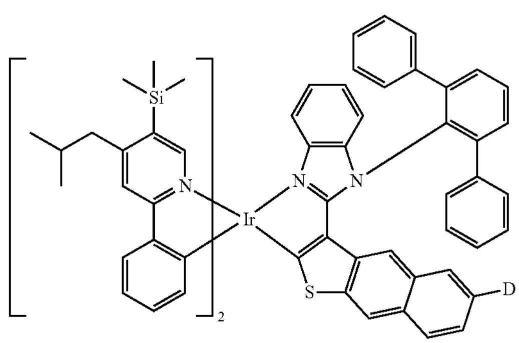
607
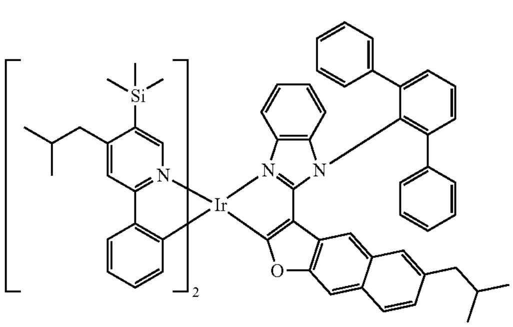
608
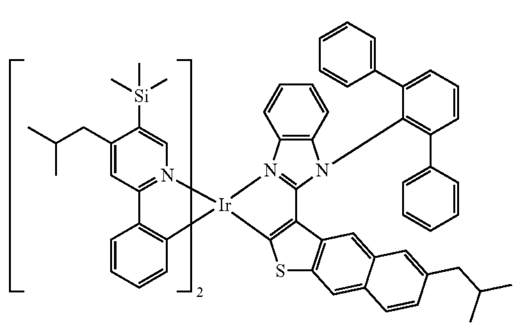

-continued
609
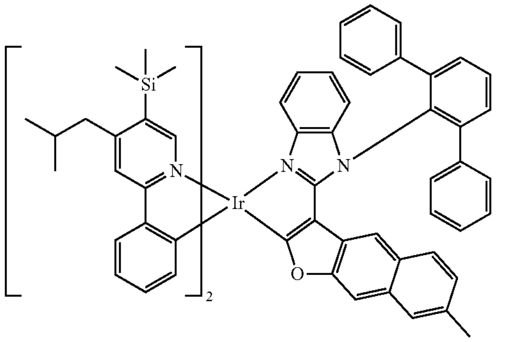
610
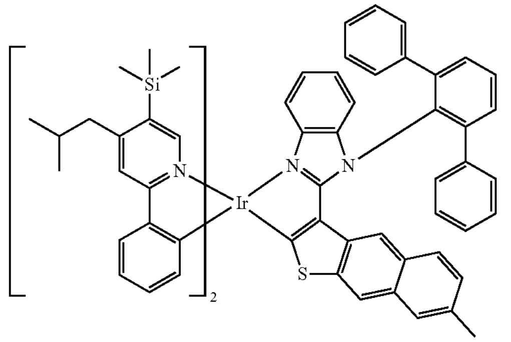
611
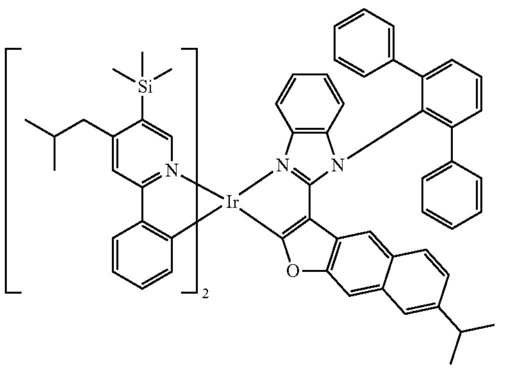
612
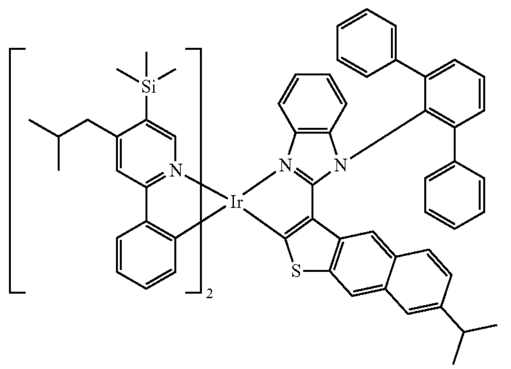
613
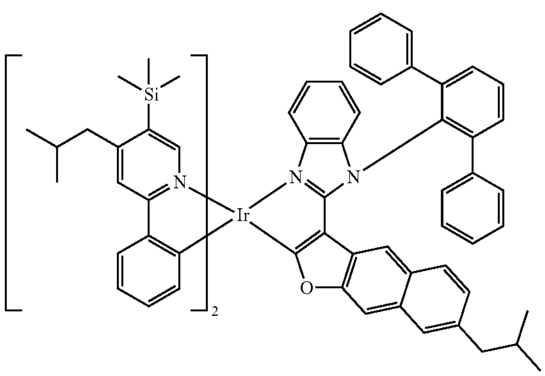
614
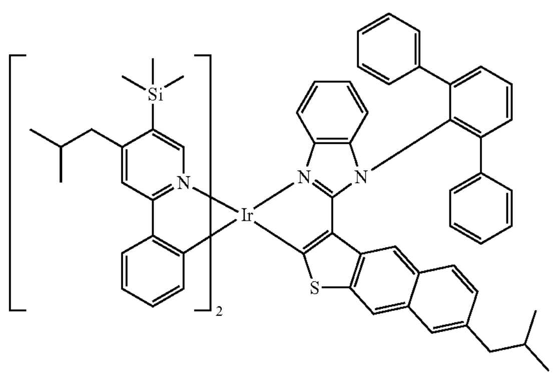
615
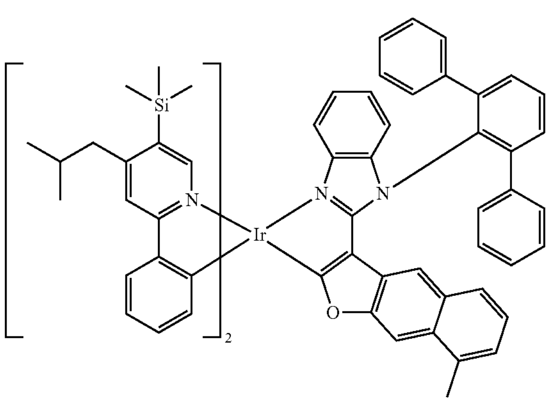
616
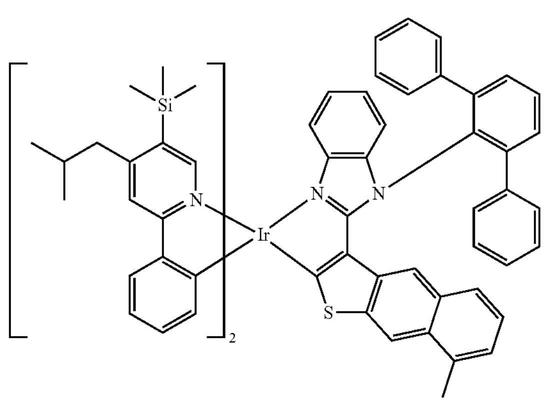

-continued
617
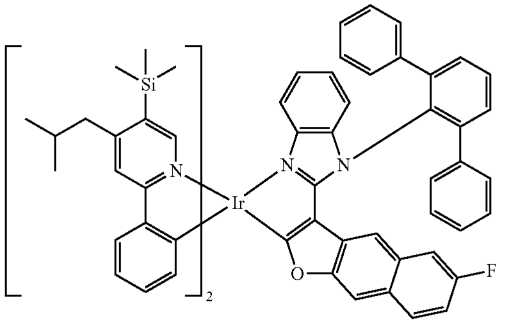
618
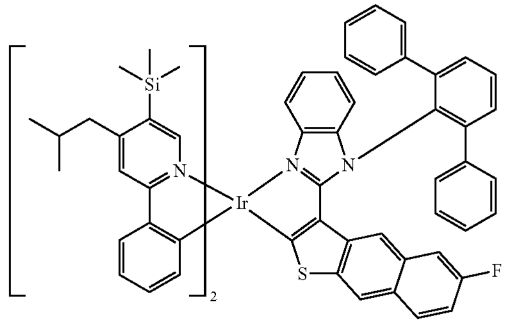
619
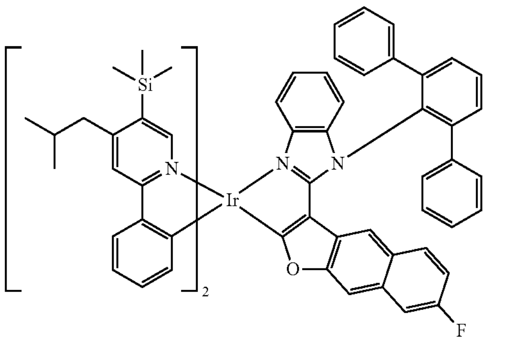
620
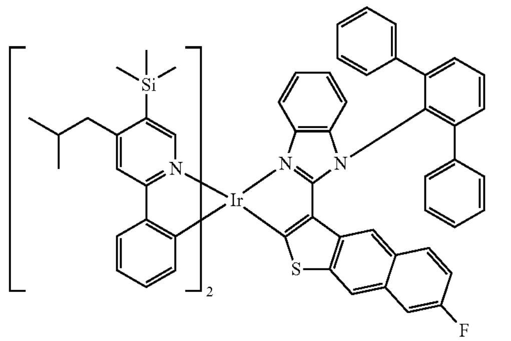
621
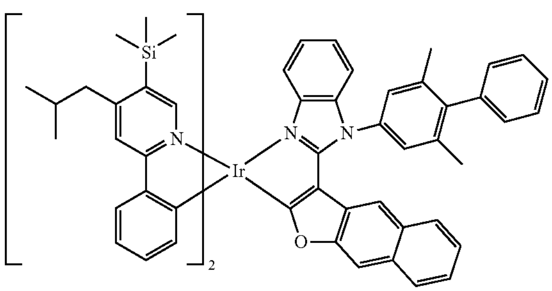
622
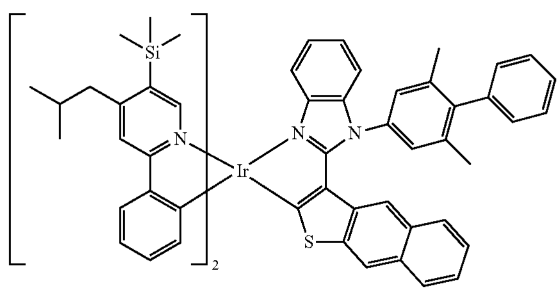
623
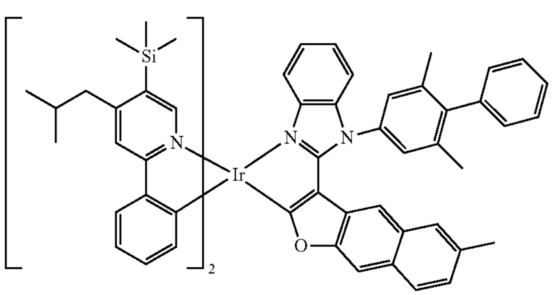
624
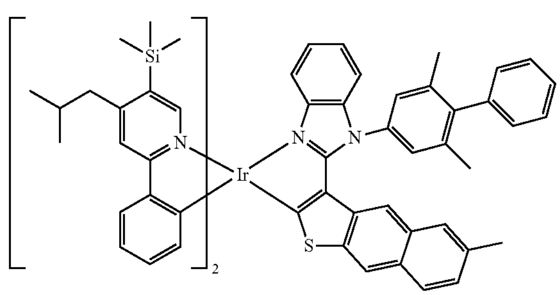
625
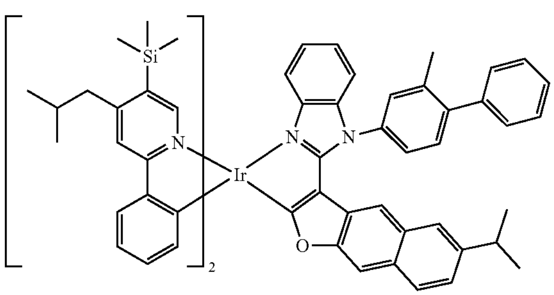
626
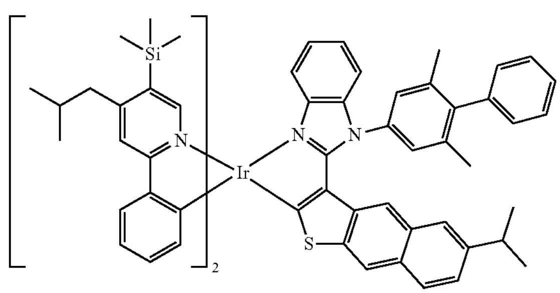

-continued
627
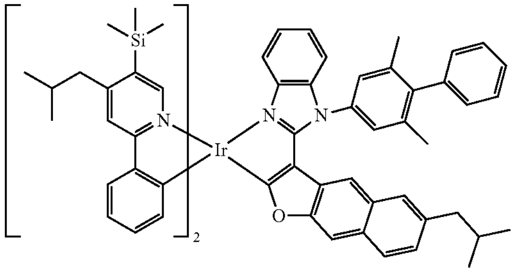
628
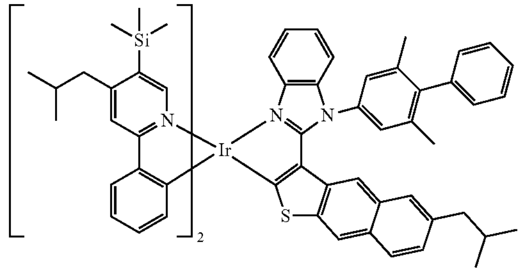
629
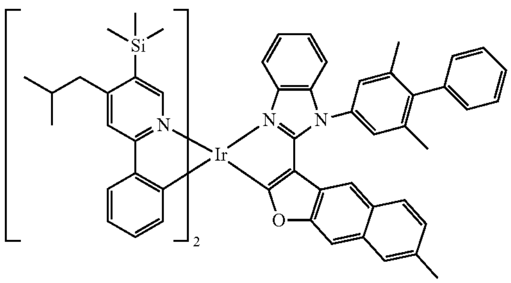
630
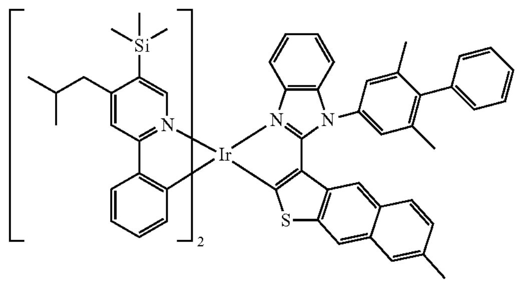
631
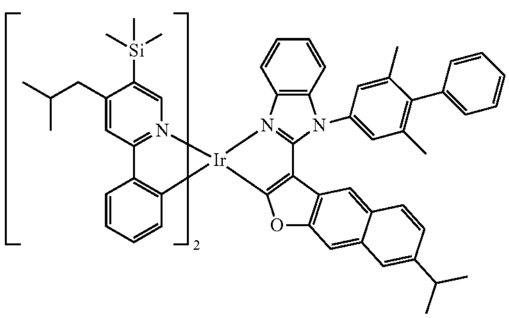
632
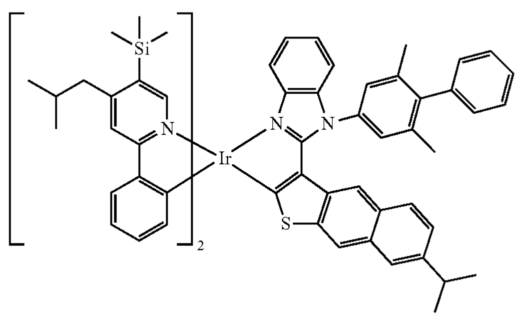
633
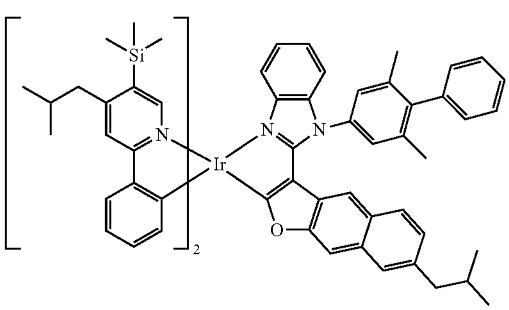
634
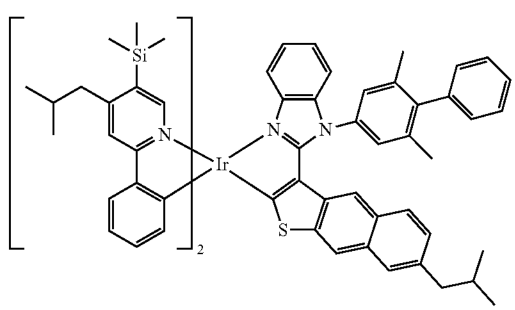
635
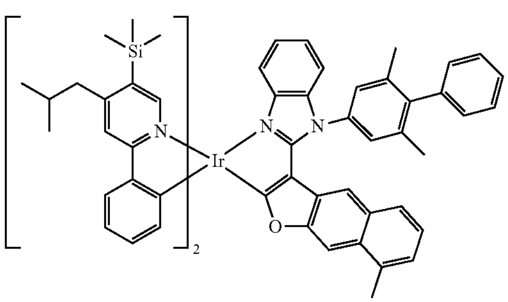
636
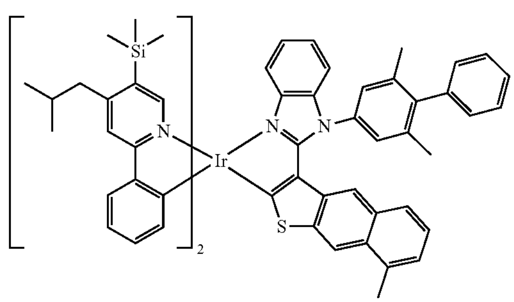

-continued
637
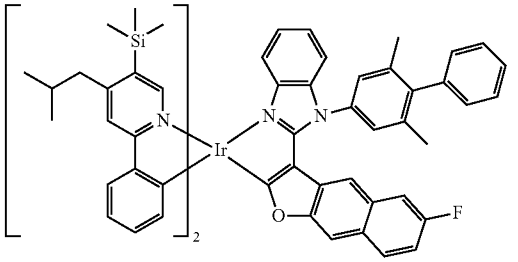
638
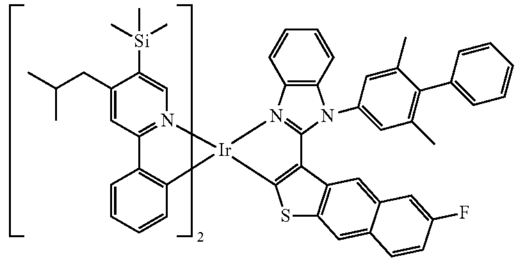
639
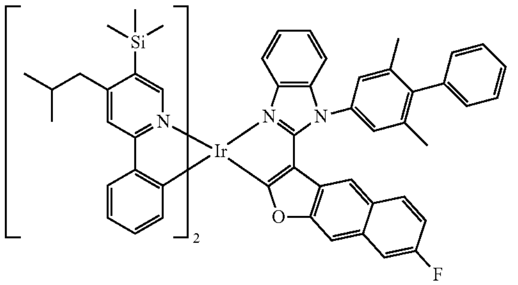
640
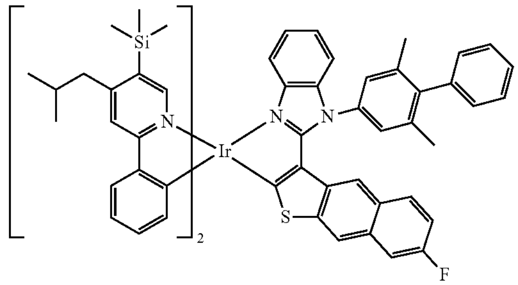
641
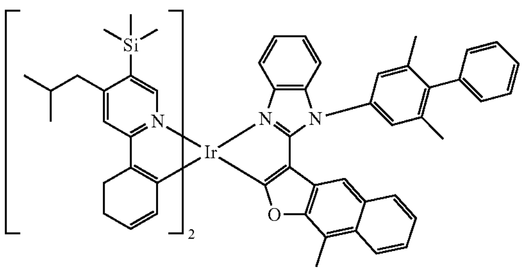
642
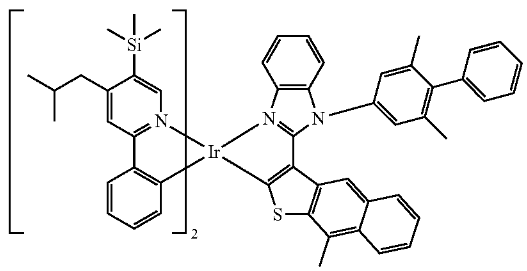
643
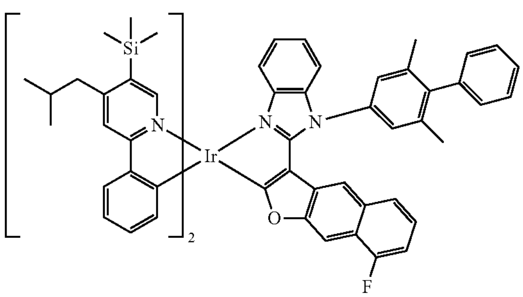
644
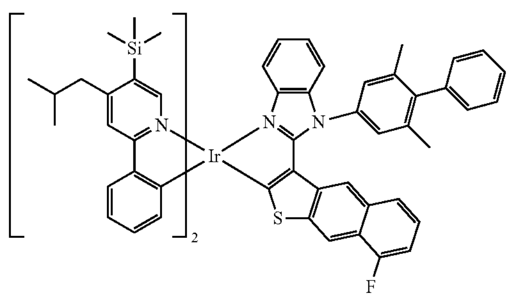
645
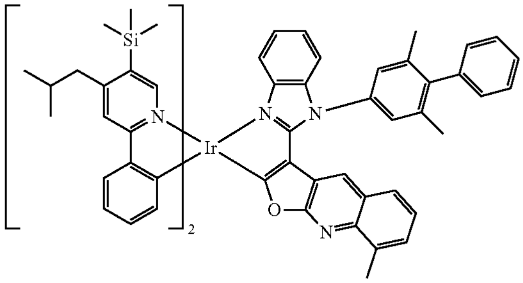
646
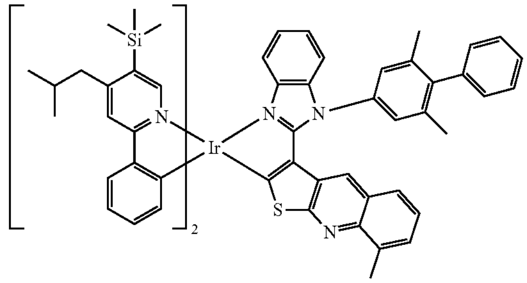

-continued
647
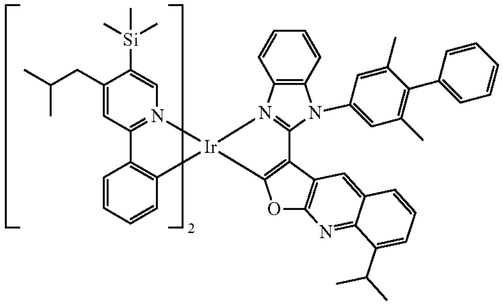
648
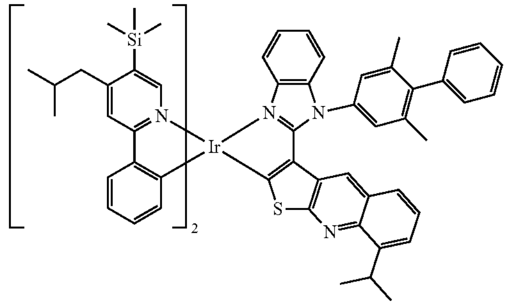
649
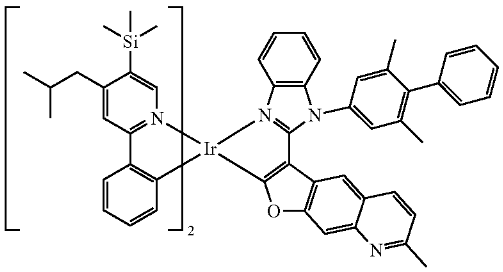
650
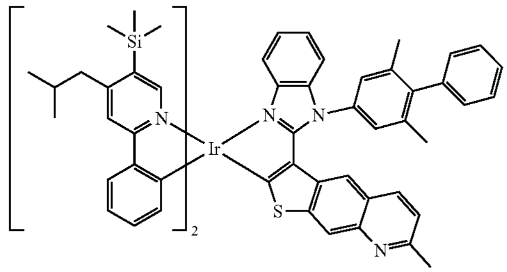
651
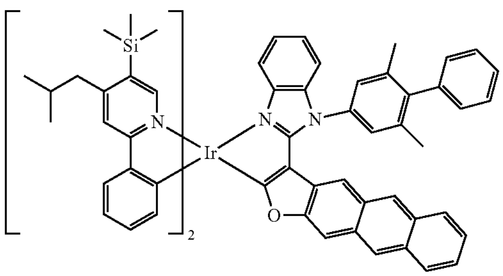
652
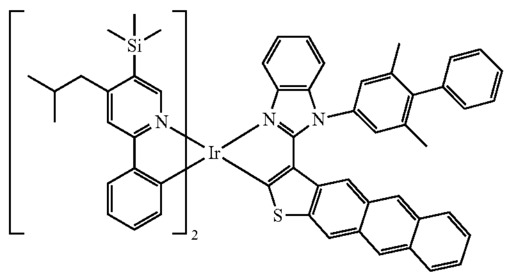
653
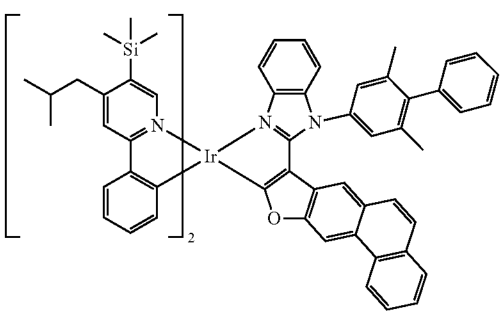
654
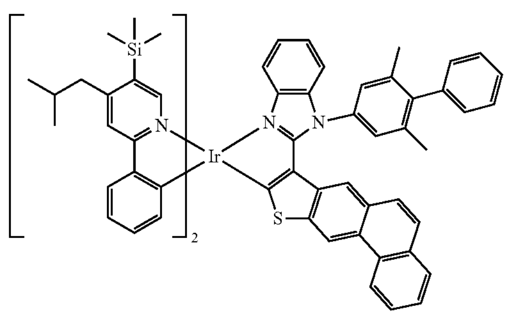
655
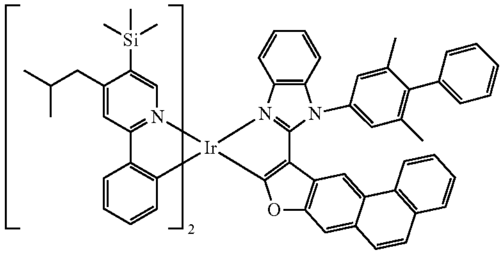
656
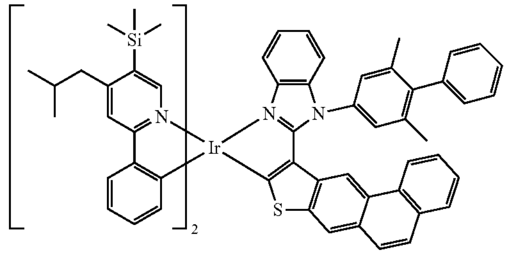

-continued
657
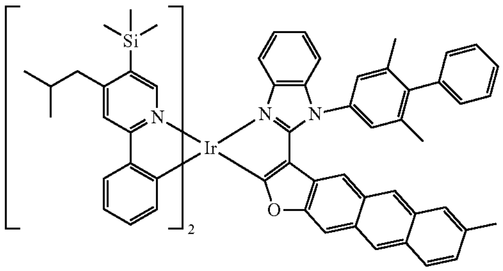
658
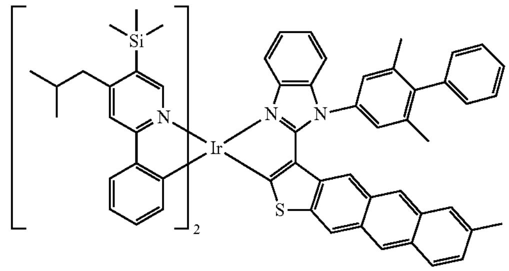
659
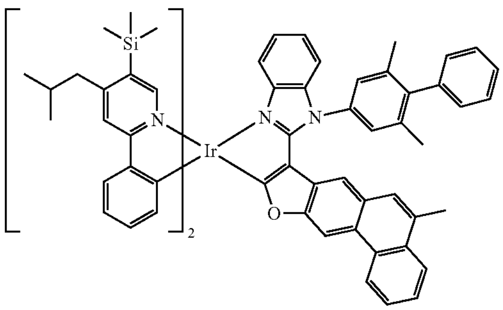
660
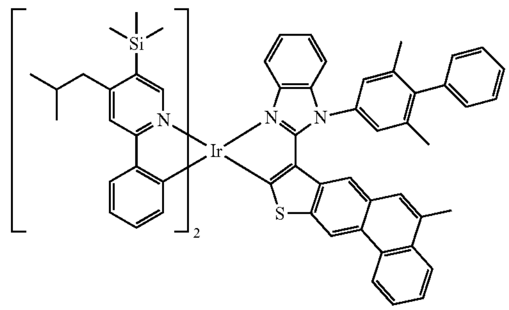
661
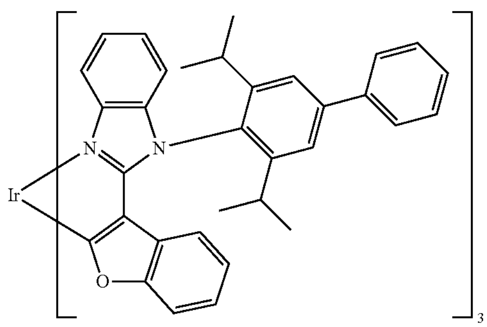
662
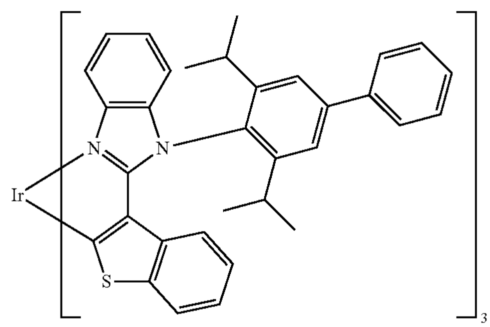
663
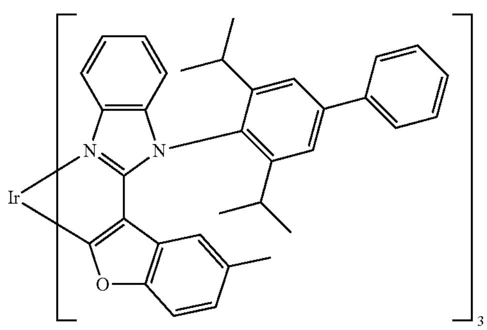
664
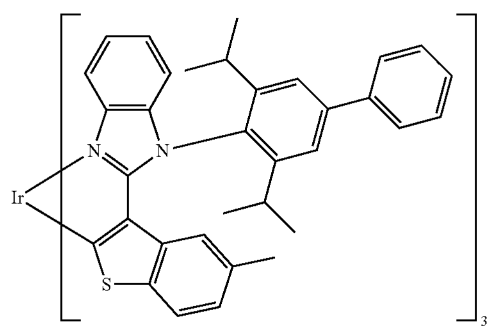
665
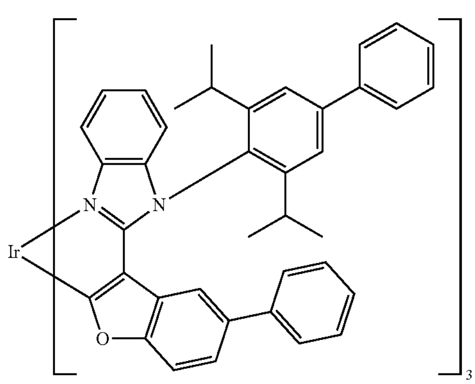
666
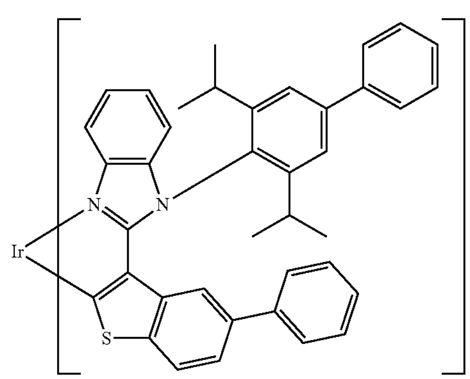

-continued
667
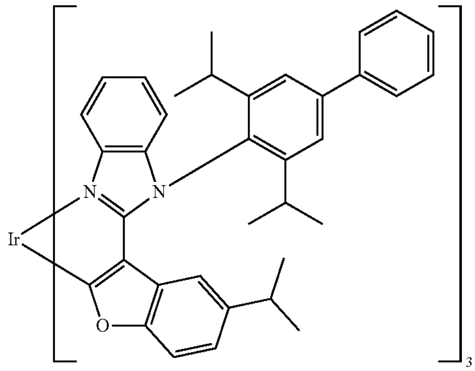
668
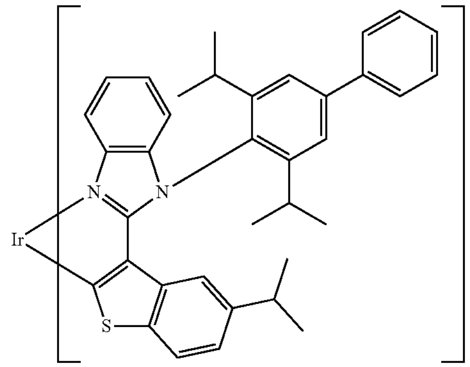
669
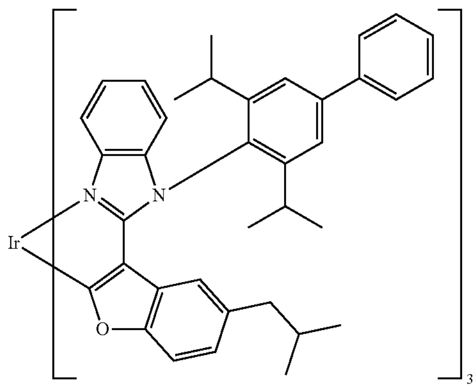
670
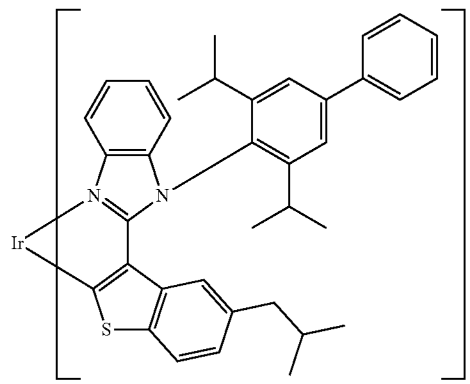
671
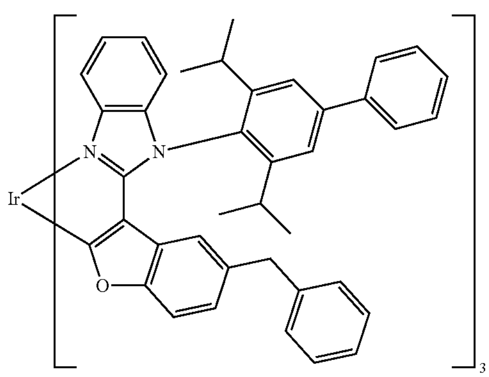
672
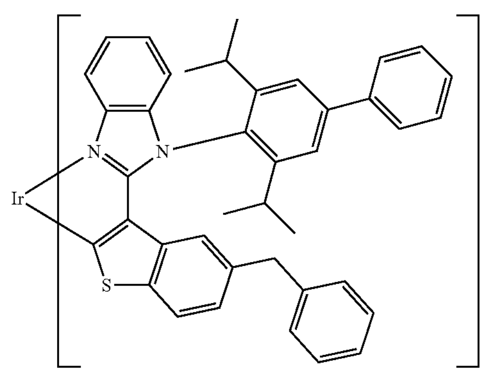
673
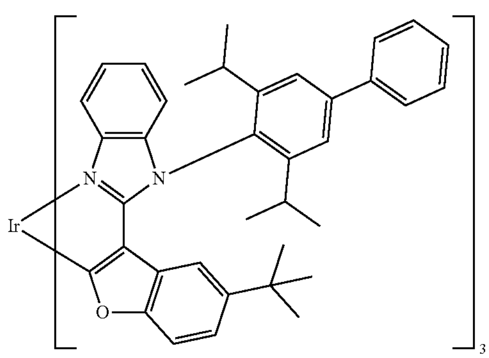
674
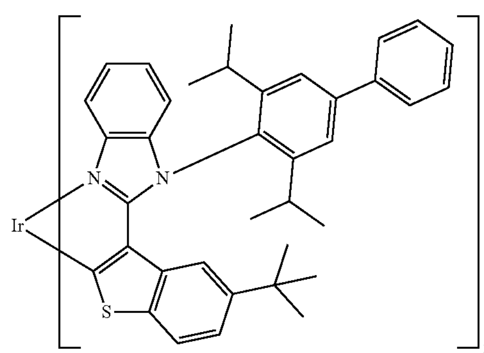

-continued
675
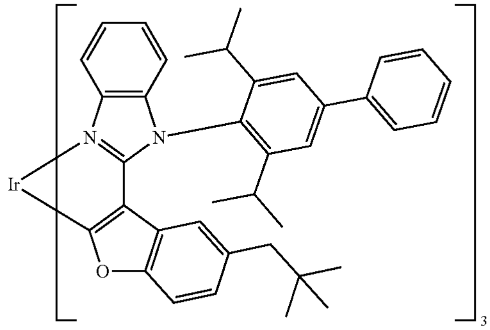
676
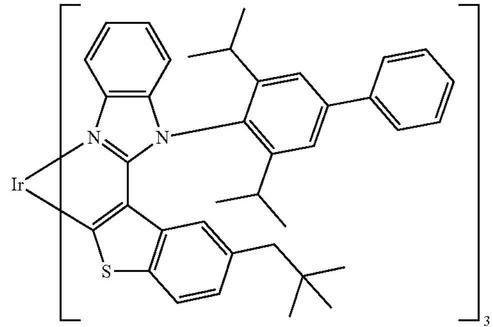
677
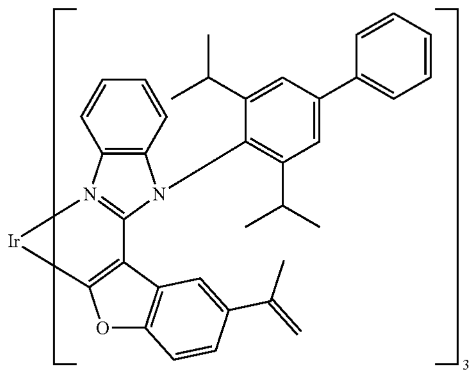
678
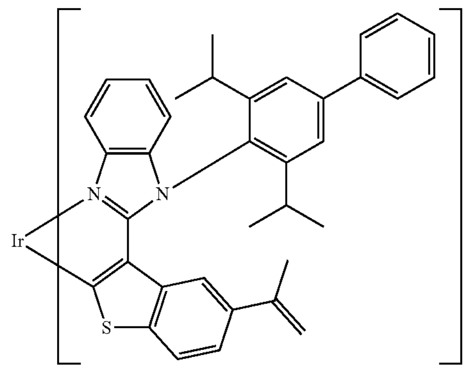
679
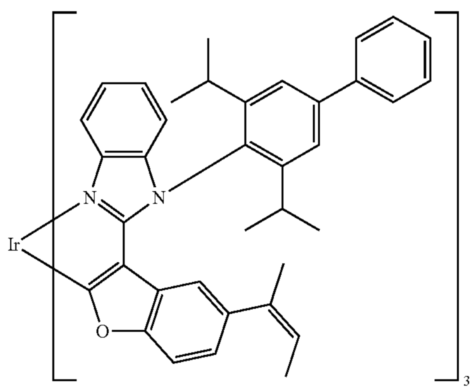
680
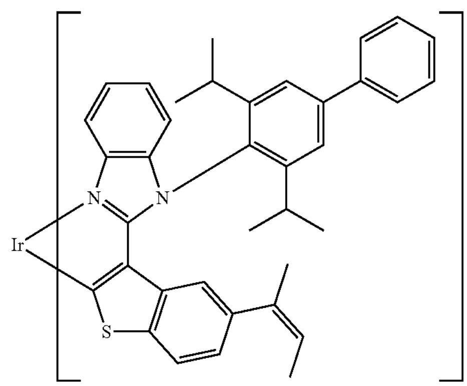
681
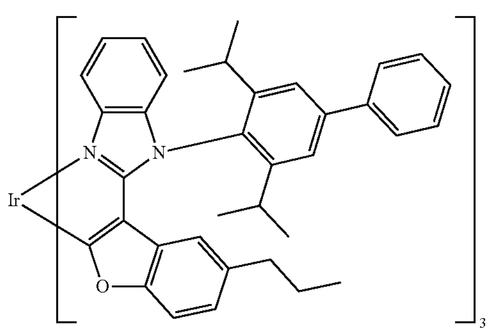
682
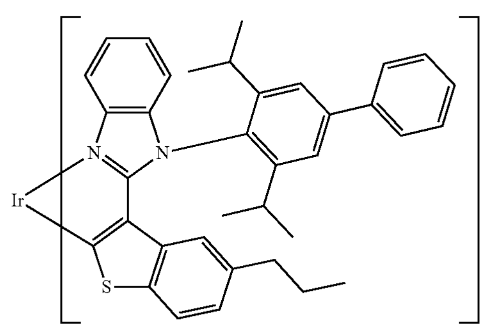

-continued
683
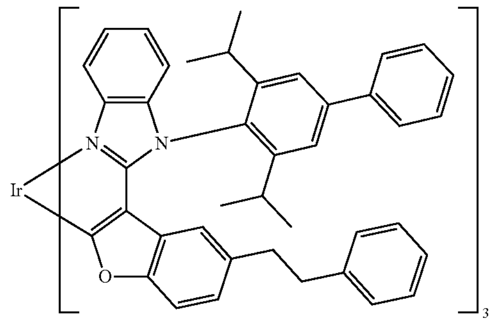
684
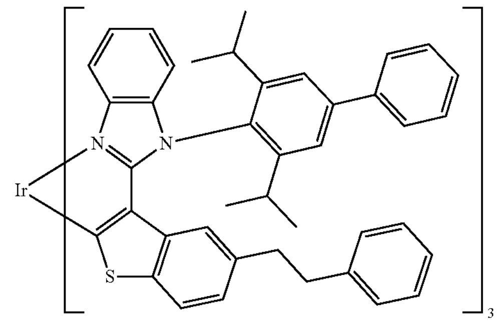
685
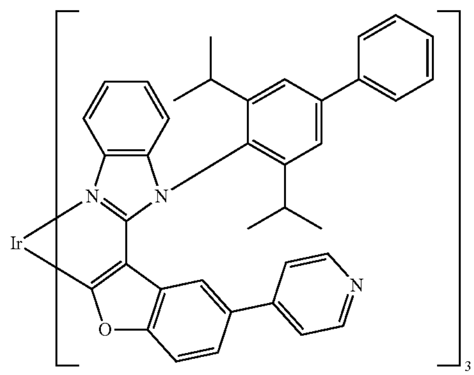
686
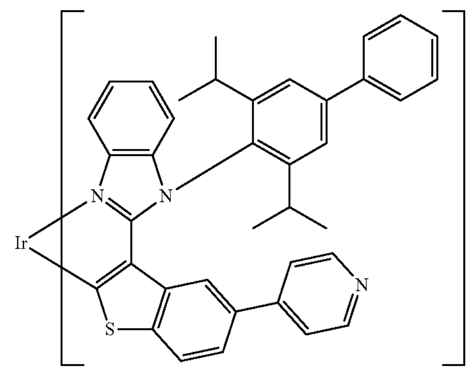
687
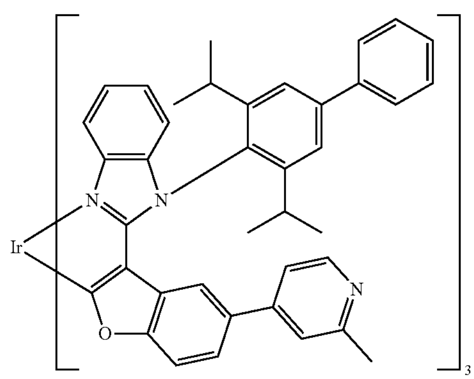
688
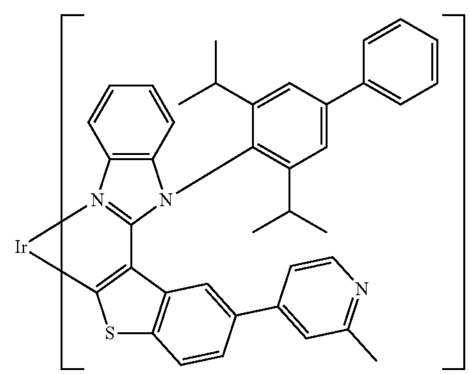
689
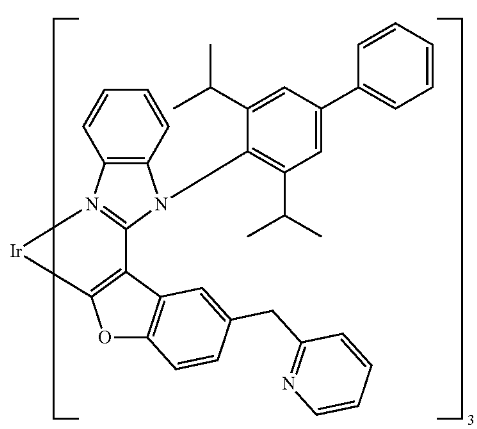
690
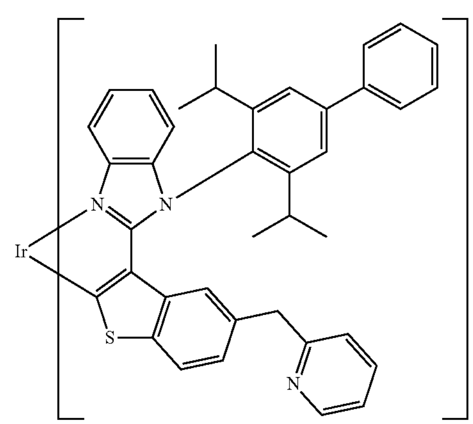

-continued
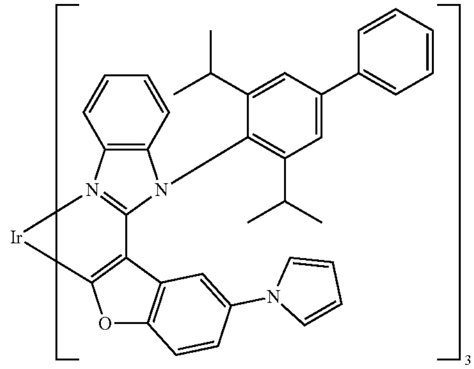
691
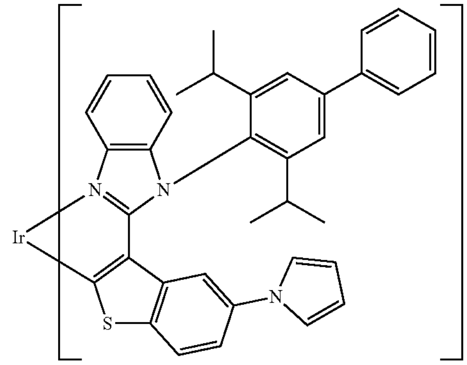
692
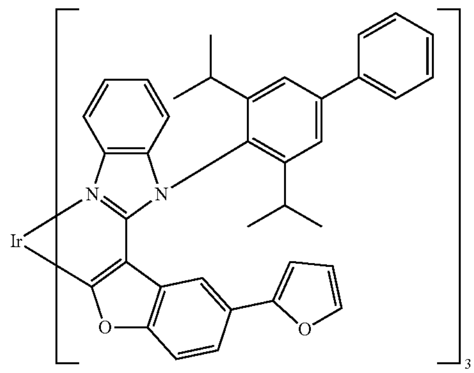
693
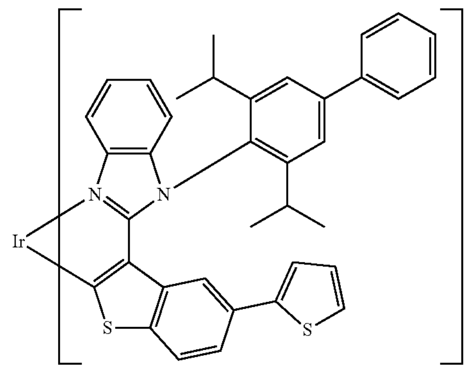
694
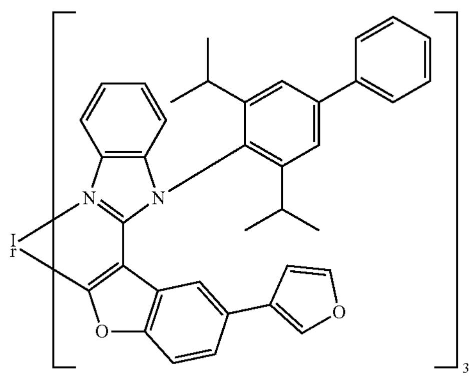
695
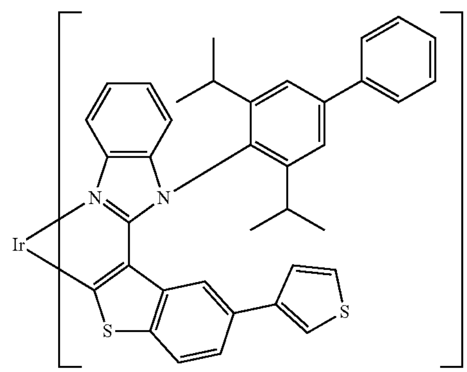
696
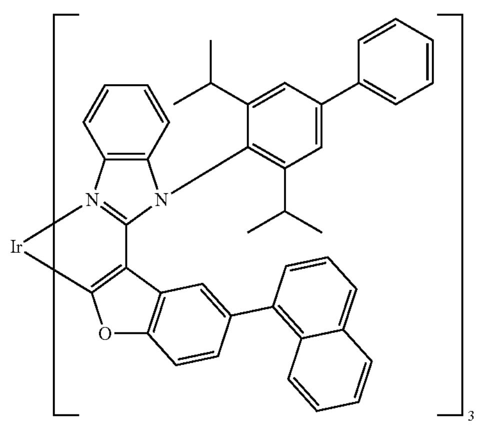
697
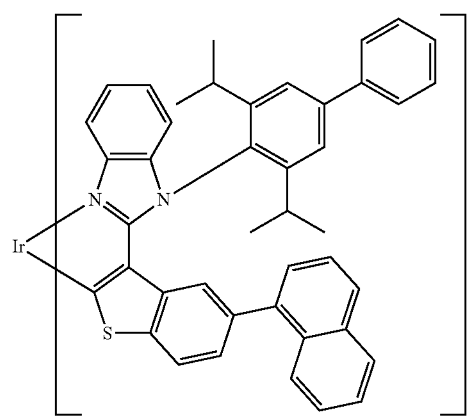
698

-continued
699
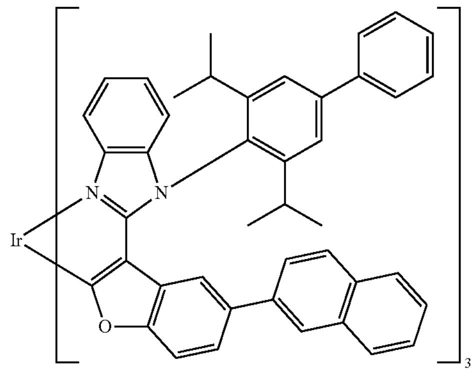
700
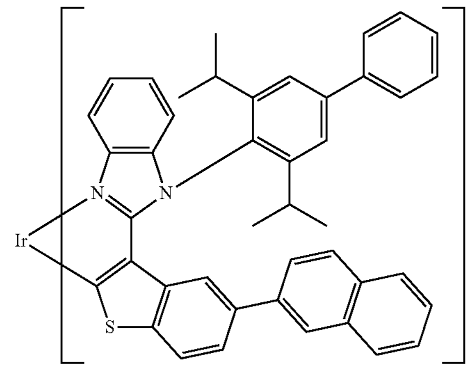
701
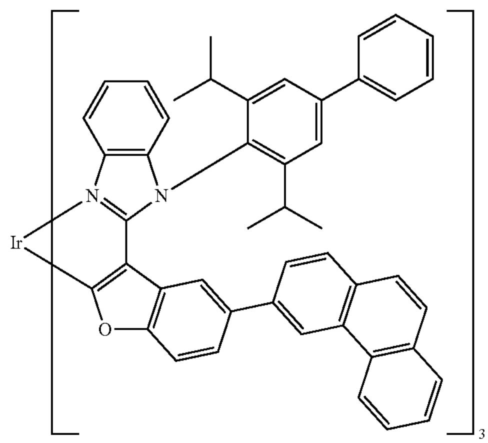
702
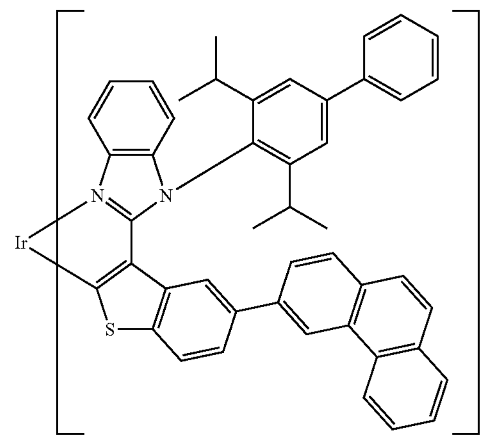
703
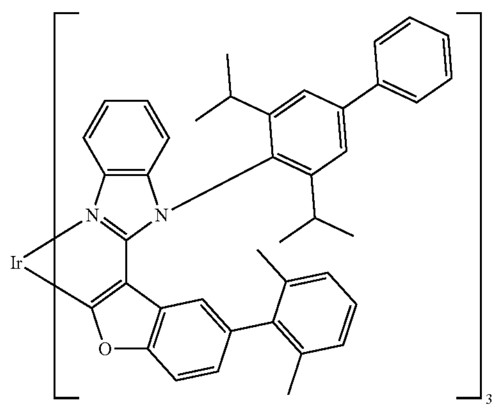
704
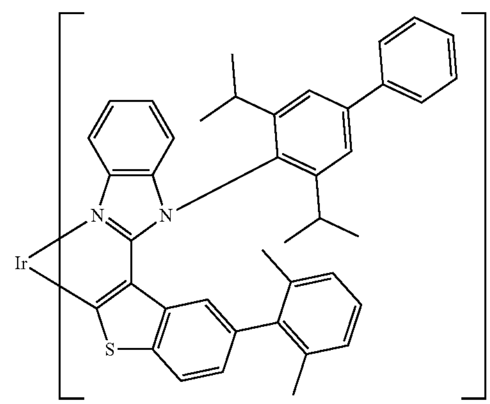
705
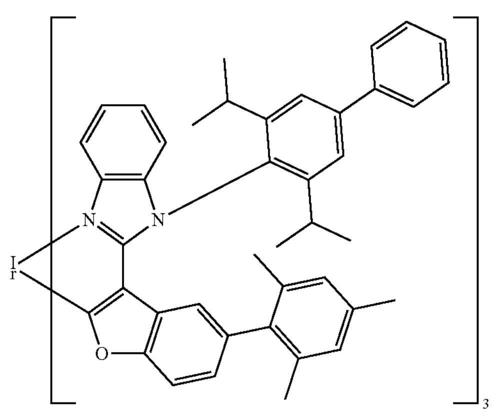
706
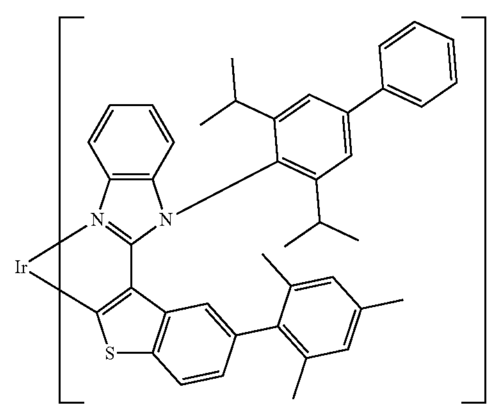

-continued
707
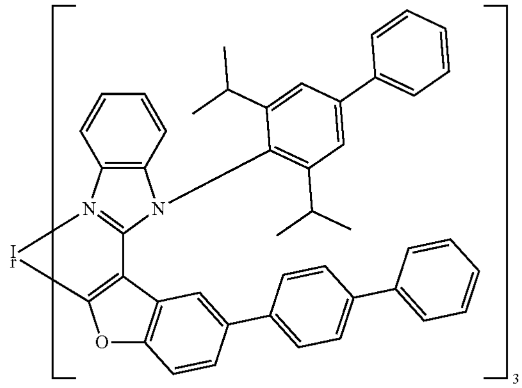
708
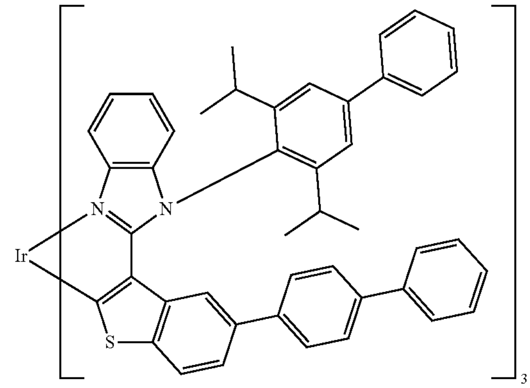
709
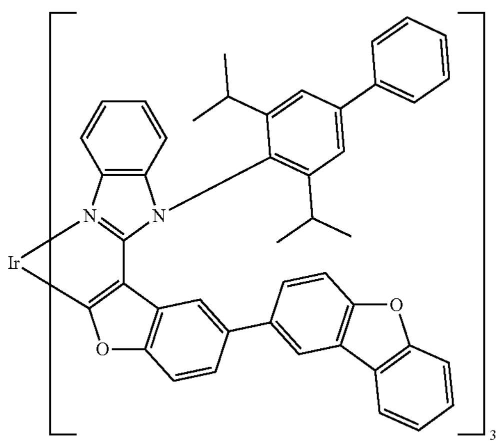
710
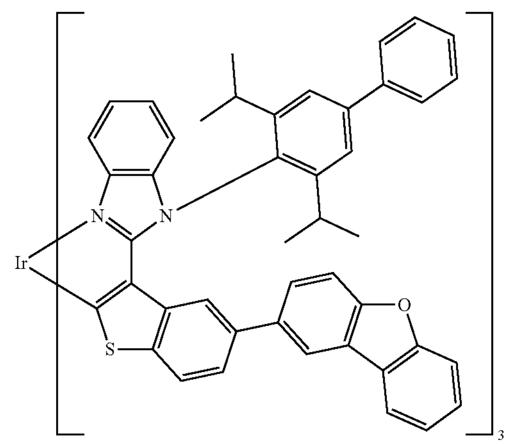
711
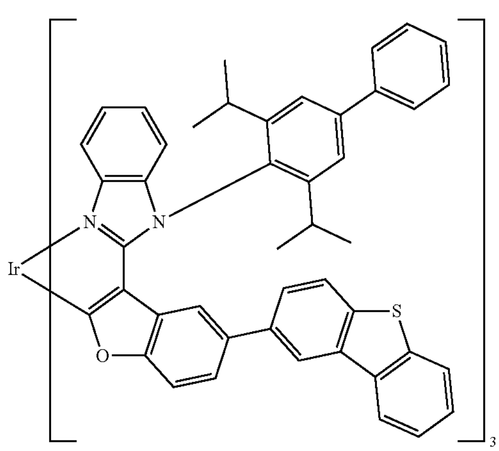
712
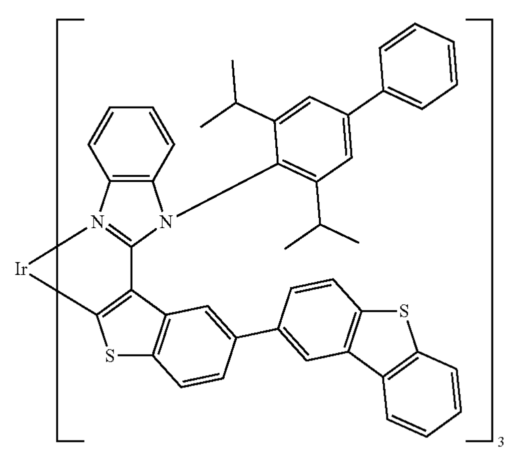

-continued
713
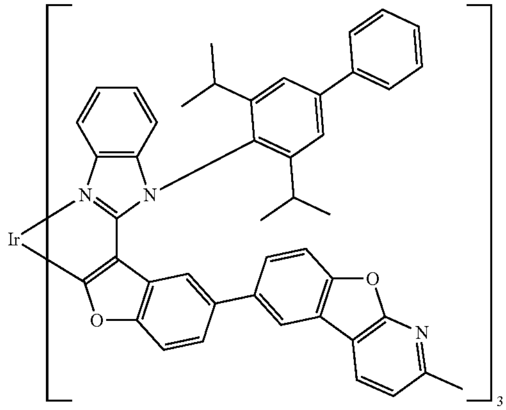
714
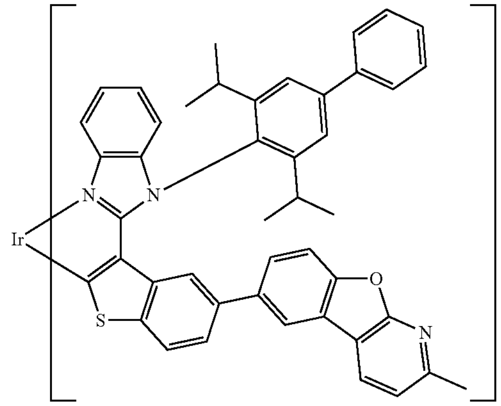
715
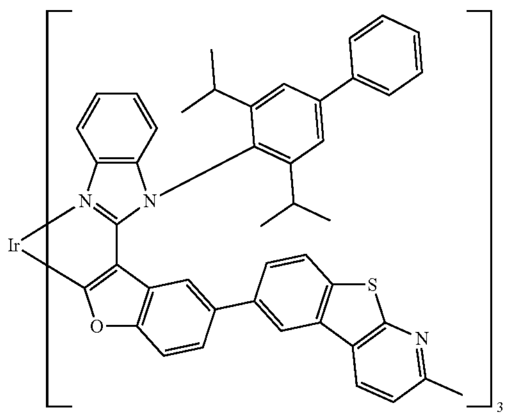
716
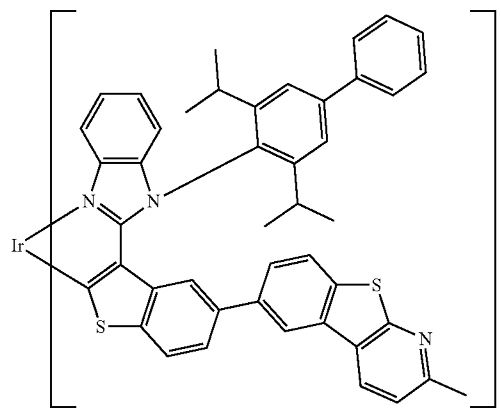
717
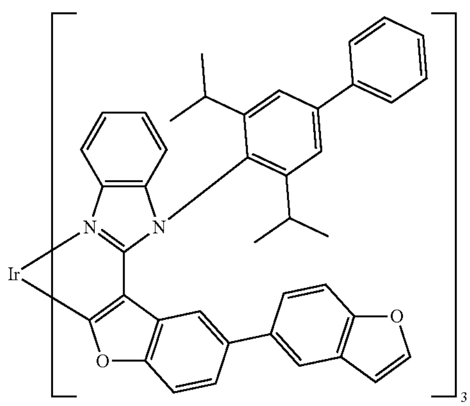
718
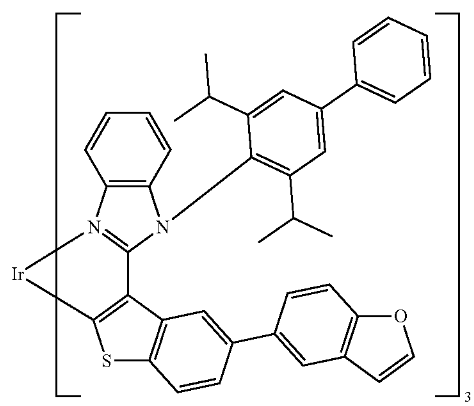
719
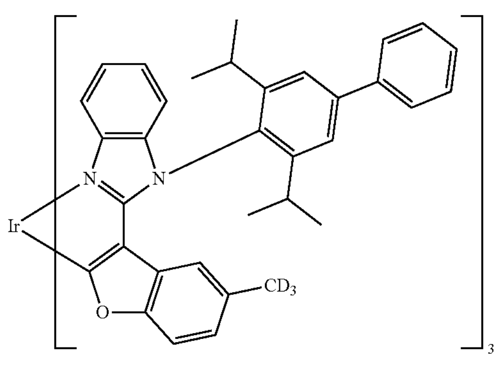
720
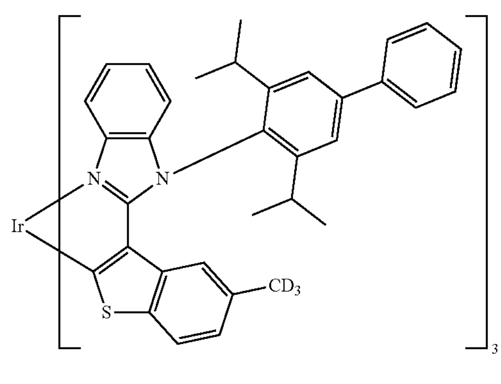

-continued
721
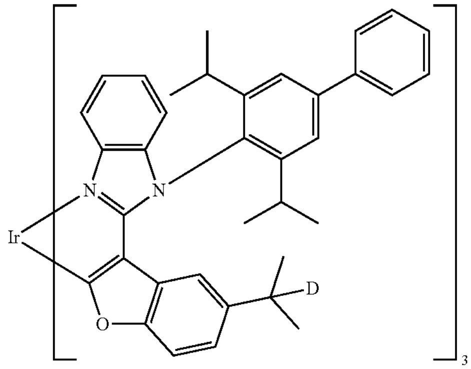
722
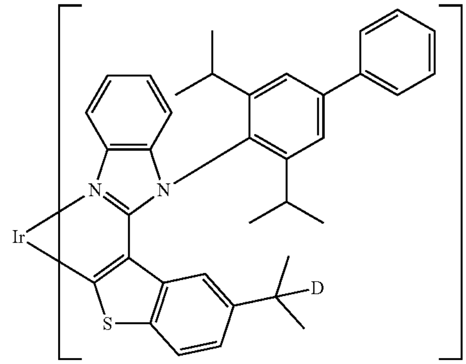
723
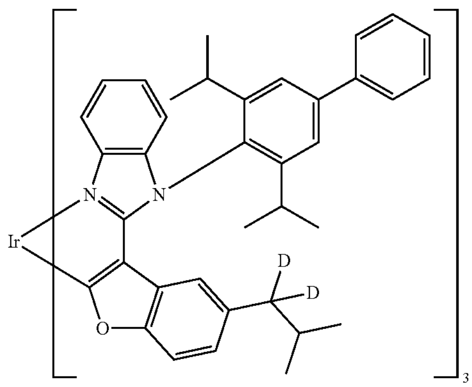
724
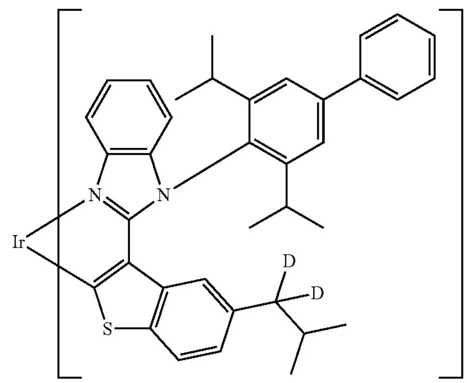
725
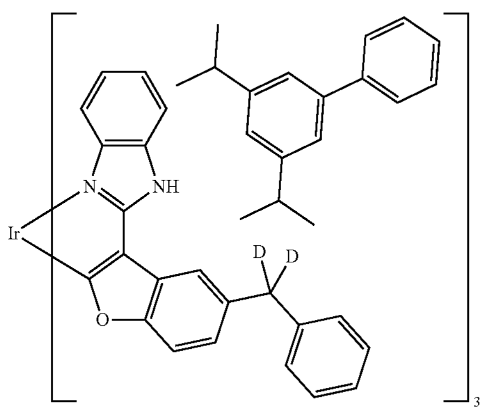
726
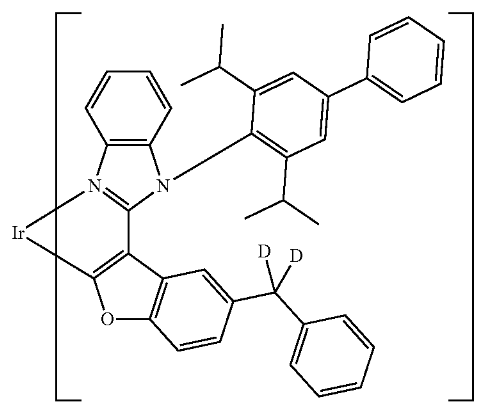
727
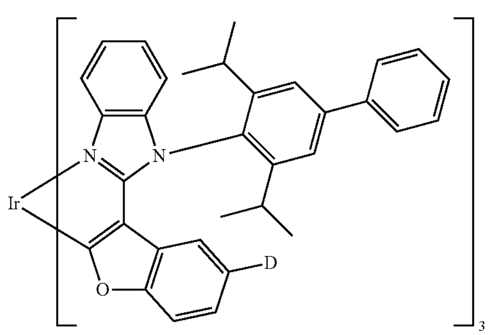
728
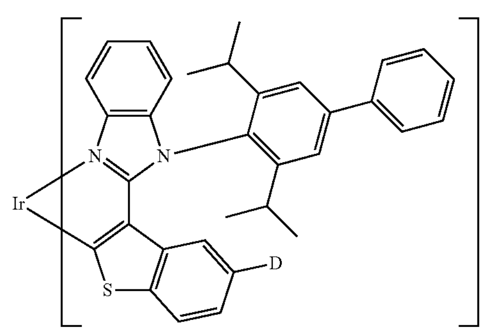

-continued
729
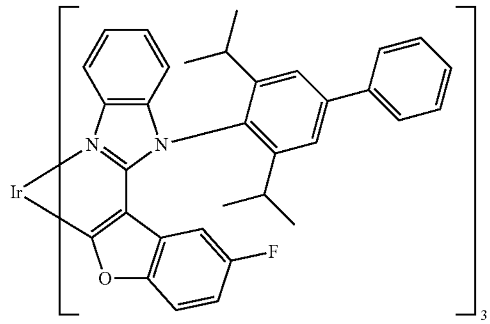
730
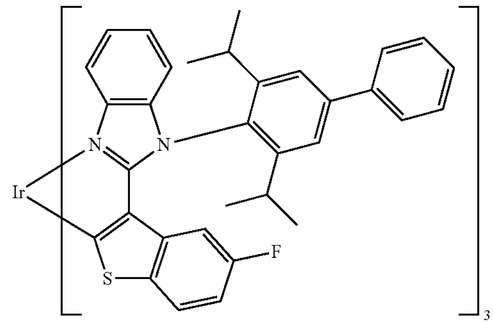
731
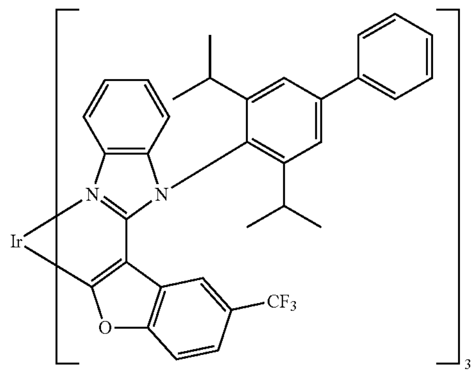
732
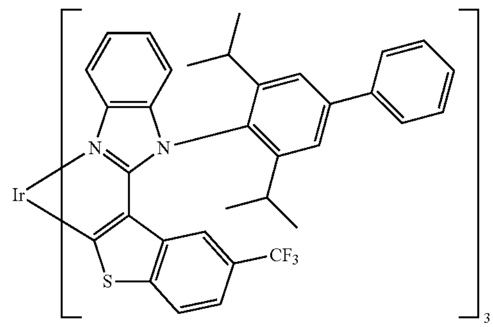
733
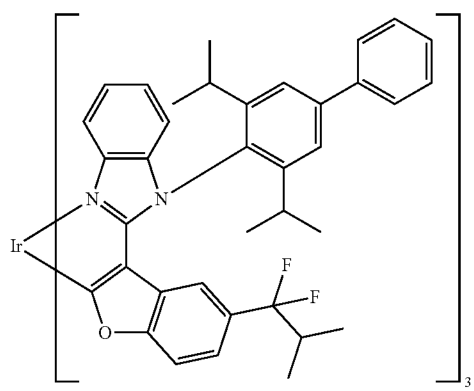
734
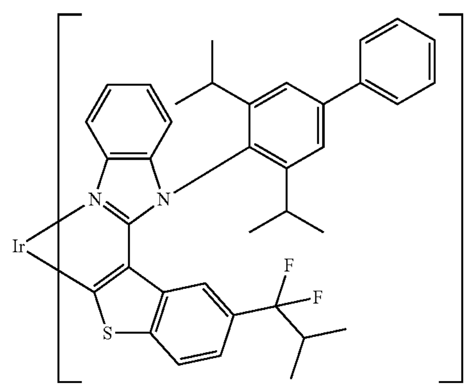
735
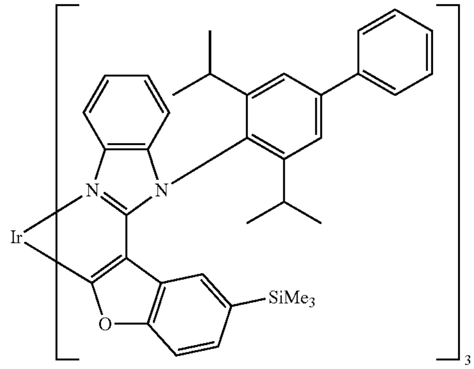
736
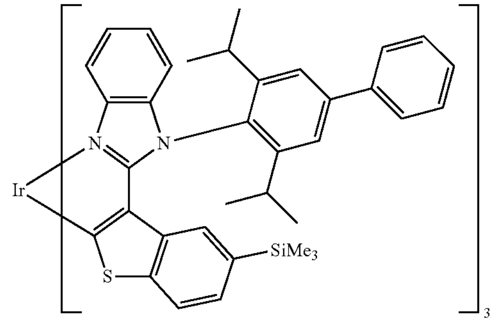

-continued
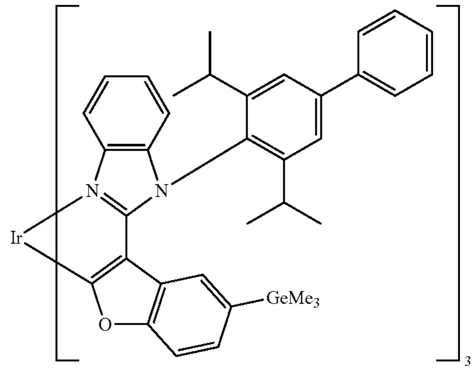
737
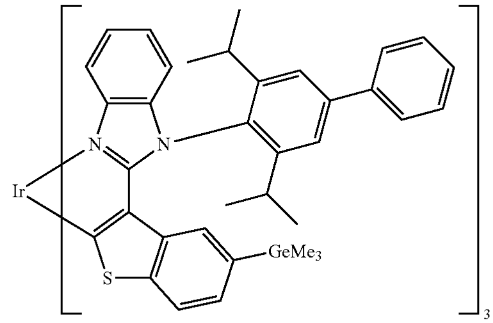
738
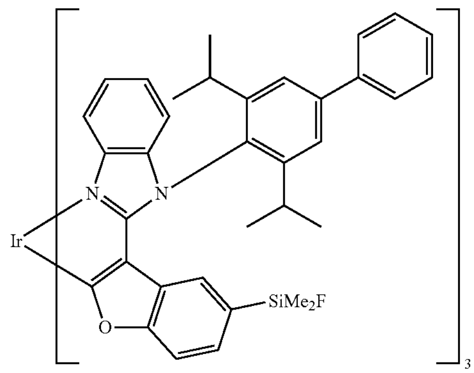
739
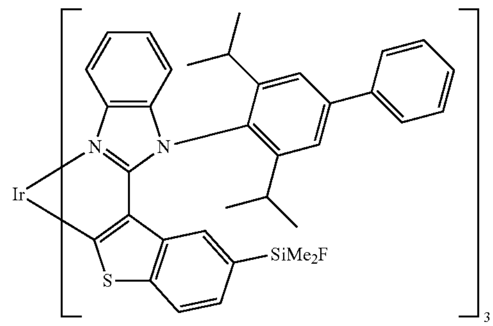
740
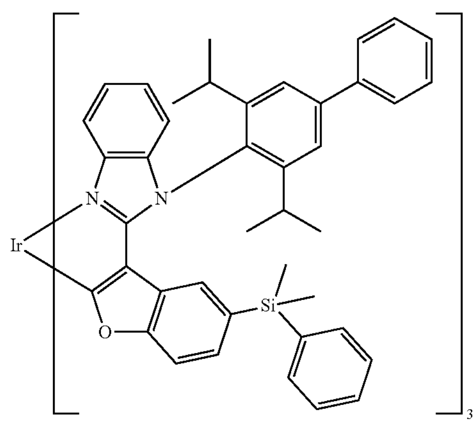
741
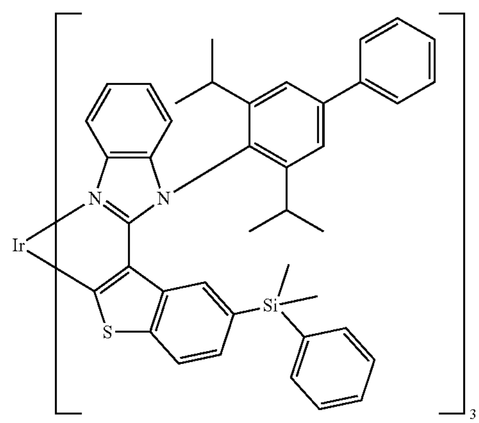
742
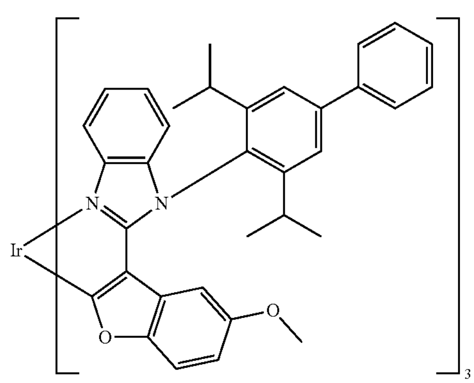
743
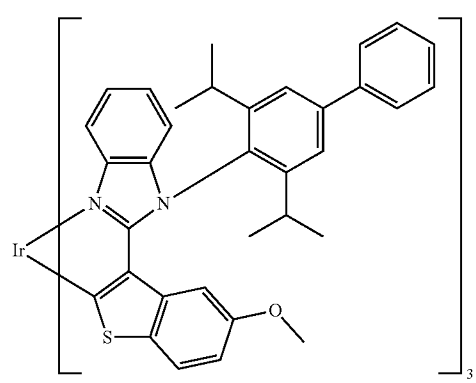
744

-continued
745
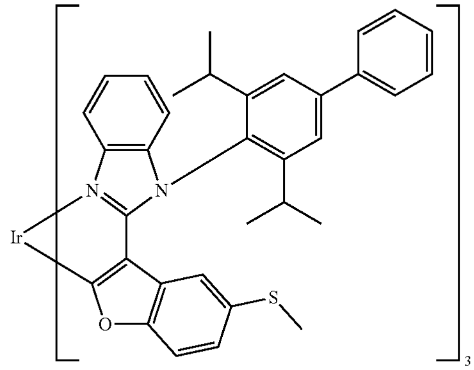
746
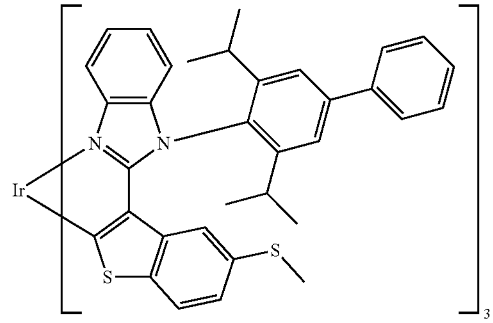
747
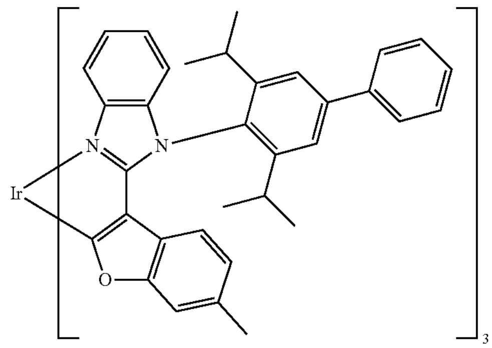
748
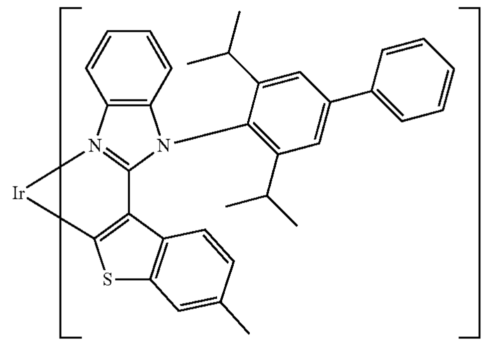
749
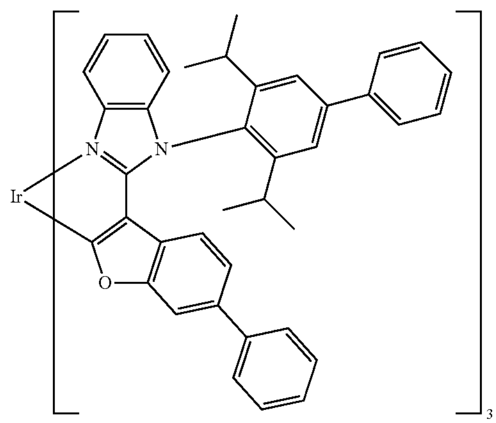
750
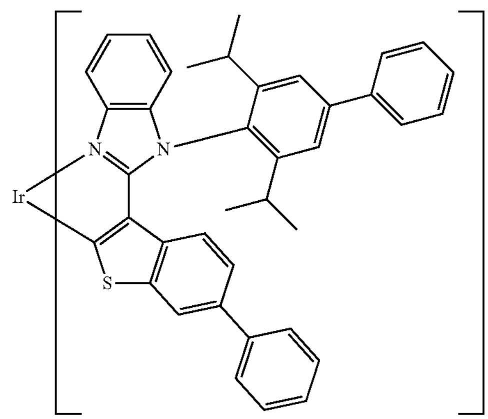
751
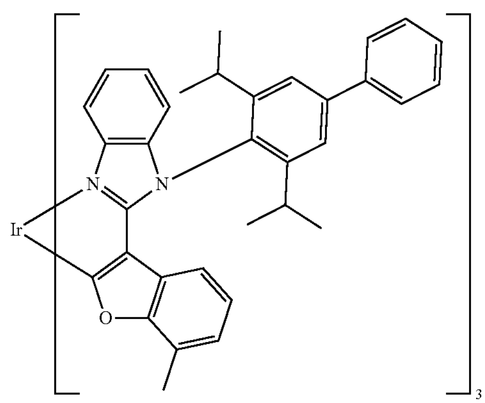
752
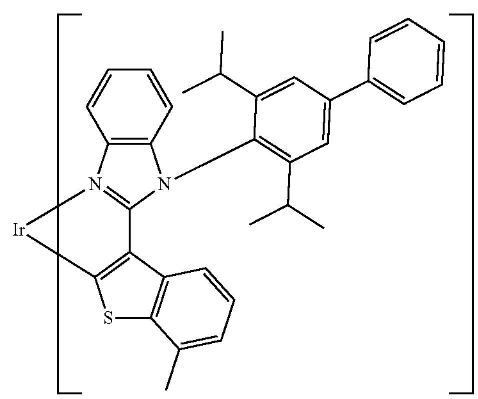

-continued
753
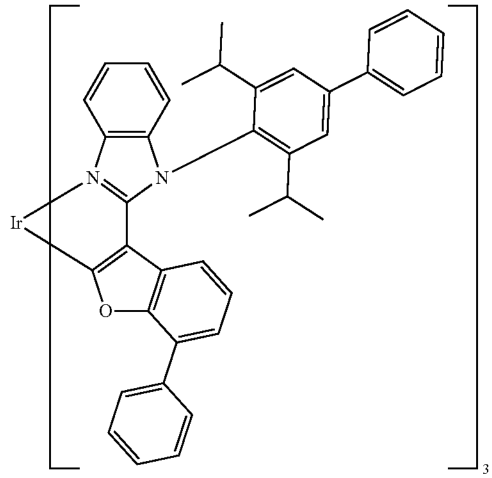
754
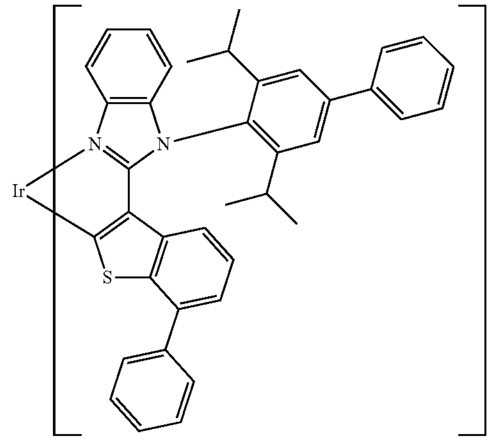
755
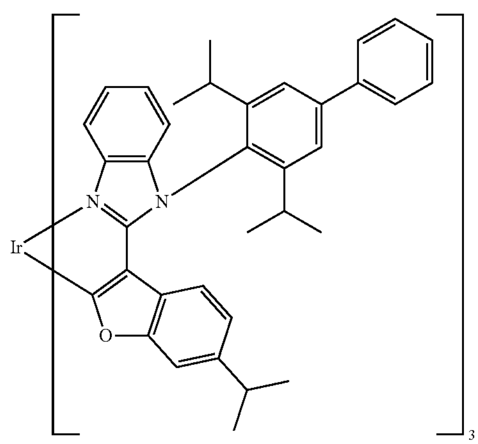
756
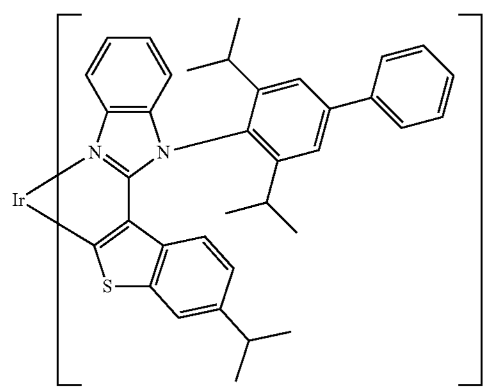
757
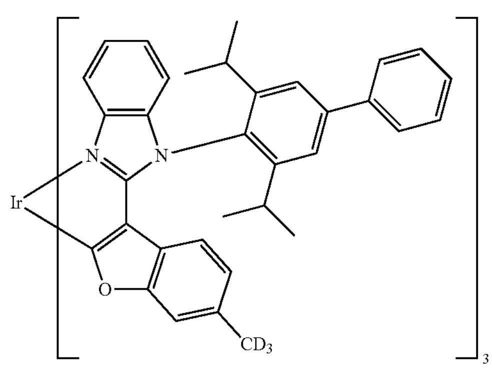
758
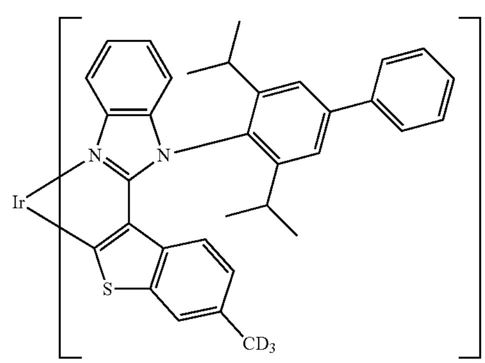

-continued
759
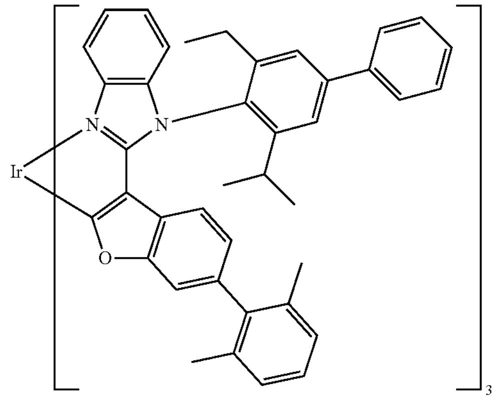
760
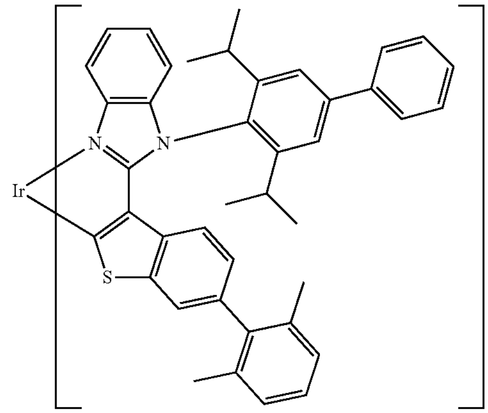
761
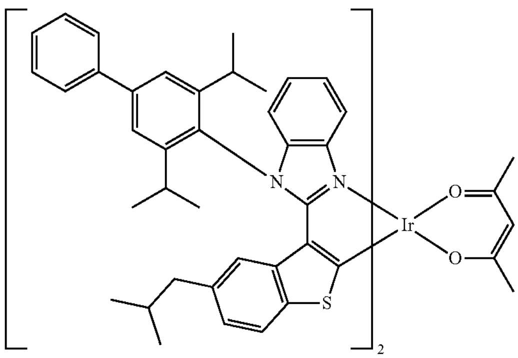
762
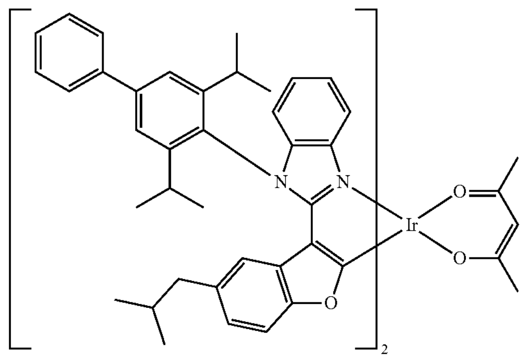
763
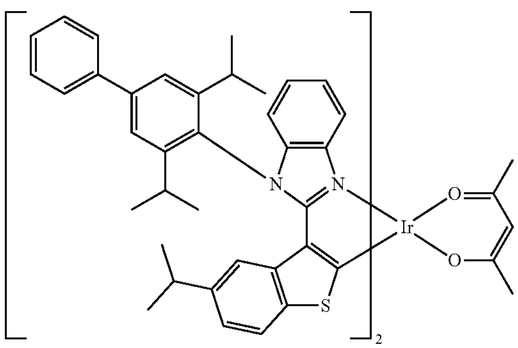
764
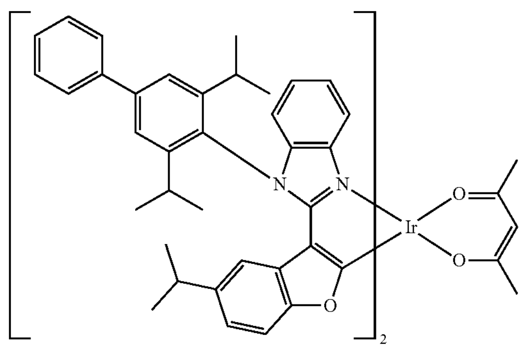
765
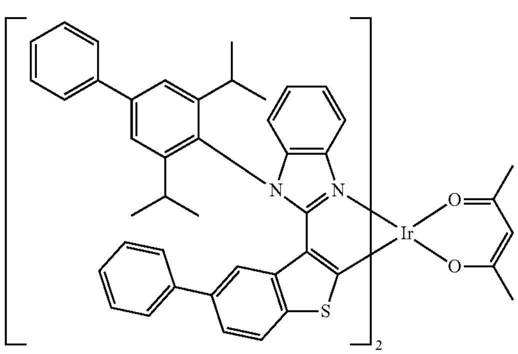
766
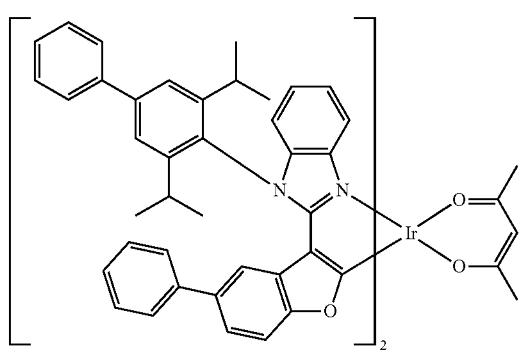

-continued
767
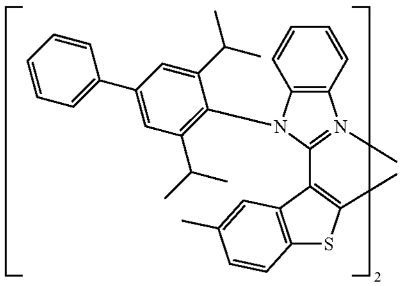
768
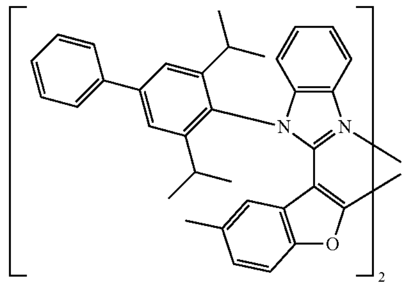
769
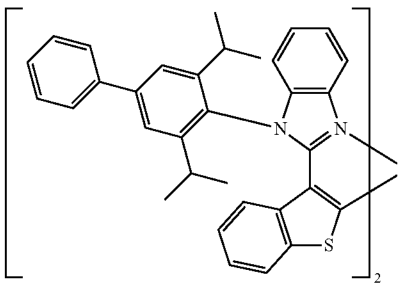
770
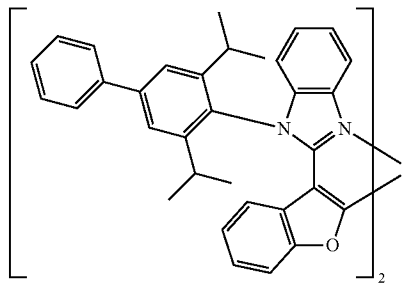
771
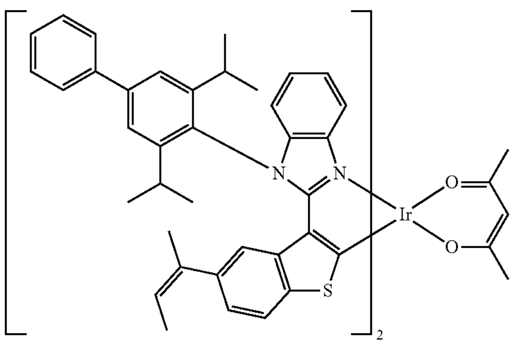
772
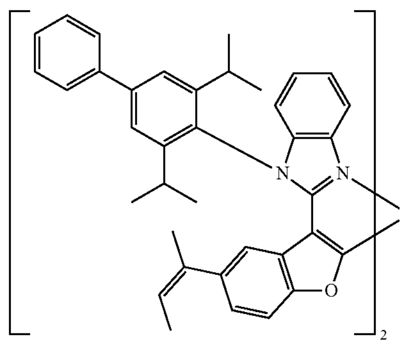
773
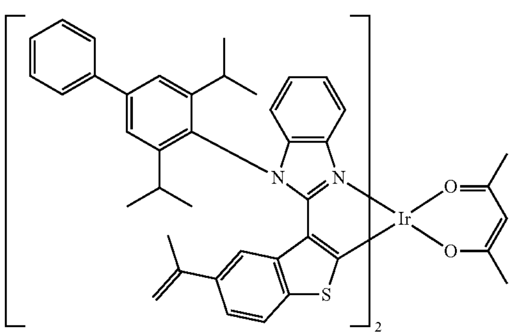
774
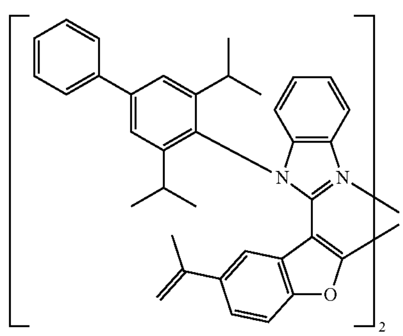
775
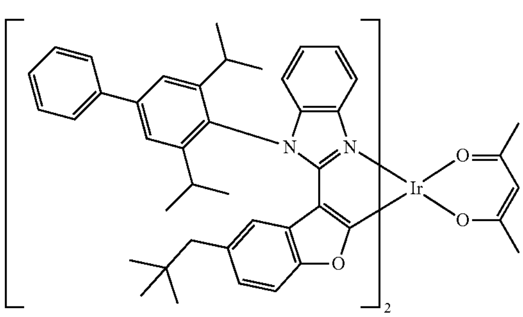
776
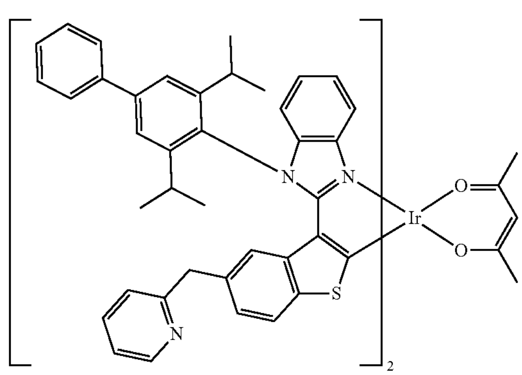

-continued
777
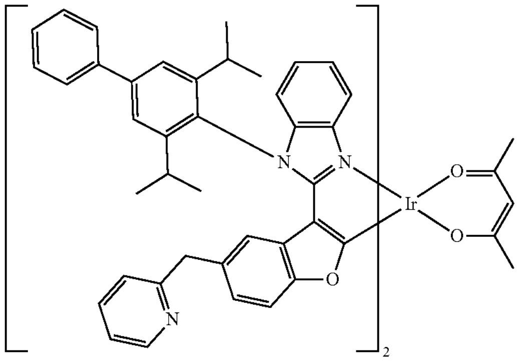
778
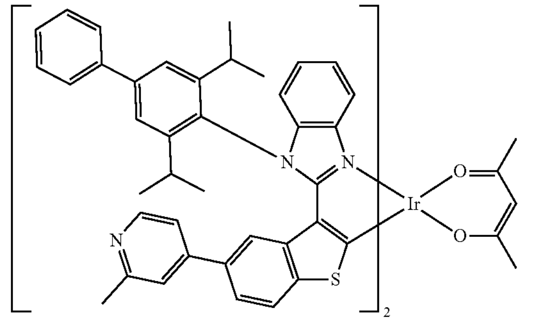
779
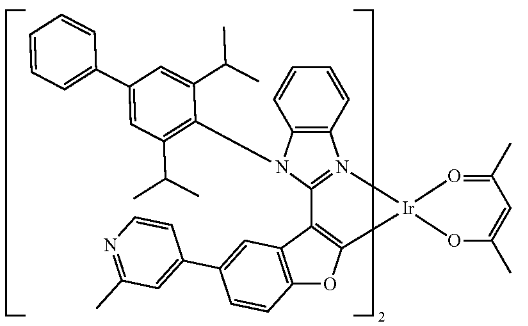
780
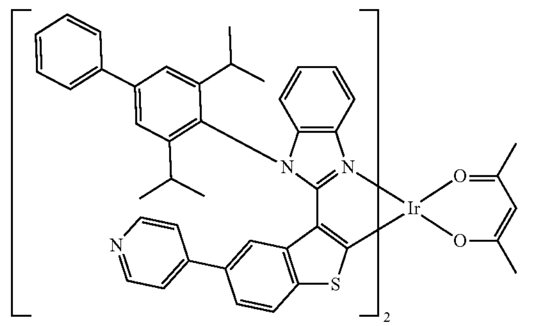
781
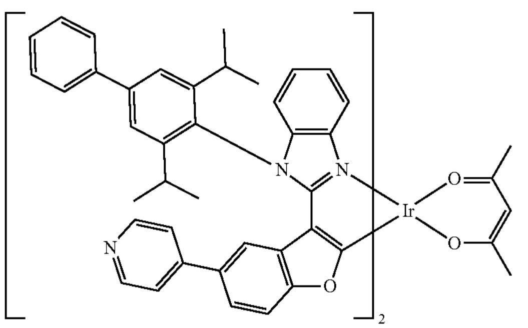
782
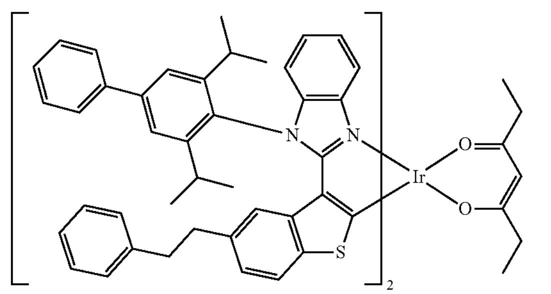
783
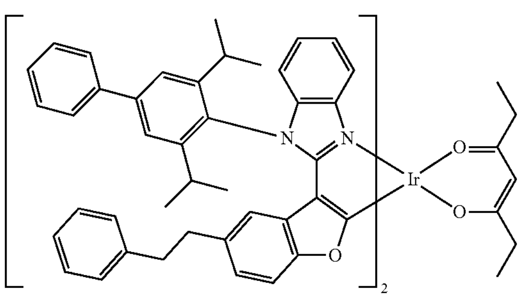
784
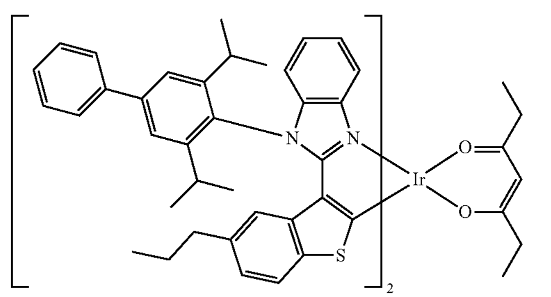
785
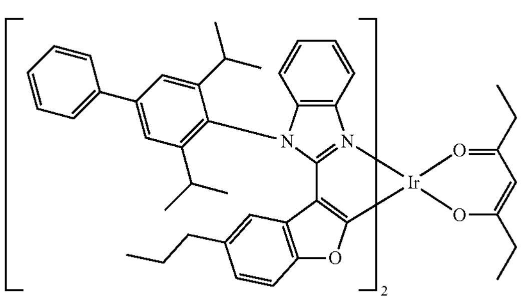
786
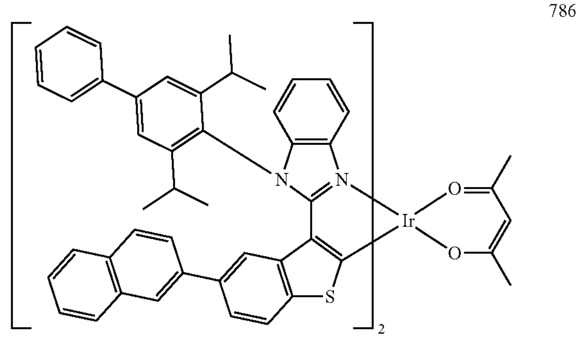

-continued
787
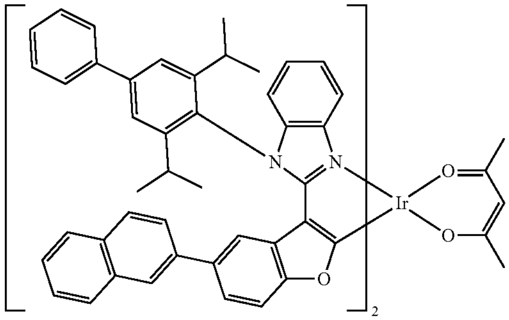
788
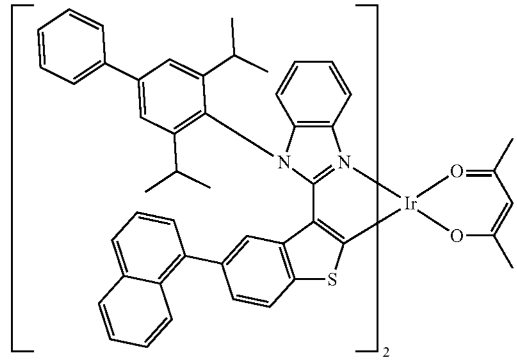
789
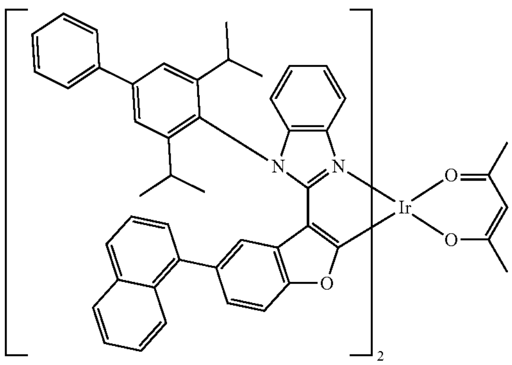
790
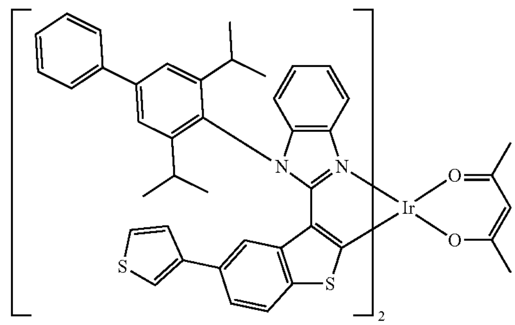
791
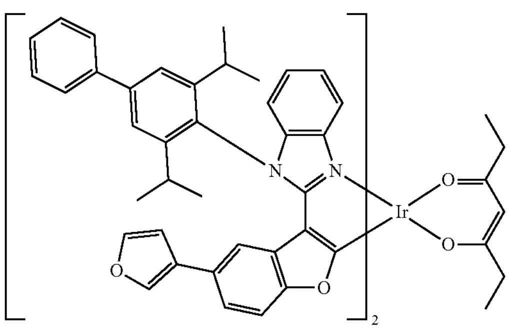
792
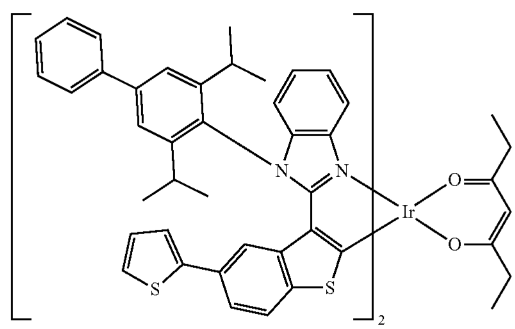
793
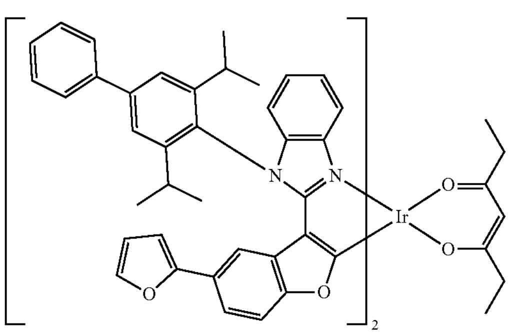
794
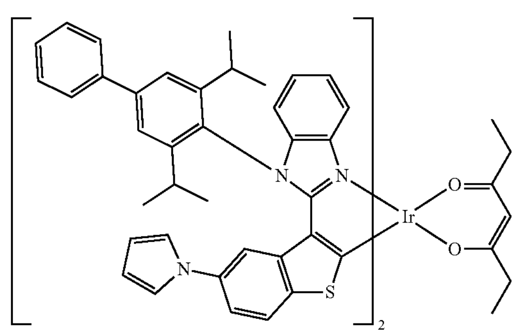

-continued
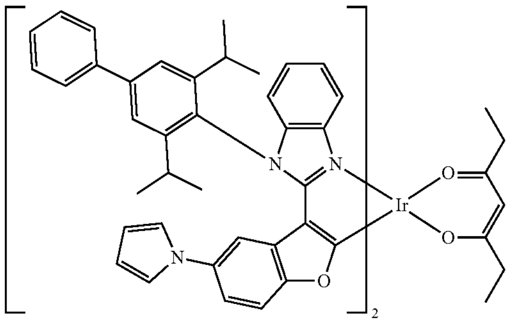
795
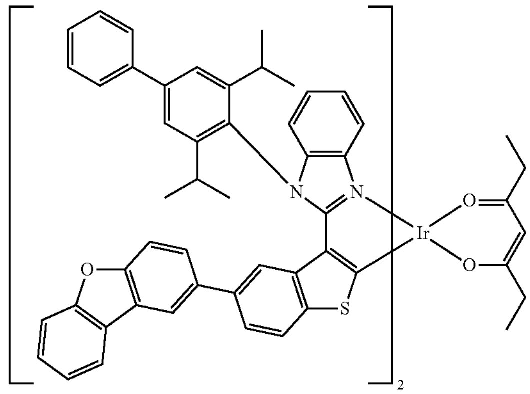
796
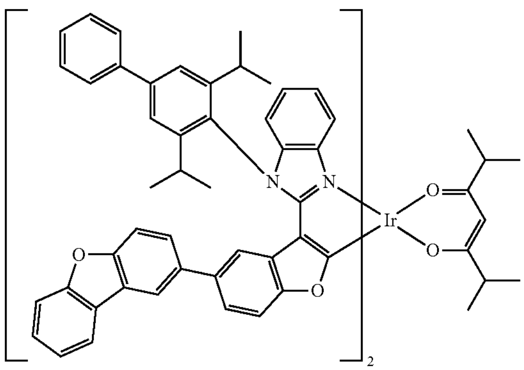
797
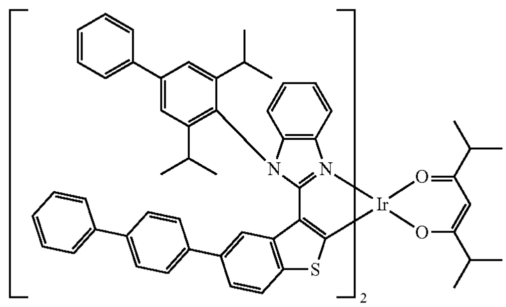
798
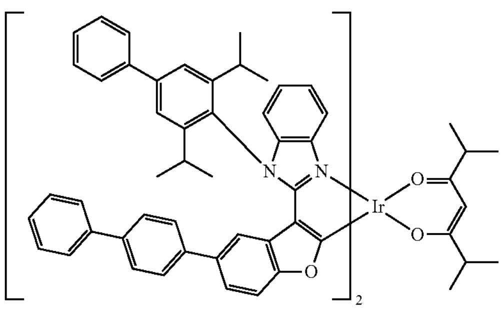
799
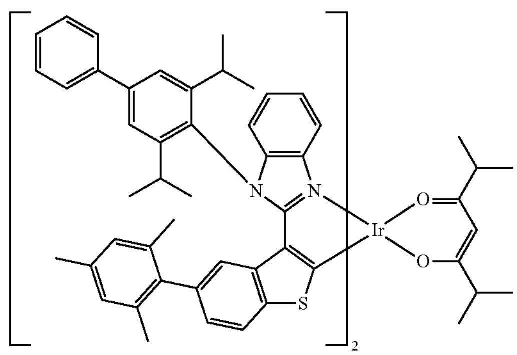
800
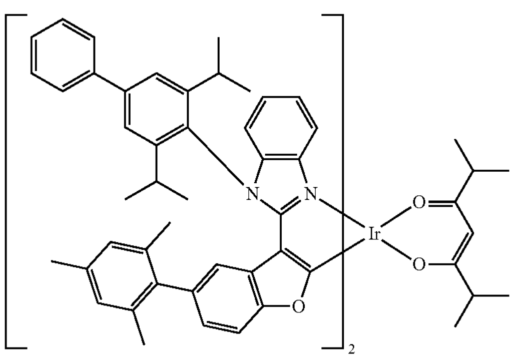
801
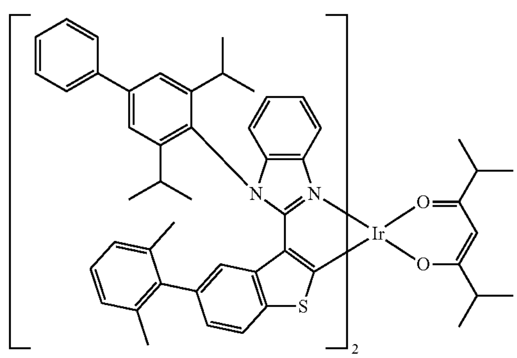
802

-continued
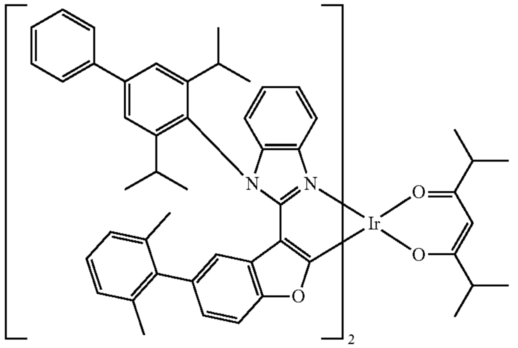
803
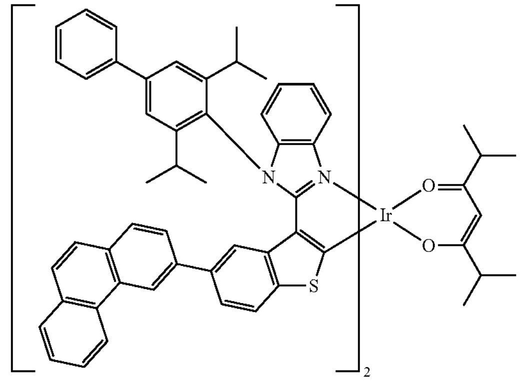
804
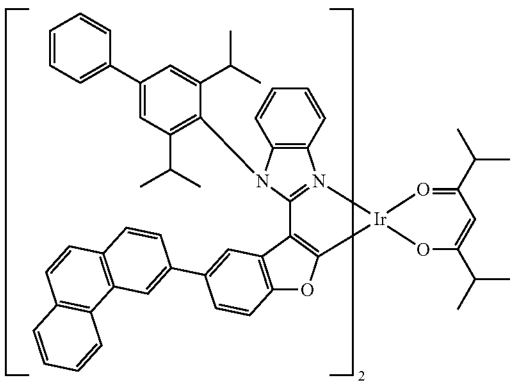
805
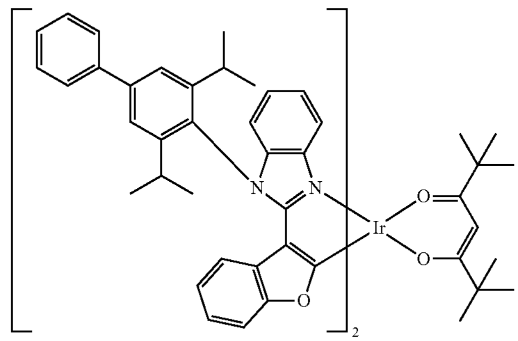
806
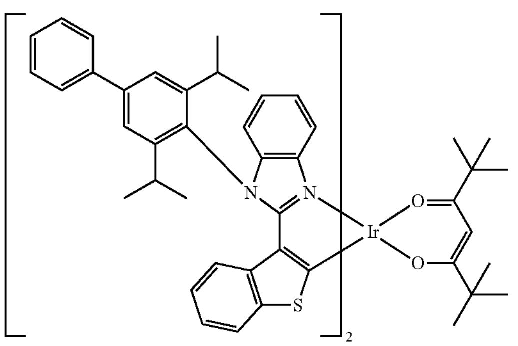
807
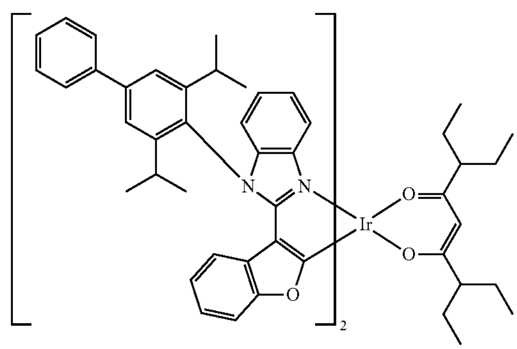
808
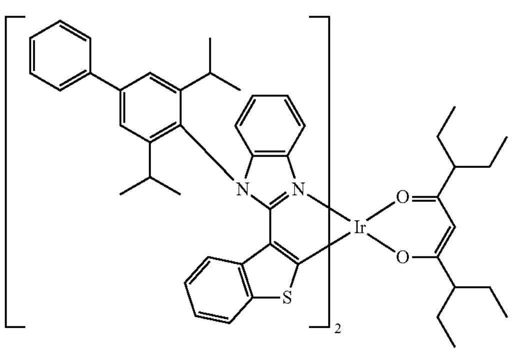
809
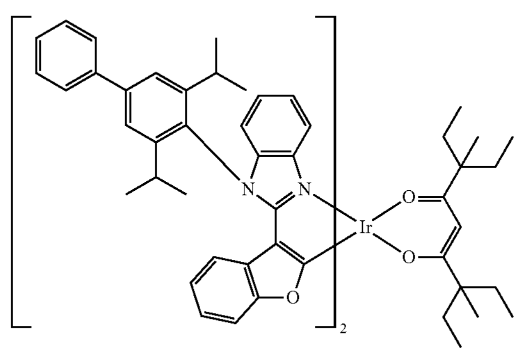
810

-continued
811
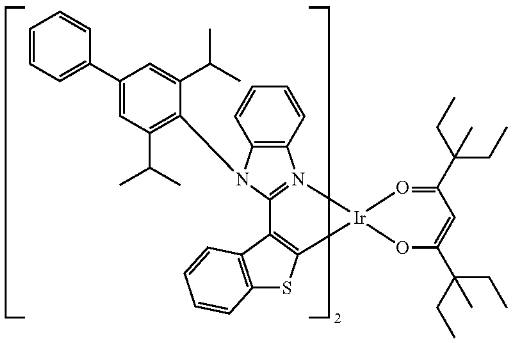
812
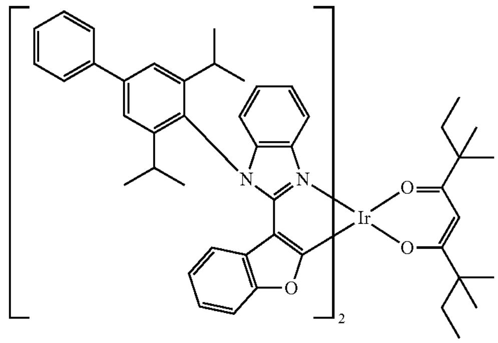
813
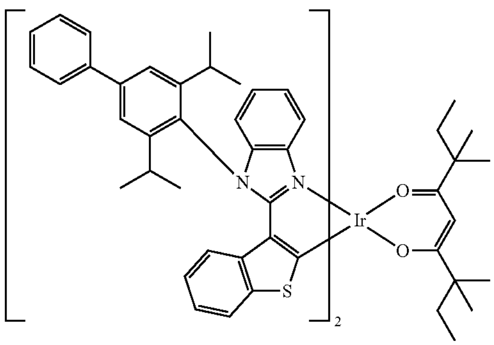
814
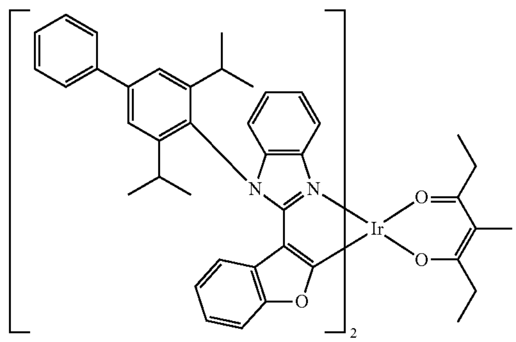
815
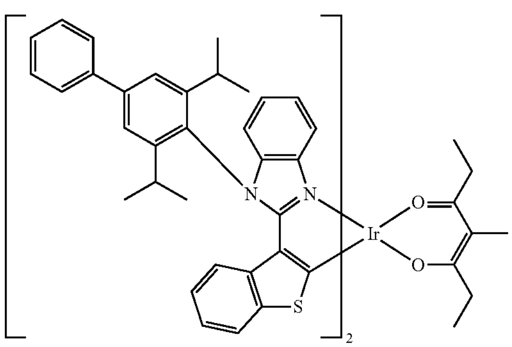
816
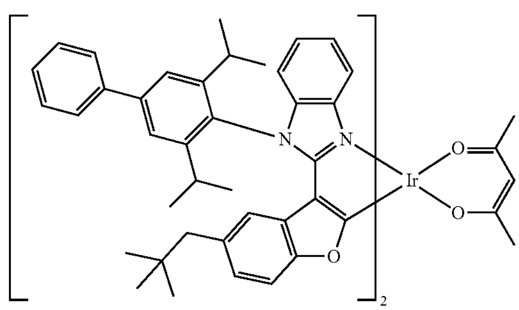
817
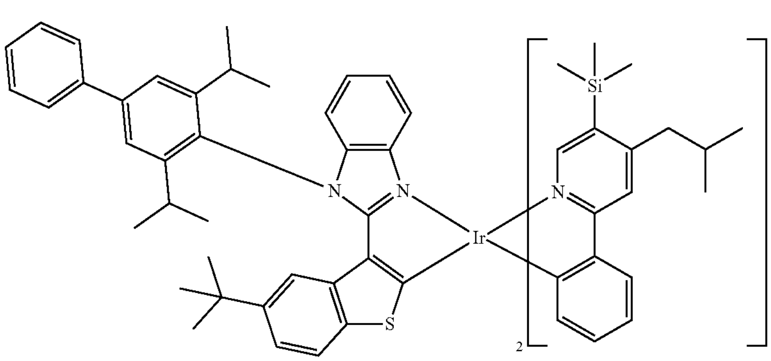

-continued
818
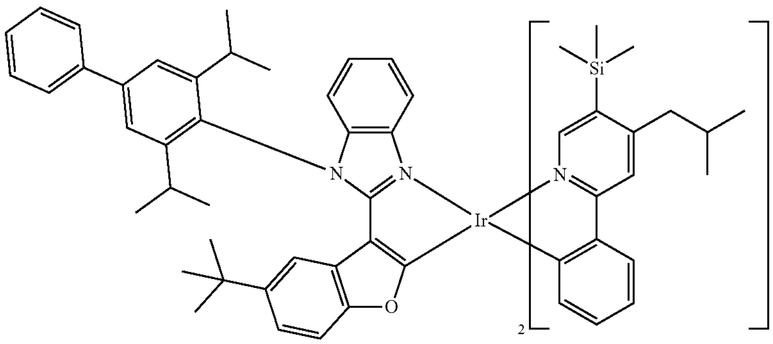
819
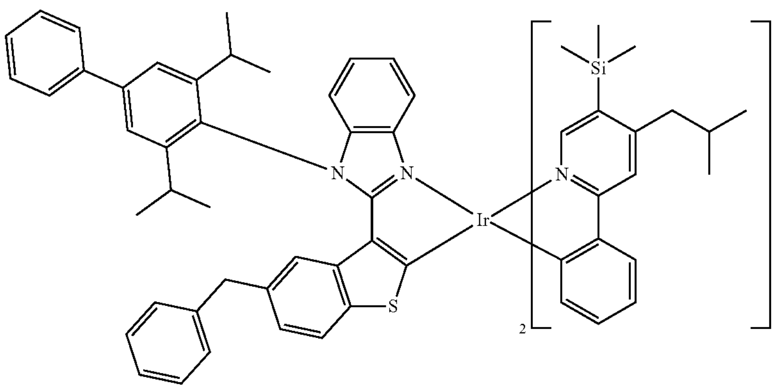
820
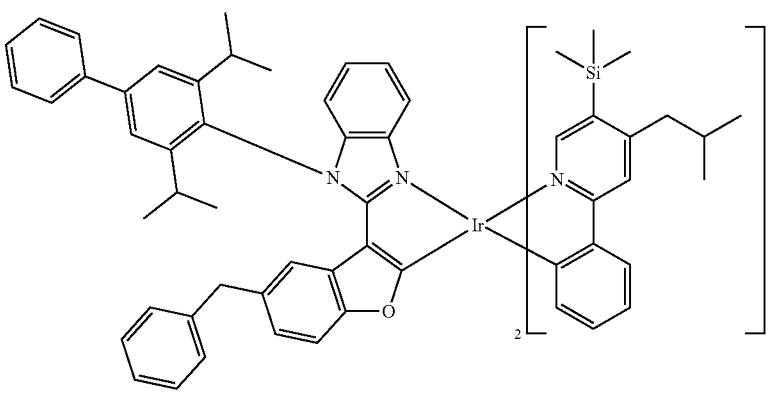
821
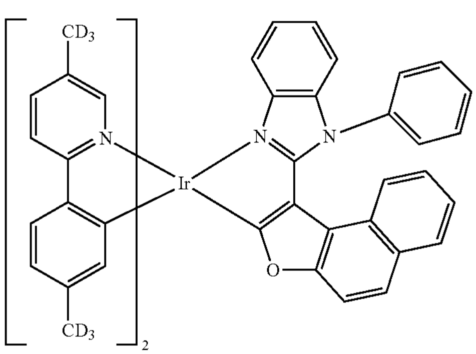
822
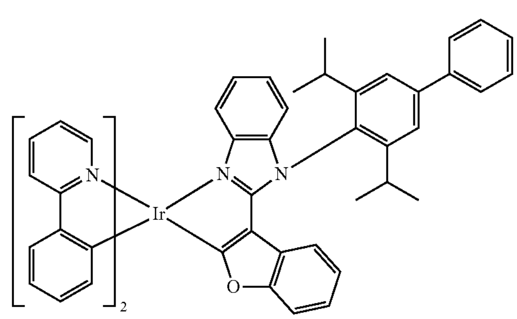

-continued
823
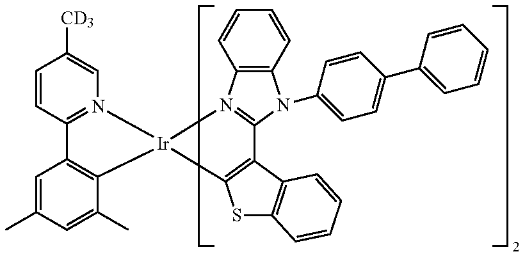
824
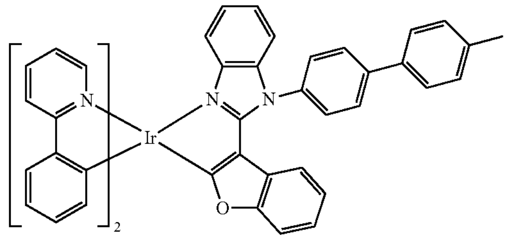
825
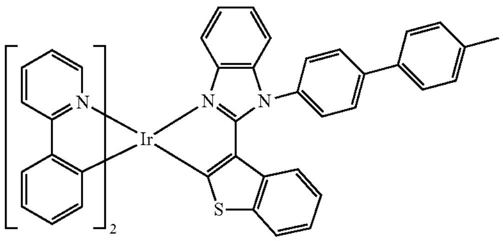
826
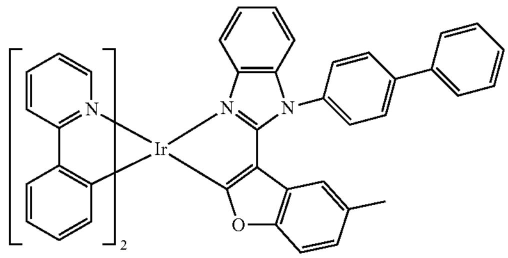
827
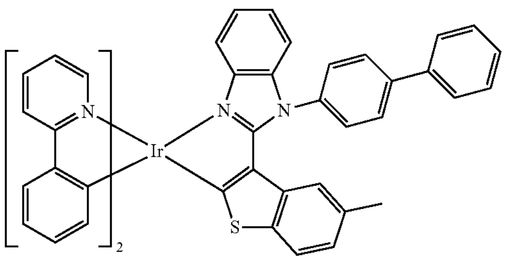
828
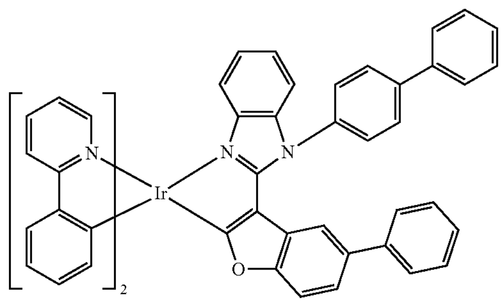
829
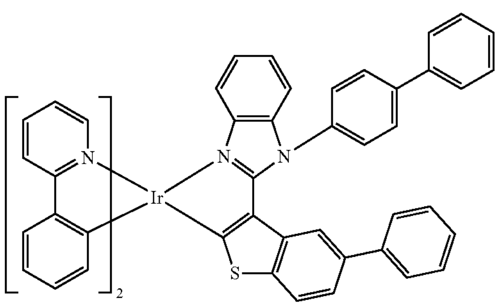
830
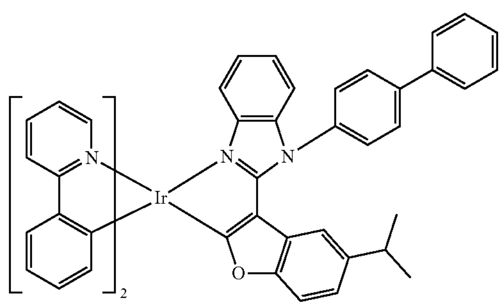
831
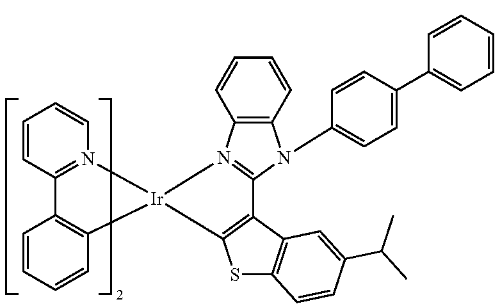
832
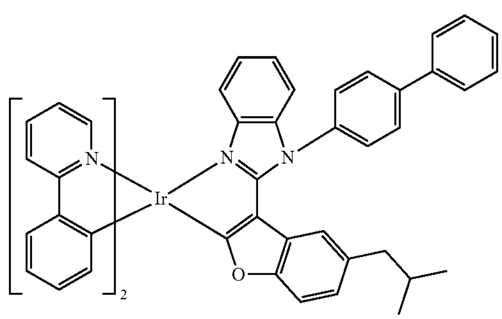

-continued
833
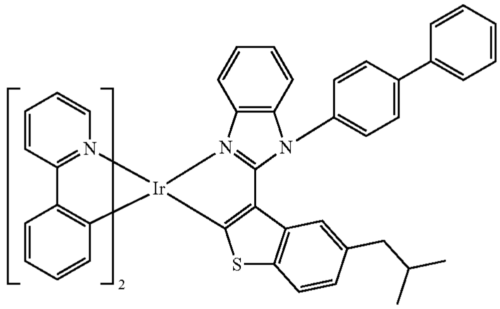
834
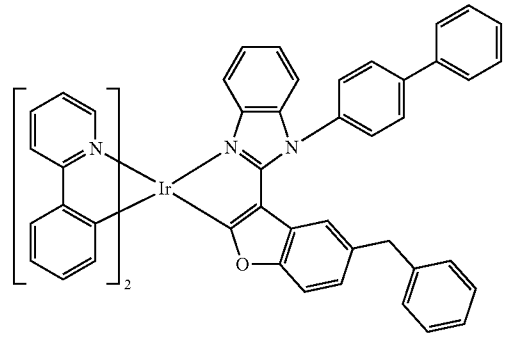
835
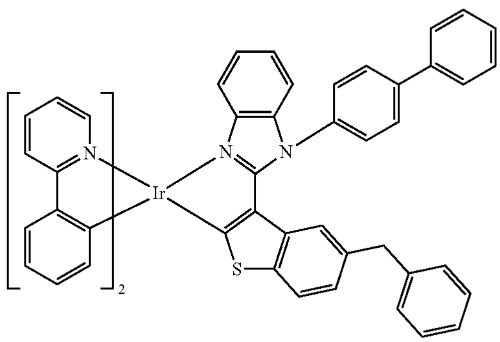
836
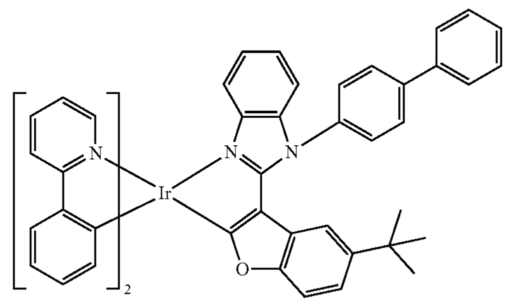
837
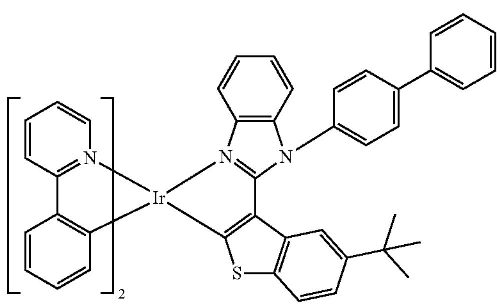
838
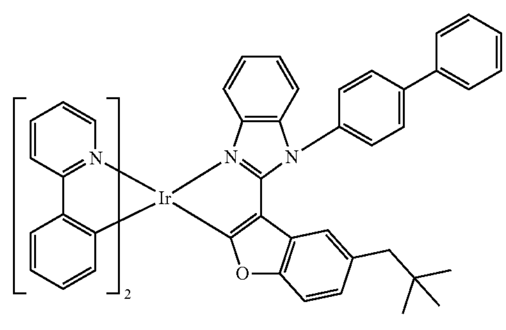
839
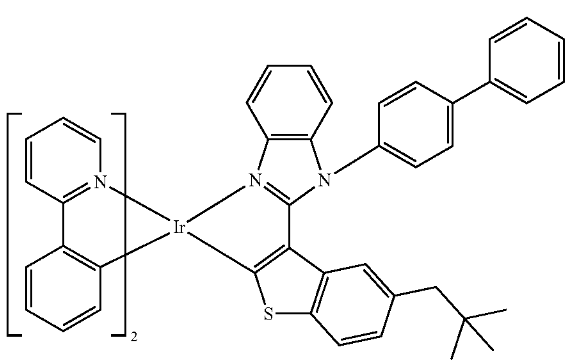

840
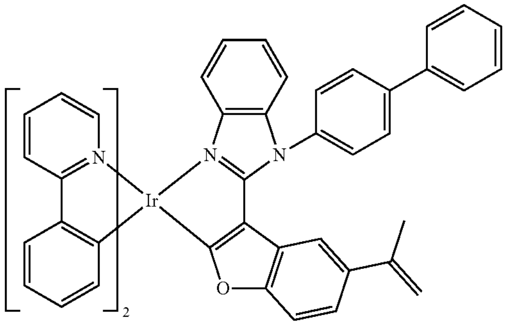
841
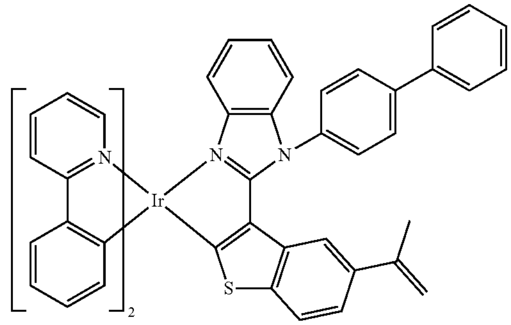
842
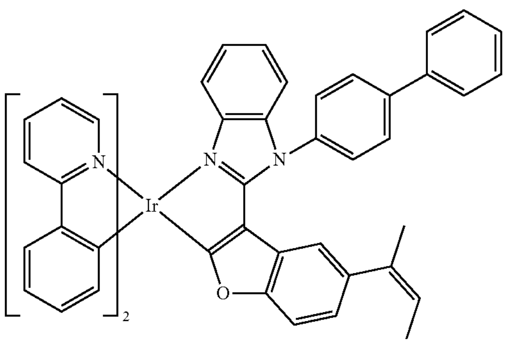
843
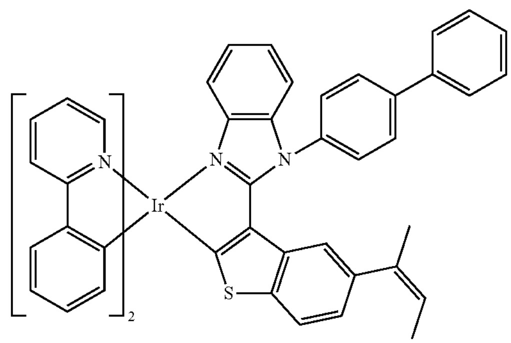
844
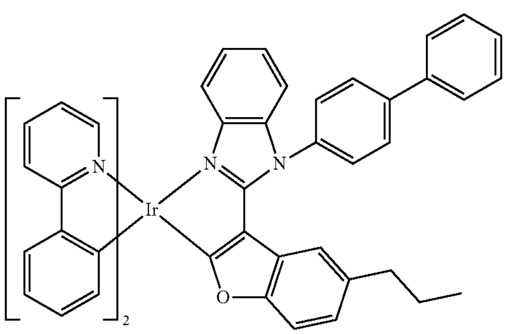
845
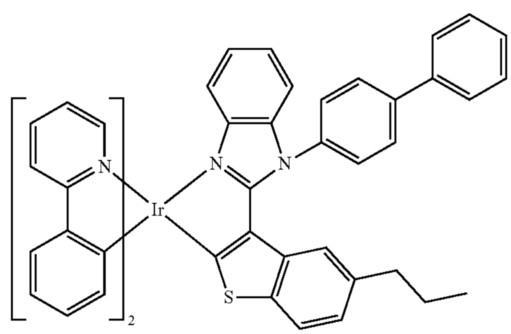
846
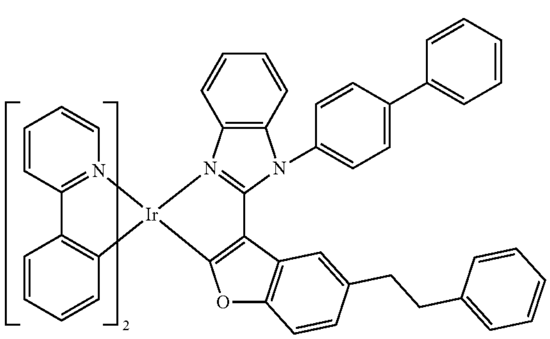

-continued
847
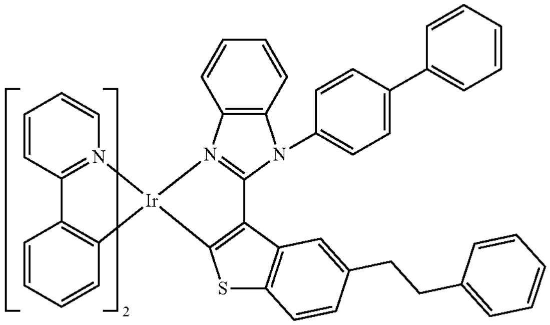
848
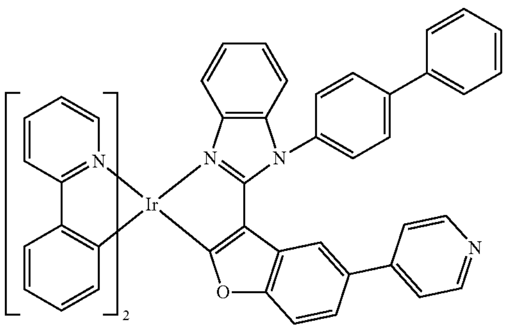
849
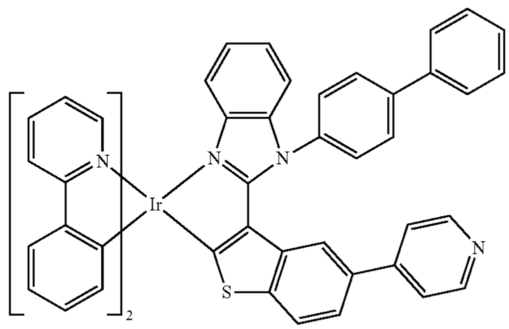
850
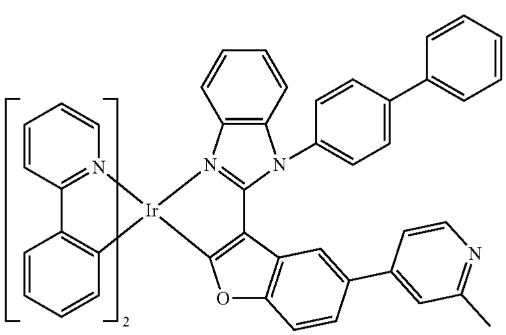
851
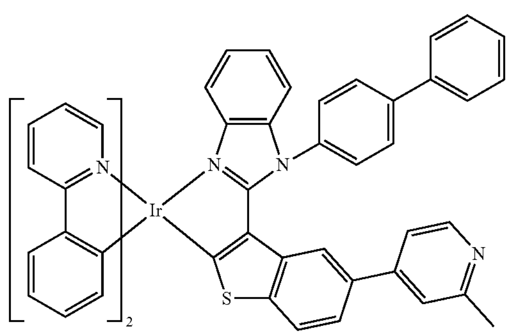
852
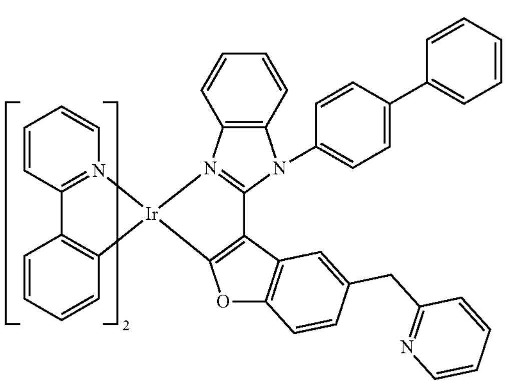
853
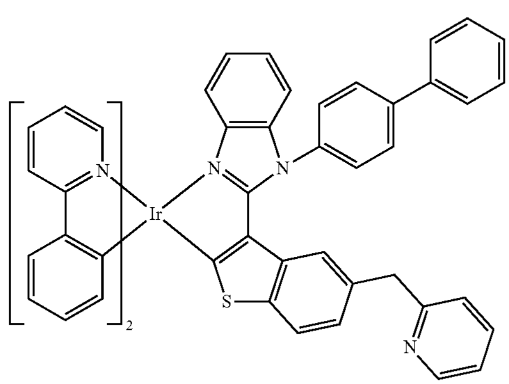

-continued
854
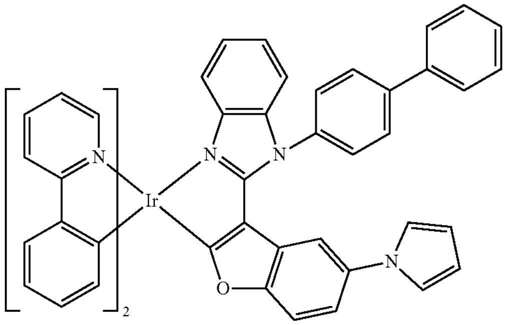
855
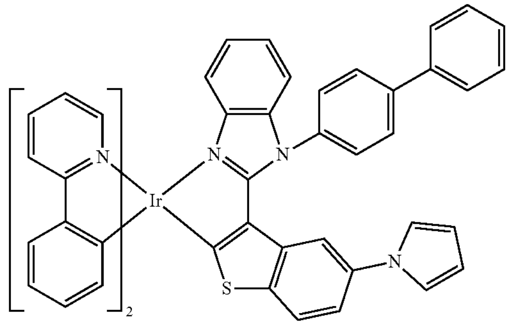
856
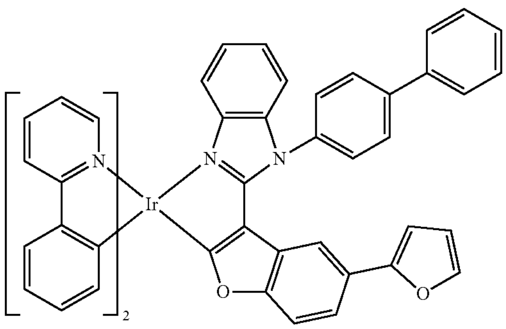
857
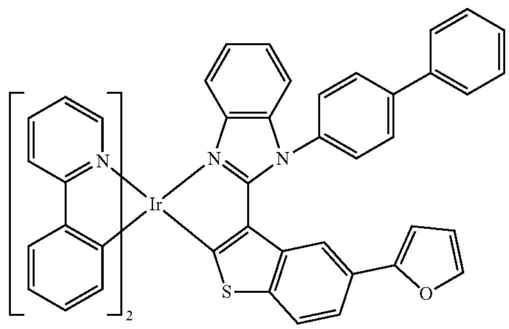
858
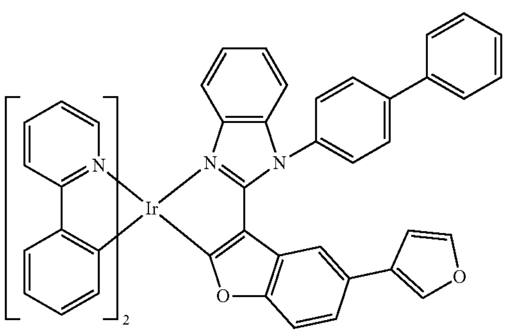
859
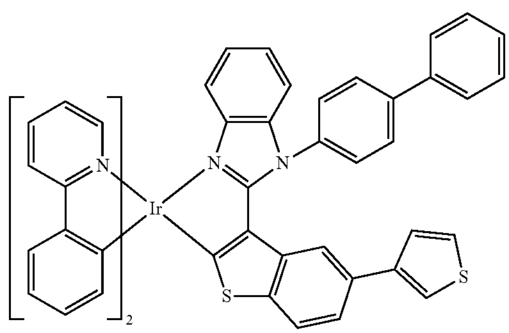
860
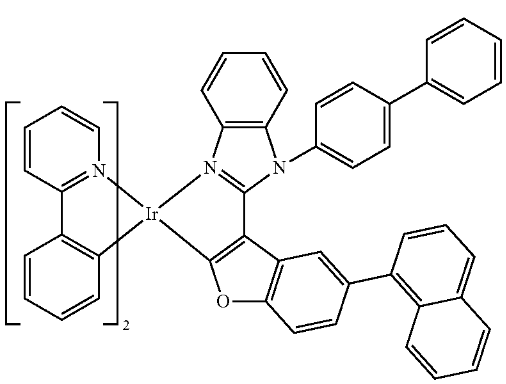
861
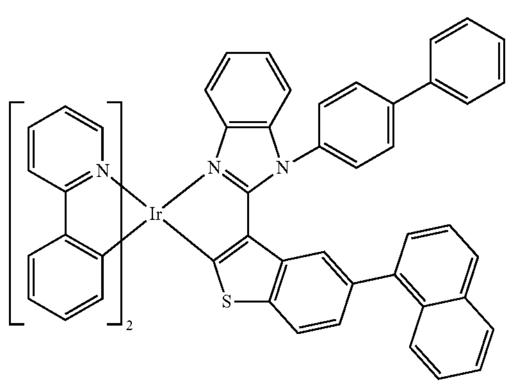

-continued
862
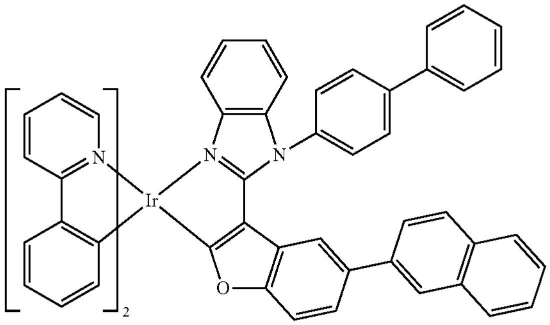
863
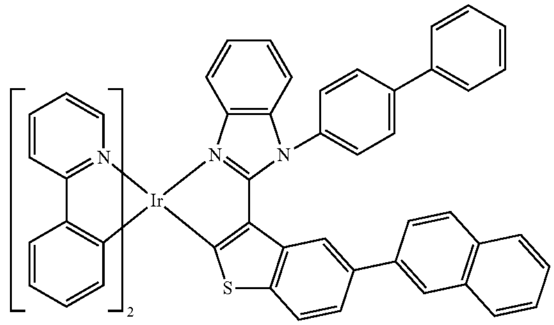
864
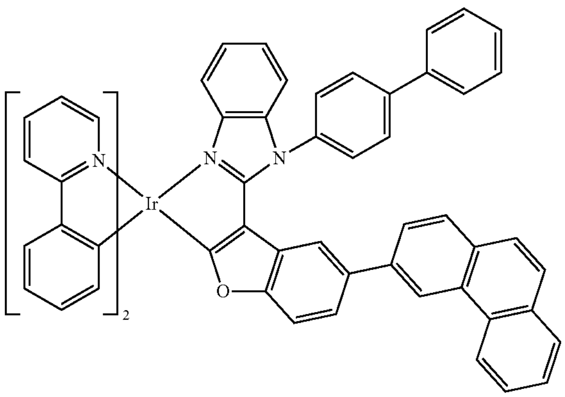
865
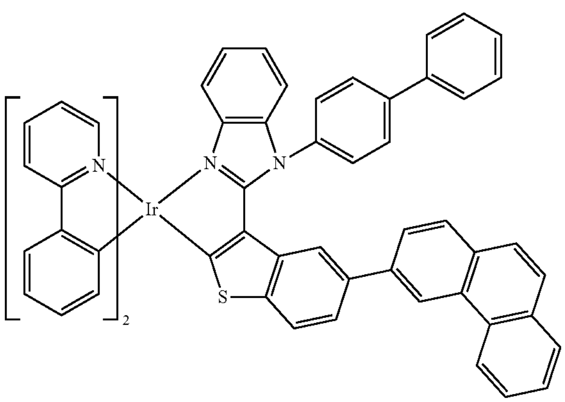
866
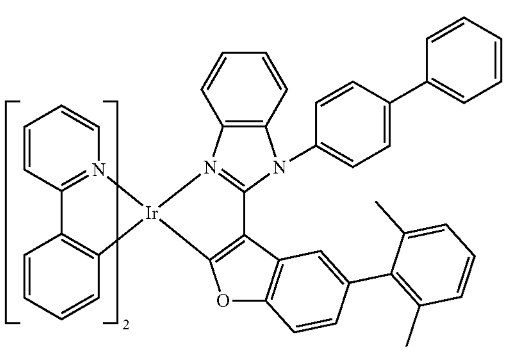
867
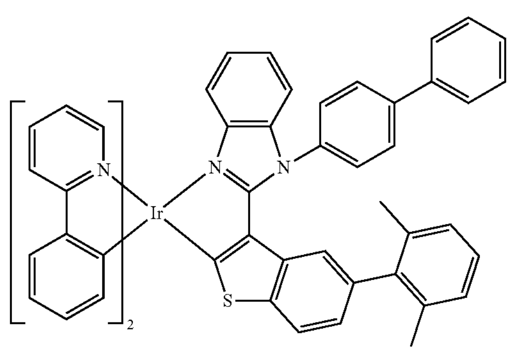

-continued
868
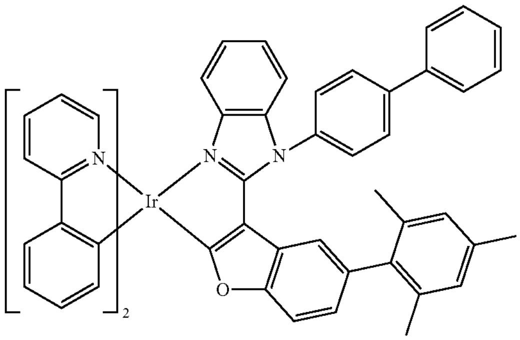
869
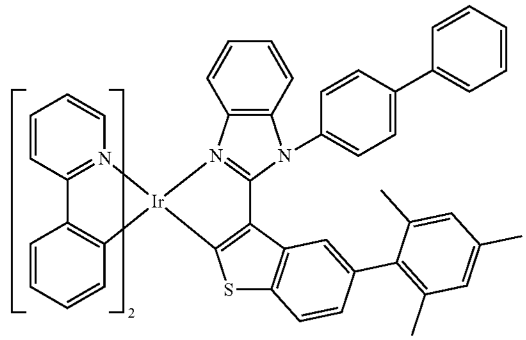
870
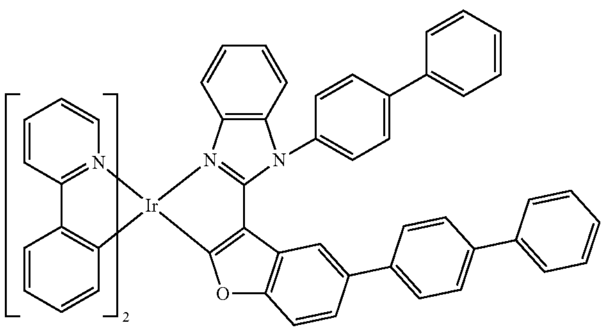
871
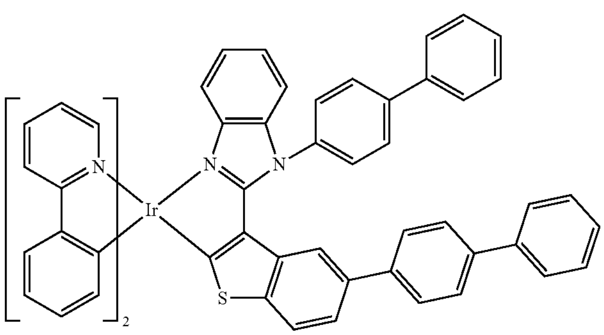
872
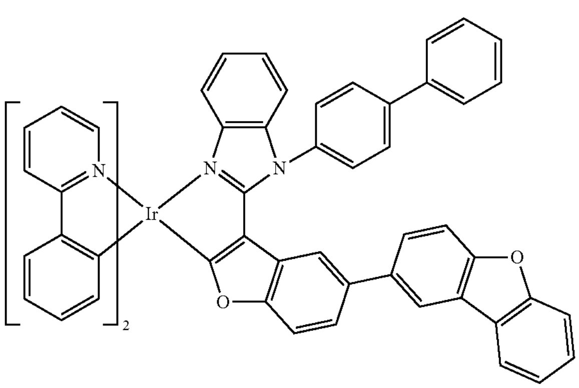

-continued
873
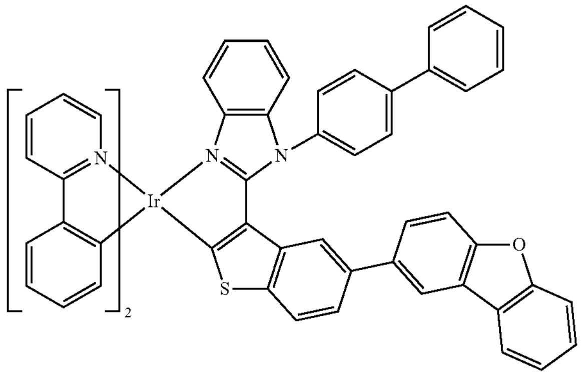
874
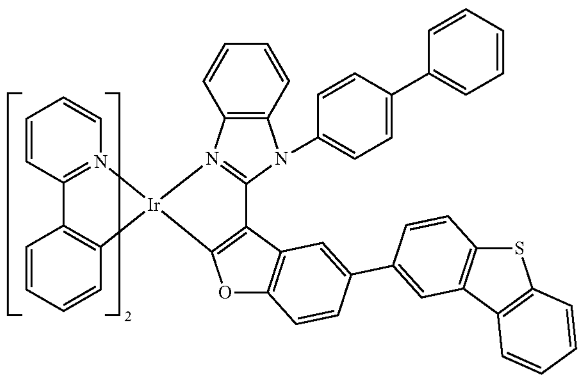
875
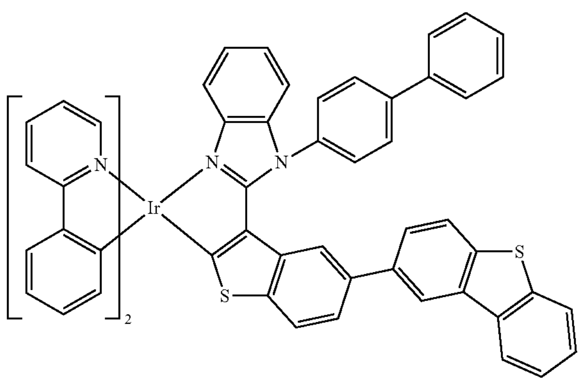
876
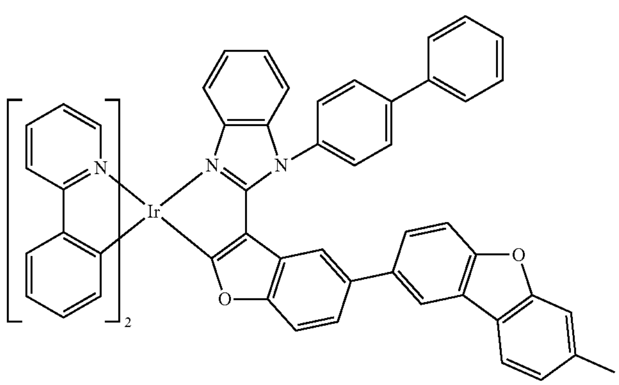

-continued
877
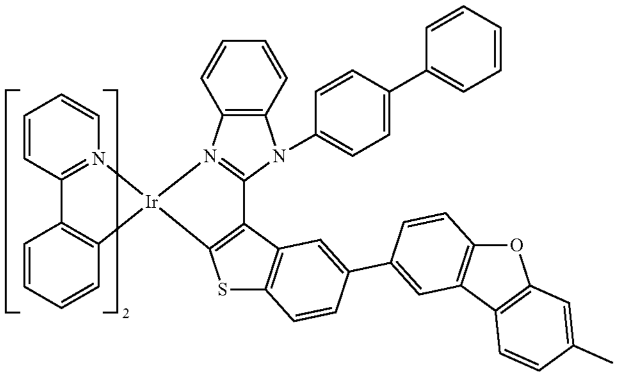
878
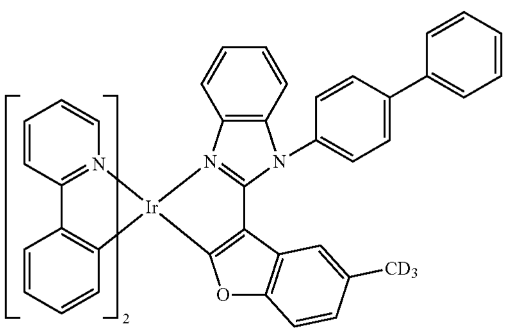
879
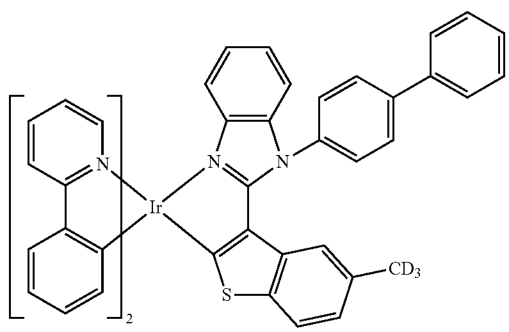
880
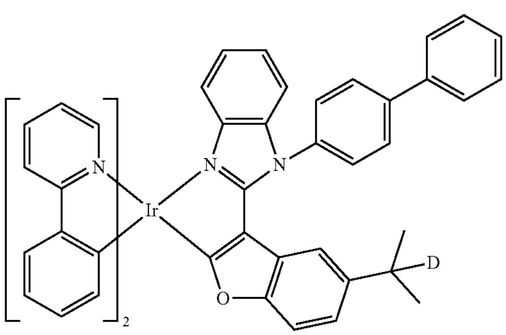
881
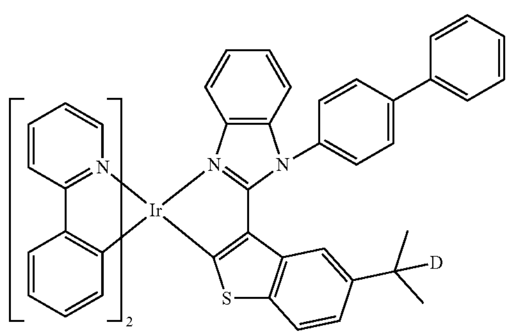
882
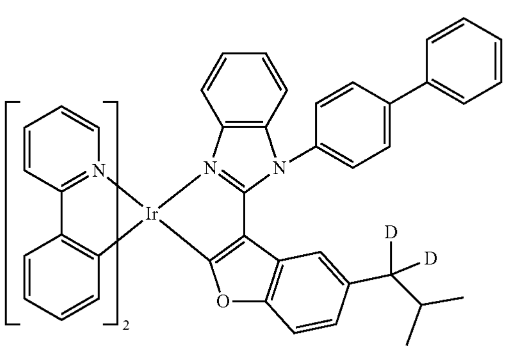
883
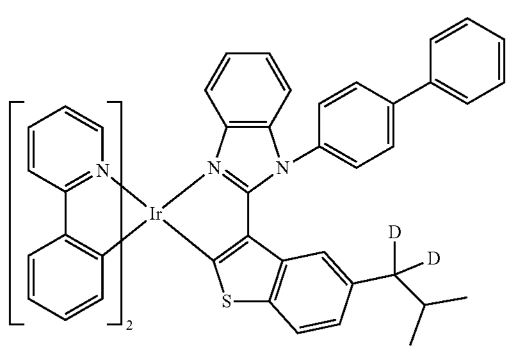

-continued
884
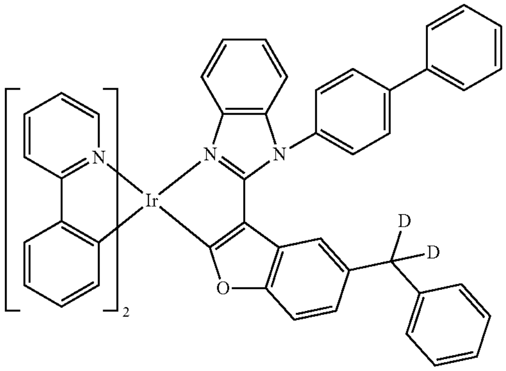
885
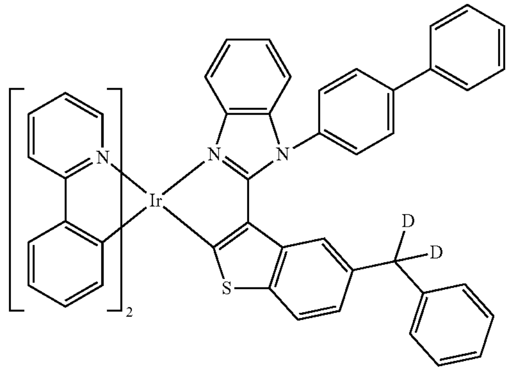
886
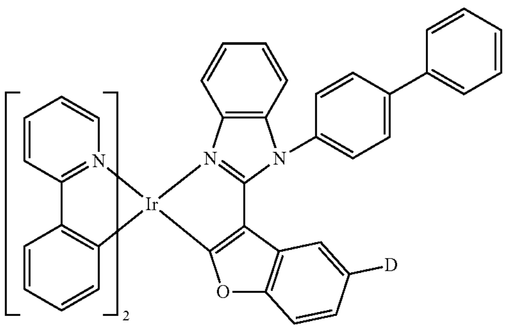
887
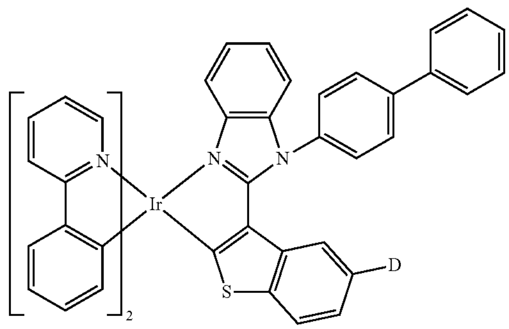
888
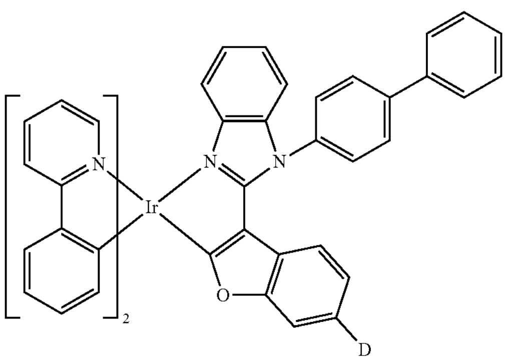
889
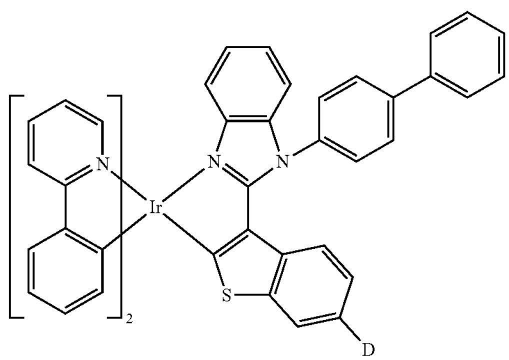
890
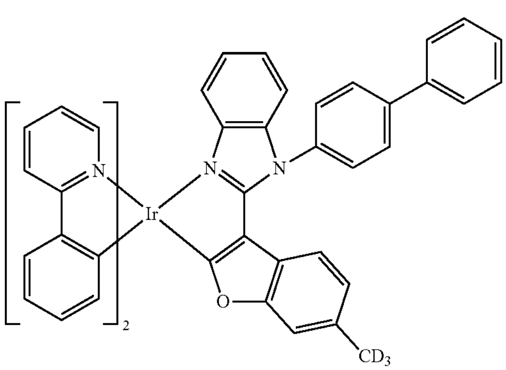
891
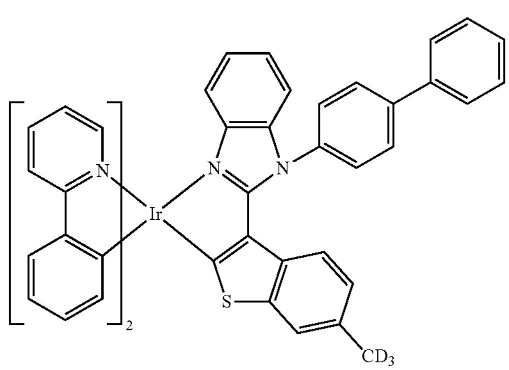

-continued
892
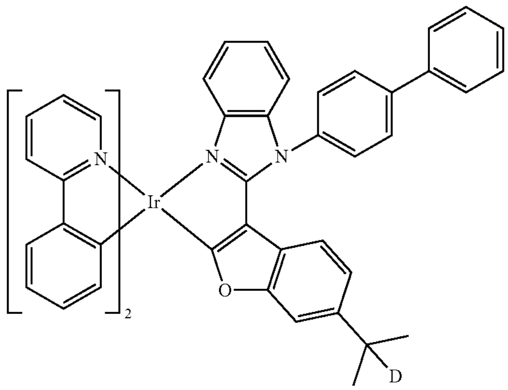
893
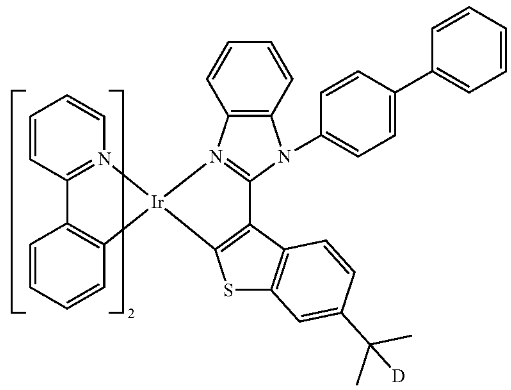
894
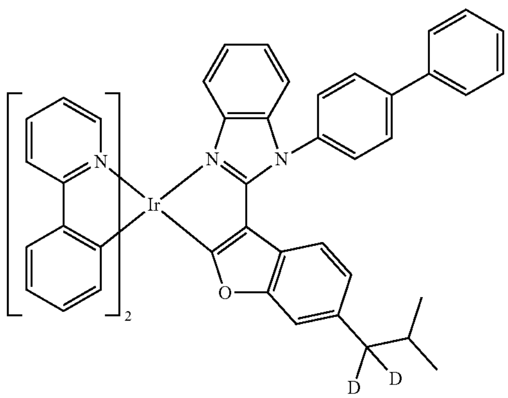
895
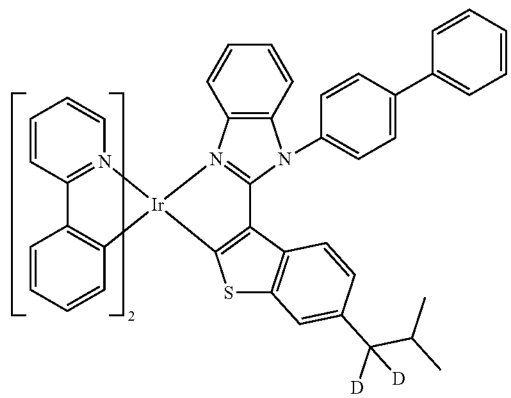
896
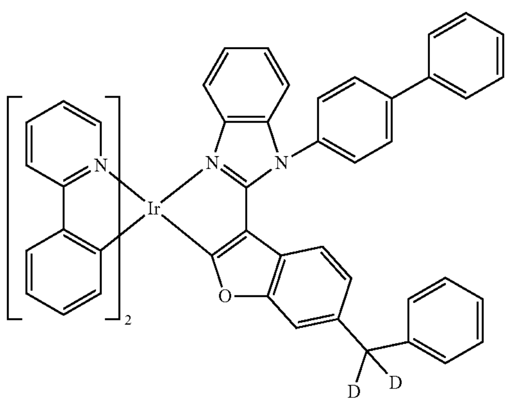
897
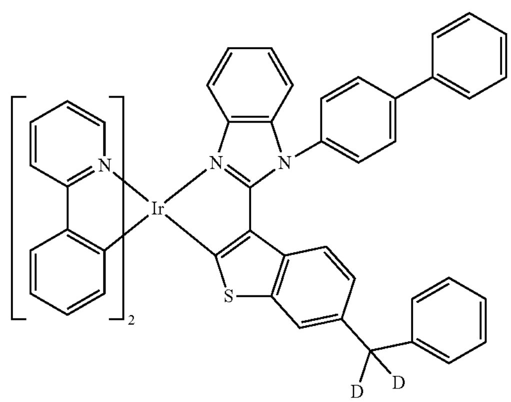
898
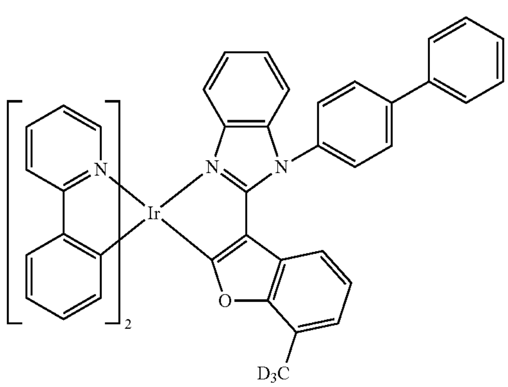
899
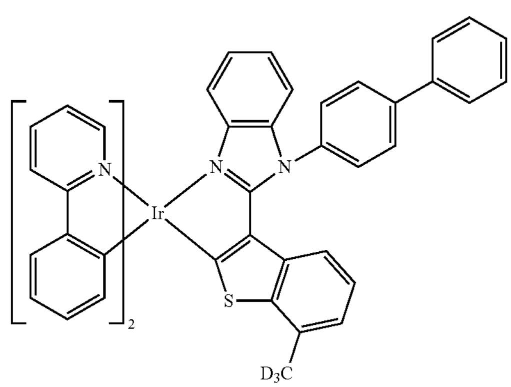

-continued
900
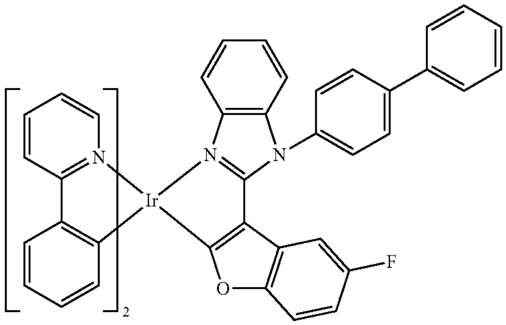
901
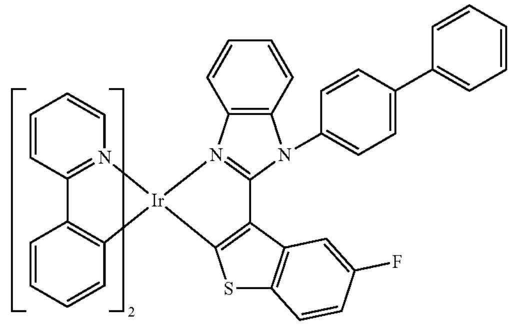
902
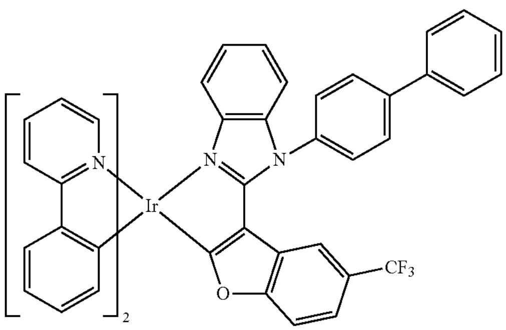
903
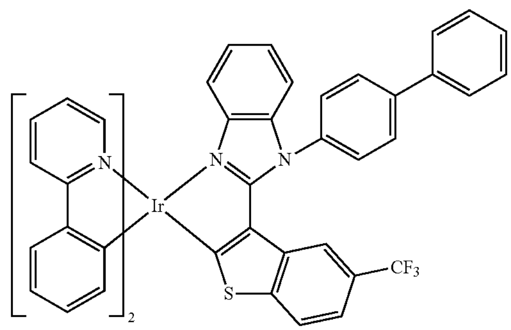
904
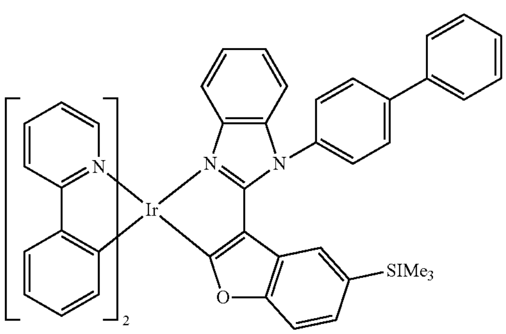
905
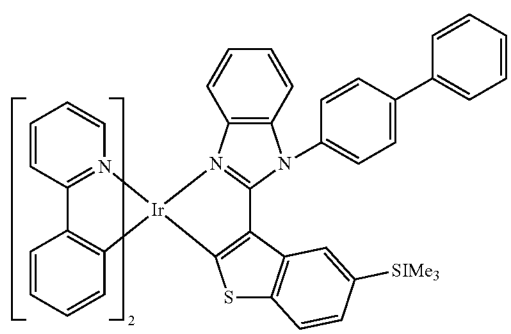
906
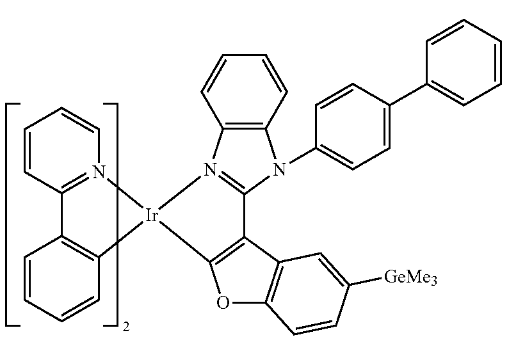
907
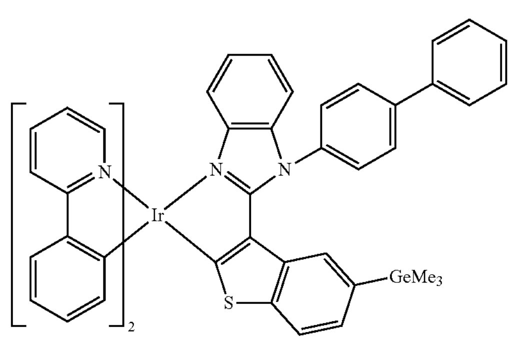

-continued
908
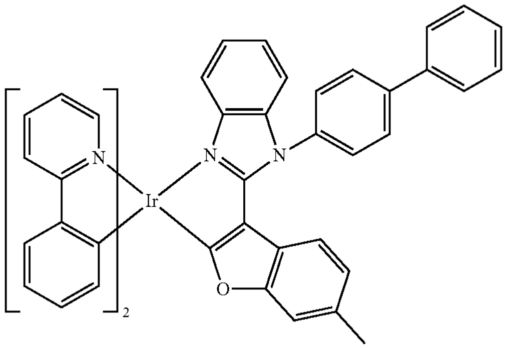
909
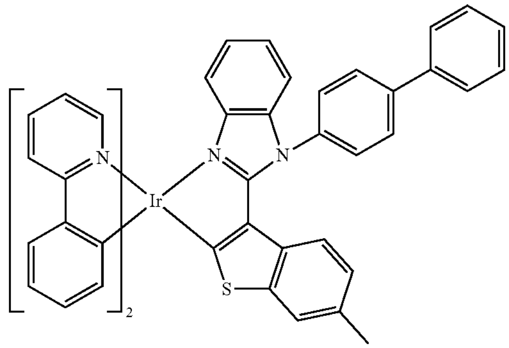
910
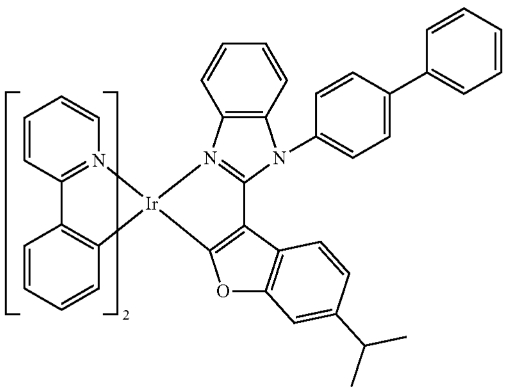
911
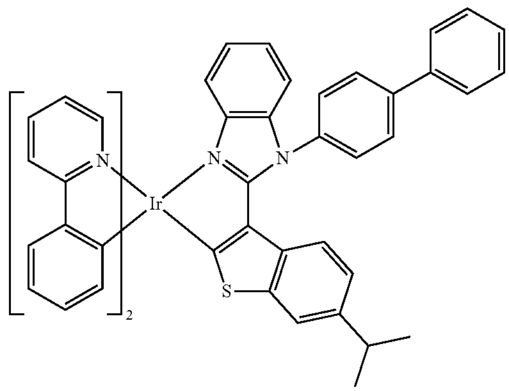
912
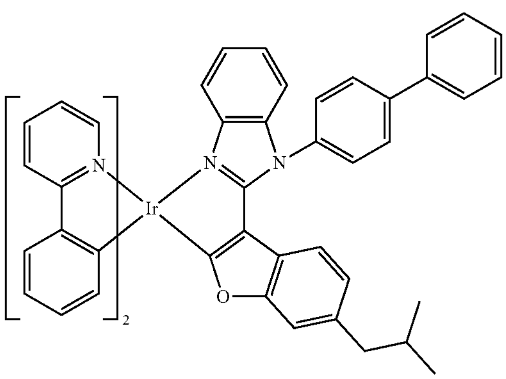
913
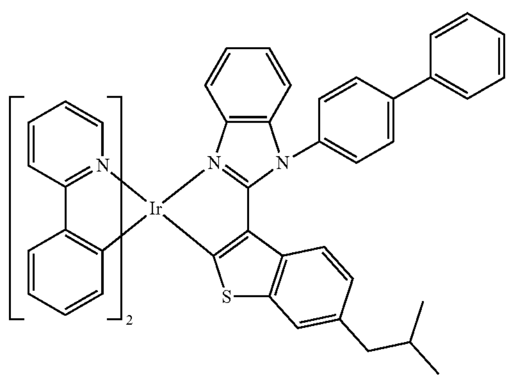
914
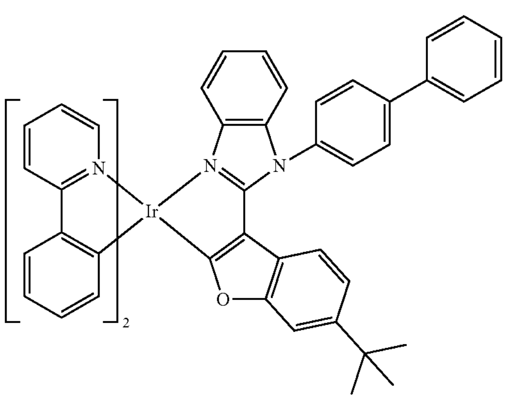
915
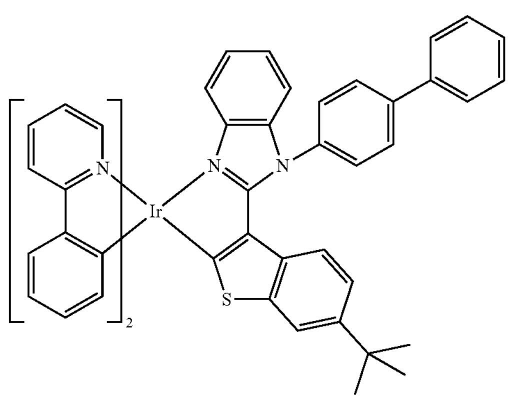

-continued
916
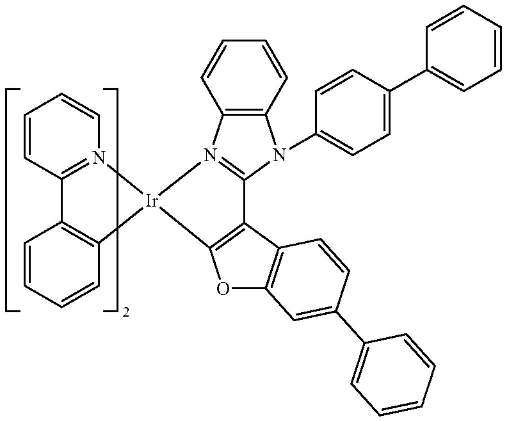
917
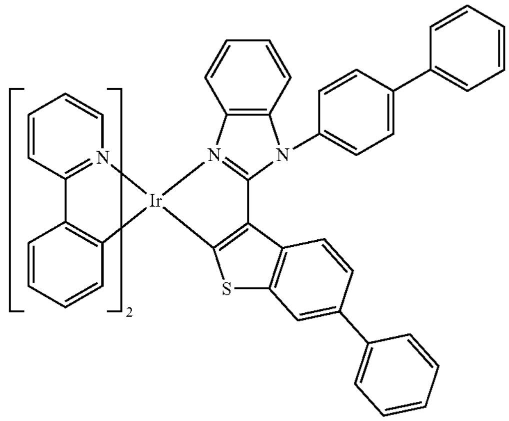
918
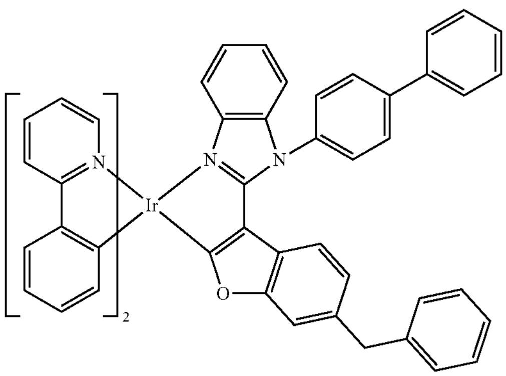
919
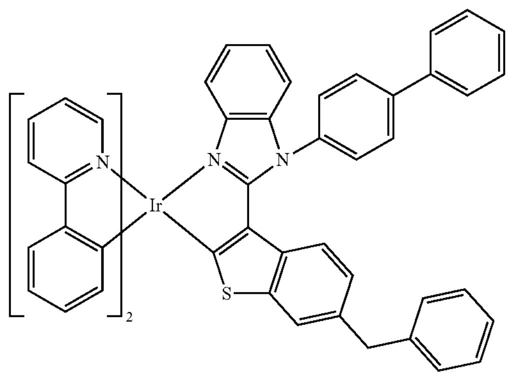
920
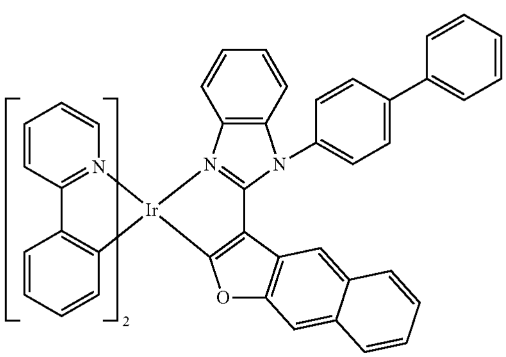
921
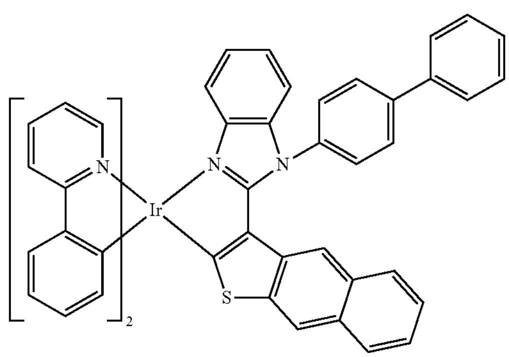
922
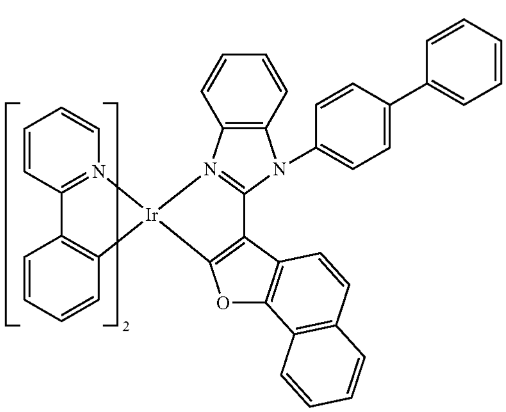
923
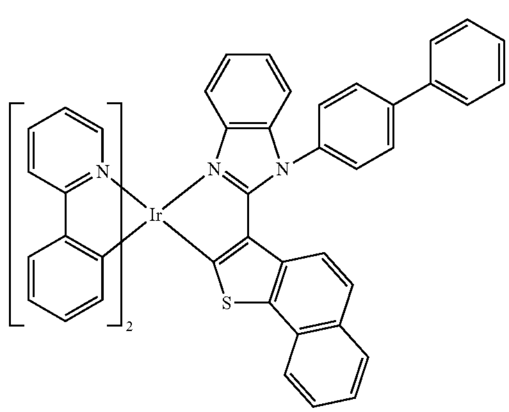

-continued
924
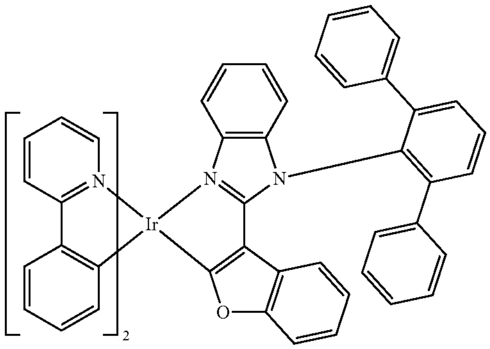
925
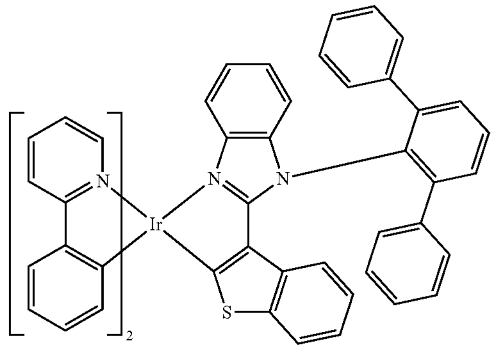
926
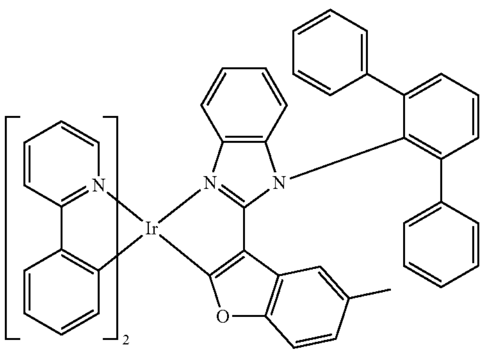
927
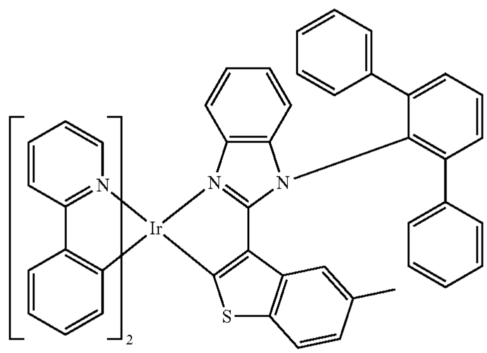
928
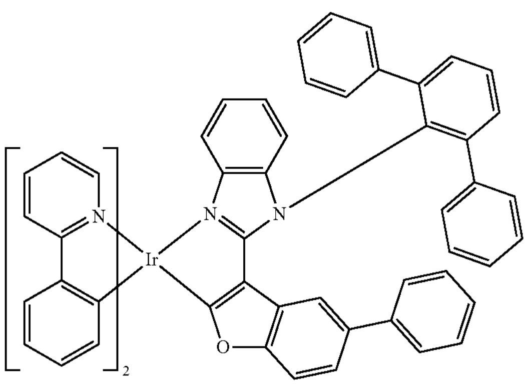
929
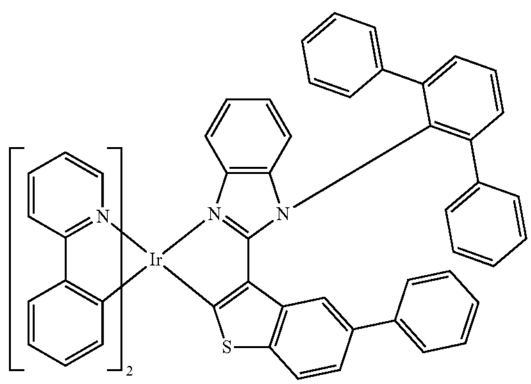
930
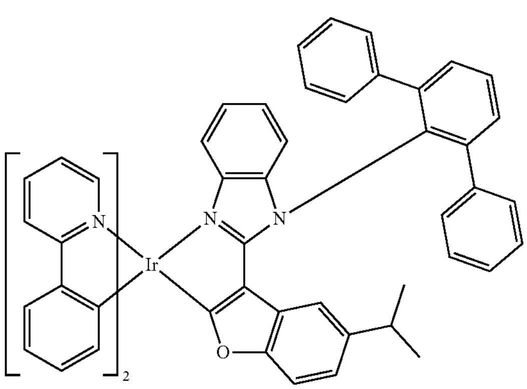
931
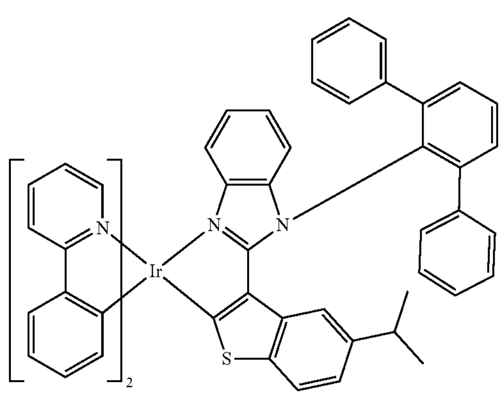

-continued
932
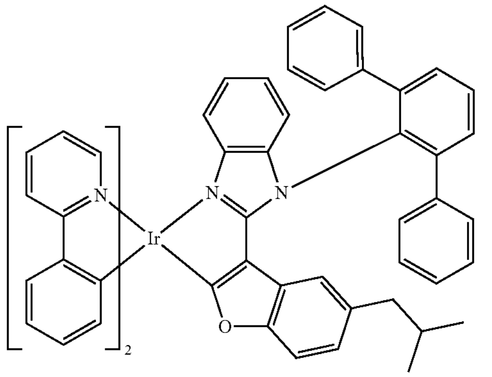
933
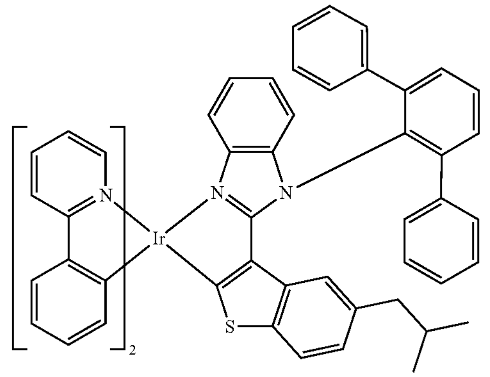
934
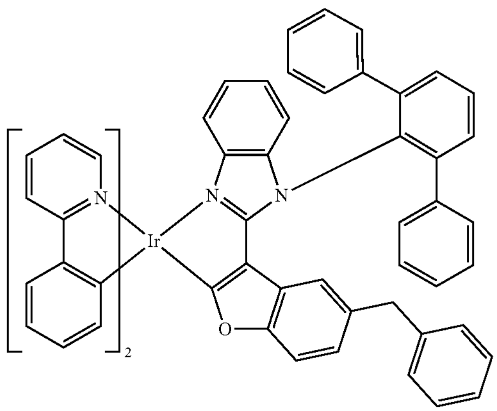
935
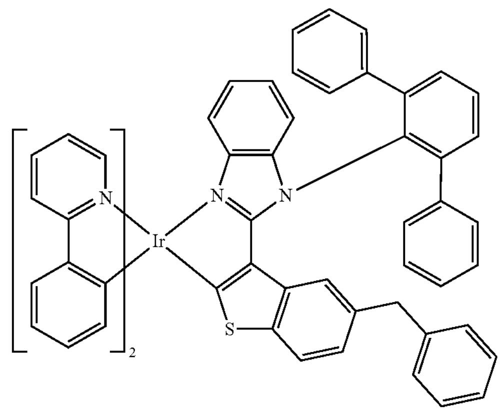
936
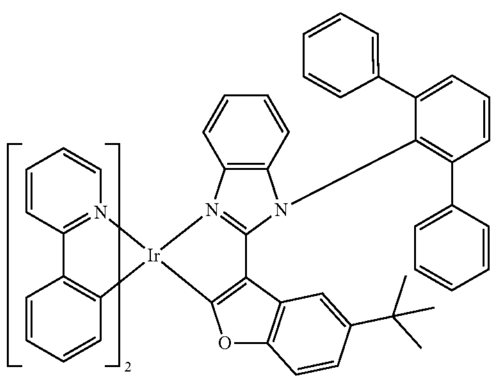
937
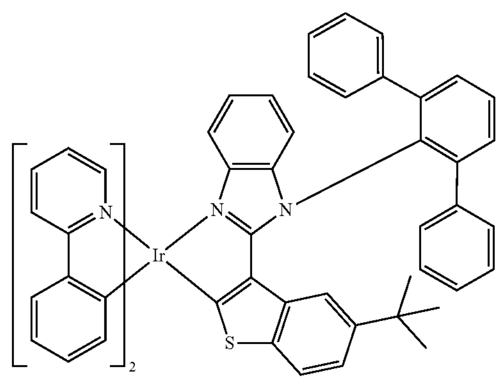
938
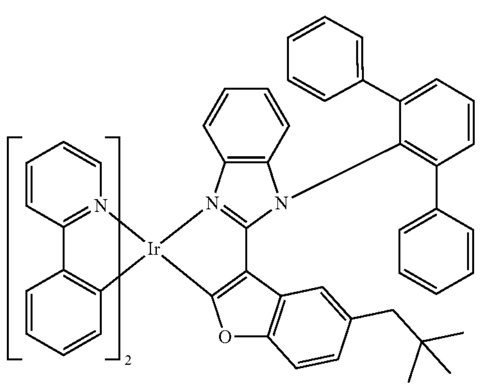
939
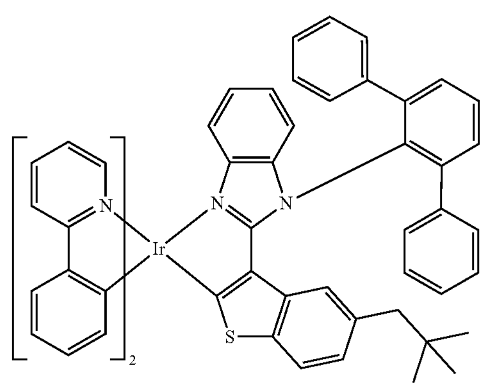

-continued
940
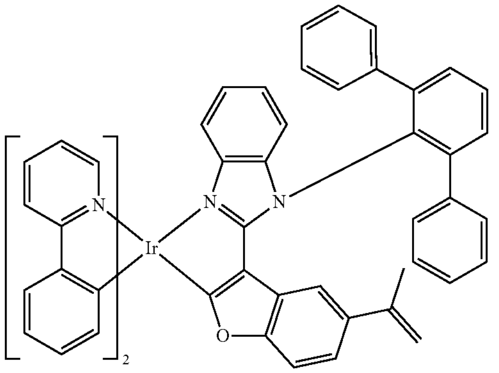
941
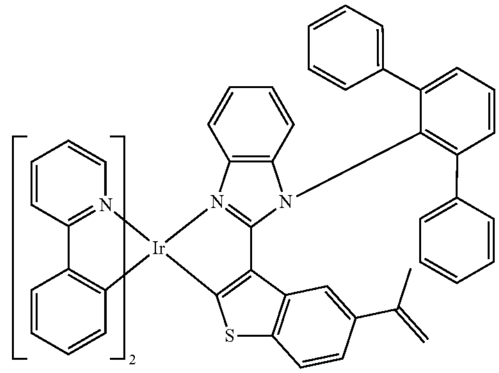
942
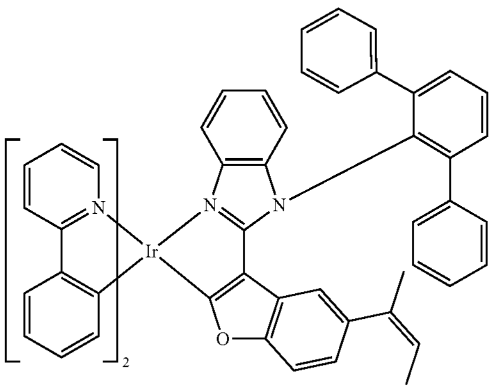
943
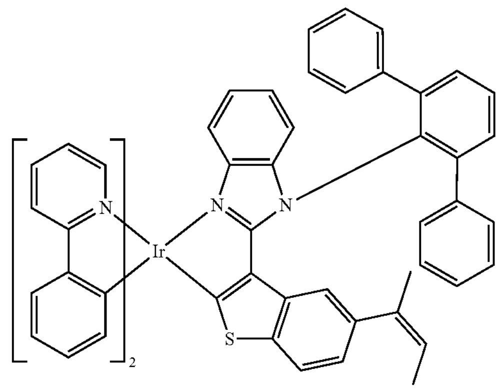
944
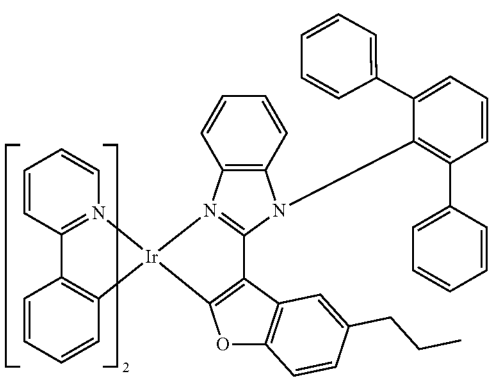
945
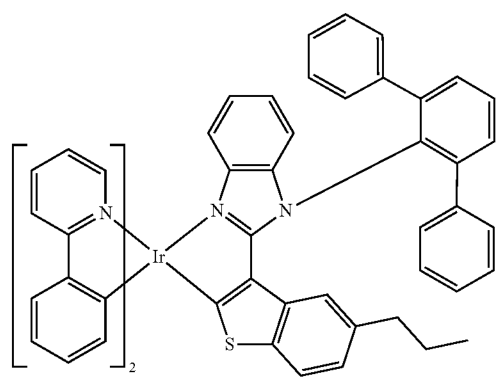
946
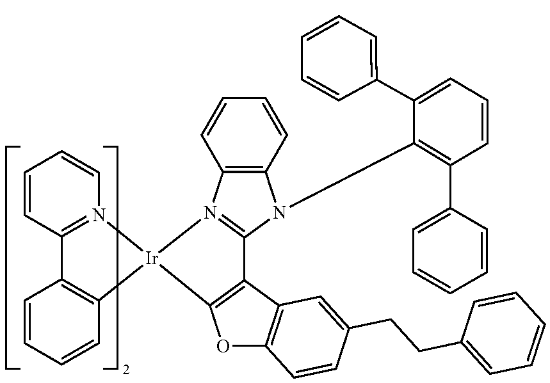

-continued
947
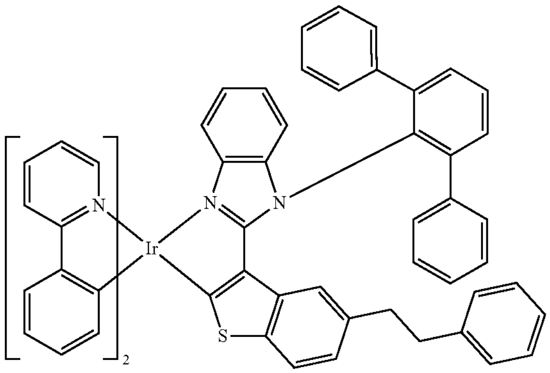
948
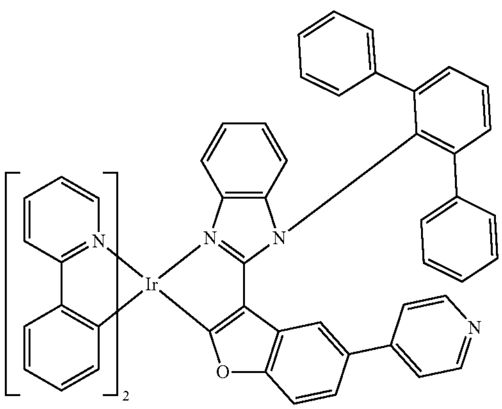
949
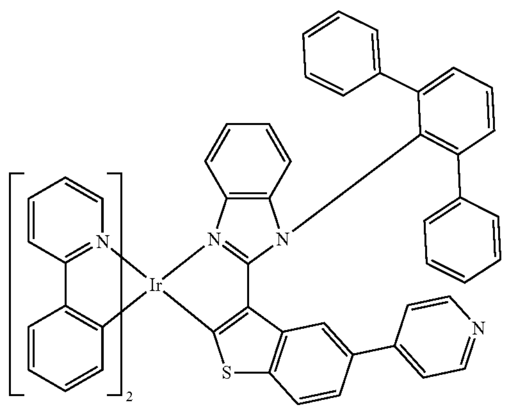
950
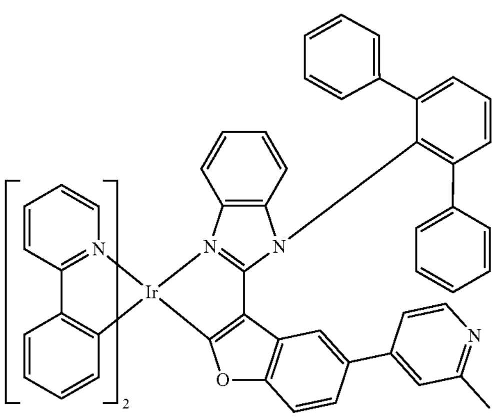
951
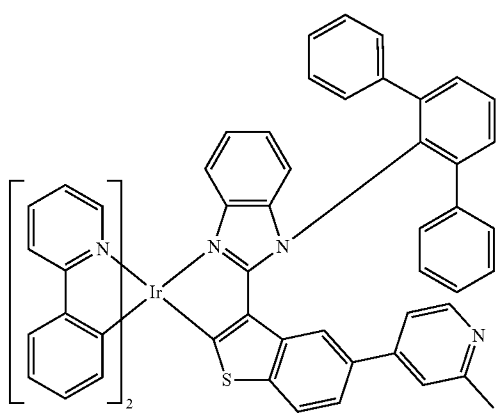
952
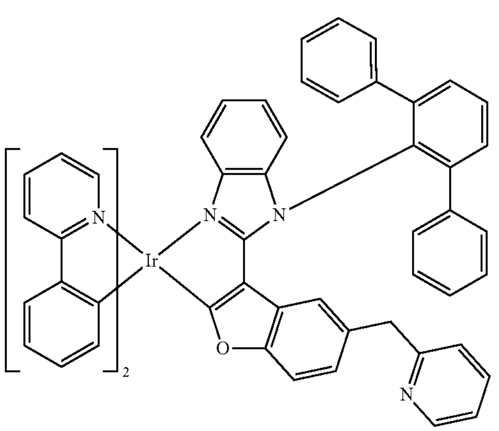
953
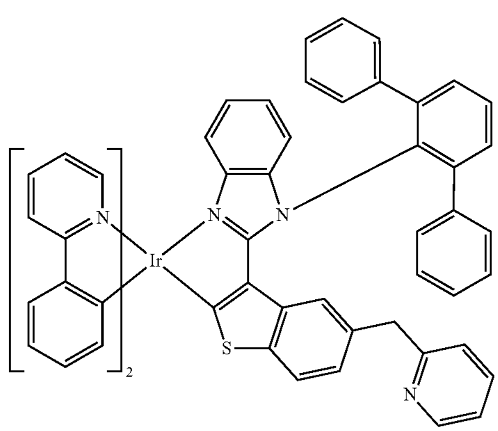

-continued
954
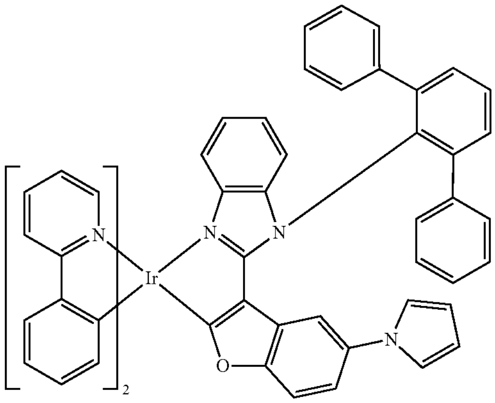
955
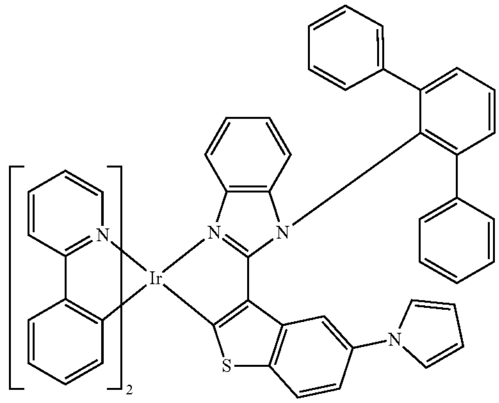
956
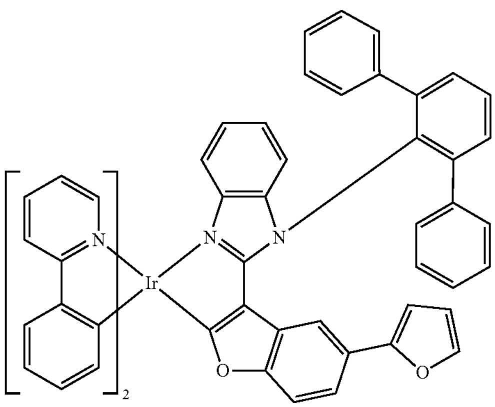
957
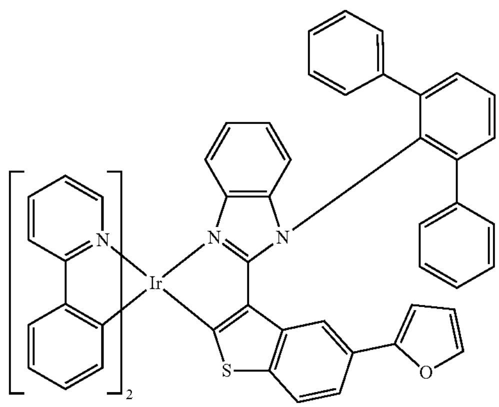
958
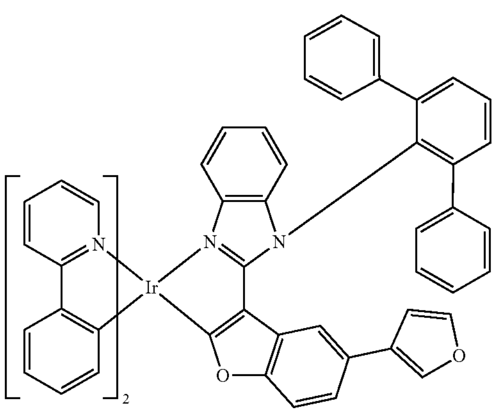
959
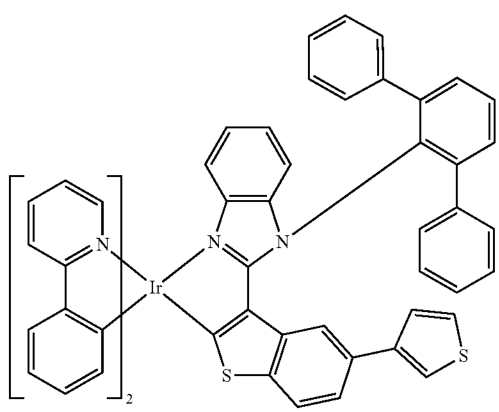

-continued
960
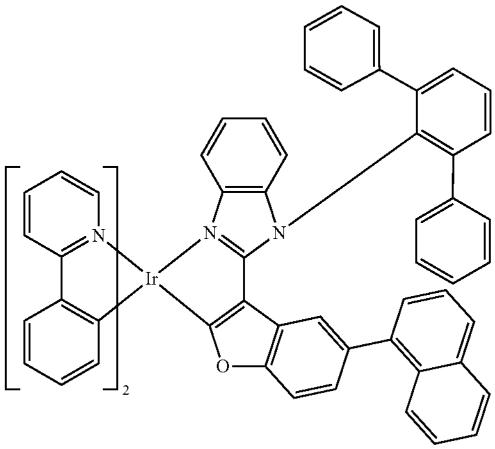
961
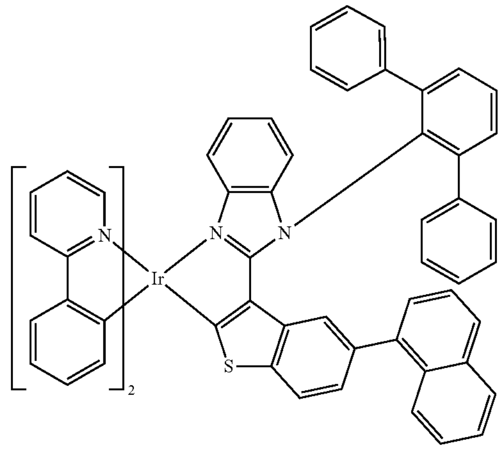
962
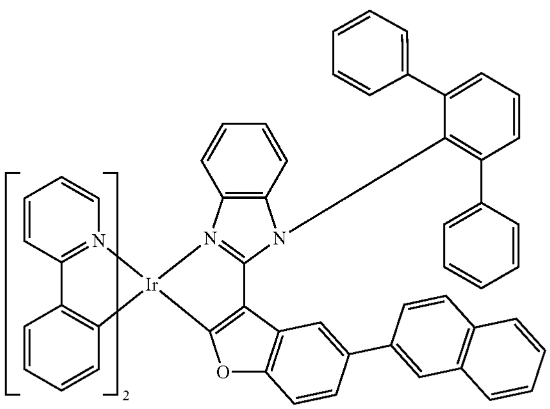
963
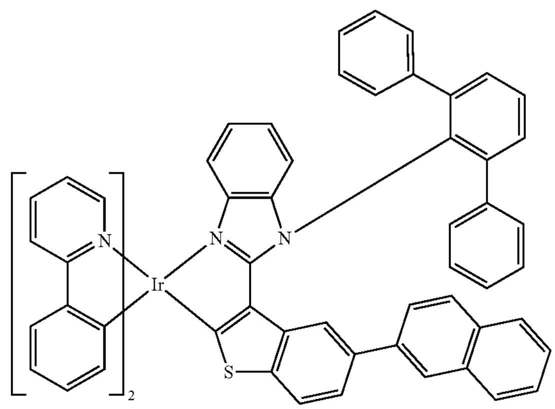
964
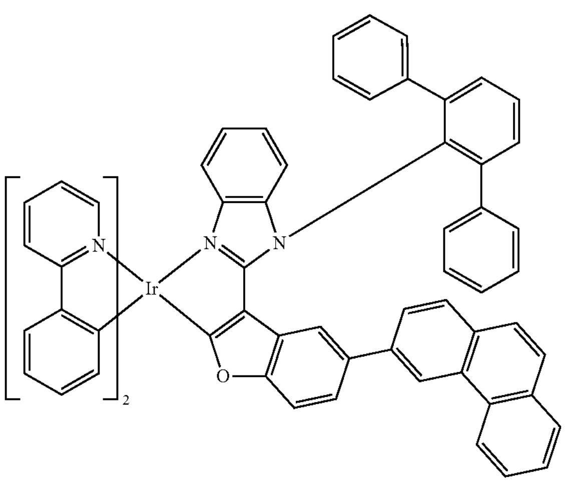

-continued
965
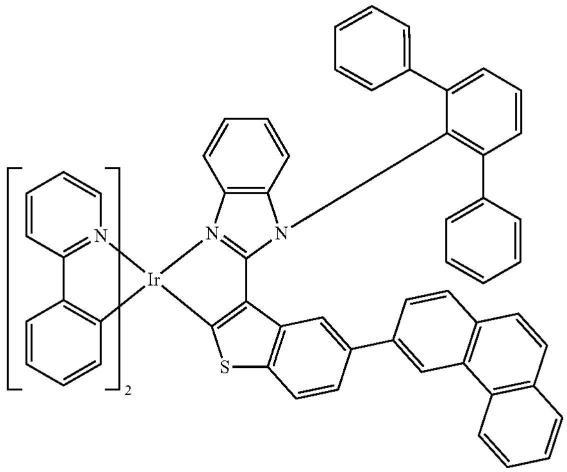
966
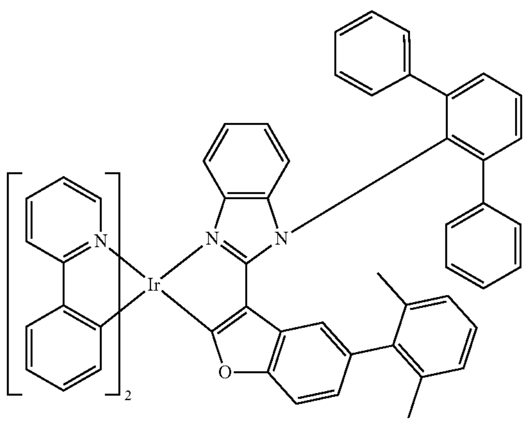
967
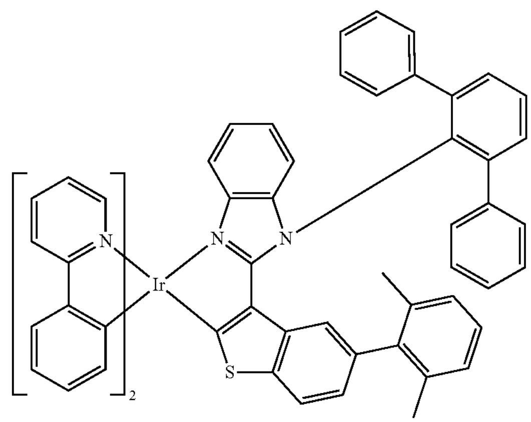
968
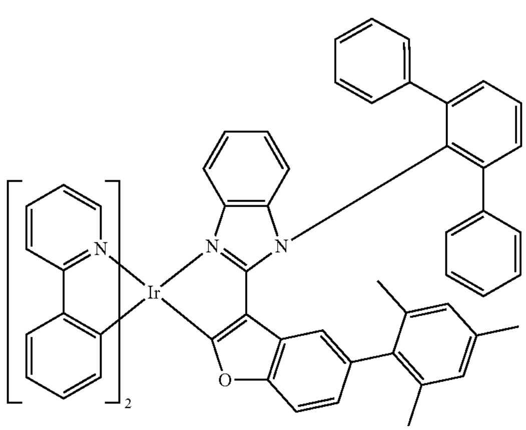
969
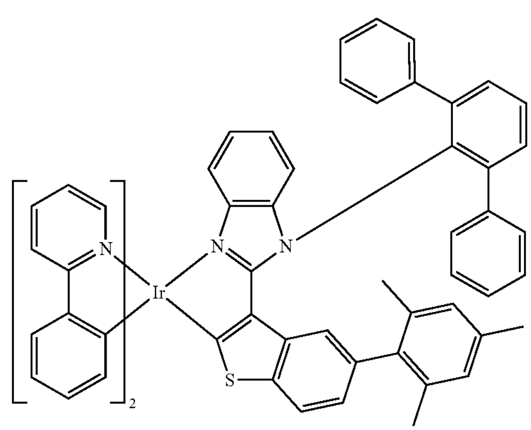

-continued
970
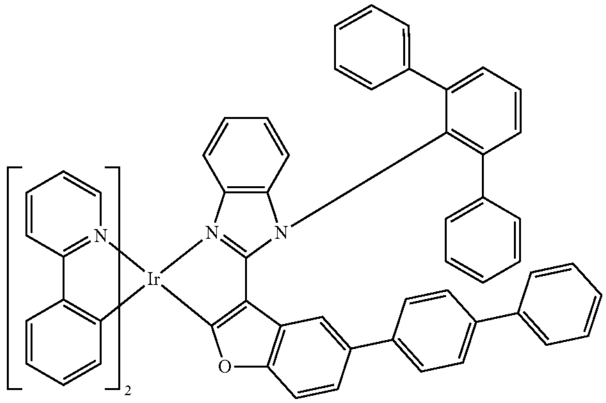
971
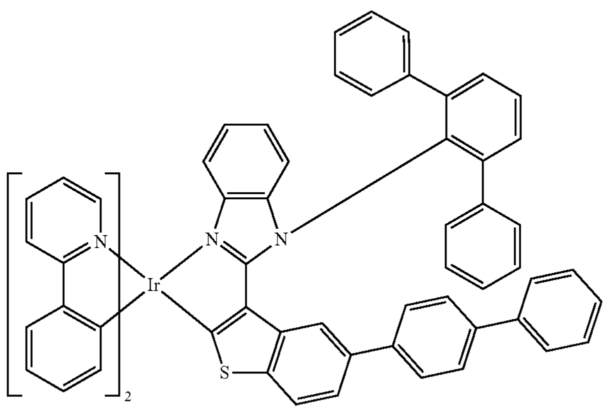
972
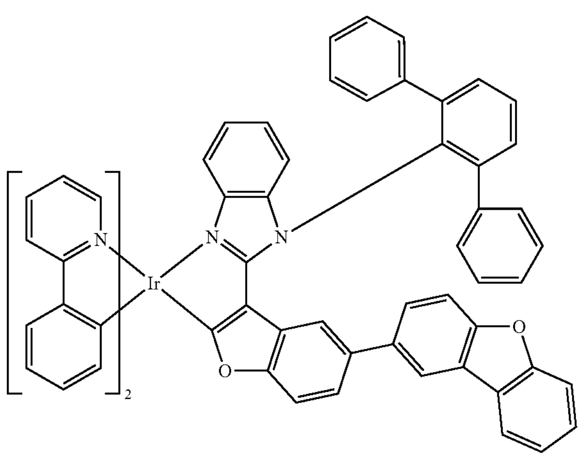

-continued
973
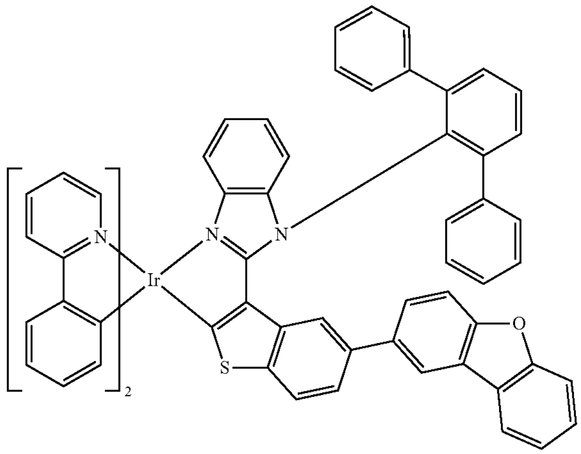
974
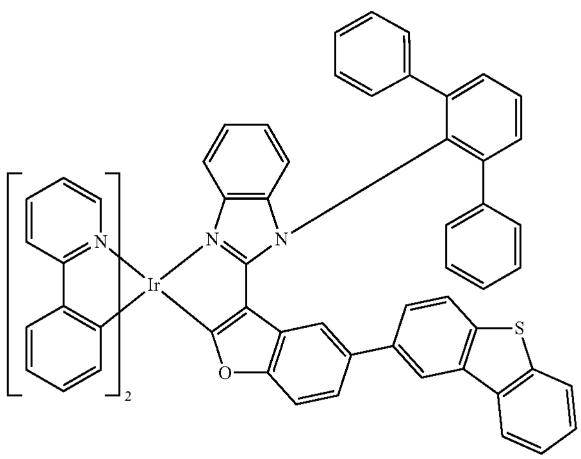
975
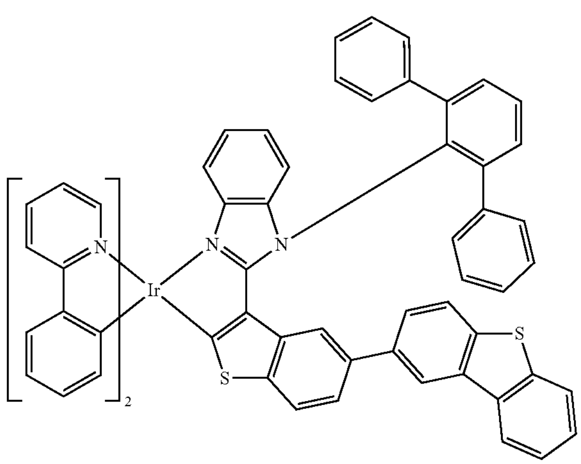

-continued
976
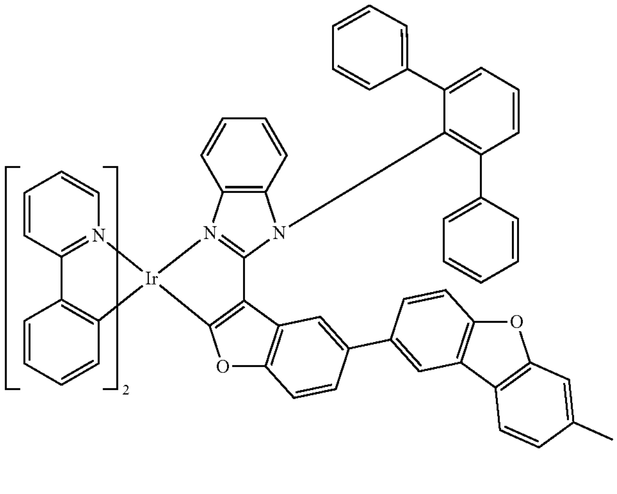
977
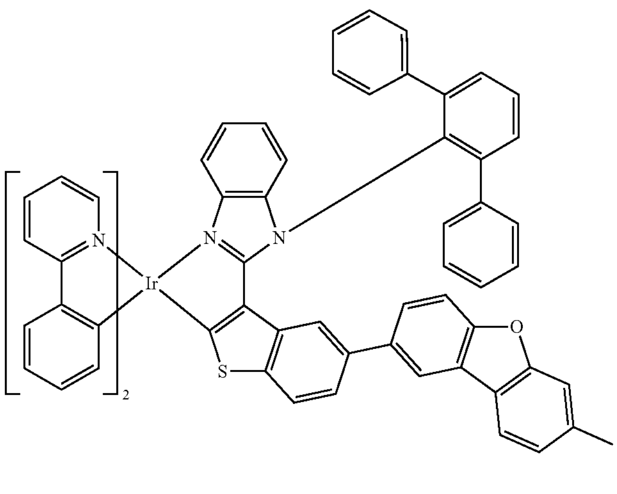
978
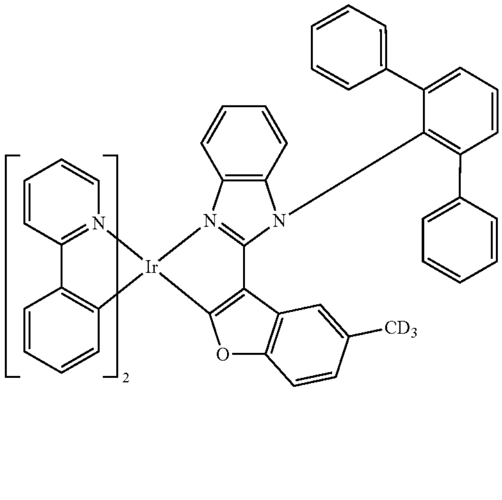
979
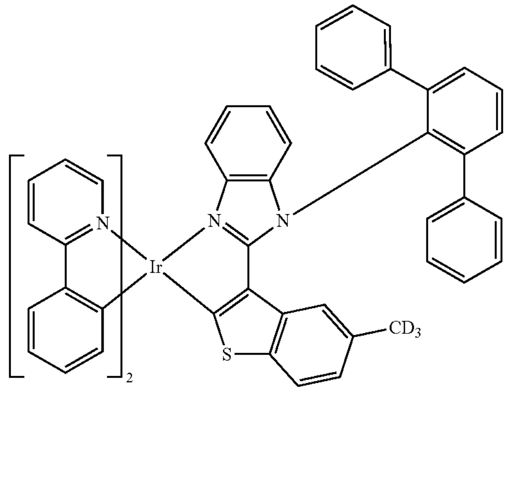

-continued
980
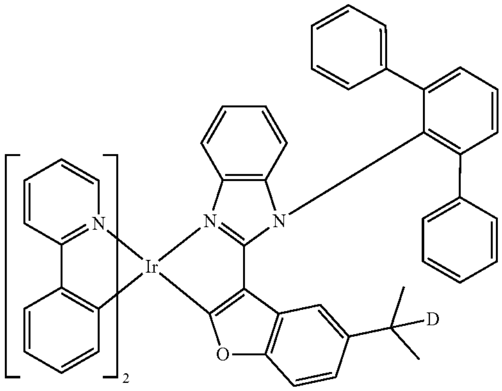
981
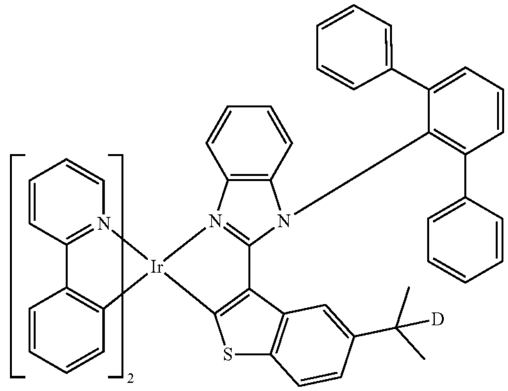
982
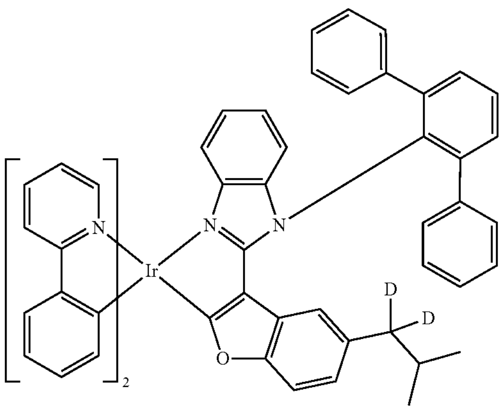
983
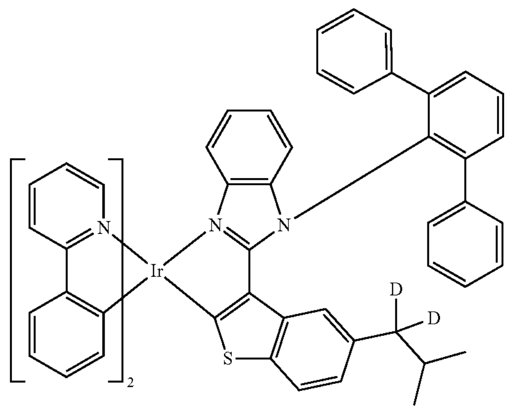
984
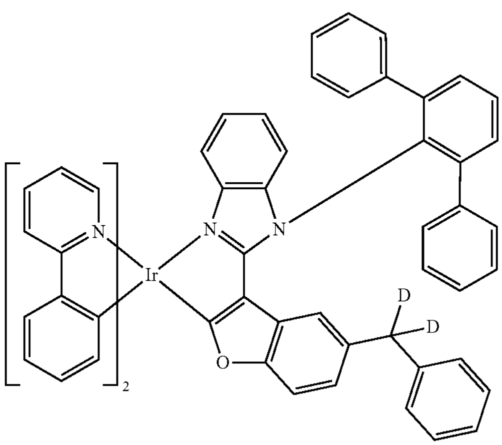
985
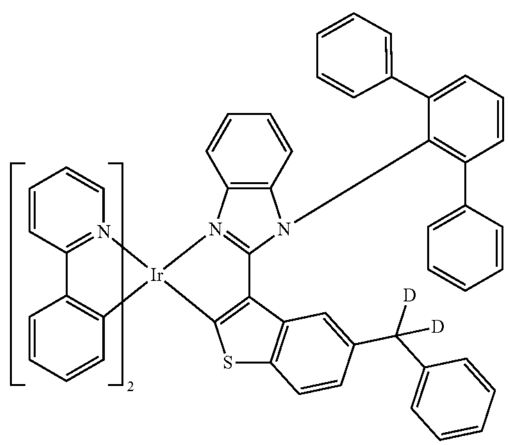
986
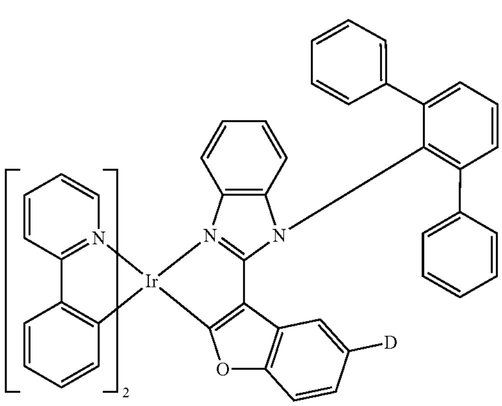
987
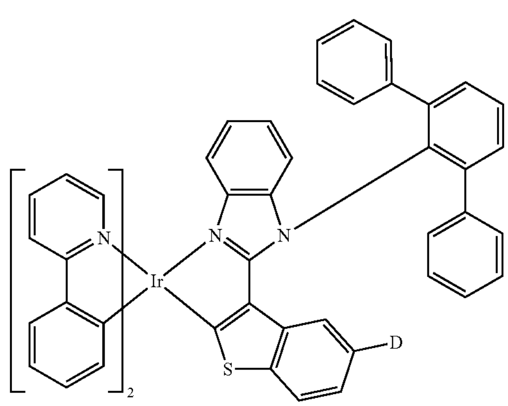

-continued
988
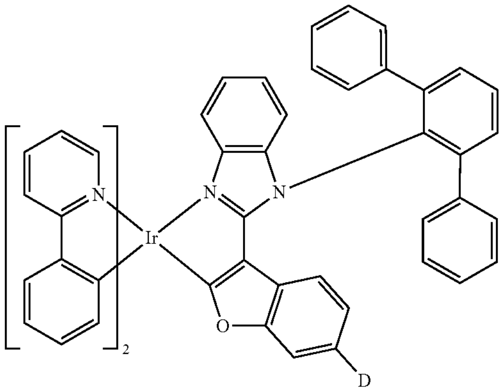
989
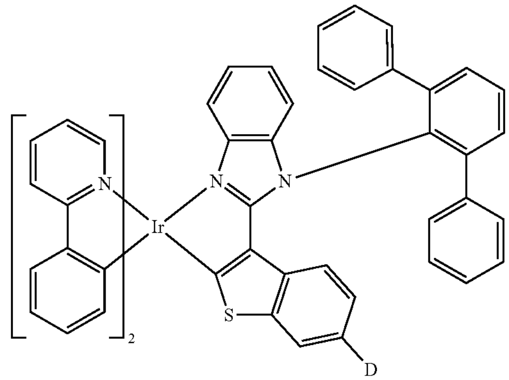
990
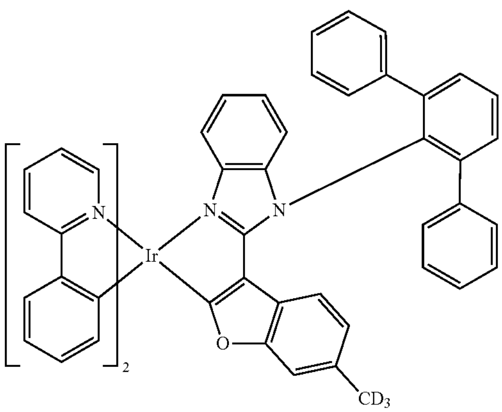
991
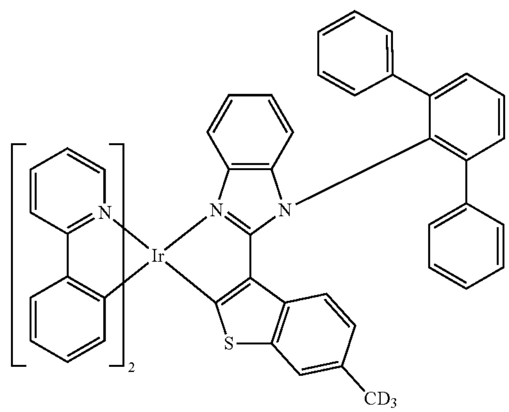
992
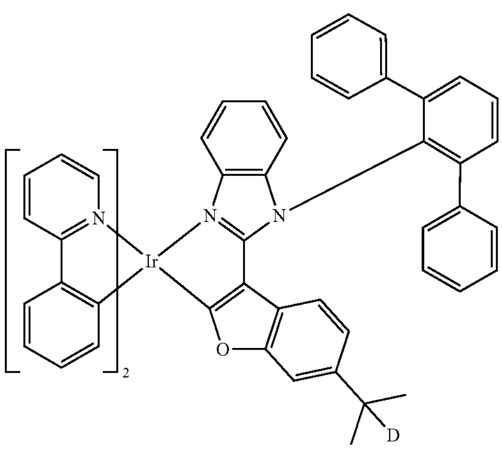
993
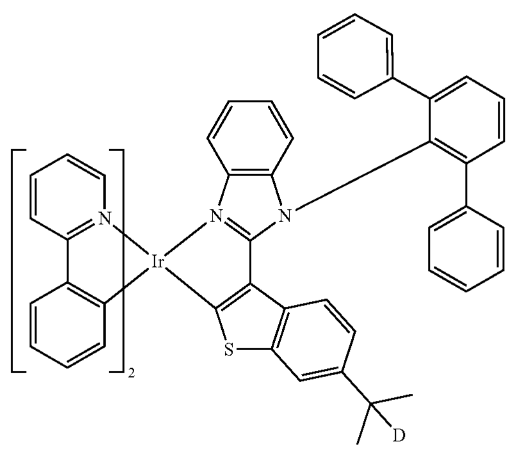

-continued
994
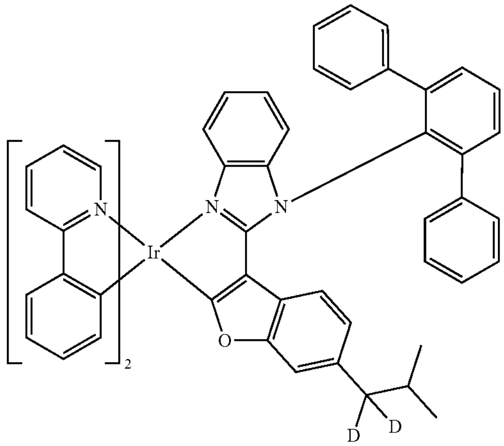
995
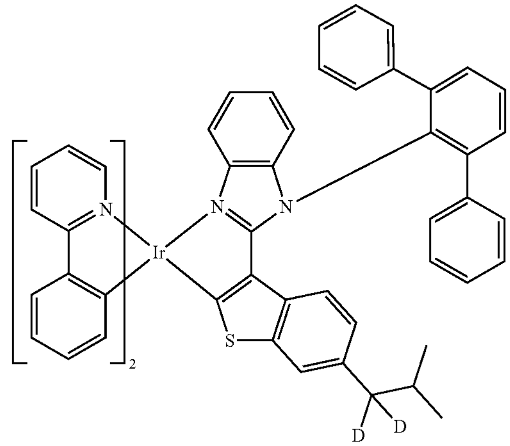
996
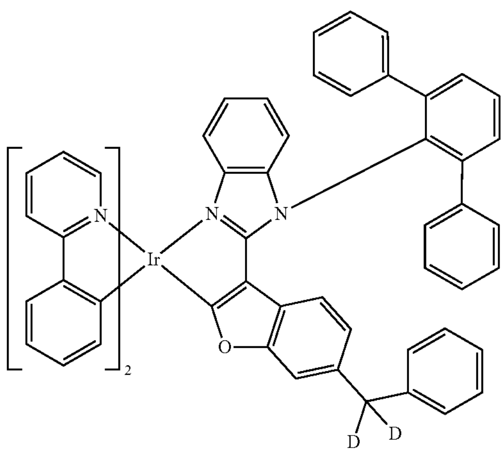
997
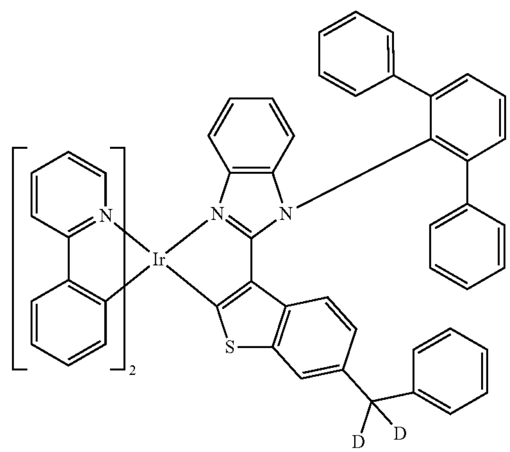
998
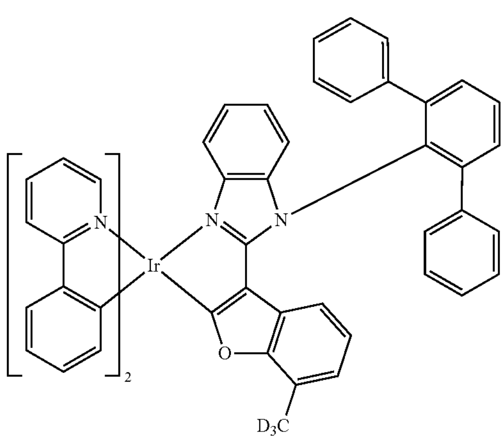
999
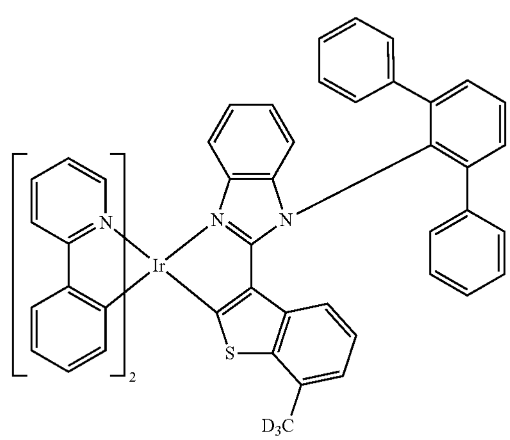

-continued
1000
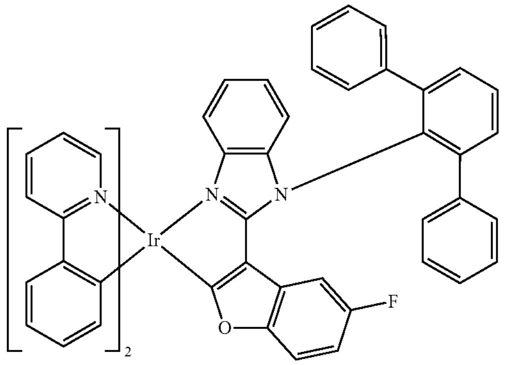
1001
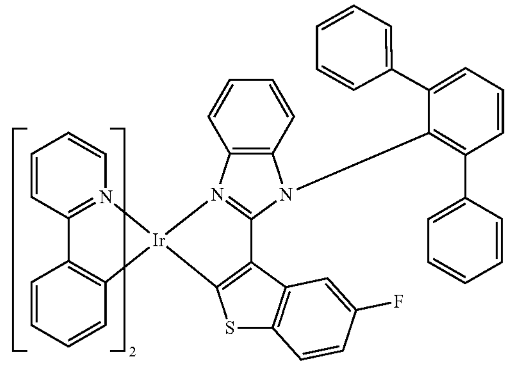
1002
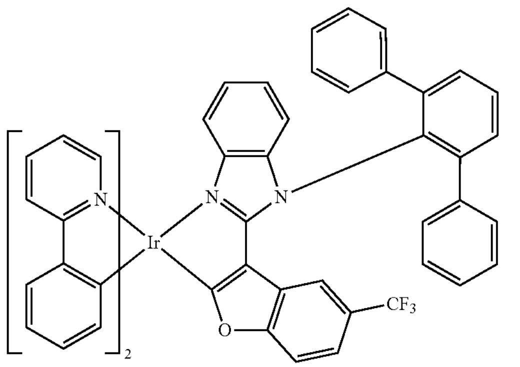
1003
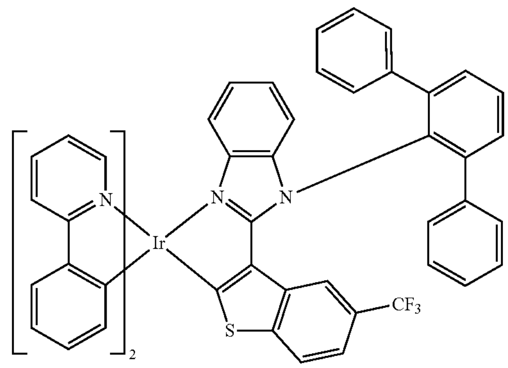
1004
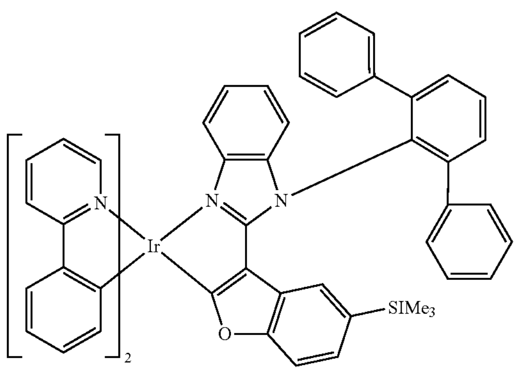
1005
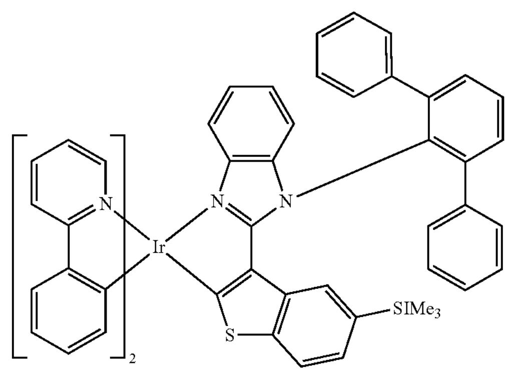
1006
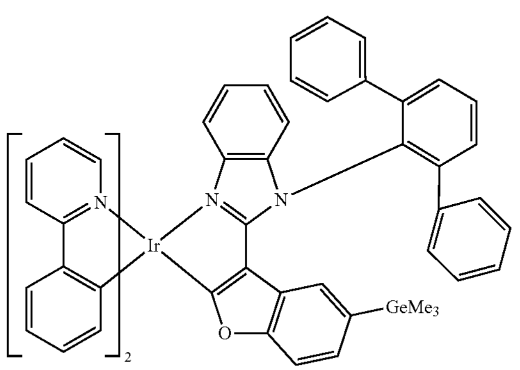
1007
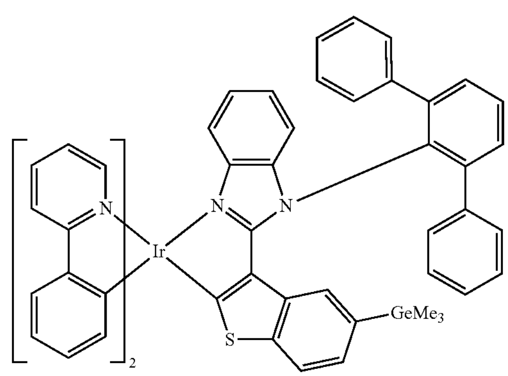

-continued
1008
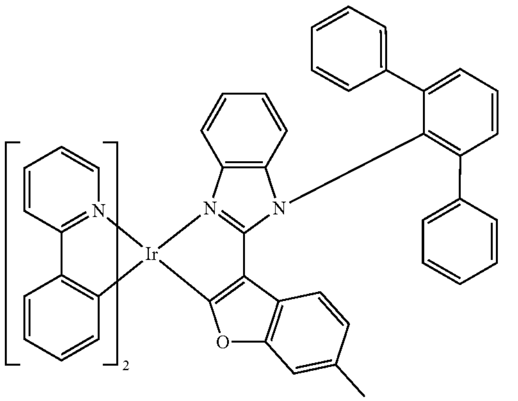
1009
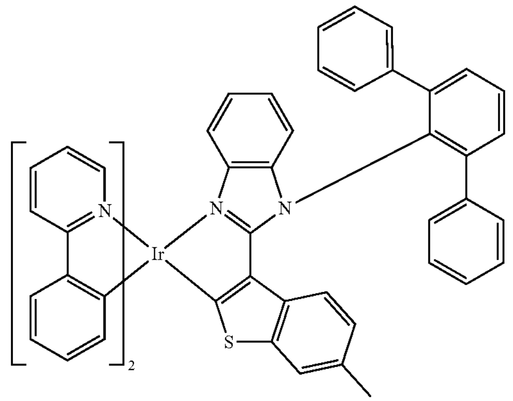
1010
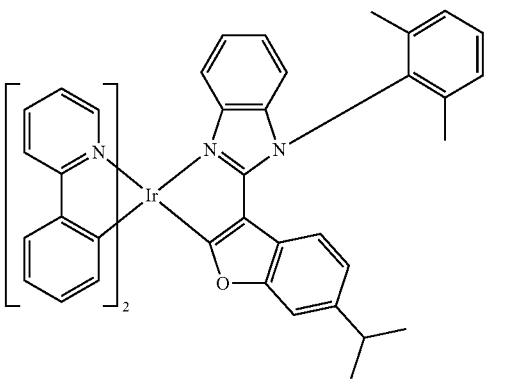
1011
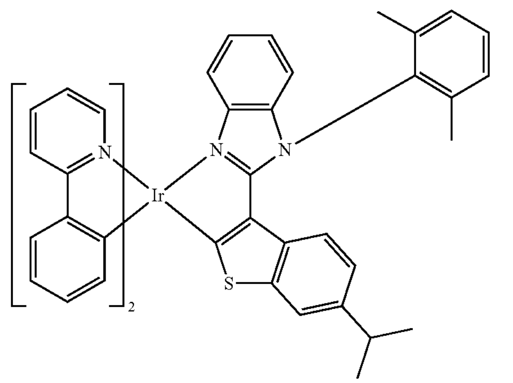
1012
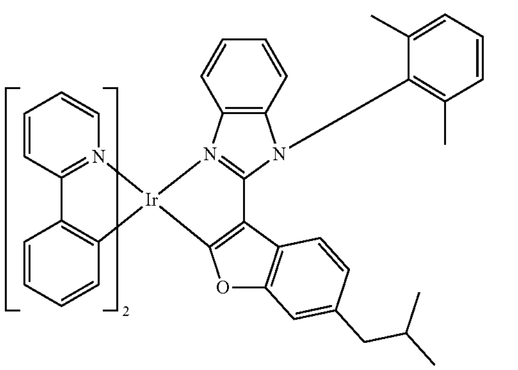
1013
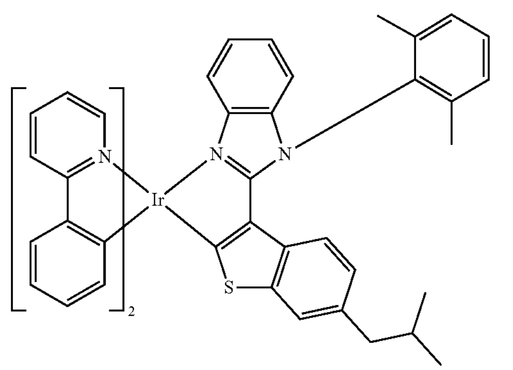
1014
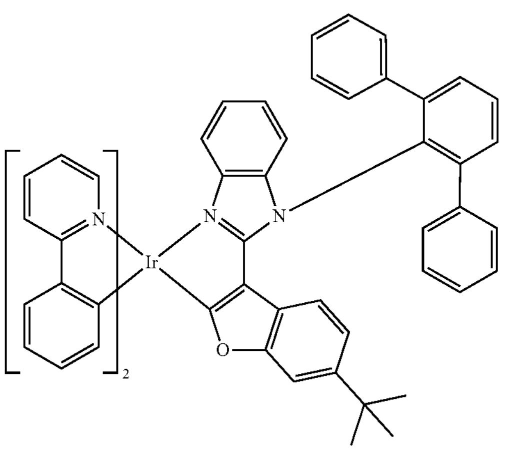
1015
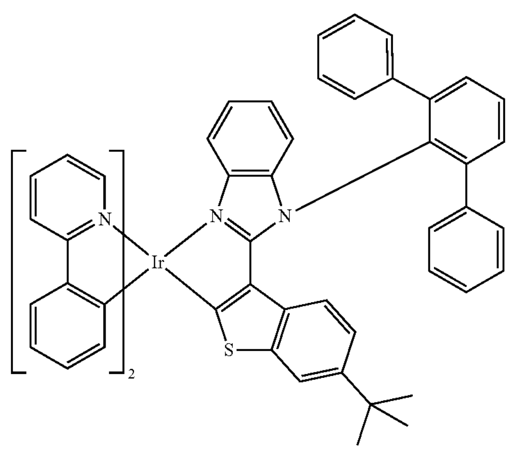

-continued
1016
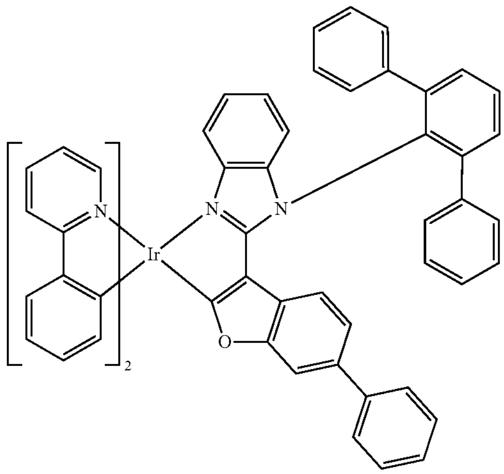
1017
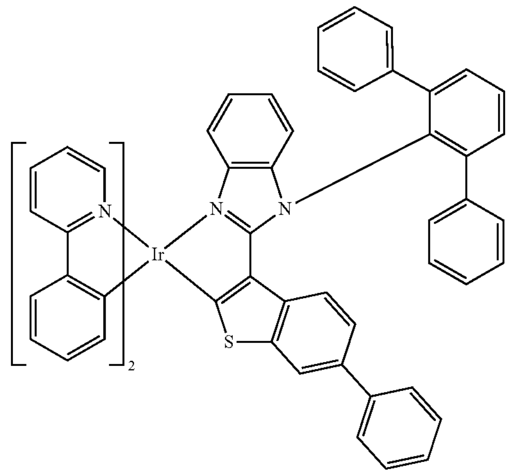
1018
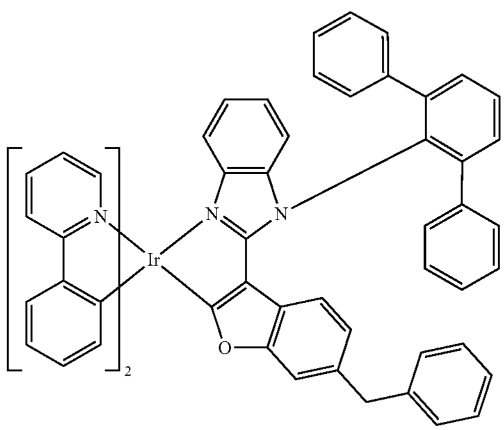
1019
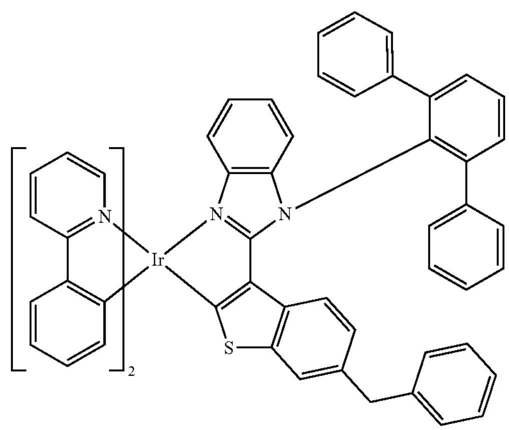
1020
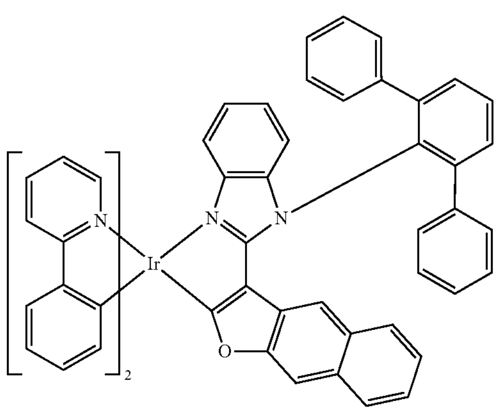
1021
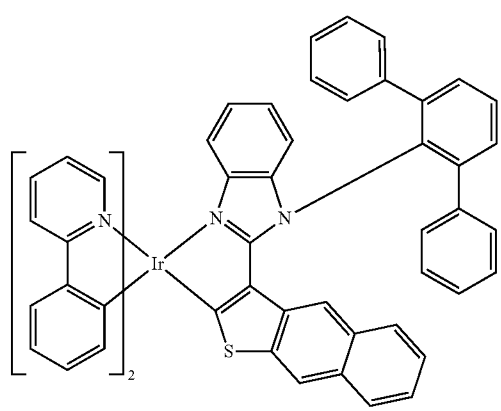

-continued
1022
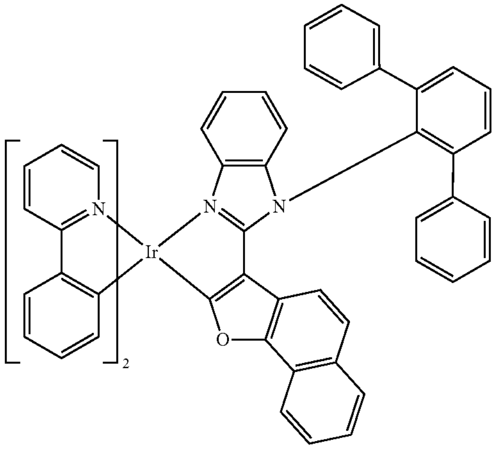
1023
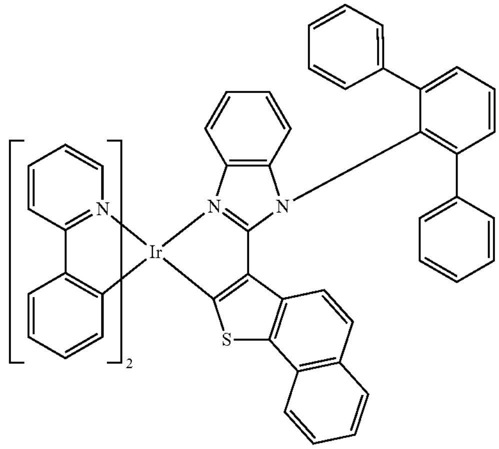
1024
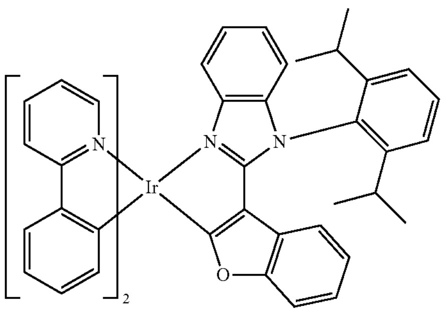
1025
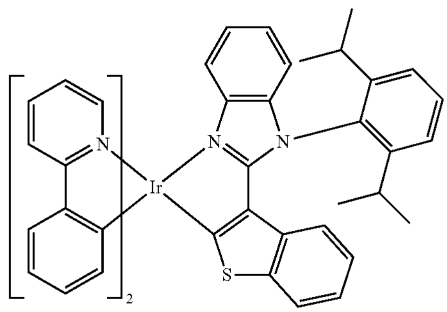
1026
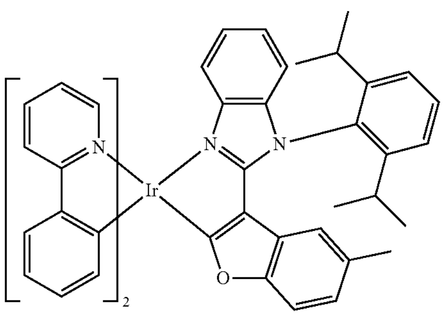
1027
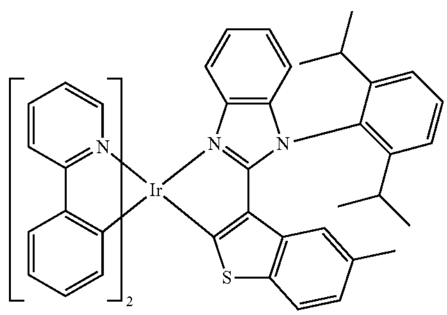
1028
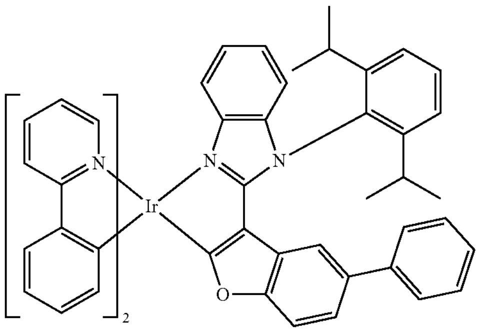
1029
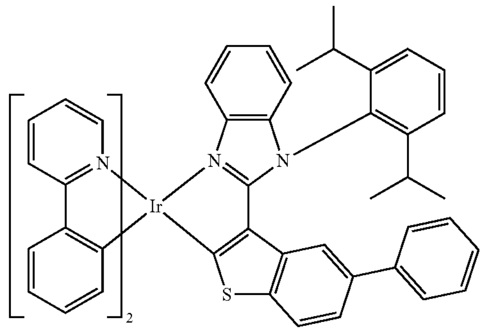

-continued
1030
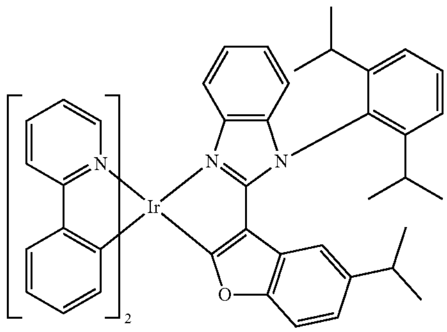
1031
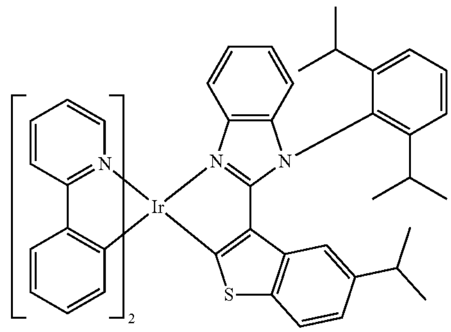
1032
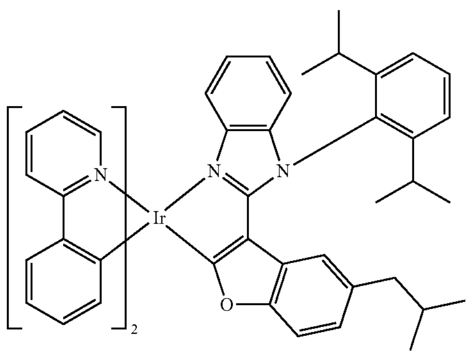
1033
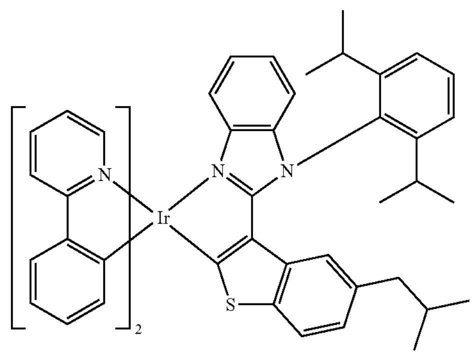
1034
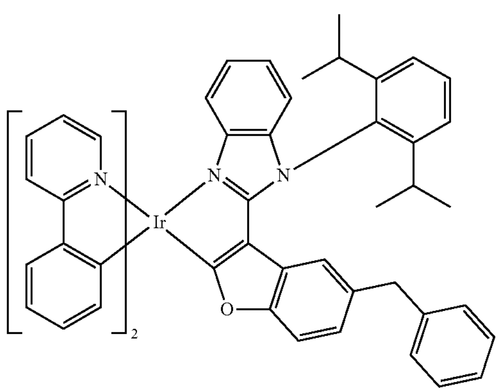
1035
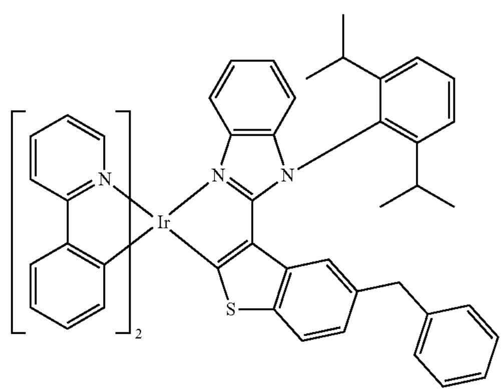
1036
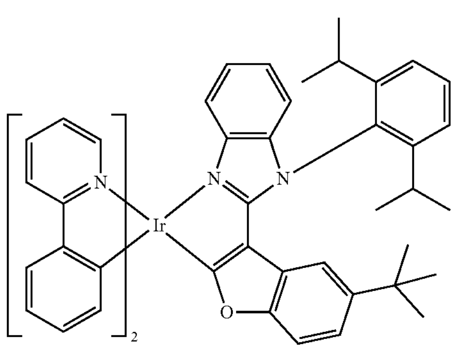
1037
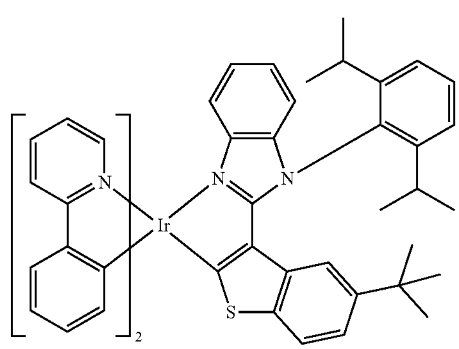

-continued
1038
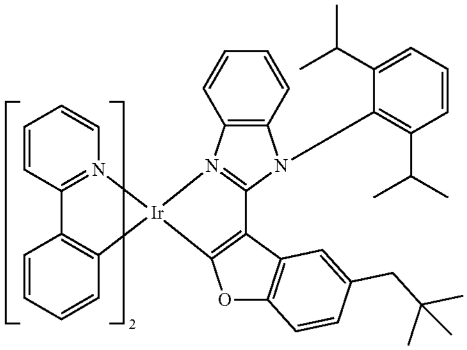
1039
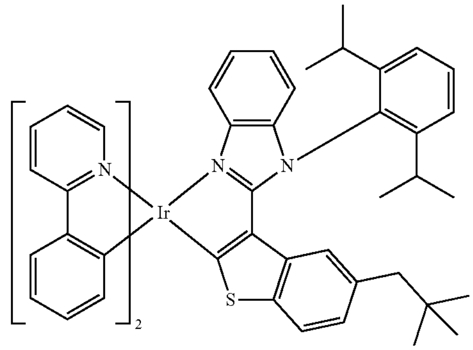
1040
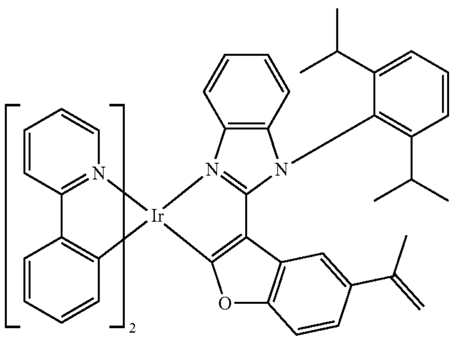
1041
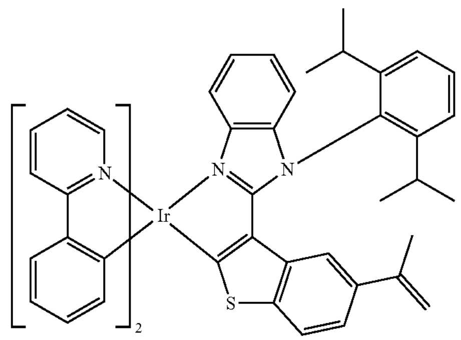
1042
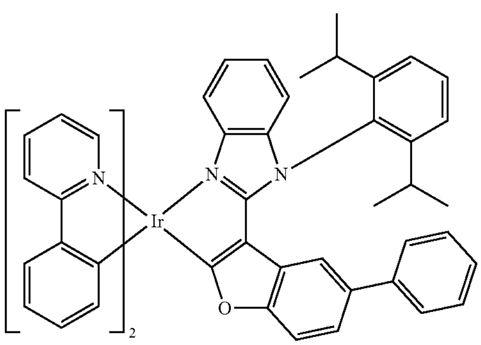
1043
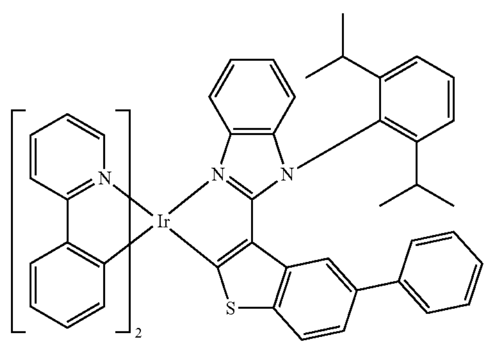
1044
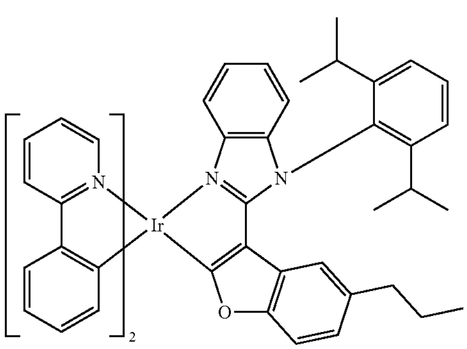
1045
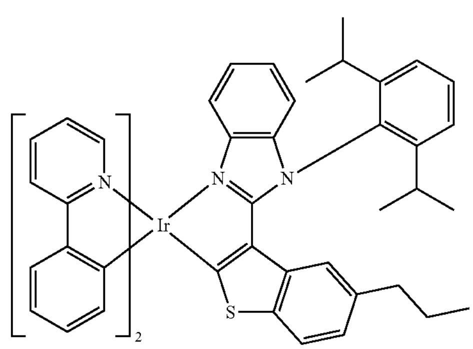

-continued
1046
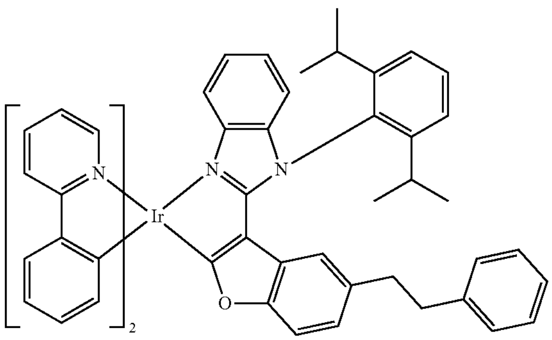
1047
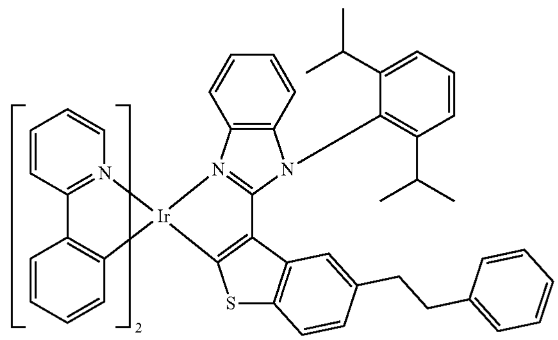
1048
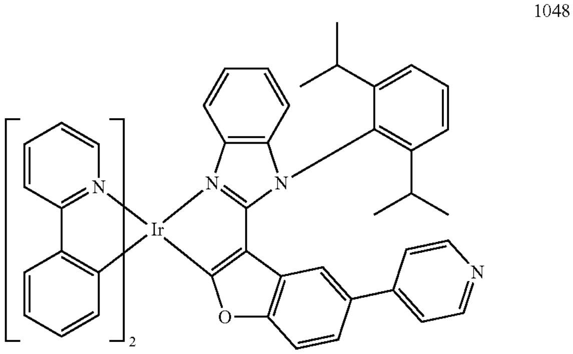
1049
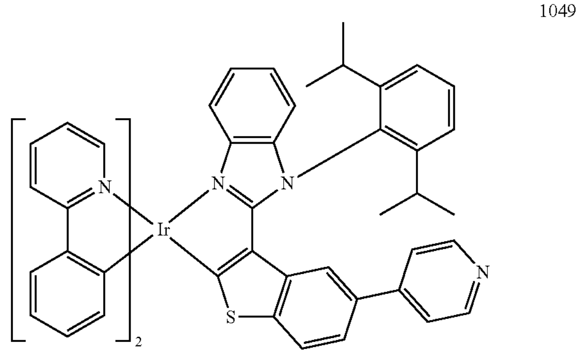
1050
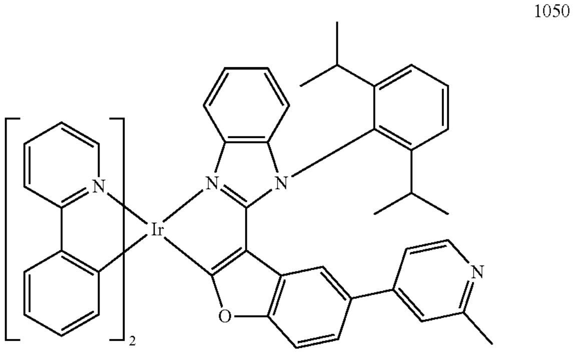
1051
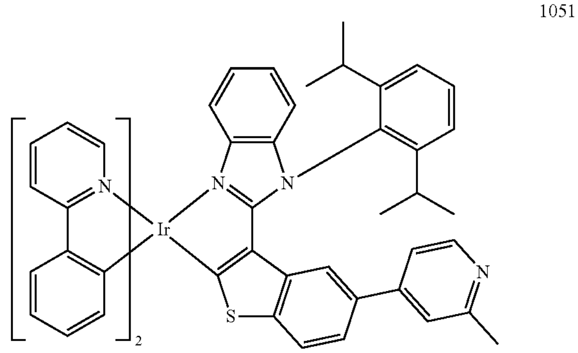
1052
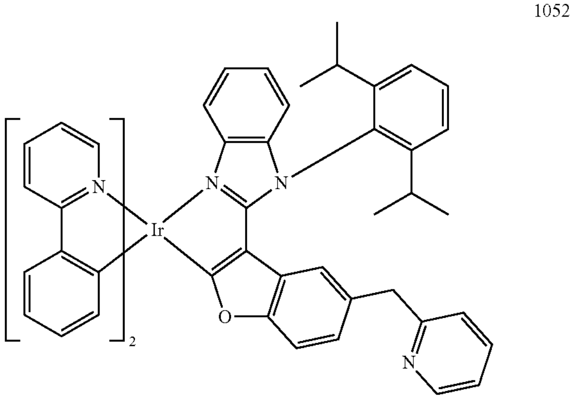
1053
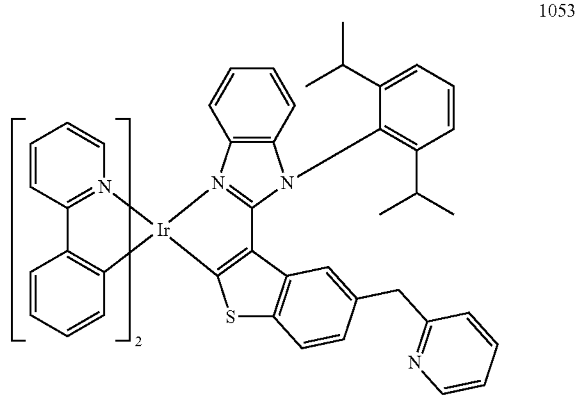

-continued
1054
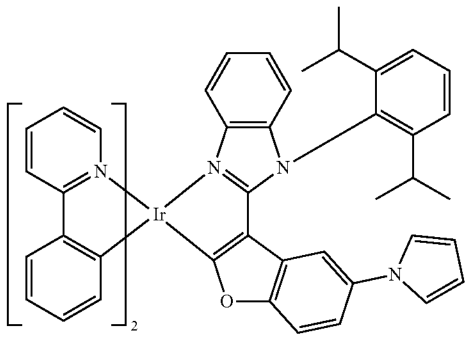
1055
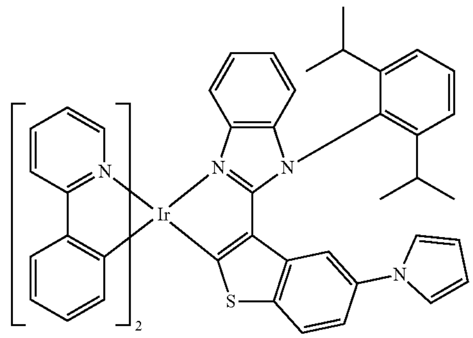
1056
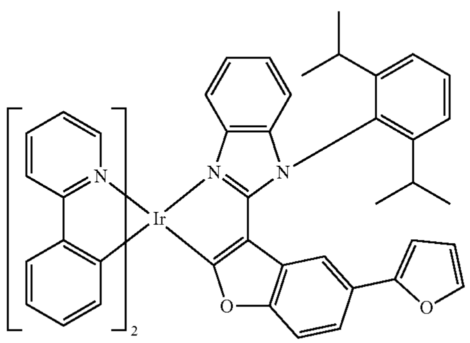
1057
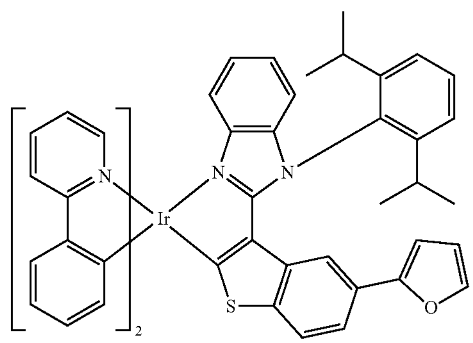
1058
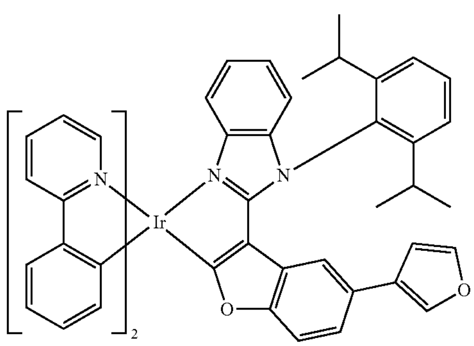
1059
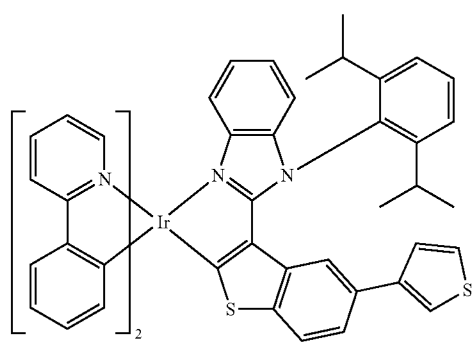
1060
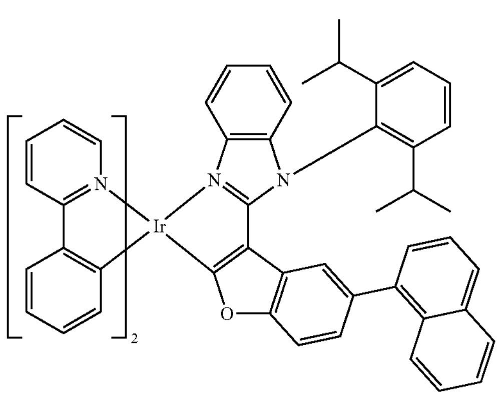
1061
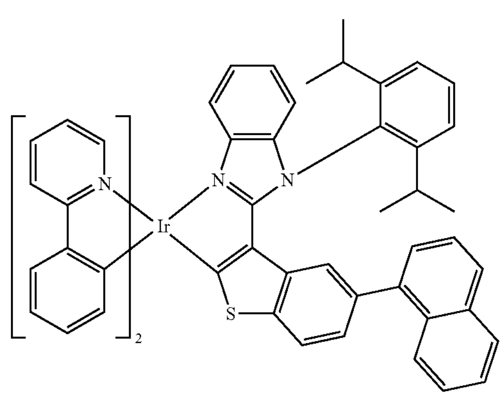

-continued
1062
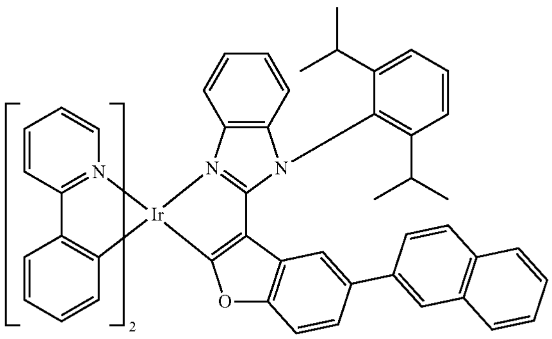
1063
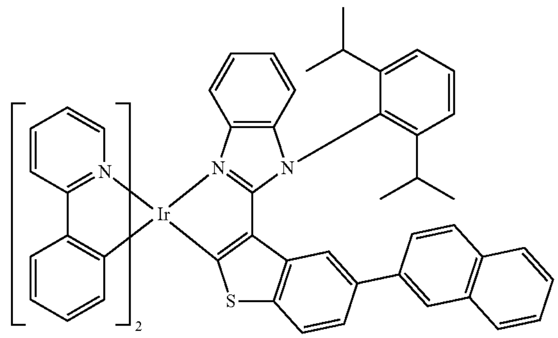
1064
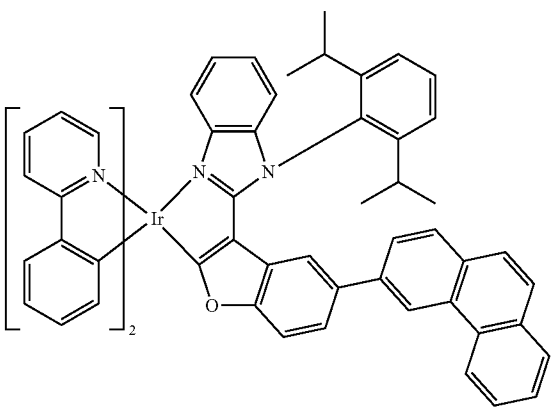
1065
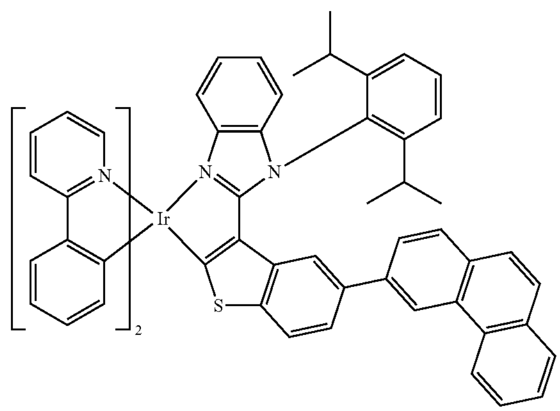
1066
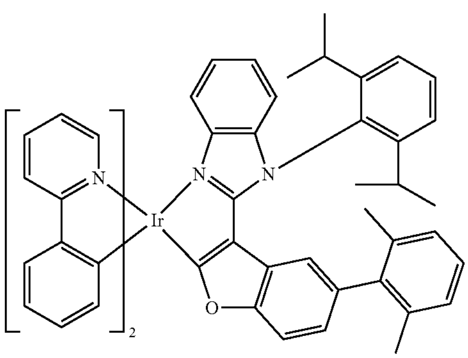
1067
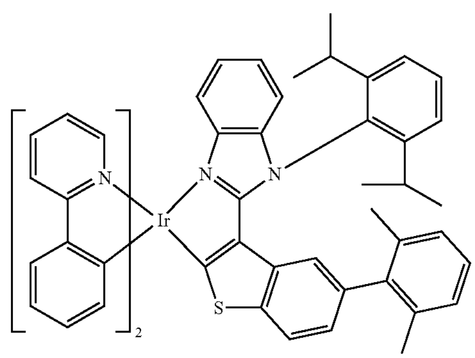
1068
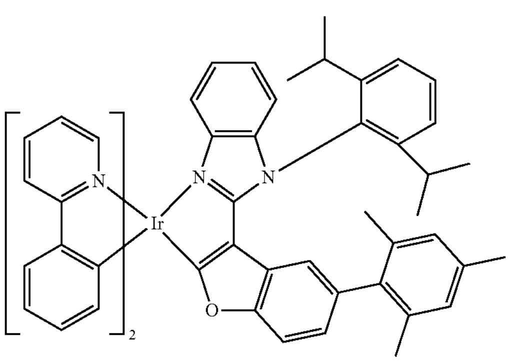
1069
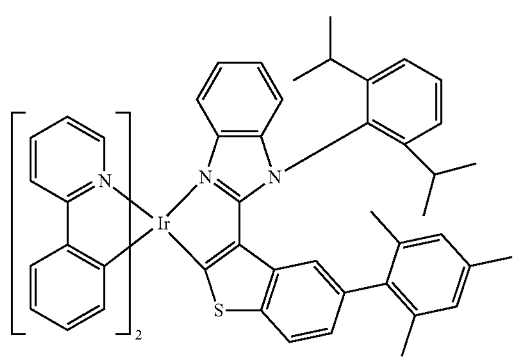

-continued
1070
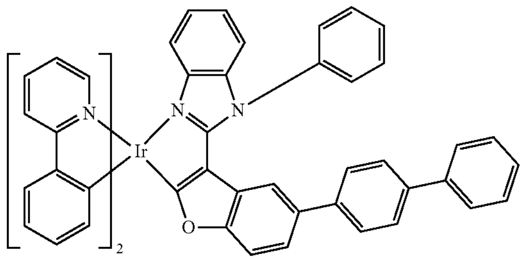
1071
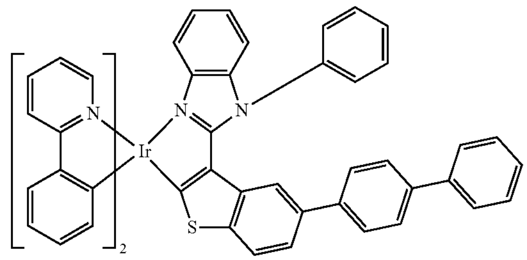
1072
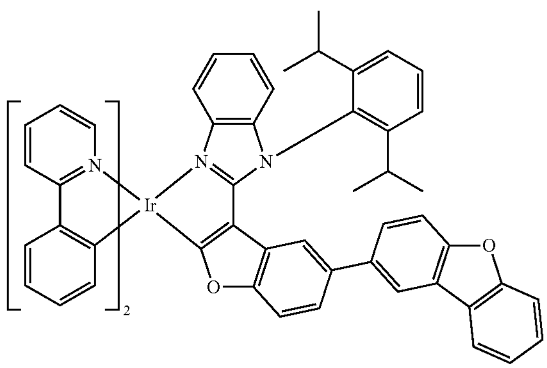
1073
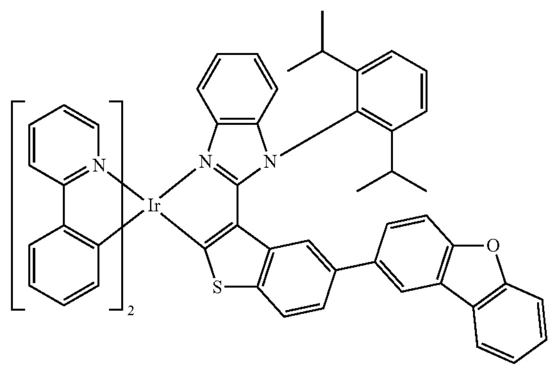
1074
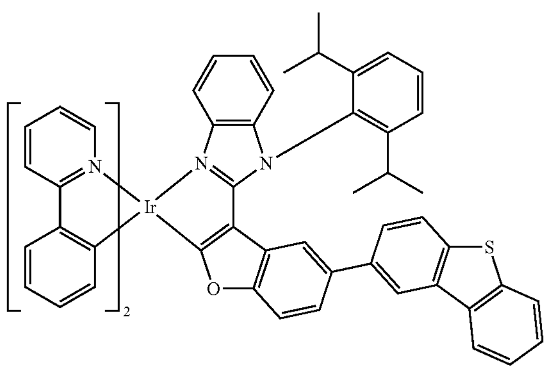
1075
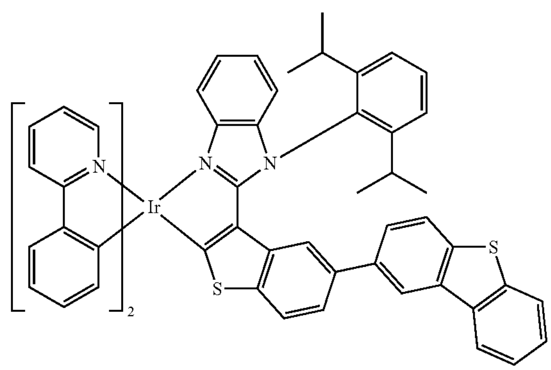
1076
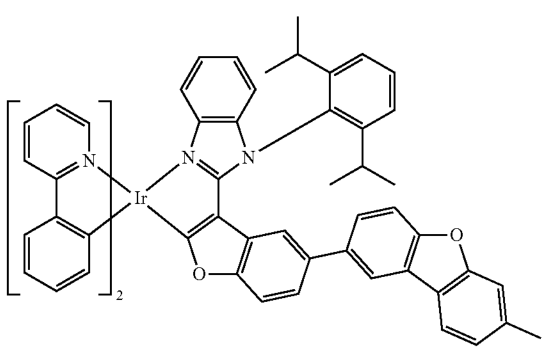
1077
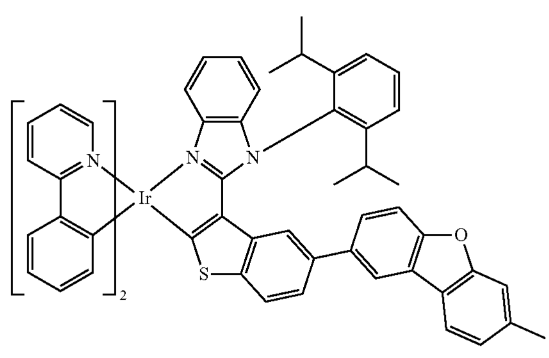

-continued
1078
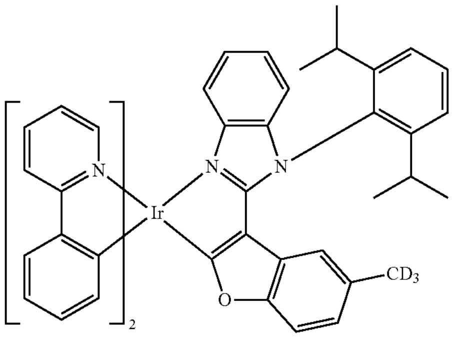
1079
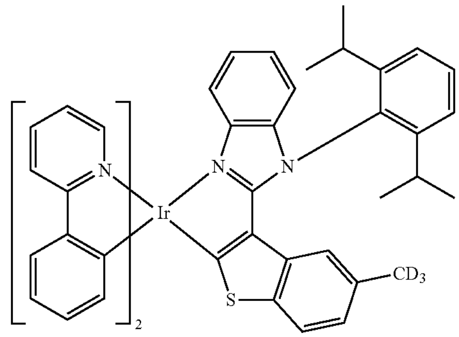
1080
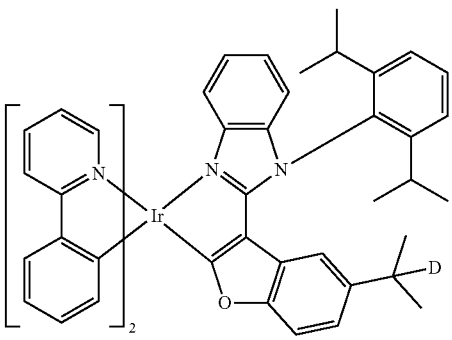
1081
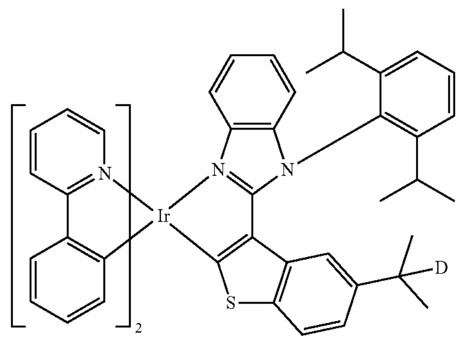
1082
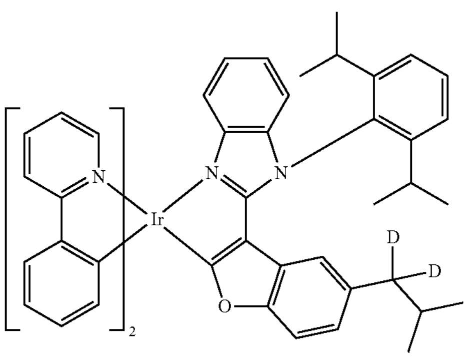
1083
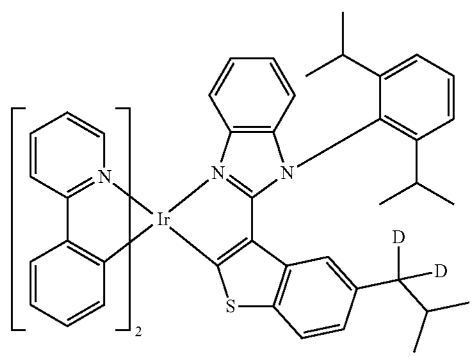
1084
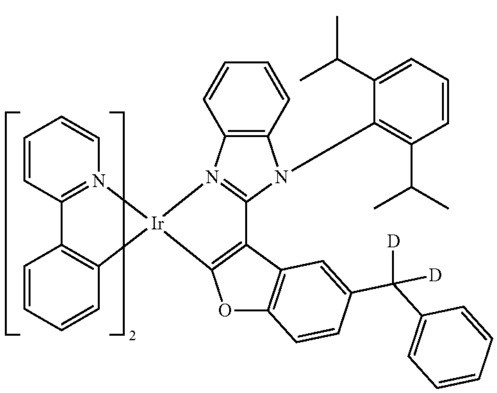
1085
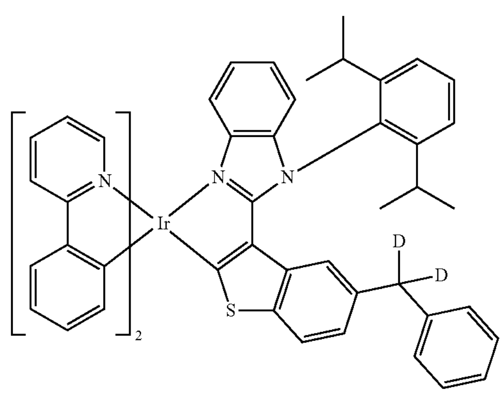

-continued
1086
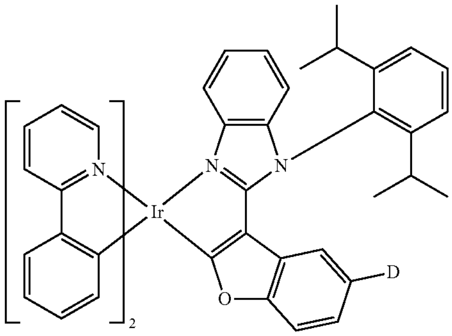
1087
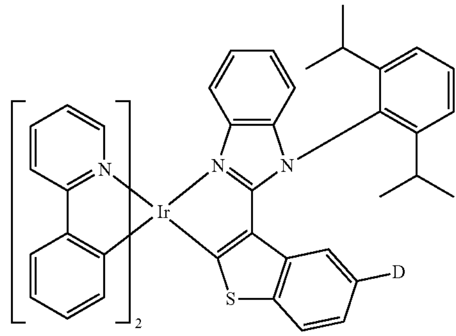
1088
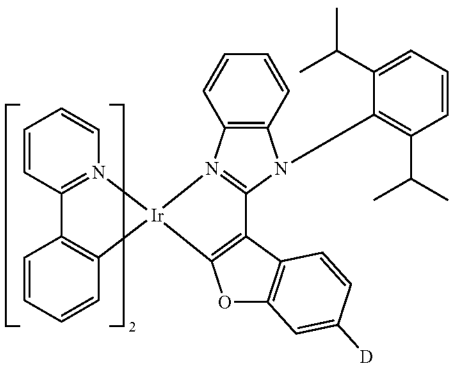
1089
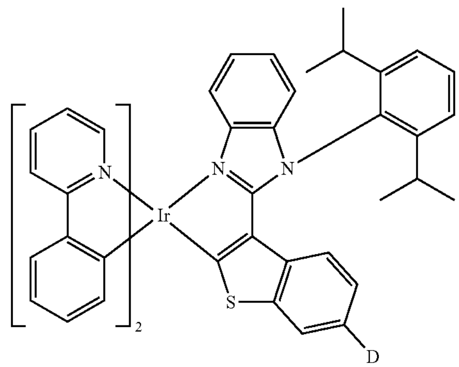
1090
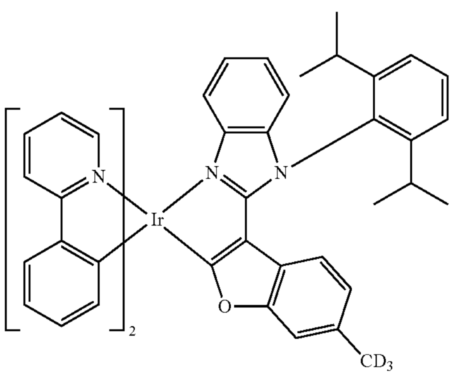
1091
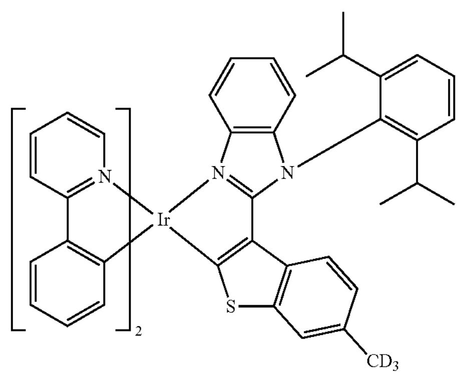
1092
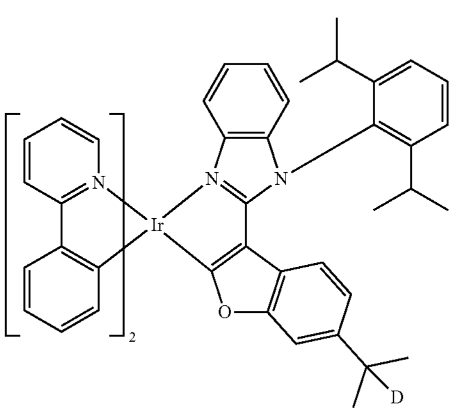
1093
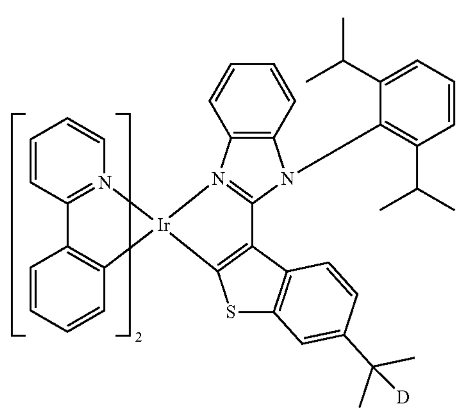

-continued
1094
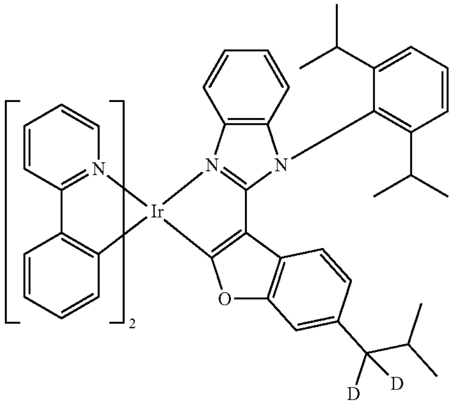
1095
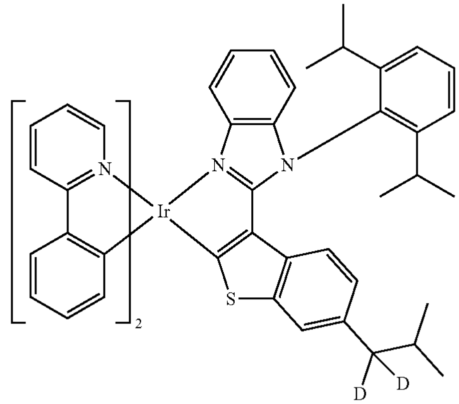
1096
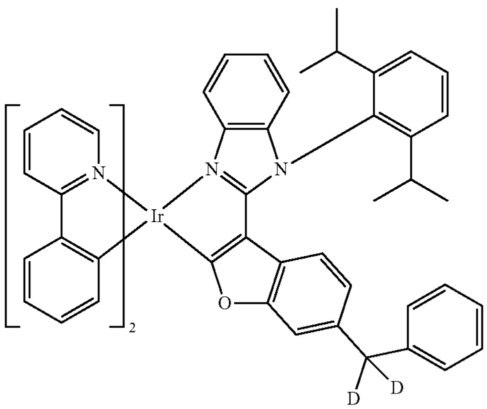
1097
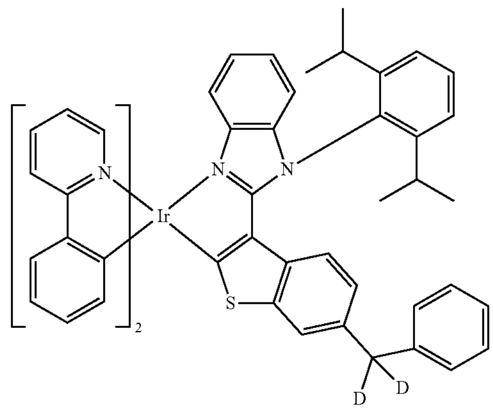
1098
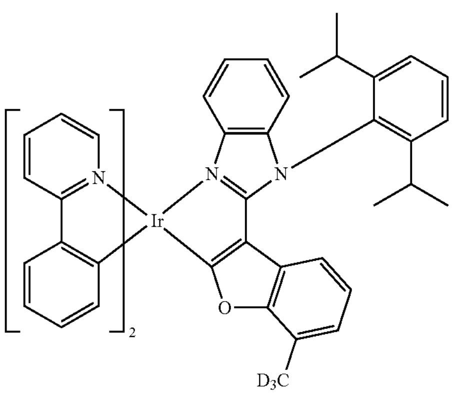
1099
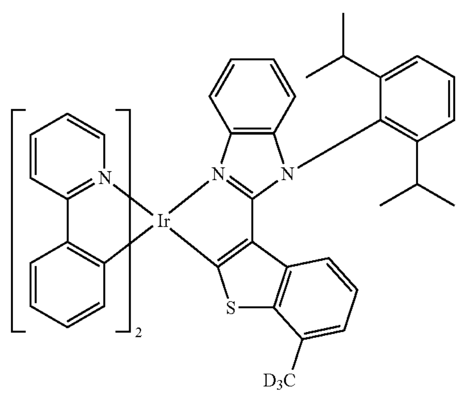
1100
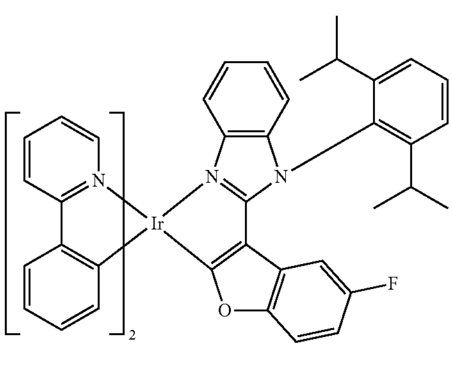
1101
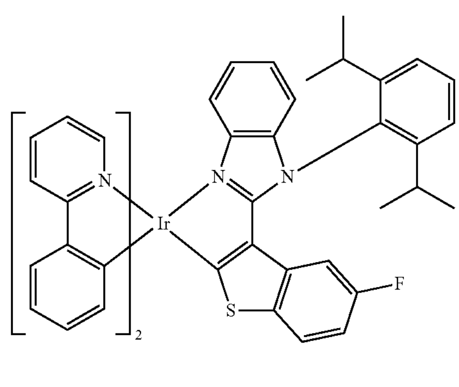

-continued
1102
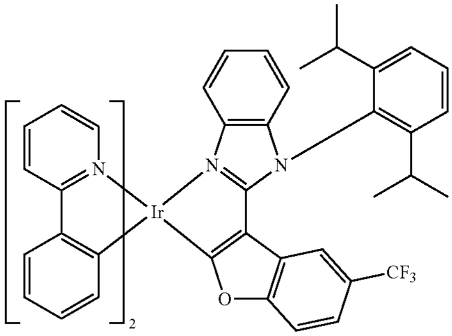
1103
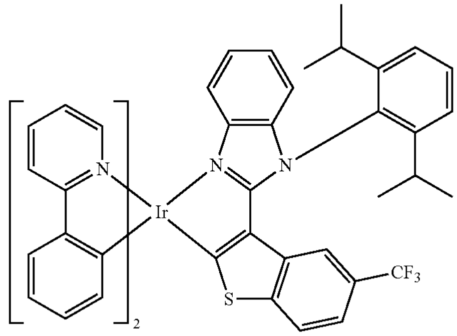
1104
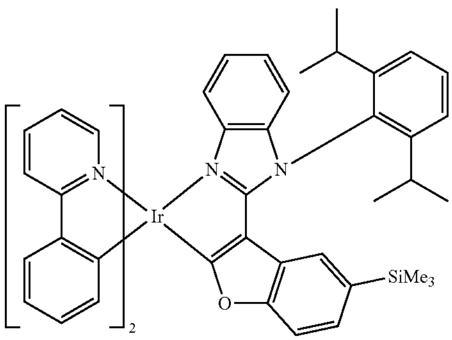
1105
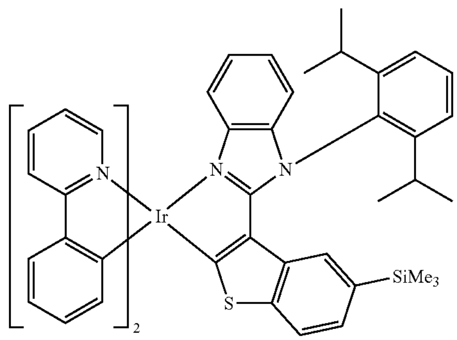
1106
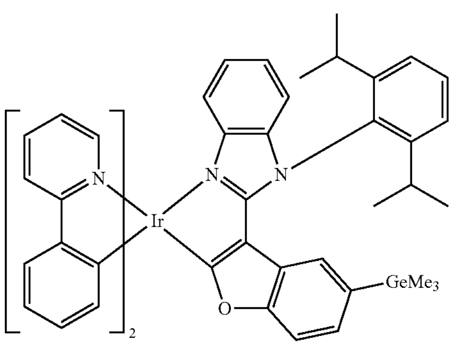
1107
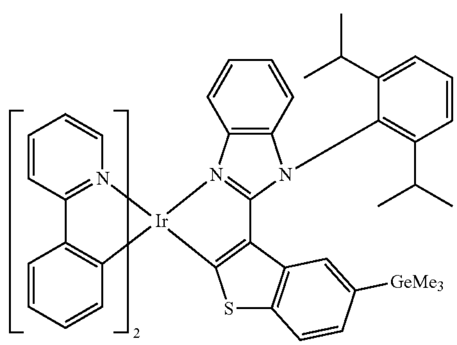
1108
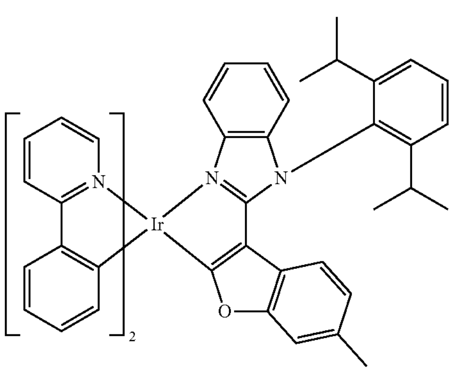
1109
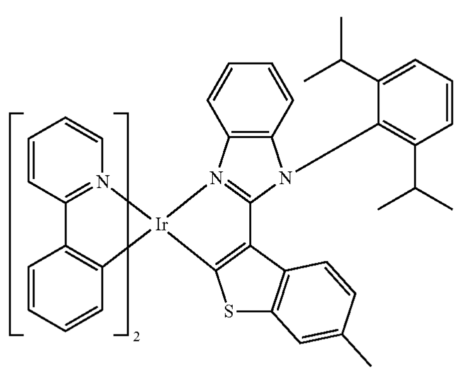

-continued
1110
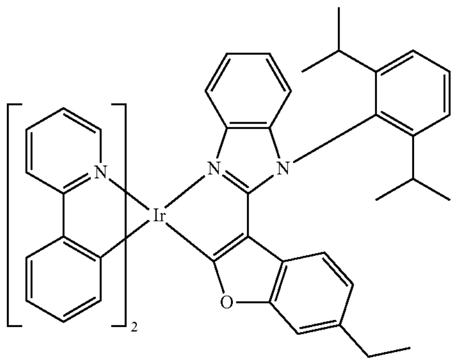
1111
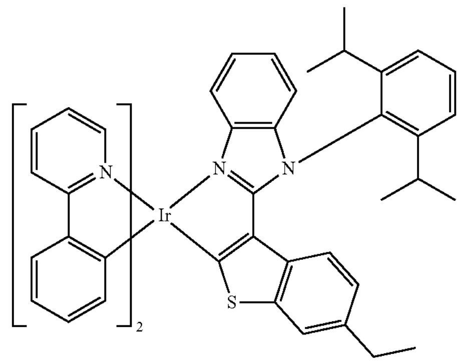
1112
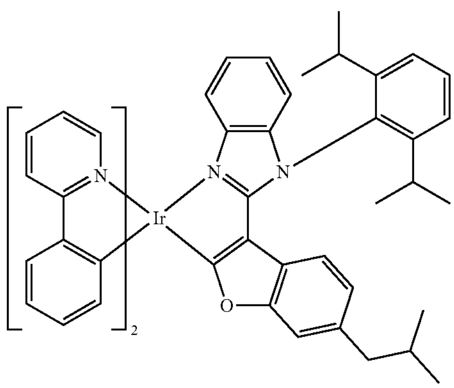
1113
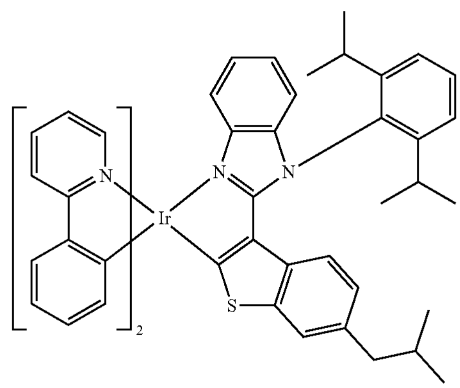
1114
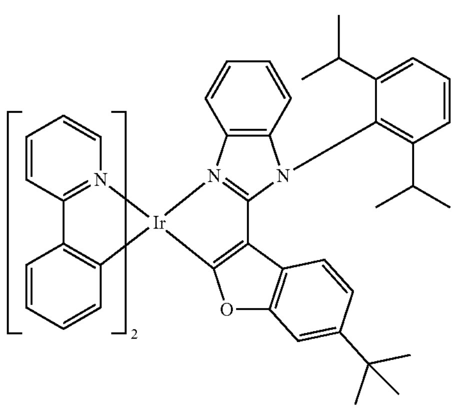
1115
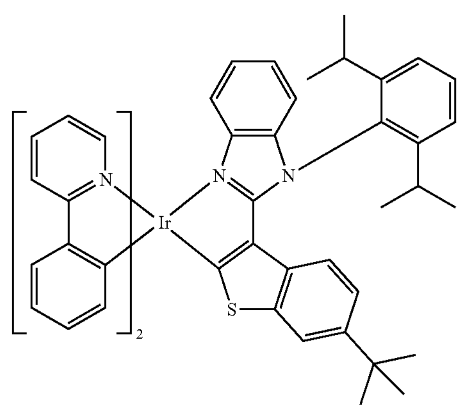
1116
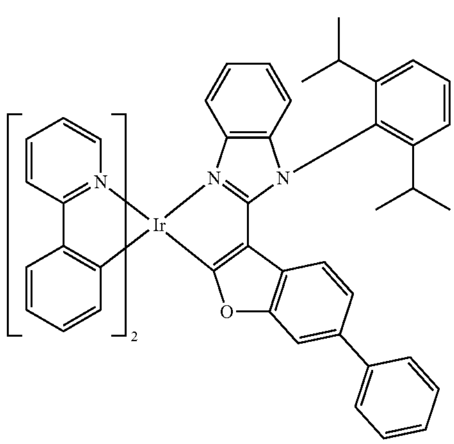
1117
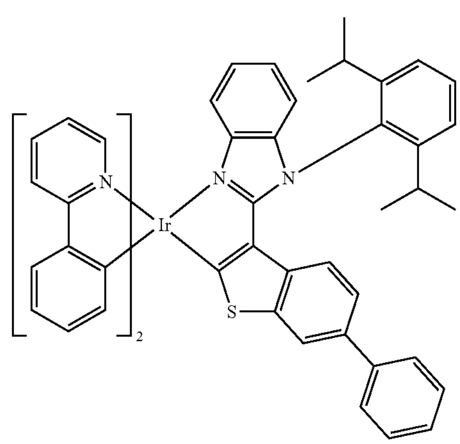

-continued
1118
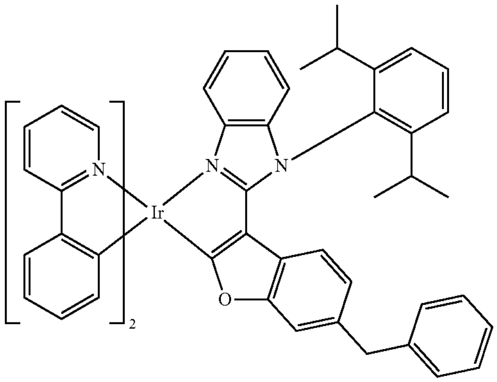
1119
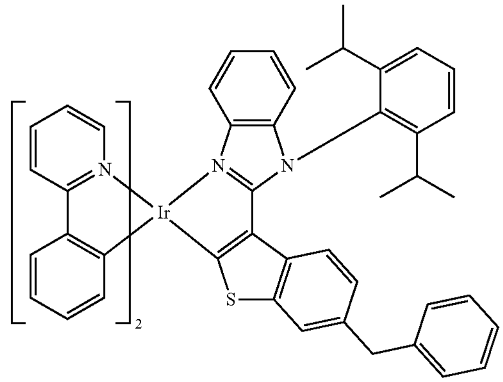
1120
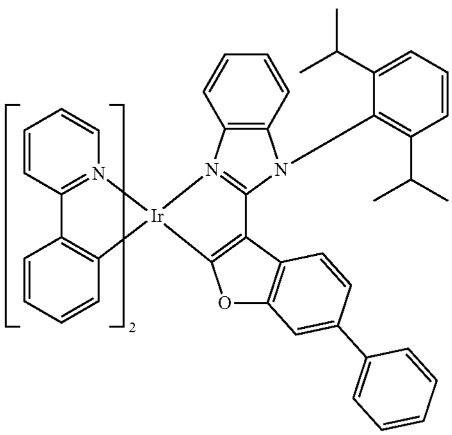
1121
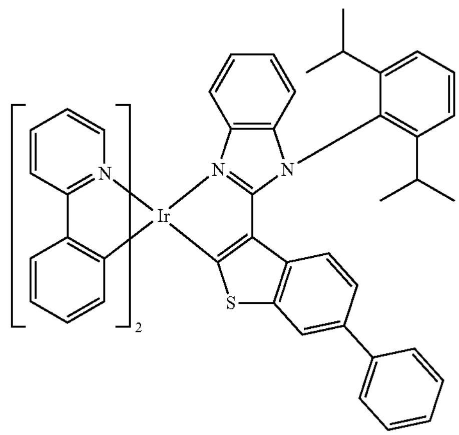
1122
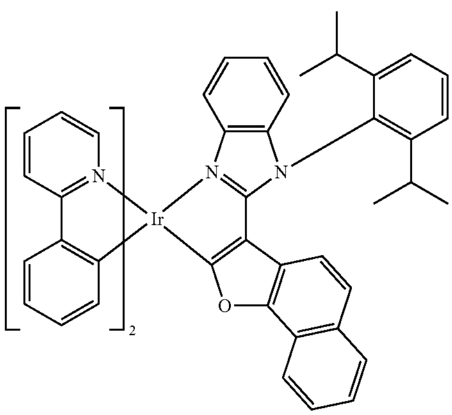
1123
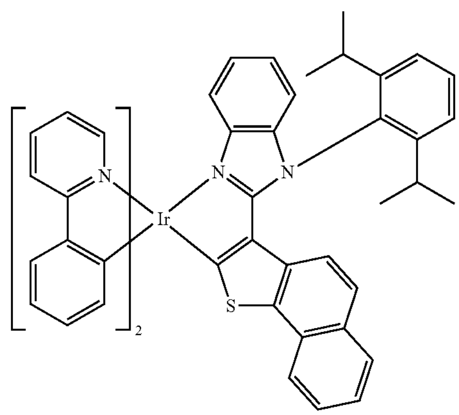
1124
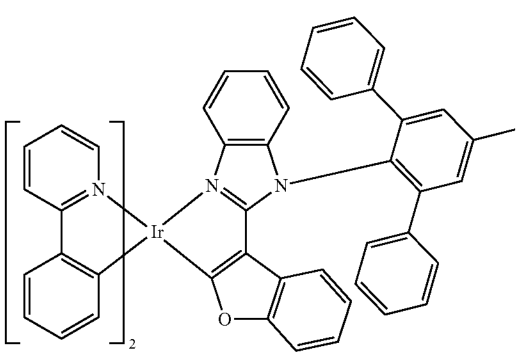
1125
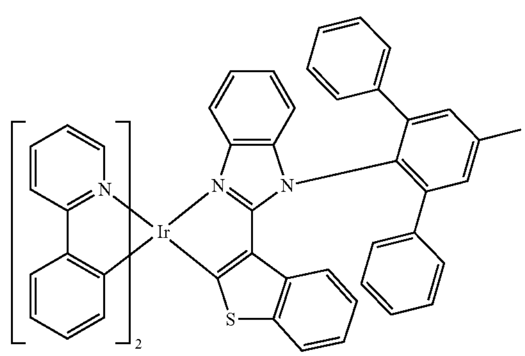

-continued
1126
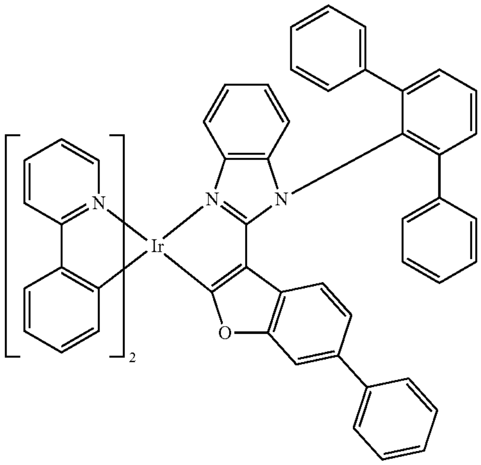
1127
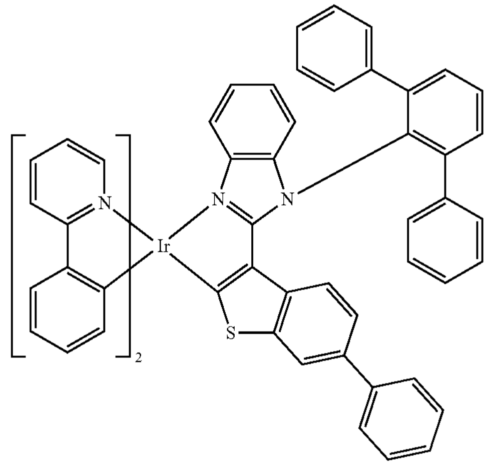
1128
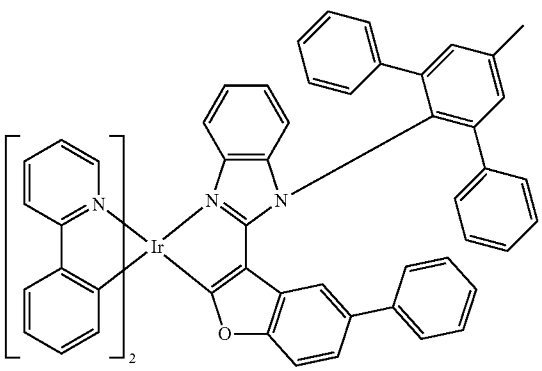
1129
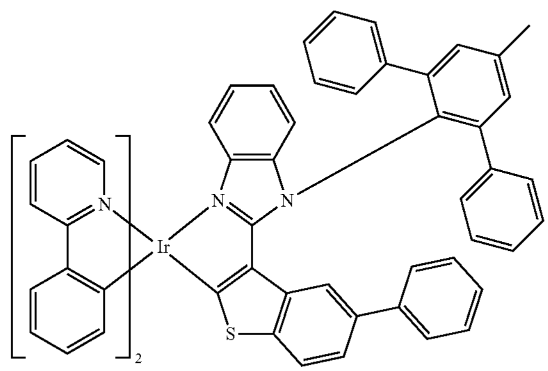
1130
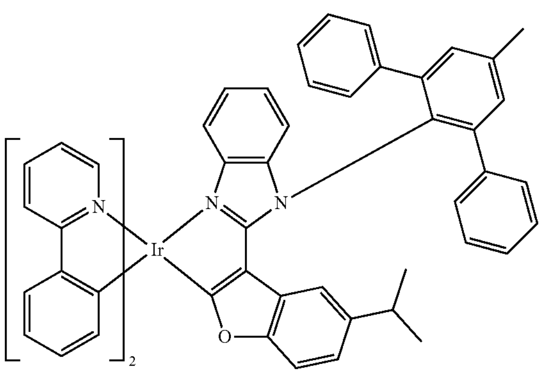
1131
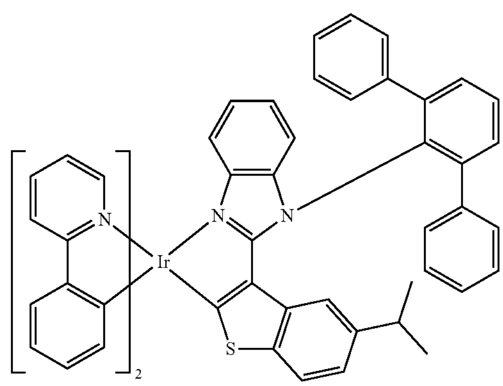
1132
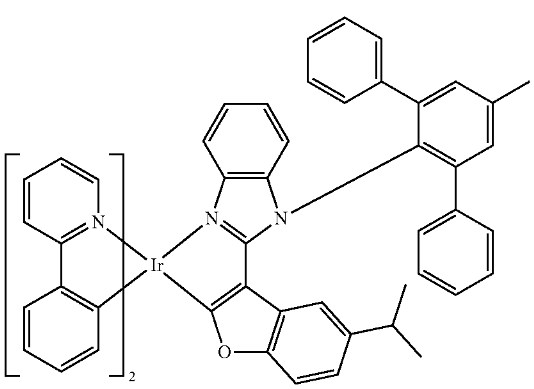
1133
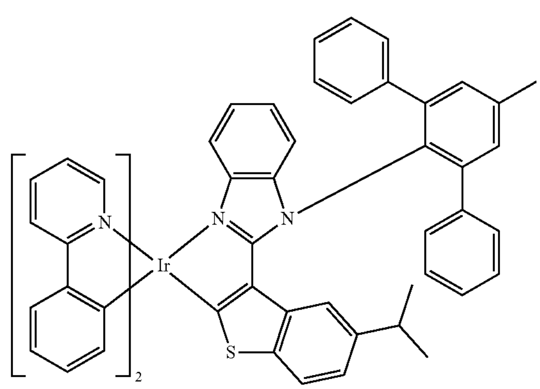

-continued
1134
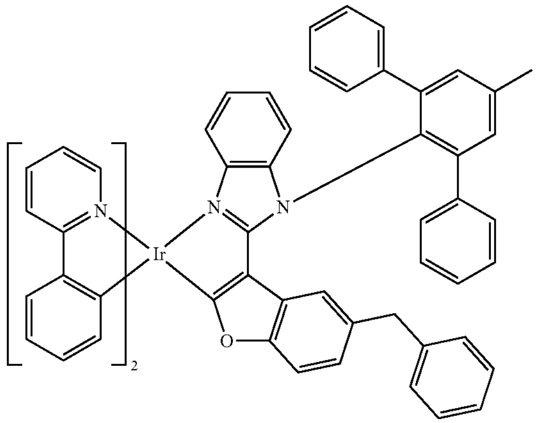
1135
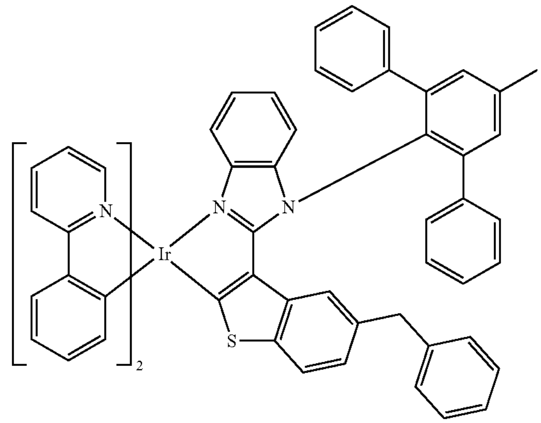
1136
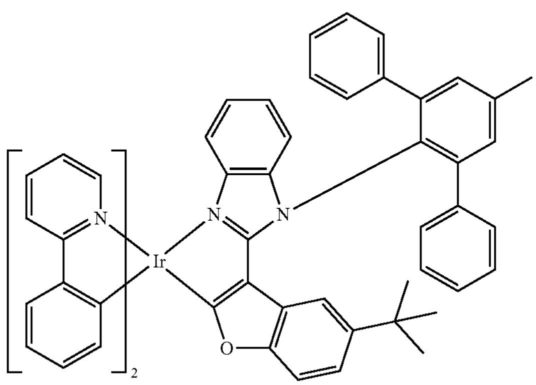
1137
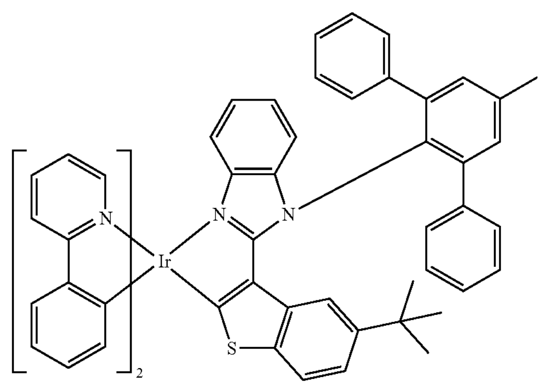
1138
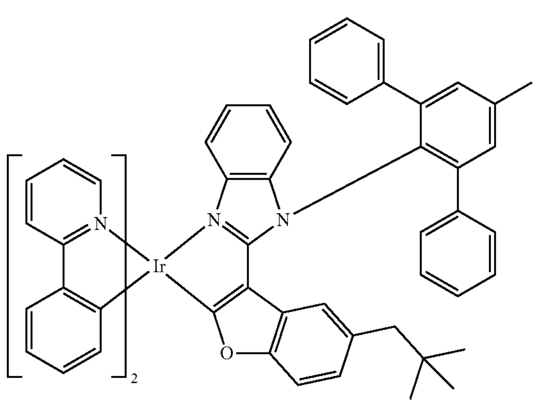
1139
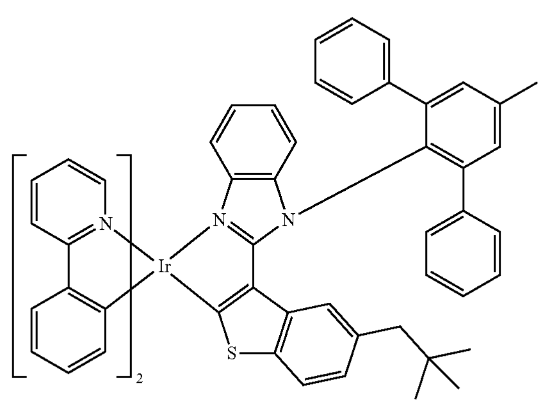

-continued
1140
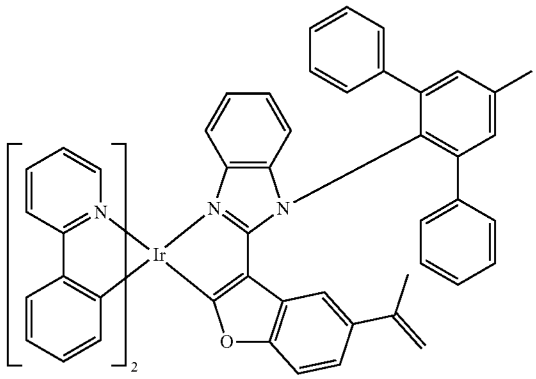
1141
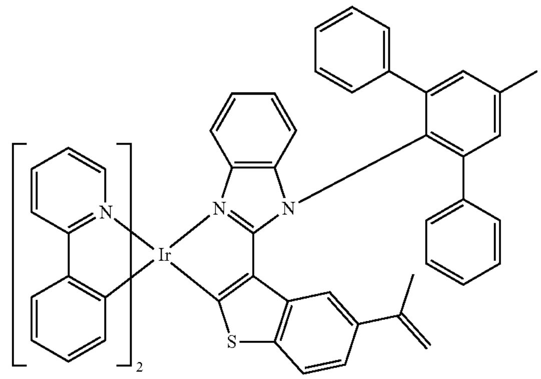
1142
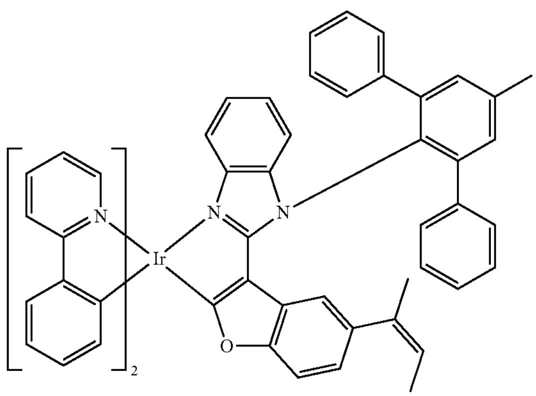
1143
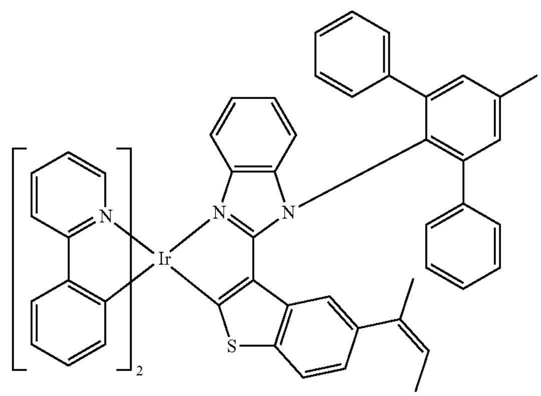
1144
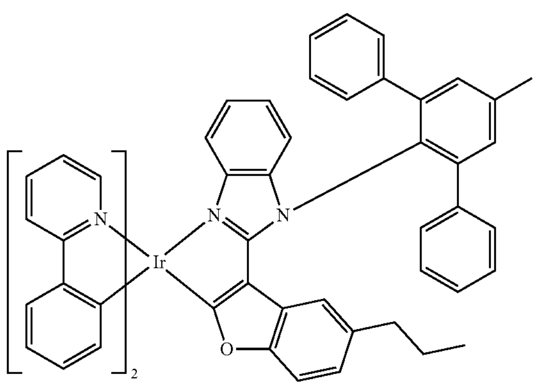
1145
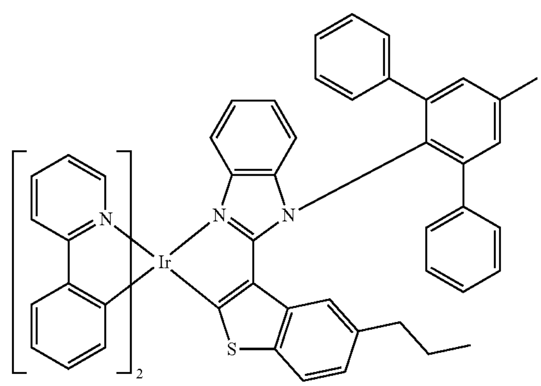
1146
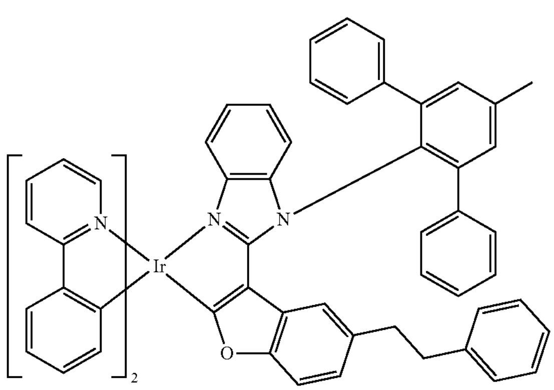
1147
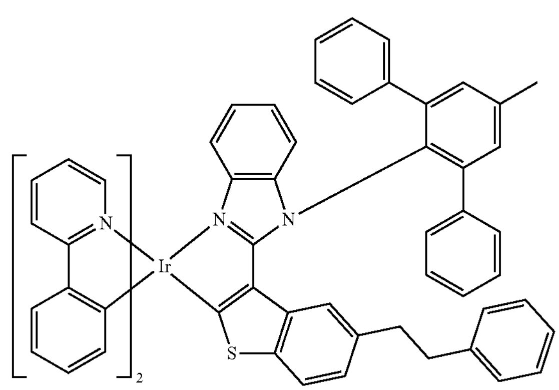

-continued
1148
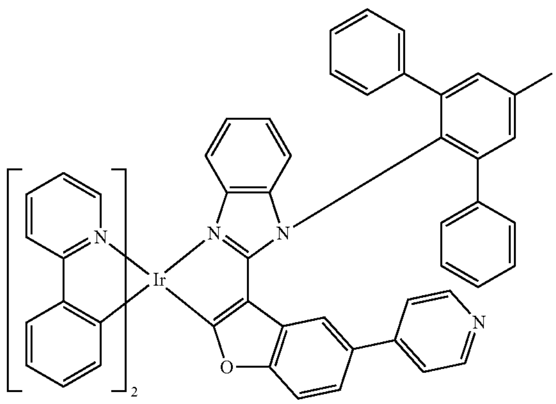
1149
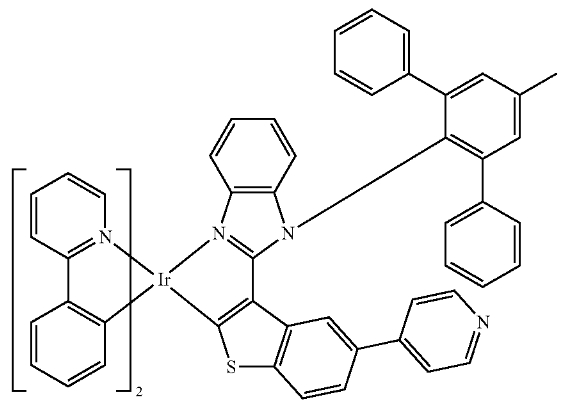
1150
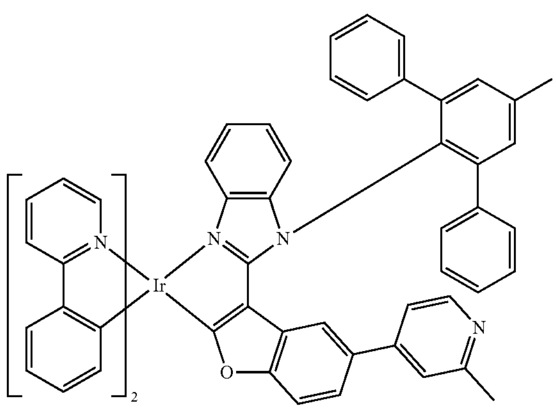
1151
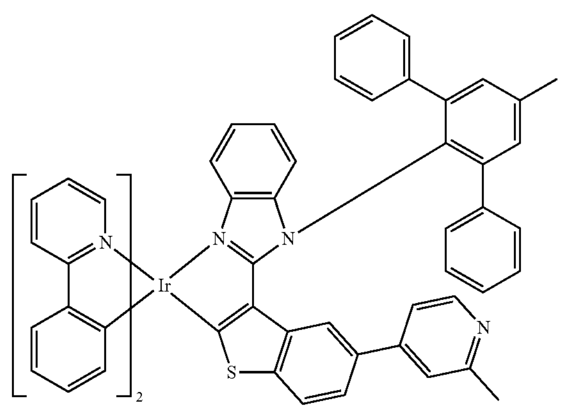
1152
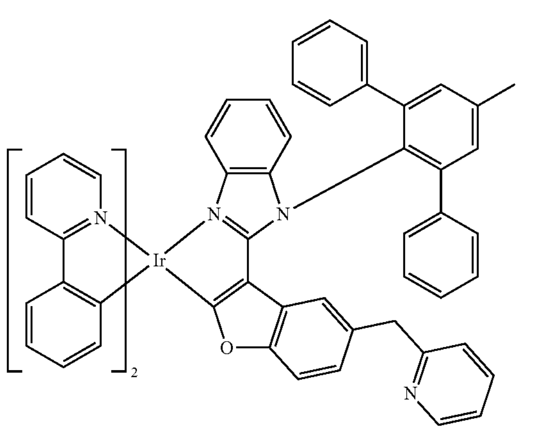
1153
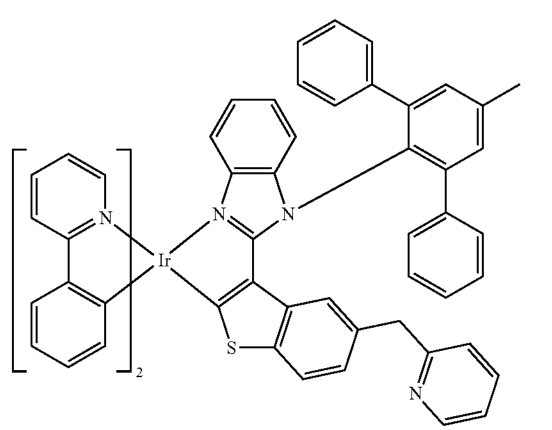

-continued
1154
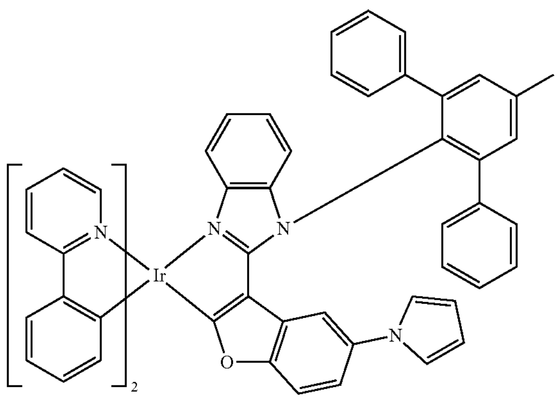
1155
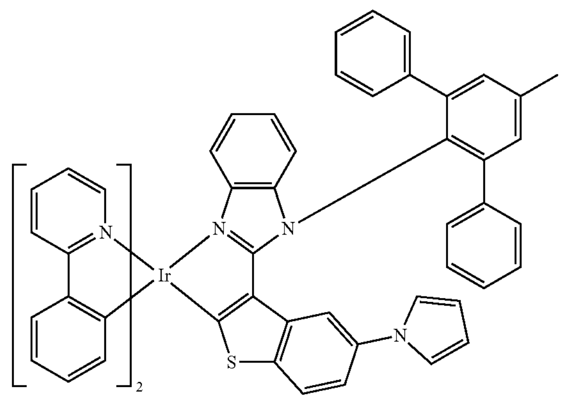
1156
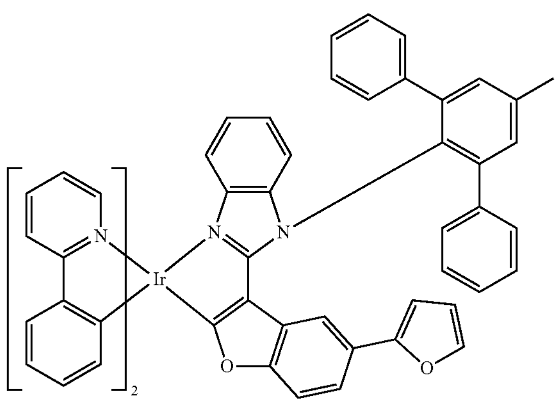
1157
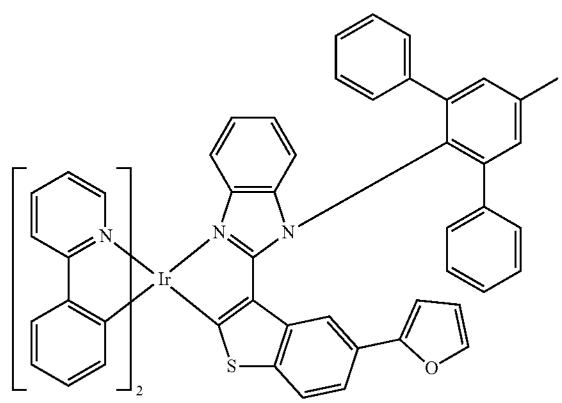
1158
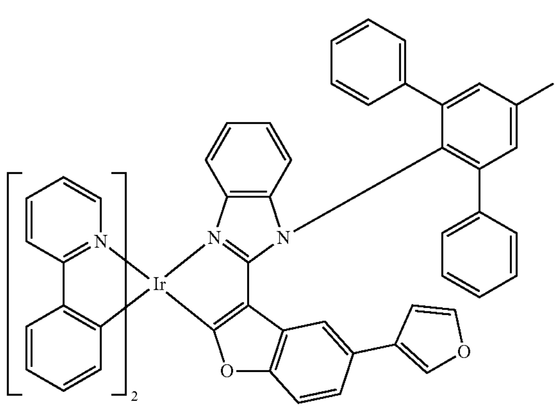
1159
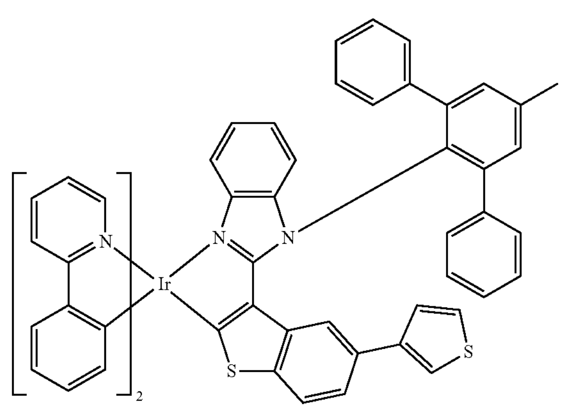

-continued
1160
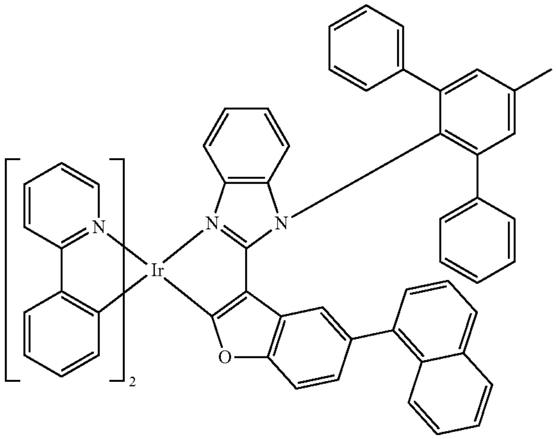
1161
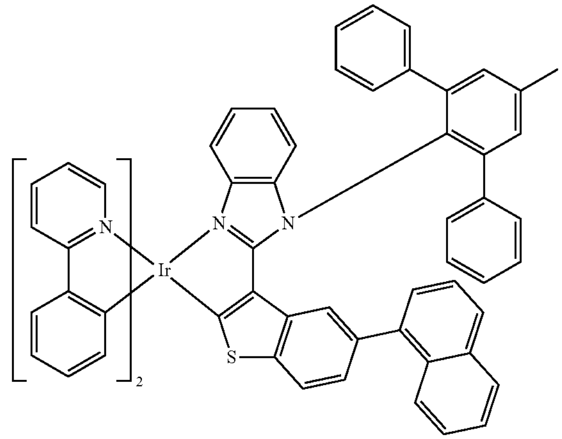
1162
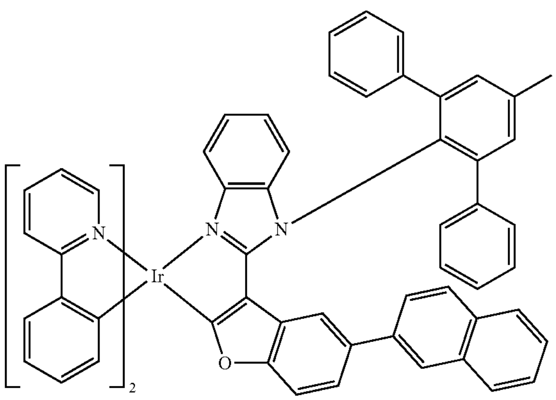
1163
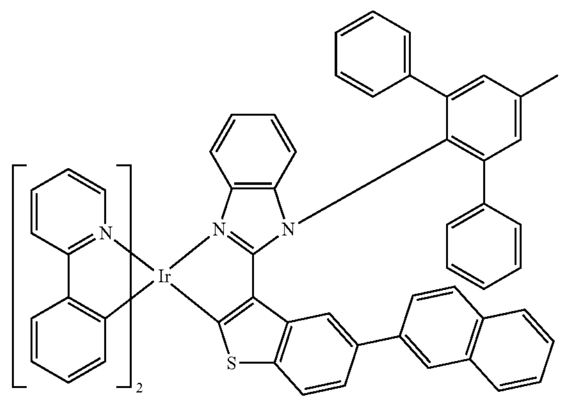
1164
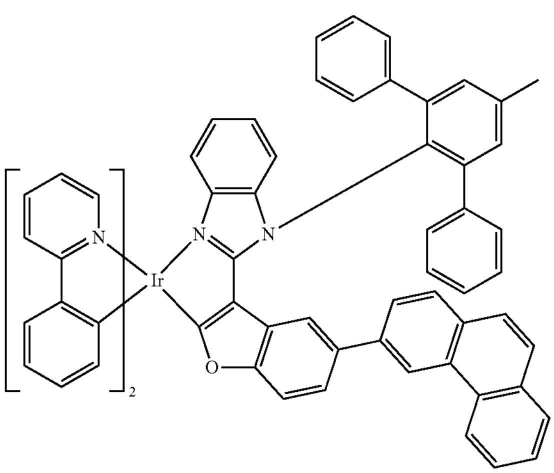
1165
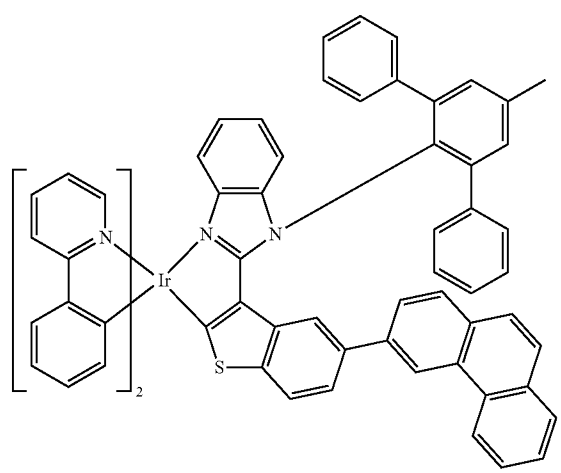

-continued
1166
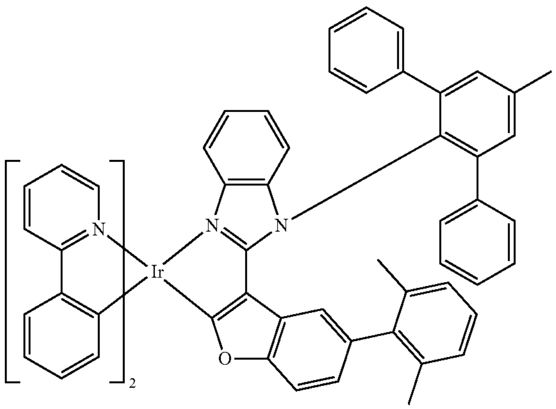
1167
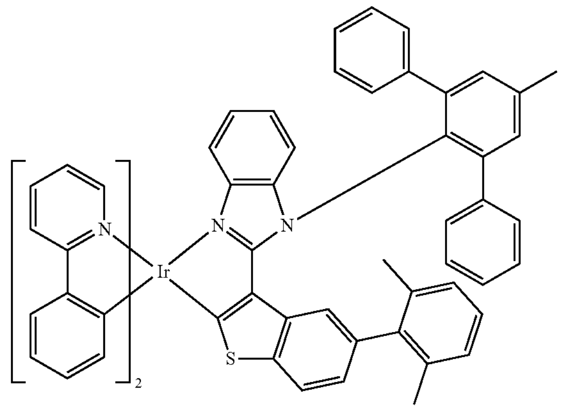
1168
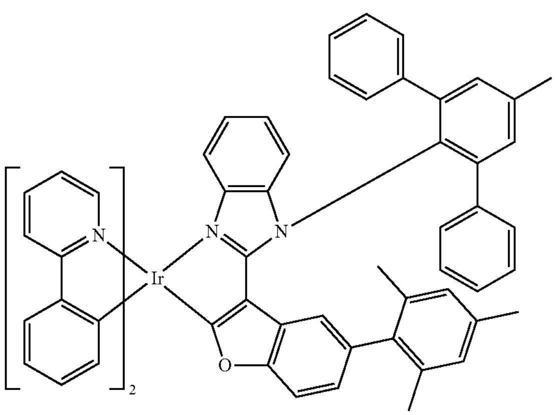
1169
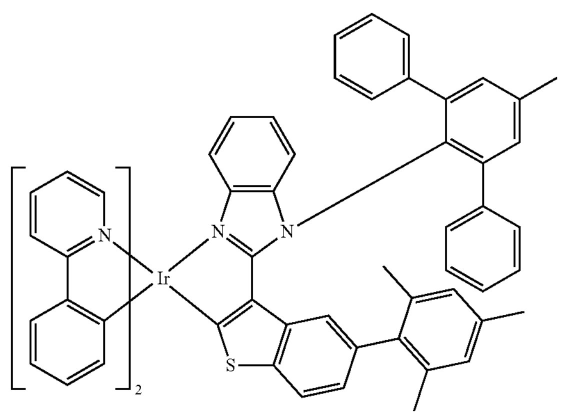
1170
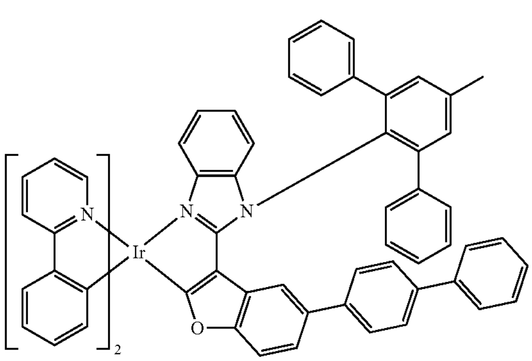
1171
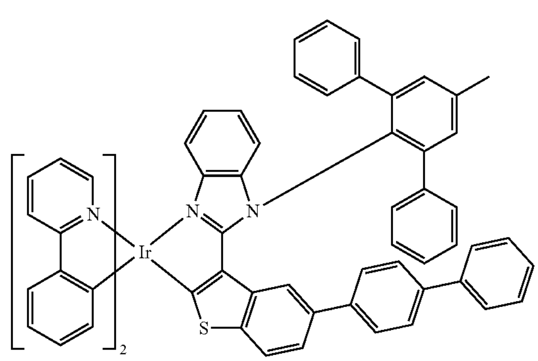

-continued
1172
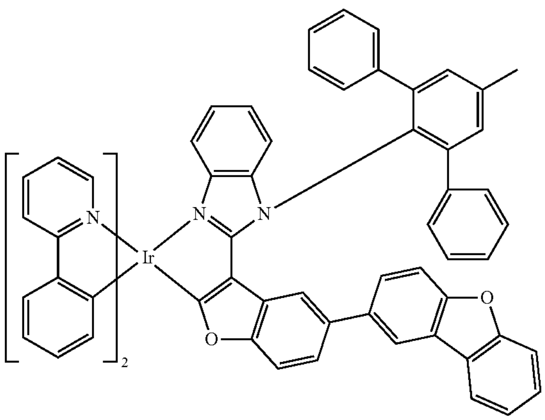
1173
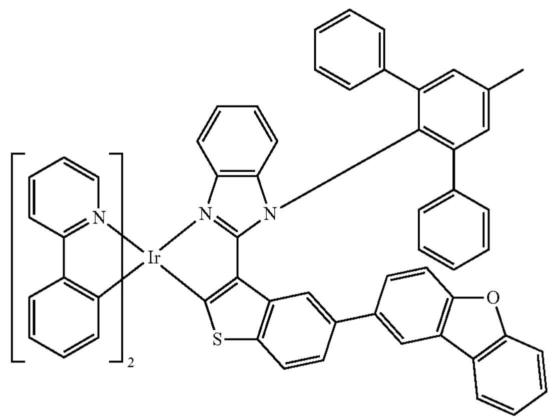
1174
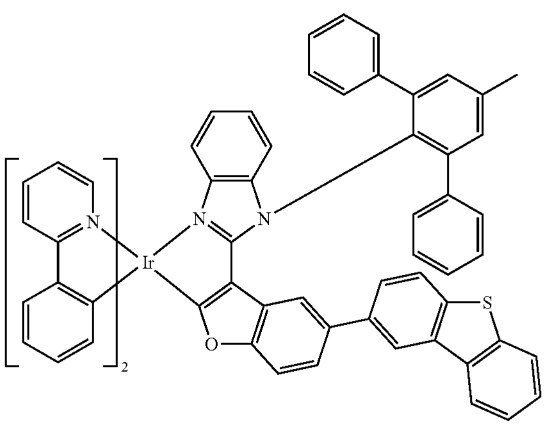
1175
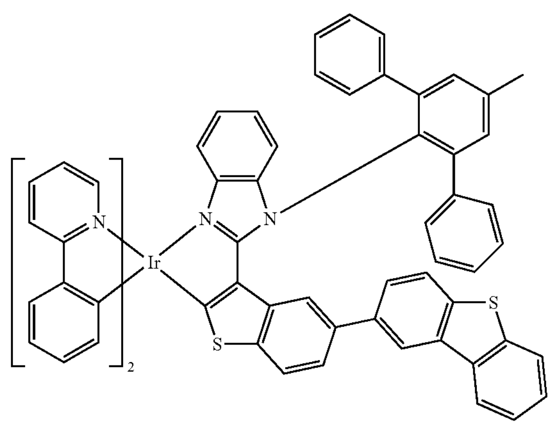
1176
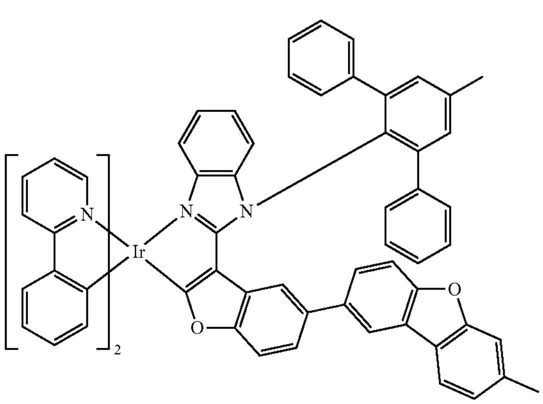
1177
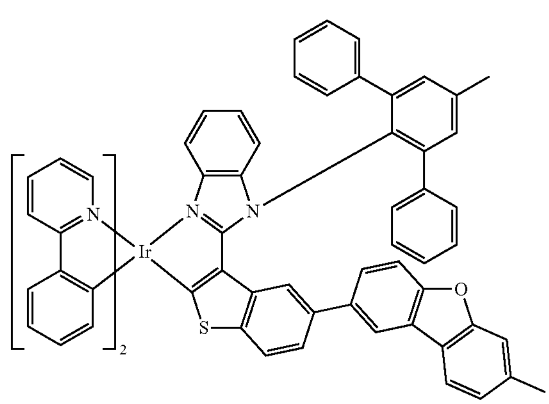

-continued
1178
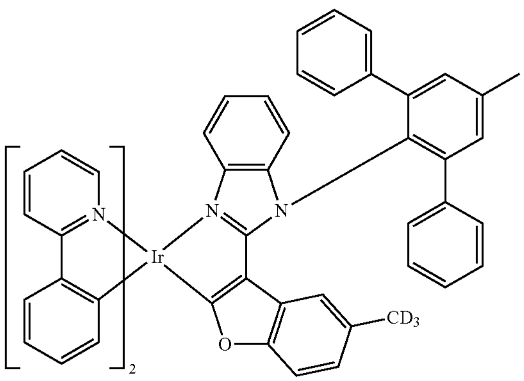
1179
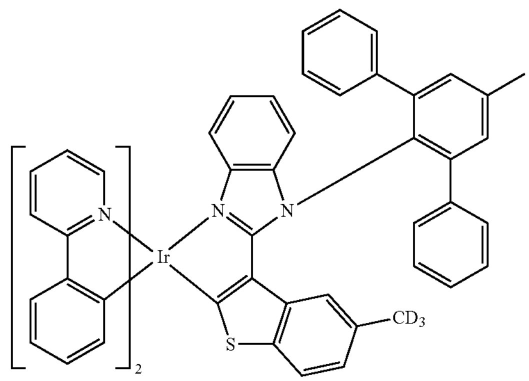
1180
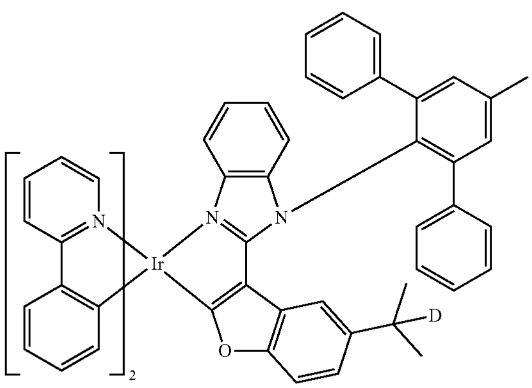
1181
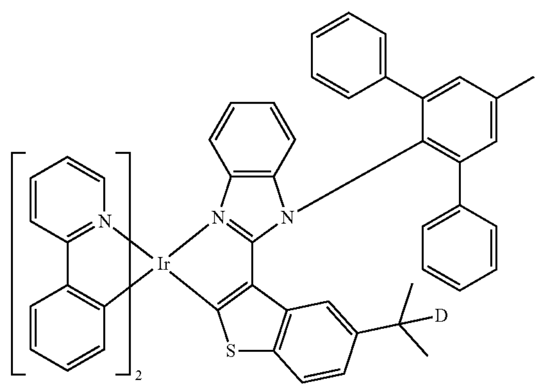
1182
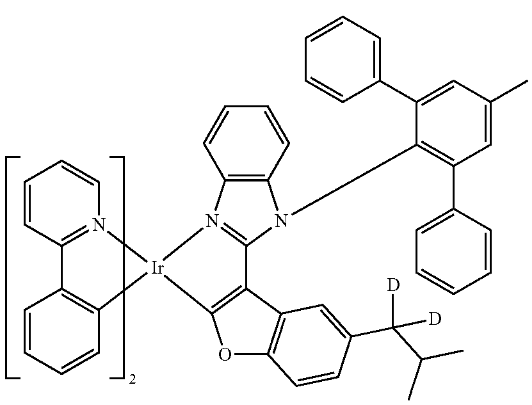
1183
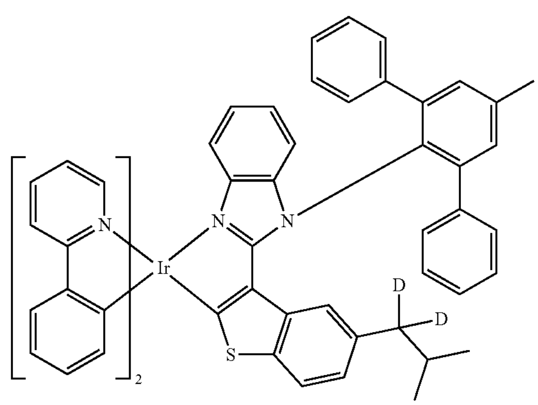

-continued
1184
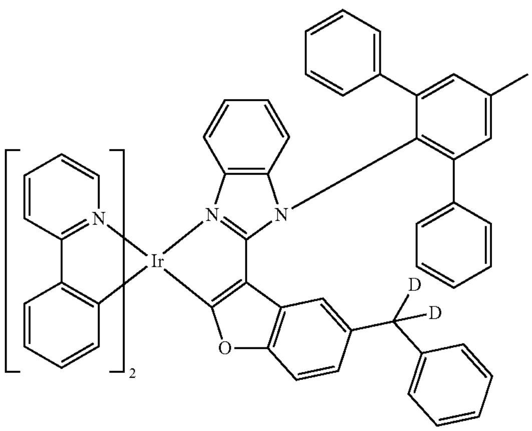
1185
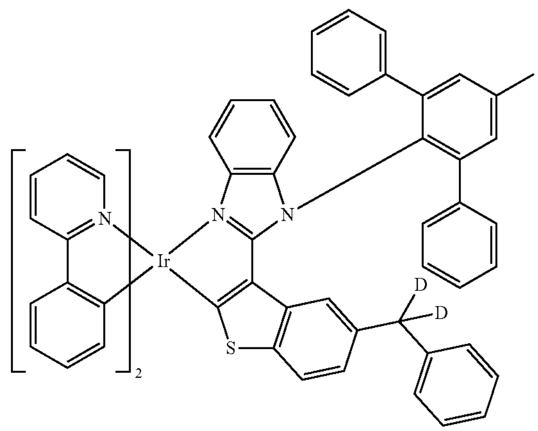
1186
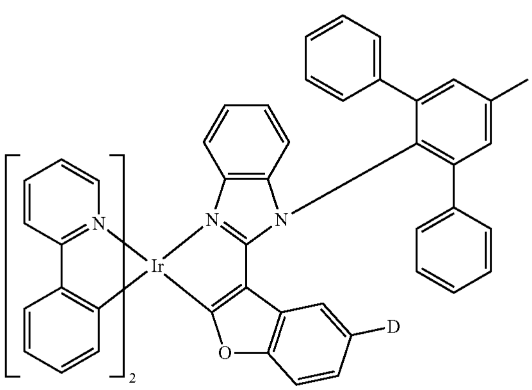
1187
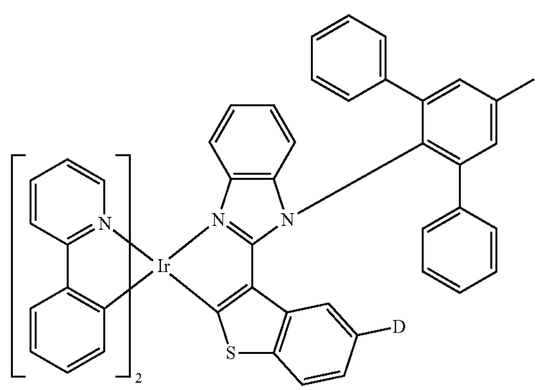
1188
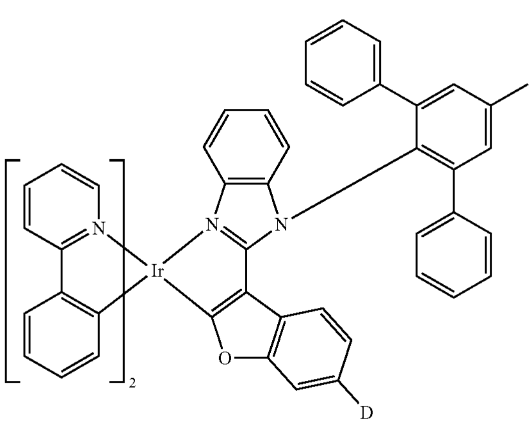
1189
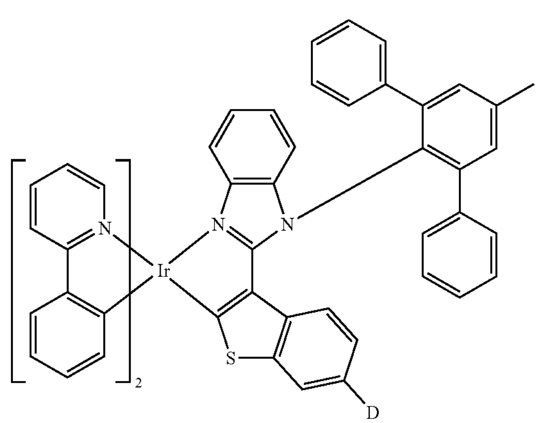

-continued
1190
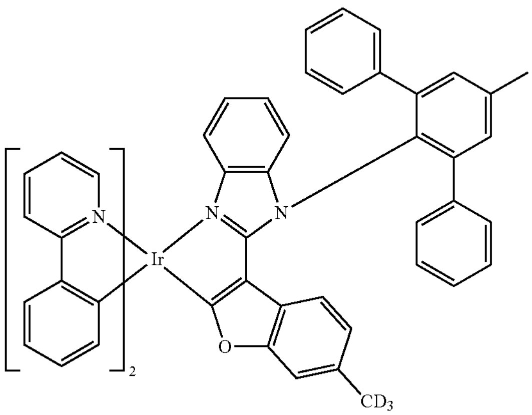
1191
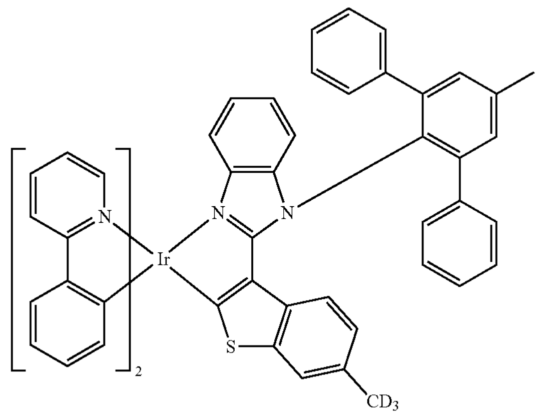
1192
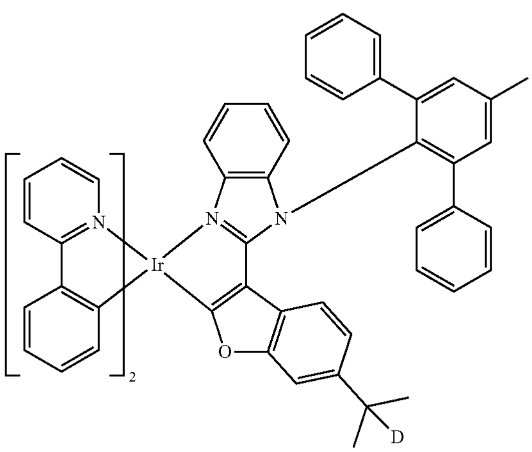
1193
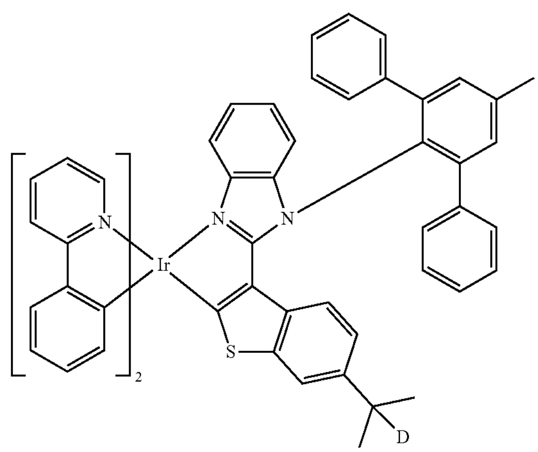
1194
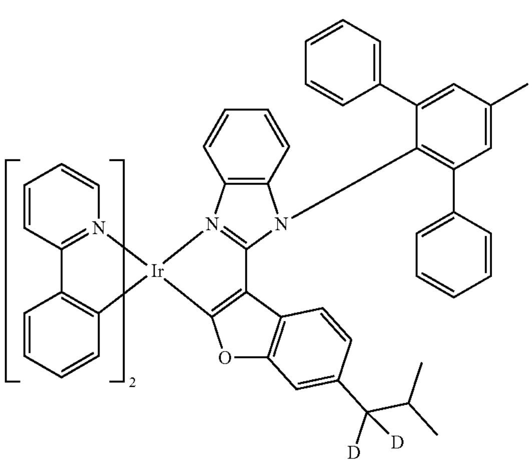
1195
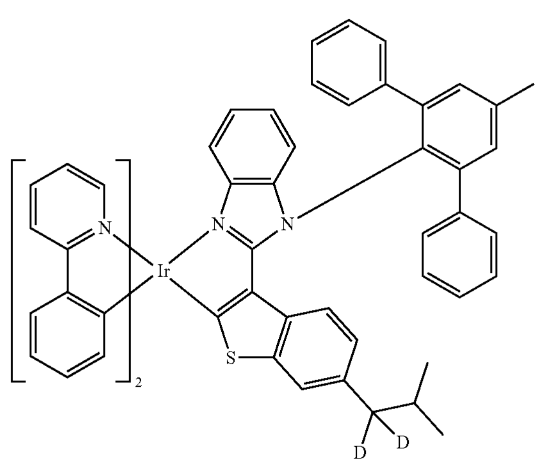

-continued
1196
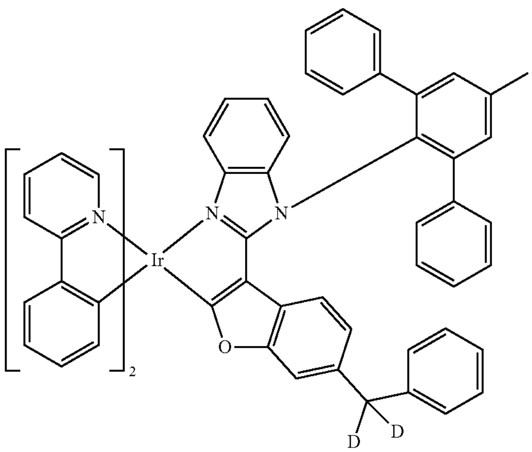
1197
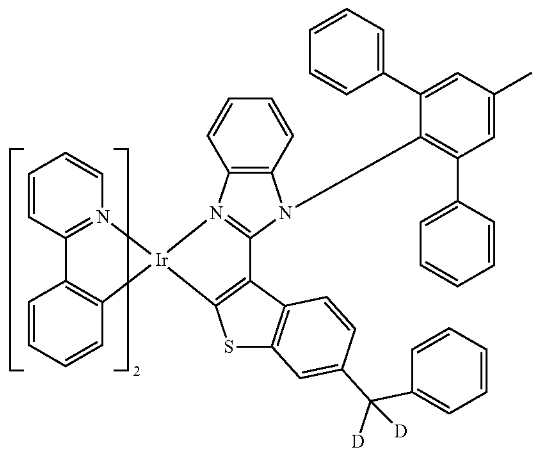
1198
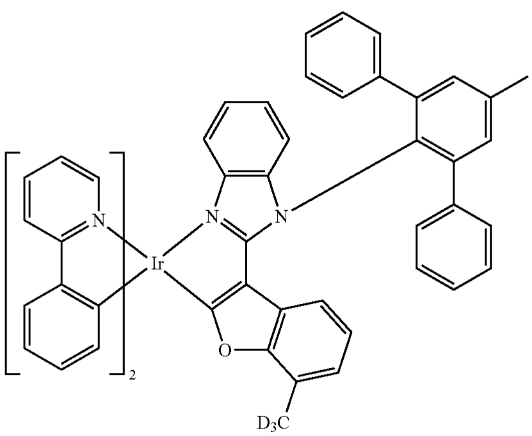
1199
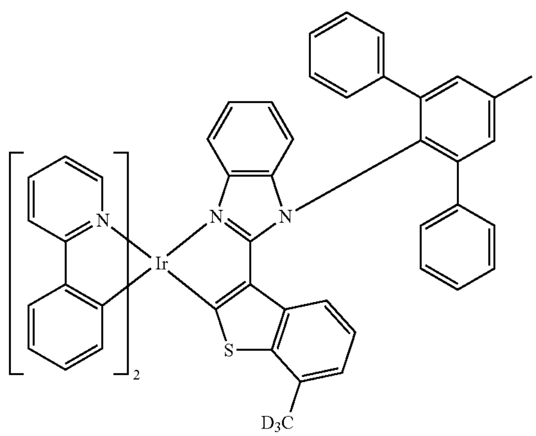
1200
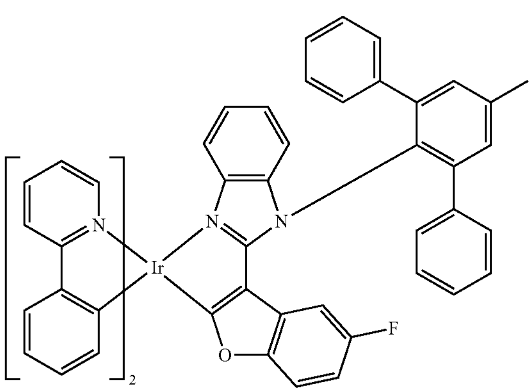
1201
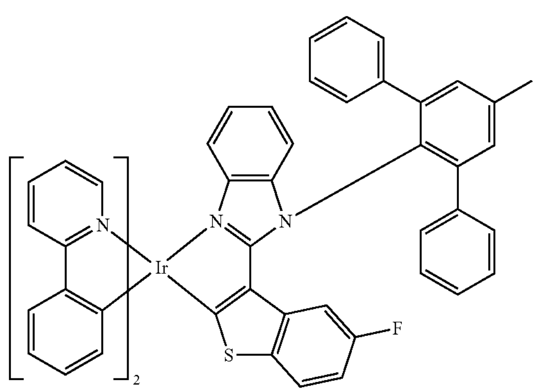

-continued
1202
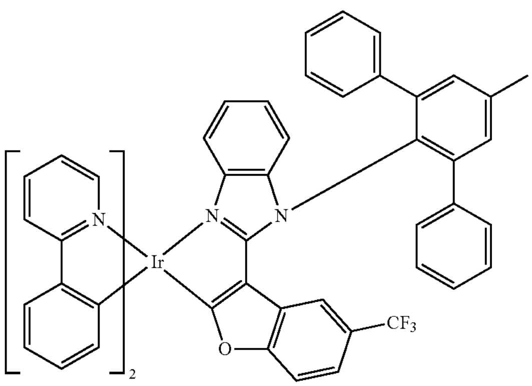
1203
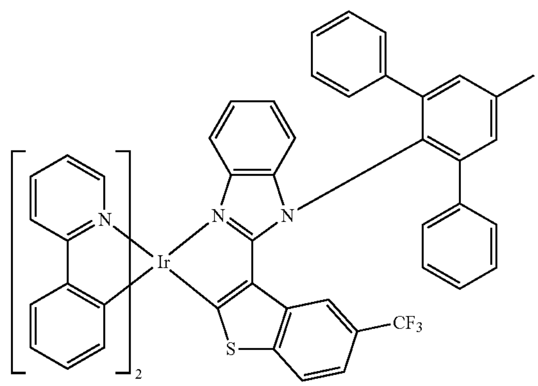
1204
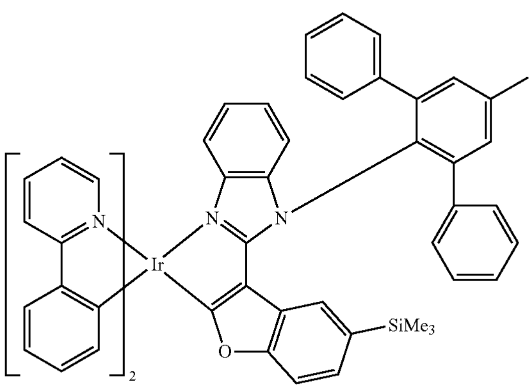
1205
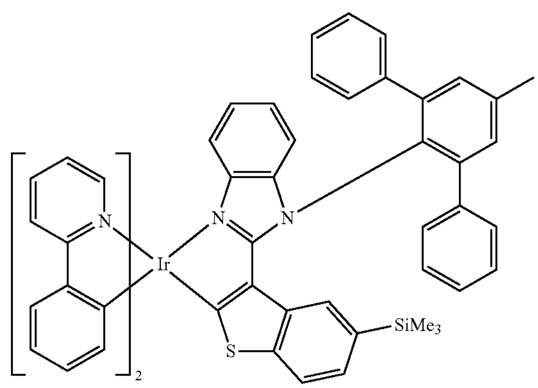
1206
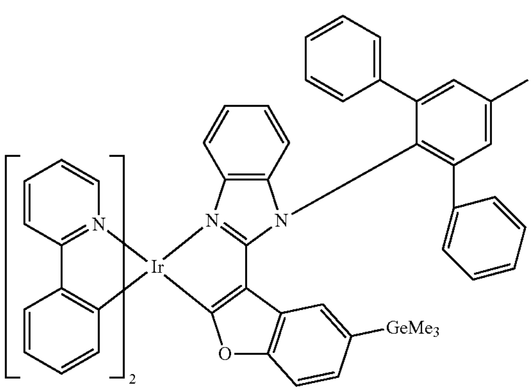
1207
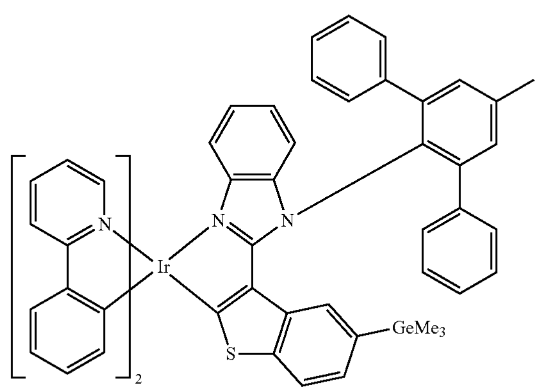
1208
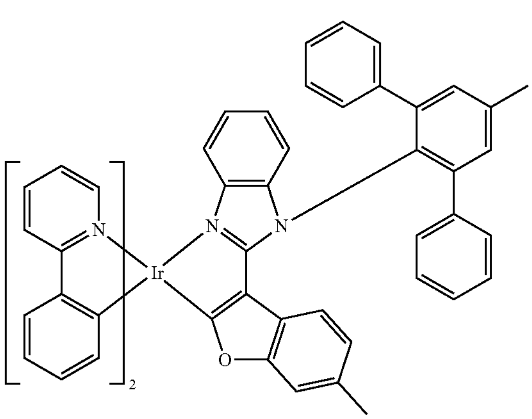
1209
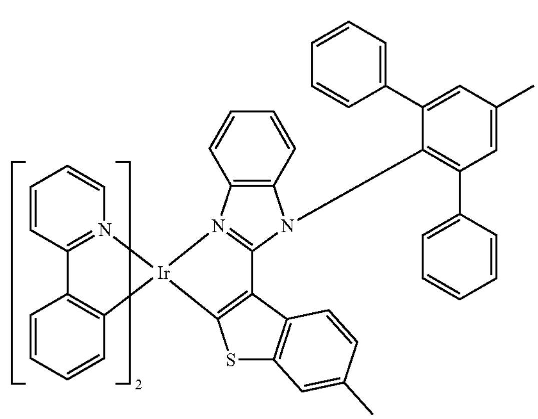

-continued
1210
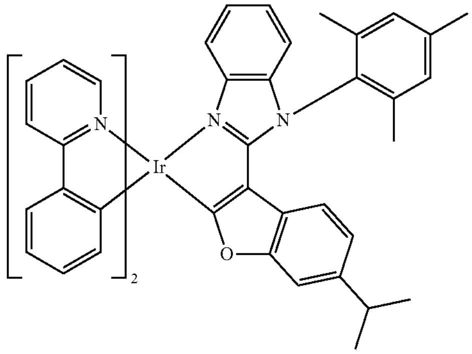
1211
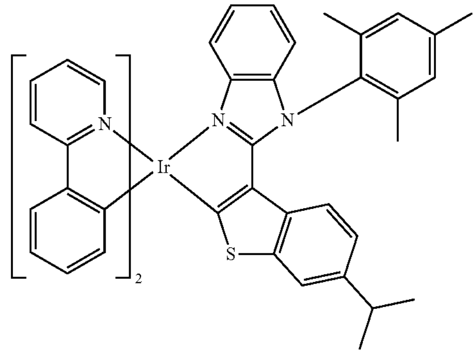
1212
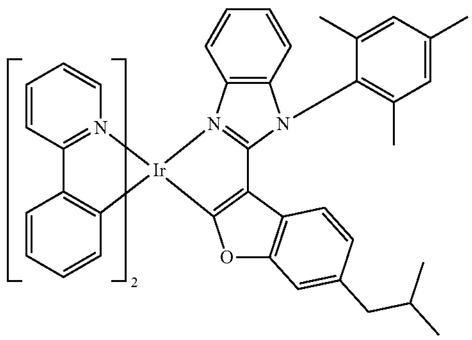
1213
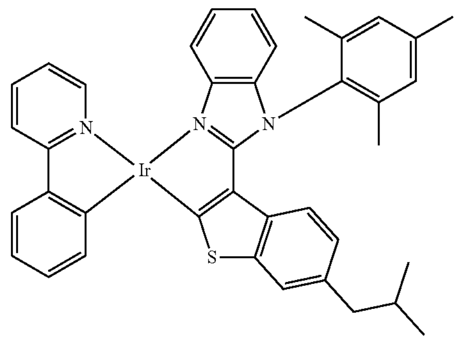
1214
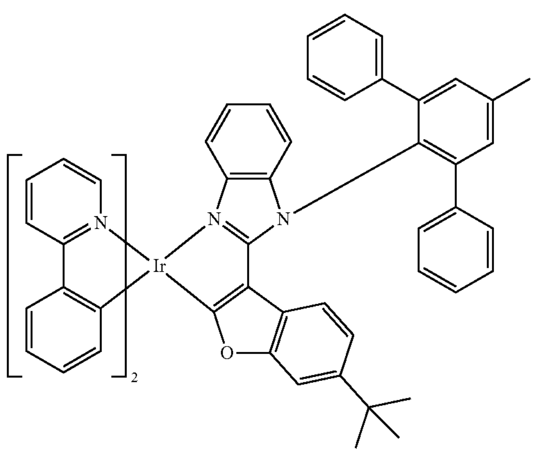
1215
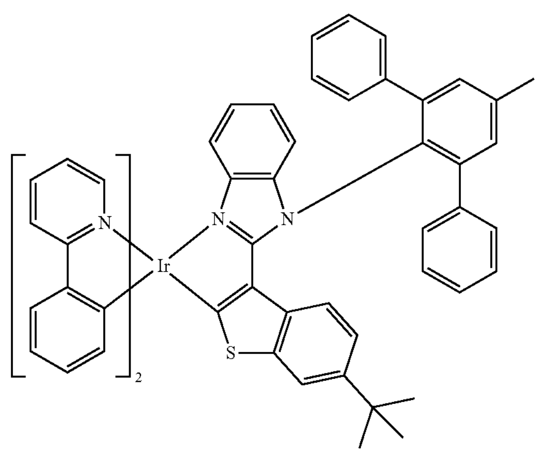
1216
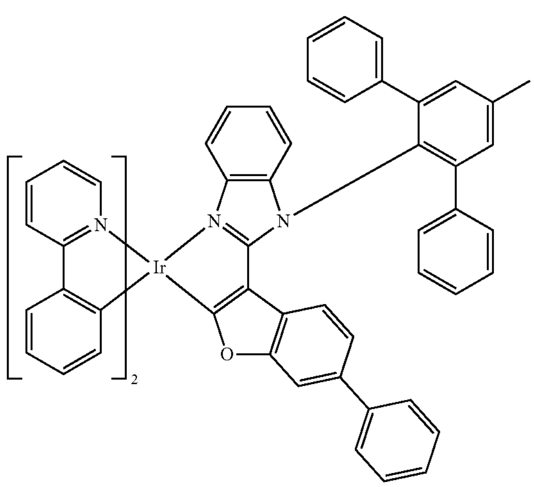
1217
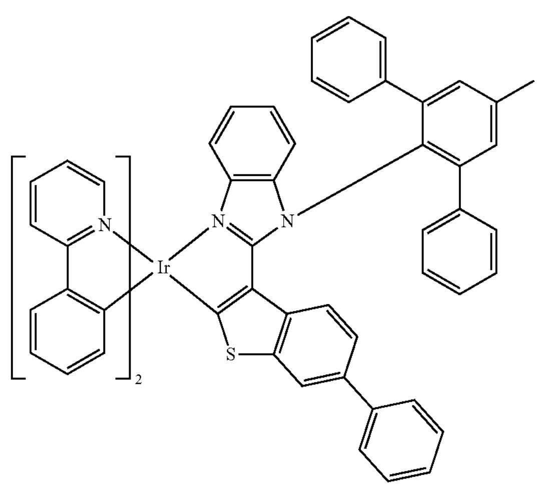

-continued
1218
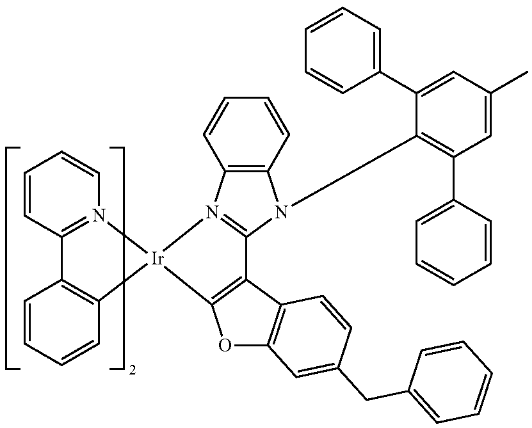
1219
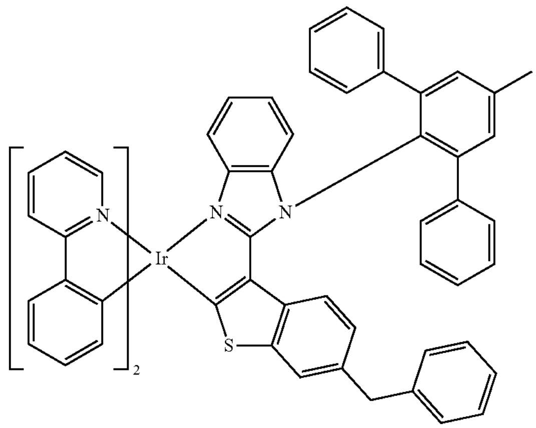
1220
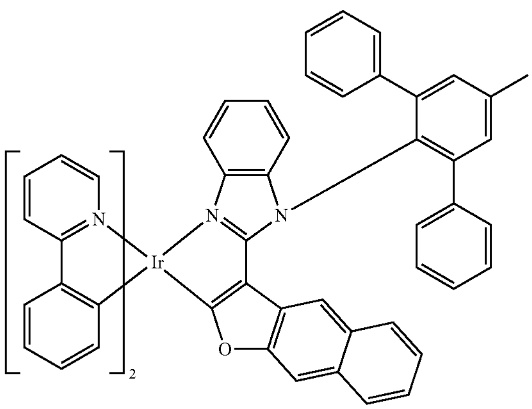
1221
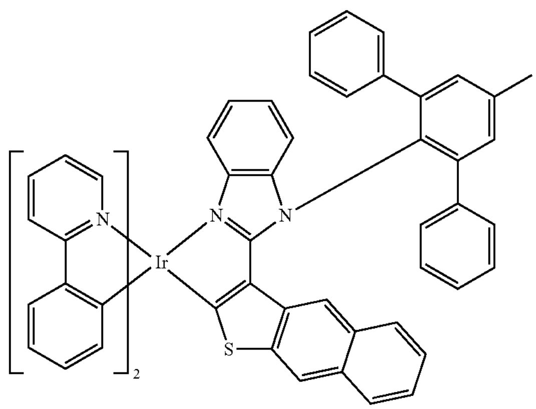
1222
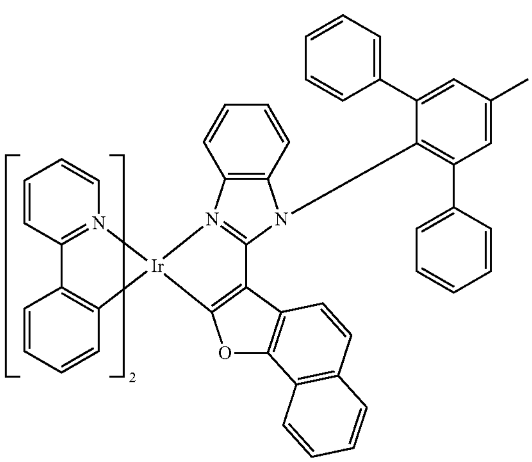
1223
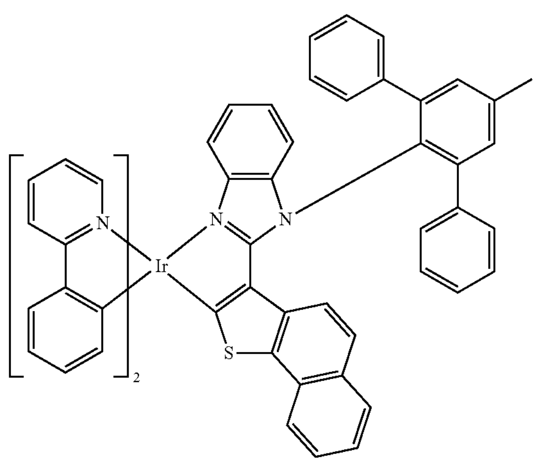

1224
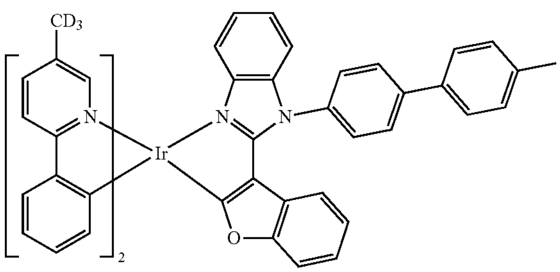
1225
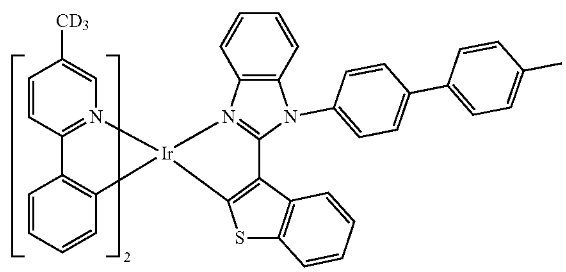
1226
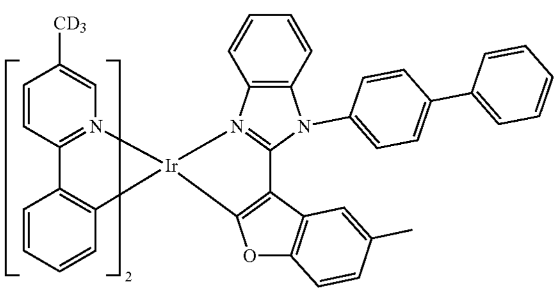
1227
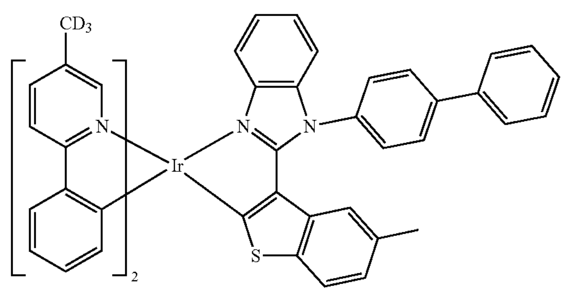
1228
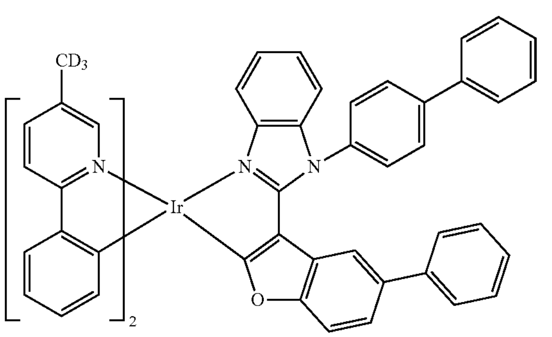
1229
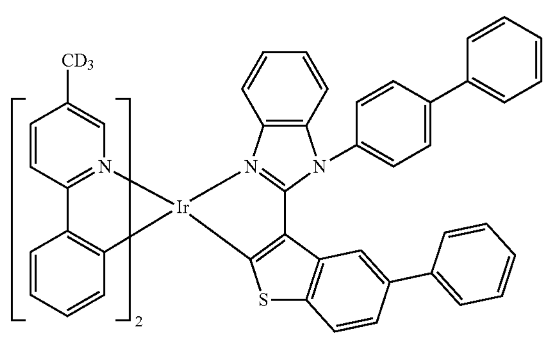
1230
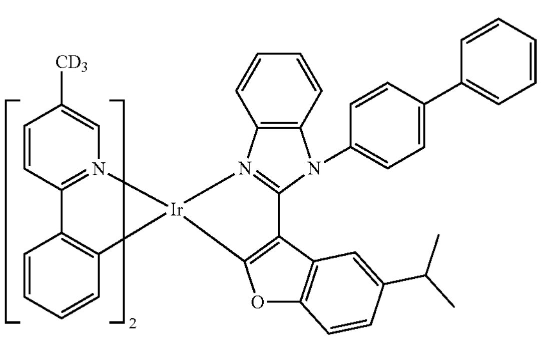
1231
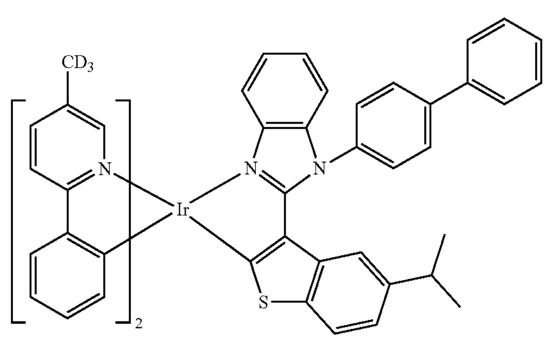

-continued
1232
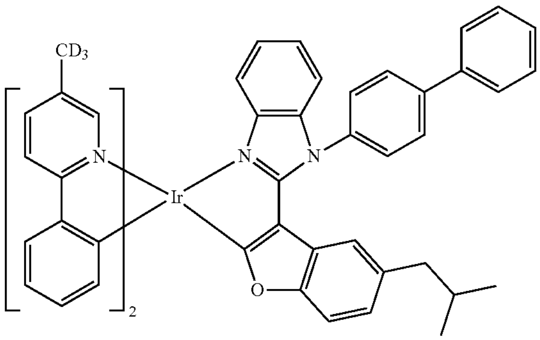
1233
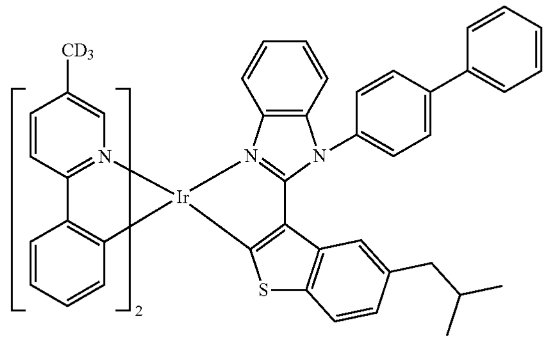
1234
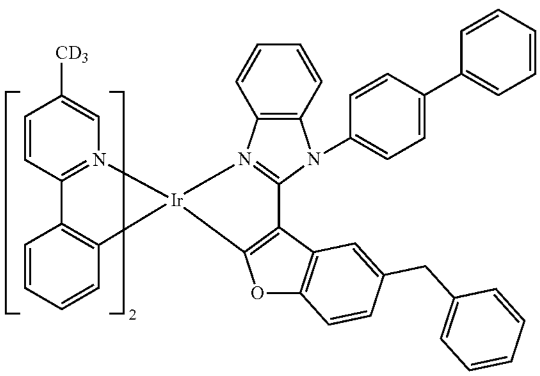
1235
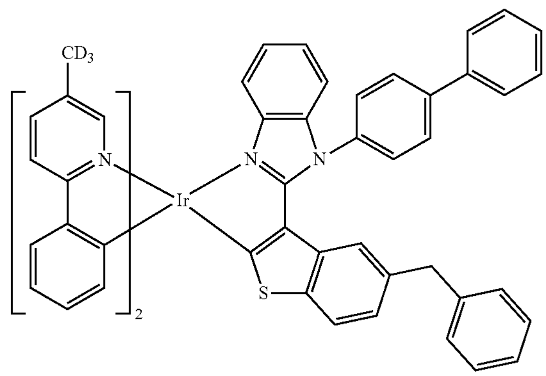
1236
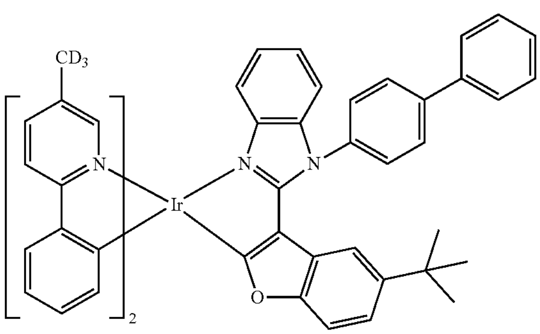
1237
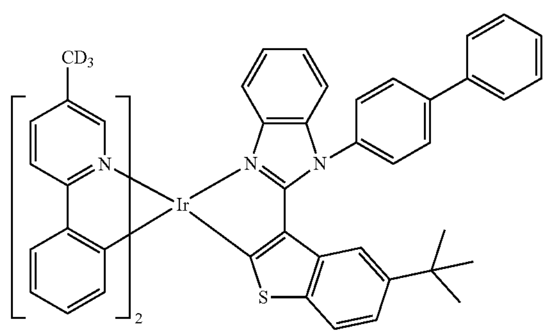
1238
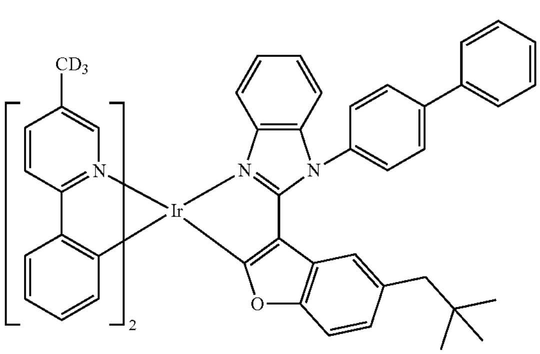
1239
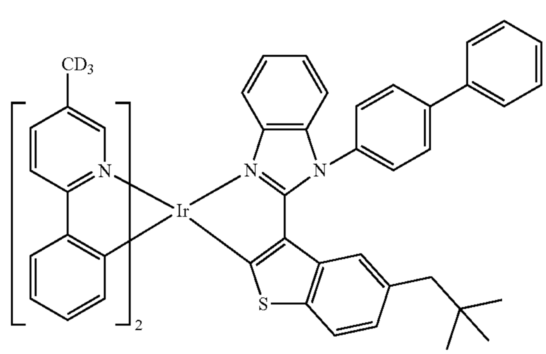

-continued
1240
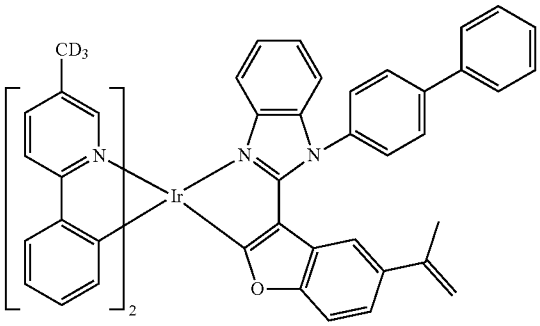
1241
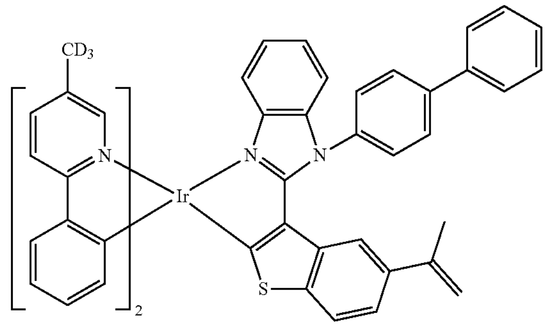
1242
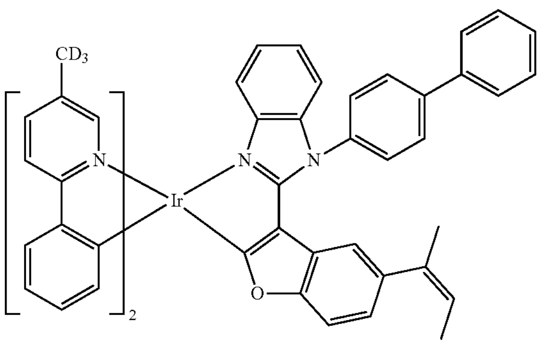
1243
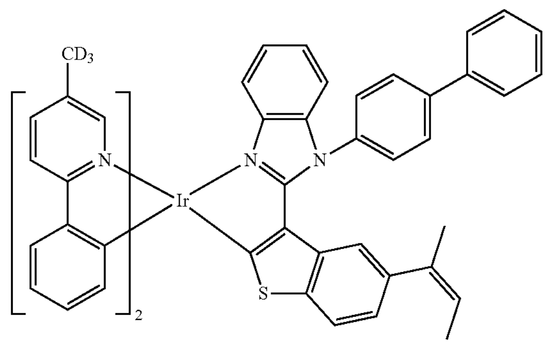
1244
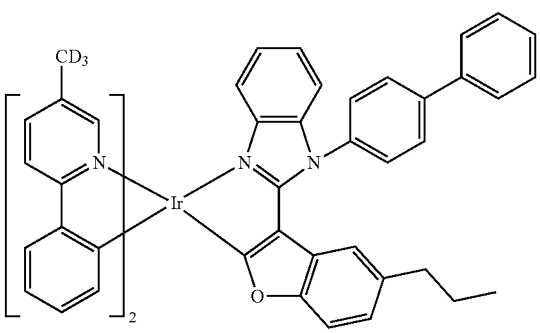
1245
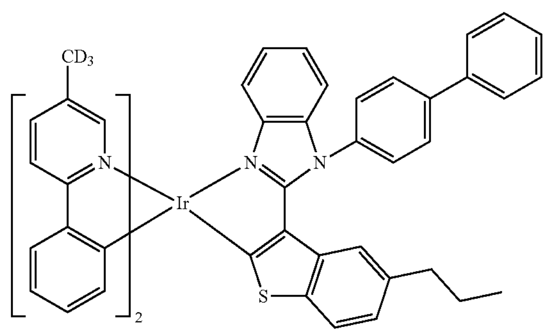
1246
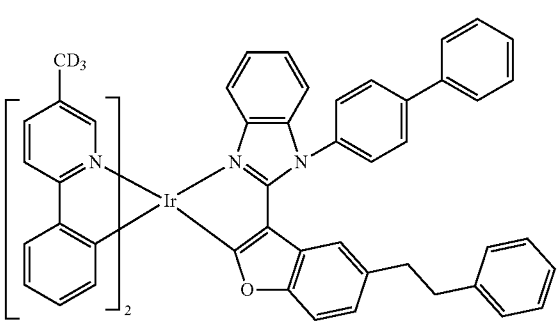
1247
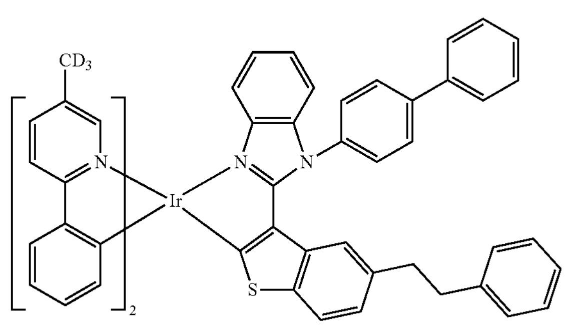

-continued
1248
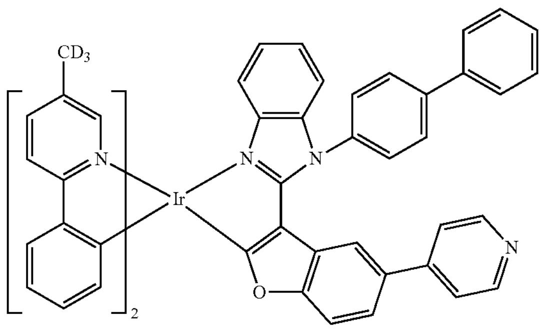
1249
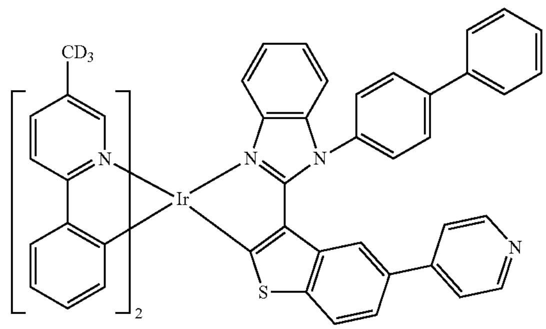
1250
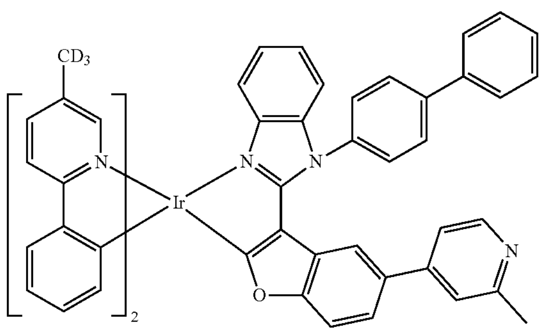
1251
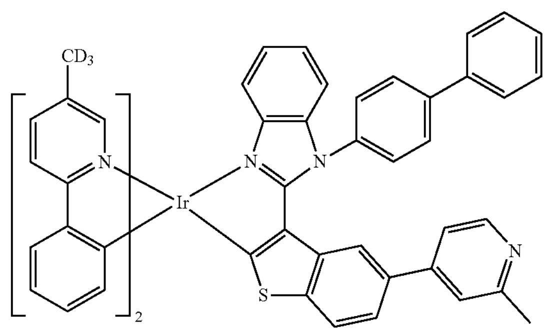
1252
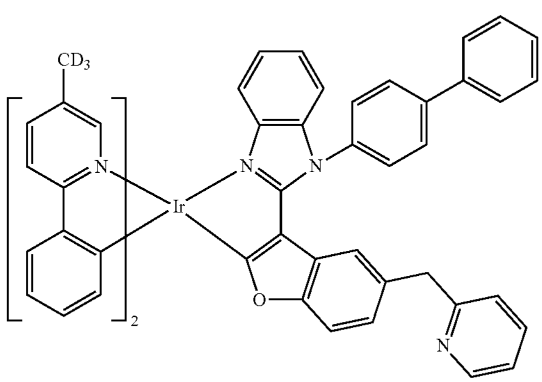
1253
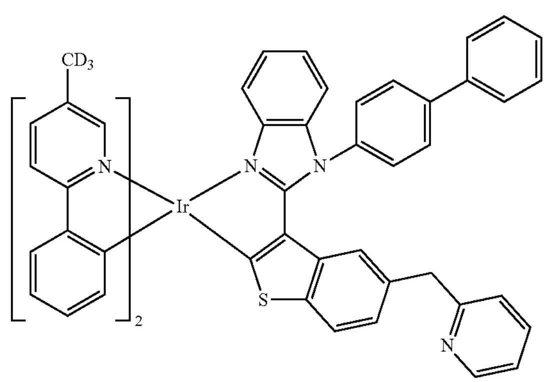
1254
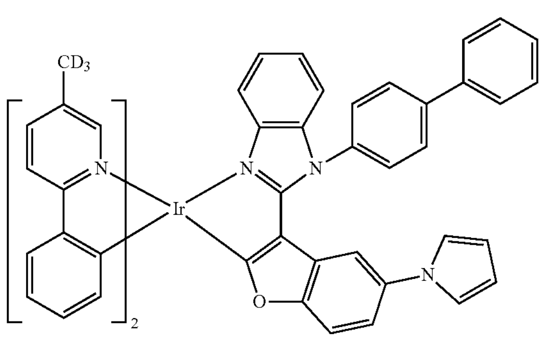
1255
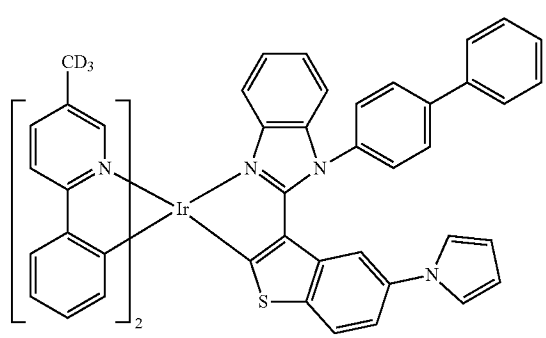

-continued
1256
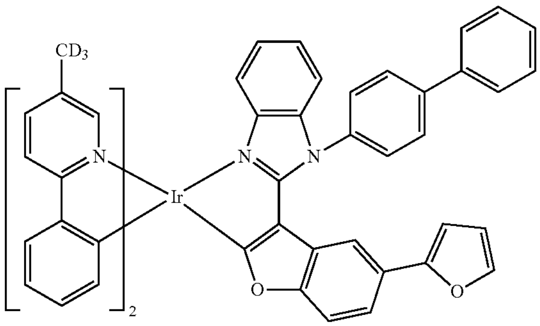
1257
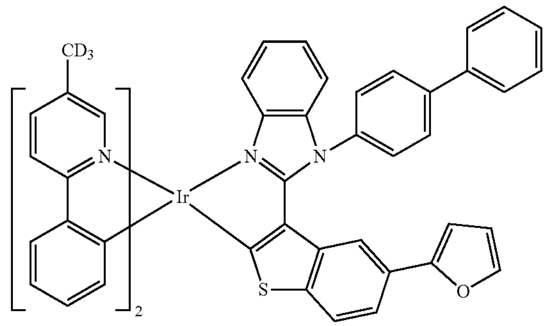
1258
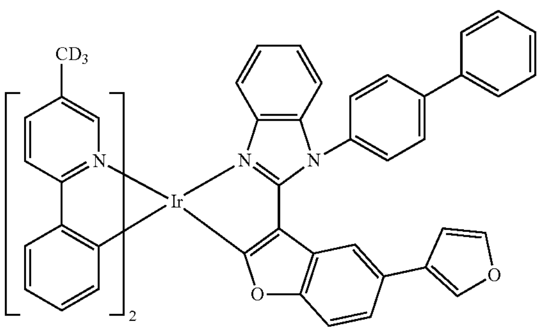
1259
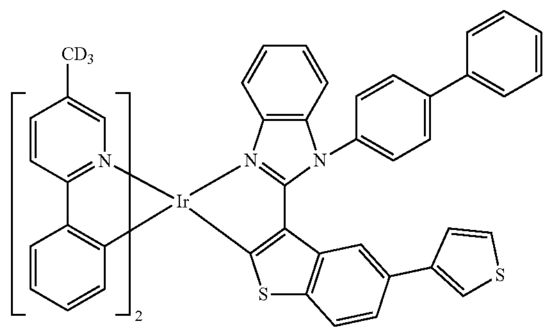
1260
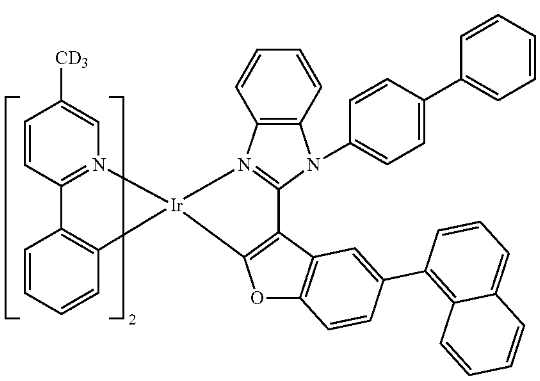
1261
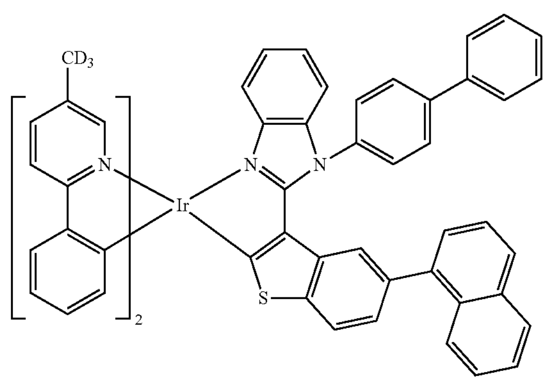
1262
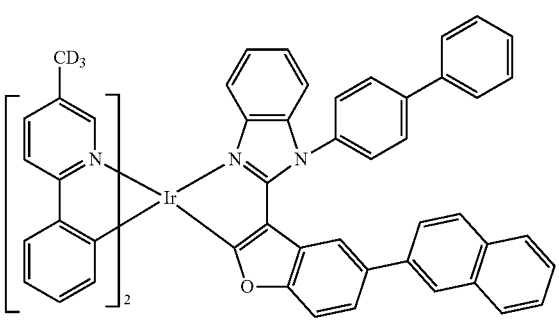
1263
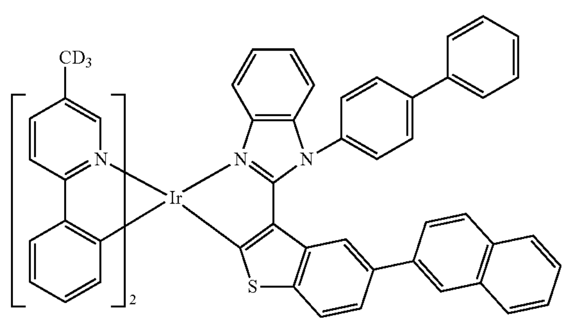

-continued
1264
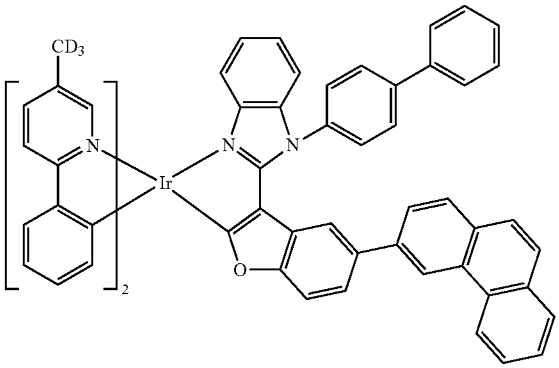
1265
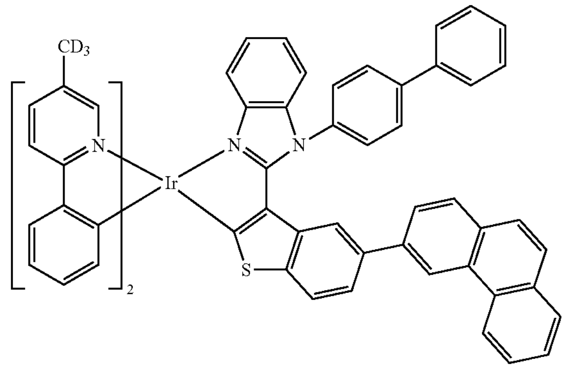
1266
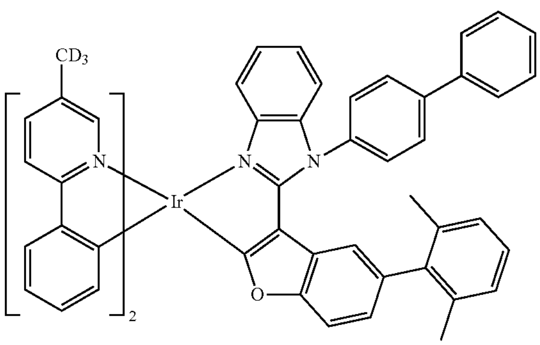
1267
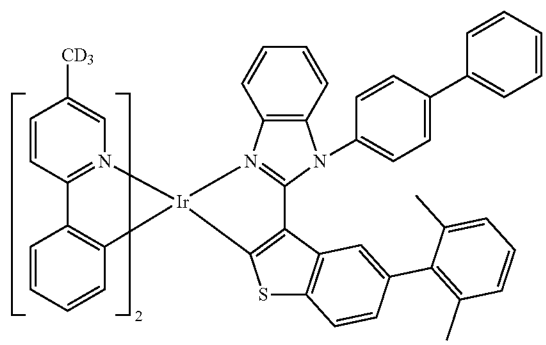
1268
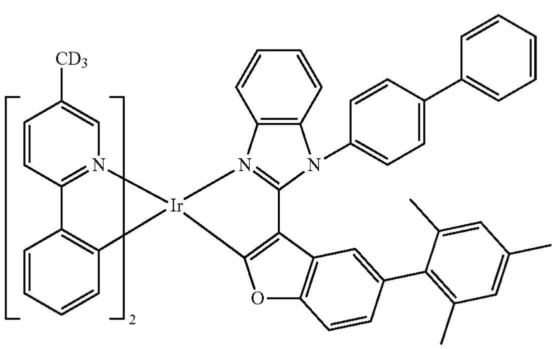
1269
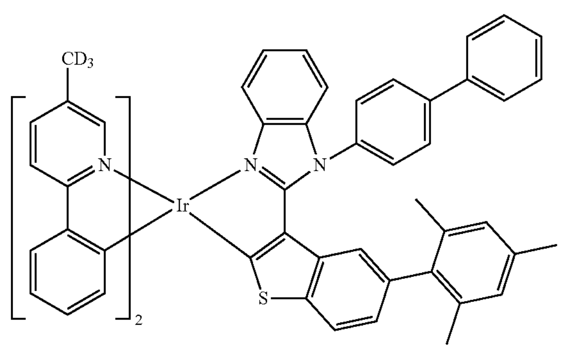
1270
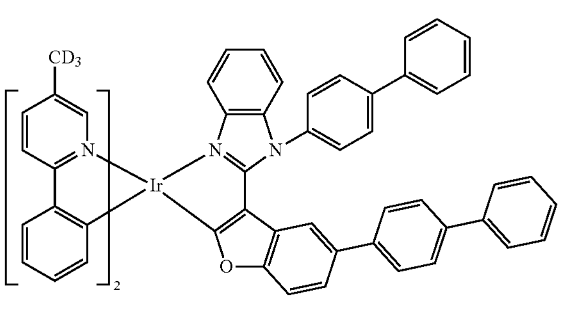
1271
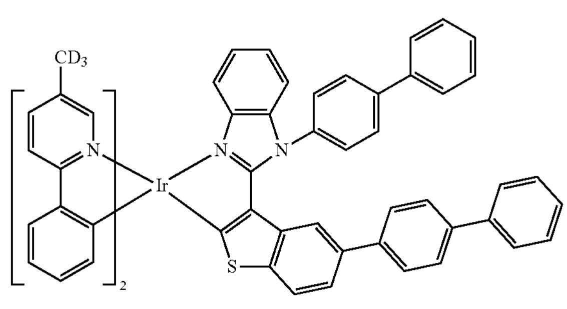

-continued
1272
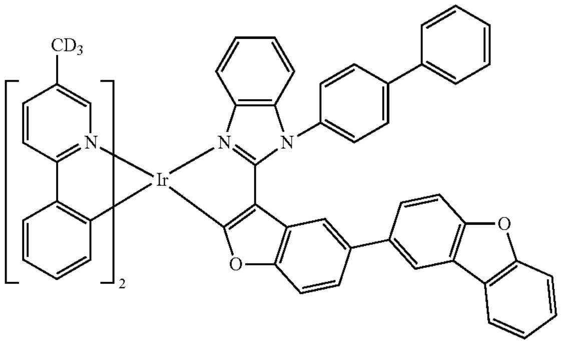
1273
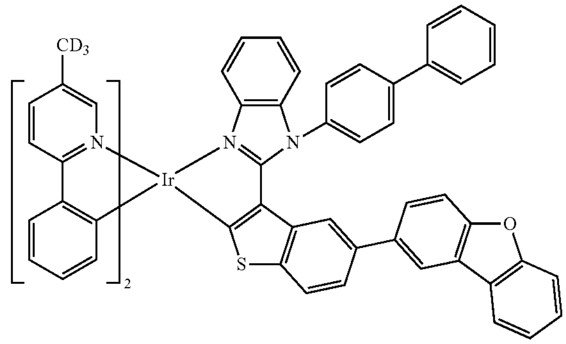
1274
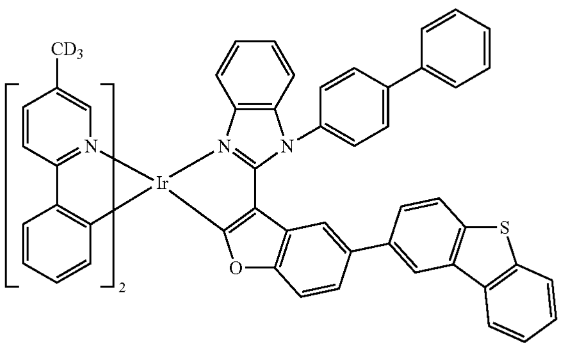
1275
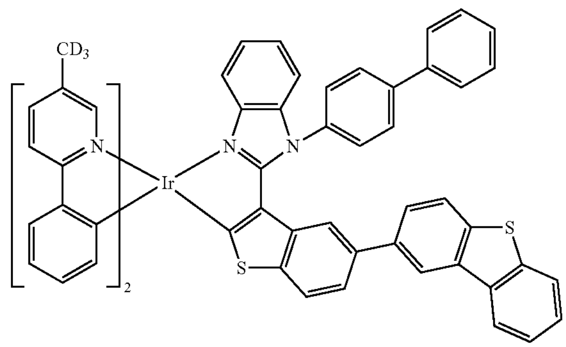
1276
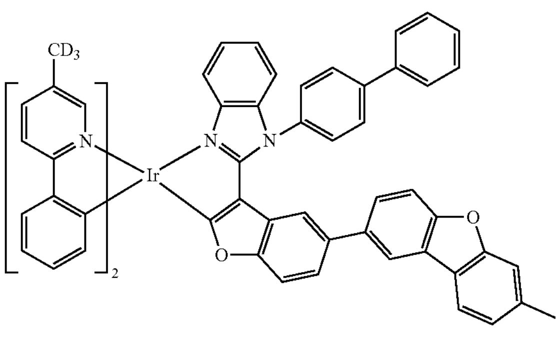
1277
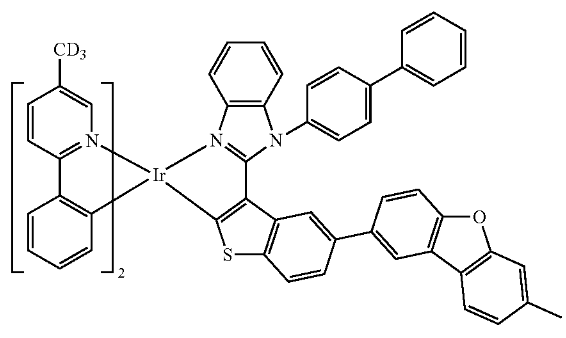
1278
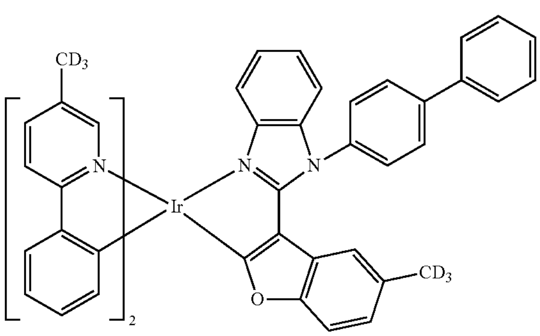
1279
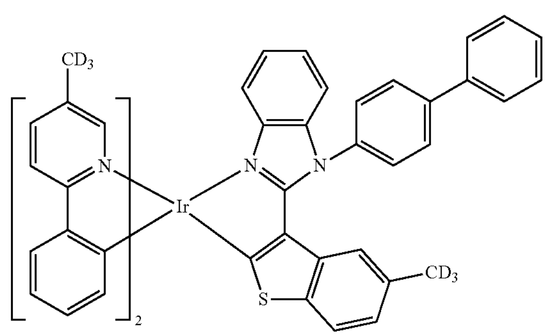

-continued
1280
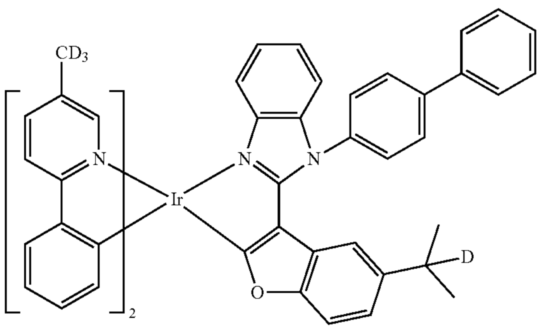
1281
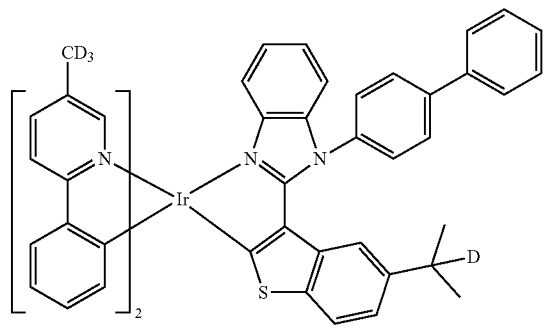
1282
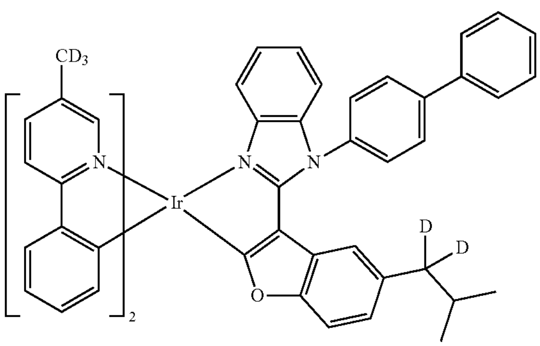
1283
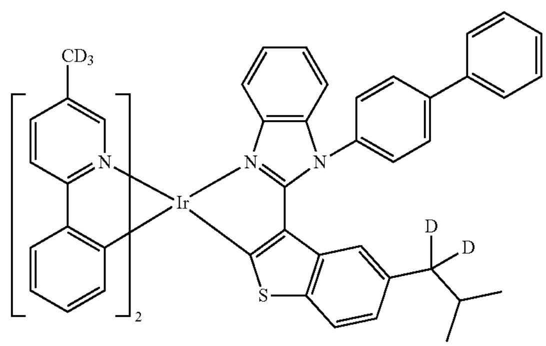
1284
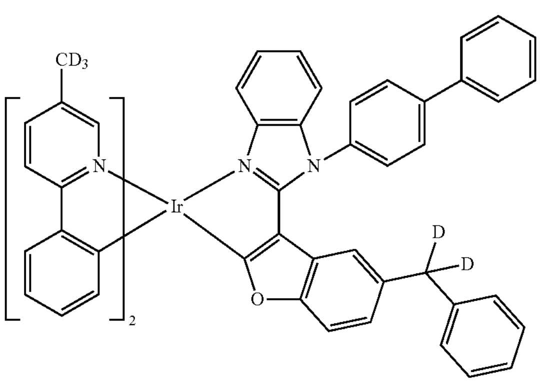
1285
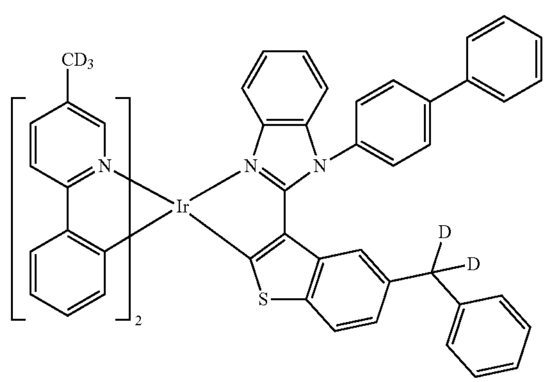
1286
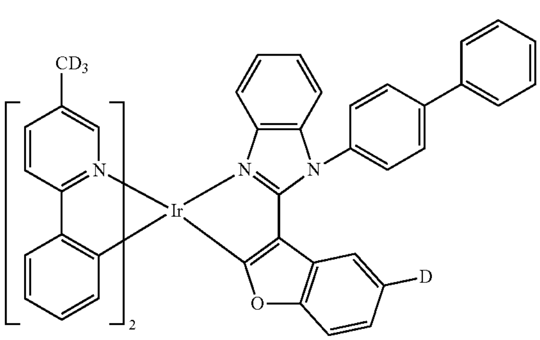
1287
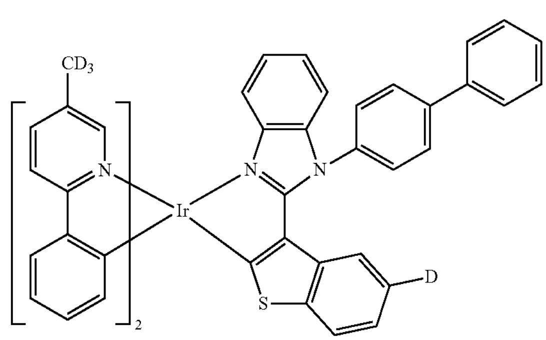

-continued
1288
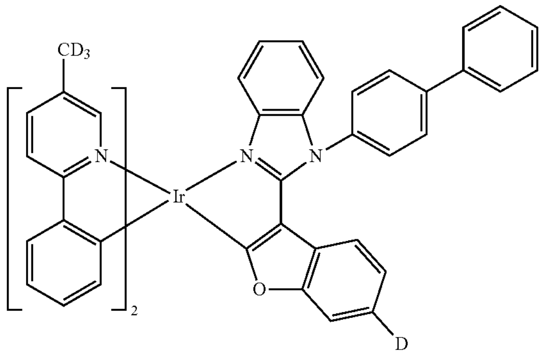
1289
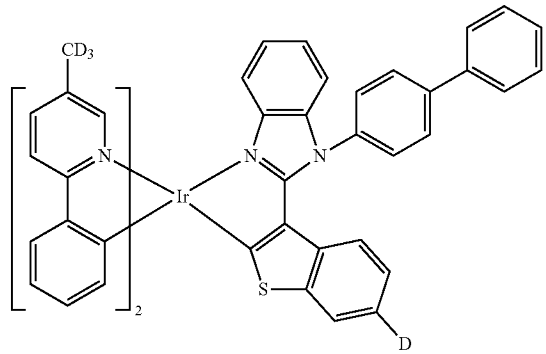
1290
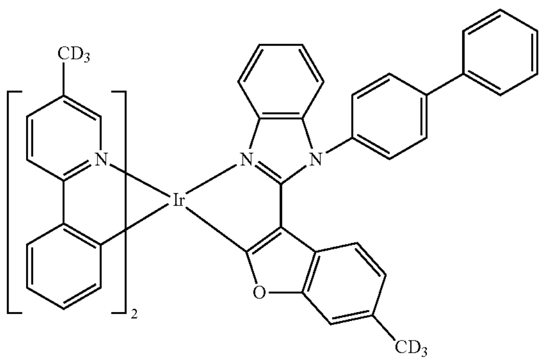
1291
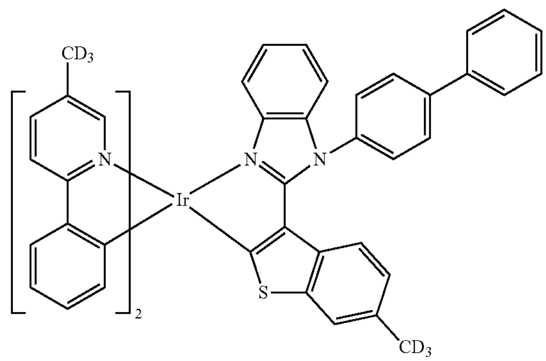
1292
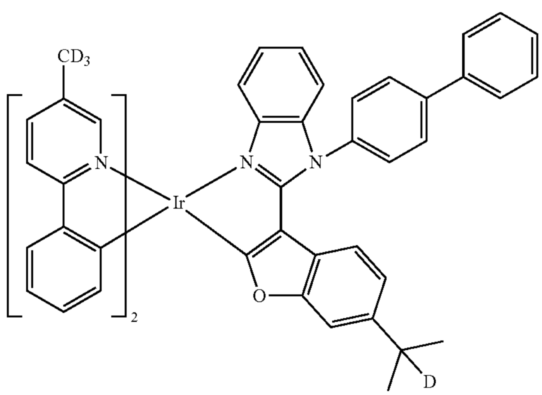
1293
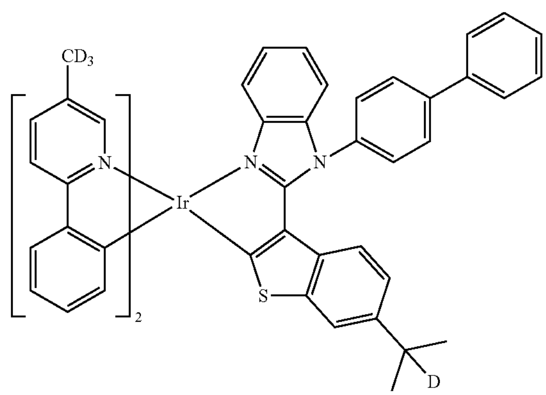
1294
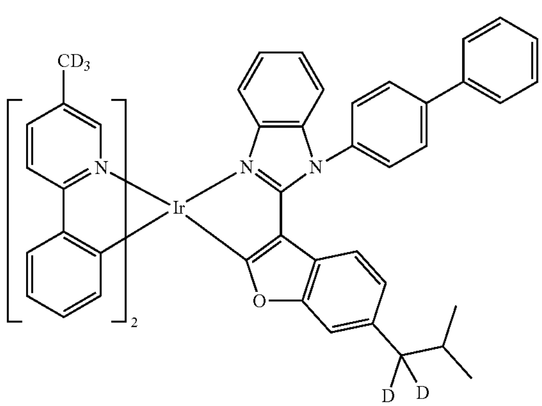
1295
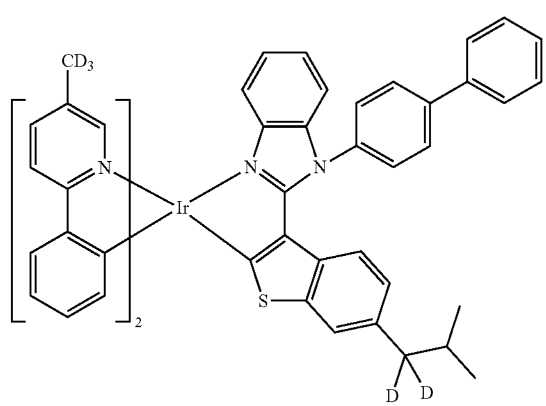

-continued
1296
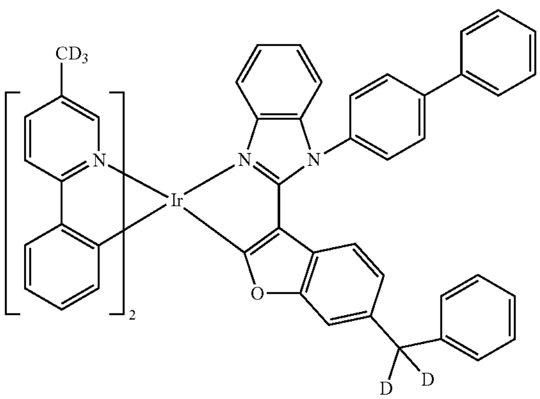
1297
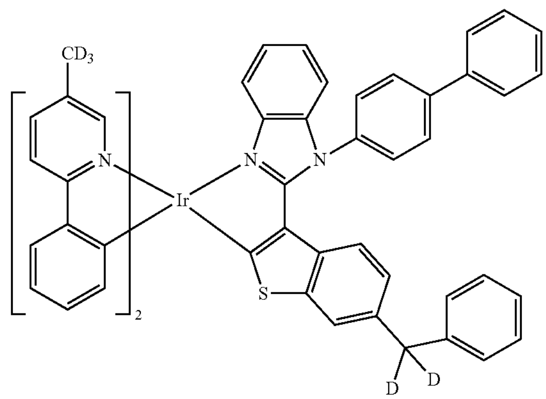
1298
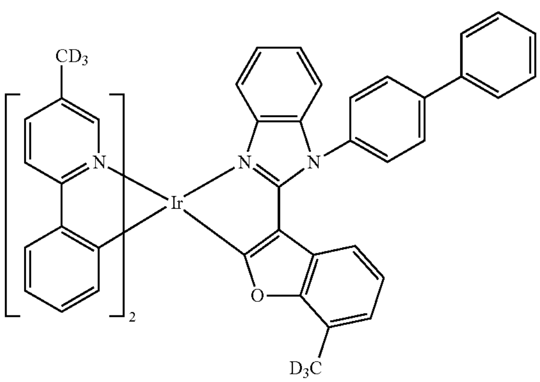
1299
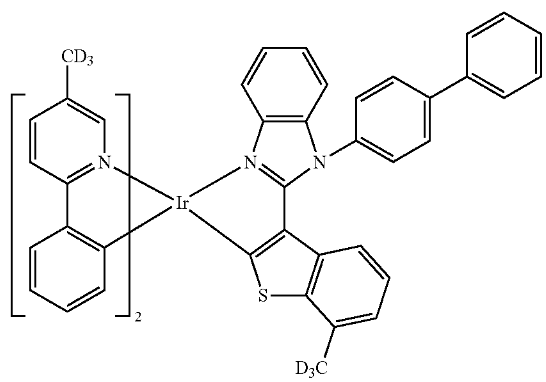
1300
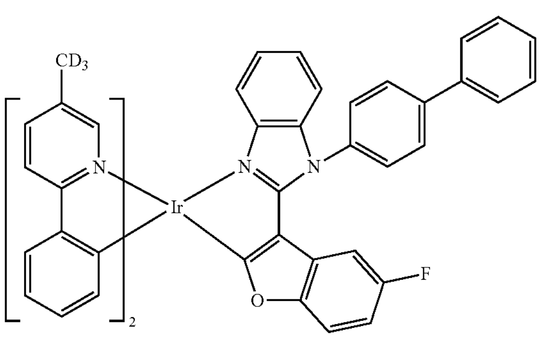
1301
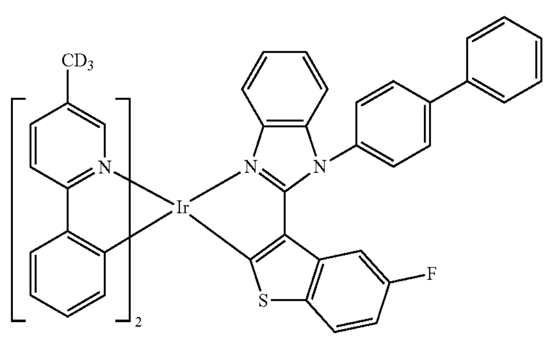
1302
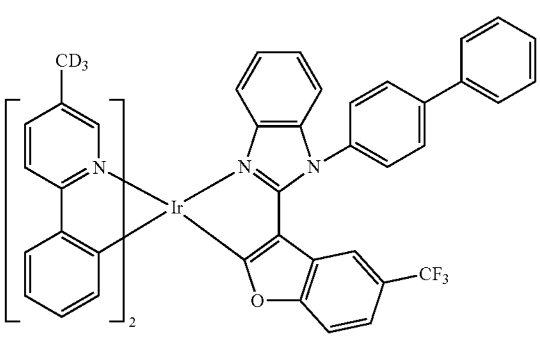
1303
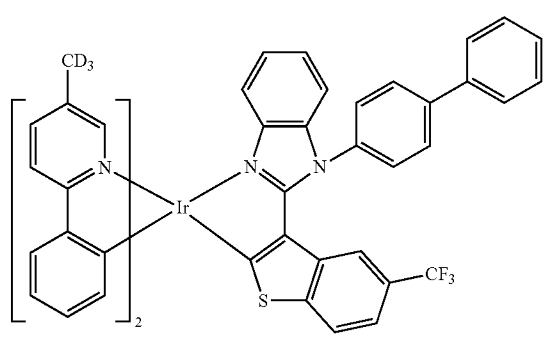

-continued
1304
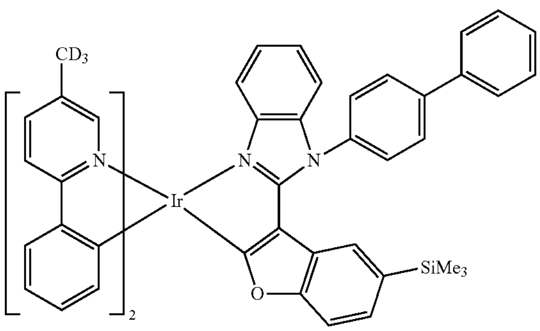
1305
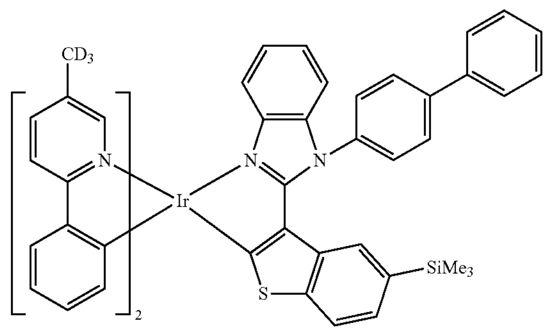
1306
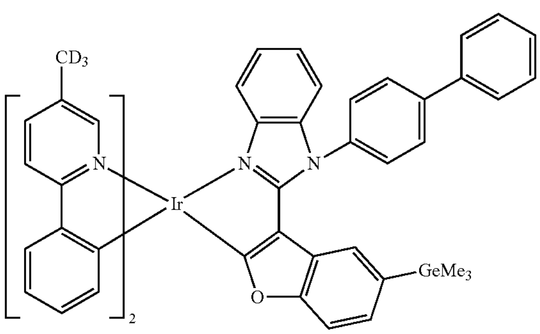
1307
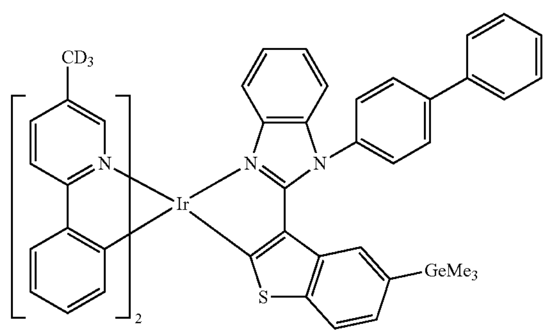
1308
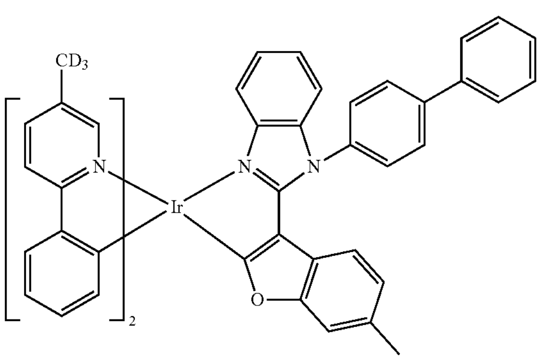
1309
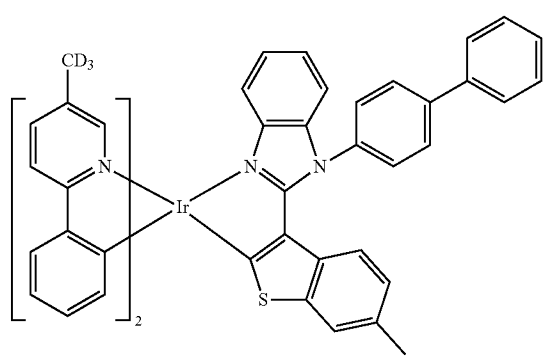
1310
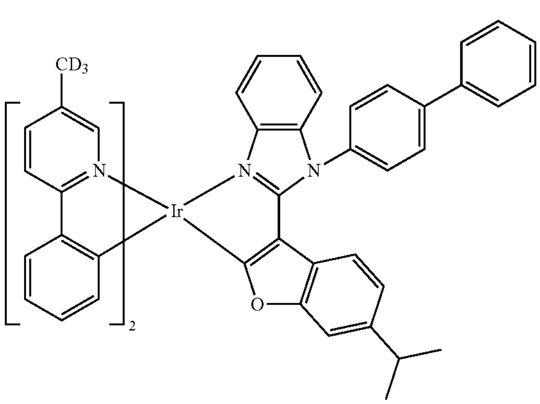
1311
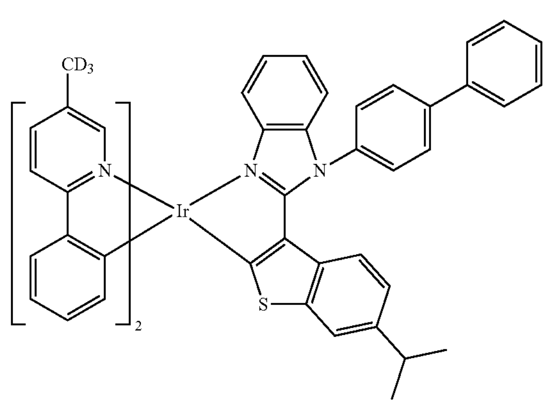

-continued
1312
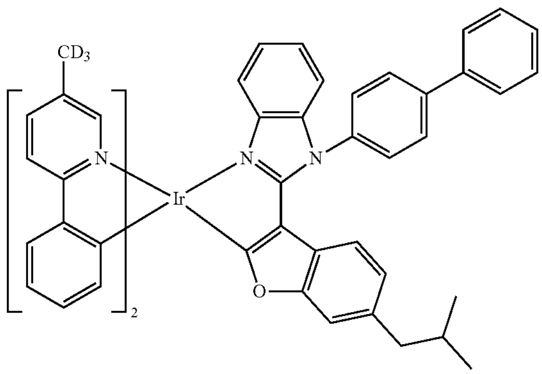
1313
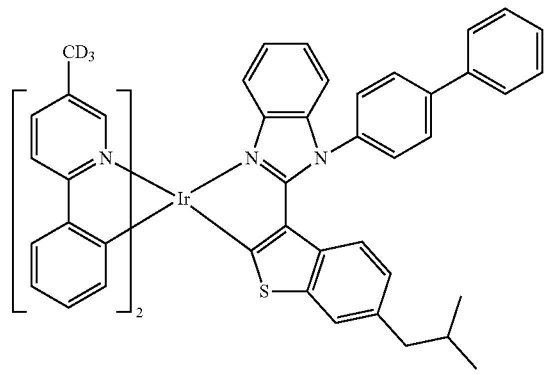
1314
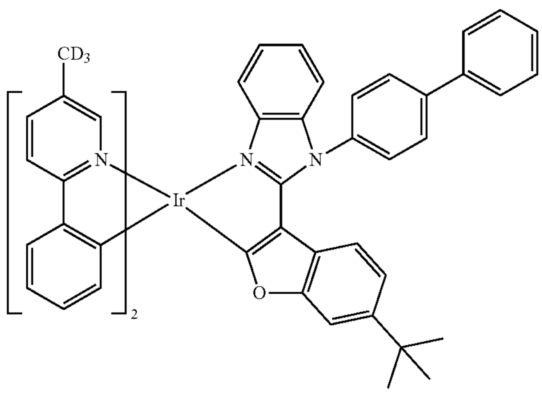
1315
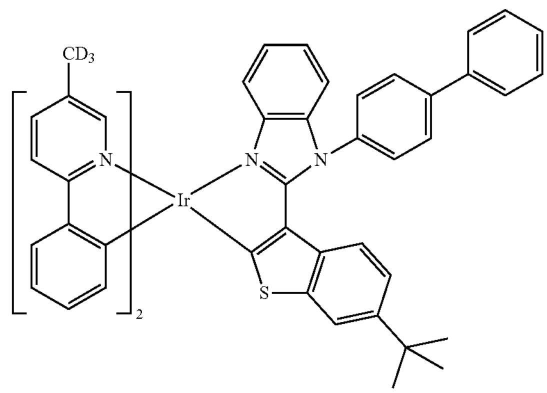
1316
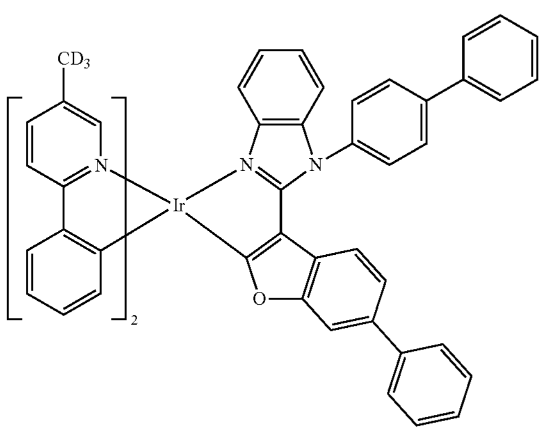
1317
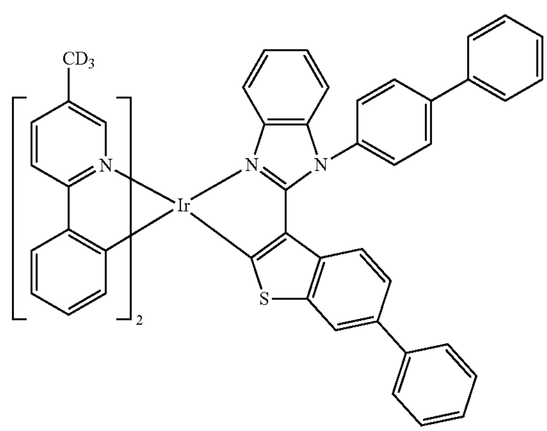
1318
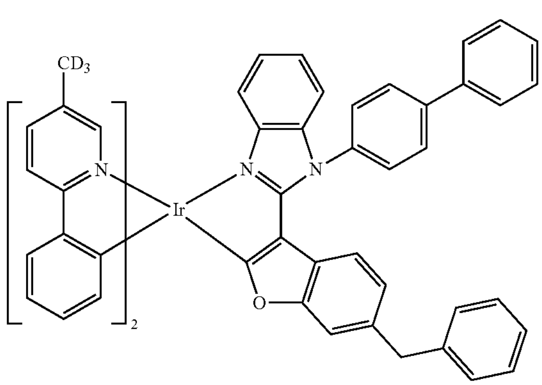
1319
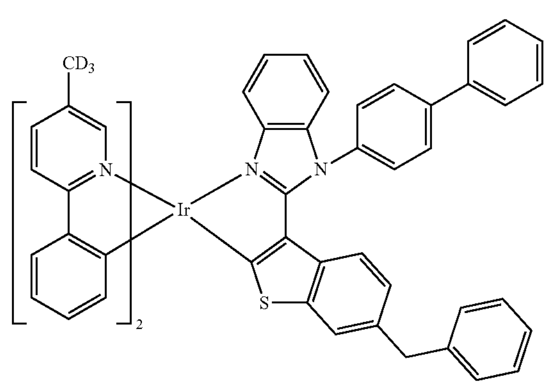

-continued
1320
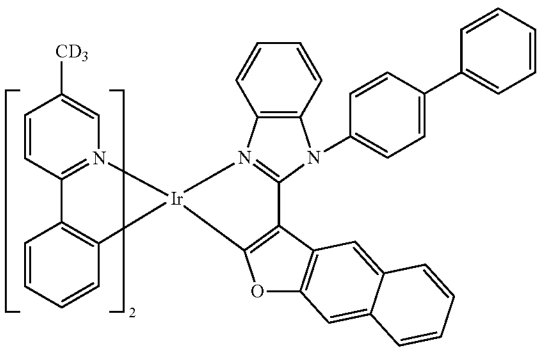
1321
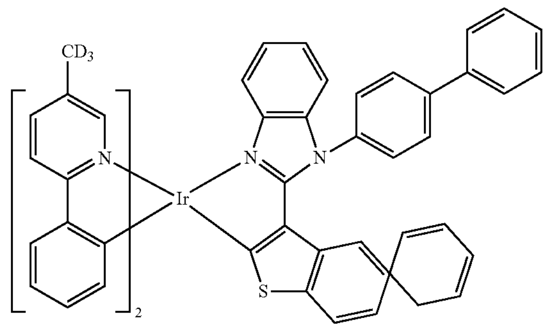
1322
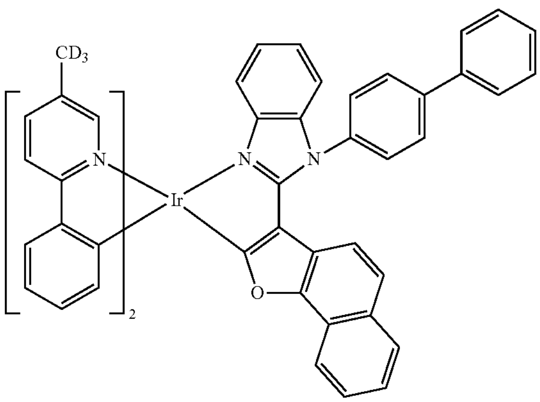
1323
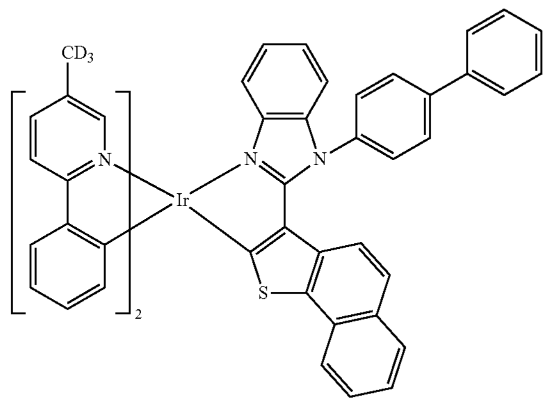
1324
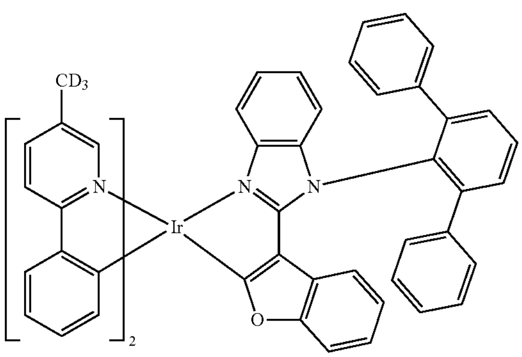
1325
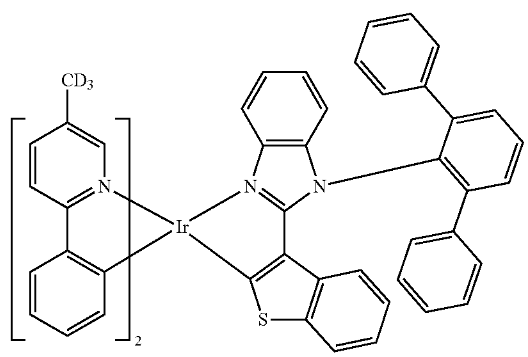
1326
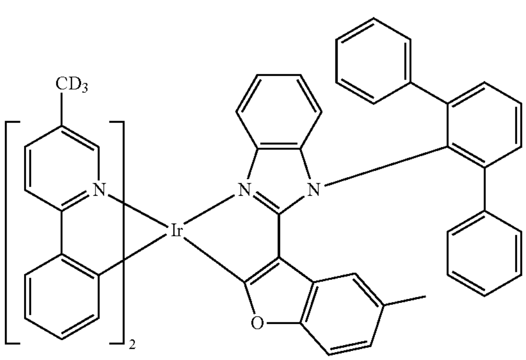
1327
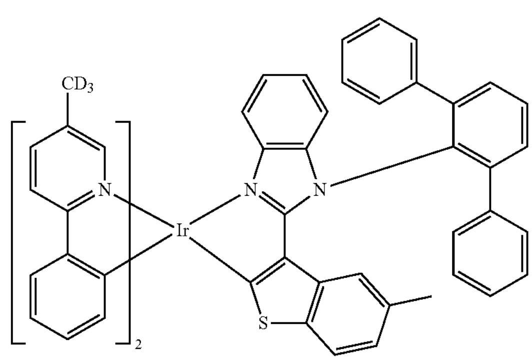

-continued
1328
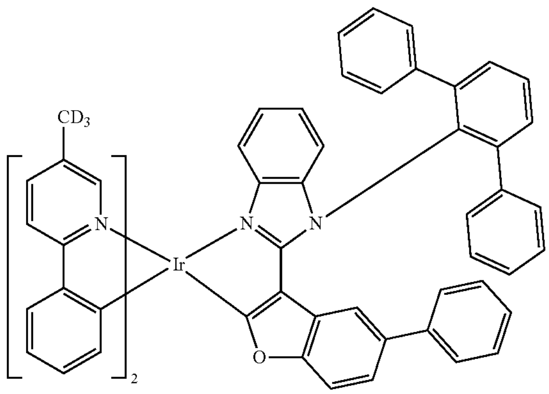
1329
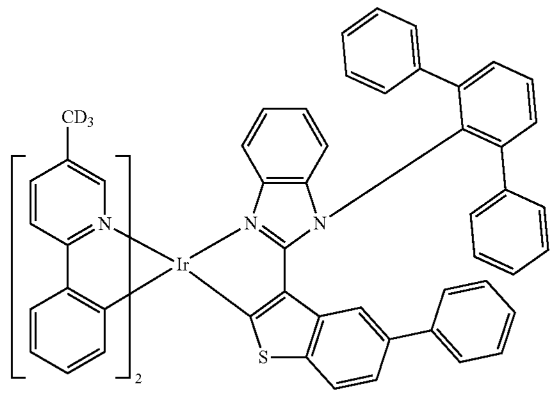
1330
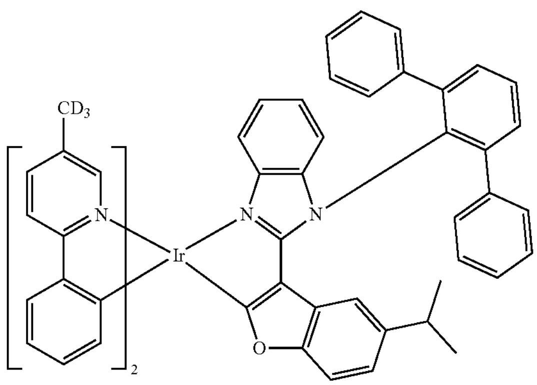
1331
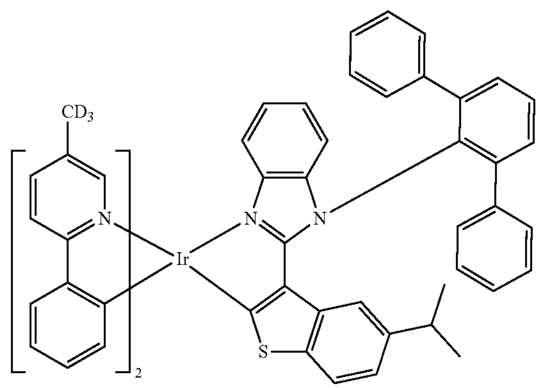
1332
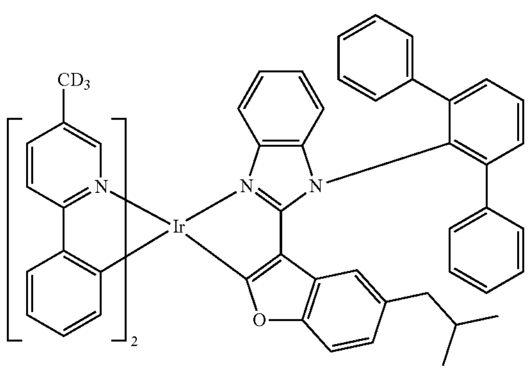
1333
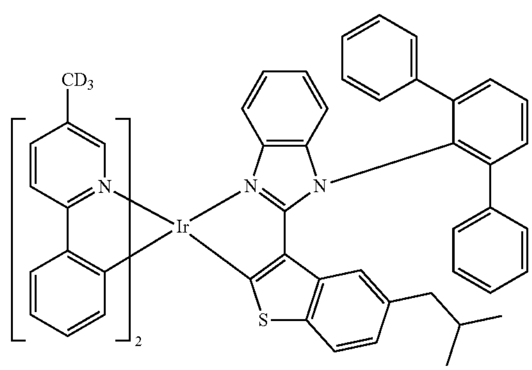
1334
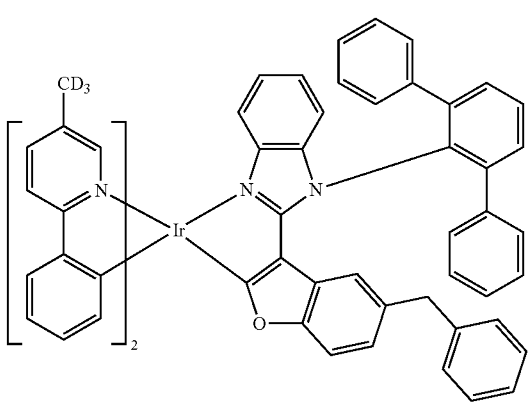
1335
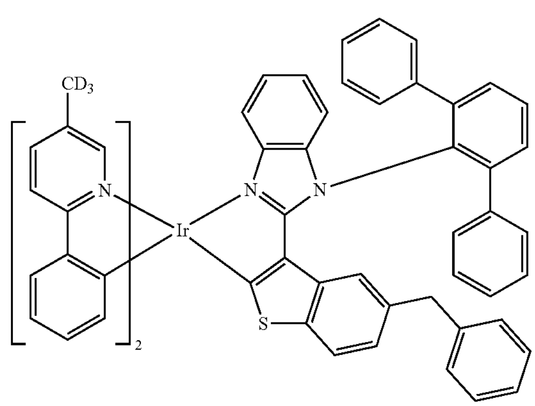

-continued
1336
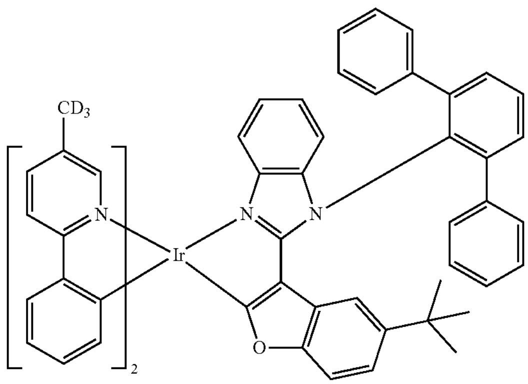
1337
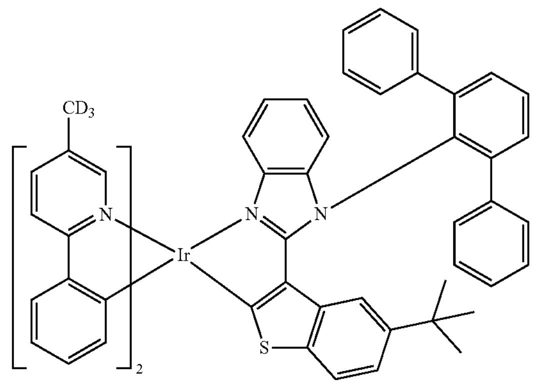
1338
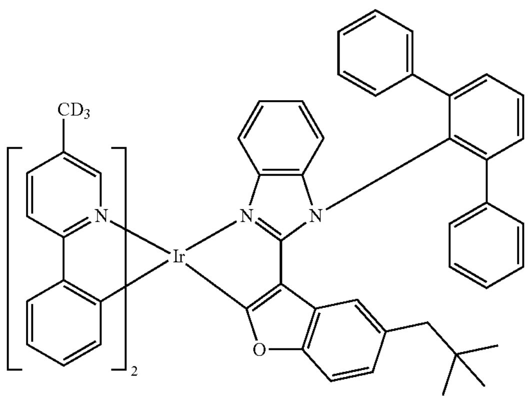
1339
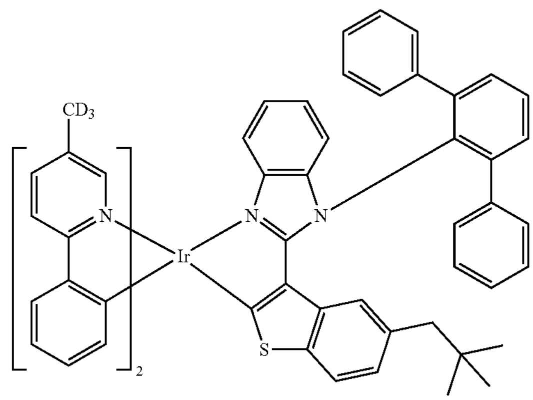
1340
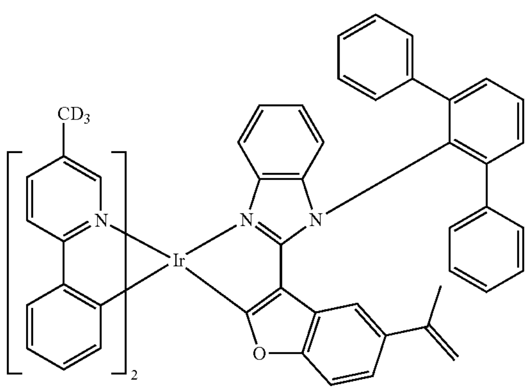
1341
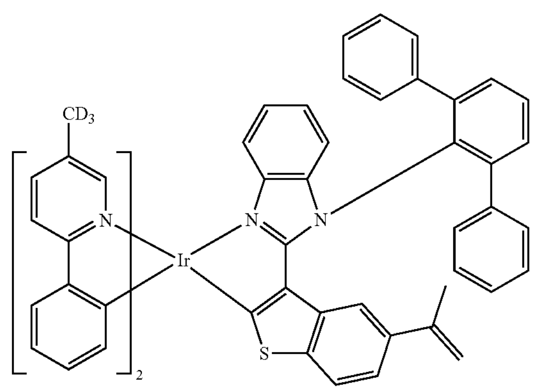
1342
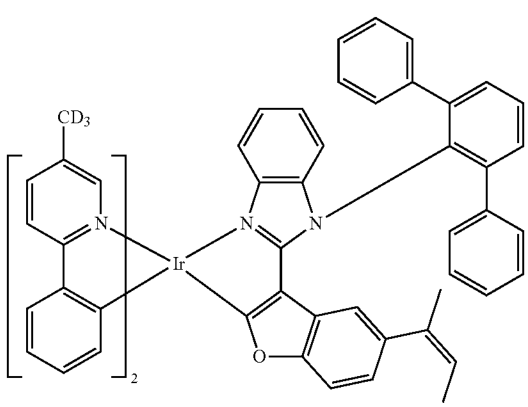
1343
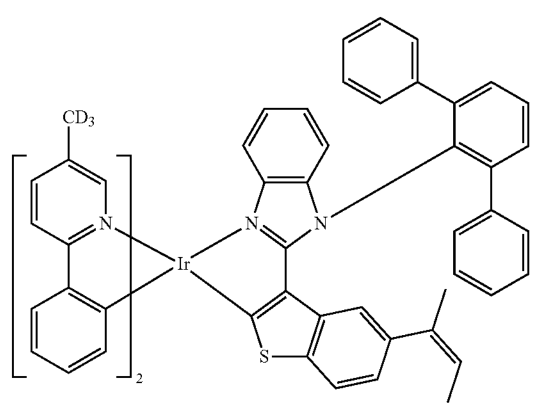

-continued
1344
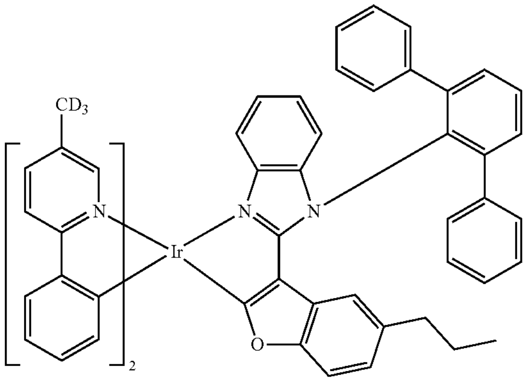
1345
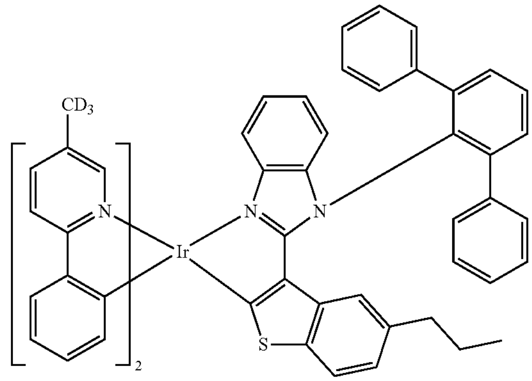
1346
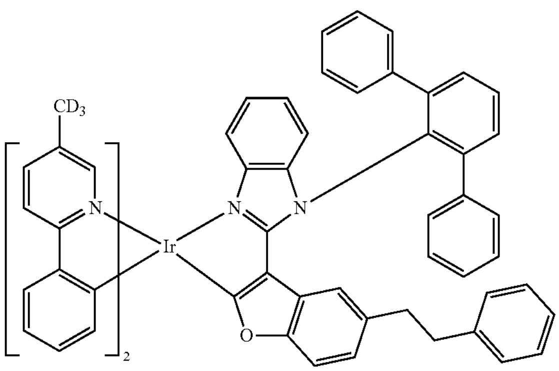
1347
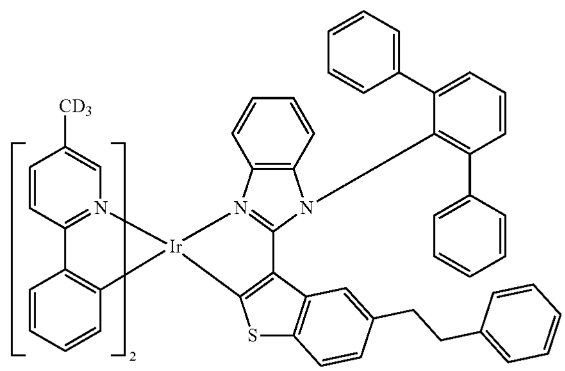
1348
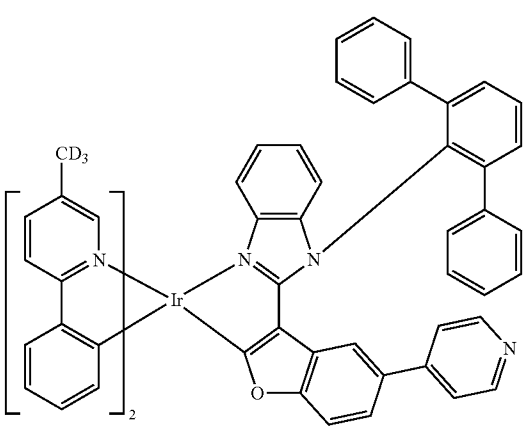
1349
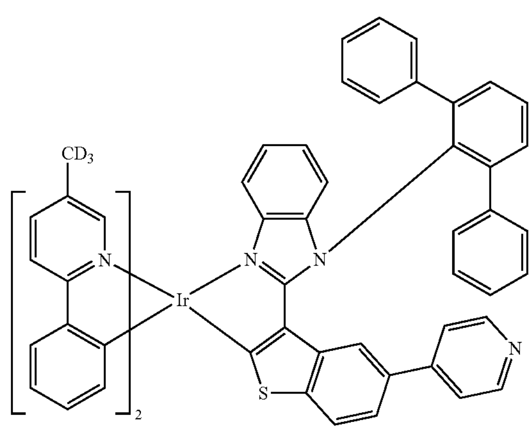

-continued
1350
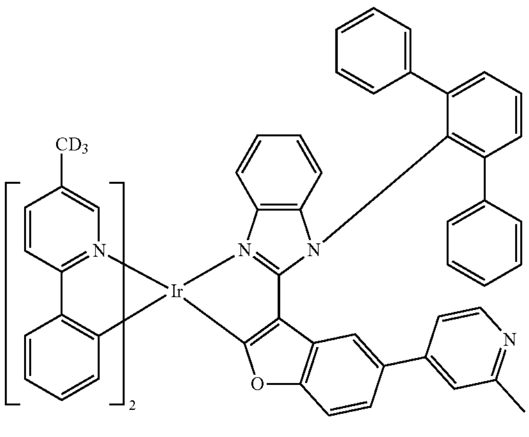
1351
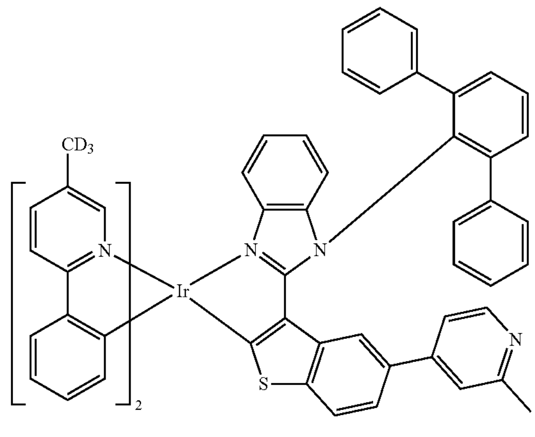
1352
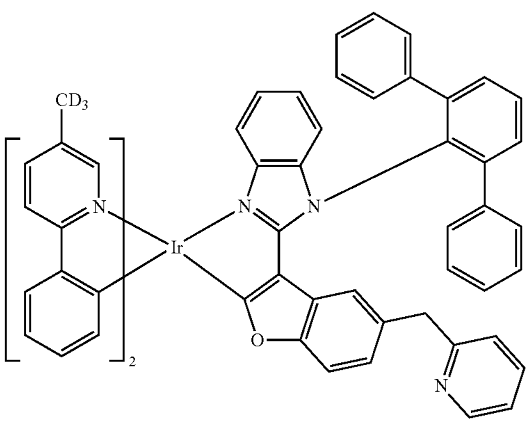
1353
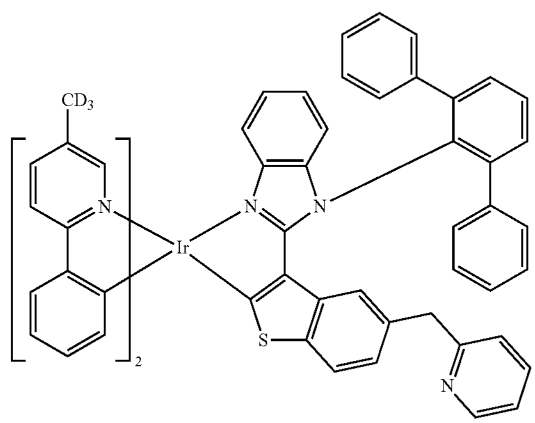
1354
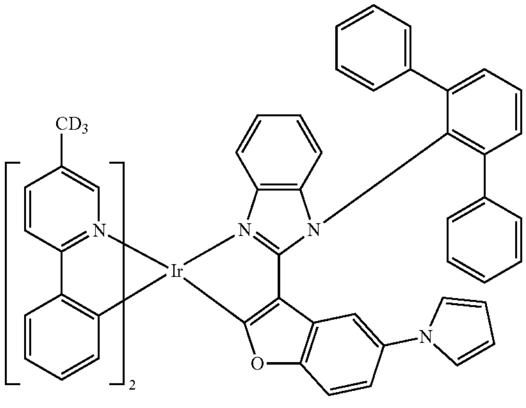
1355
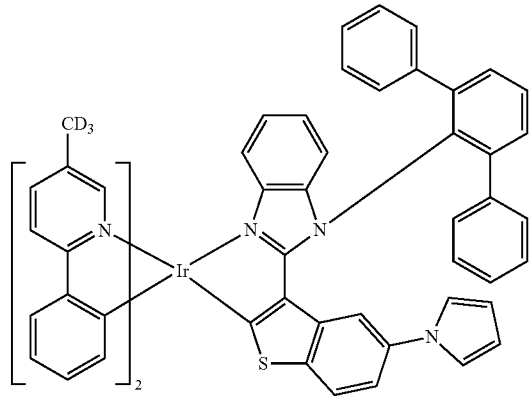

-continued
1356
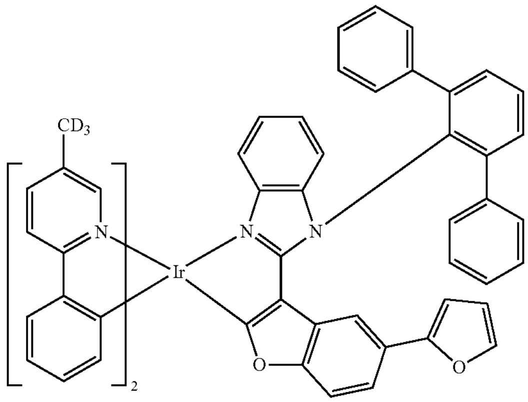
1357
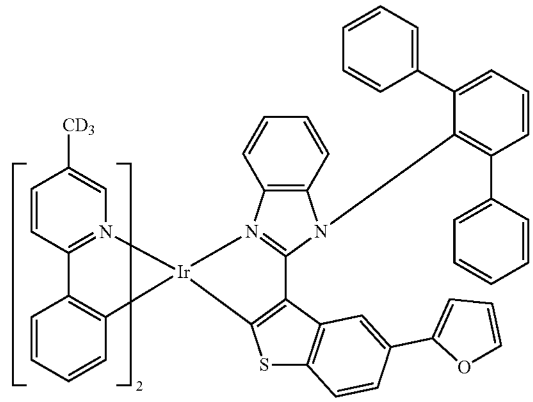
1358
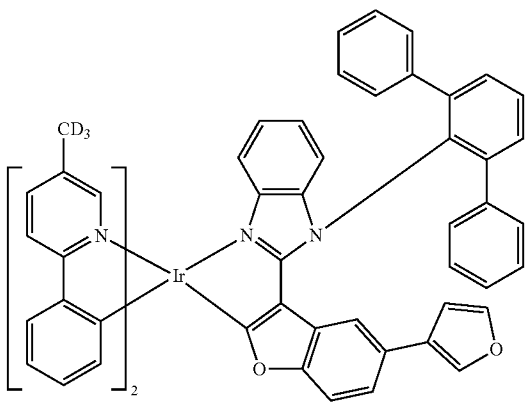
1359
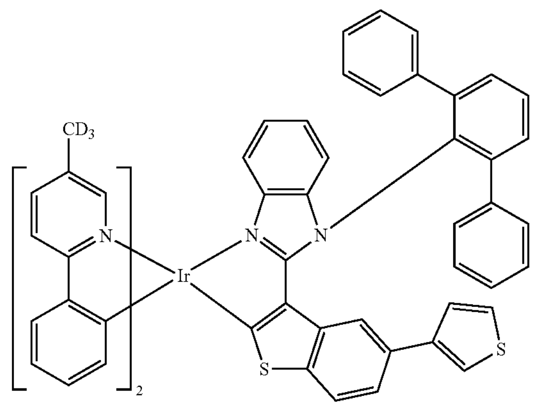
1360
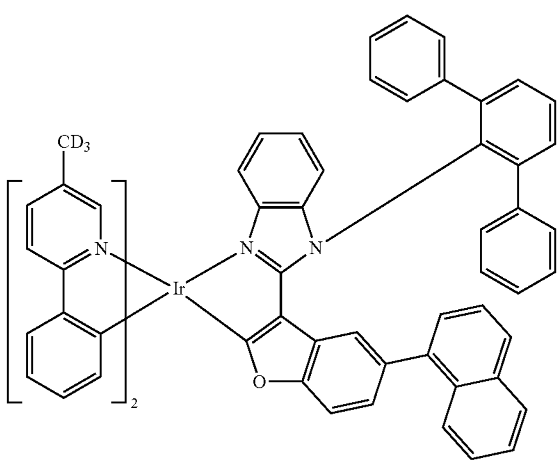
1361
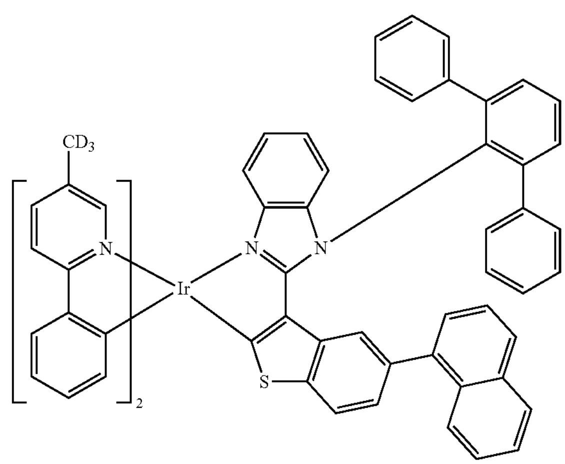

-continued
1362
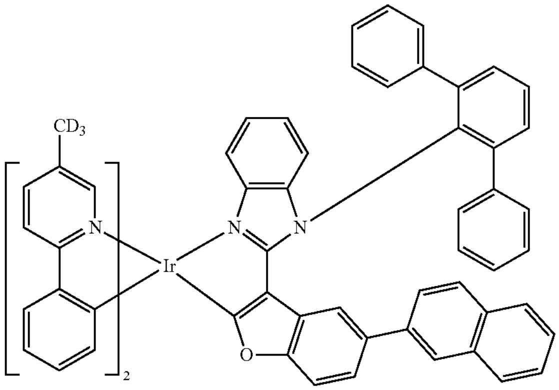
1363
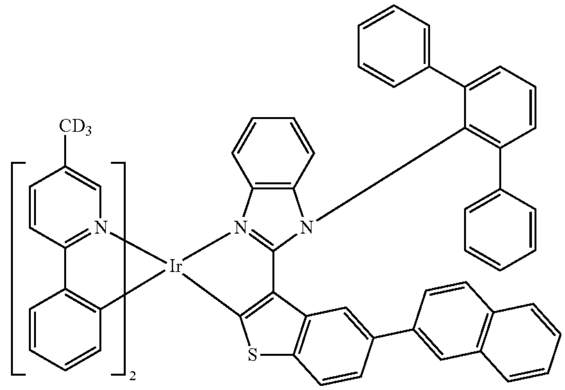
1364
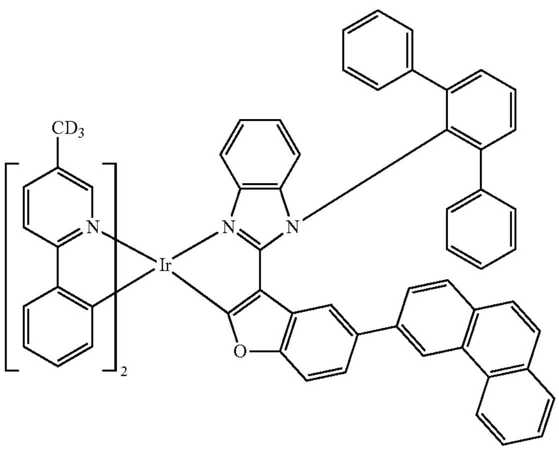
1365
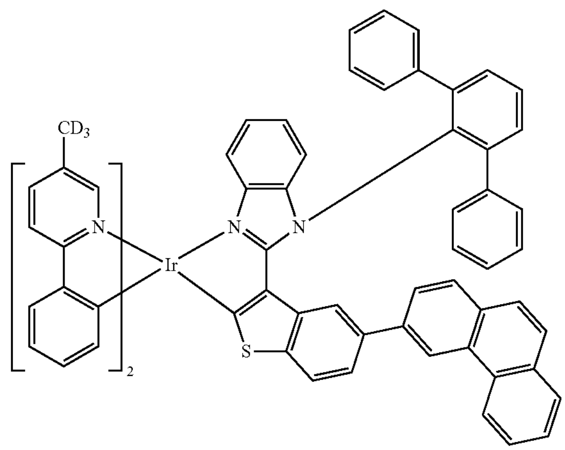
1366
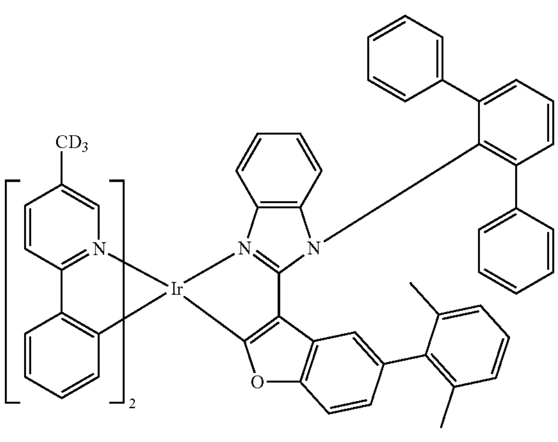
1367
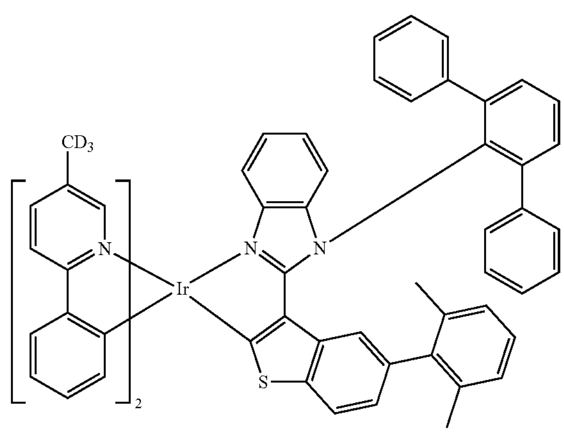

-continued
1368
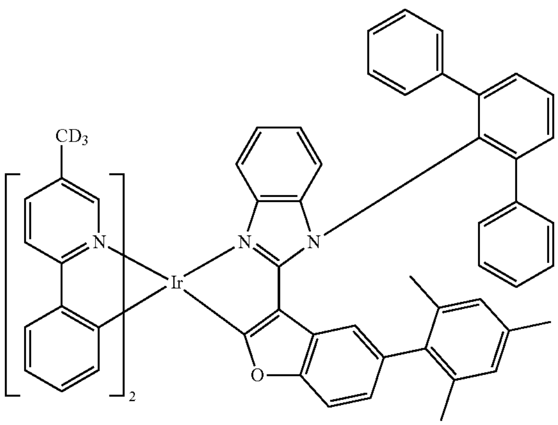
1369
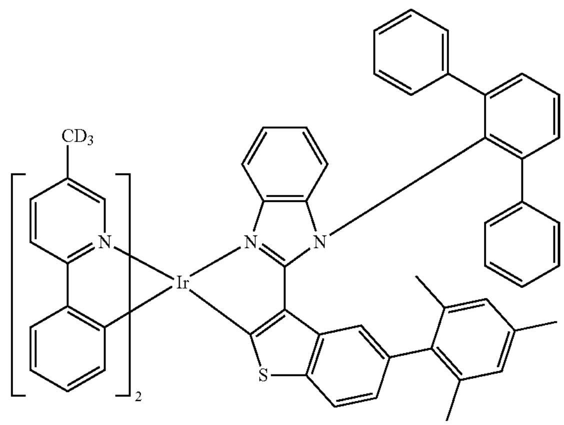
1370
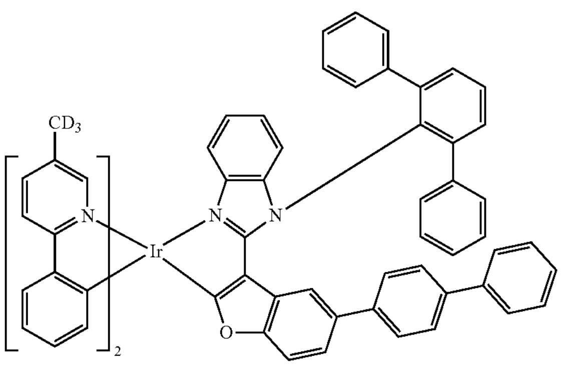
1371
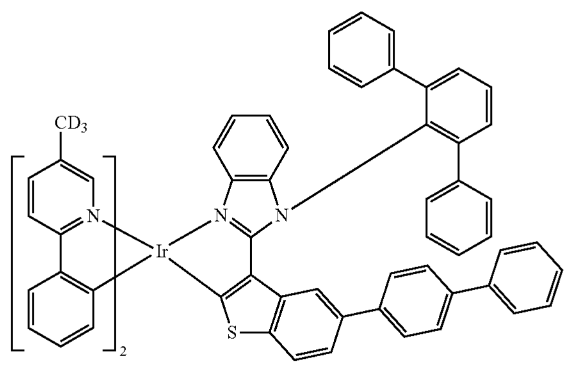
1372
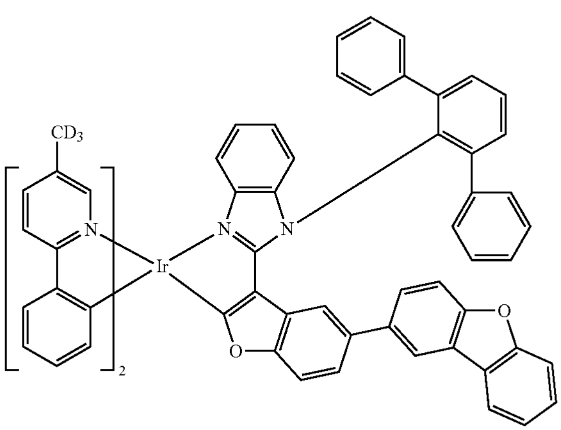
1373
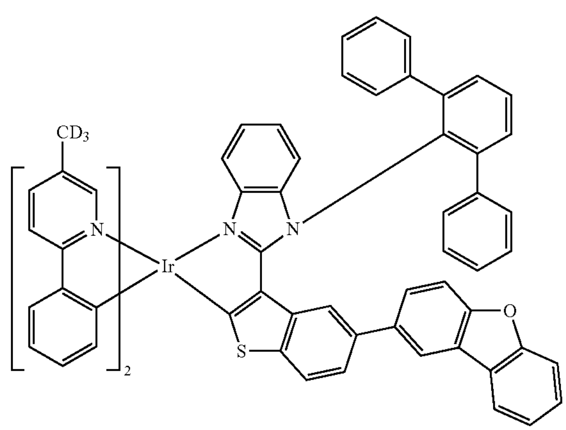

-continued
1374
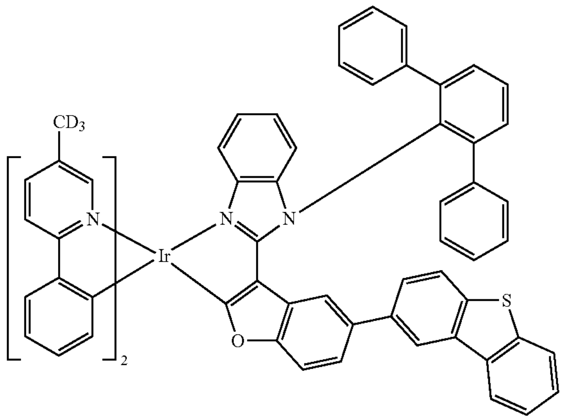
1375
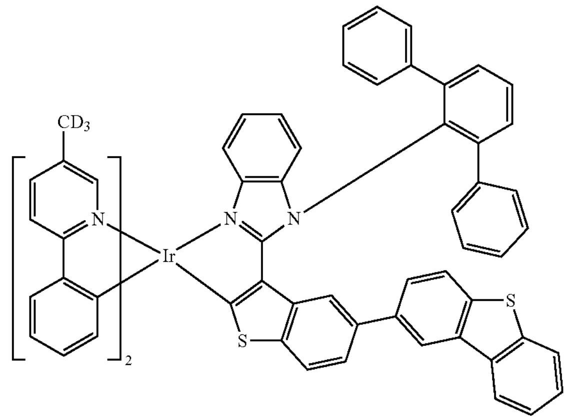
1376
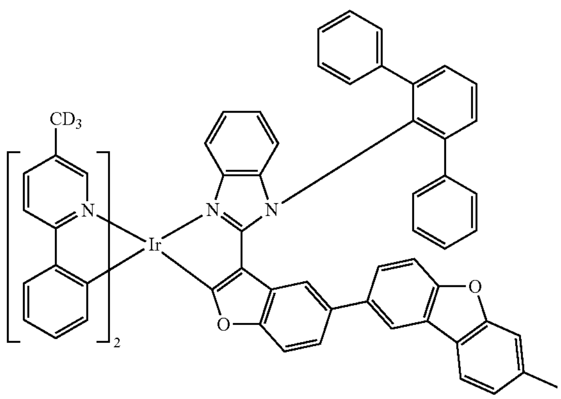
1377
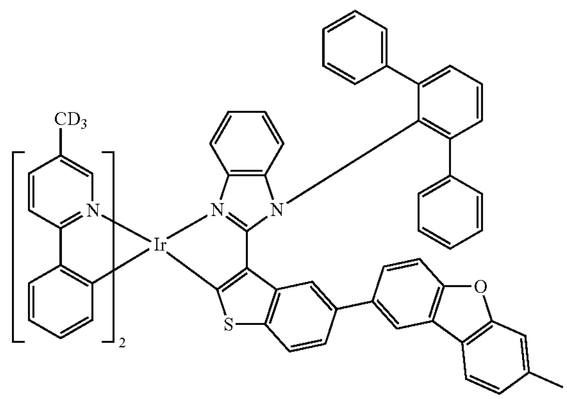
1378
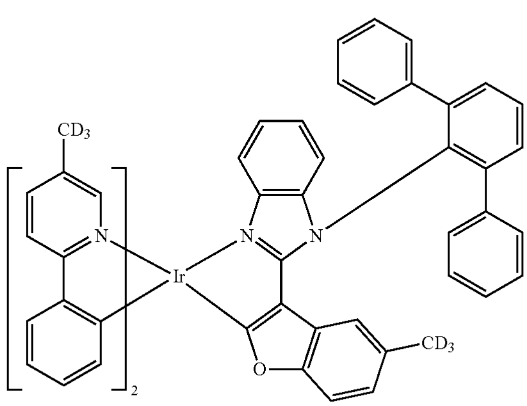
1379
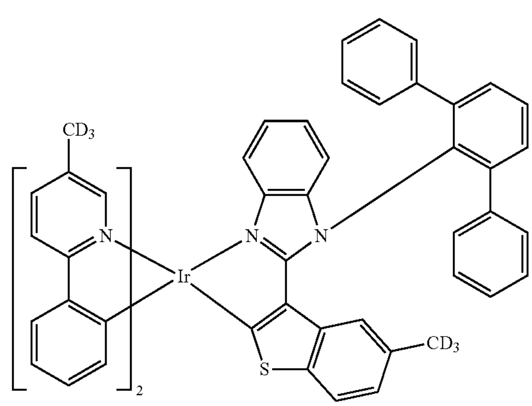

-continued
1380
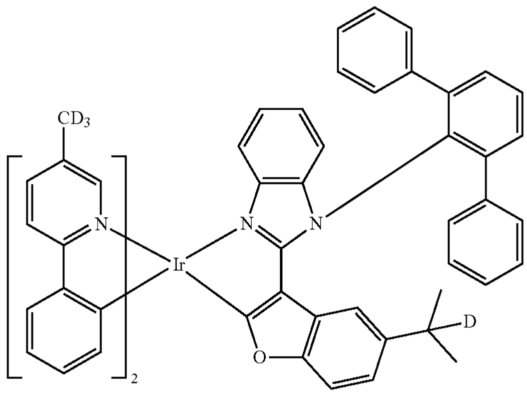
1381
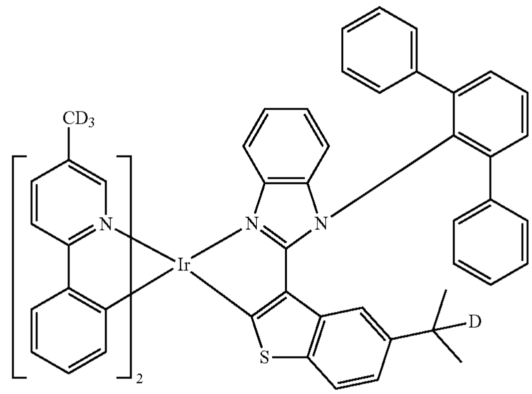
1382
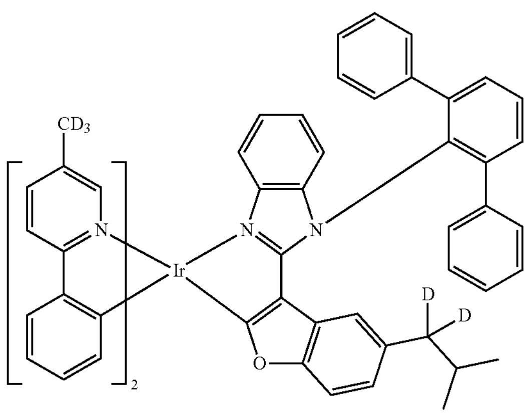
1383
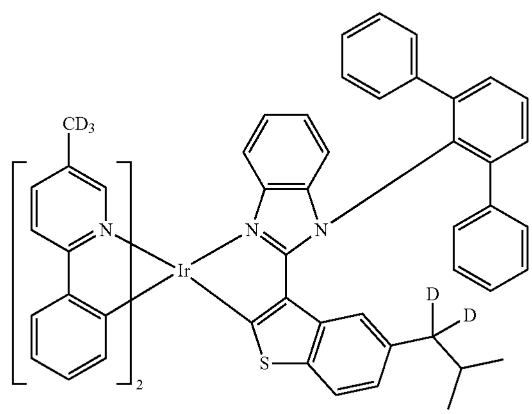
1384
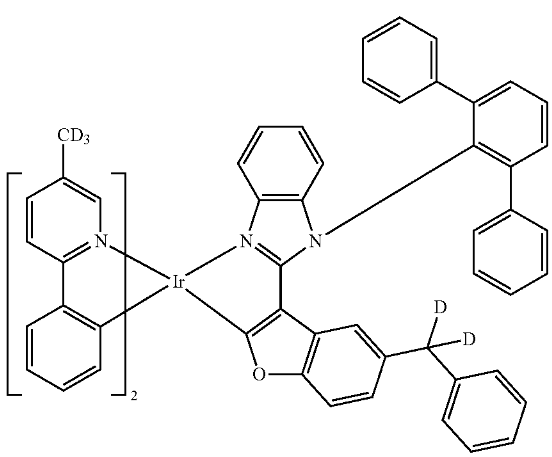
1385
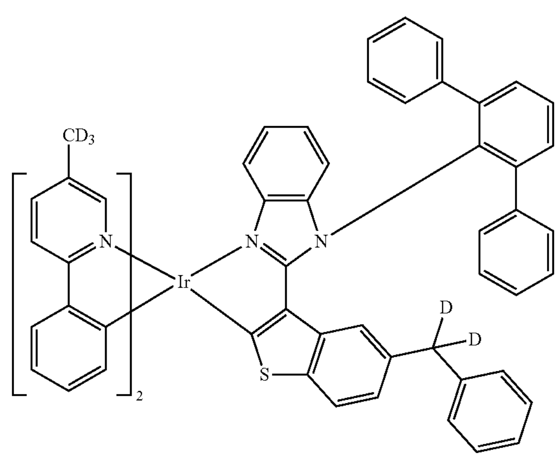

-continued
1386
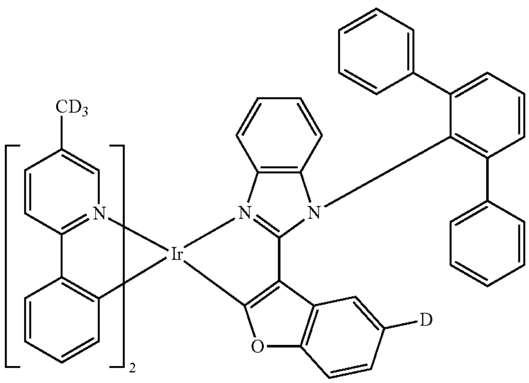
1387
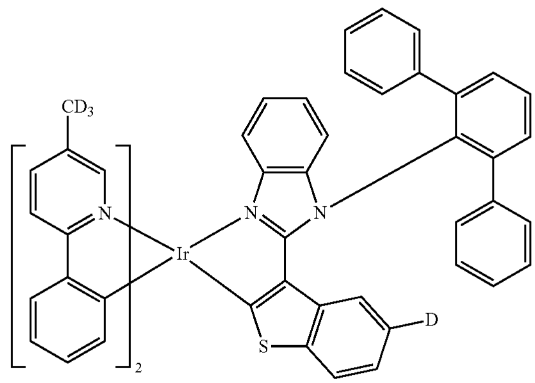
1388
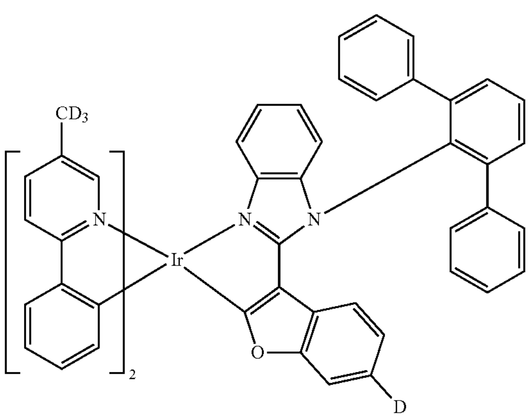
1389
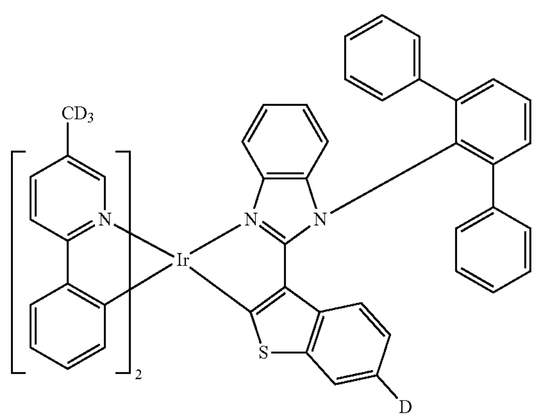
1390
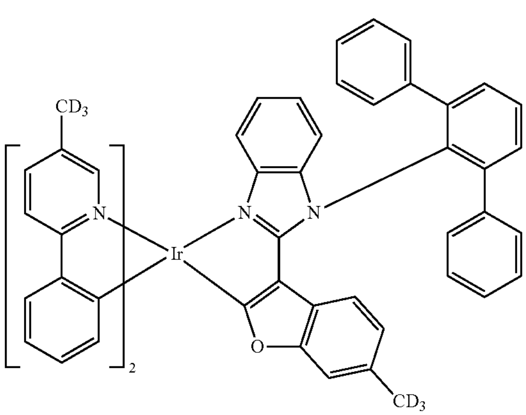
1391
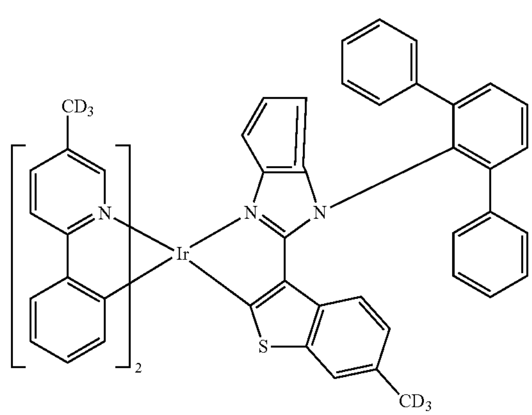

-continued
1392
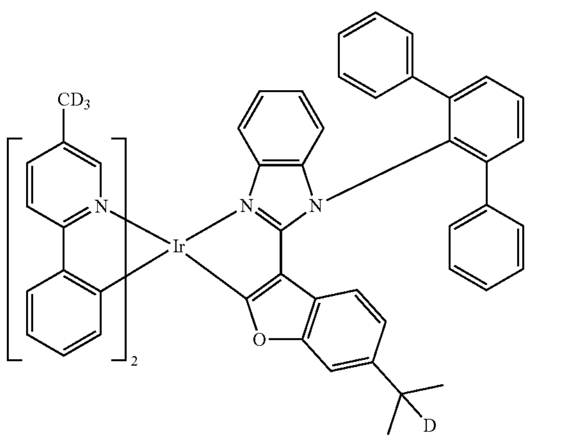
1393
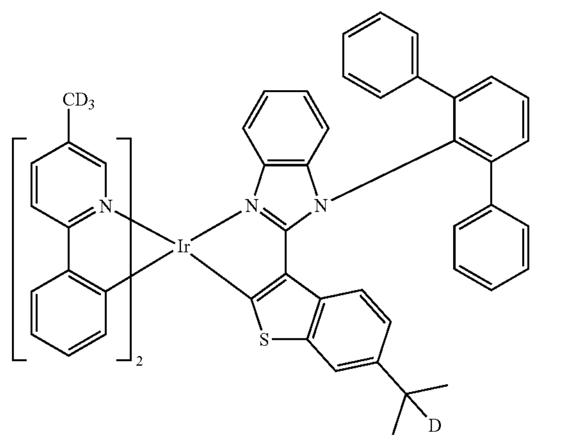
1394
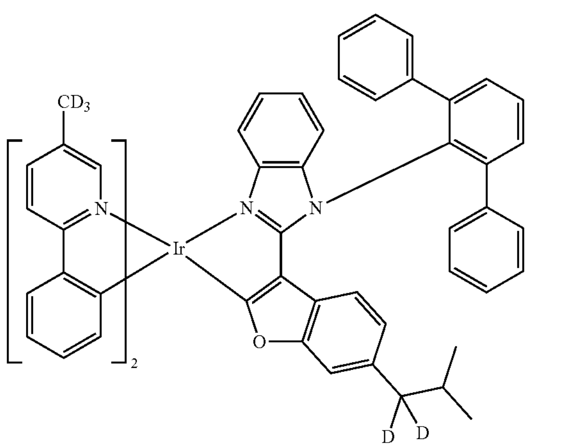
1395
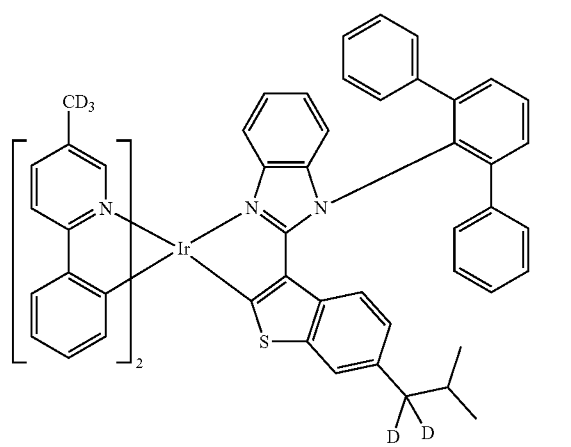
1396
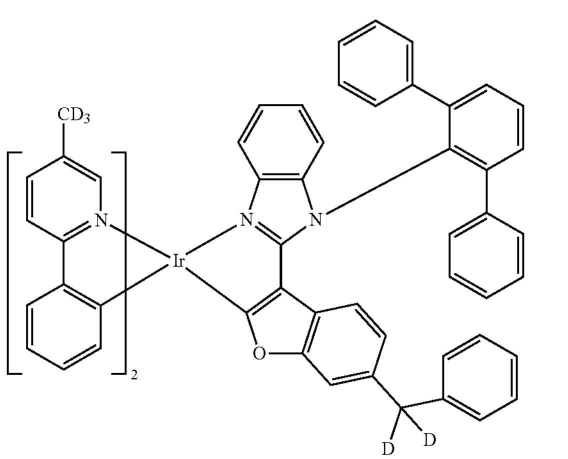
1397
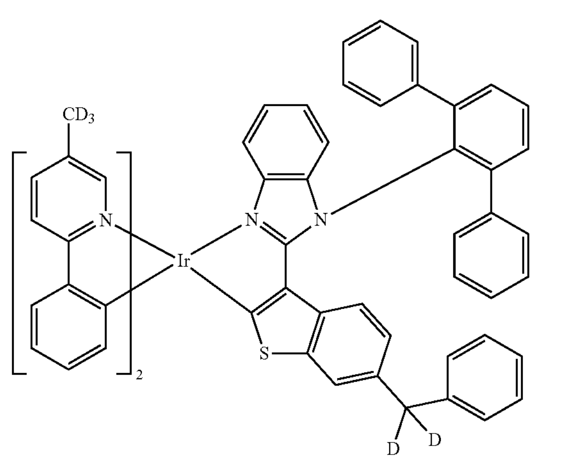

-continued
1398
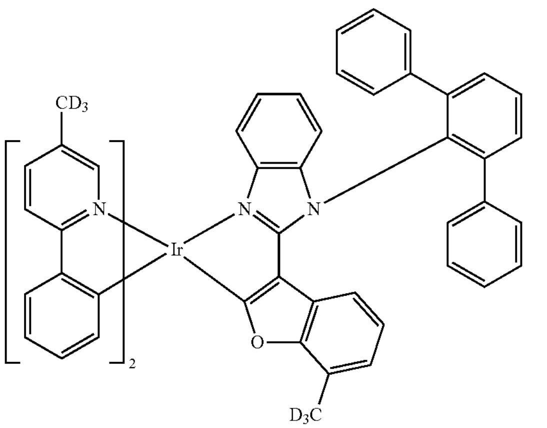
1399
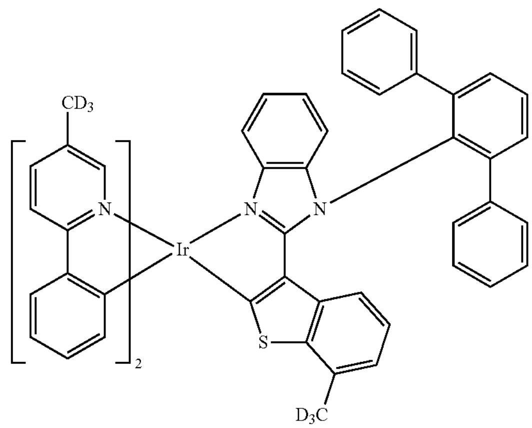
1400
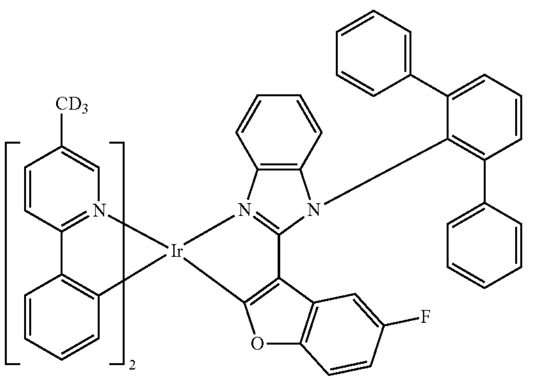
1401
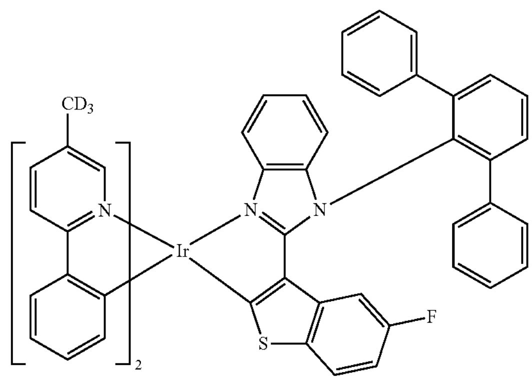
1402
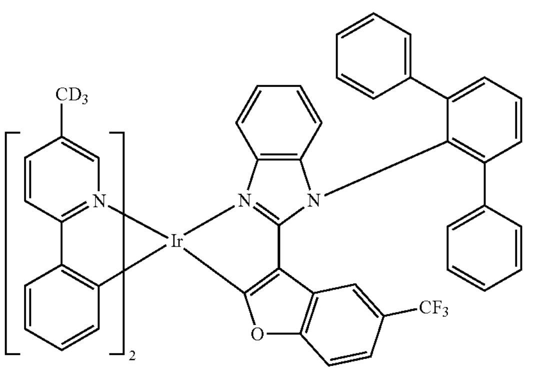
1403
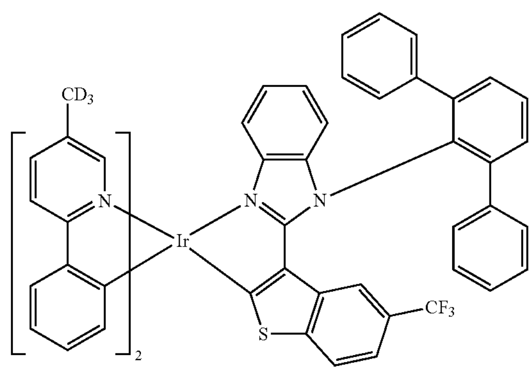
1404
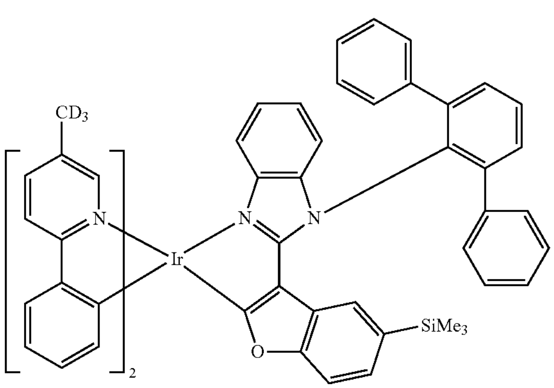
1405
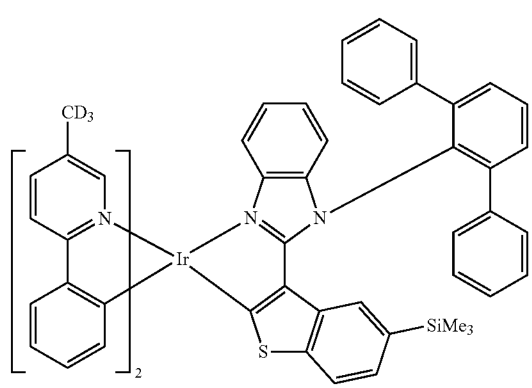

-continued
1406
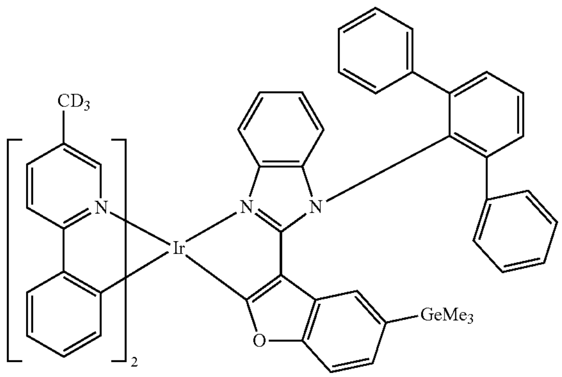
1407
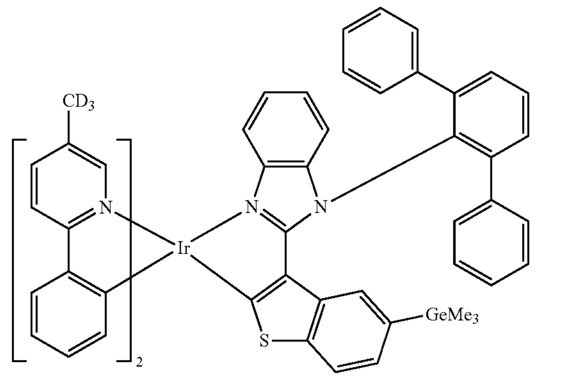
1408
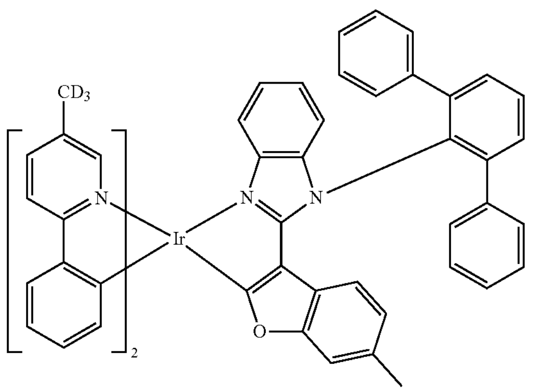
1409
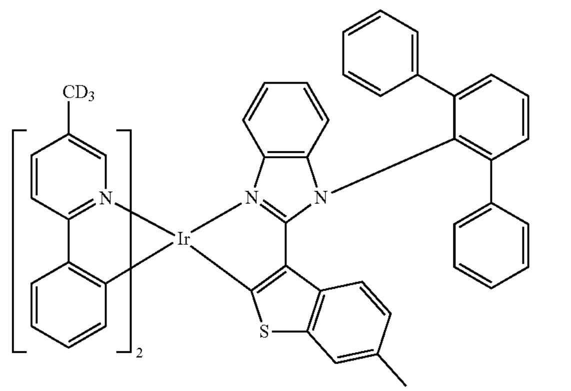
1410
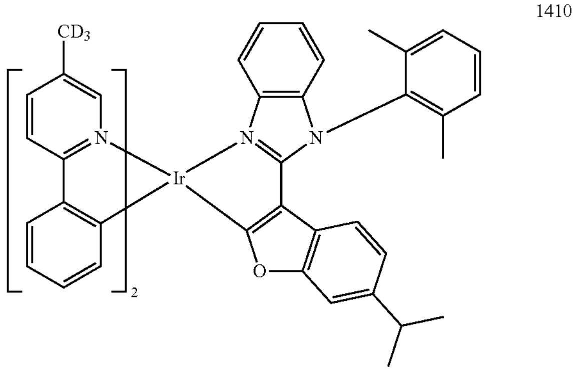
1411
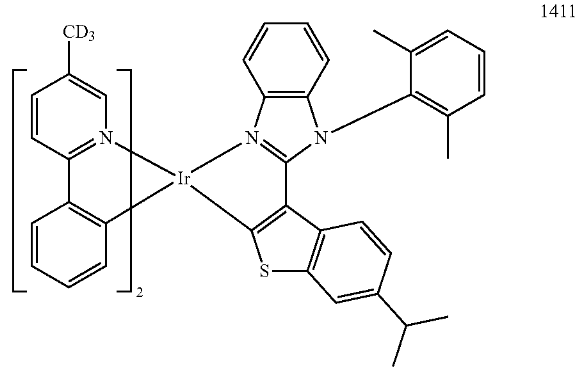
1412
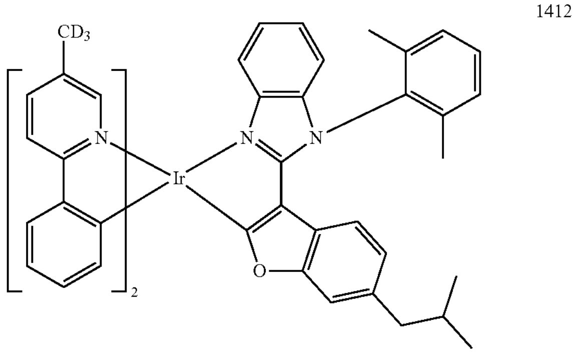
1413
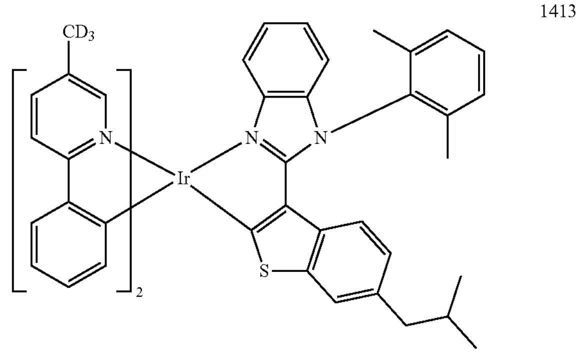

-continued
1414
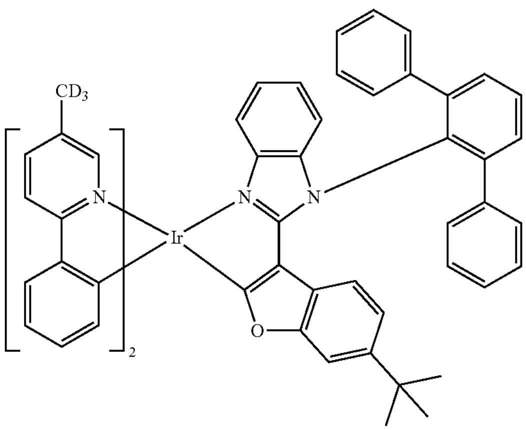
1415
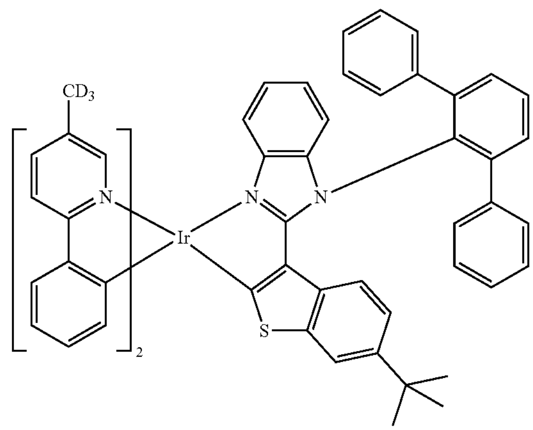
1416
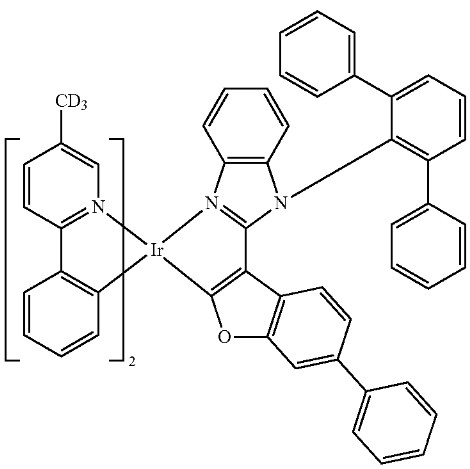
1417
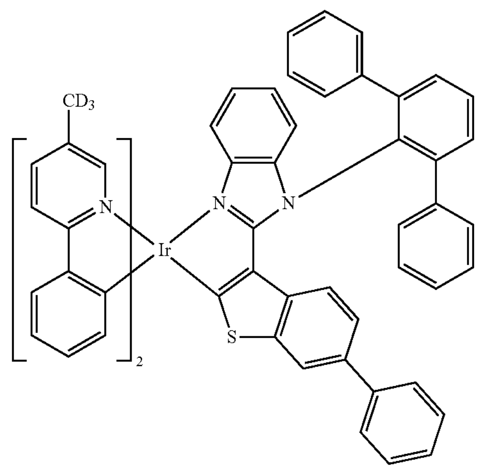
1418
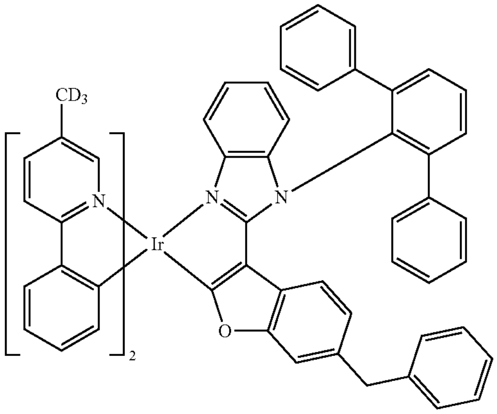
1419
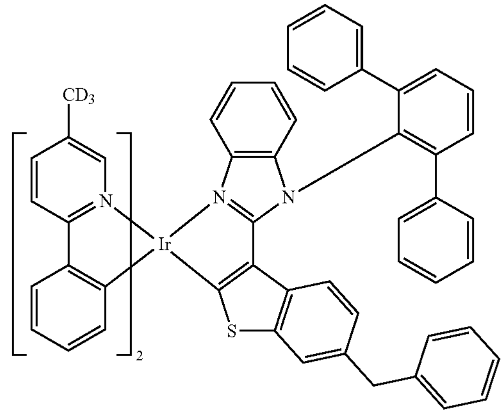

-continued
1420
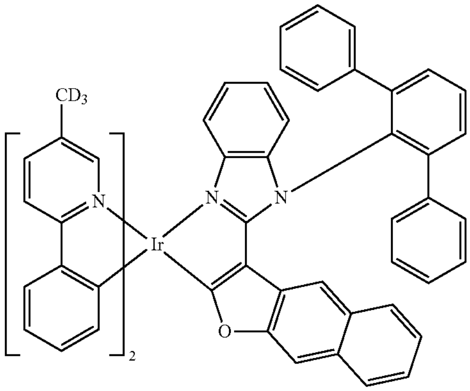
1421
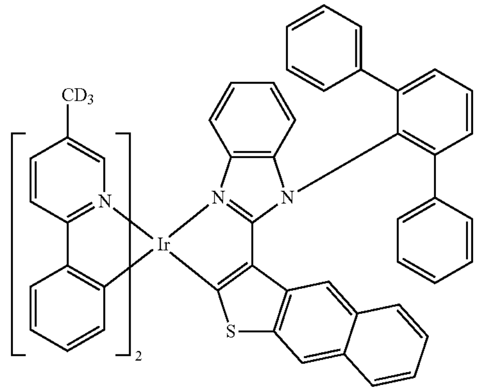
1422
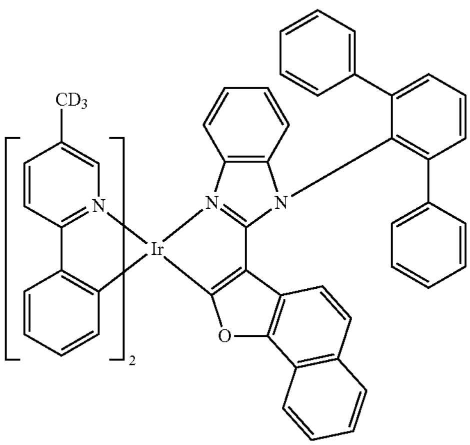
1423
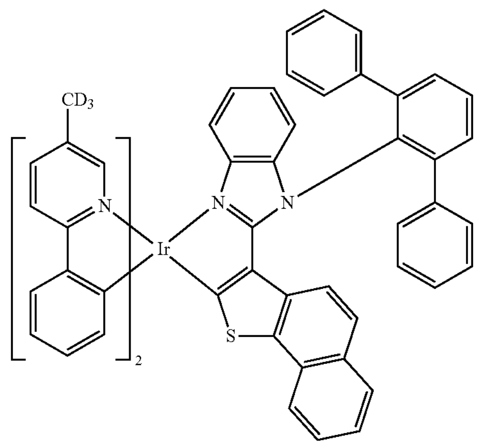
1424
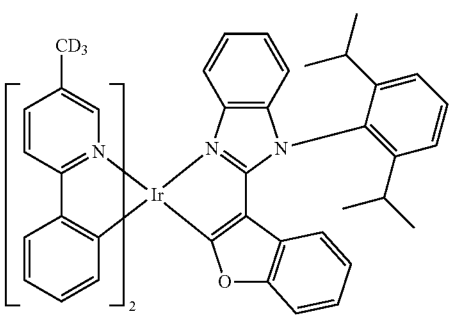
1425
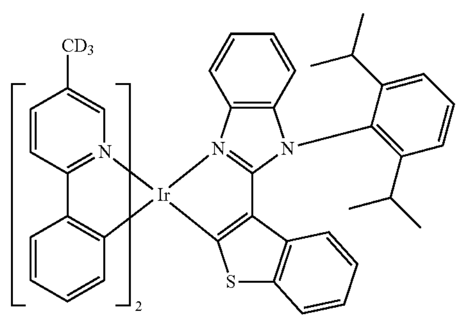
1426
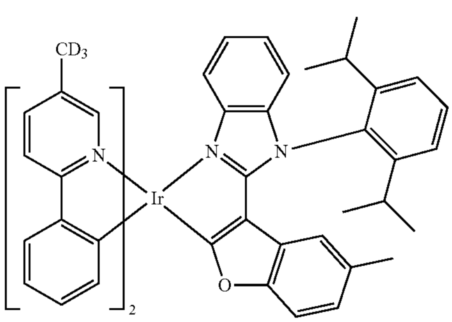
1427
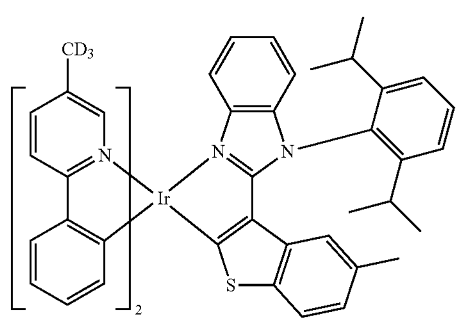

-continued
1428
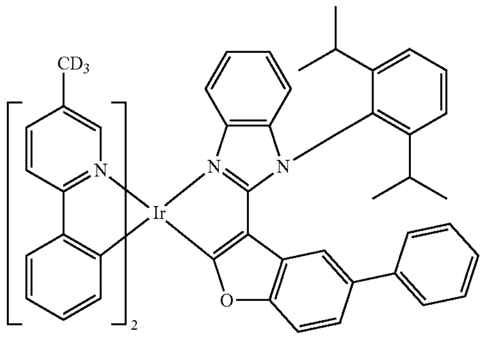
1429
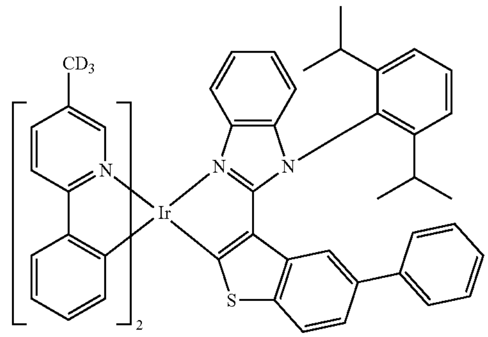
1430
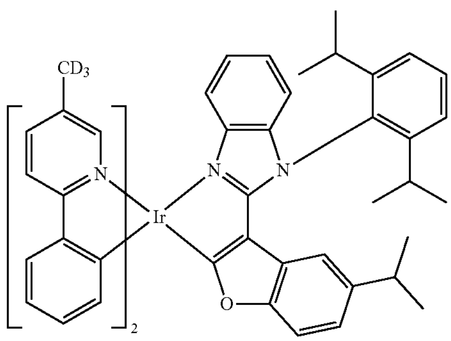
1431
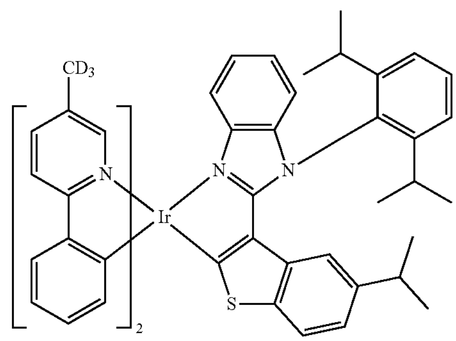
1432
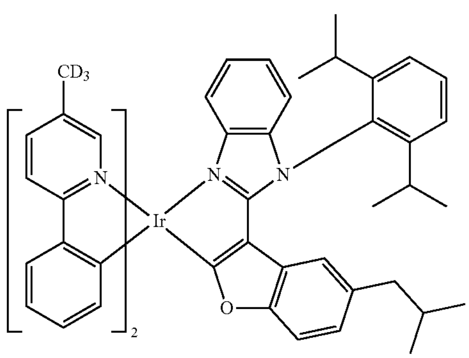
1433
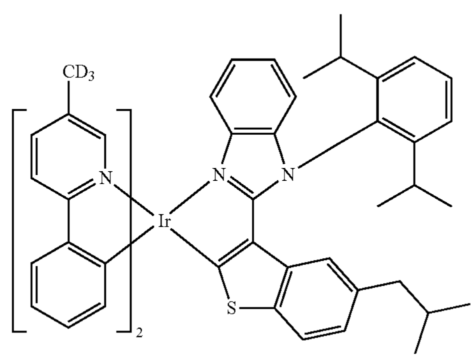
1434
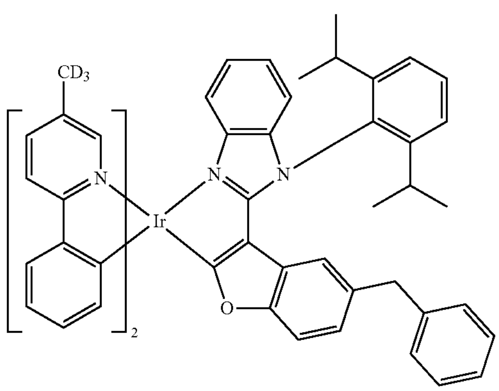
1435
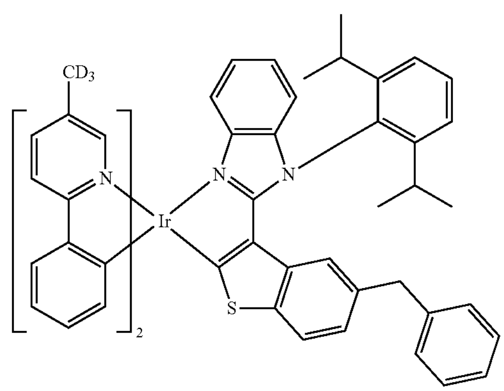

-continued
1436
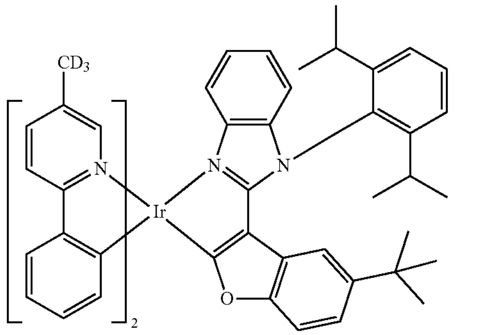
1437
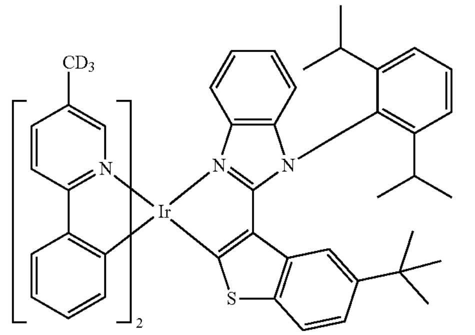
1438
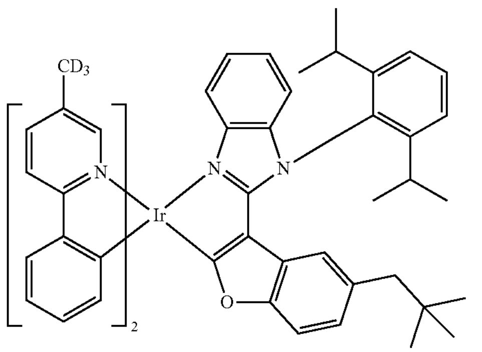
1439
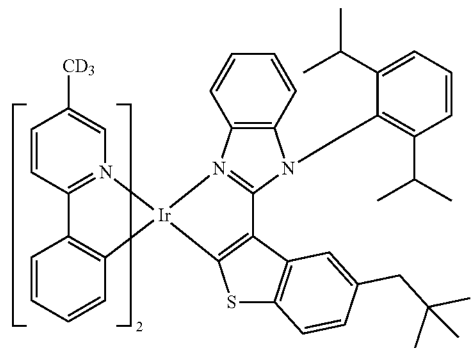
1440
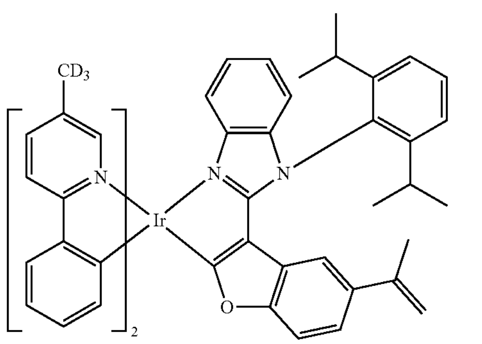
1441
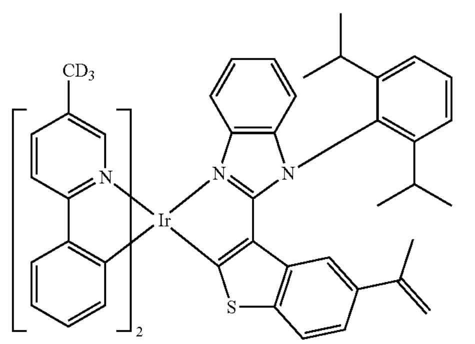
1442
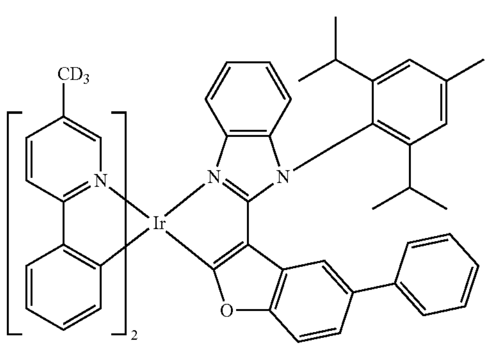
1443
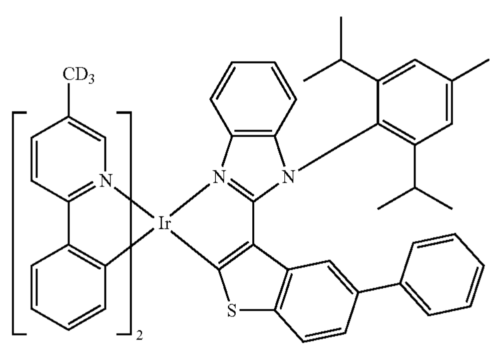

-continued
1444
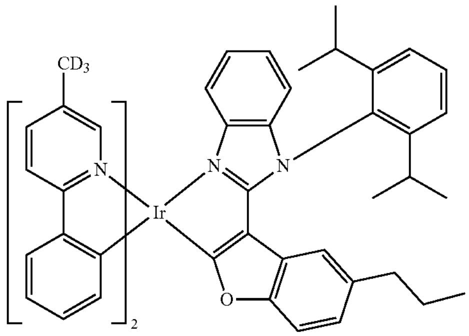
1445
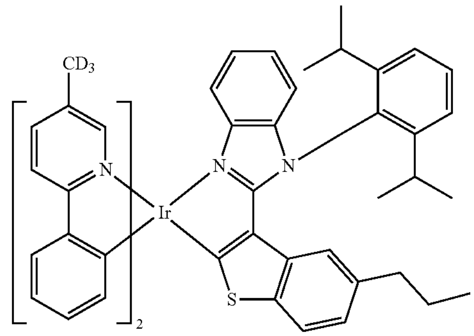
1446
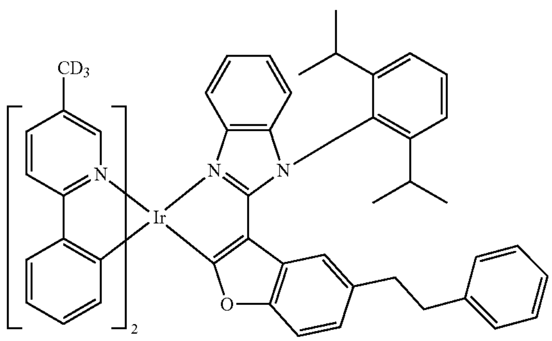
1447
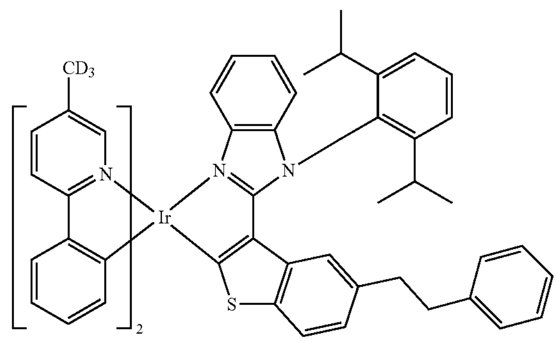
1448
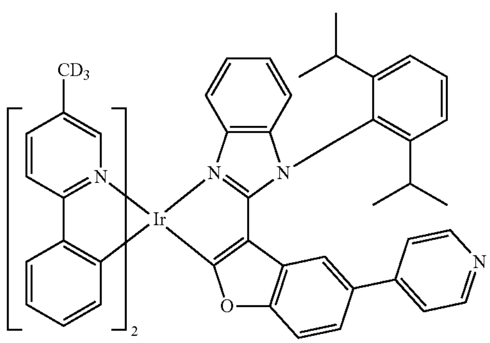
1449
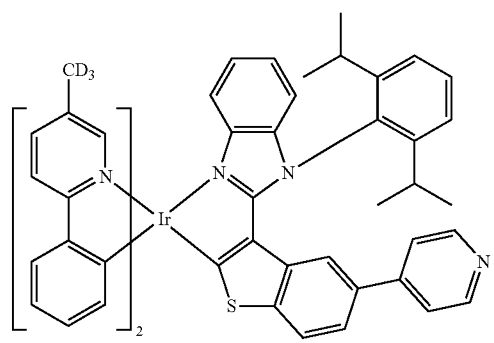
1450
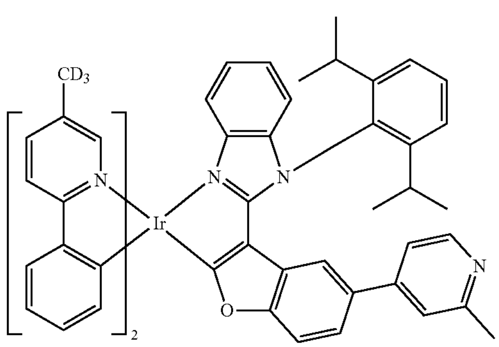
1451
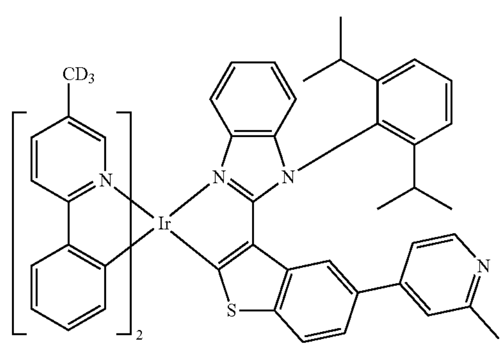

-continued
1452
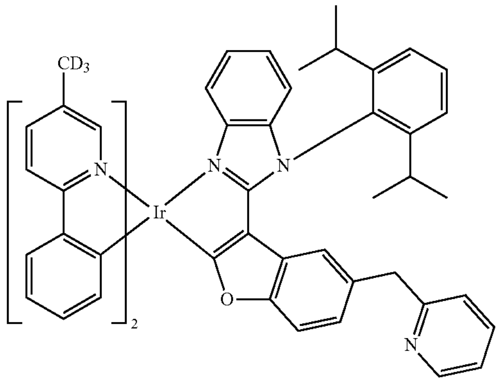
1453
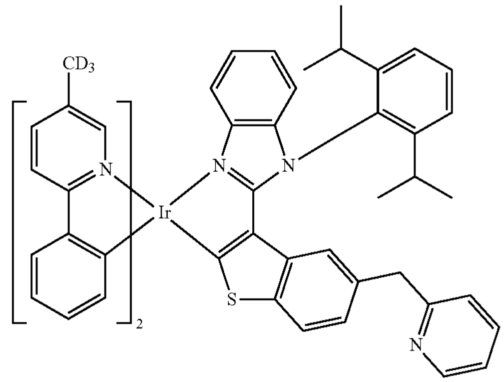
1454
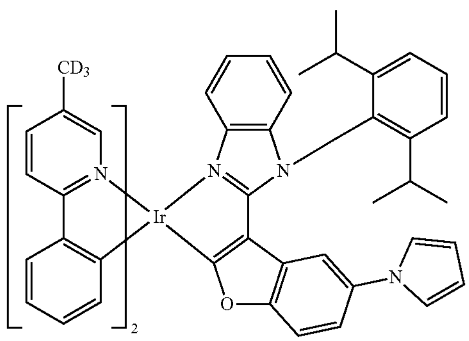
1455
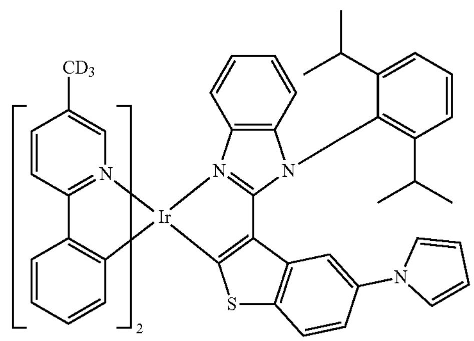
1456
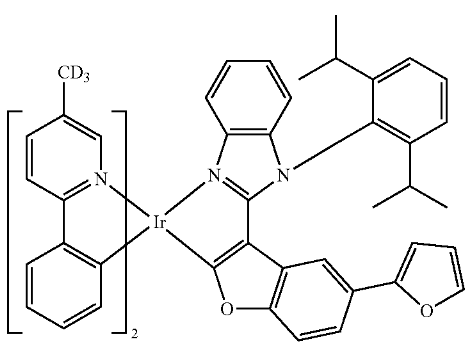
1457
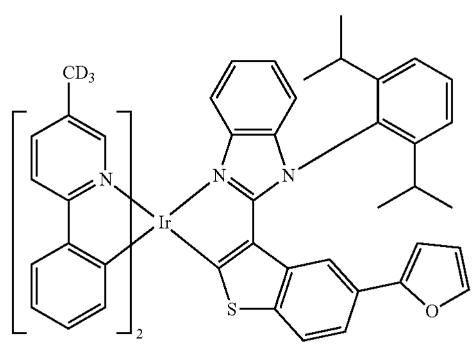
1458
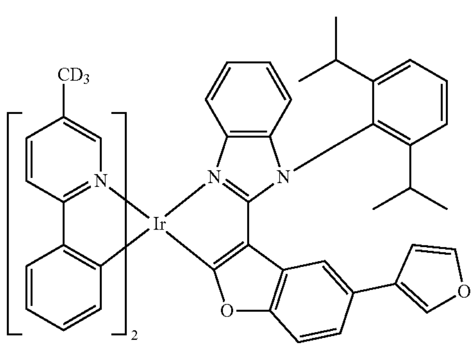
1459
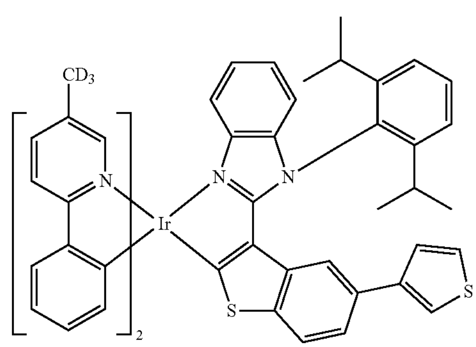

-continued
1460
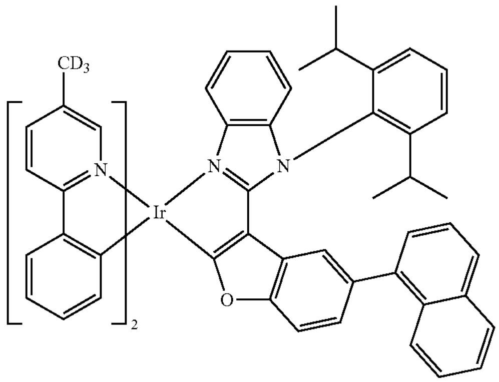
1461
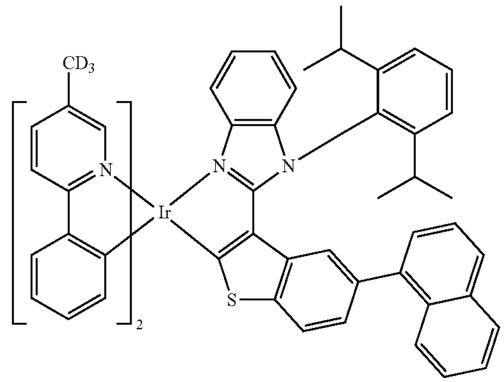
1462
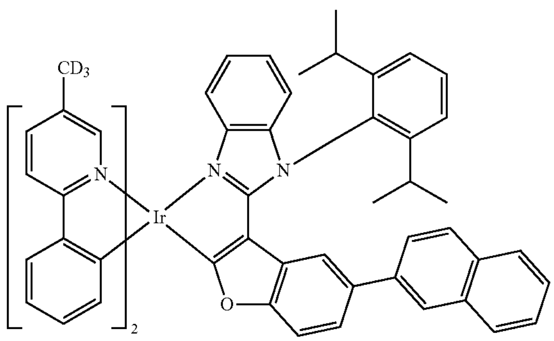
1463
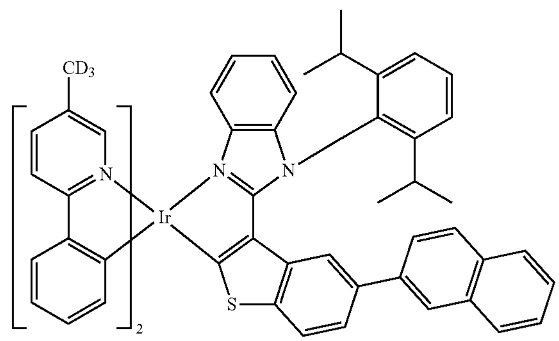
1464
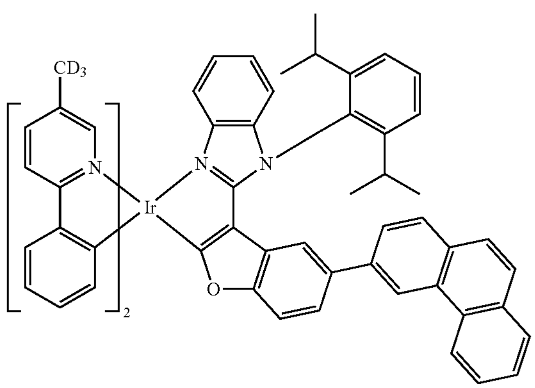
1465
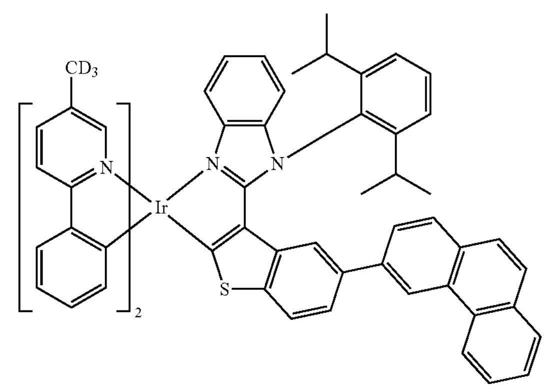
1466
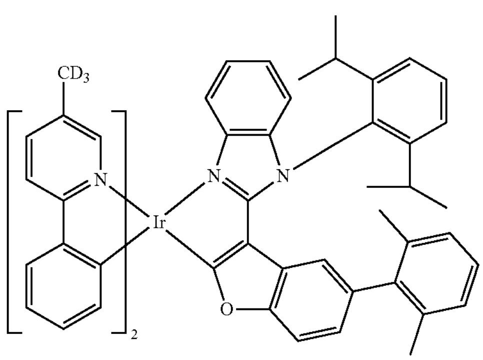
1467
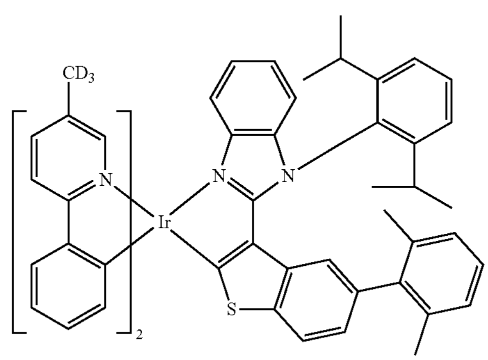

-continued
1468
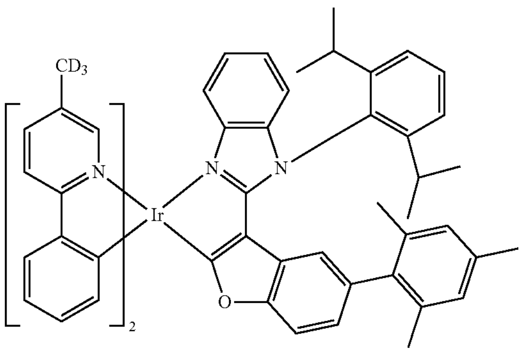
1469
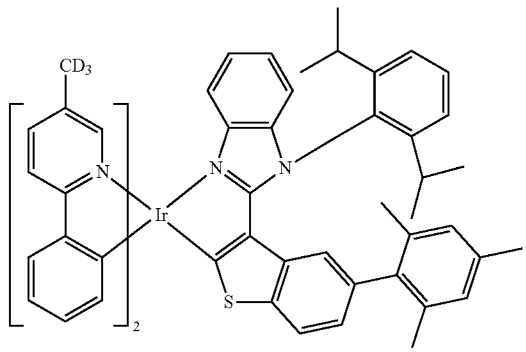
1470
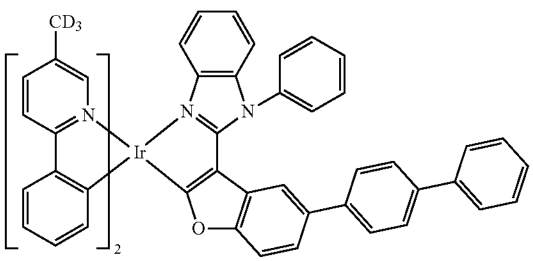
1471
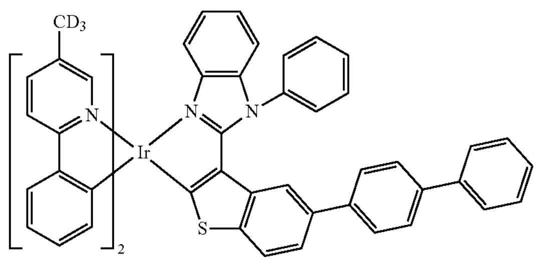
1472
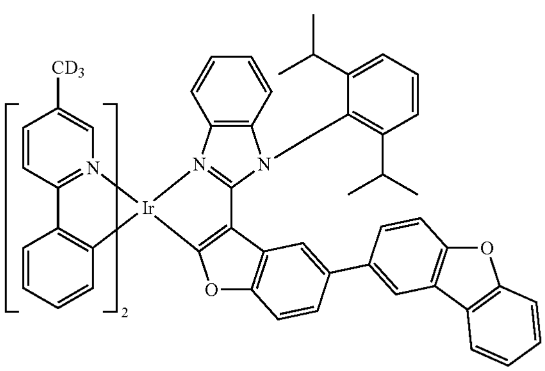
1473
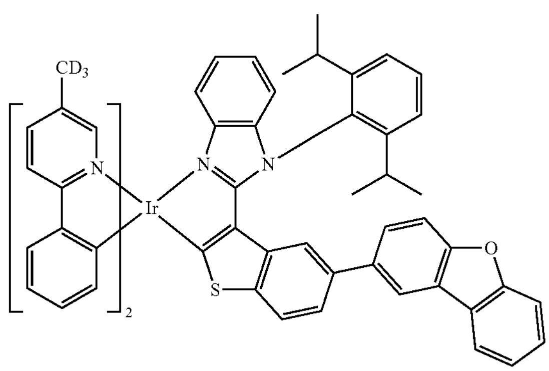
1474
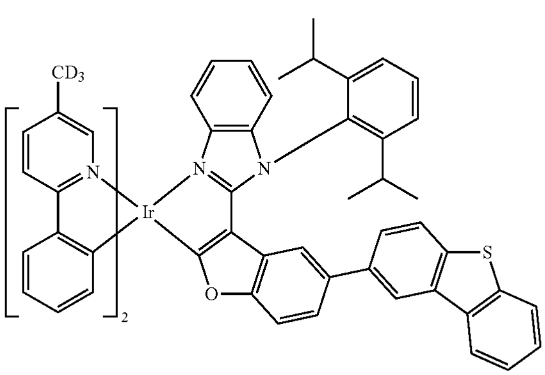
1475
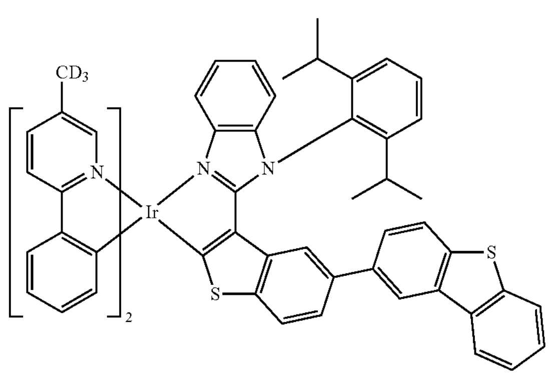

-continued
1476
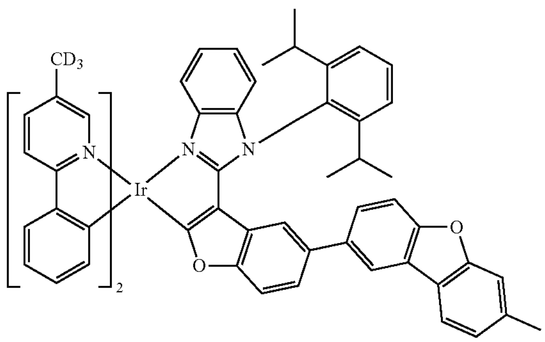
1477
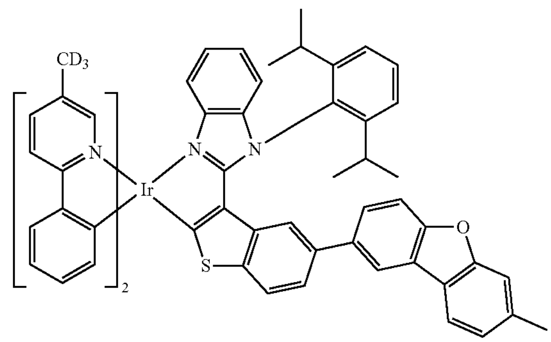
1478
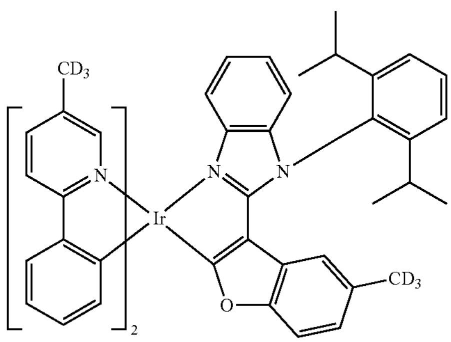
1479
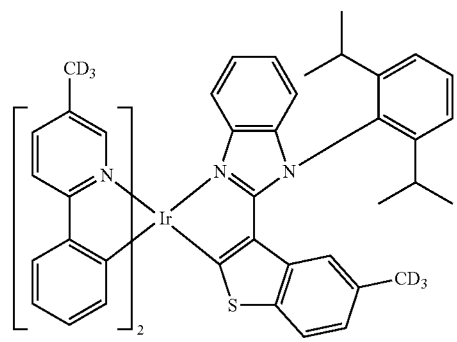
1480
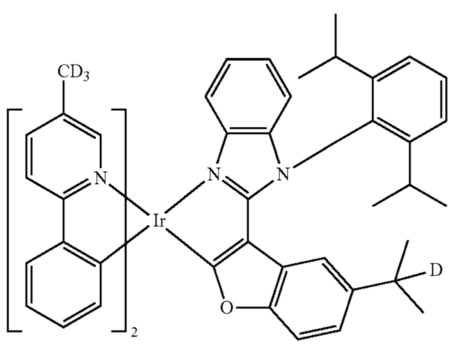
1481
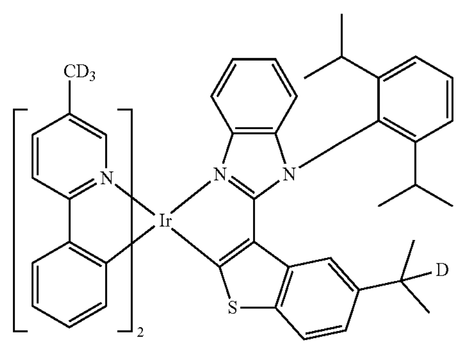
1482
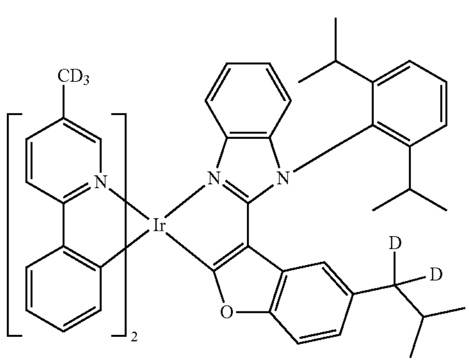
1483
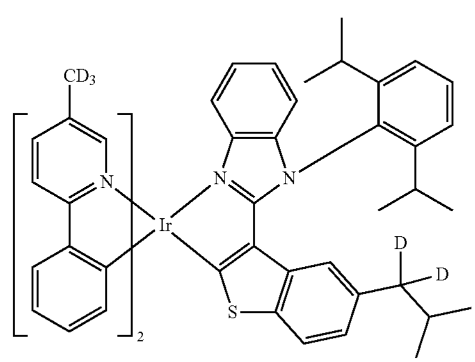

-continued
1484
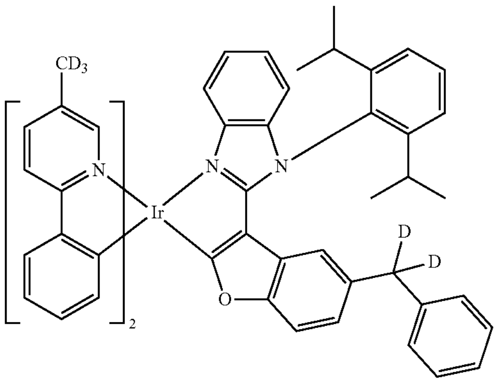
1485
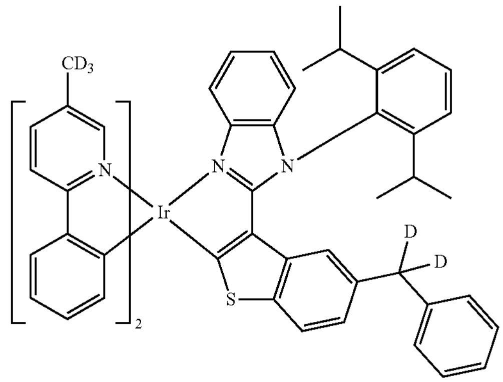
1486
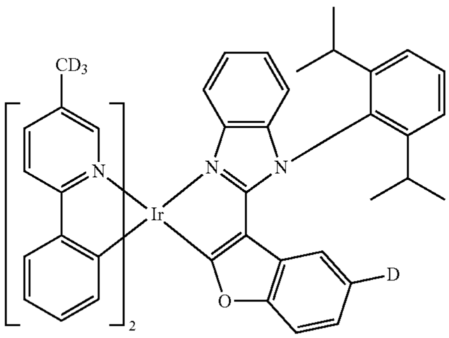
1487
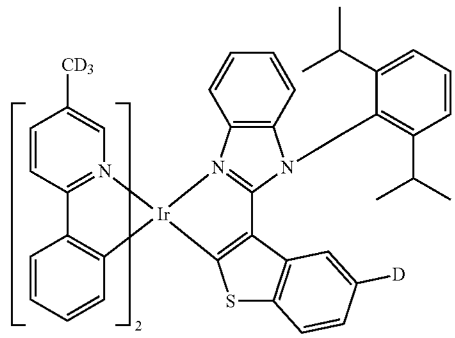
1488
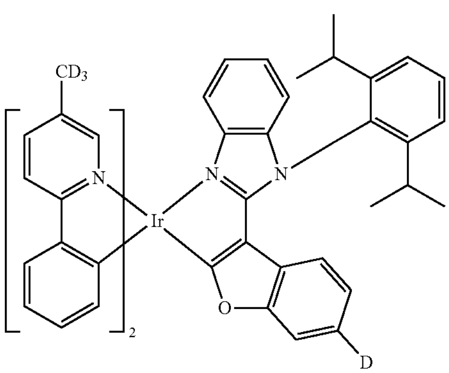
1489
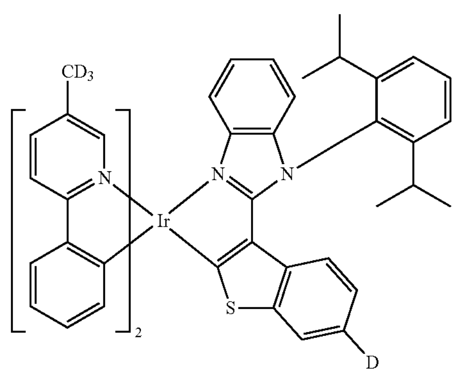
1490
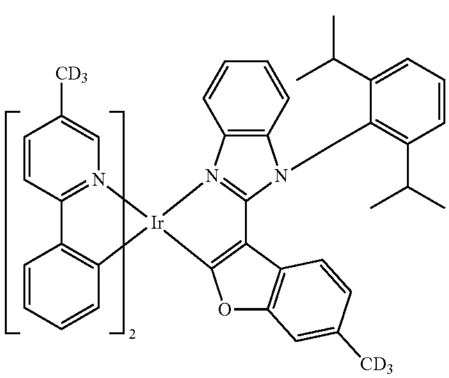
1491
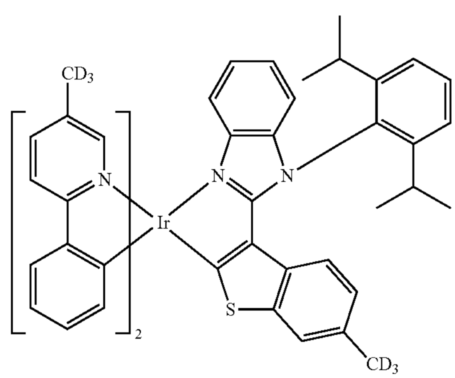

-continued
1492
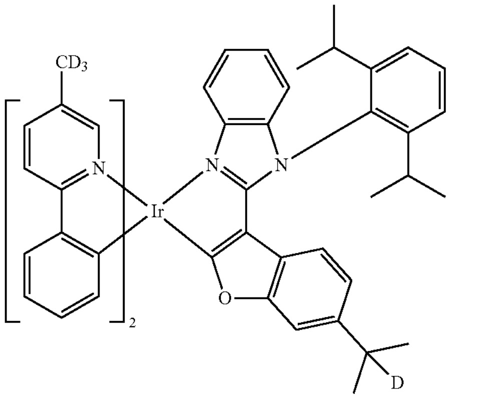
1493
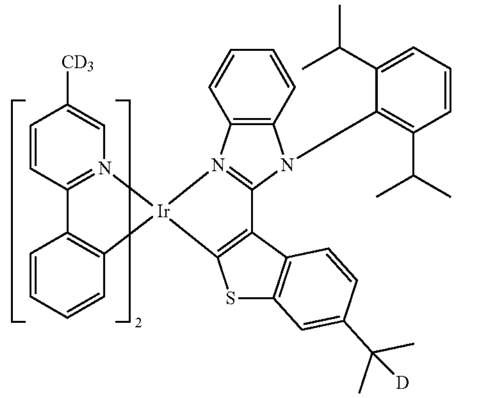
1494
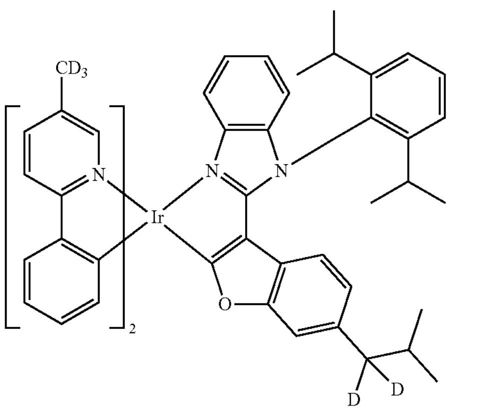
1495
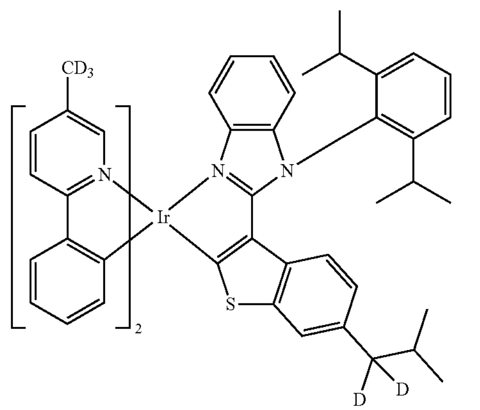
1496
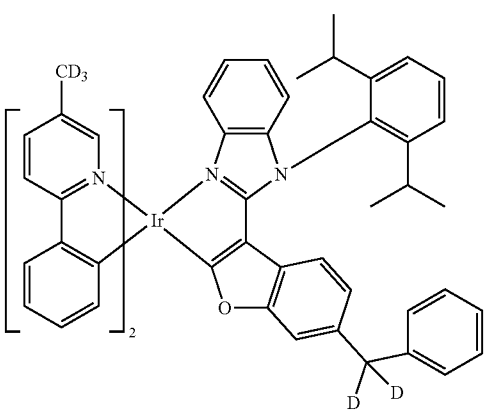
1497
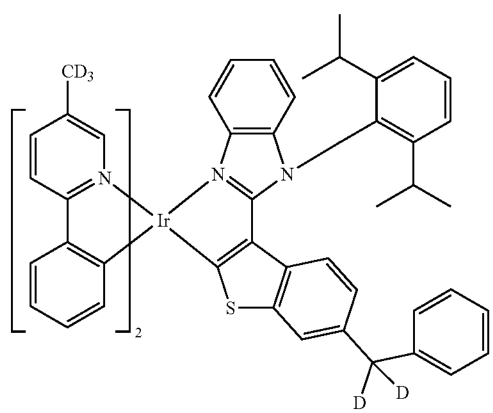
1498
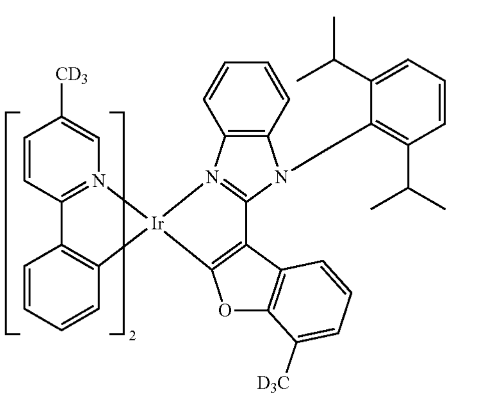
1499
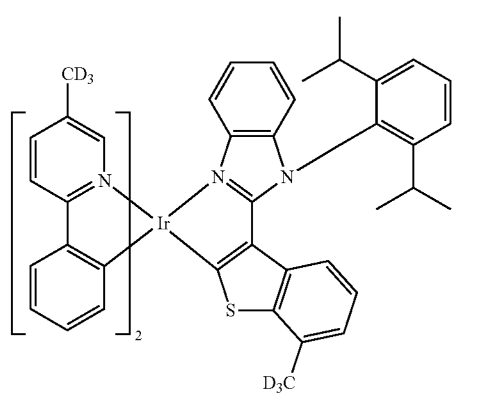

-continued
1500
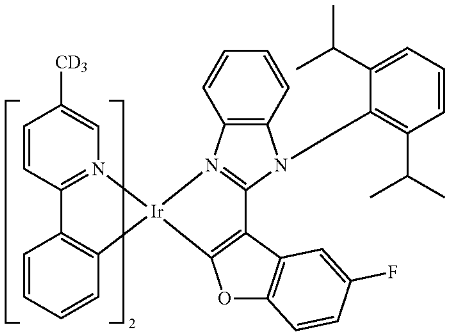
1501
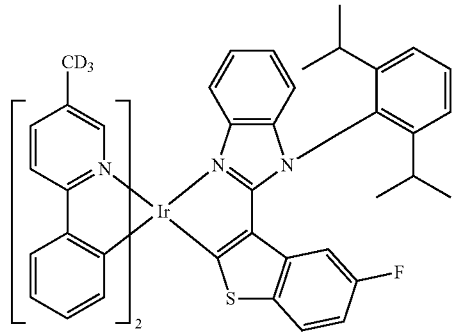
1502
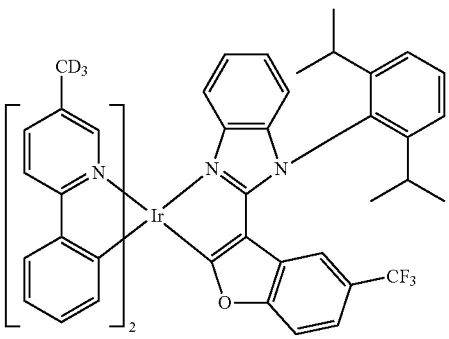
1503
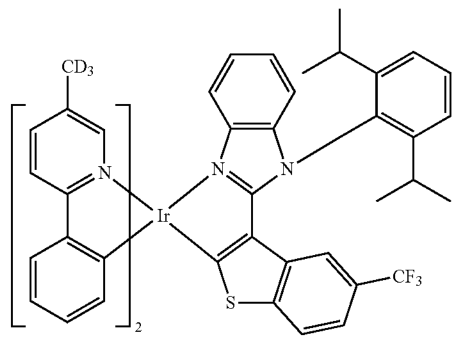
1504
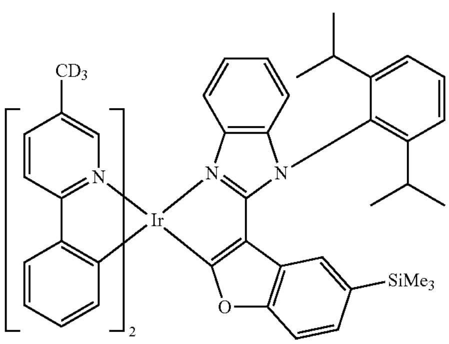
1505
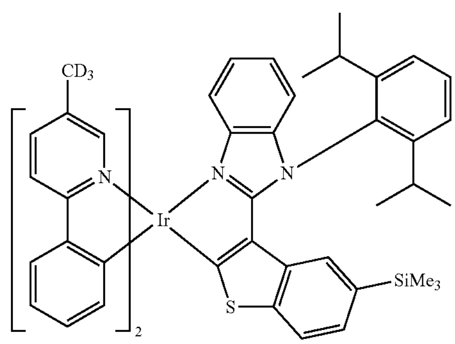
1506
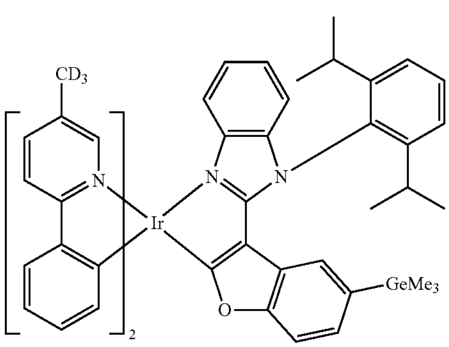
1507
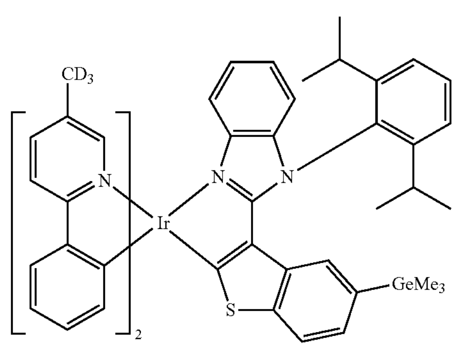

-continued
1508
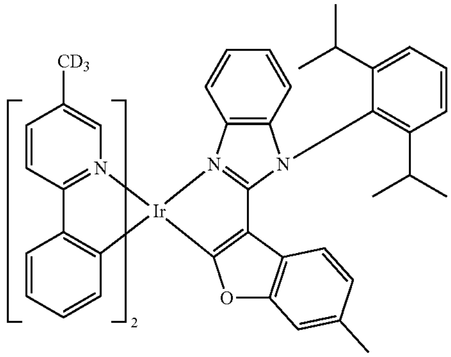
1509
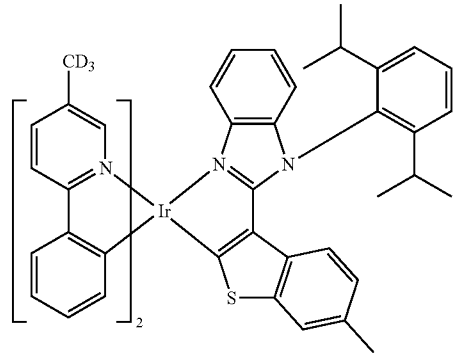
1510
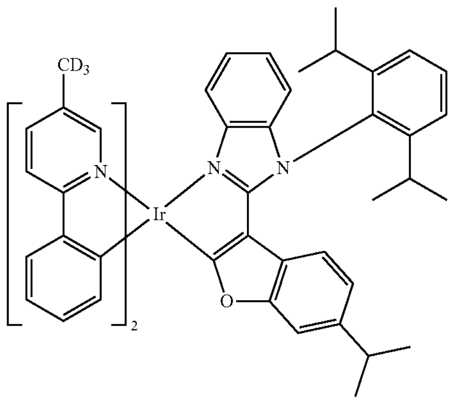
1511
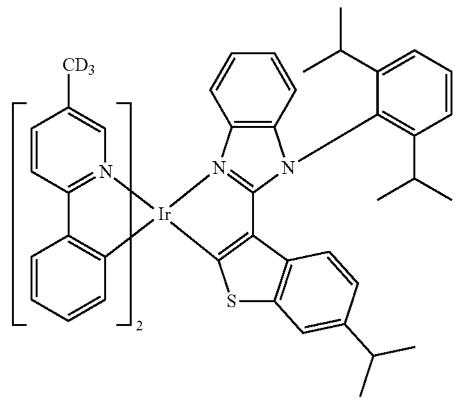
1512
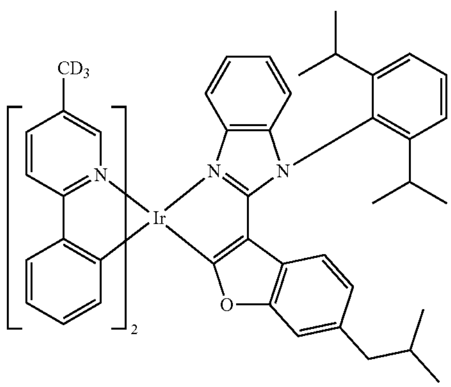
1513
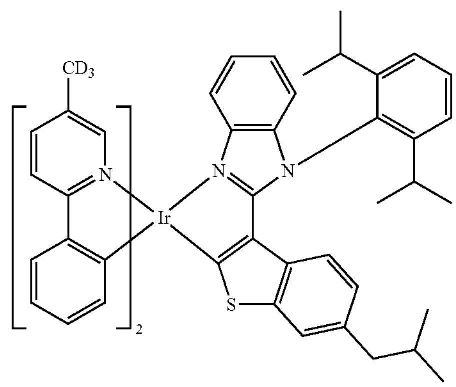
1514
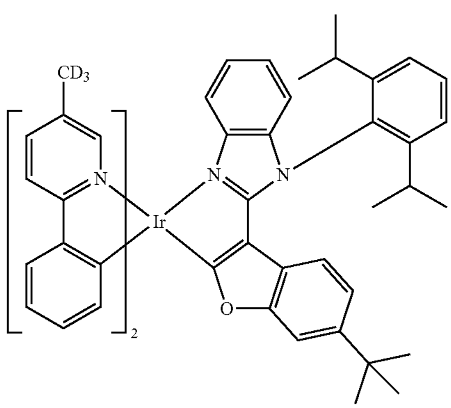
1515
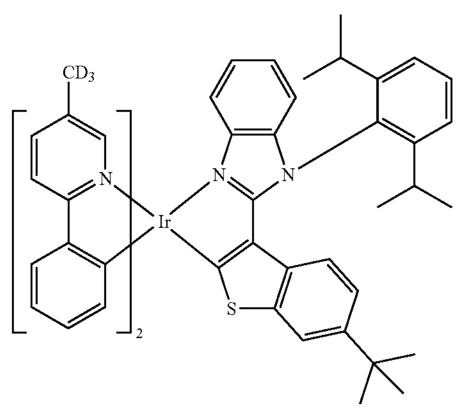

-continued
1516
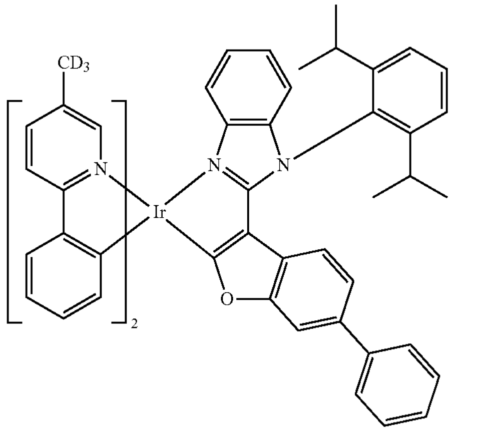
1517
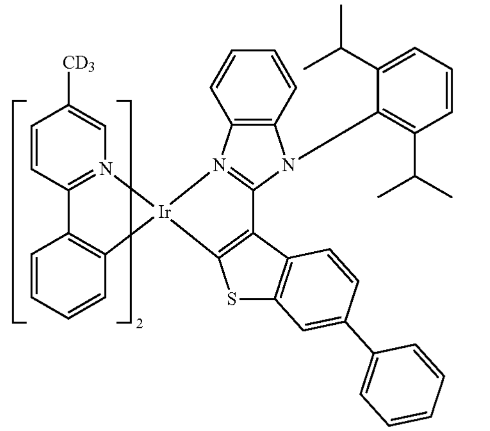
1518
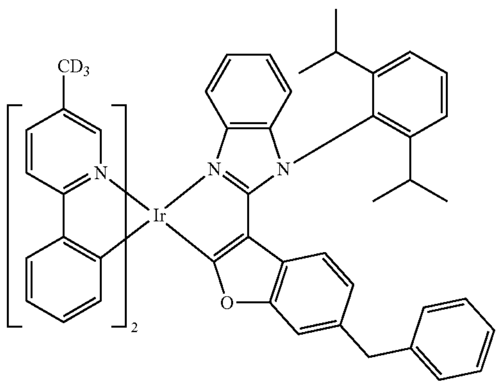
1519
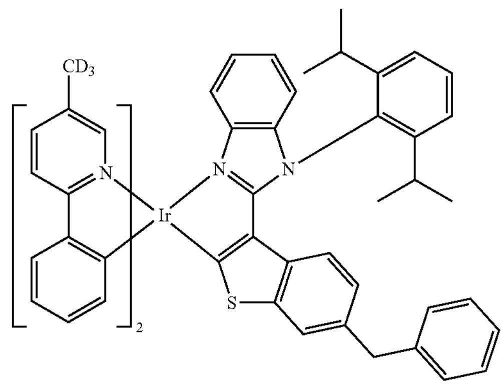
1520
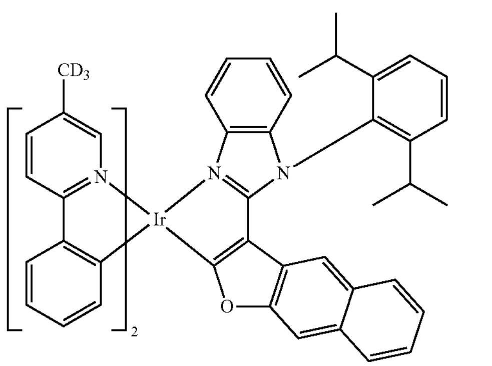
1521
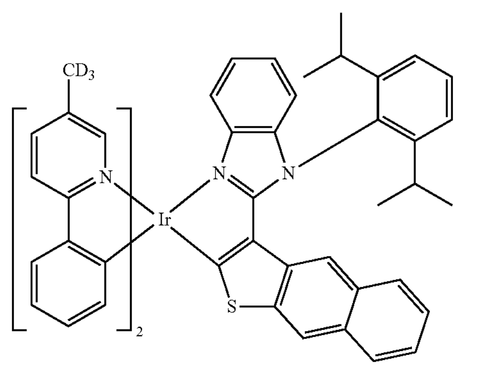
1522
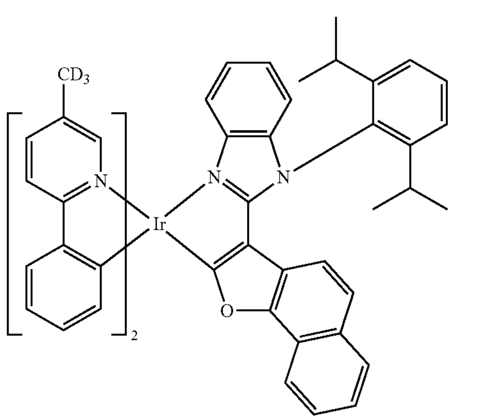
1523
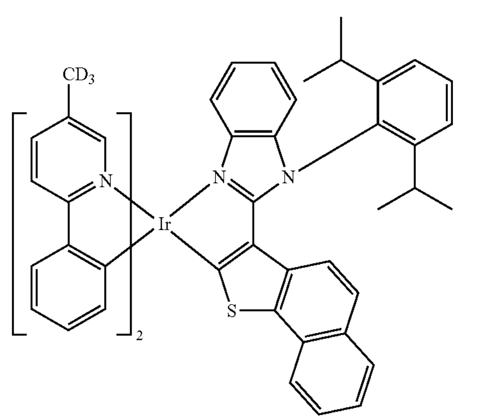

-continued
1524
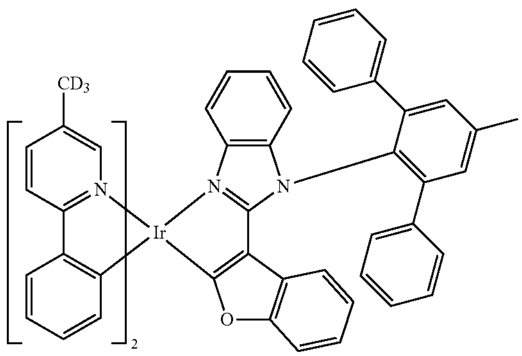
1525
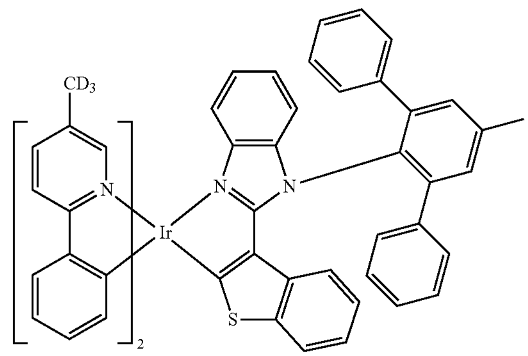
1526
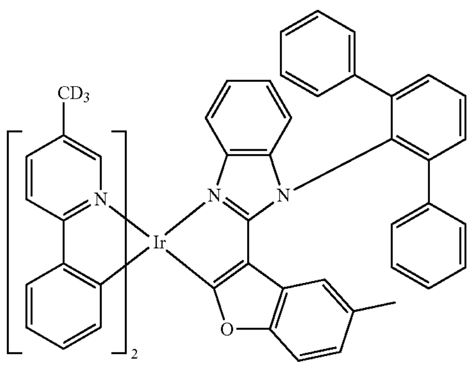
1527
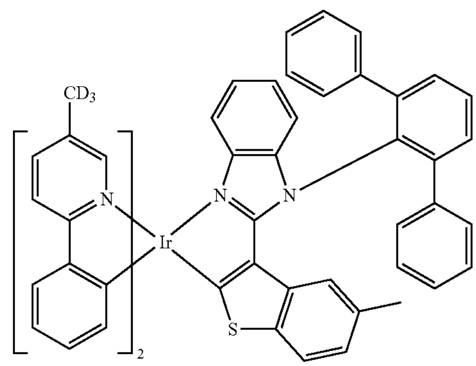
1528
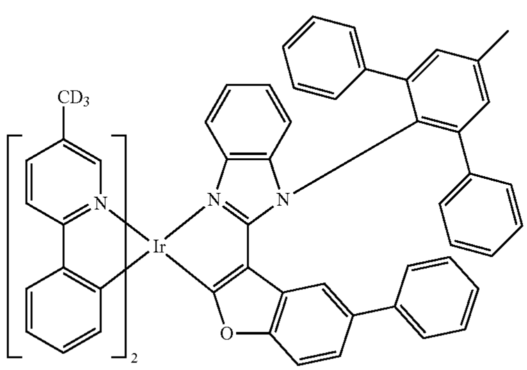
1529
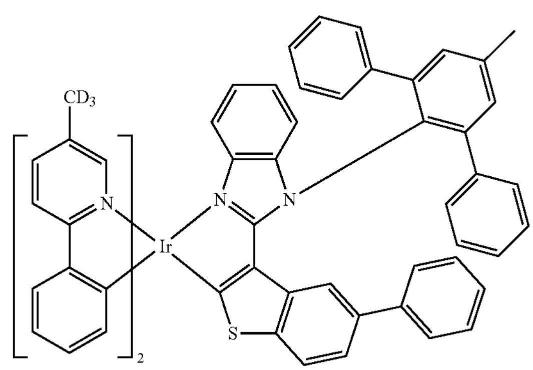
1530
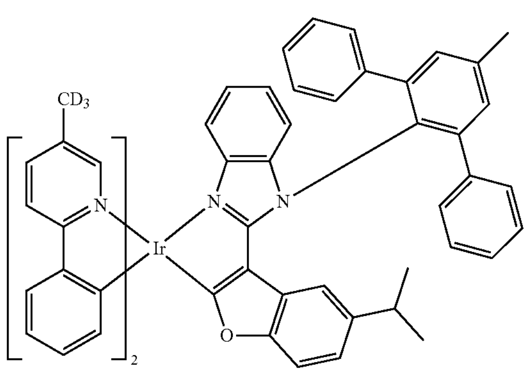
1531
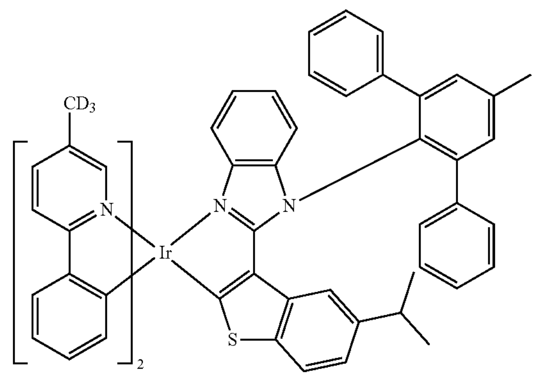

-continued
1532
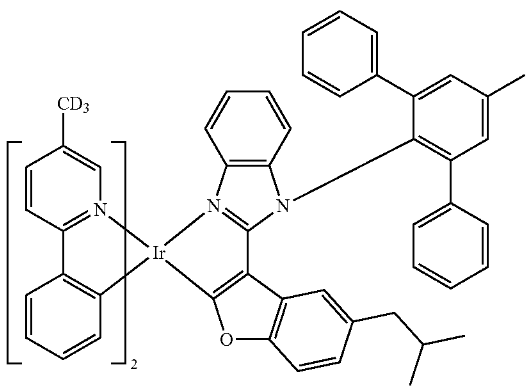
1533
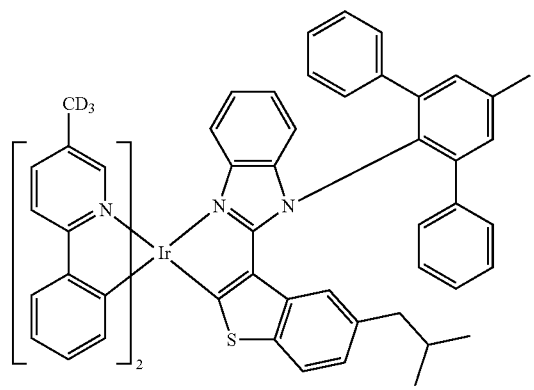
1534
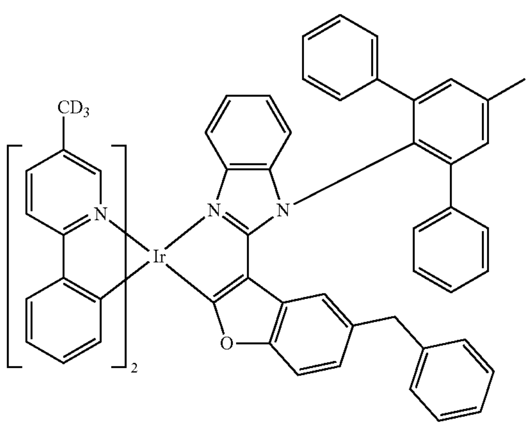
1535
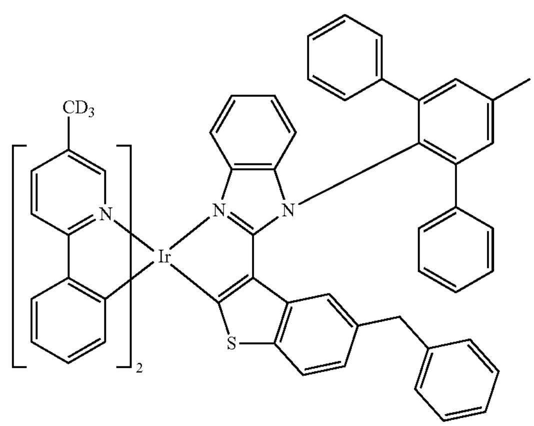
1536
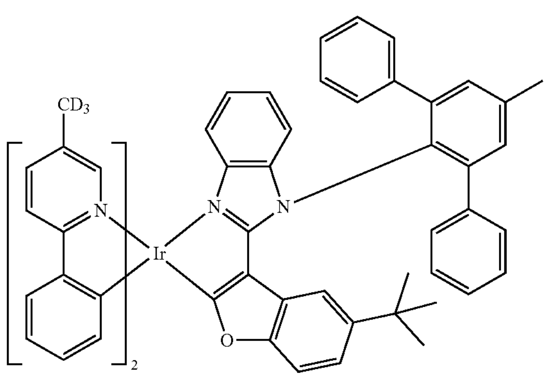
1537
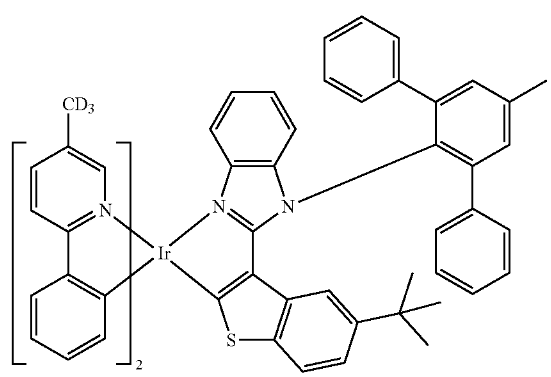
1538
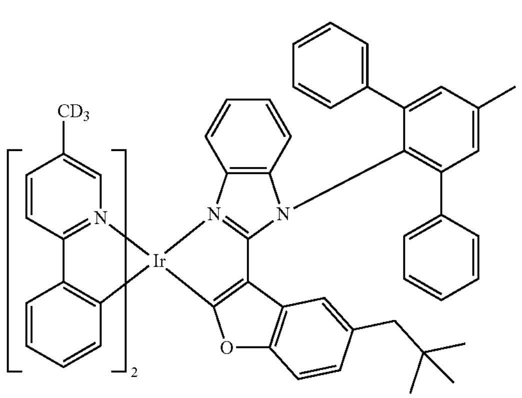
1539
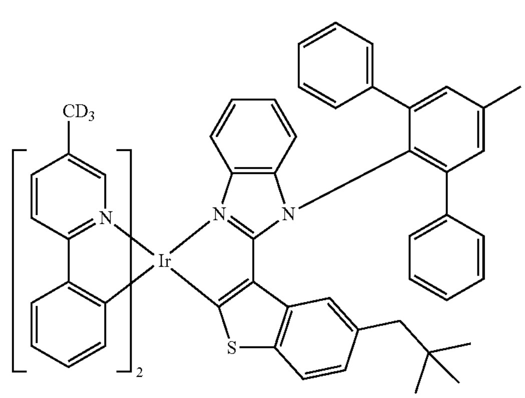

-continued
1540
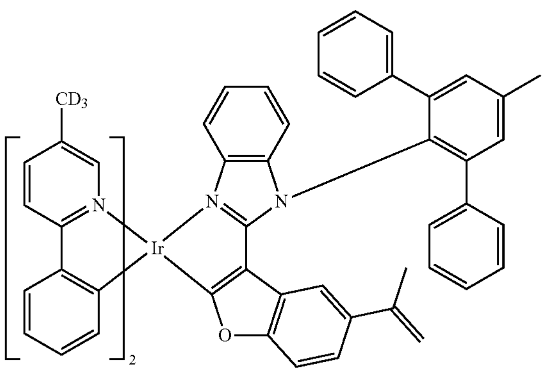
1541
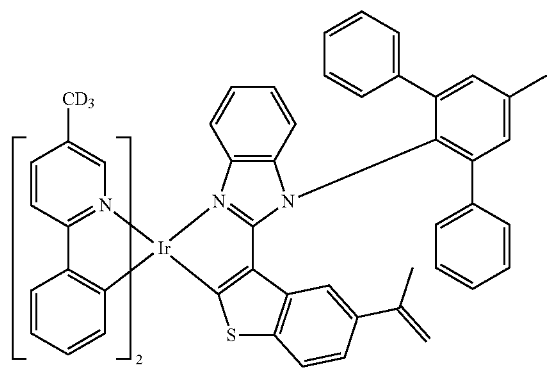
1542
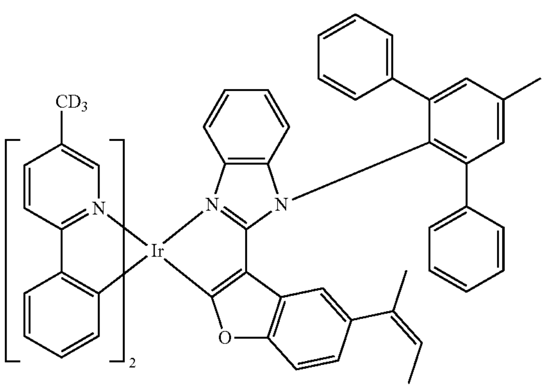
1543
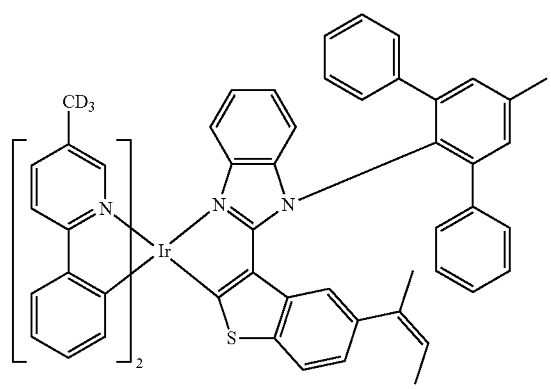
1544
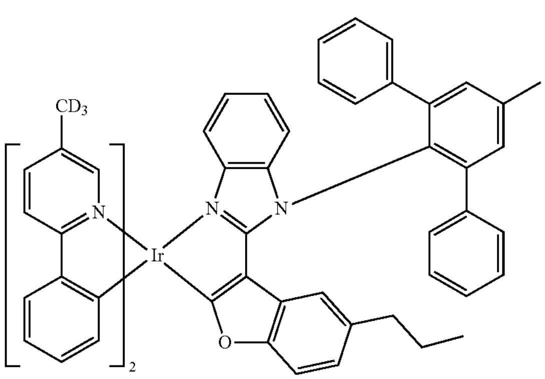
1545
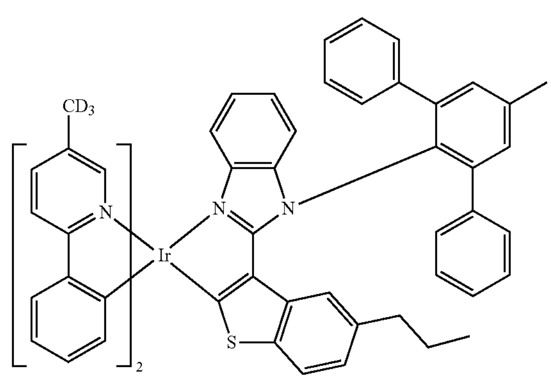
1546
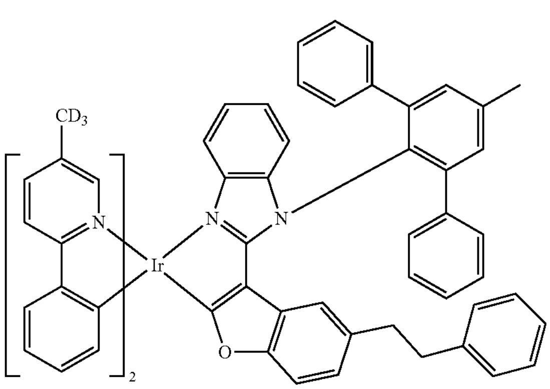
1547
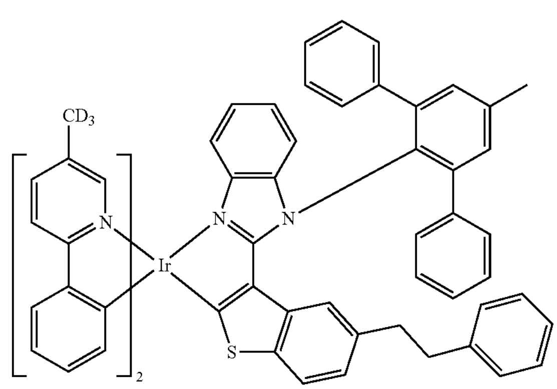

-continued
1548
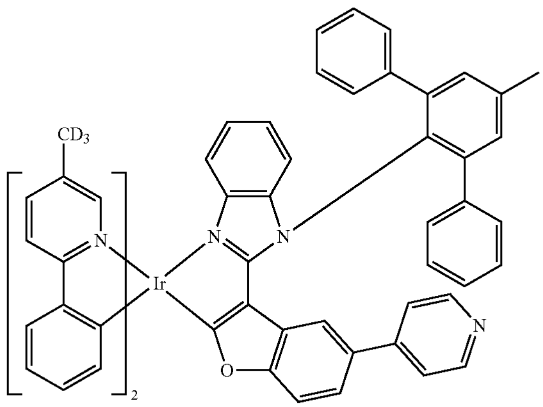
1549
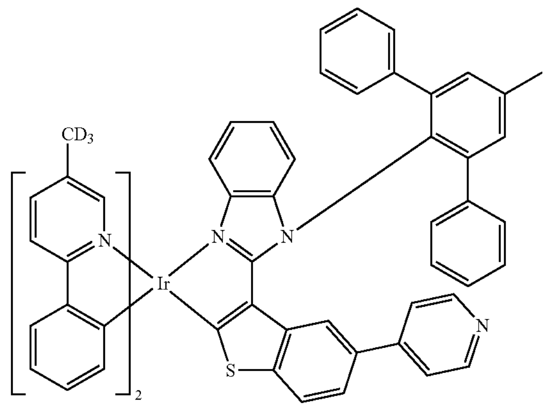
1550
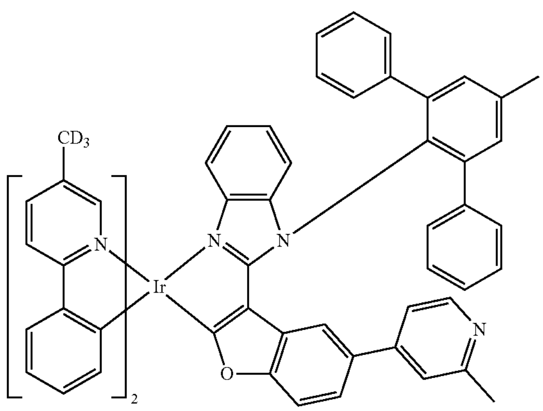
1551
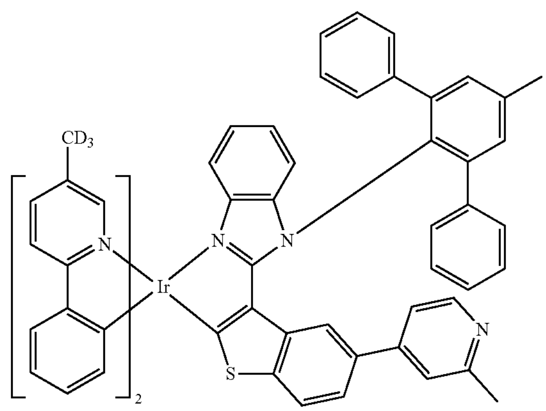
1552
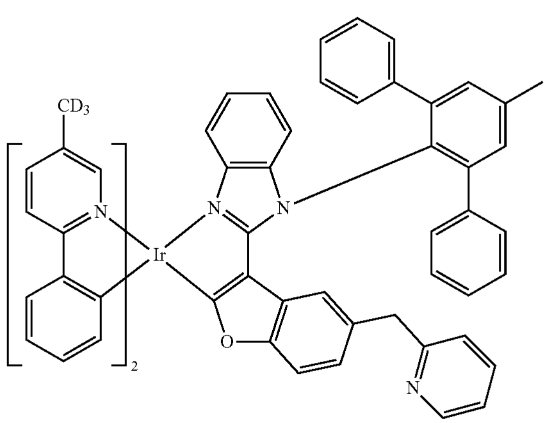
1553
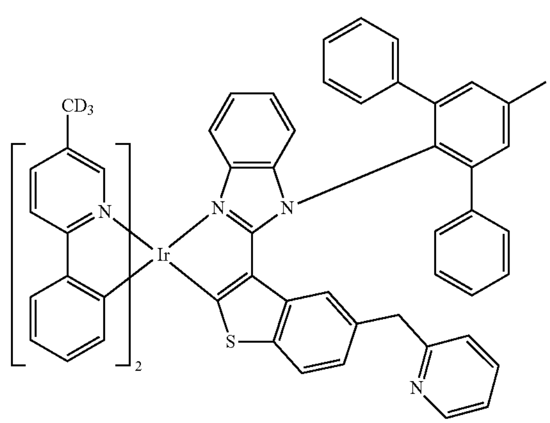

-continued
1554
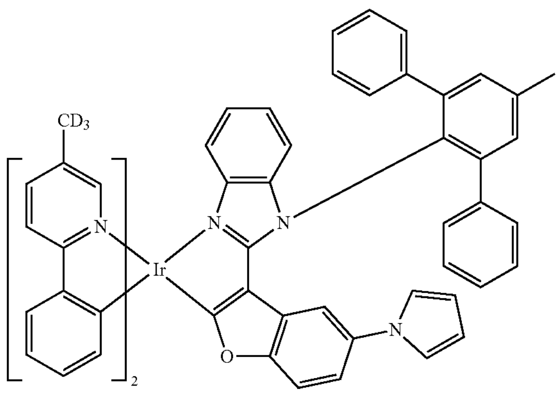
1555
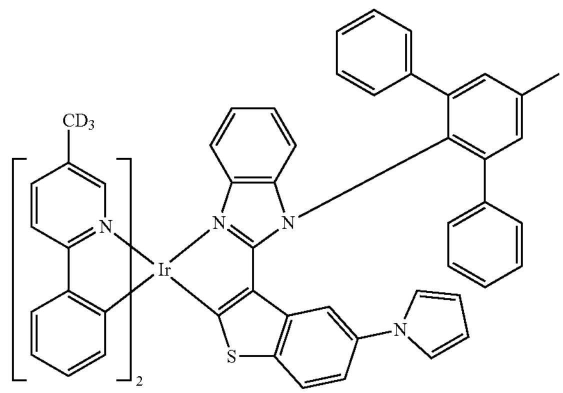
1556
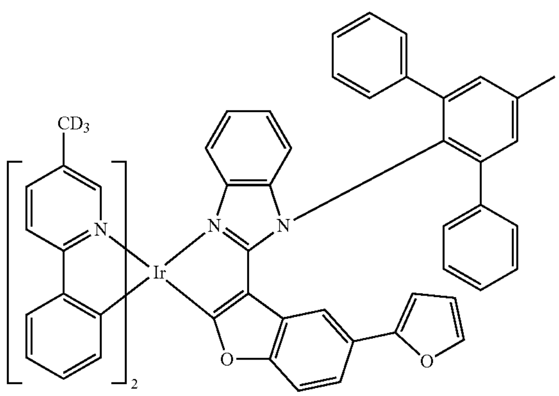
1557
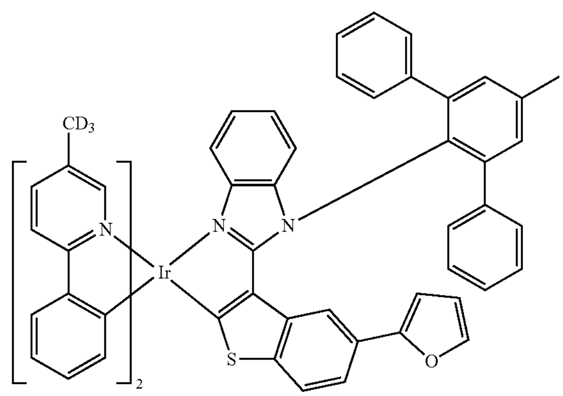
1558
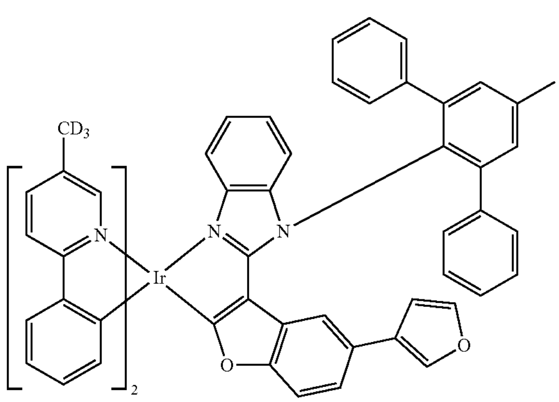
1559
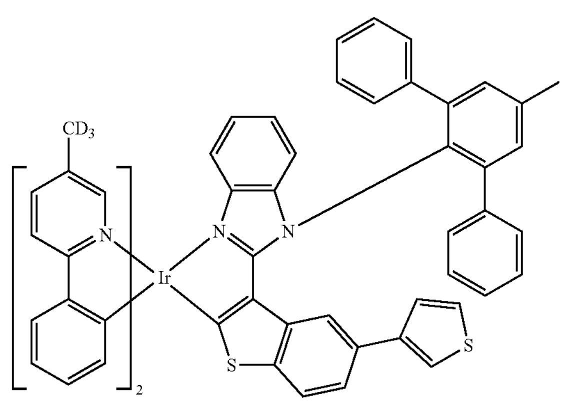

-continued
1560
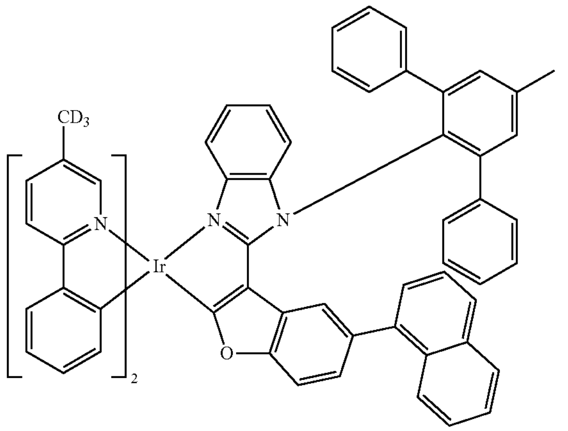
1561
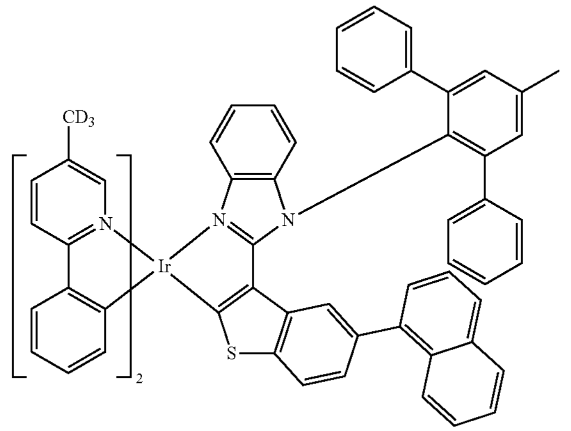
1562
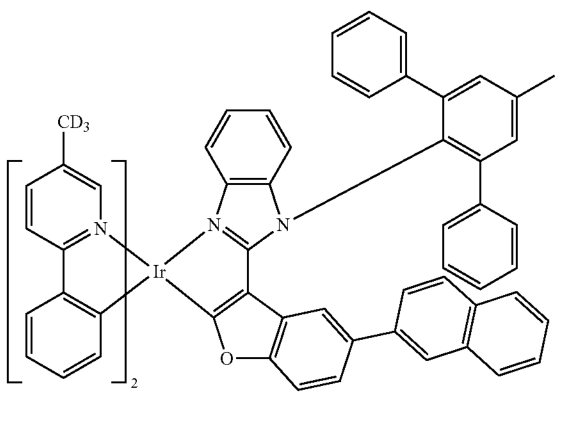
1563
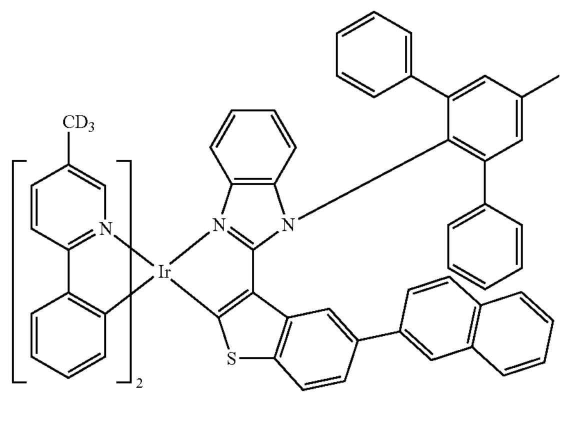
1565
1564
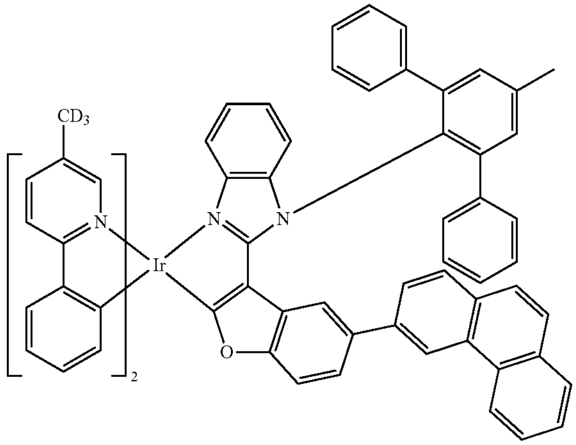
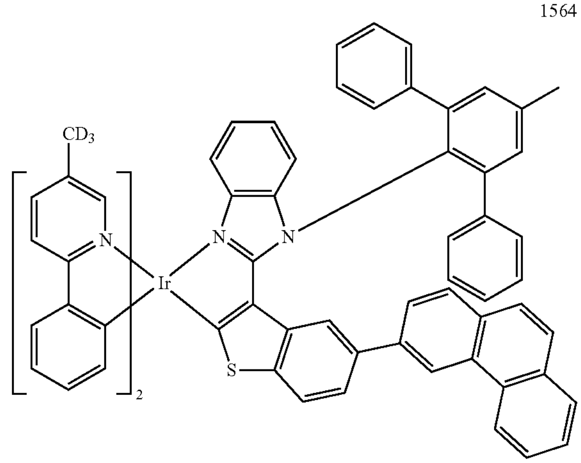

-continued
1566
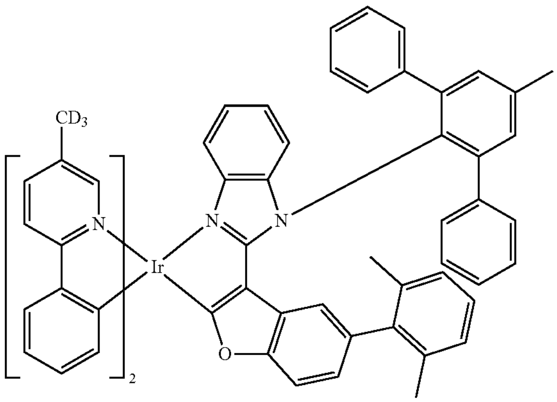
1567
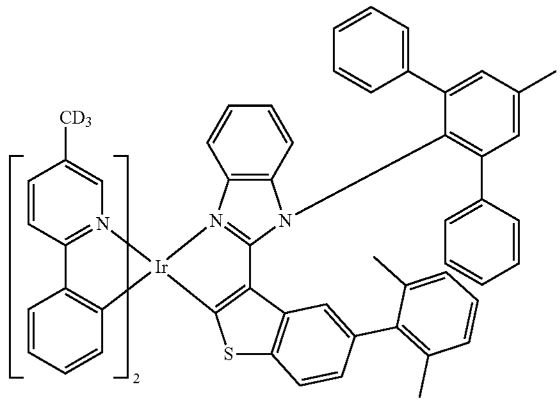
1568
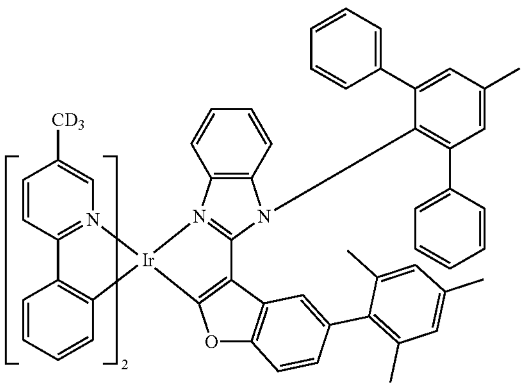
1569
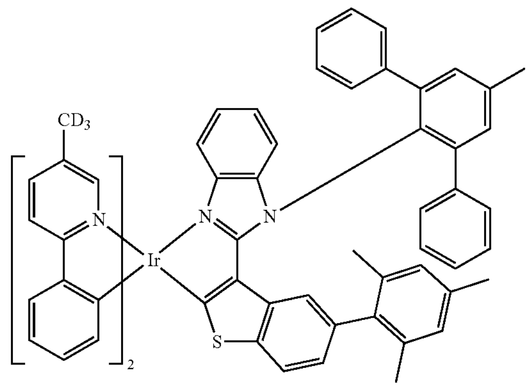
1570
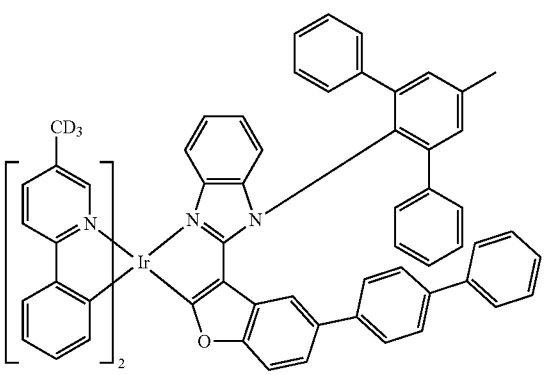
1571
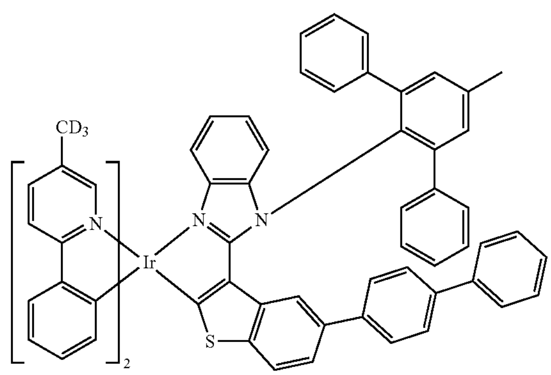
1572
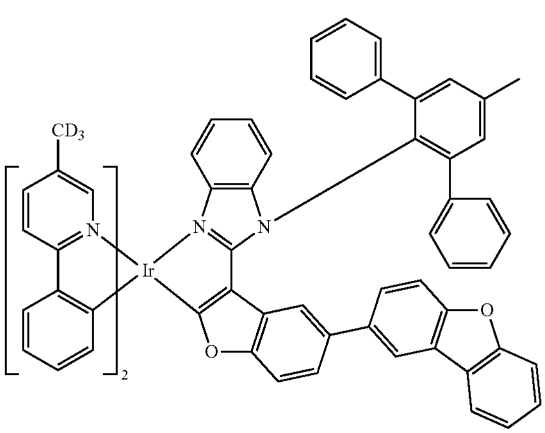
1573
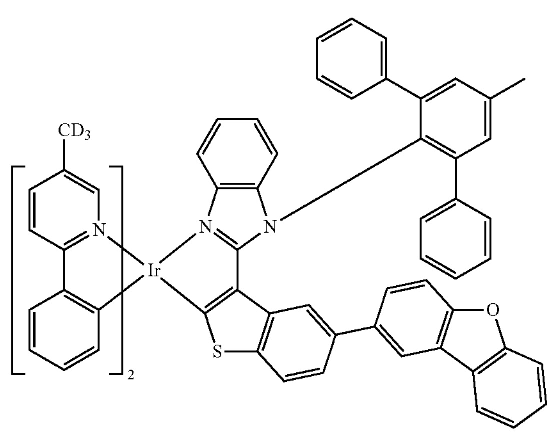

-continued
1574
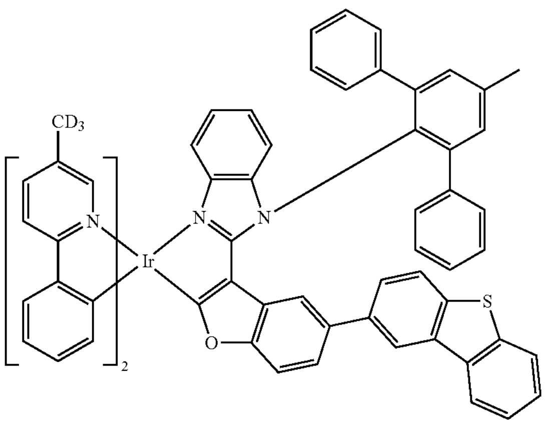
1575
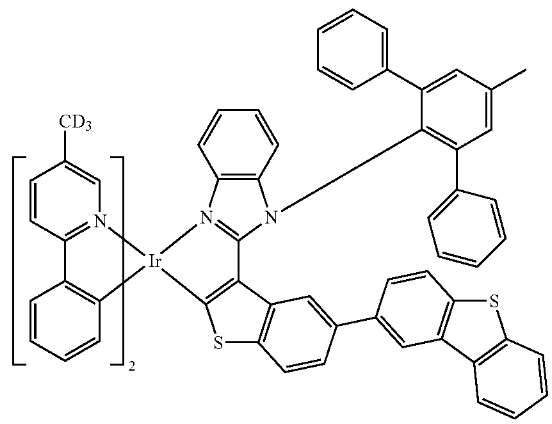
1576
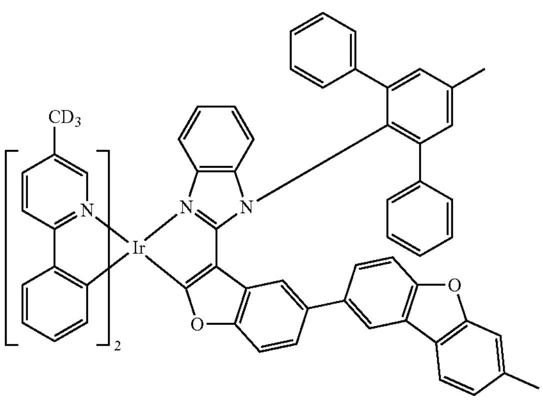
1577
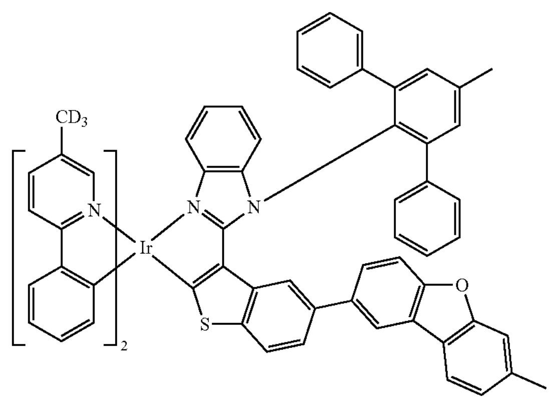
1578
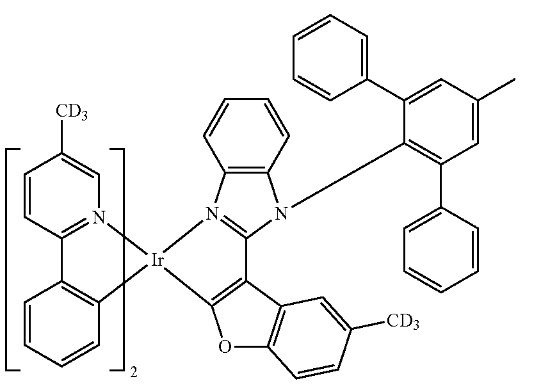
1579
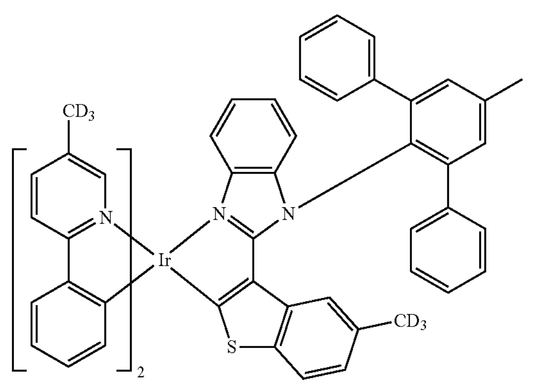
1580
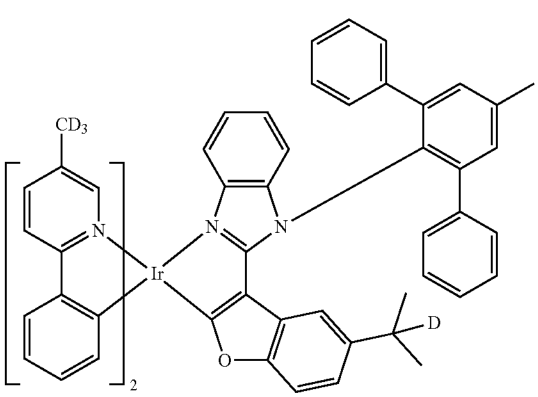
1581
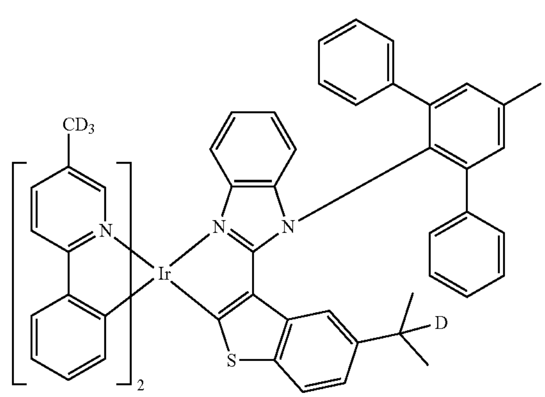

-continued
1582
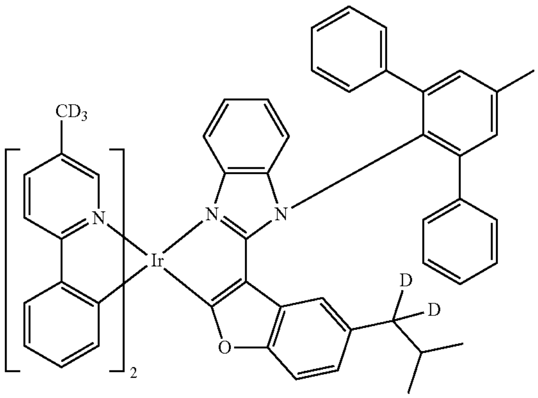
1583
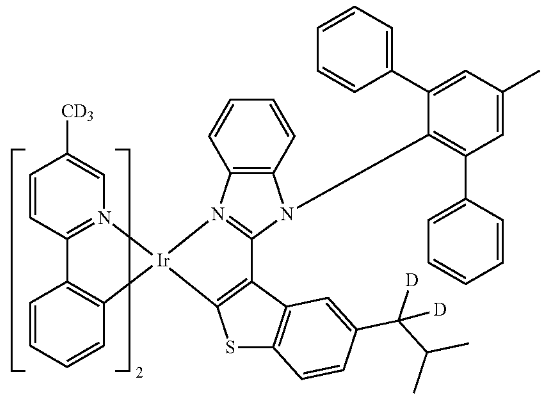
1584
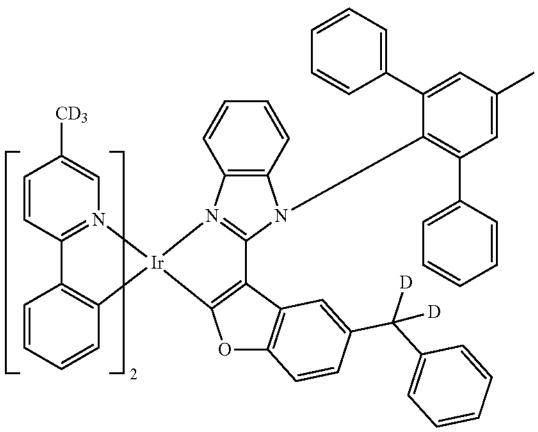
1585
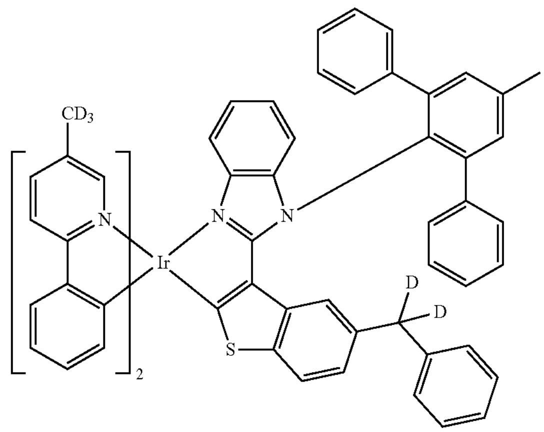
1586
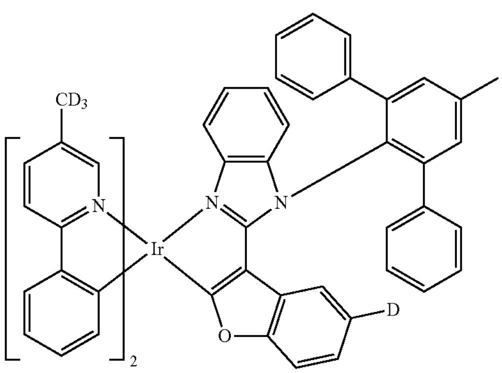
1587
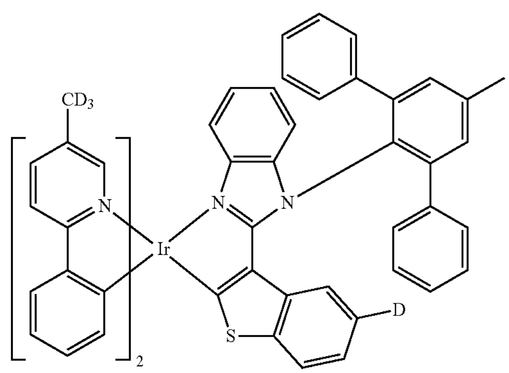
1588
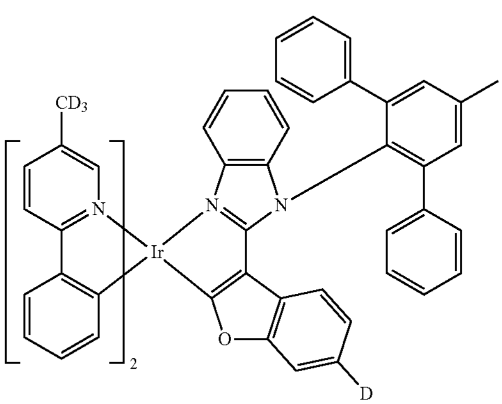
1589
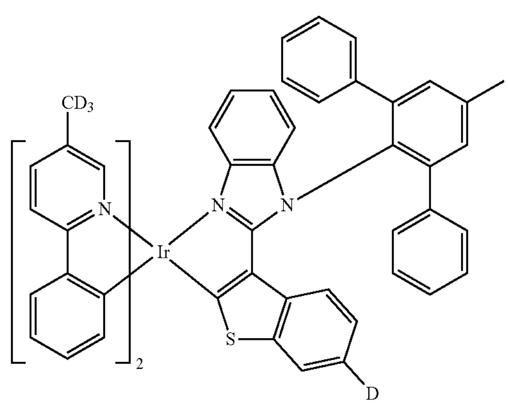

-continued
1590
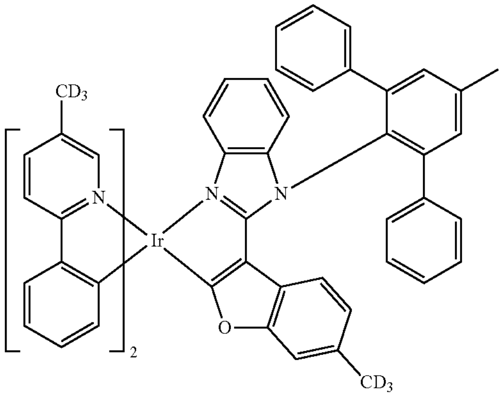
1591
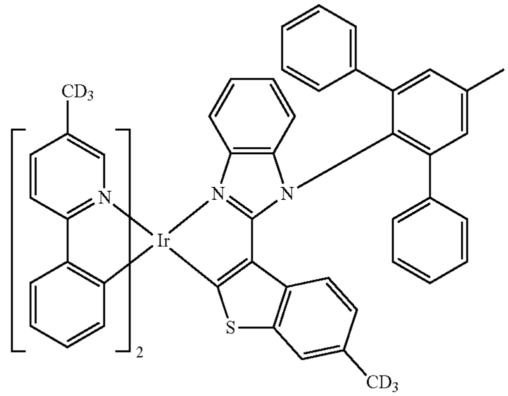
1592
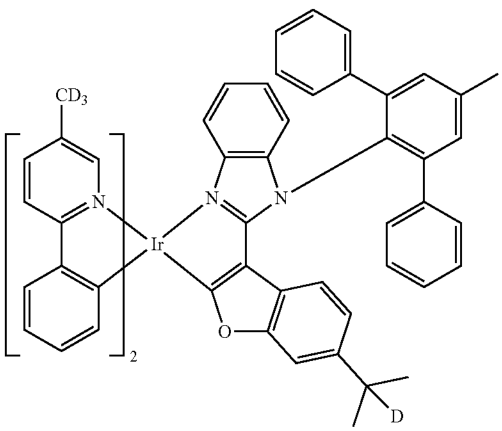
1593
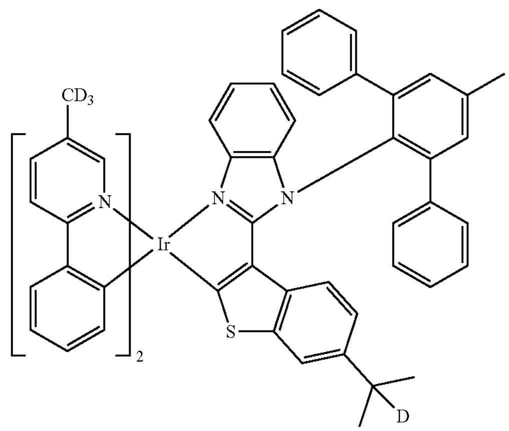
1594
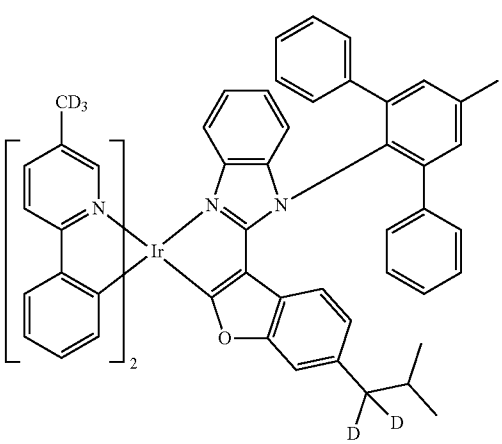
1595
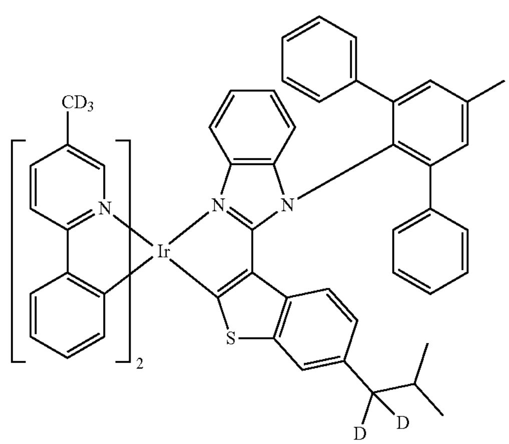

-continued
1596
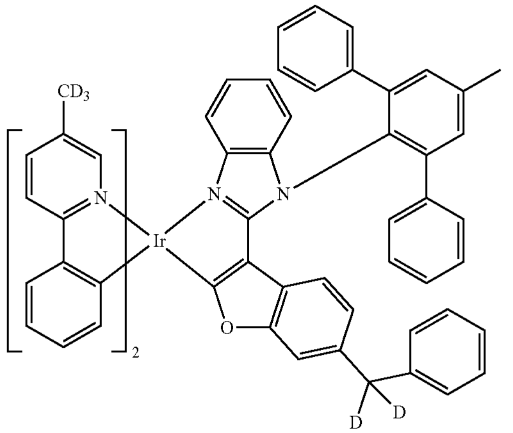
1597
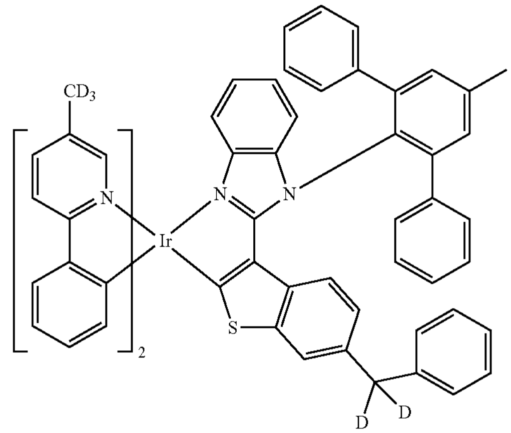
1598
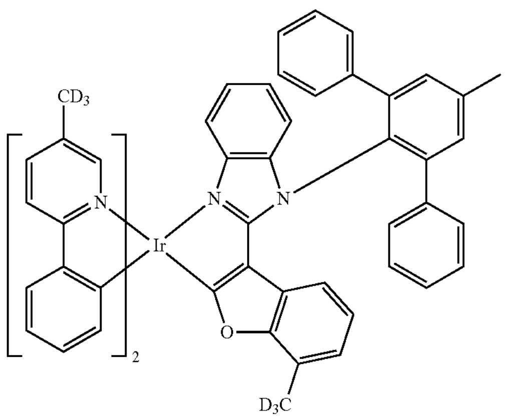
1599
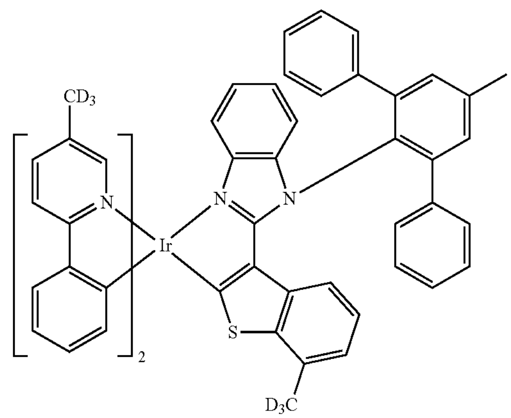
1600
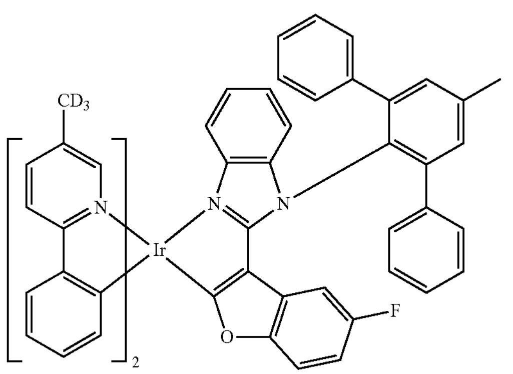
1601
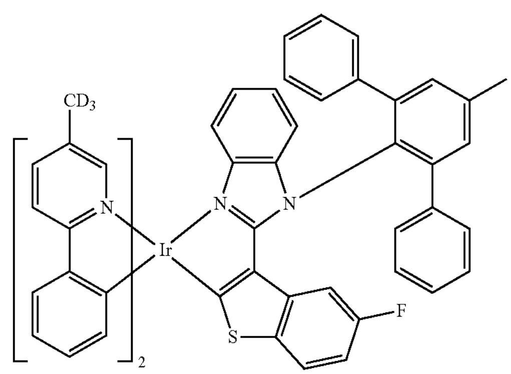
1602
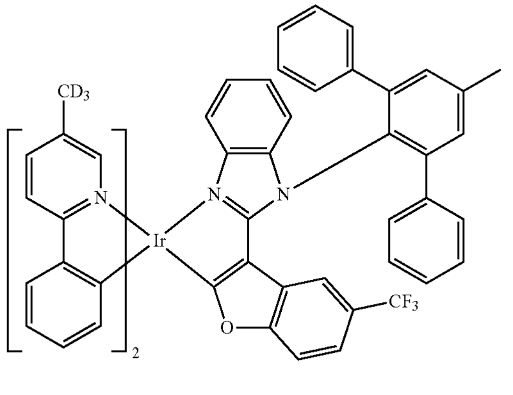
1603
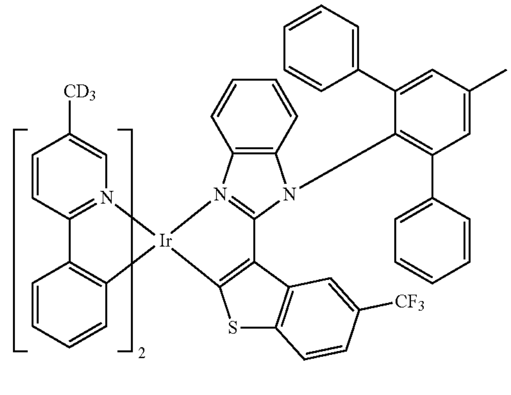

-continued
1604
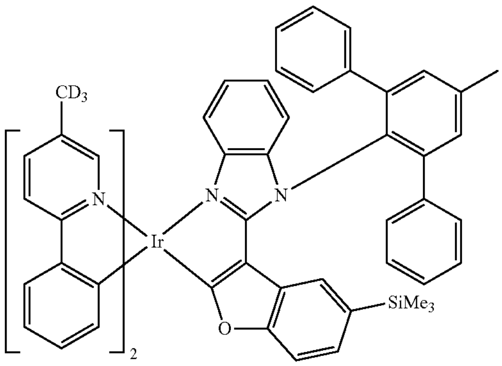
1605
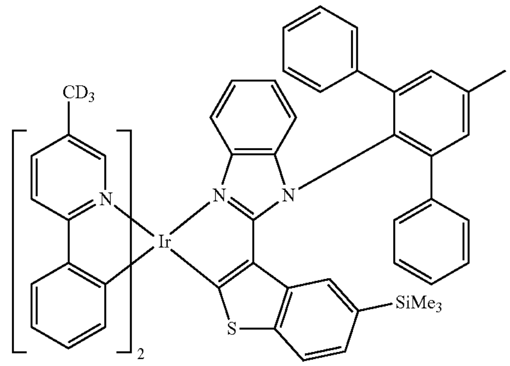
1606
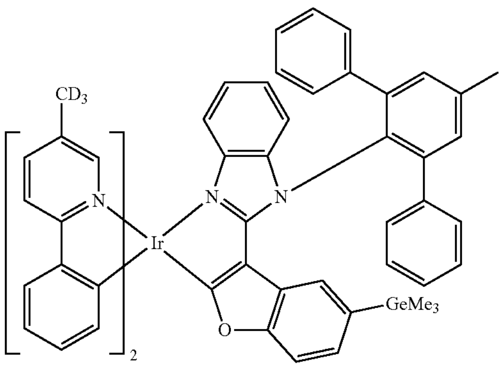
1607
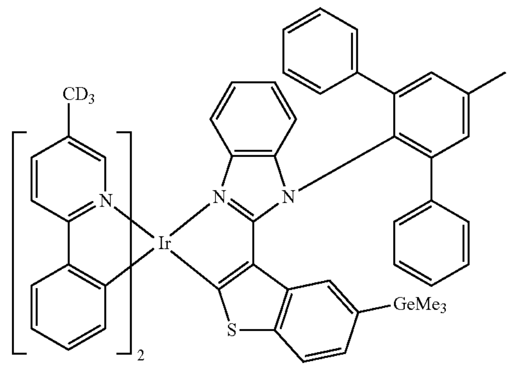
1608
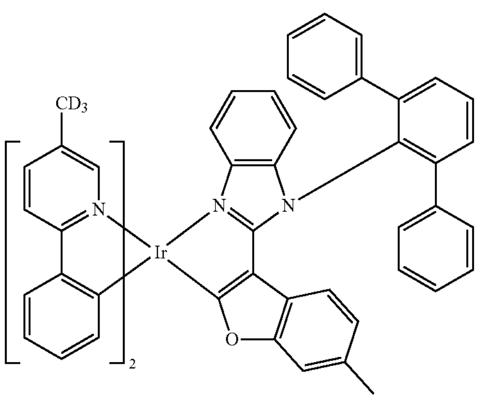
1609
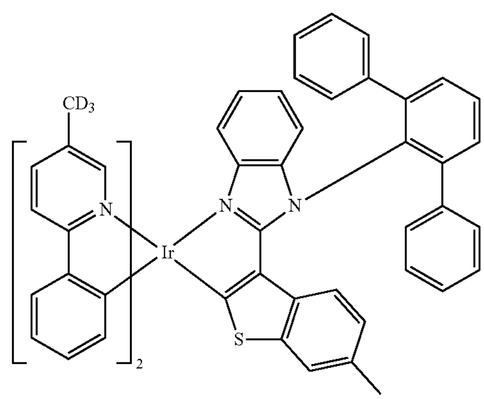
1610
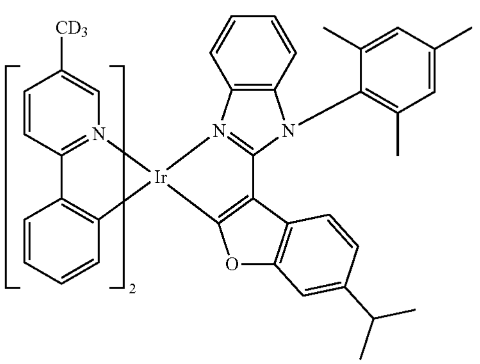
1611
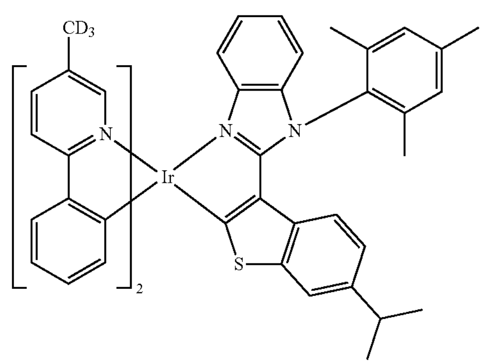

-continued
1612
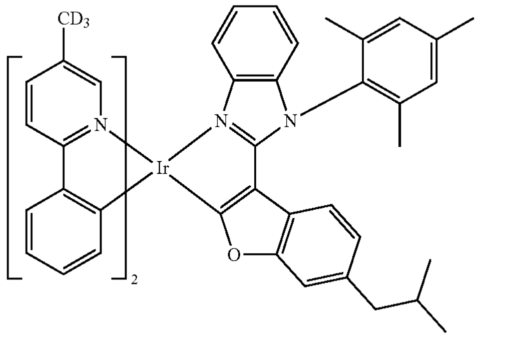
1613
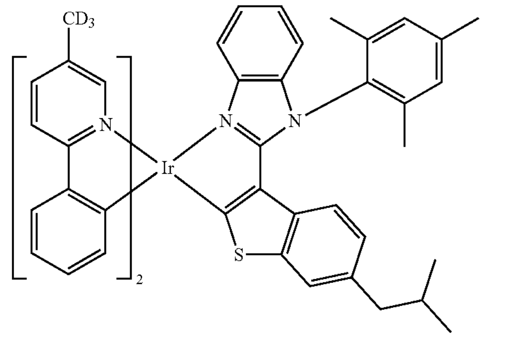
1614
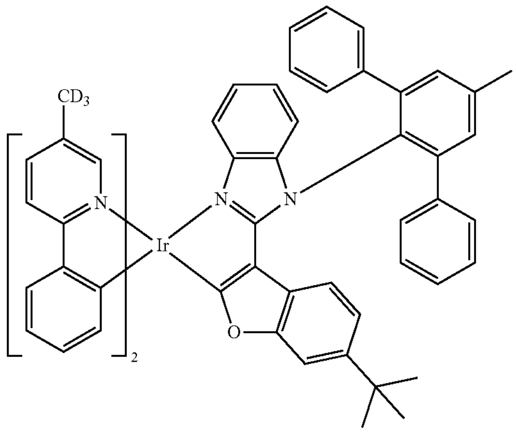
1615
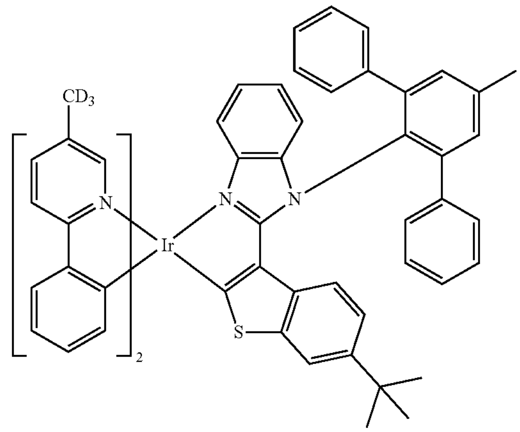
1616
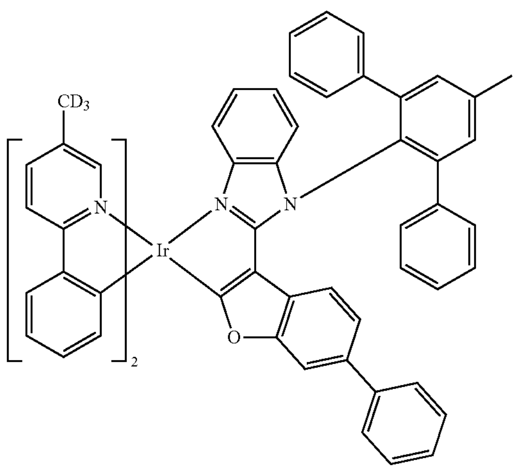
1617
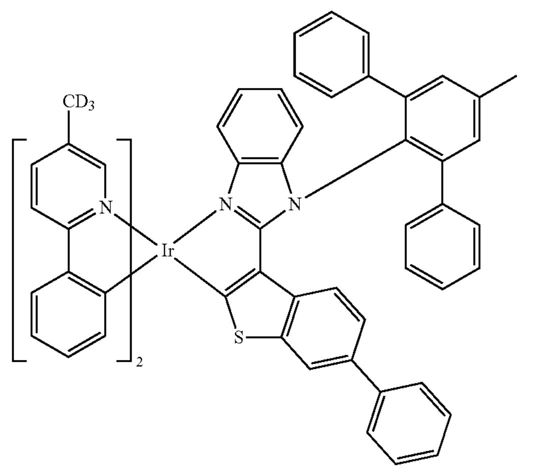
1618
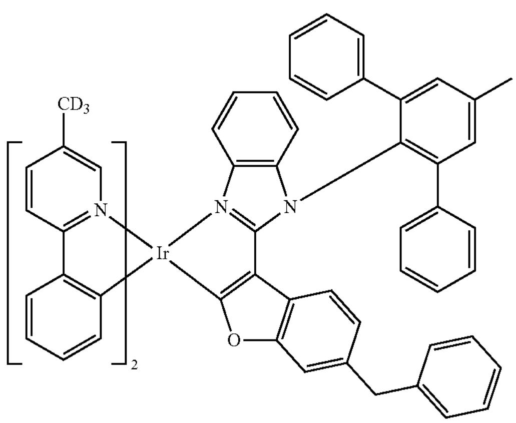
1619
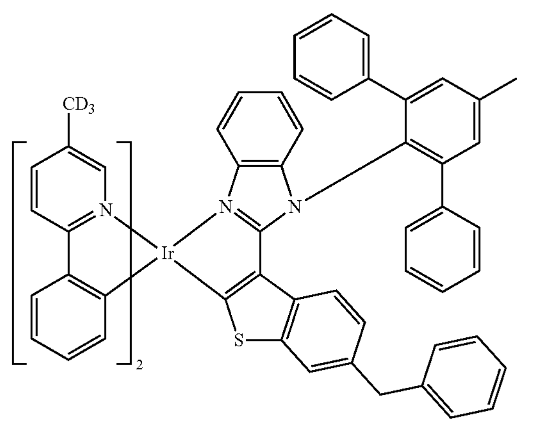

-continued
1620
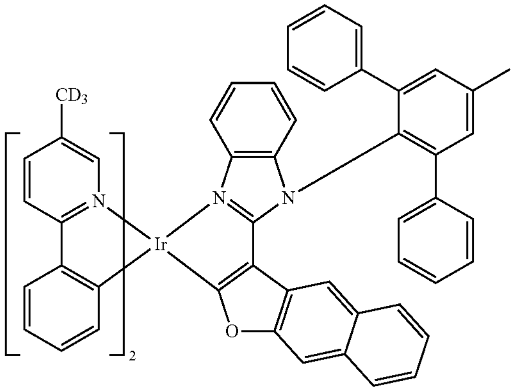
1621
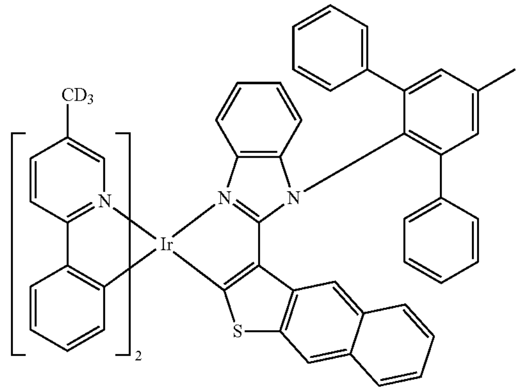
1622
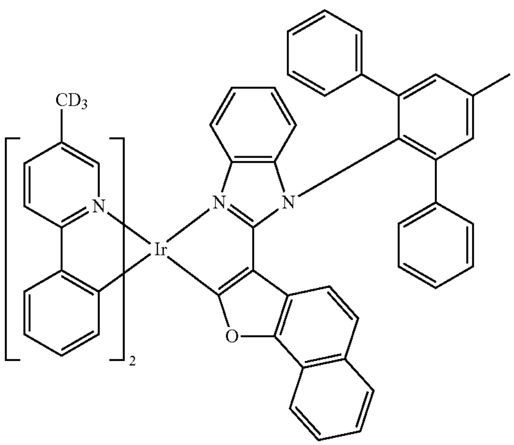
1623
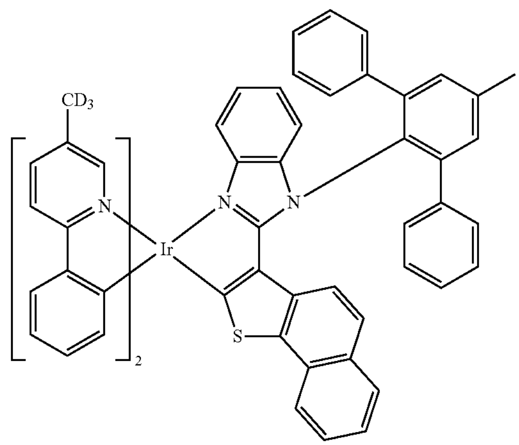
1624
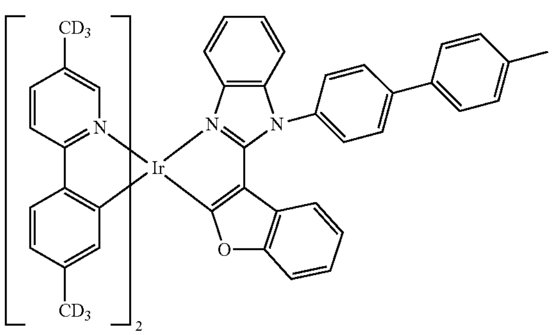
1625
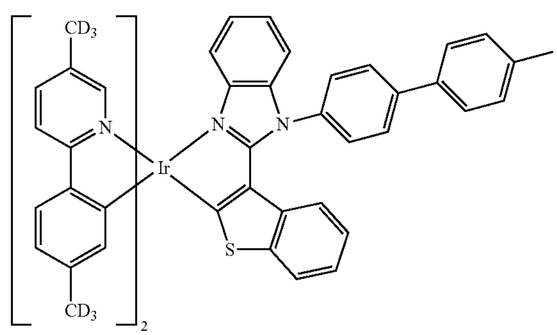
1626
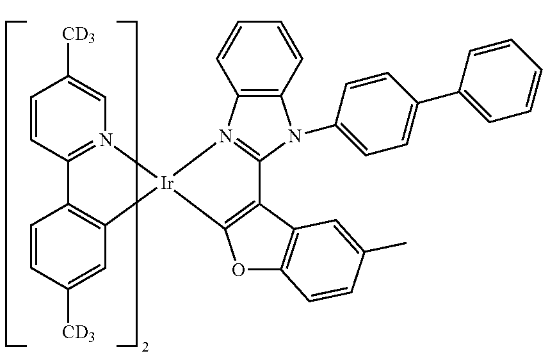
1627
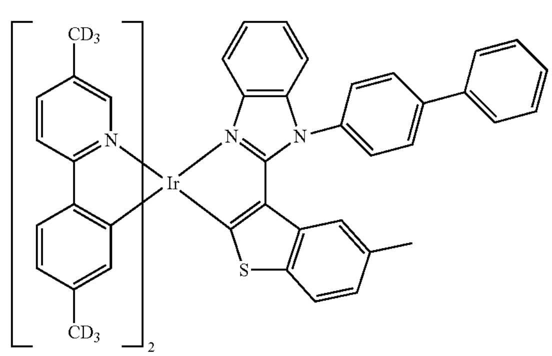

-continued
1628
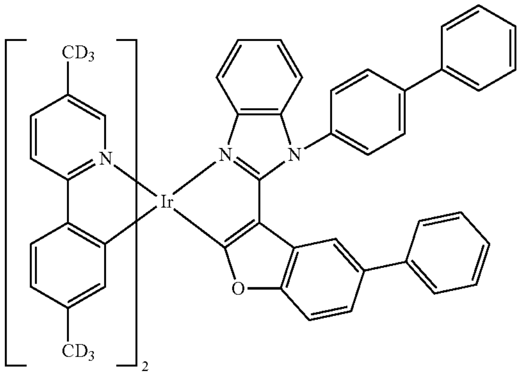
1629
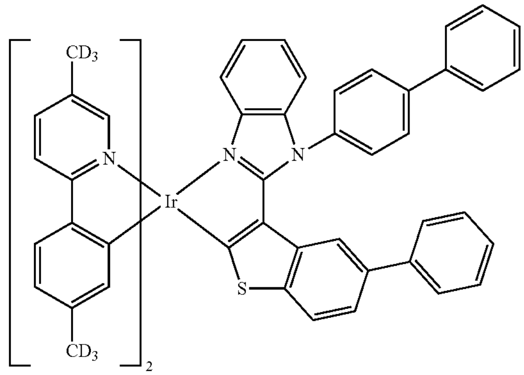
1630
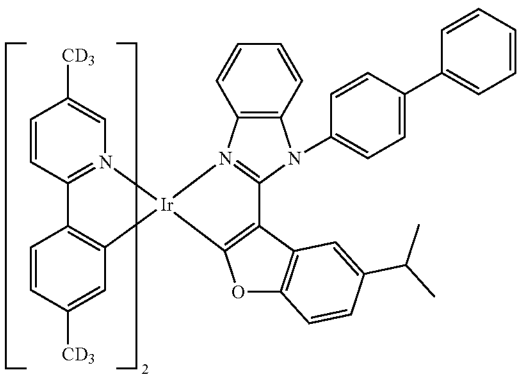
1631
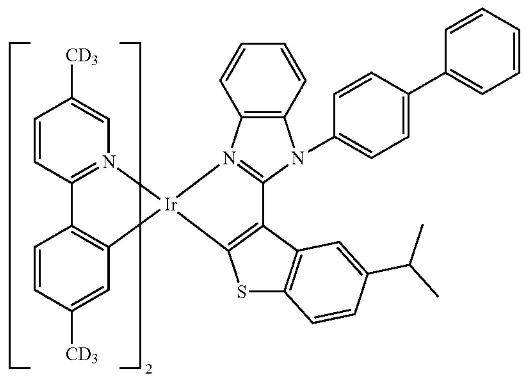
1632
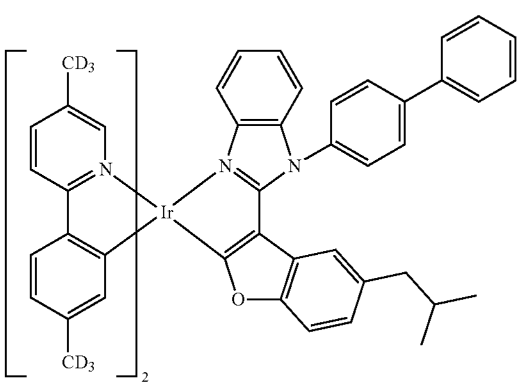
1633
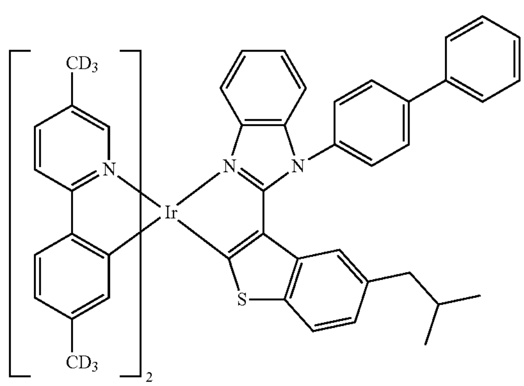
1634
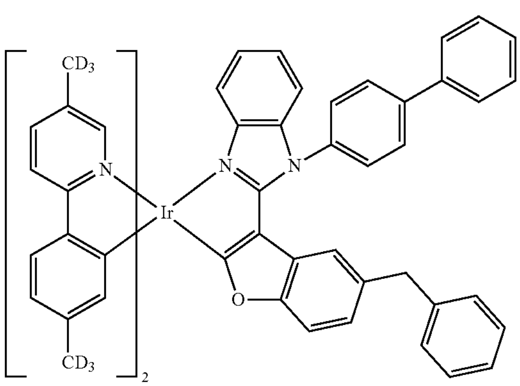
1635
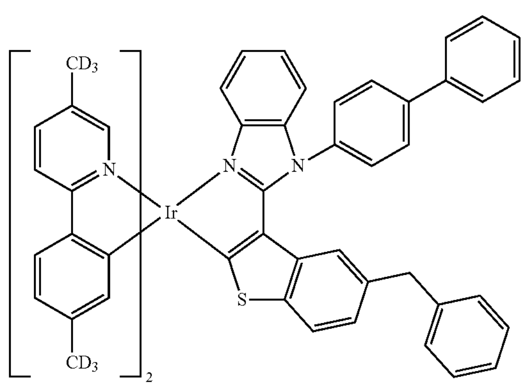

-continued
1636
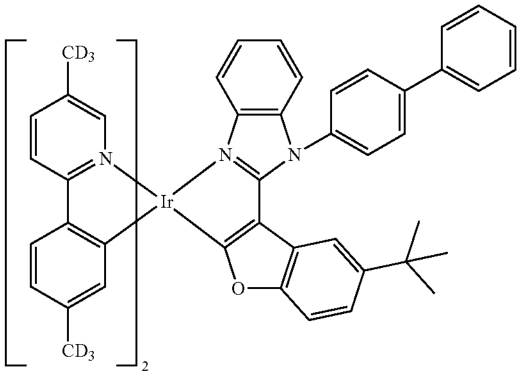
1637
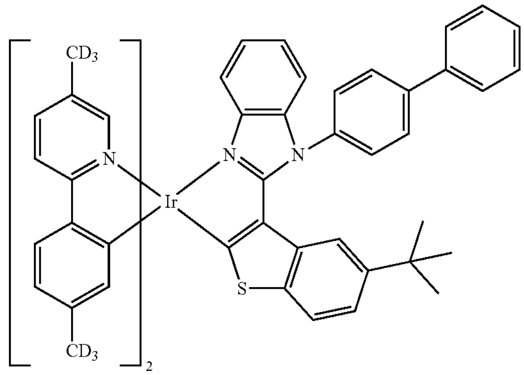
1638
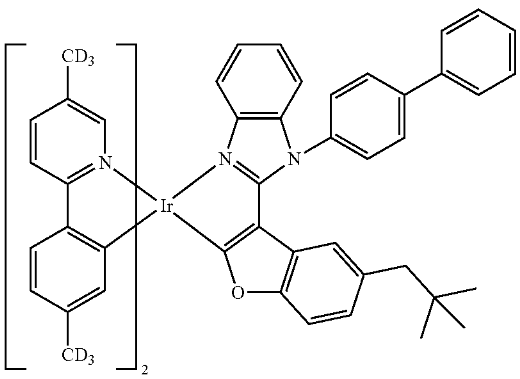
1639
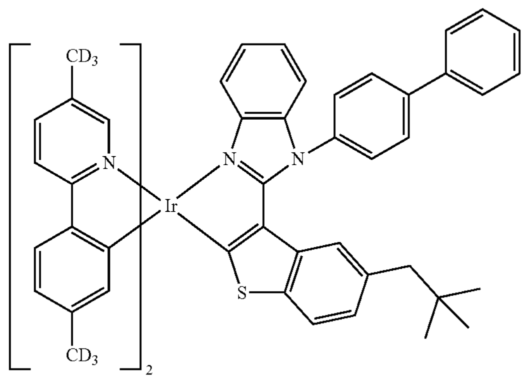
1640
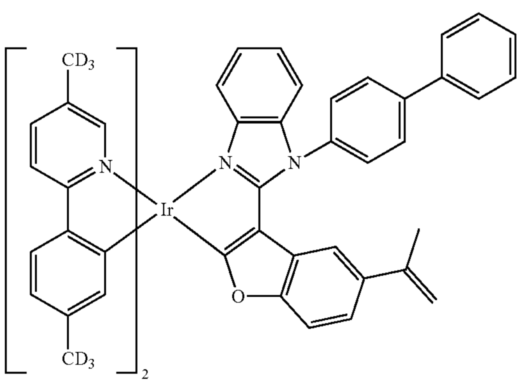
1641
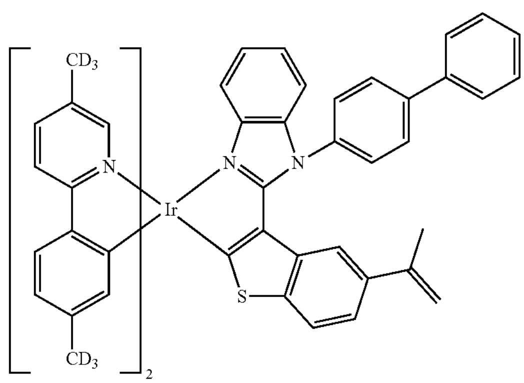
1642
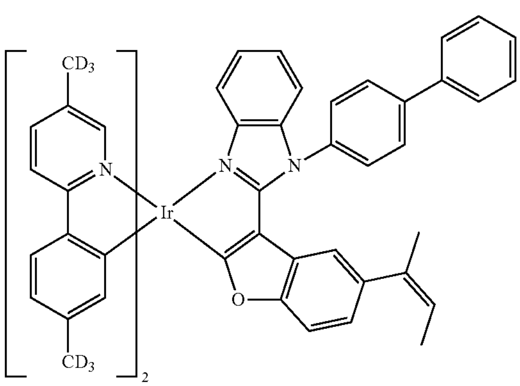
1643
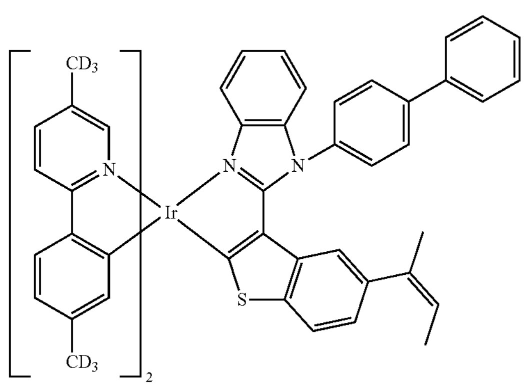

-continued
1644
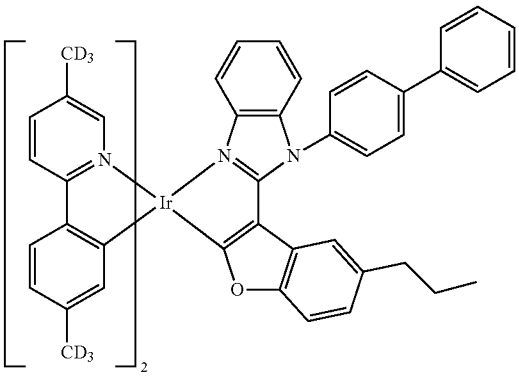
1645
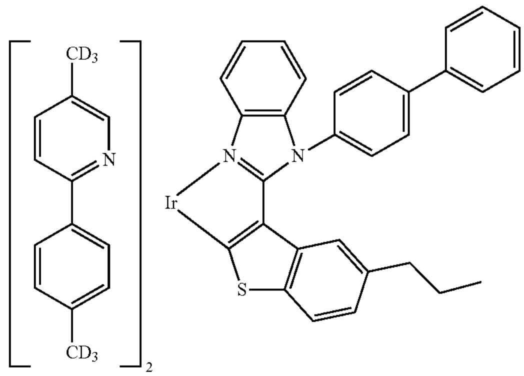
1646
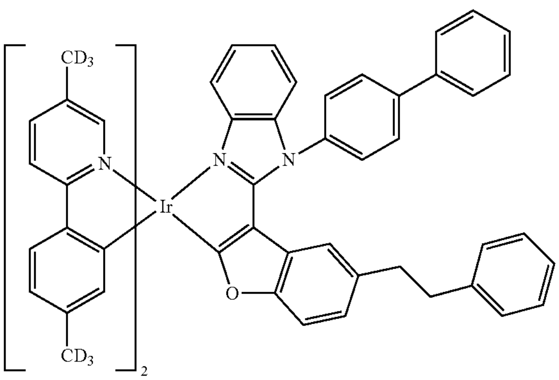
1647
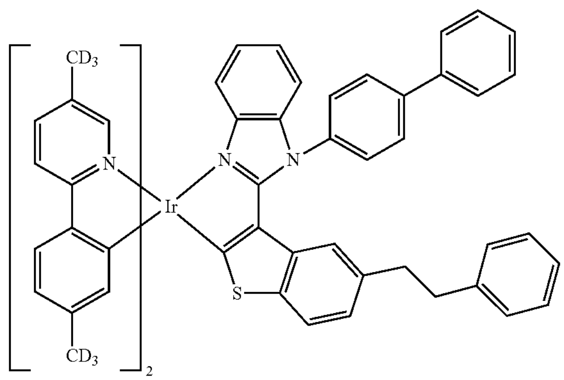
1648
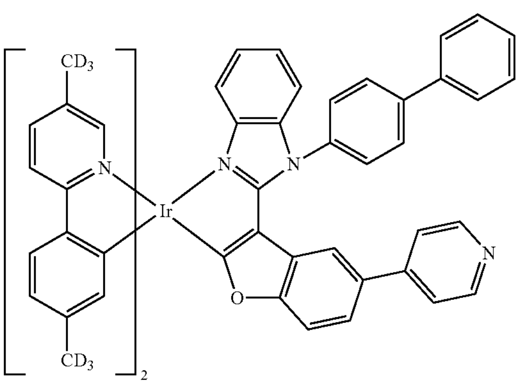
1649
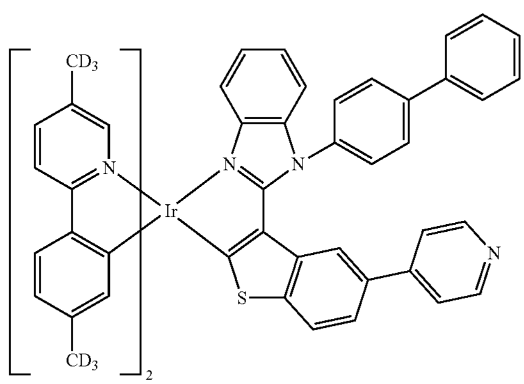
1650
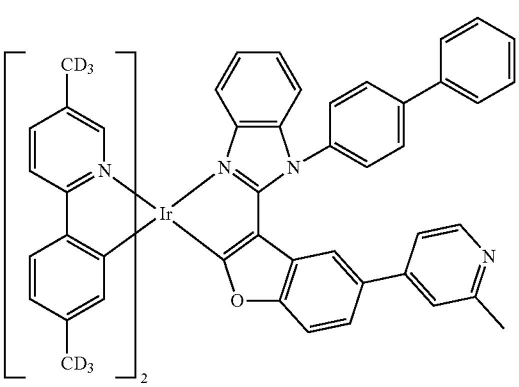
1651
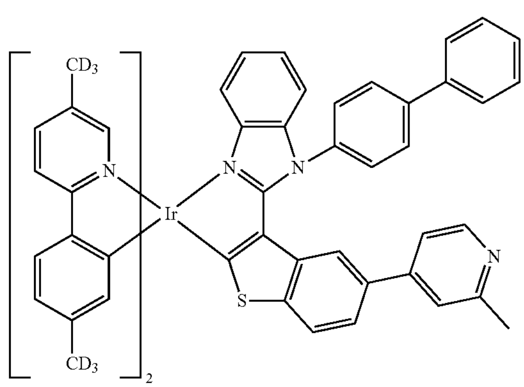

-continued
1652
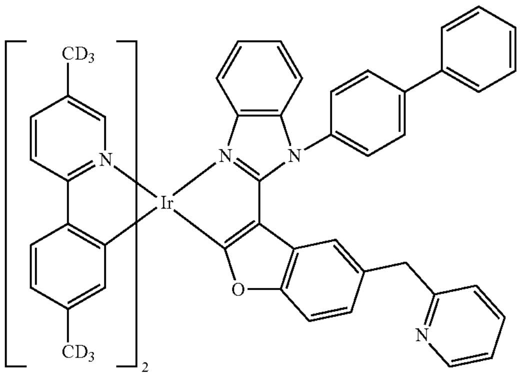
1653
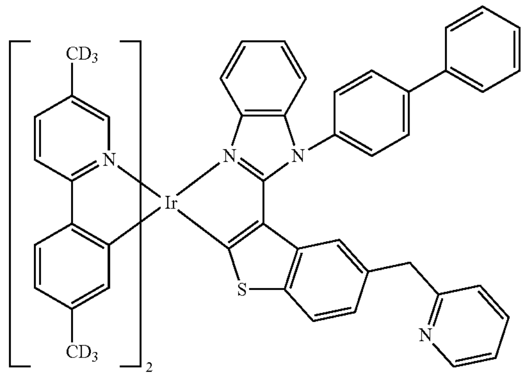
1654
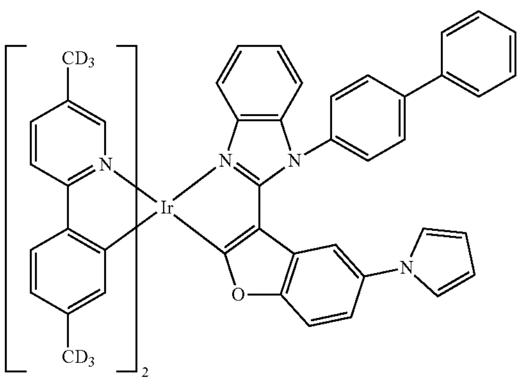
1655
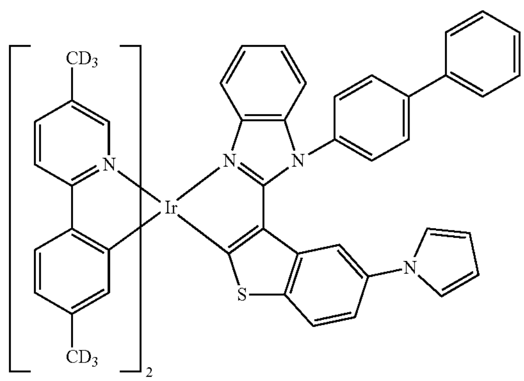
1656
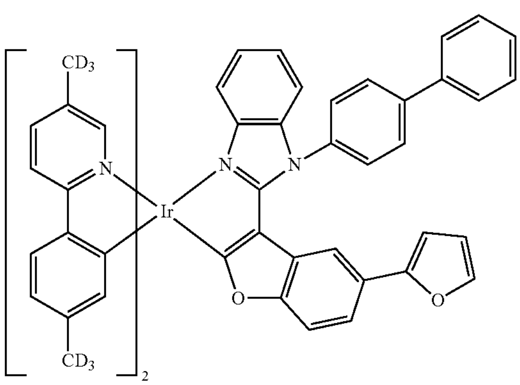
1657
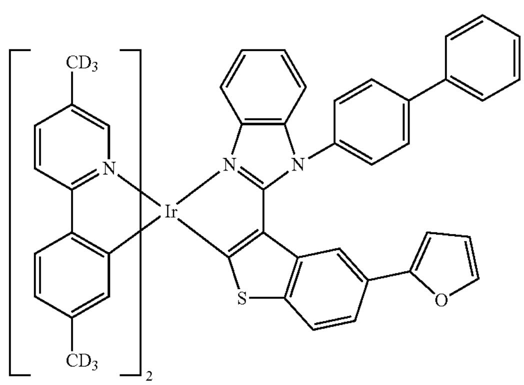
1658
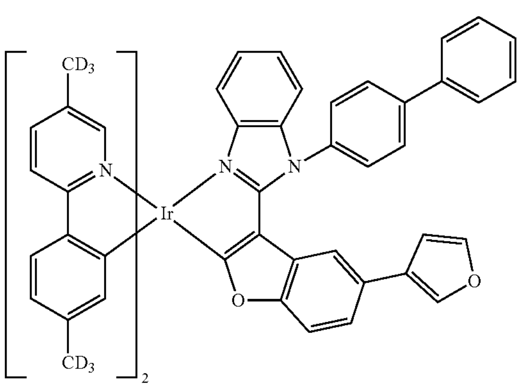
1659
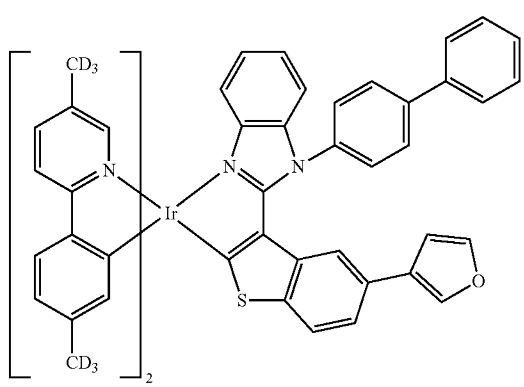

-continued
1660
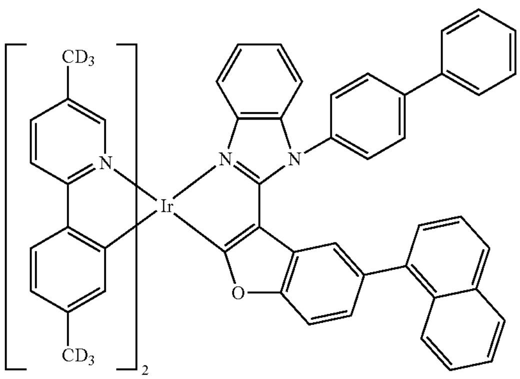
1661
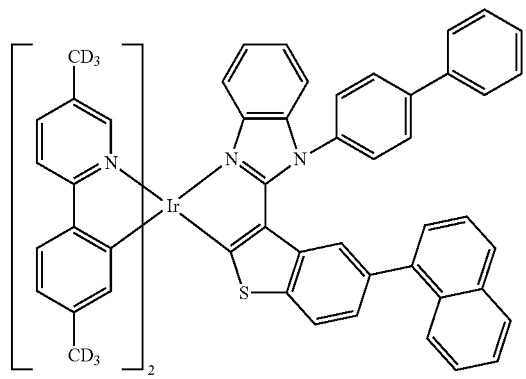
1662
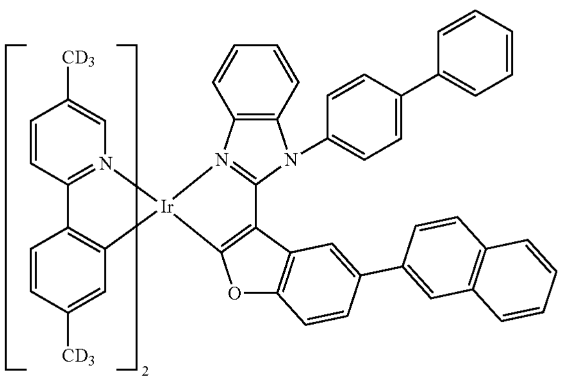
1663
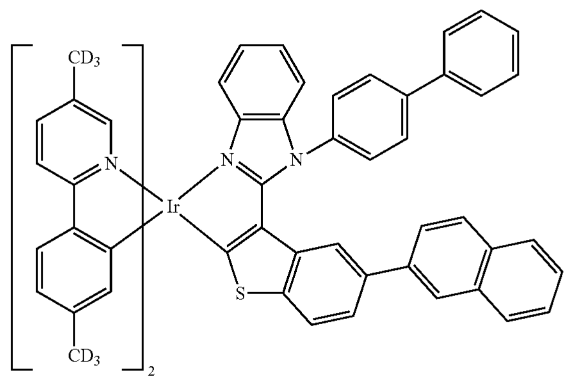
1664
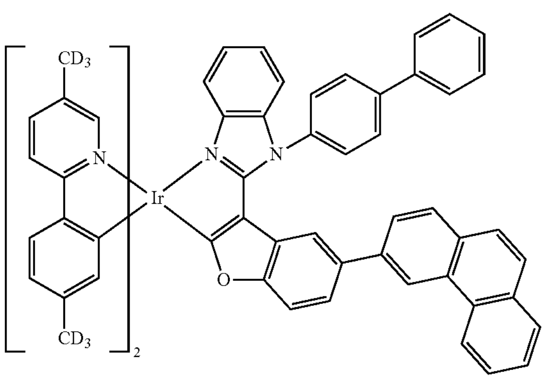
1665
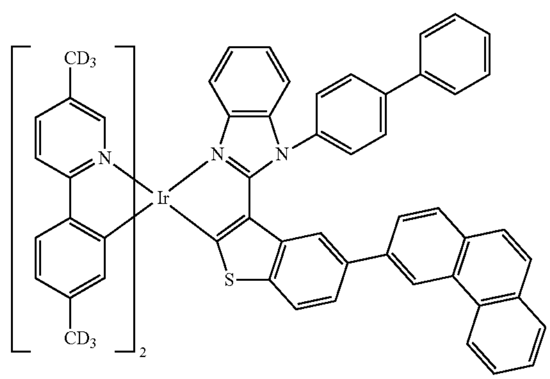
1666
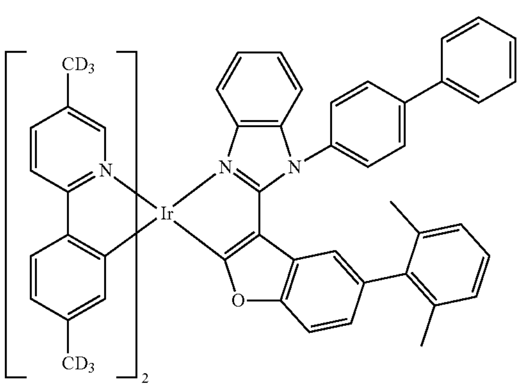
1667
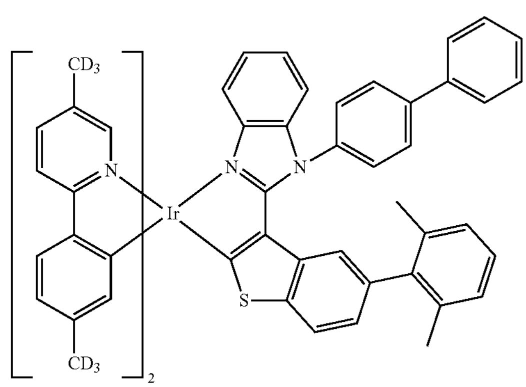

-continued
1668
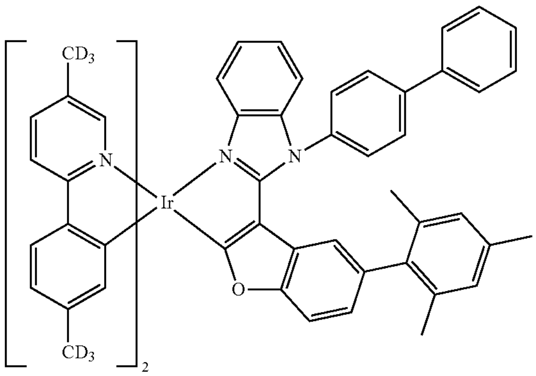
1669
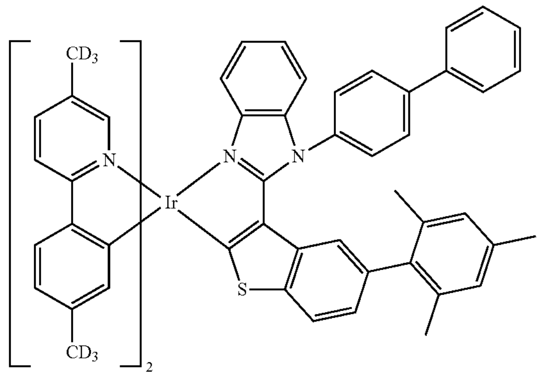
1670
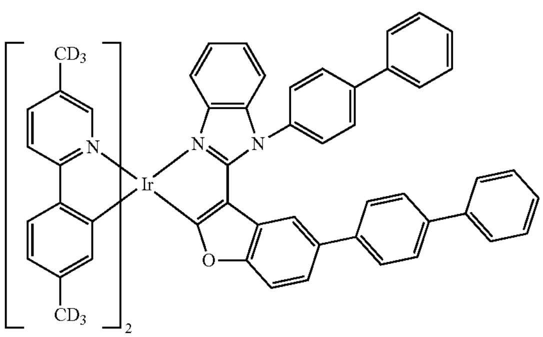
1671
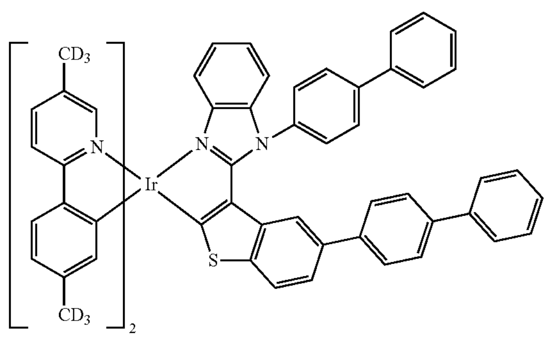
1672
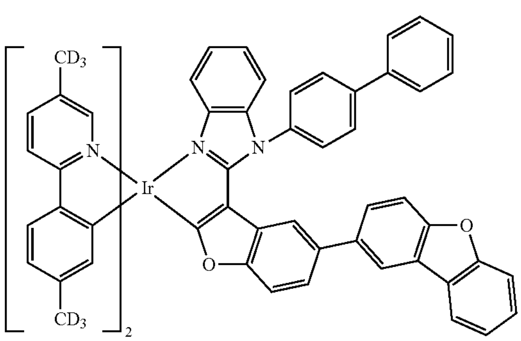
1673
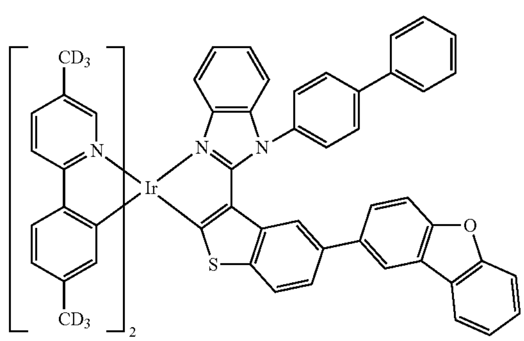
1674
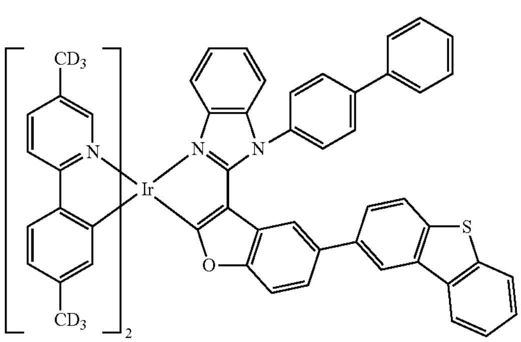
1675
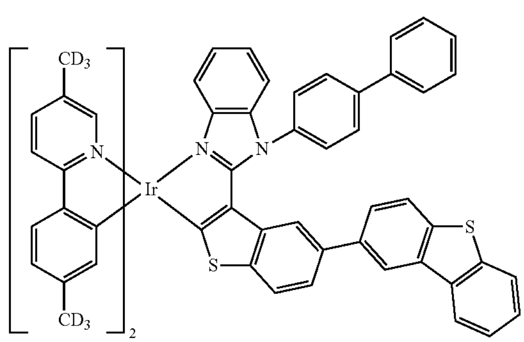

-continued
1676
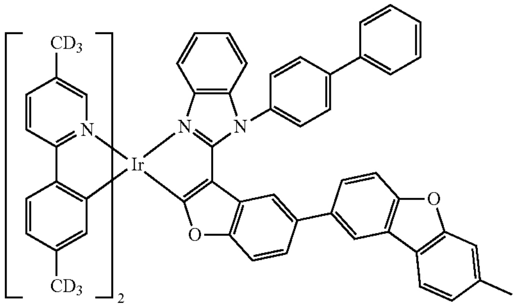
1677
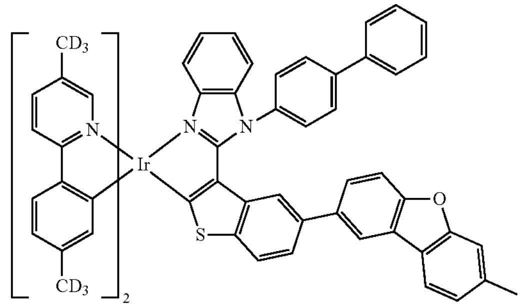
1678
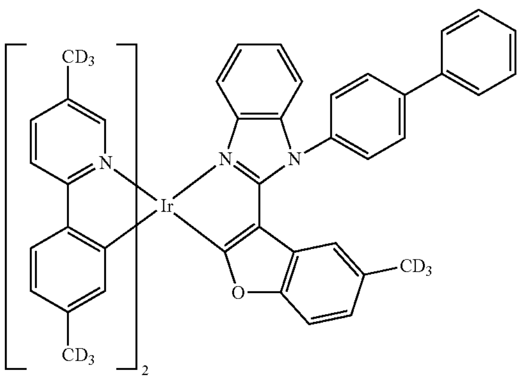
1679
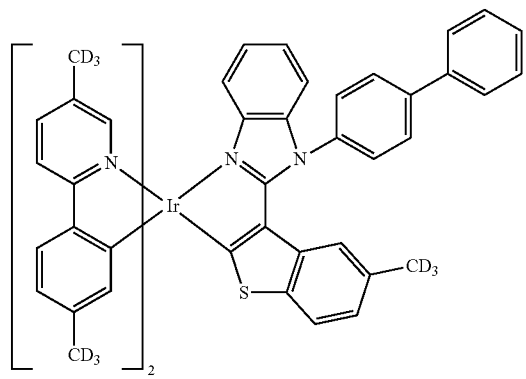
1680
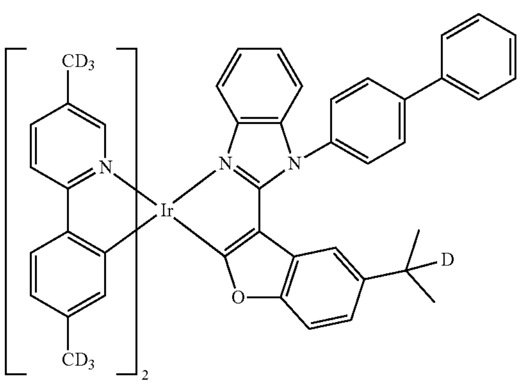
1681
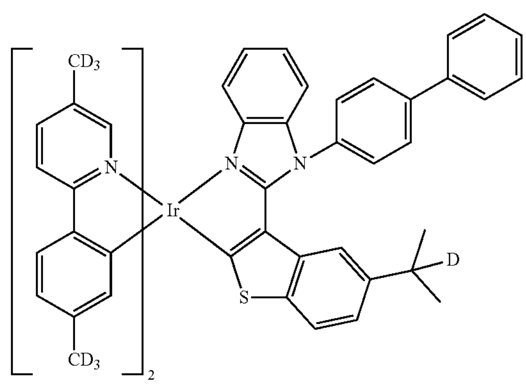
1682
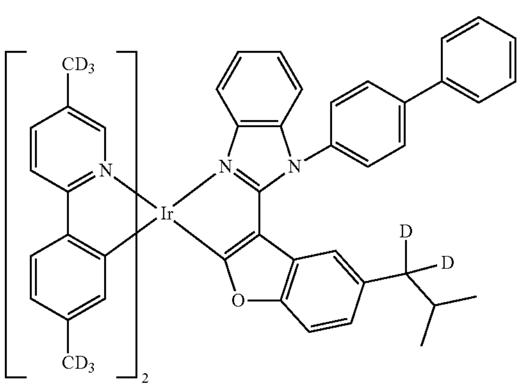
1683
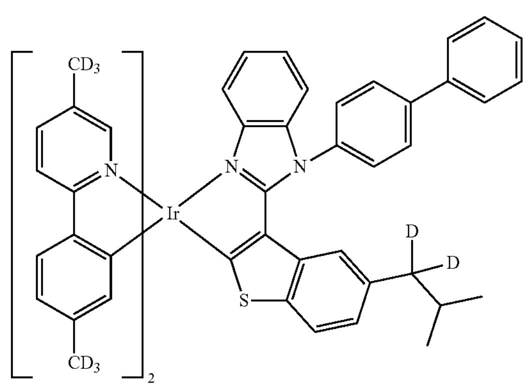

-continued
1684
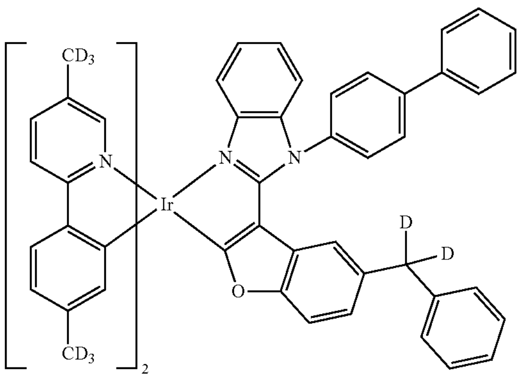
1685
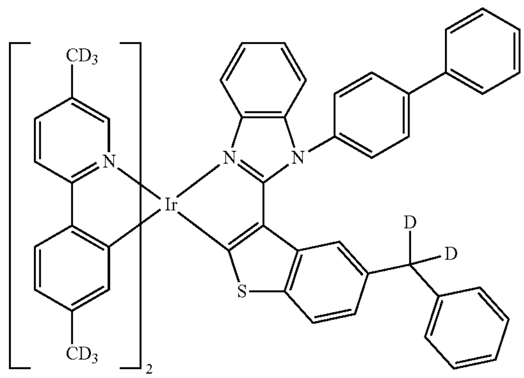
1686
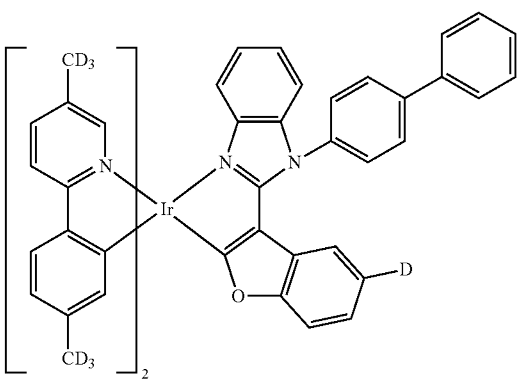
1687
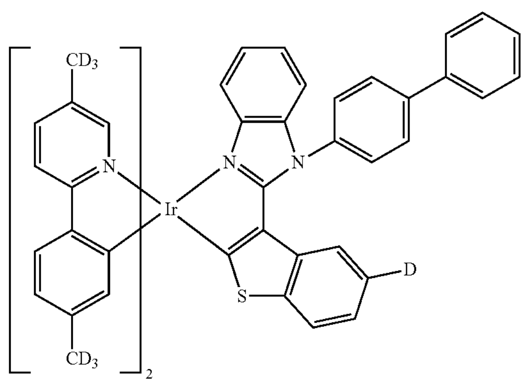
1688
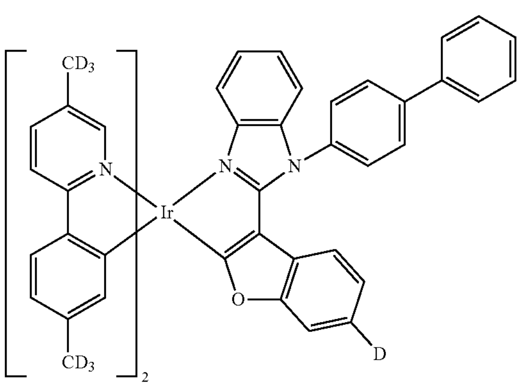
1689
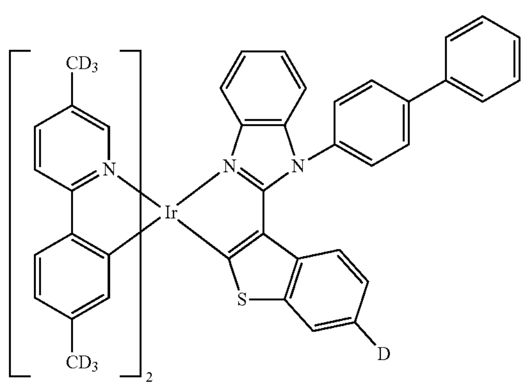
1690
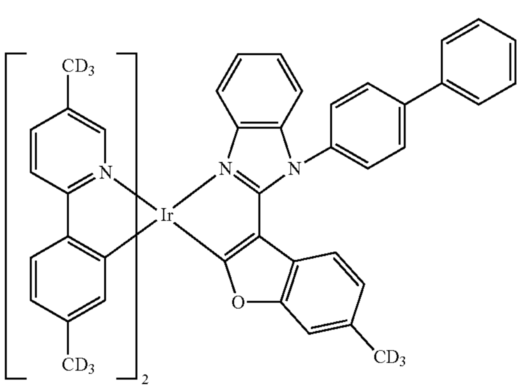
1691
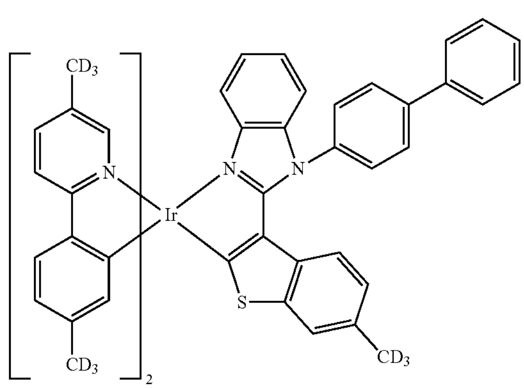

-continued
1692
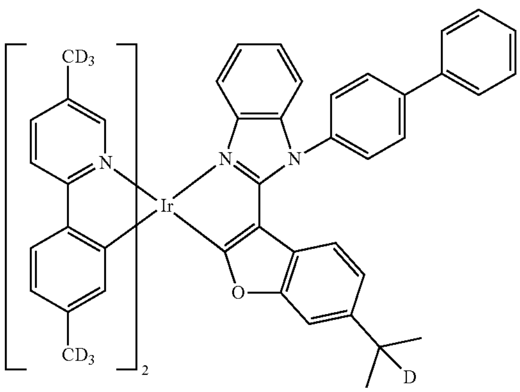
1693
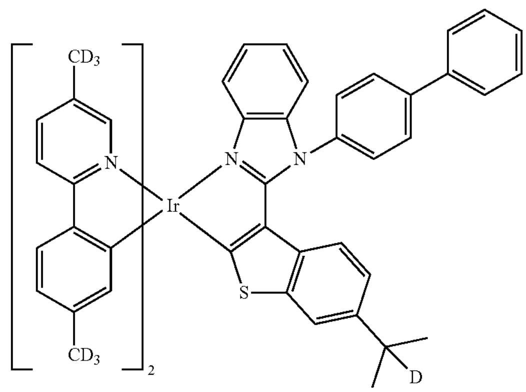
1694
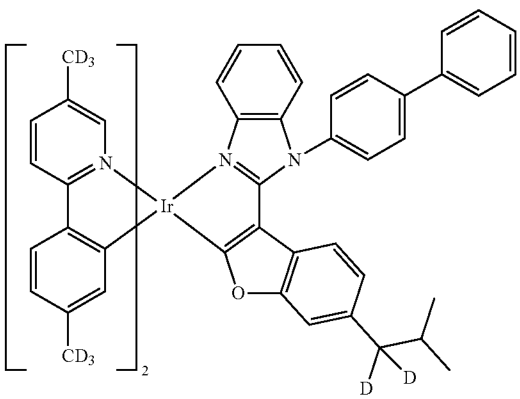
1695
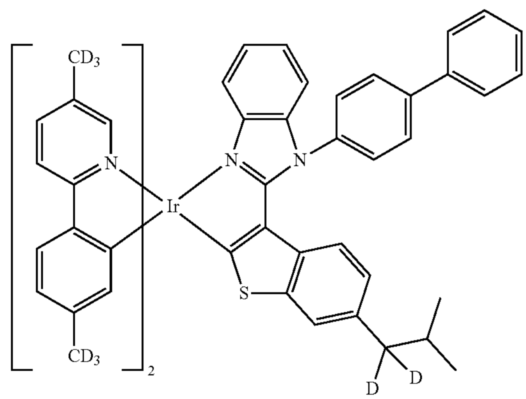
1696
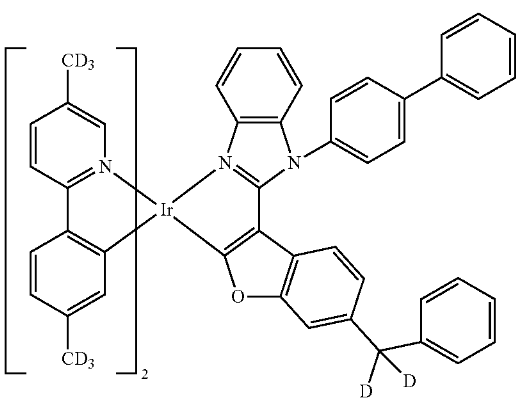
1697
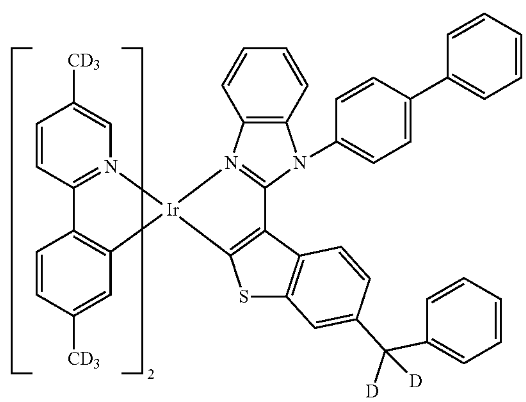
1698
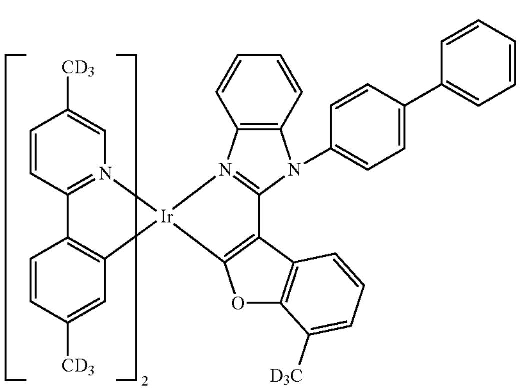
1699
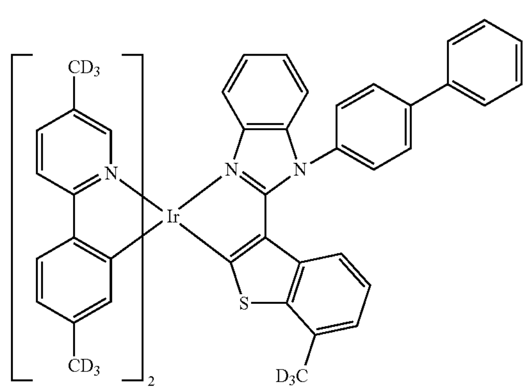

-continued
1700
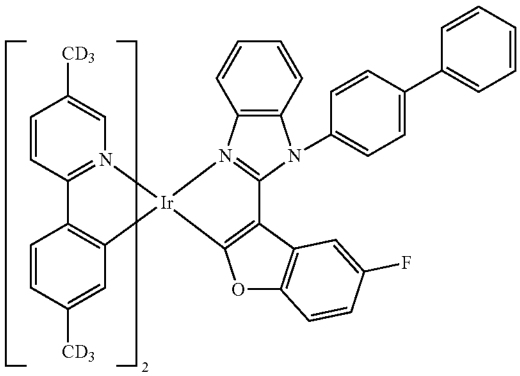
1701
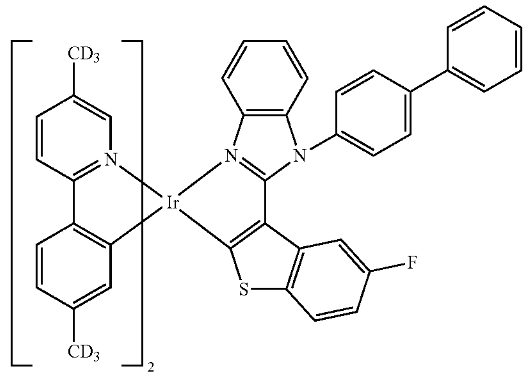
1702
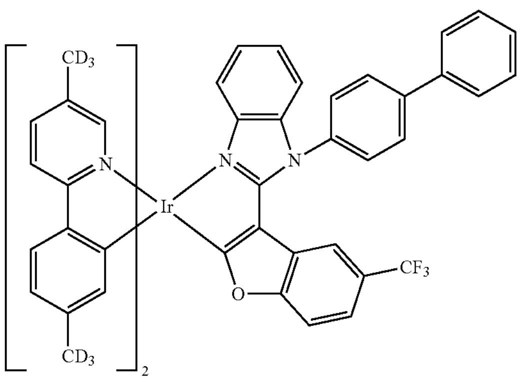
1703
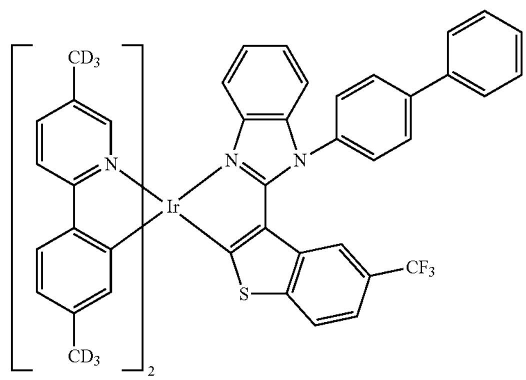
1704
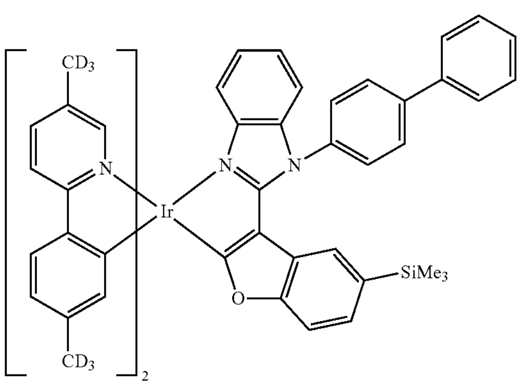
1705
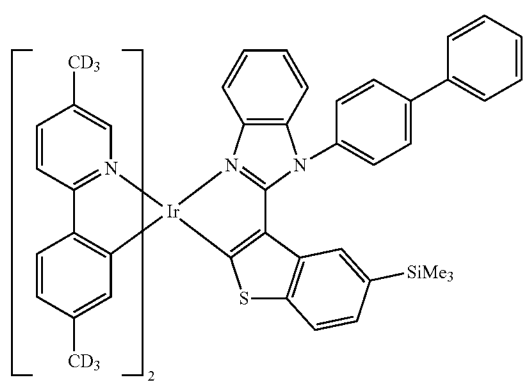
1706
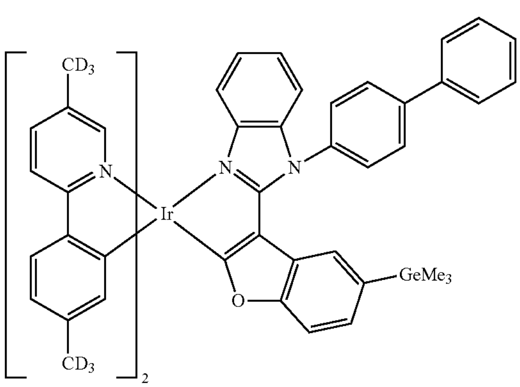
1707
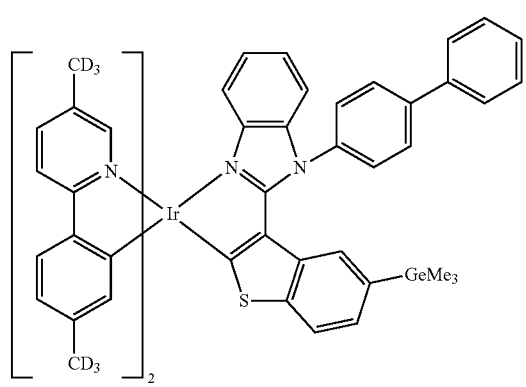

-continued
1708
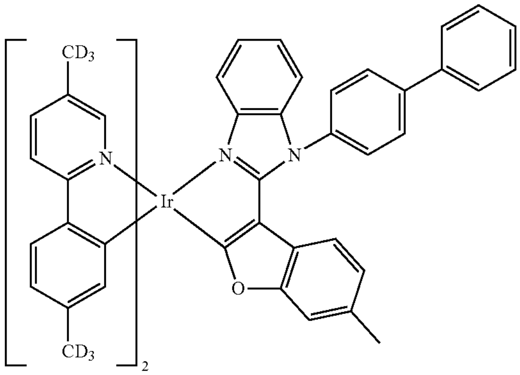
1709
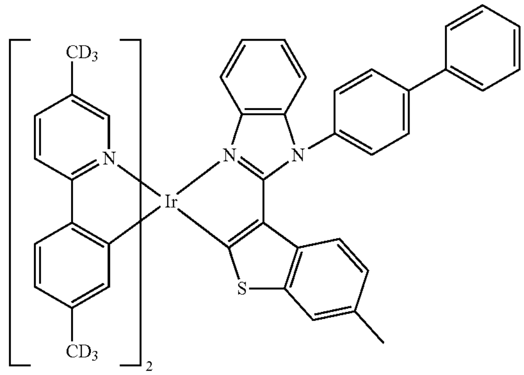
1710
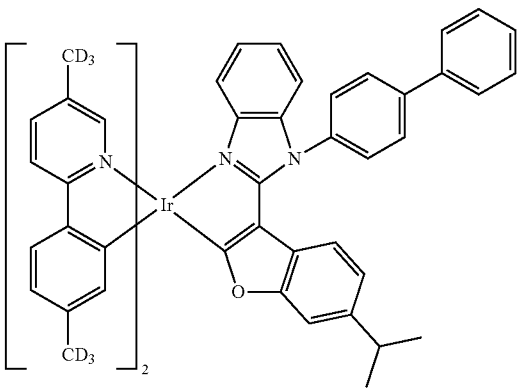
1711
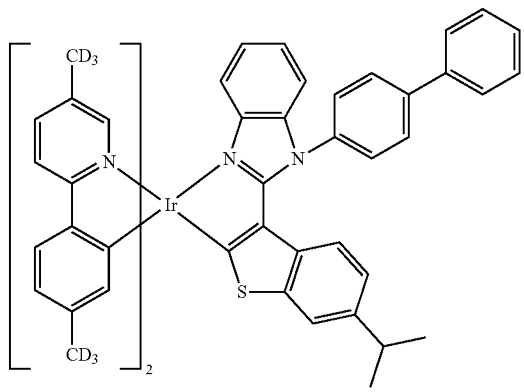
1712
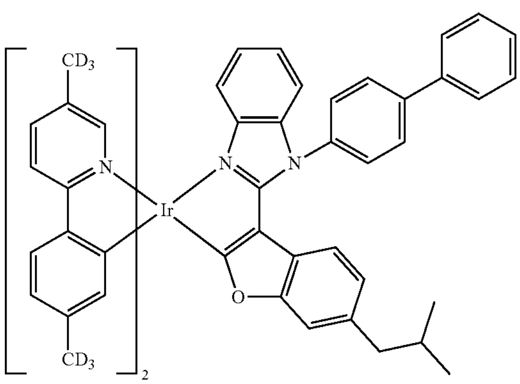
1713
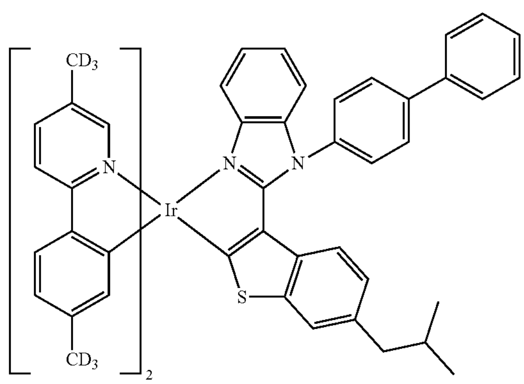
1714
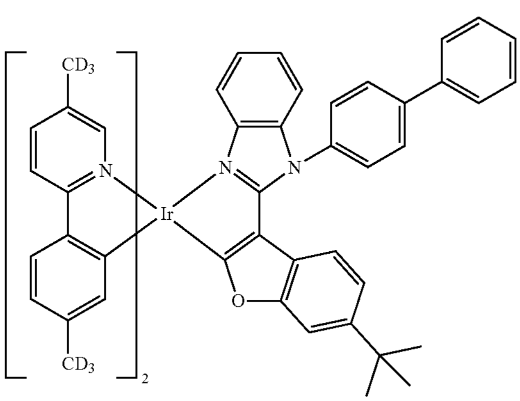
1715
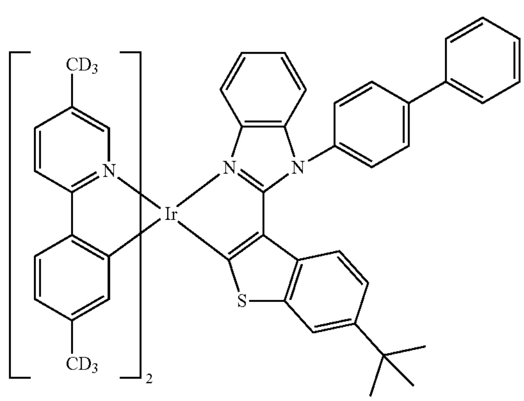

-continued
1716
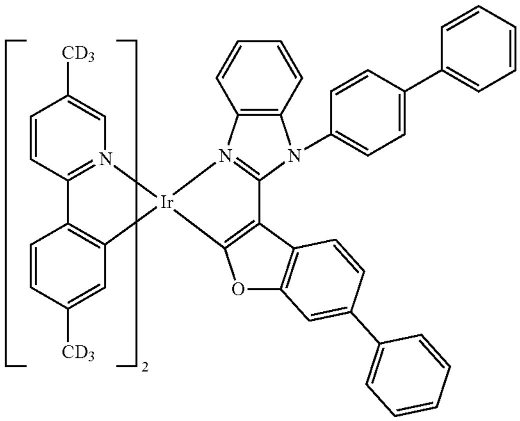
1717
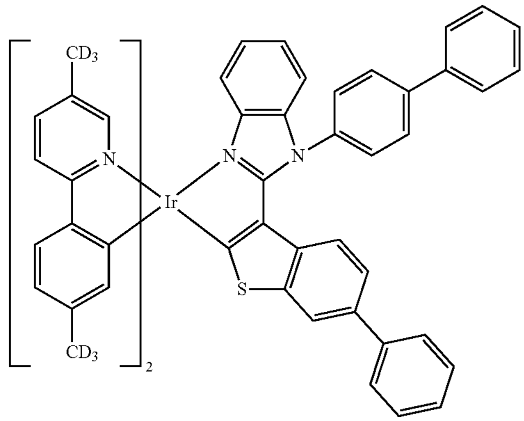
1718
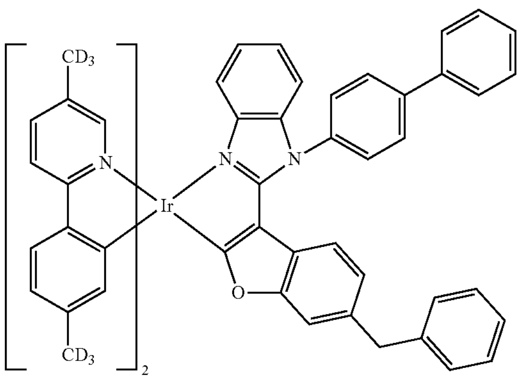
1719
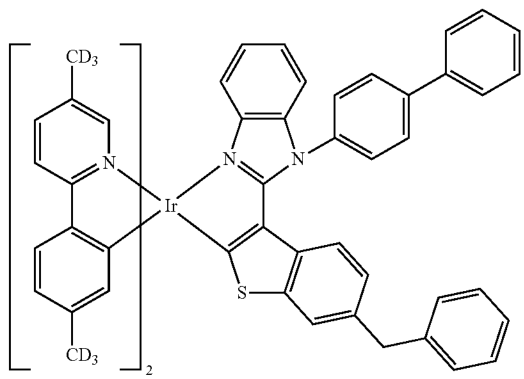
1720
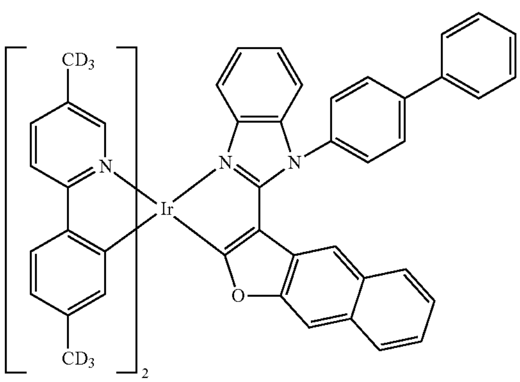
1721
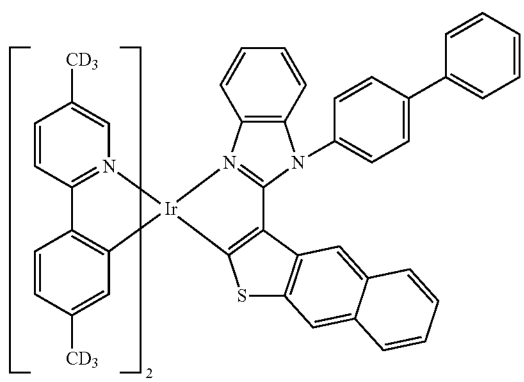
1722
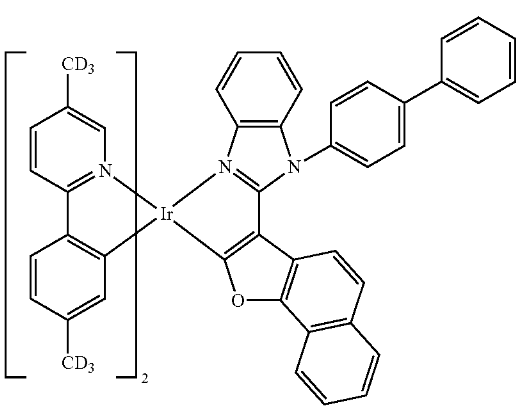
1723
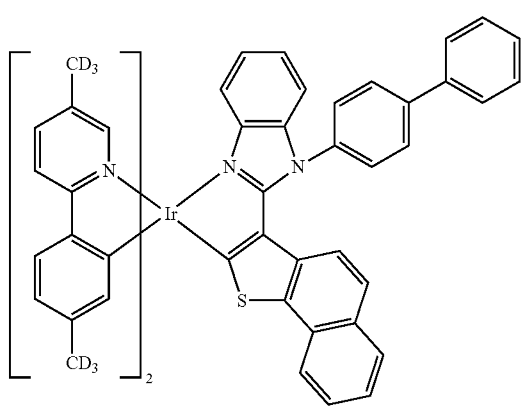

-continued
1724
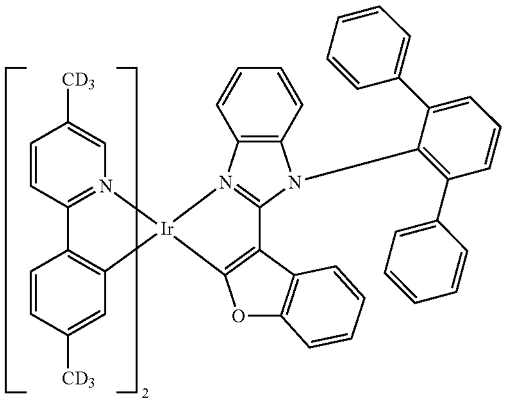
1725
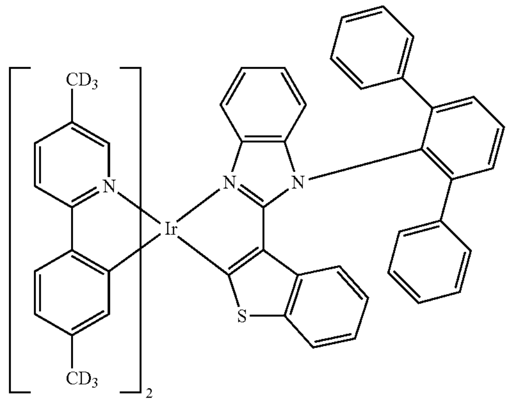
1726
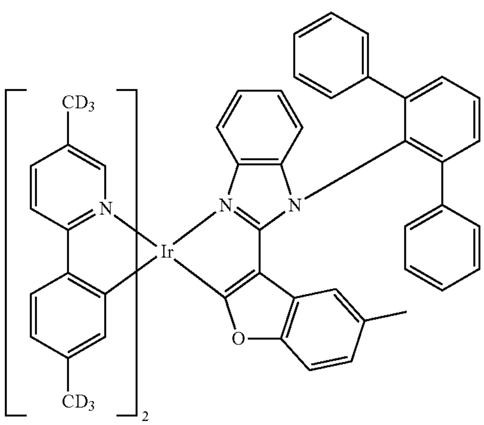
1727
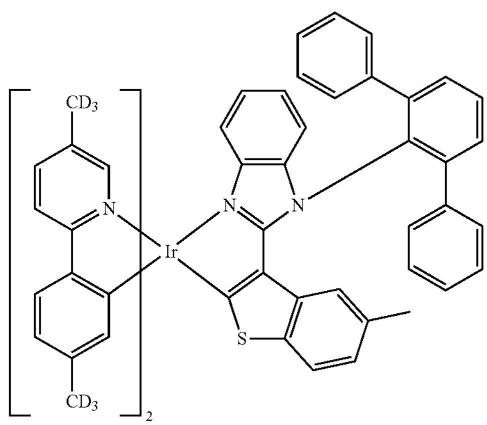
1728
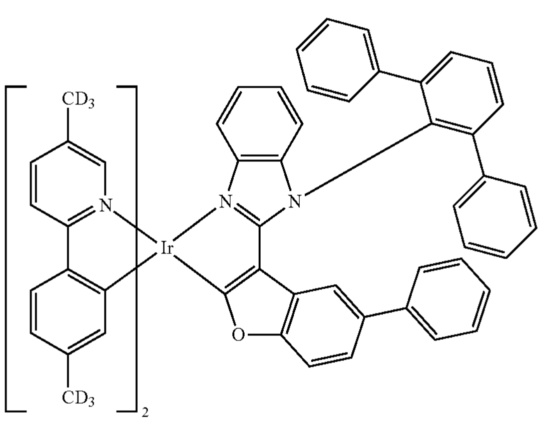
1729
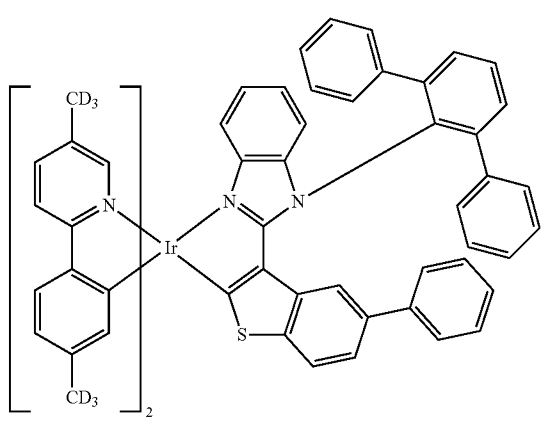

-continued
1730
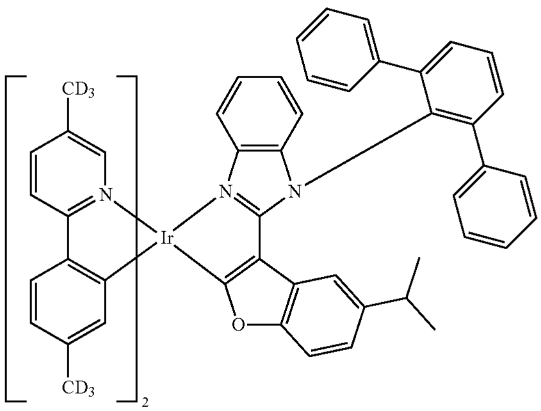
1731
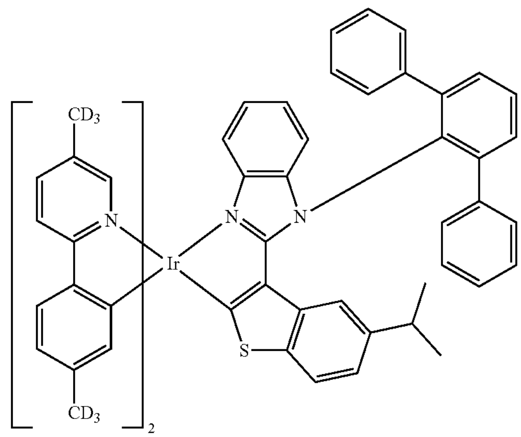
1732
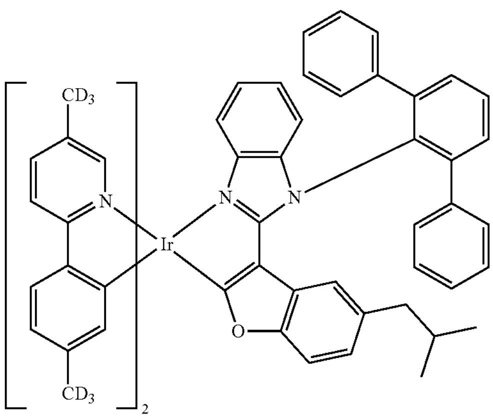
1733
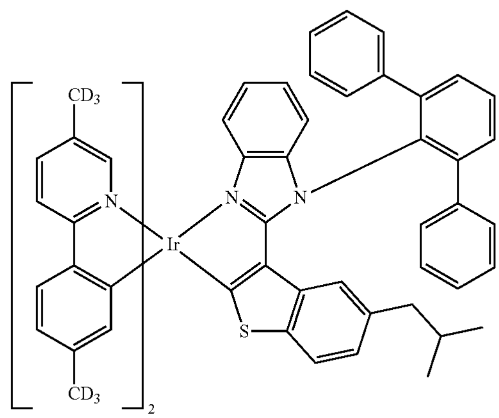
1734
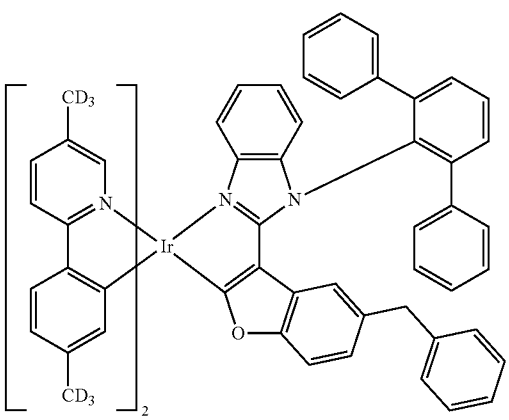
1735
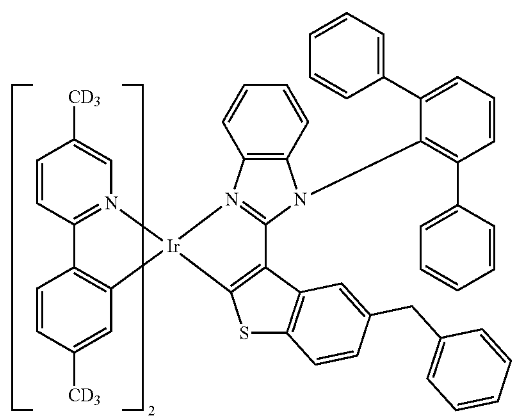

-continued
1736
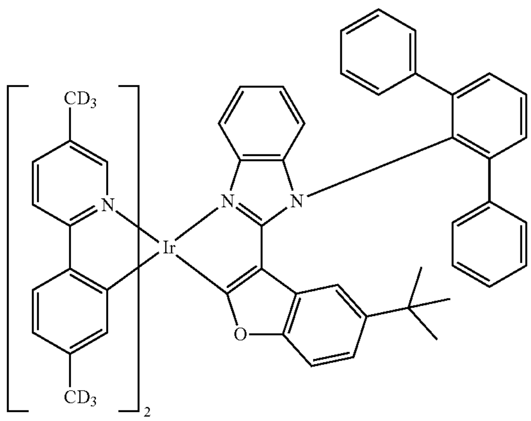
1737
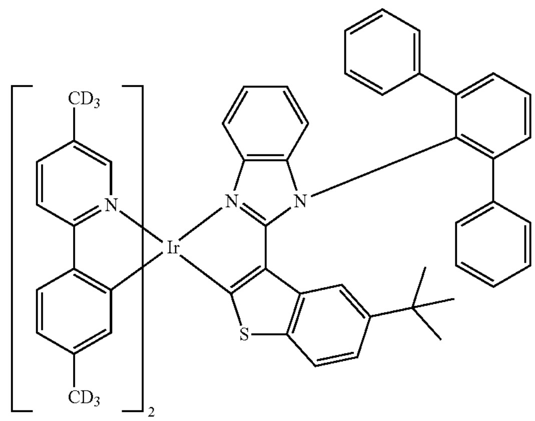
1738
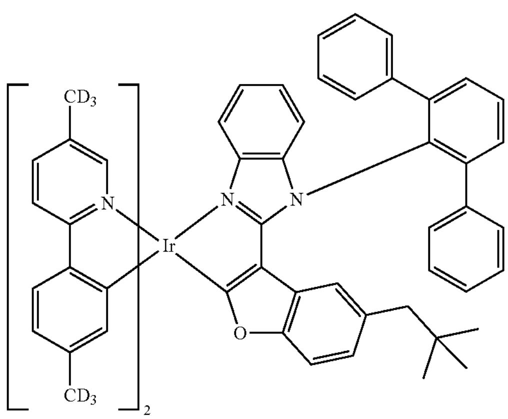
1739
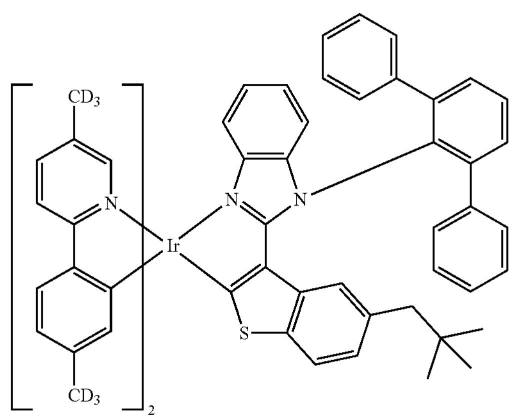
1740
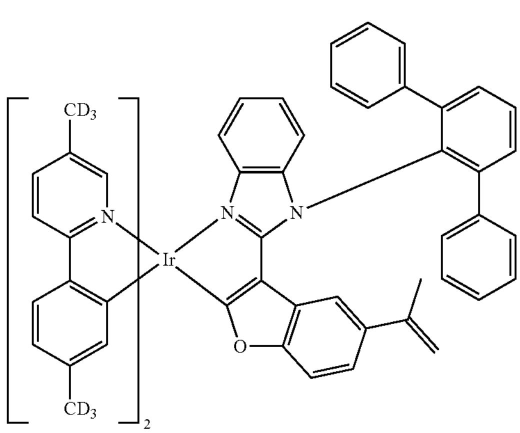
1741
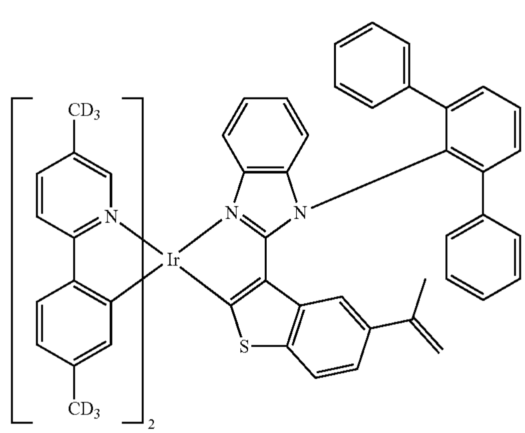

-continued
1742
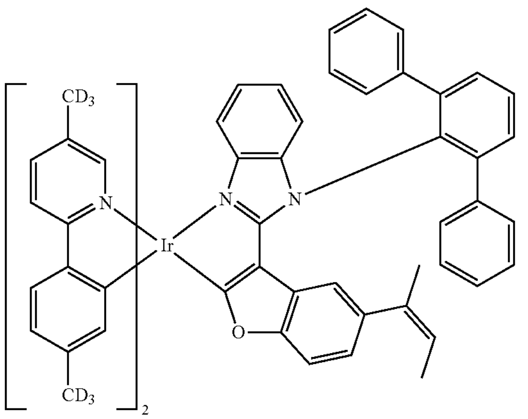
1743
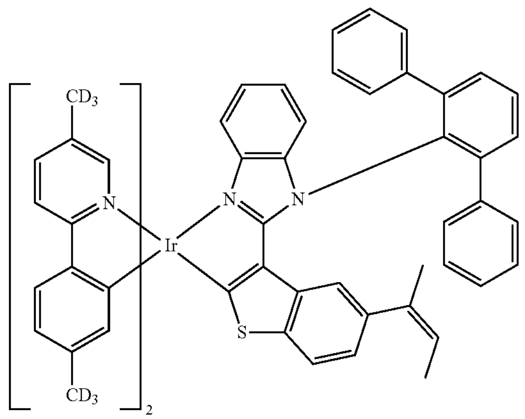
1744
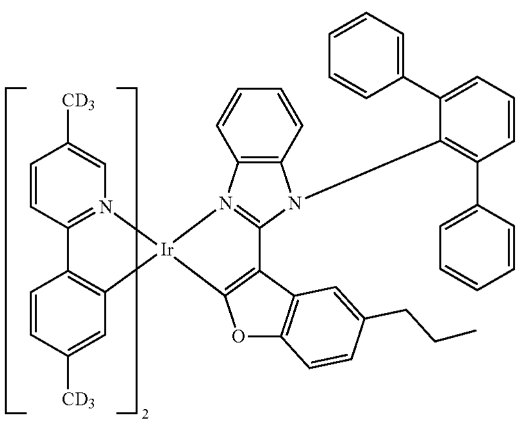
1745
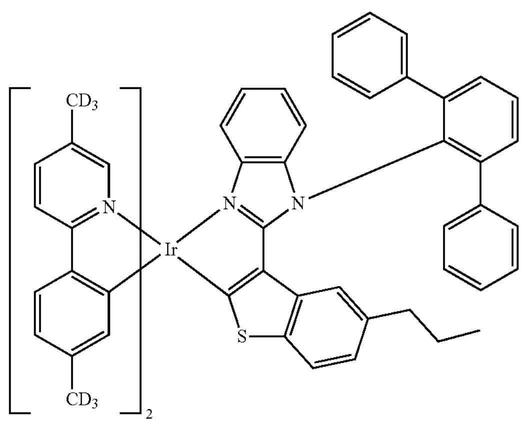
1746
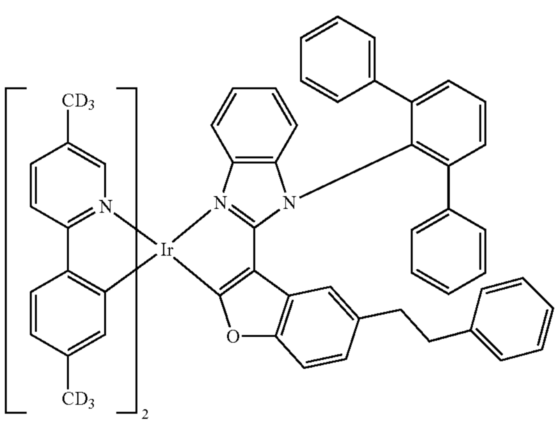
1747
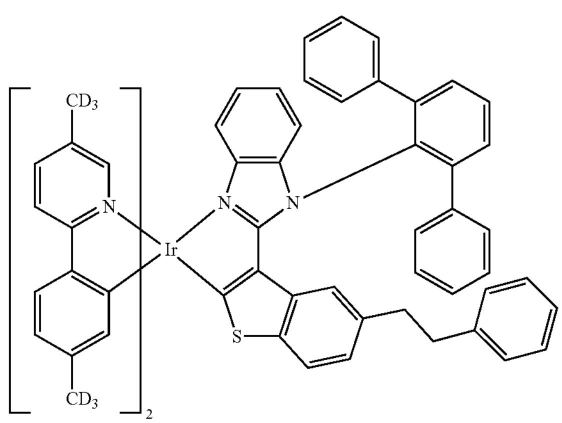

-continued
1748
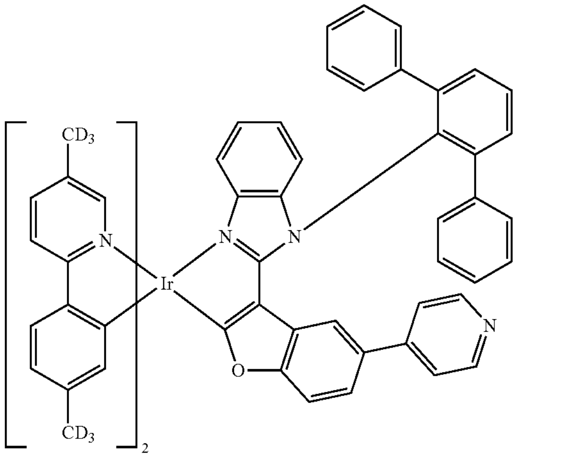
1749
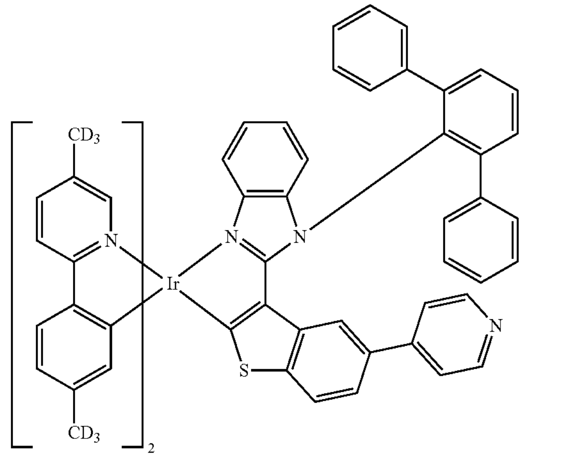
1750
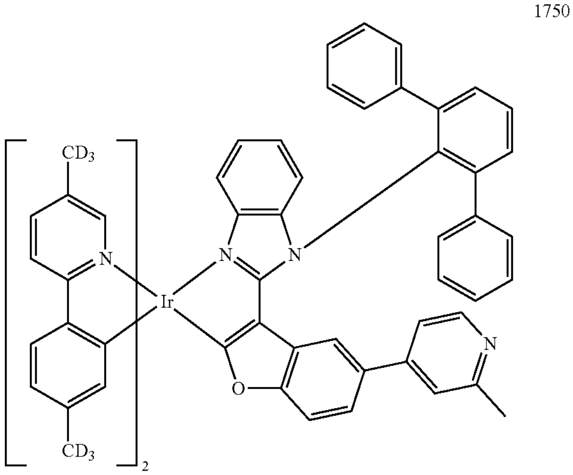
1751
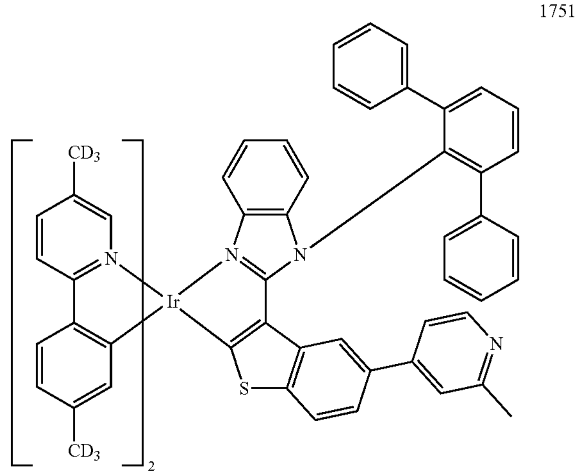
1752
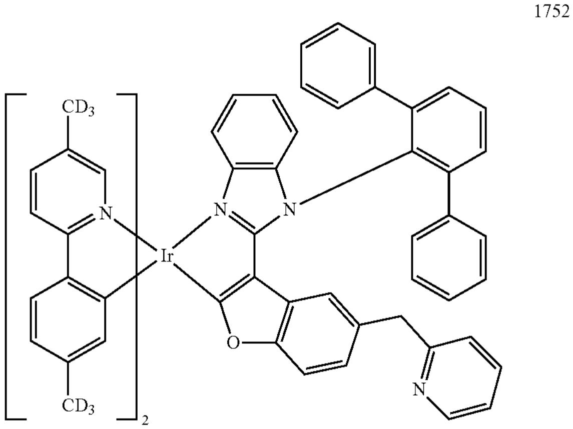
1753
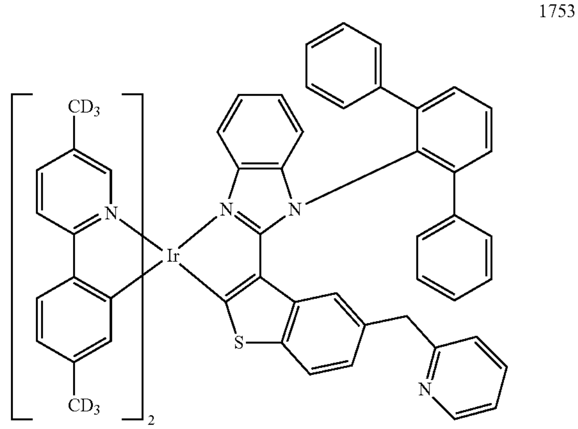

-continued
1754
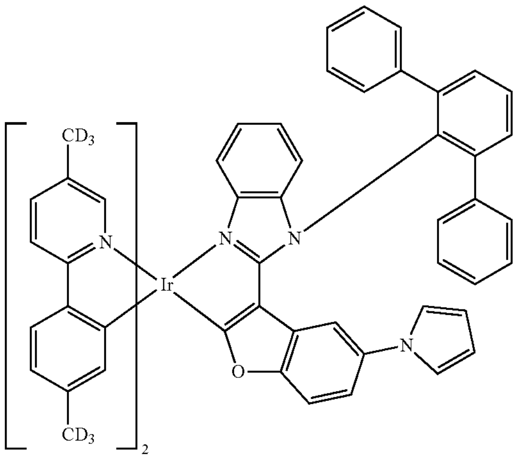
1755
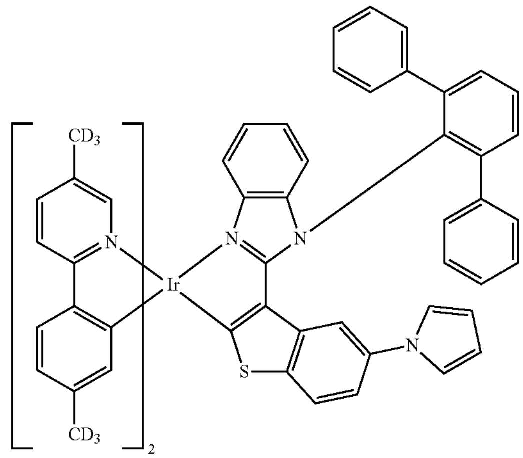
1756
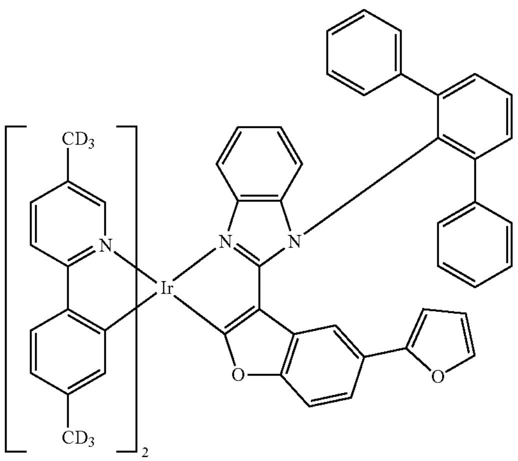
1757
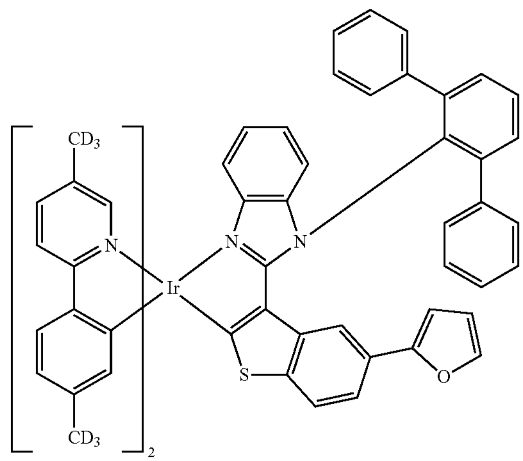
1758
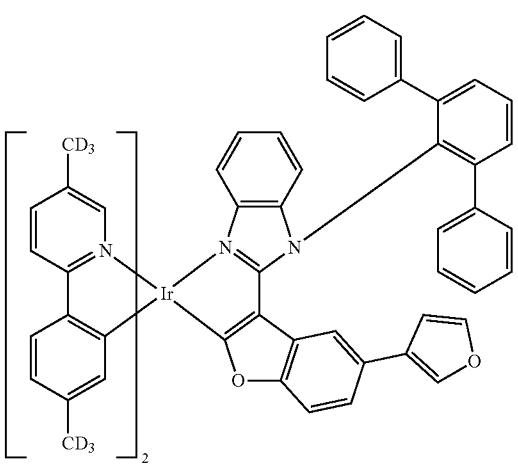
1759
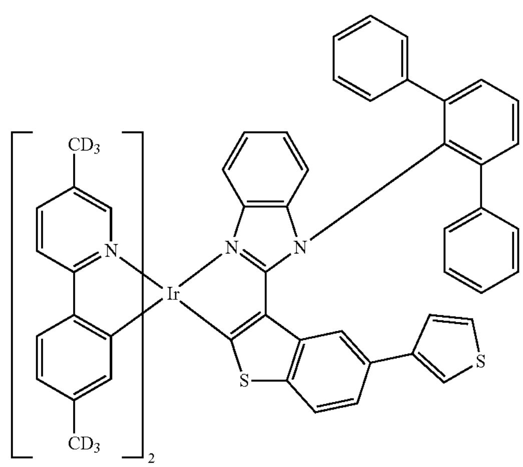

-continued
1760
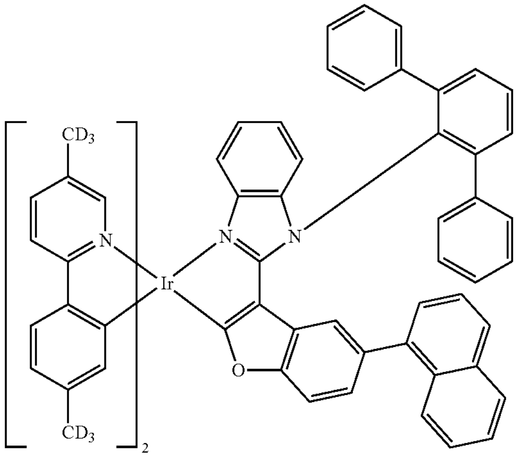
1761
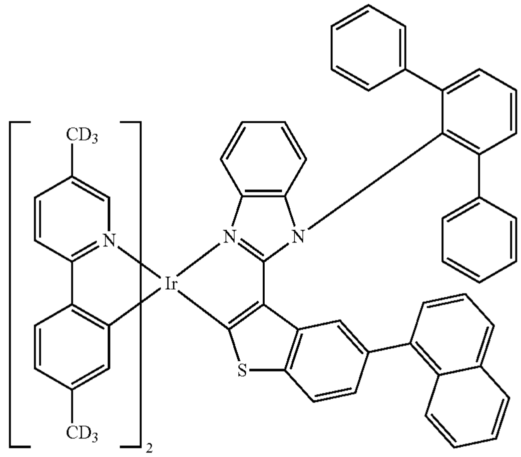
1762
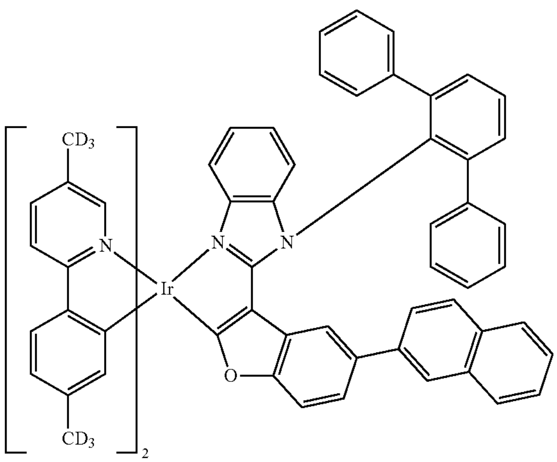
1763
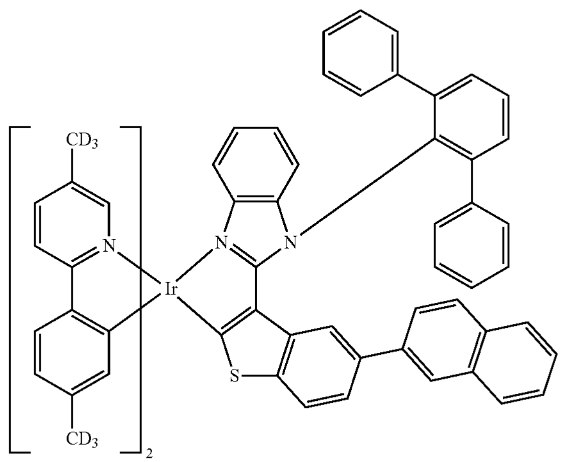
1764
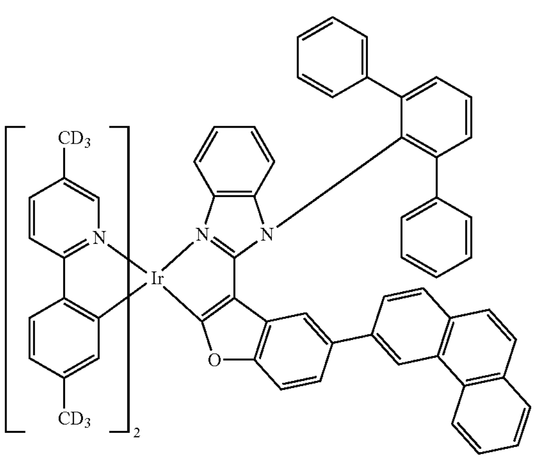
1765
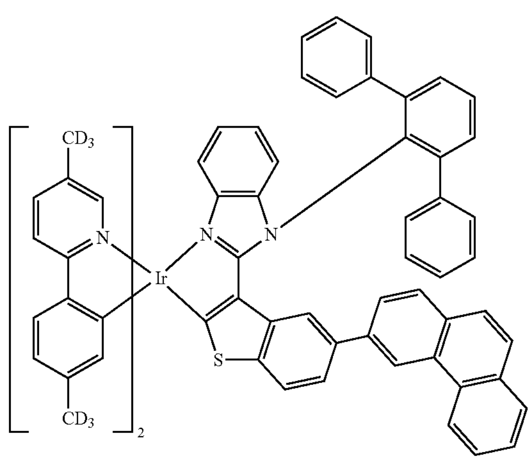

-continued
1766
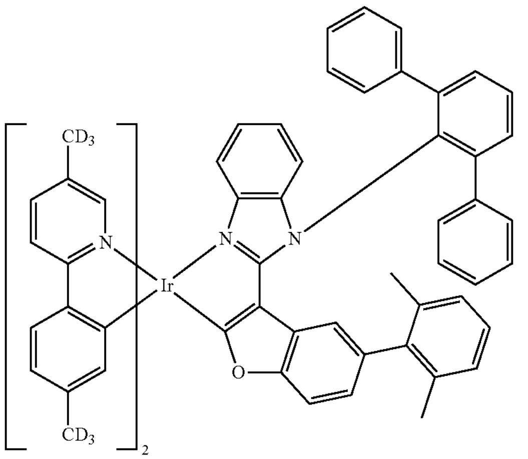
1767
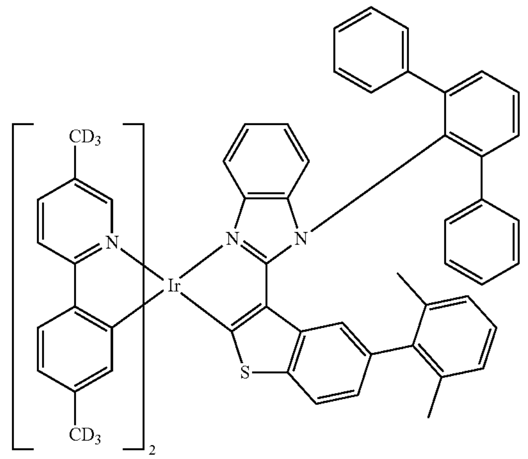
1768
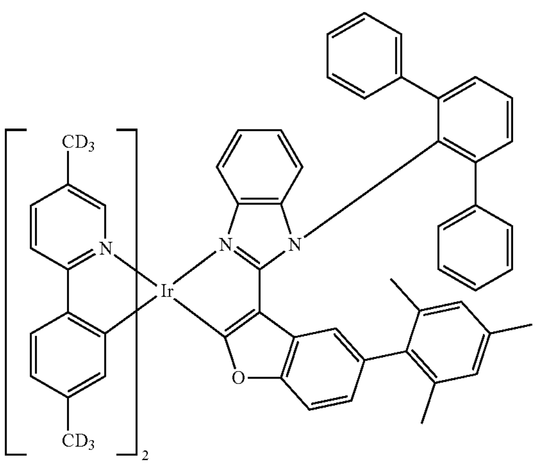
1769
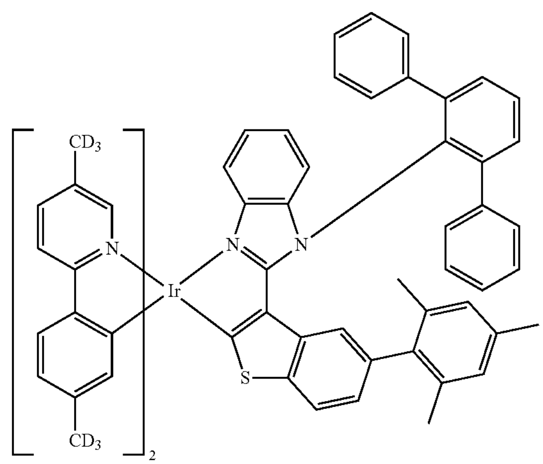
1770
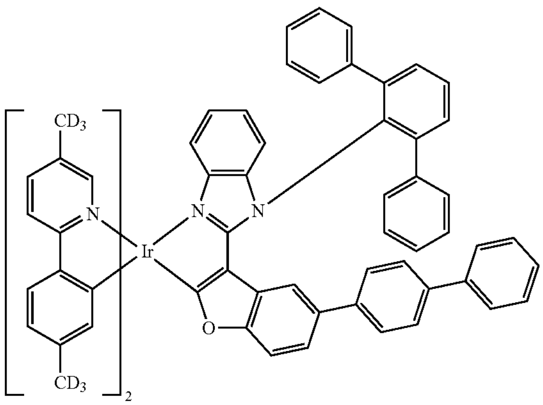
1771
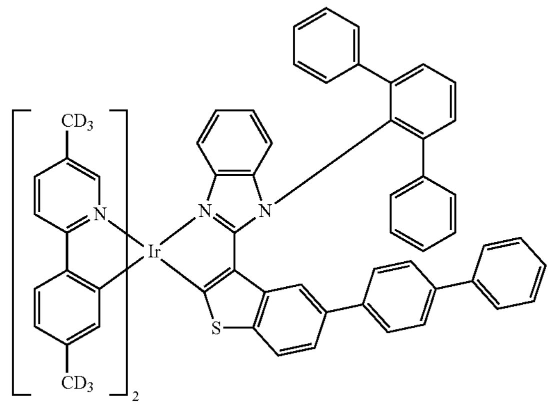

-continued
1772
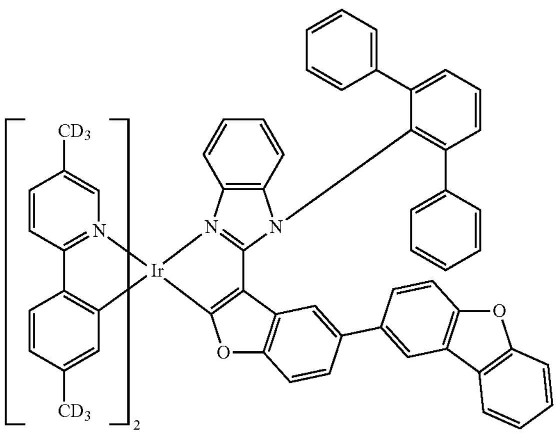
1773
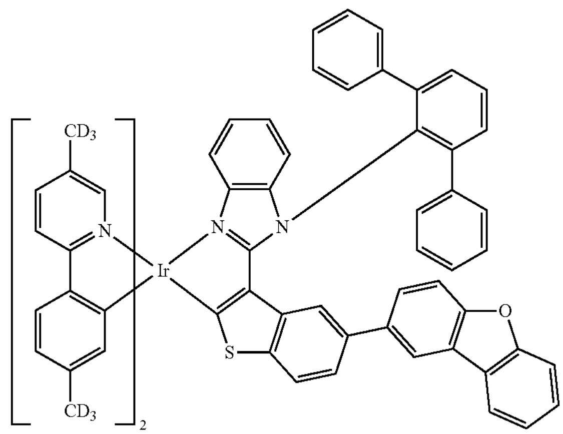
1774
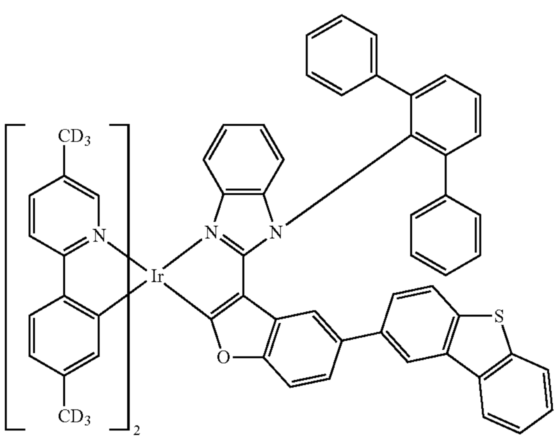
1775
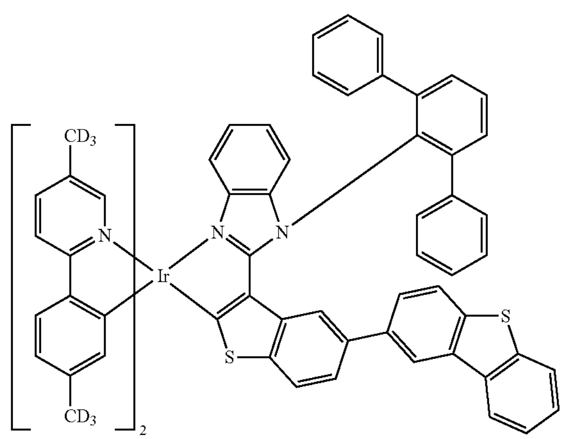
1776
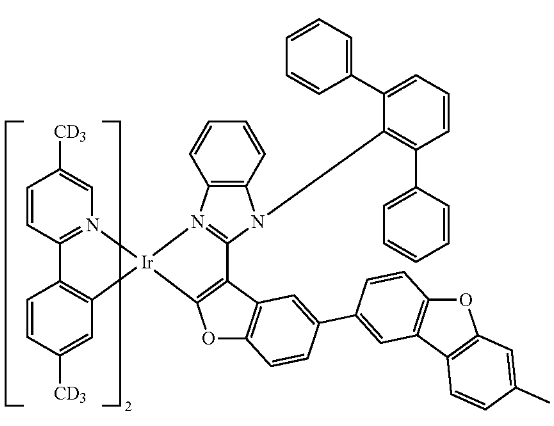
1777
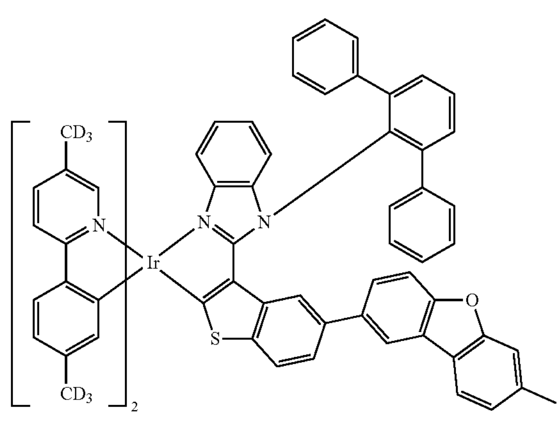

-continued
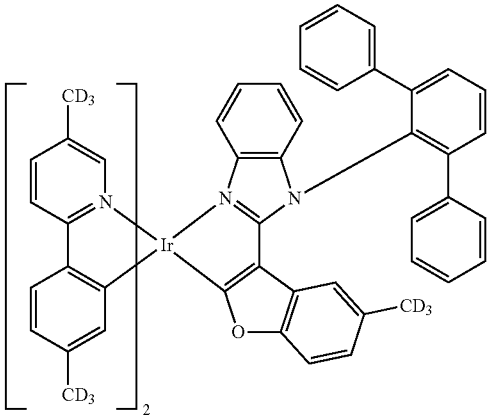
1778
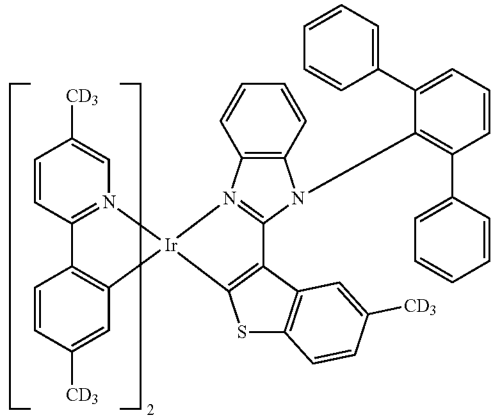
1779
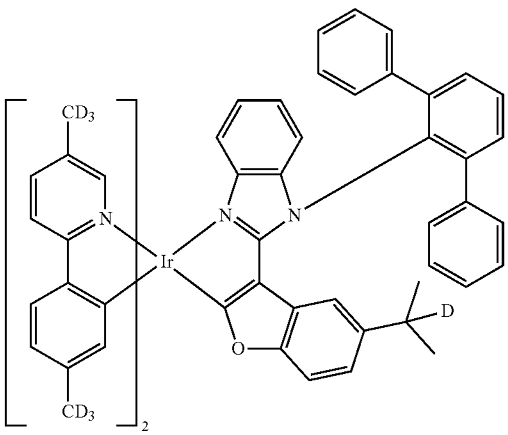
1780
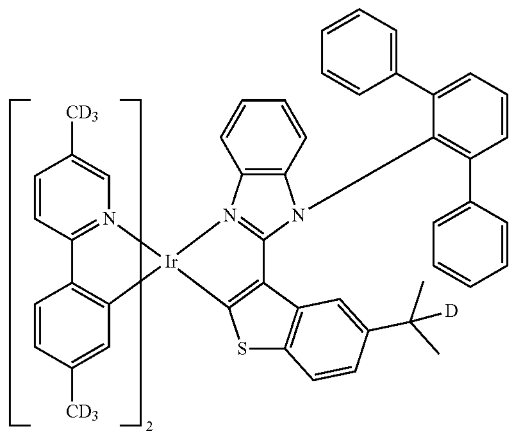
1781
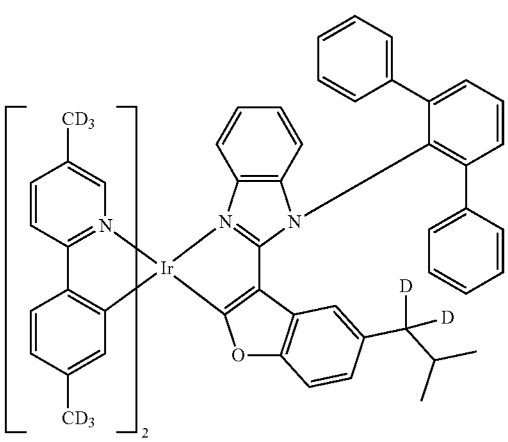
1782
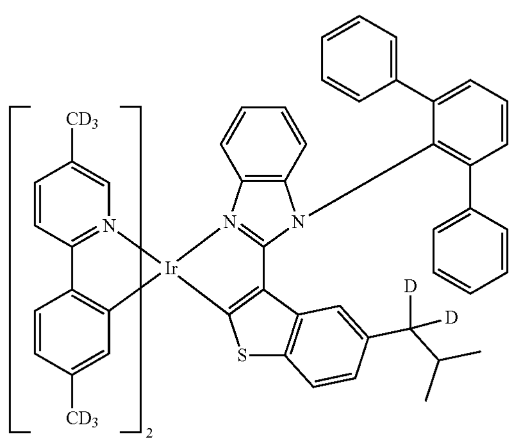
1783

-continued
1784
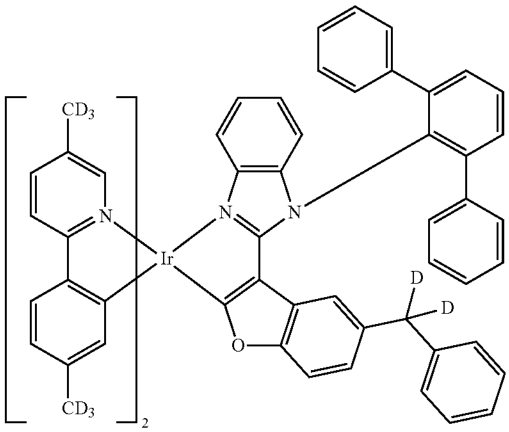
1785
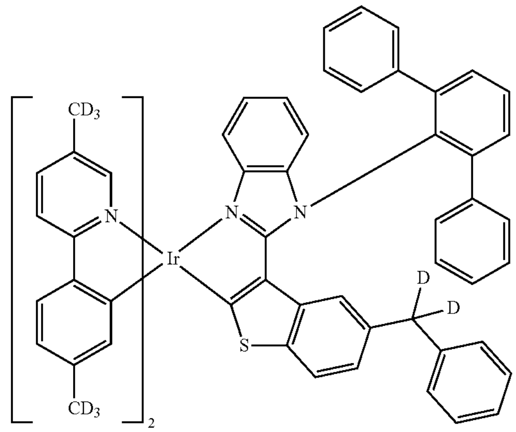
1786
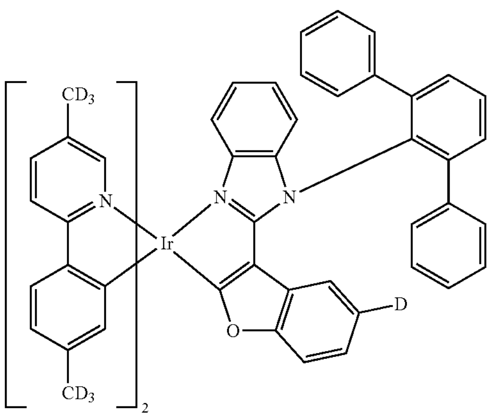
1787
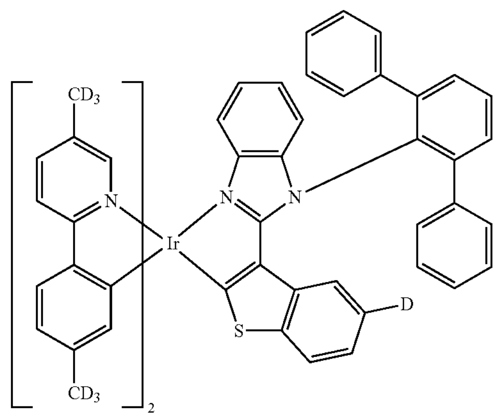
1788
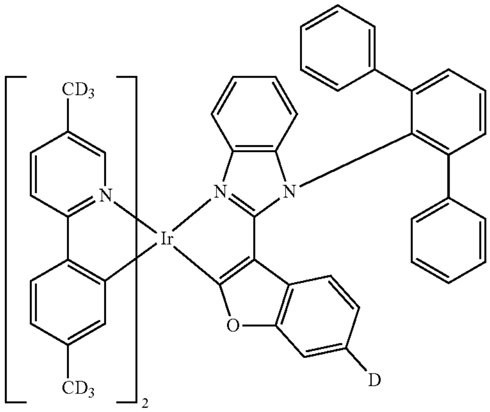
1789
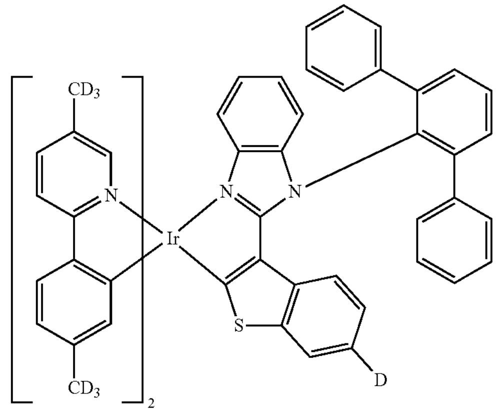

-continued
1790
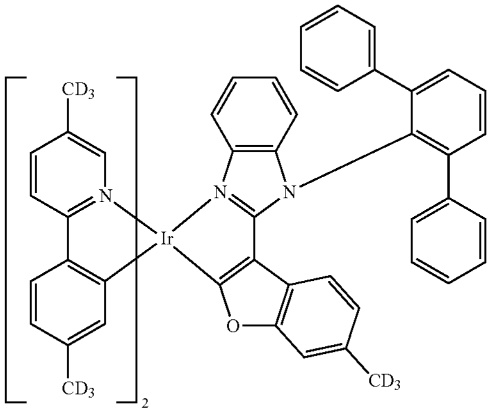
1791
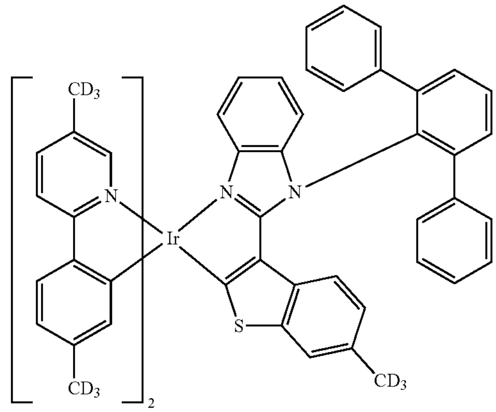
1792
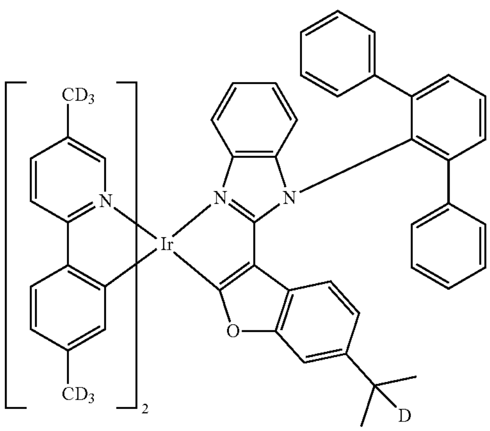
1793
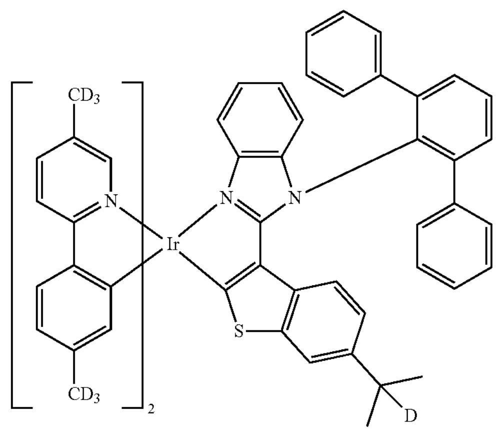
1794
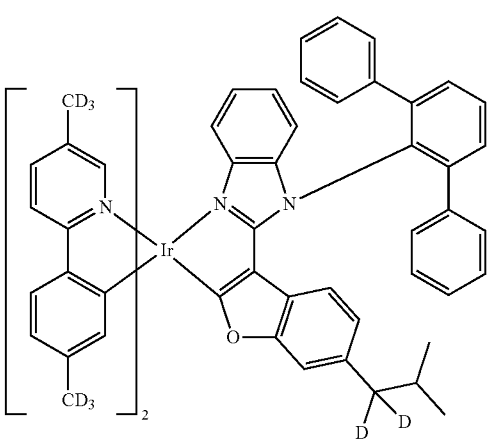
1795
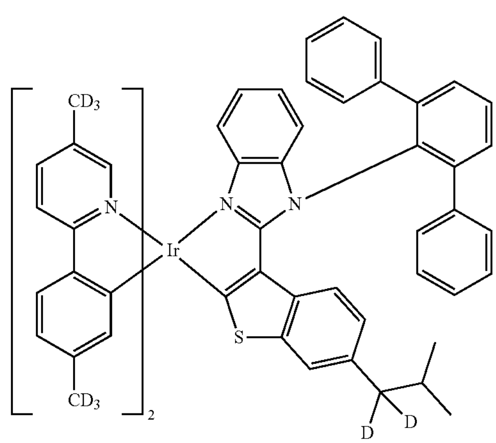

-continued
1796
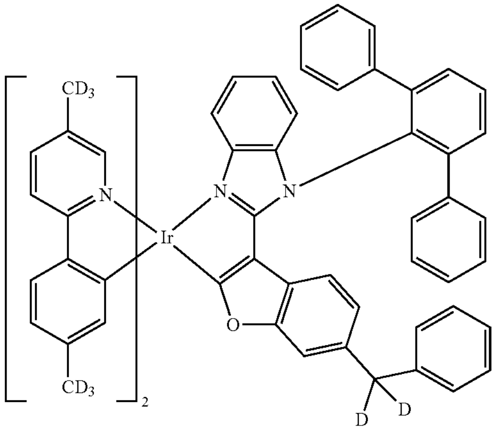
1797
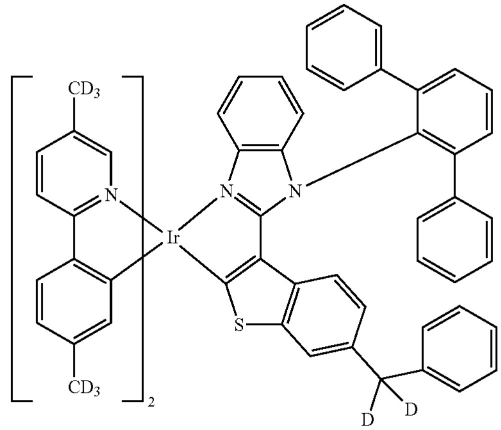
1798
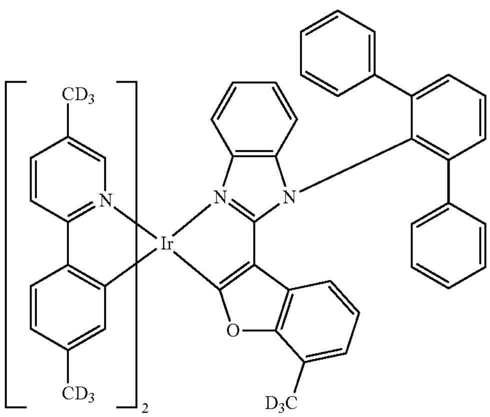
1799
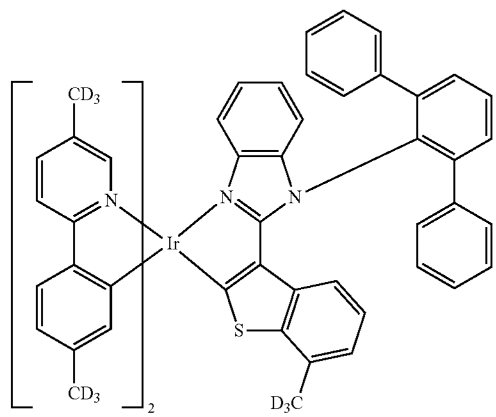
1800
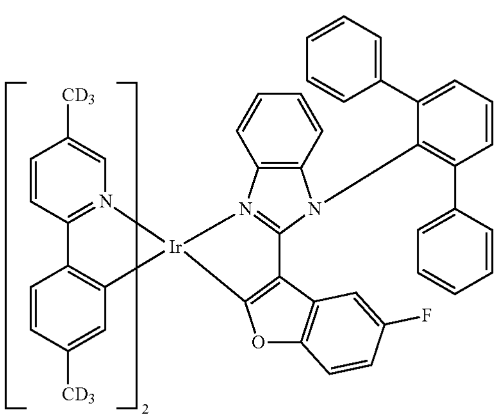
1801
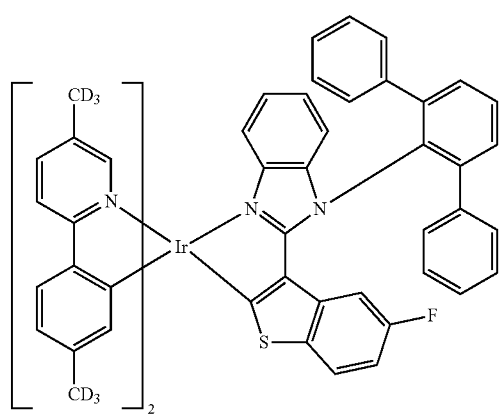

-continued
1802
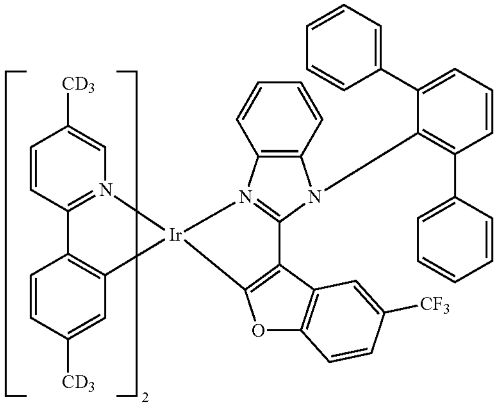
1803
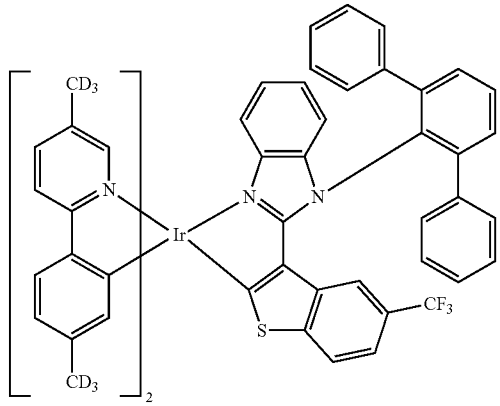
1804
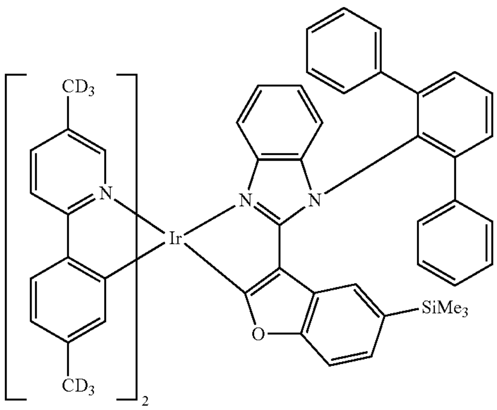
1805
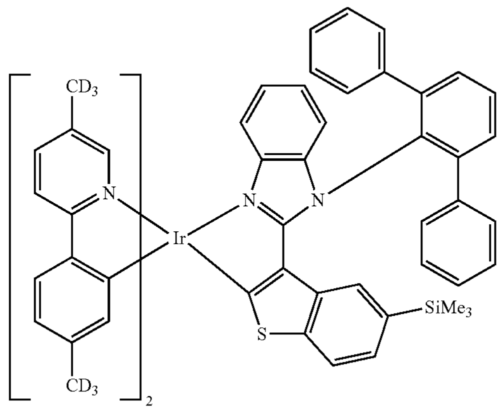
1806
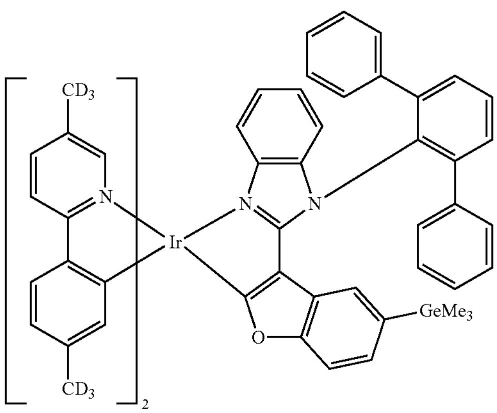
1807
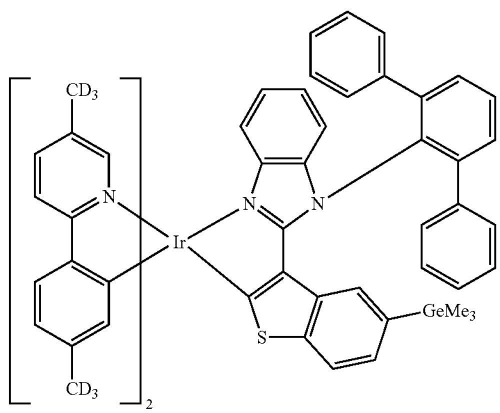
1808
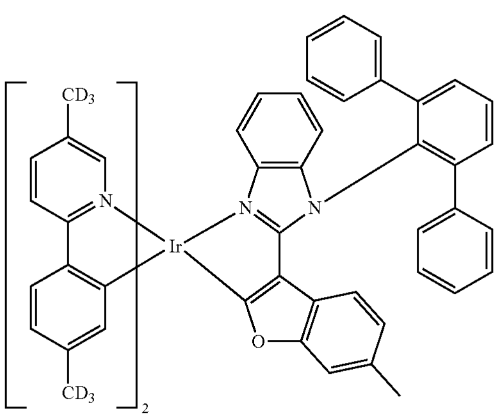
1809
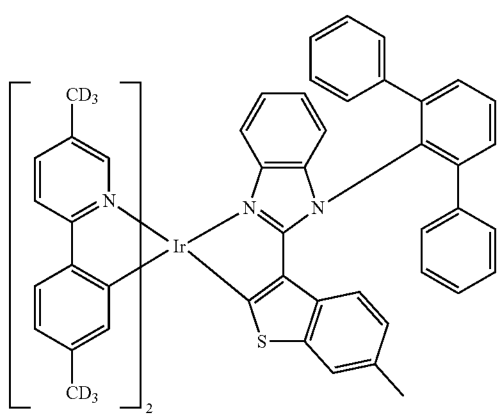

-continued
1810
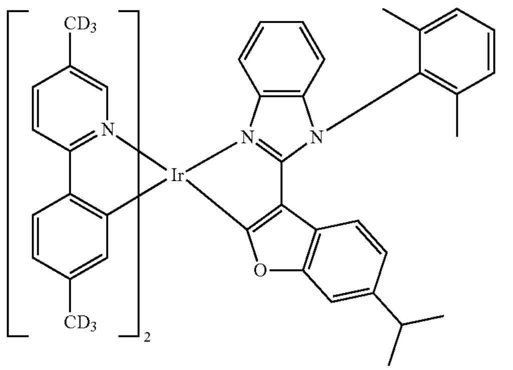
1811
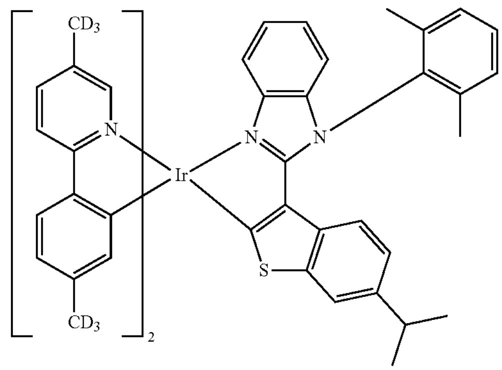
1812
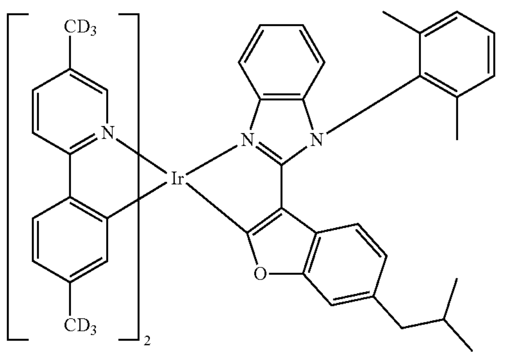
1813
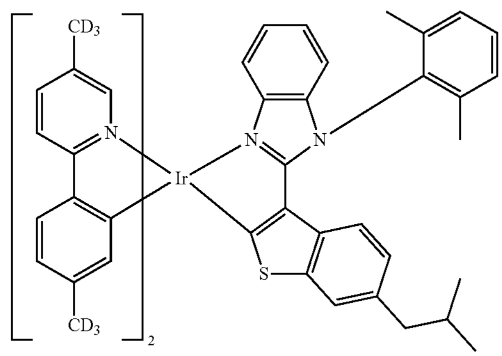
1814
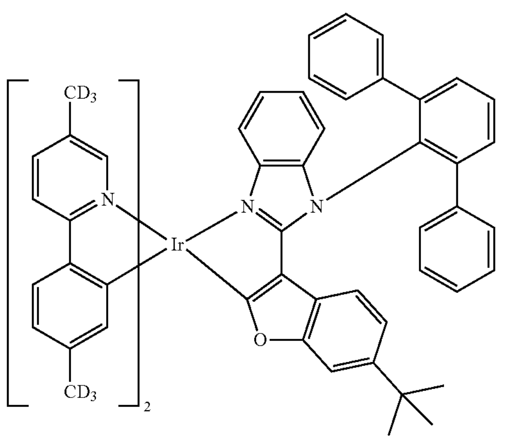
1815
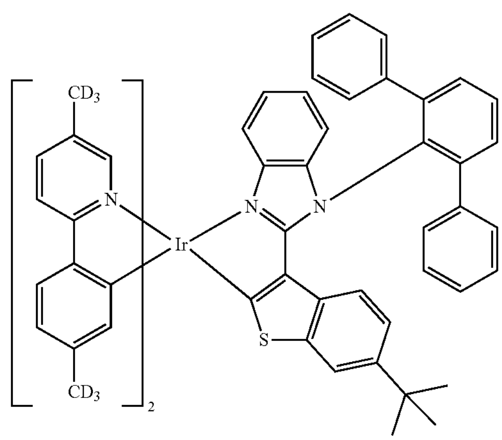
1816
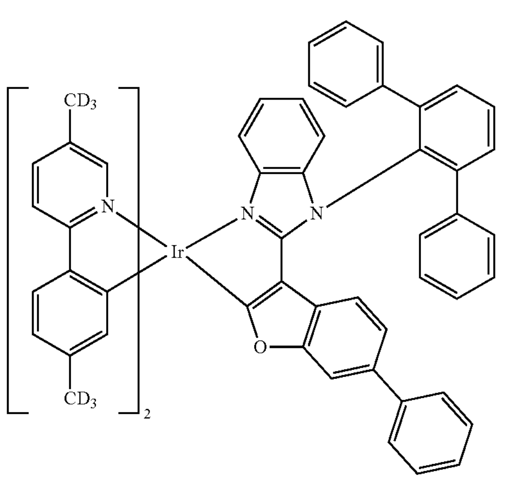
1817
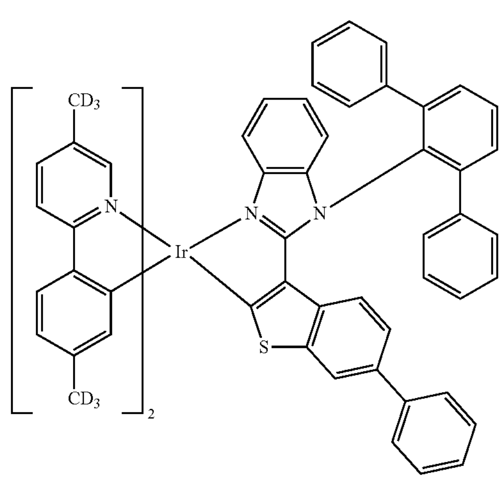

-continued
1818
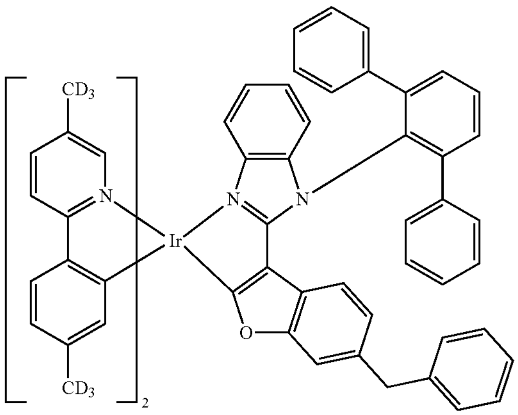
1819
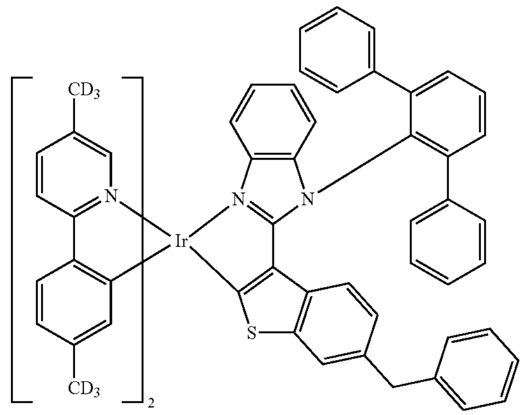
1820
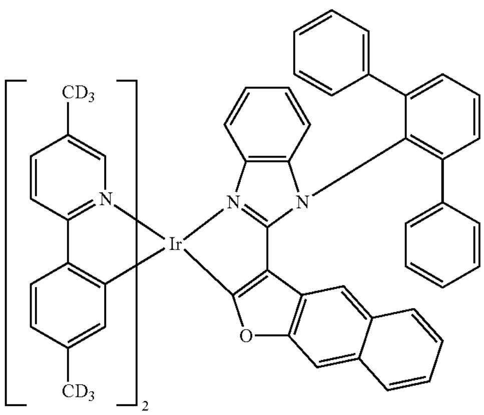
1821
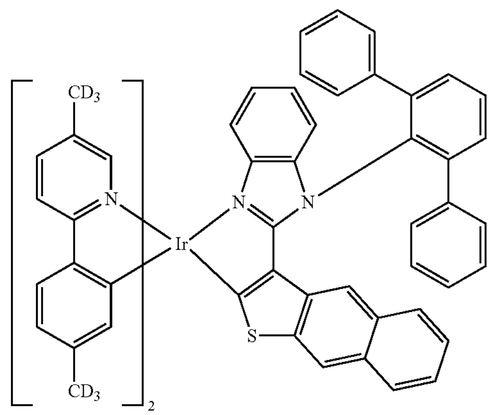
1822
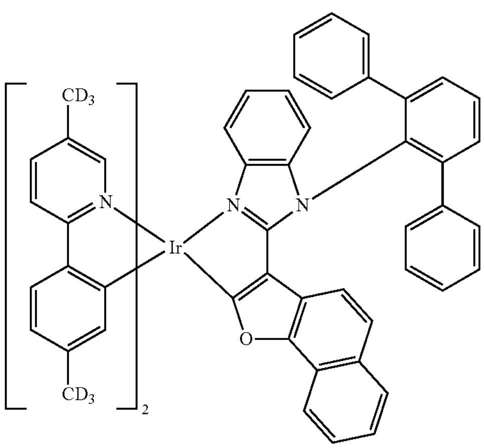
1823
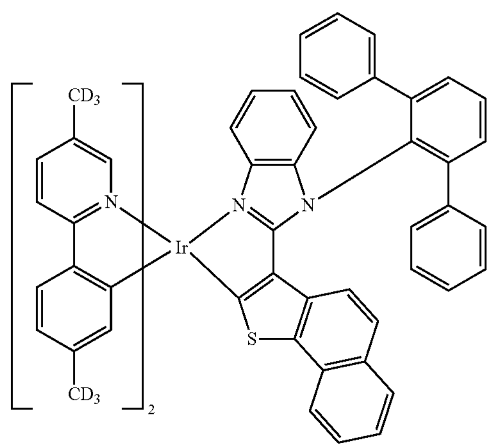
1824
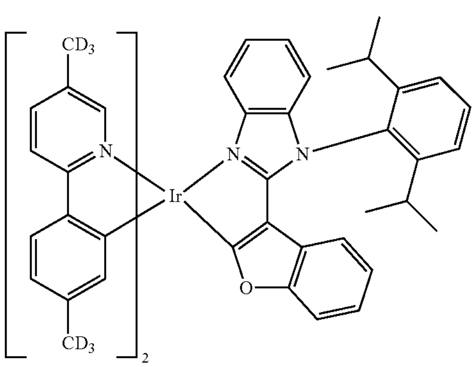
1825
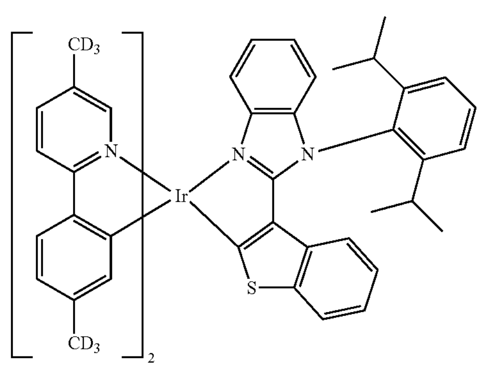

-continued
1826
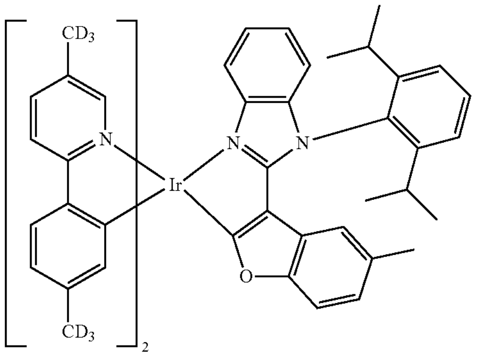
1827
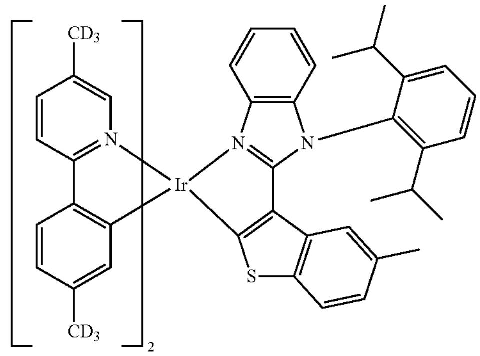
1828
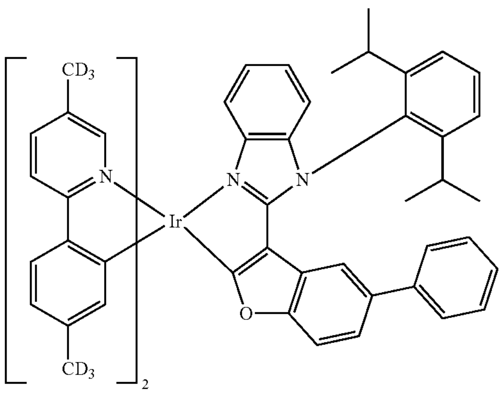
1829
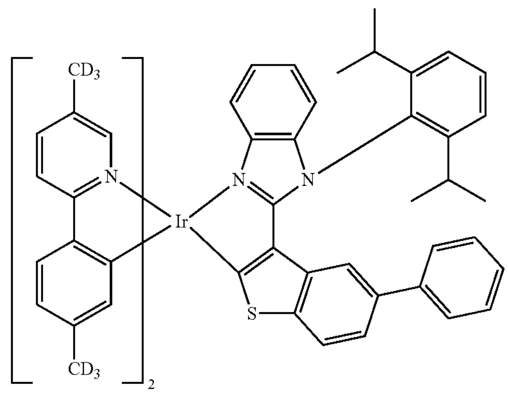
1830
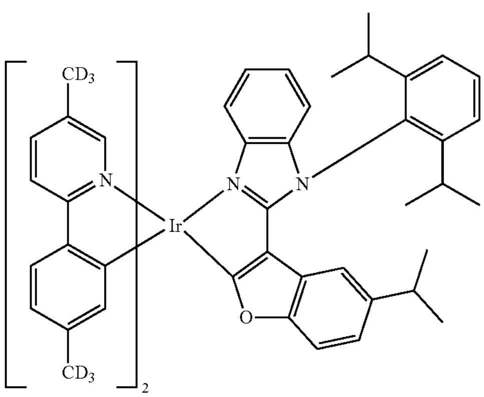
1831
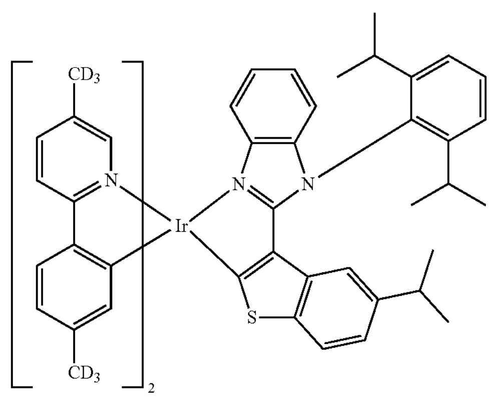
1832
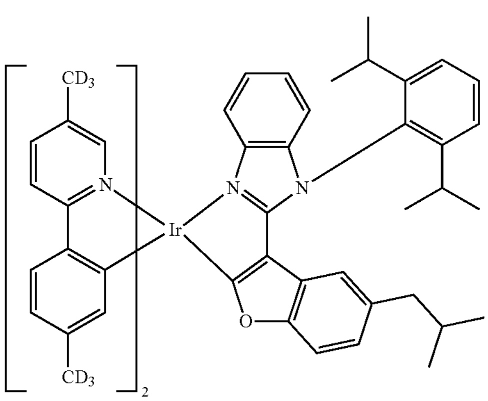
1833
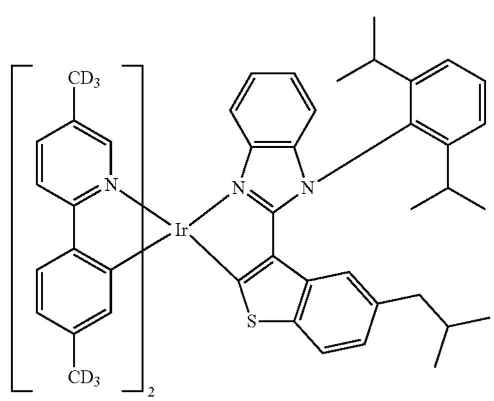

-continued
1834
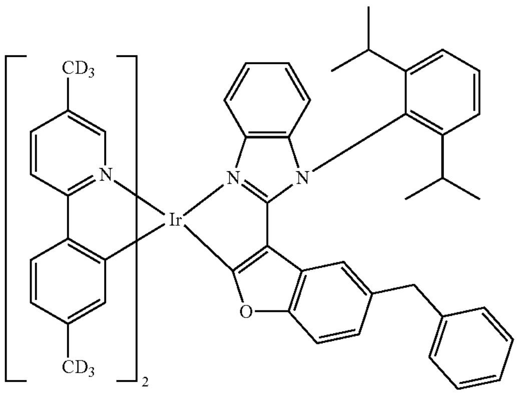
1835
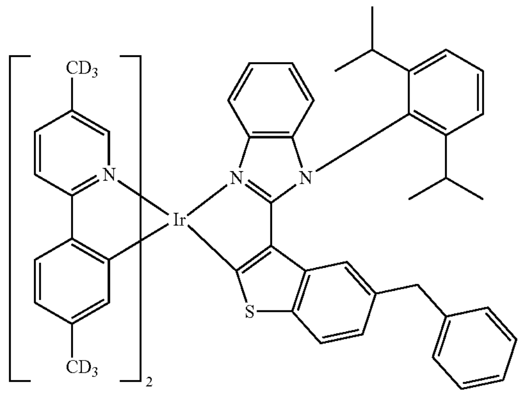
1836
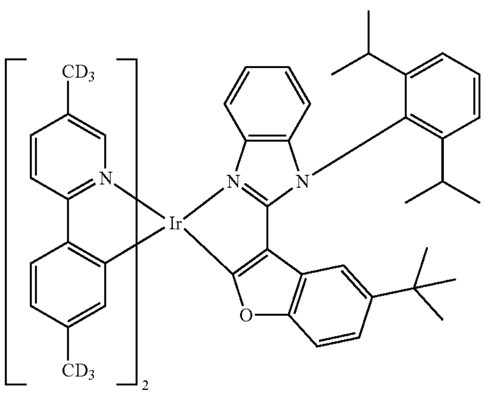
1837
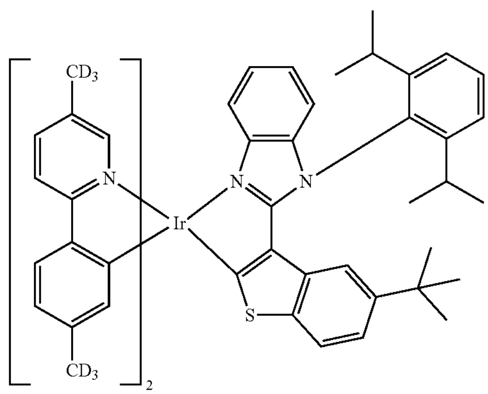
1838
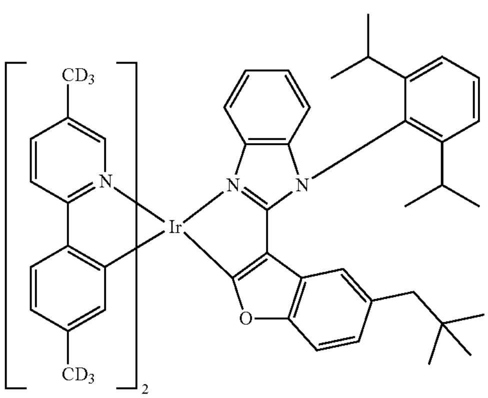
1839
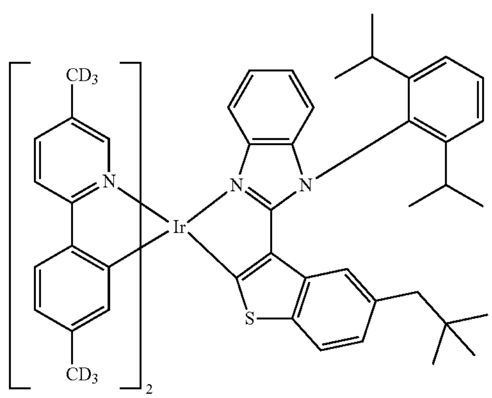
1840
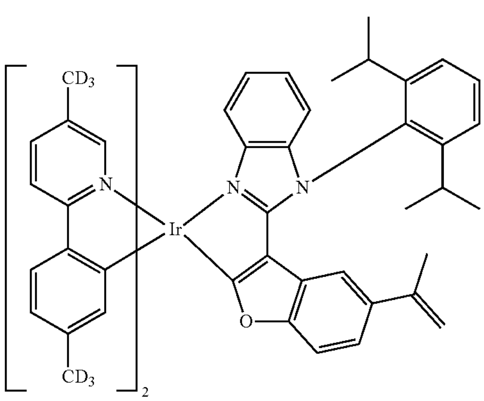
1841
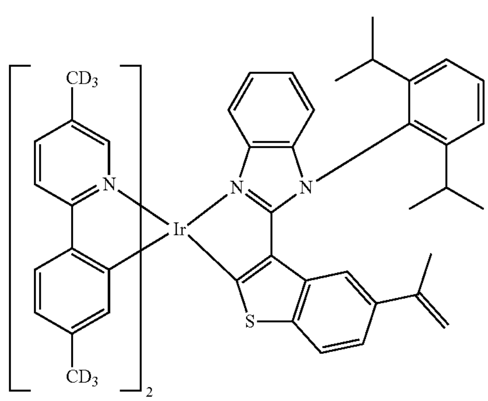

-continued
1842
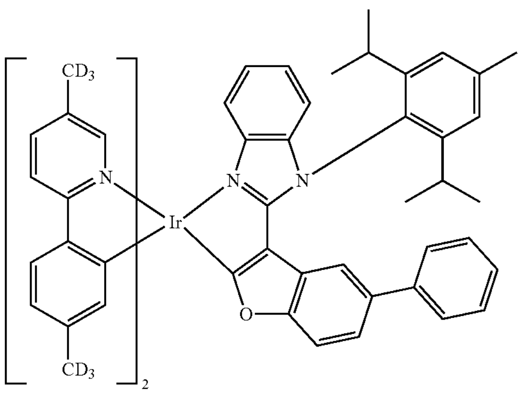
1843
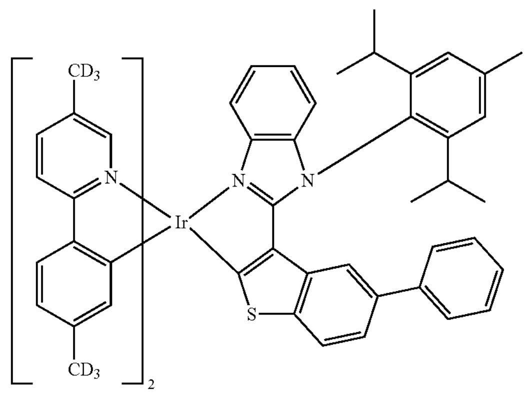
1844
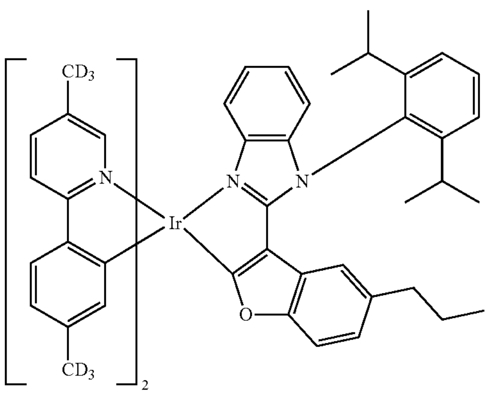
1845
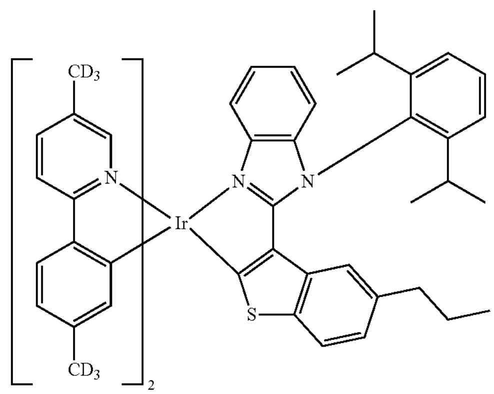
1846
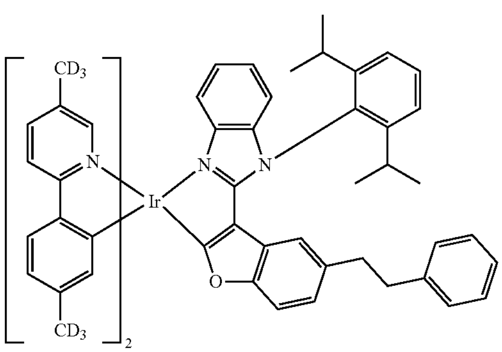
1847
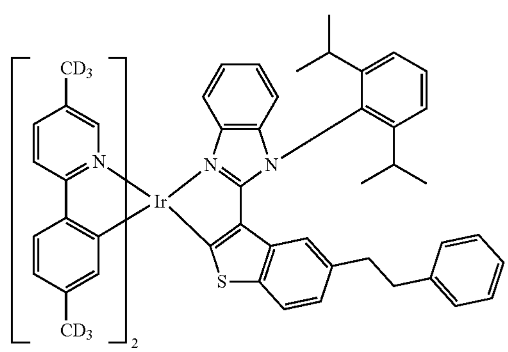
1848
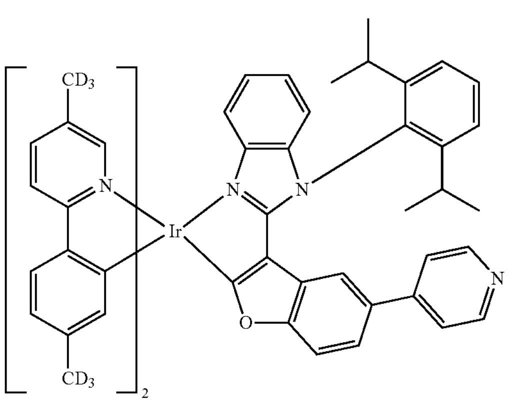
1849
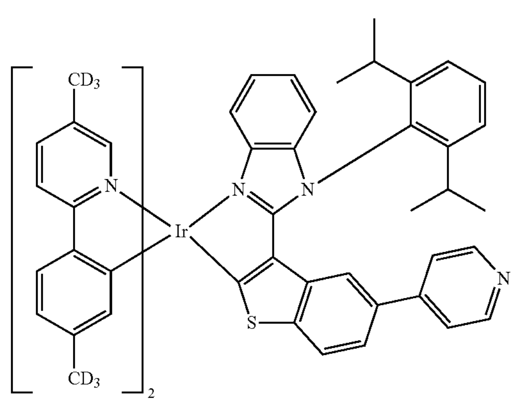

-continued
1850
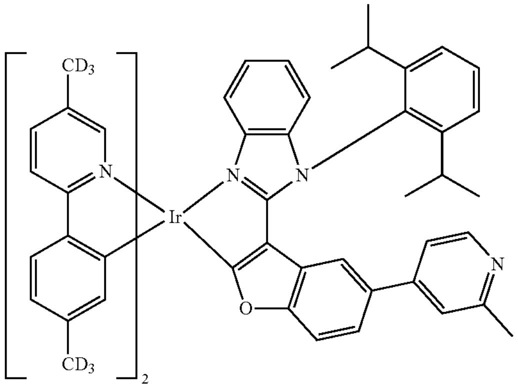
1851
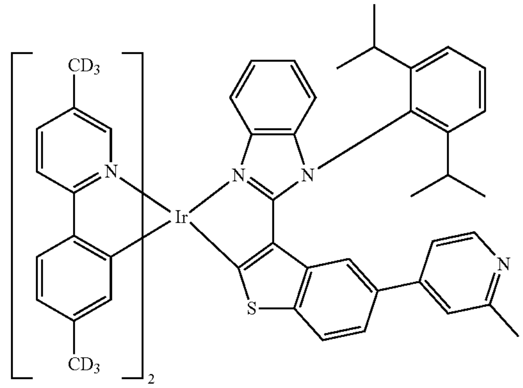
1852
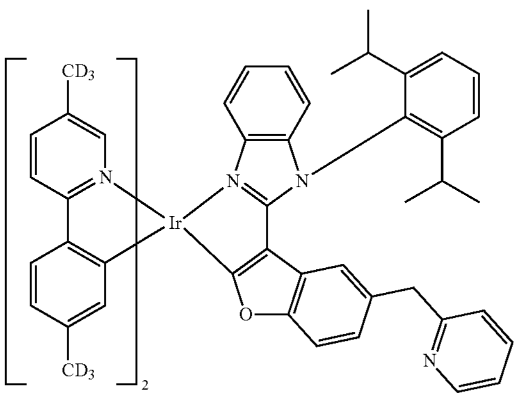
1853
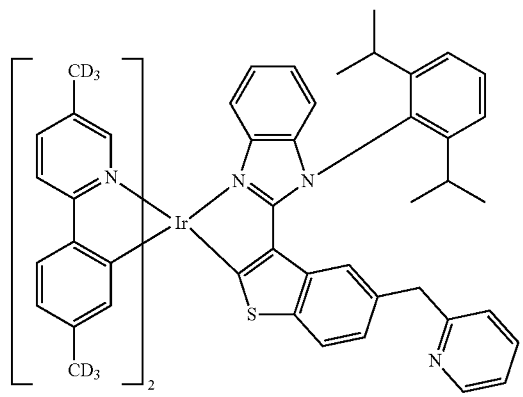
1854
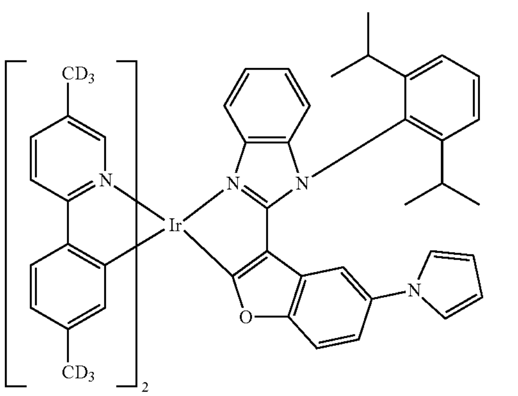
1855
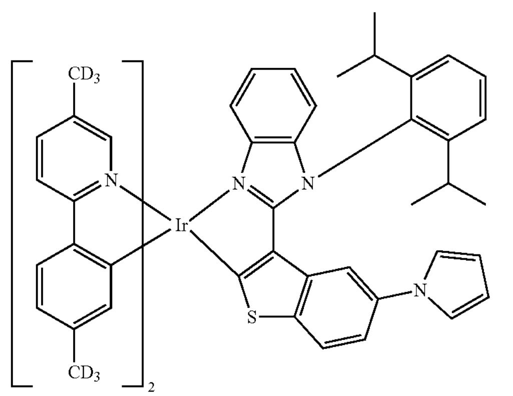
1856
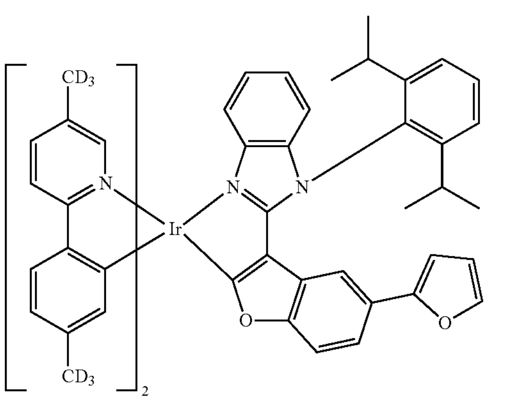
1857
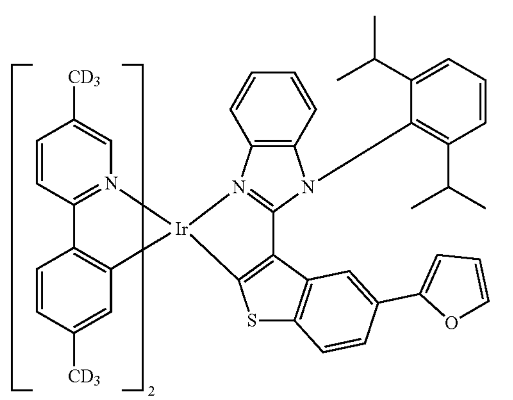

-continued
1858
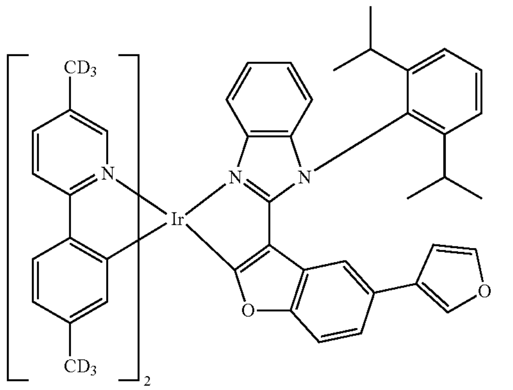
1859
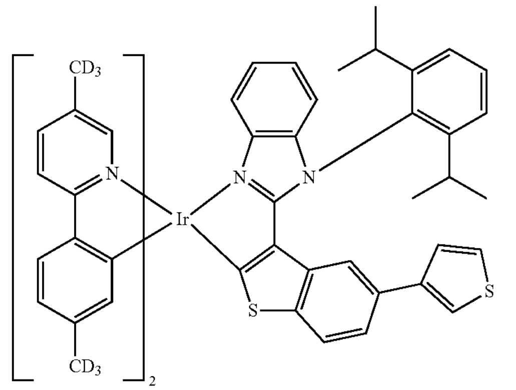
1860
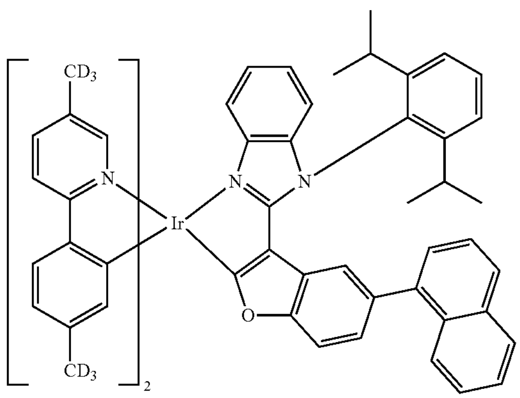
1861
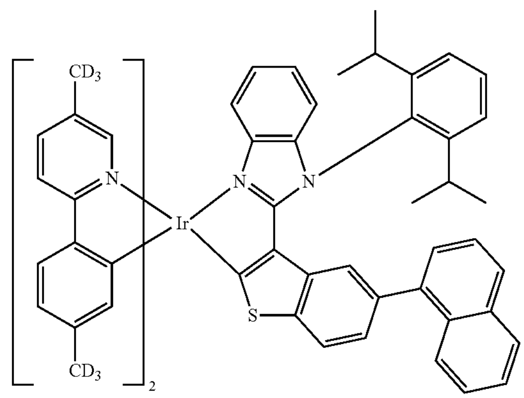
1862
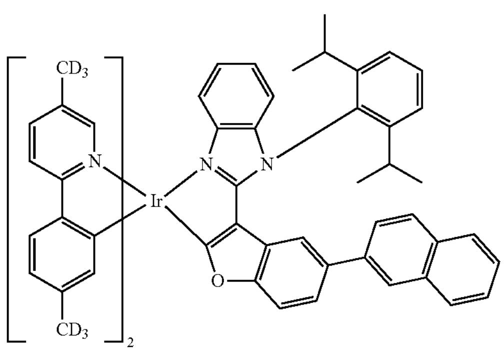
1863
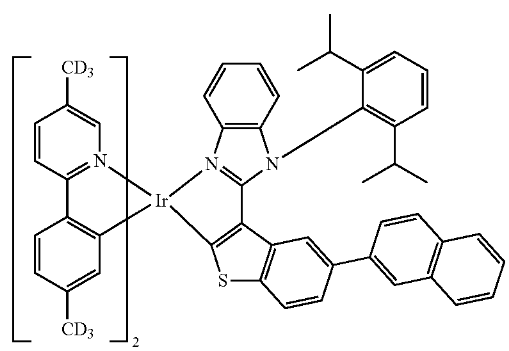
1864
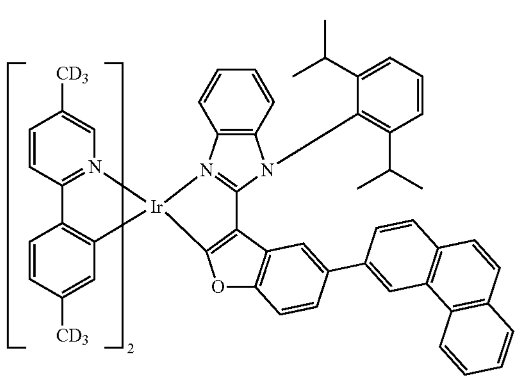
1865
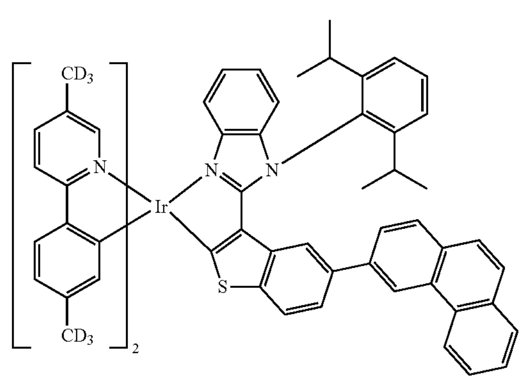

-continued
1866
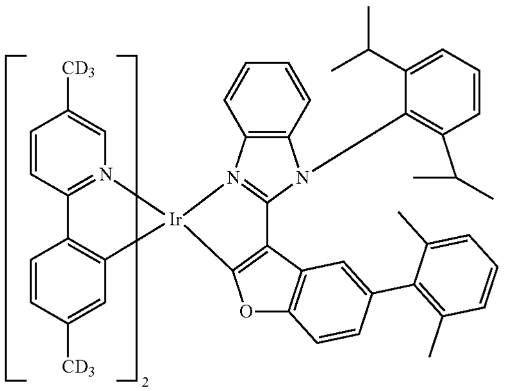
1867
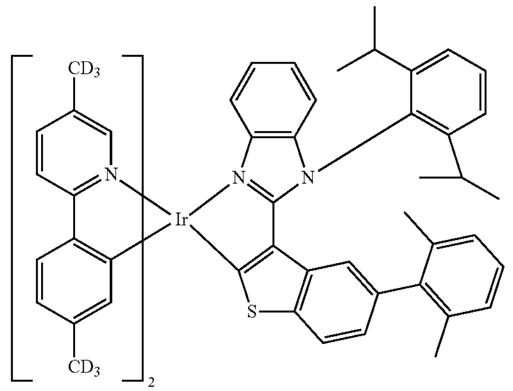
1868
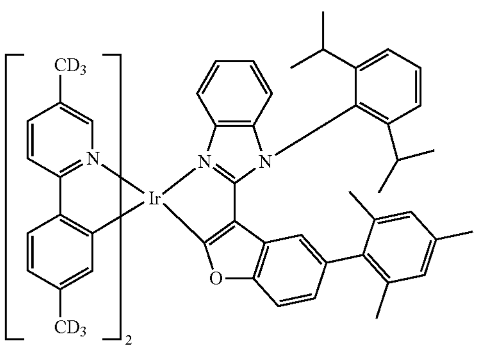
1869
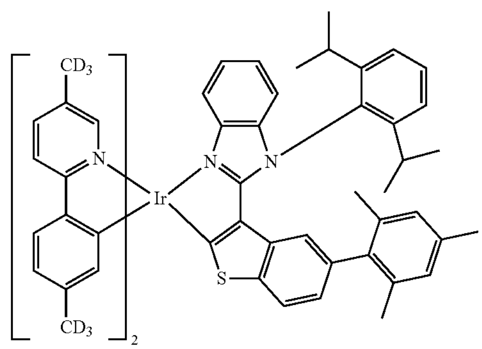
1870
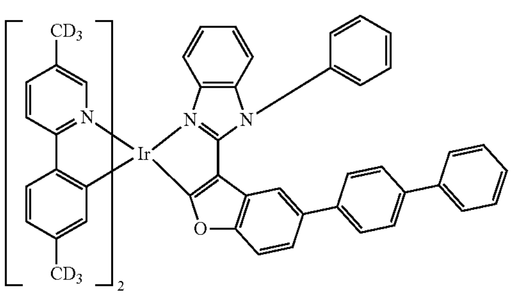
1871
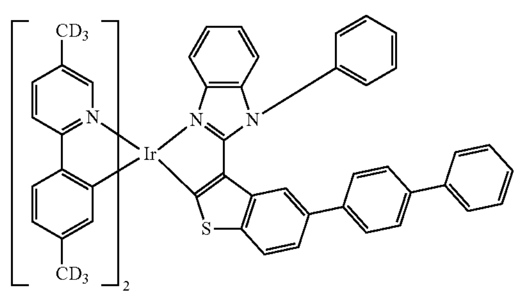
1872
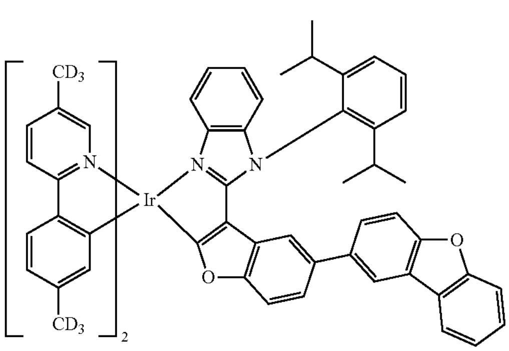
1873
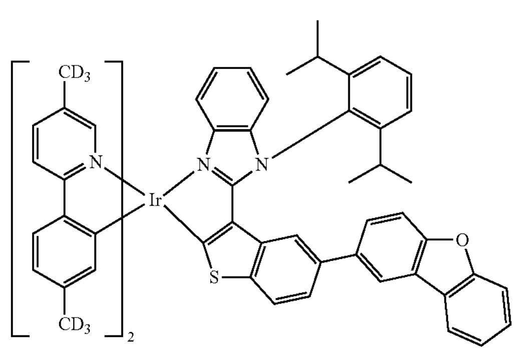

-continued
1874
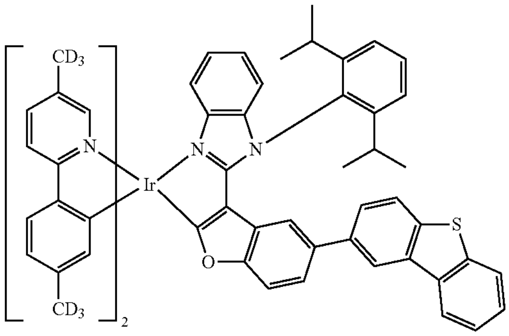
1875
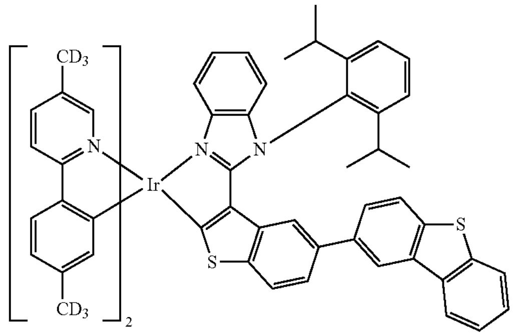
1876
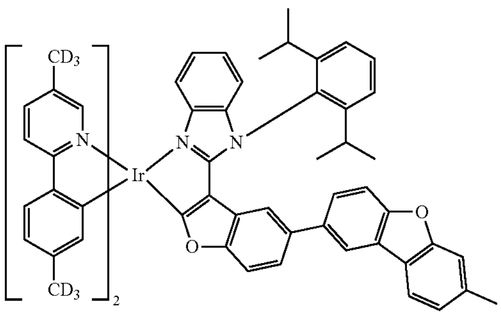
1877
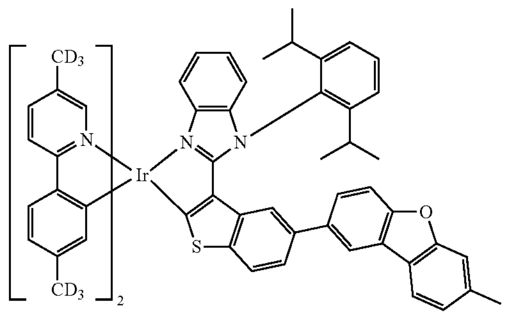
1878
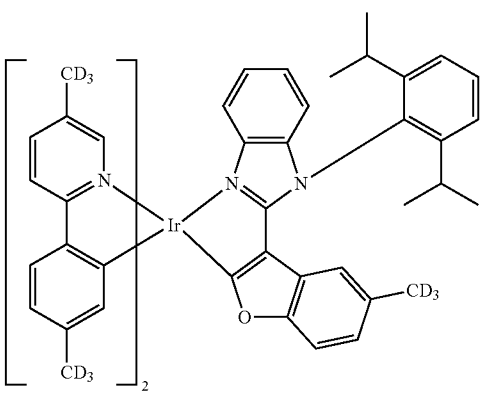
1879
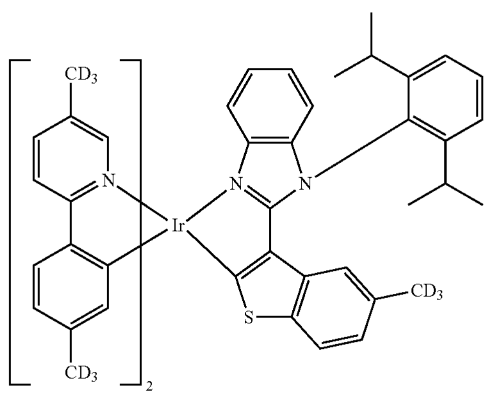
1880
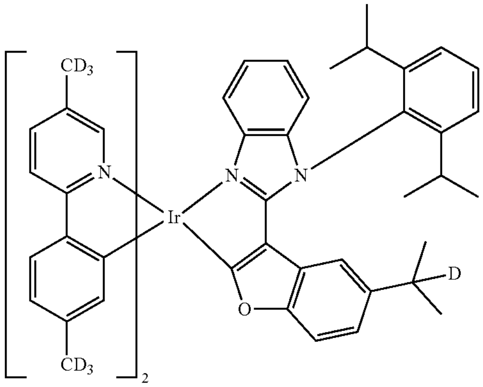
1881
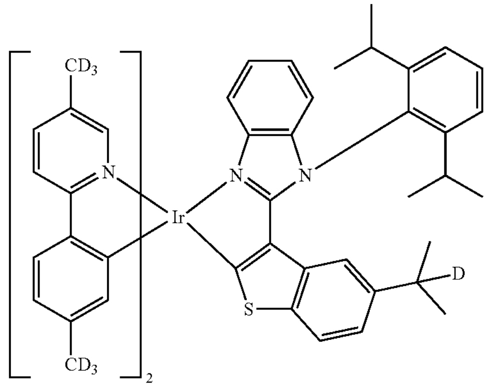

-continued
1882
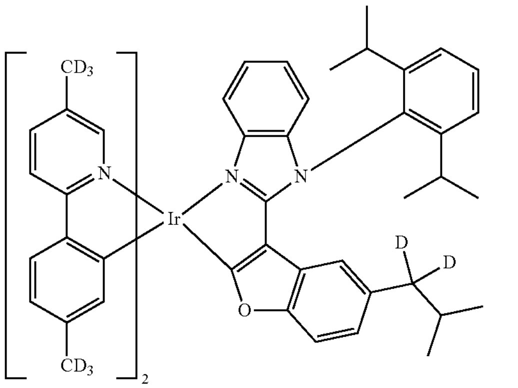
1883
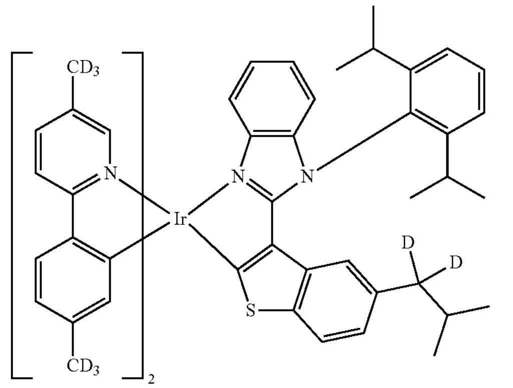
1884
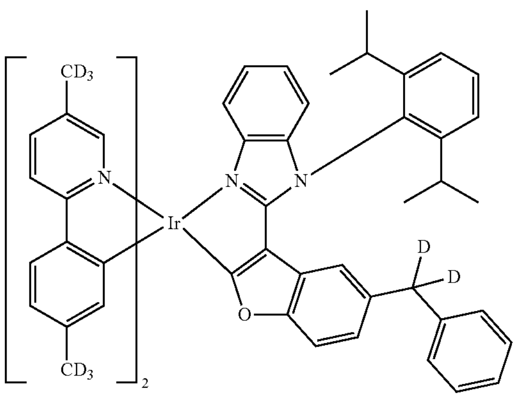
1885
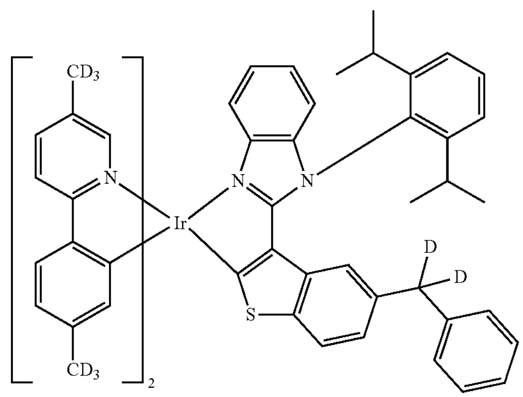
1886
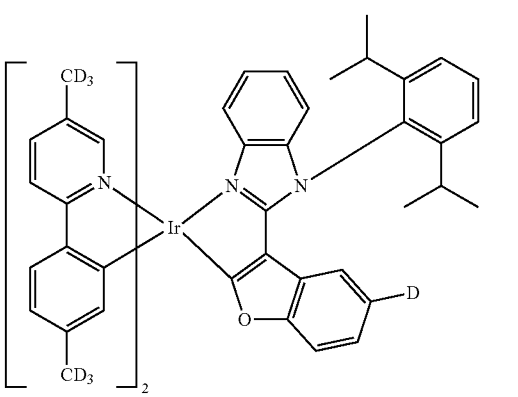
1887
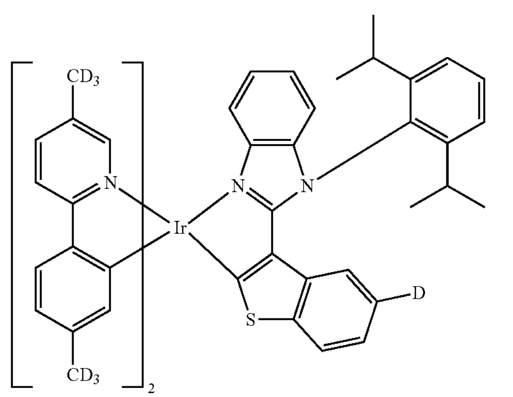
1888
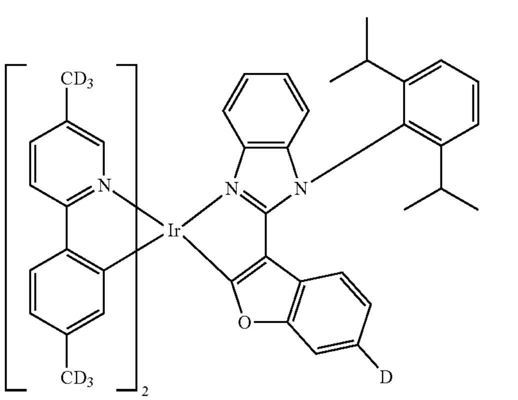
1889
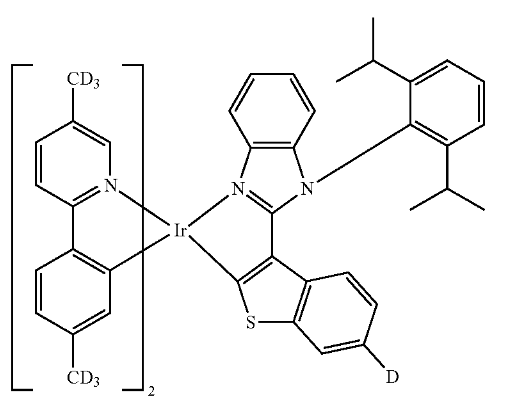

-continued
1890
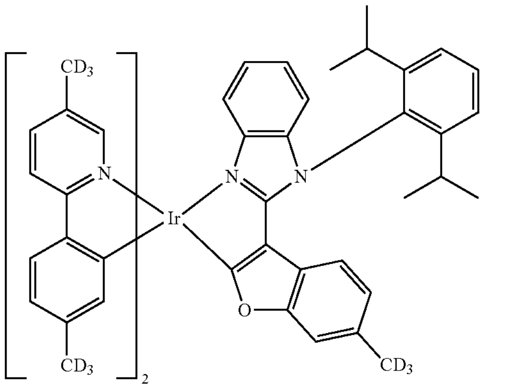
1891
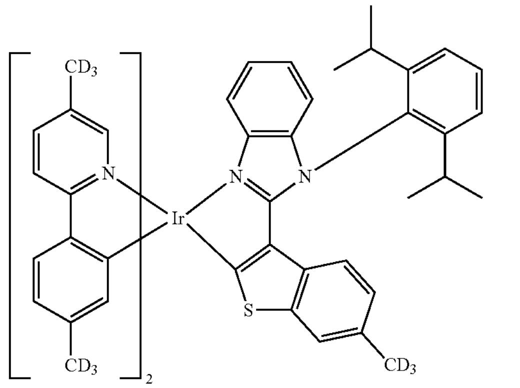
1892
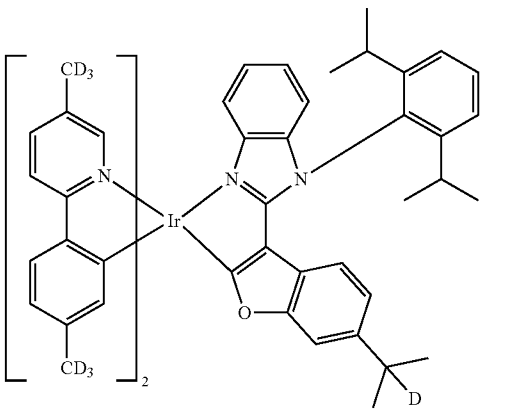
1893
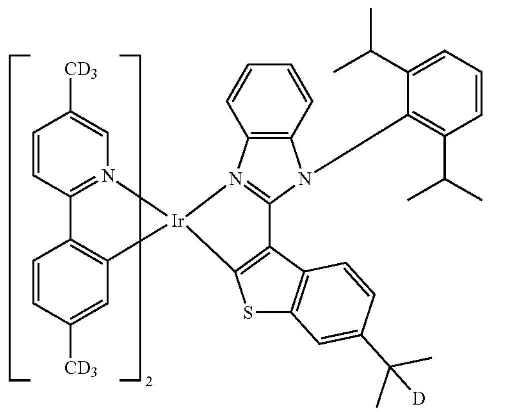
1894
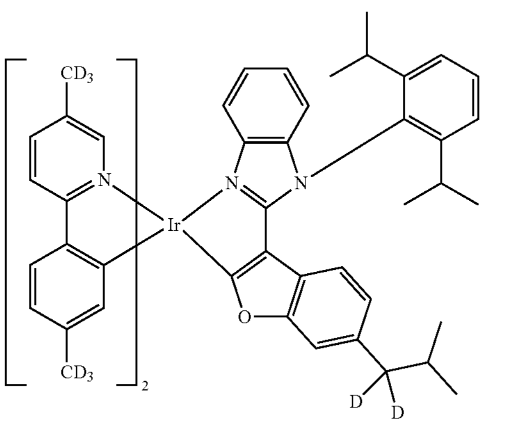
1895
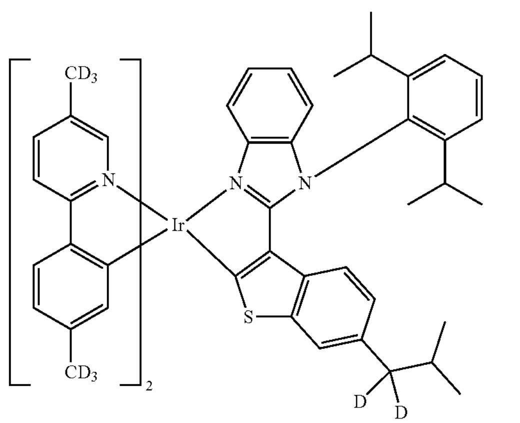
1896
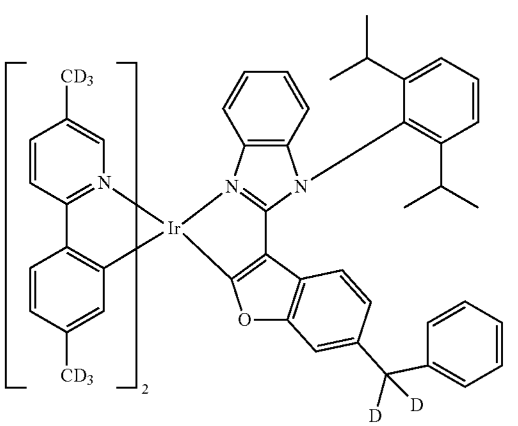
1897
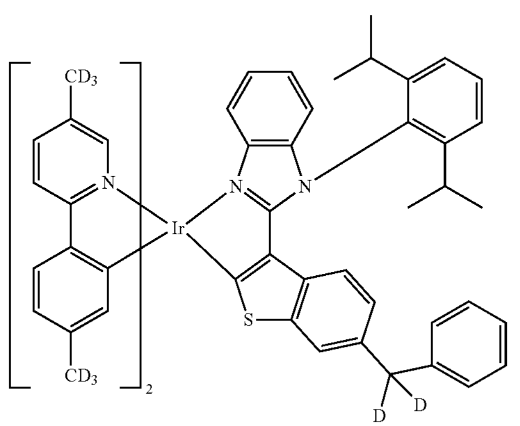

-continued
1898
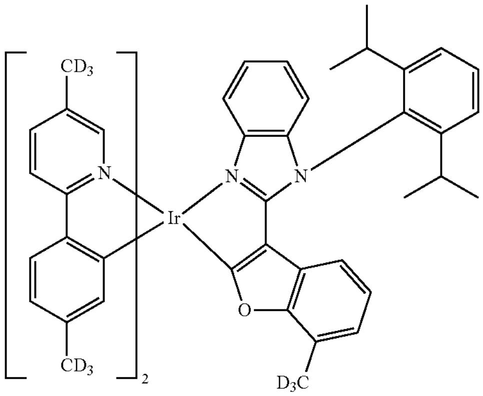
1899
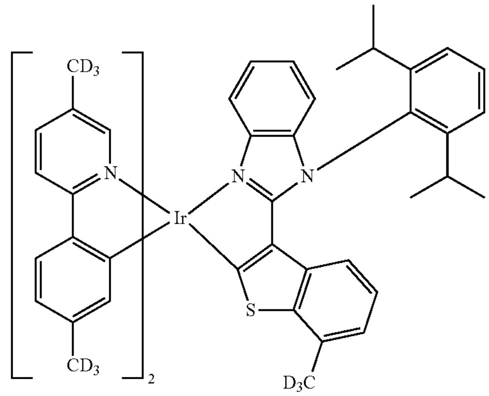
1900
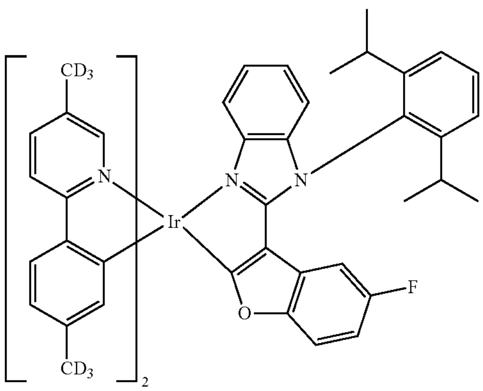
1901
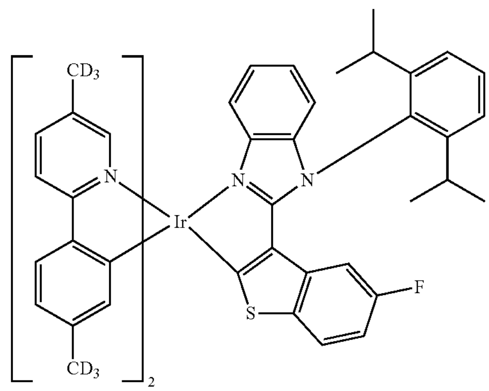
1902
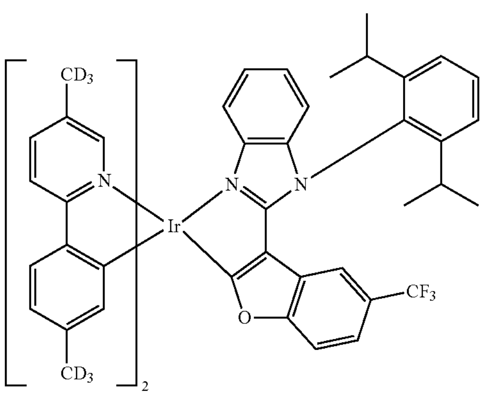
1903
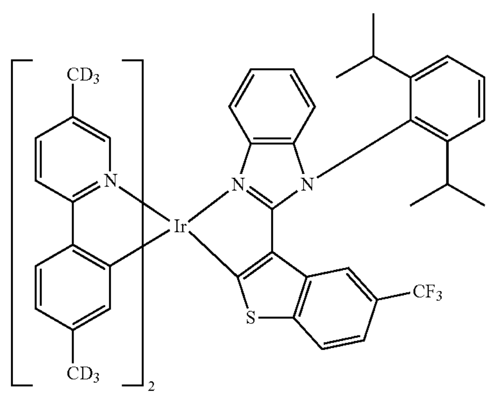
1904
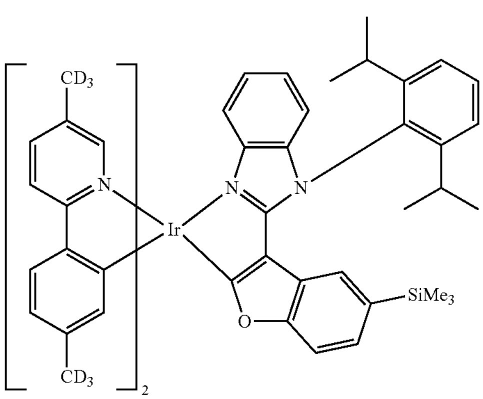
1905
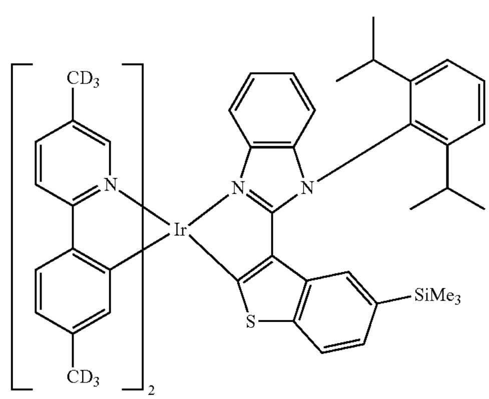

-continued
1906
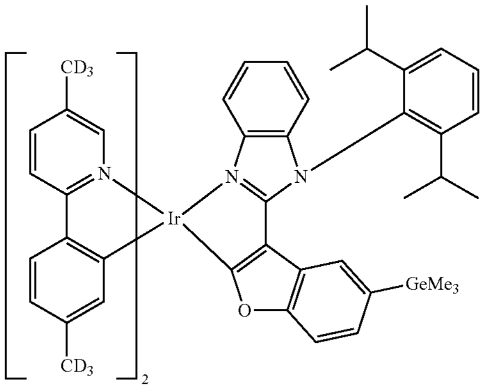
1907
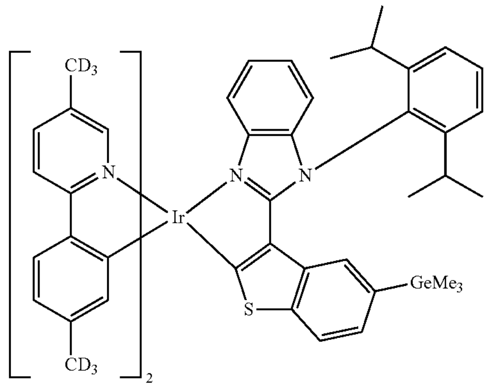
1908
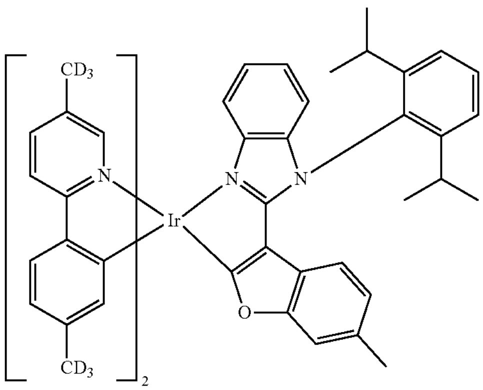
1909
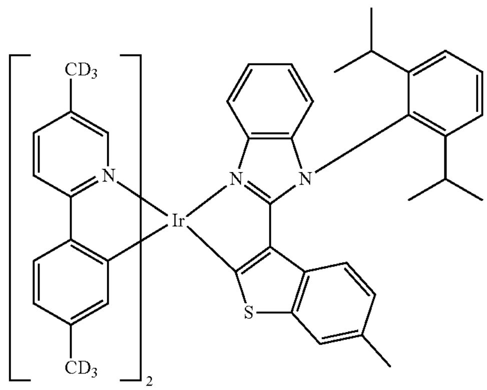
1910
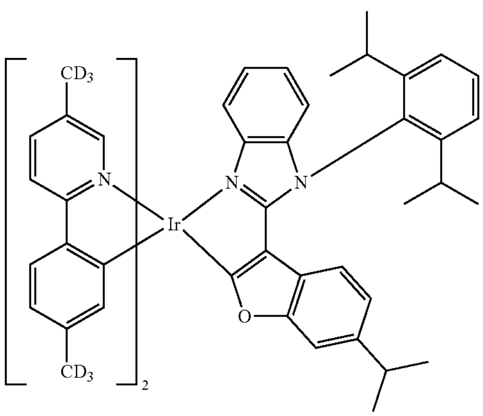
1911
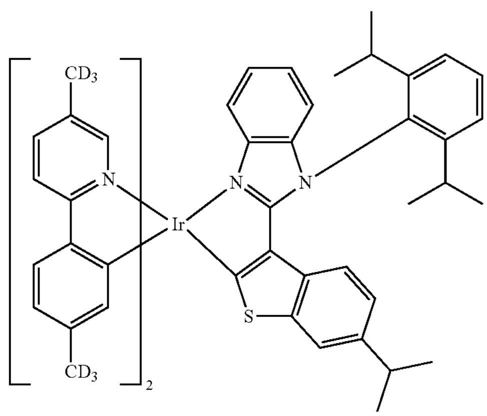
1912
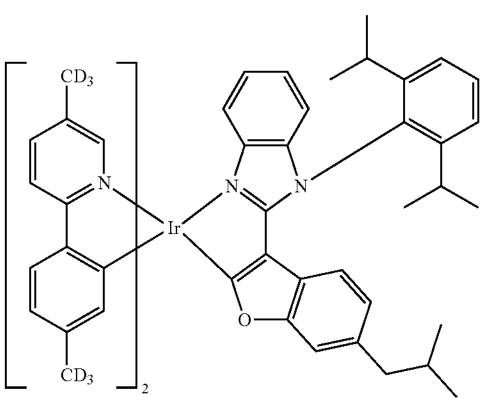
1913
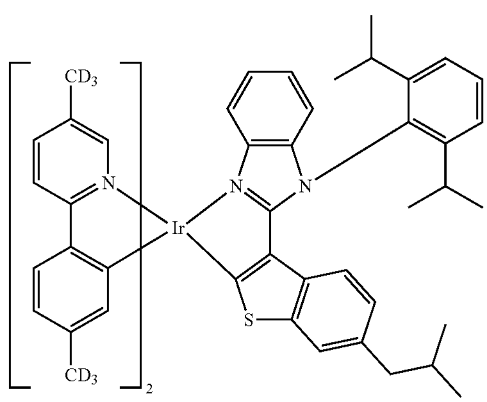

-continued
1914
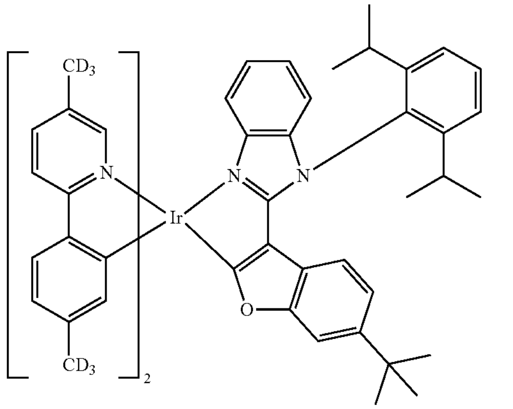
1915
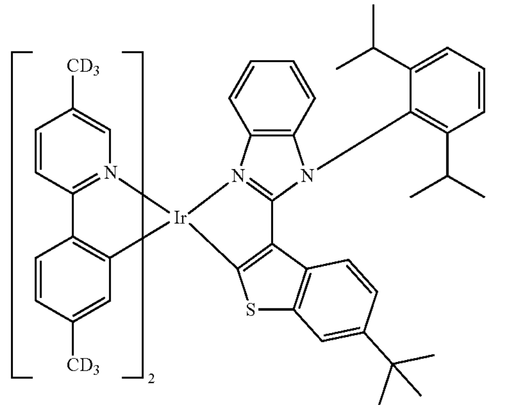
1916
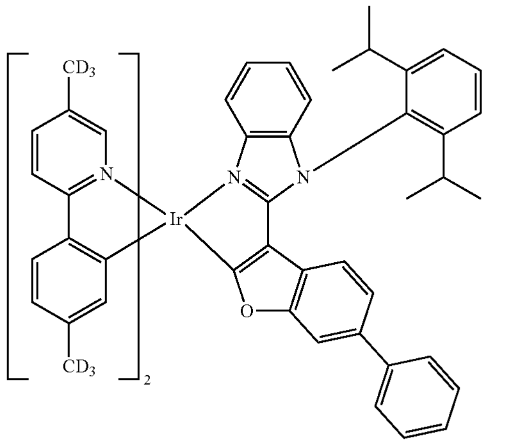
1917
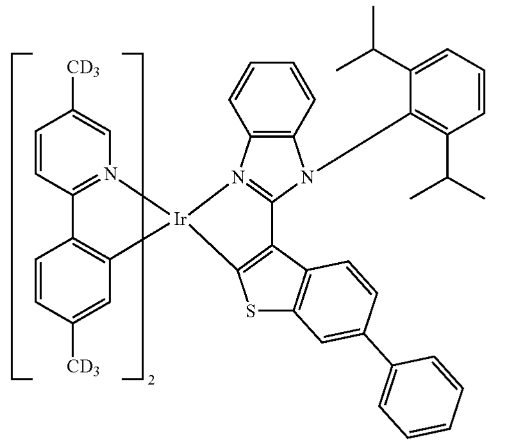
1918
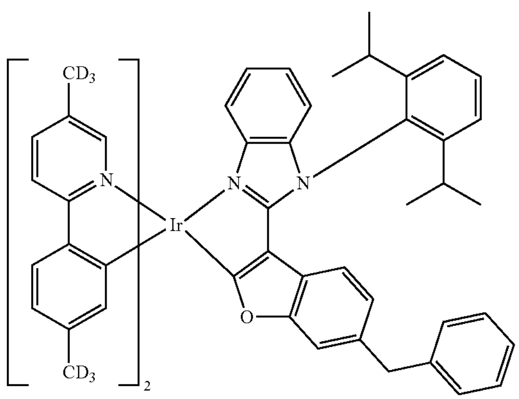
1919
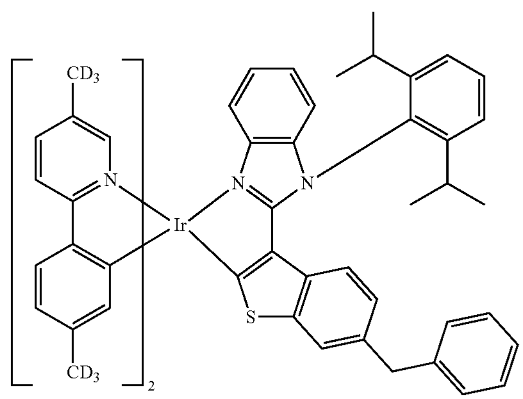
1920
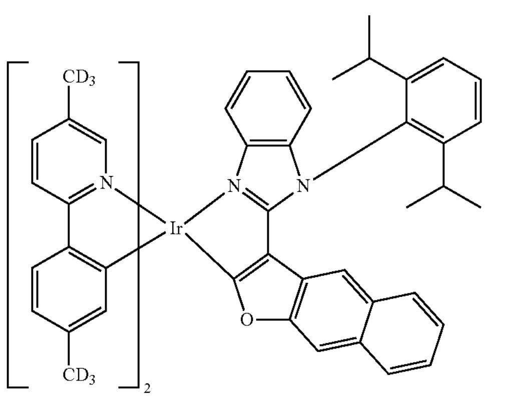
1921
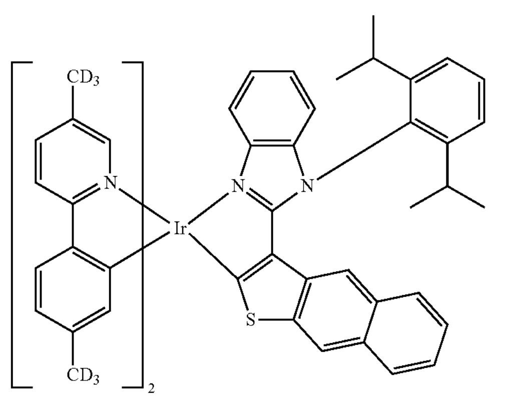

-continued
1922
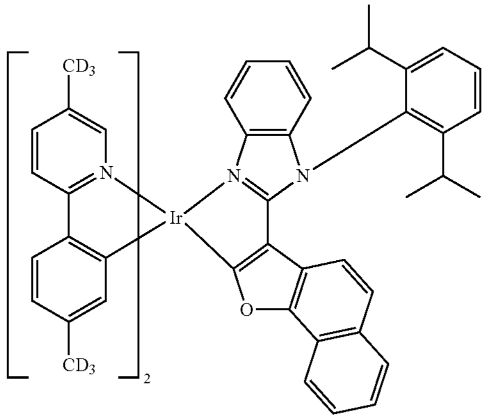
1923
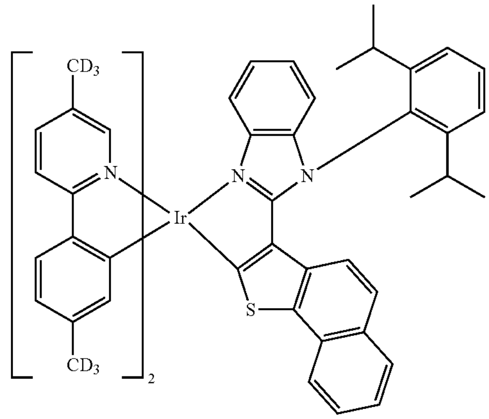
1924
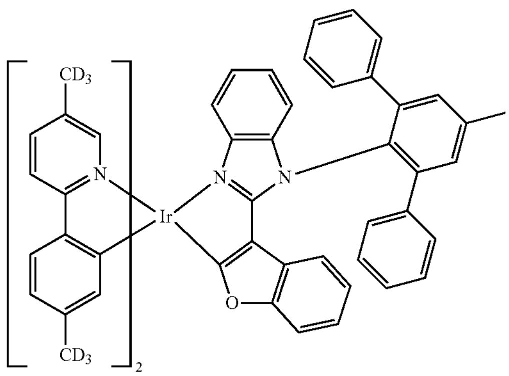
1925
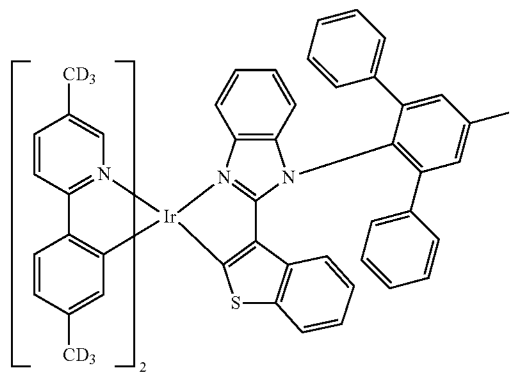
1926
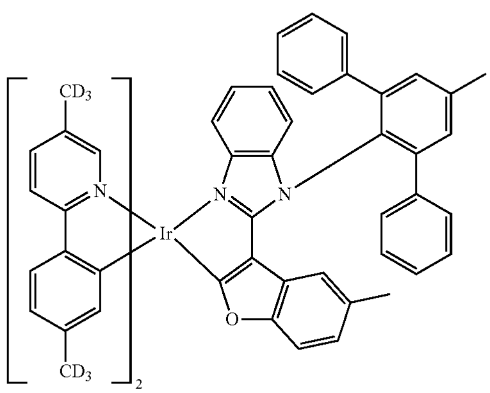
1927
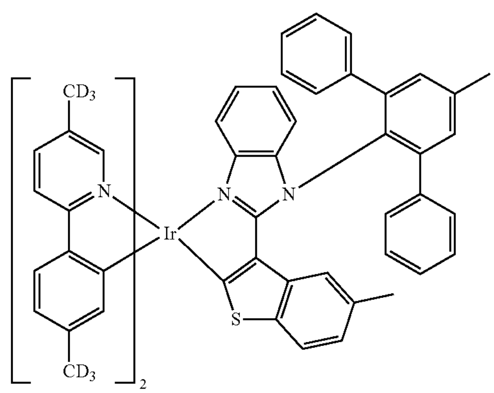
1928
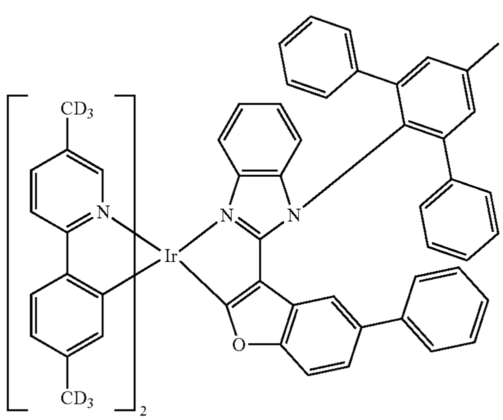
1929
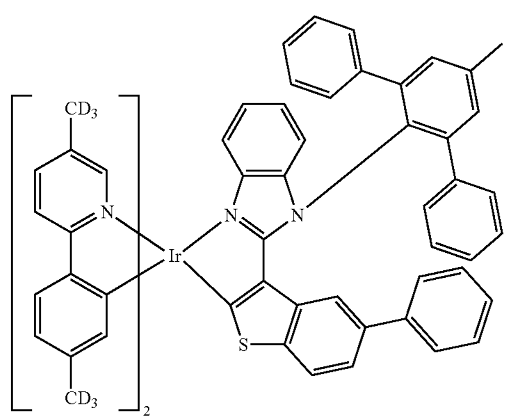

-continued
1930
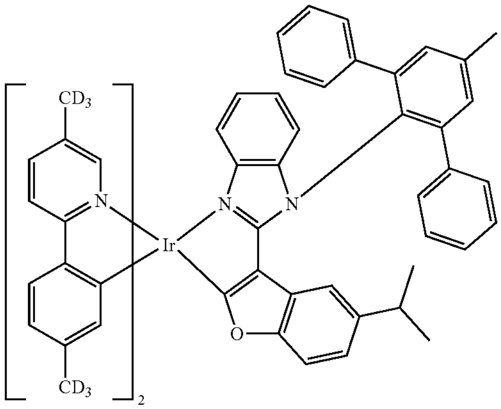
1931
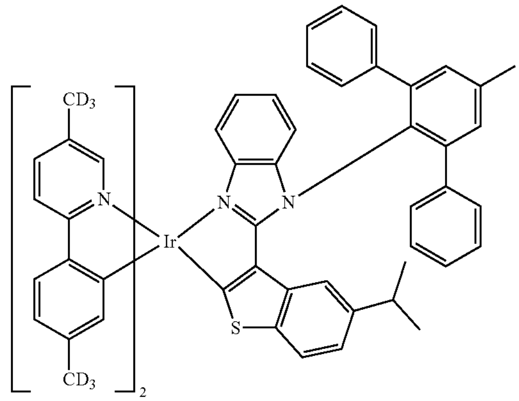
1932
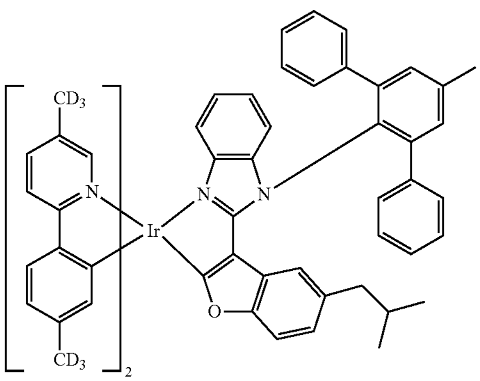
1933
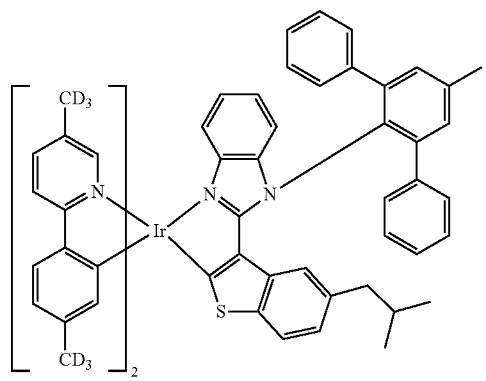
1934
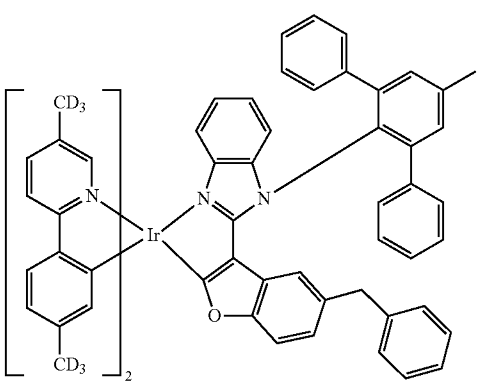
1935
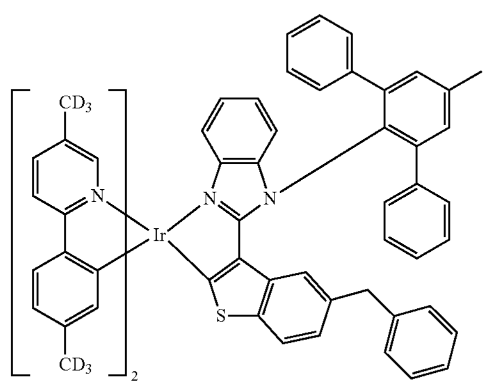
1936
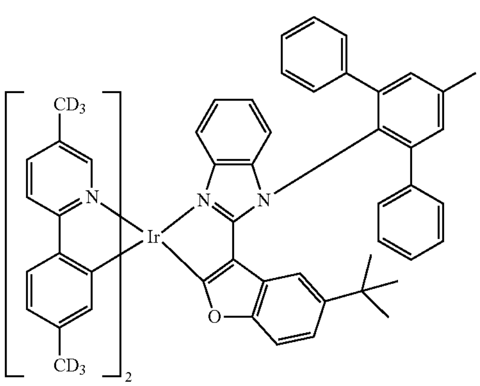
1937
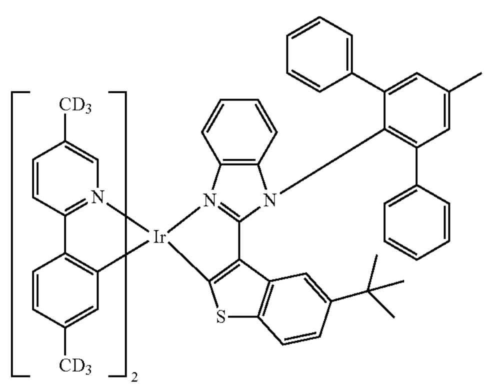

-continued
1938
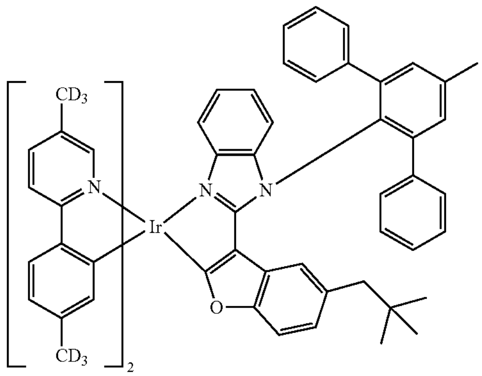
1939
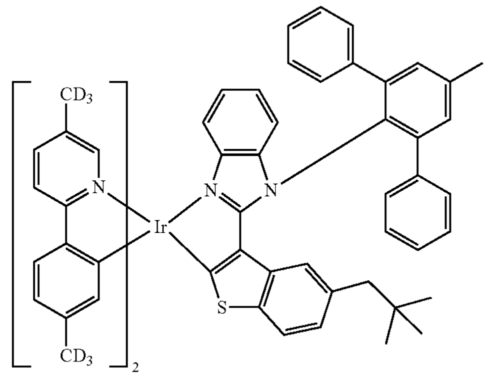
1940
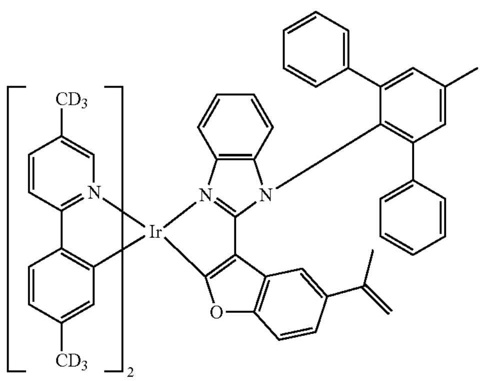
1941
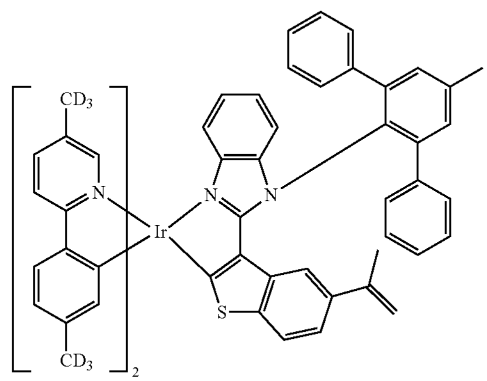
1942
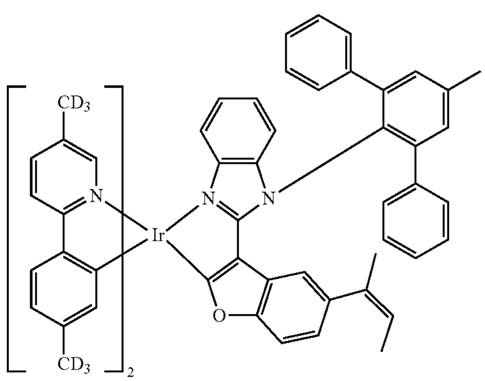
1943
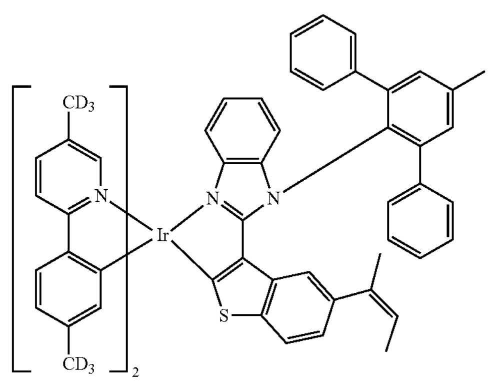
1944
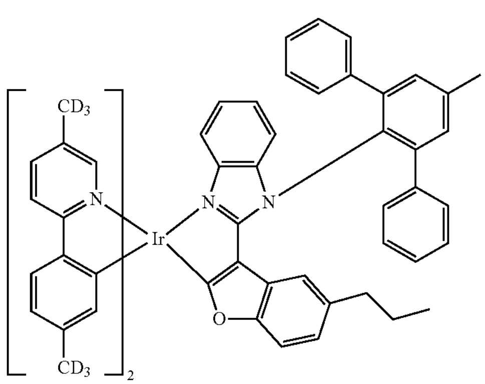
1945
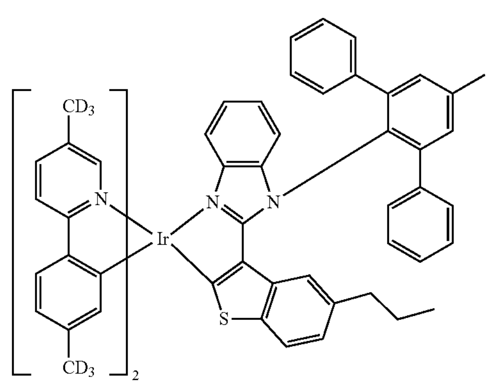

-continued
1946
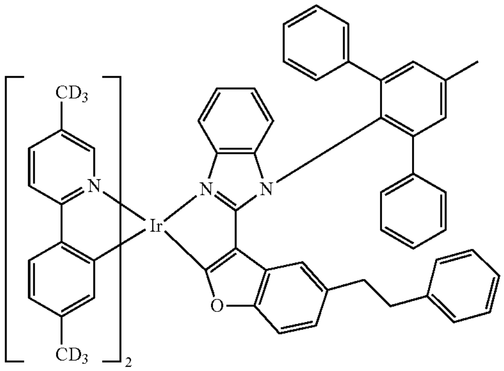
1947
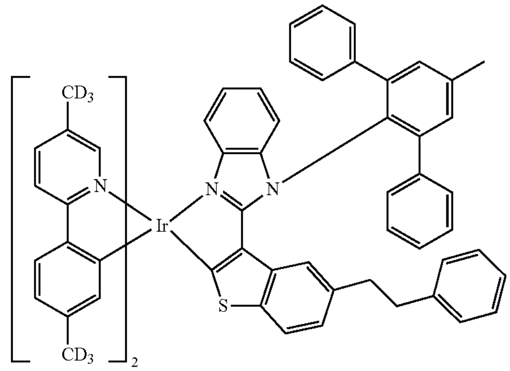
1948
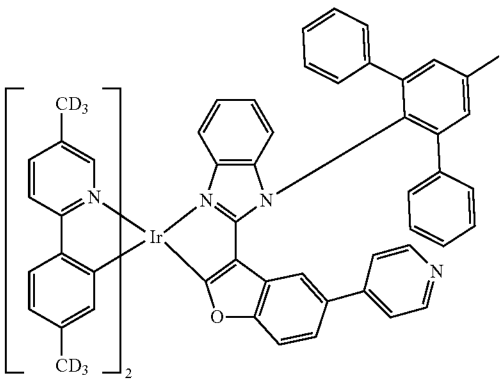
1949
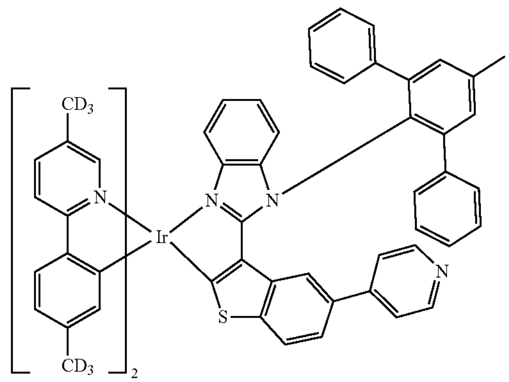
1950
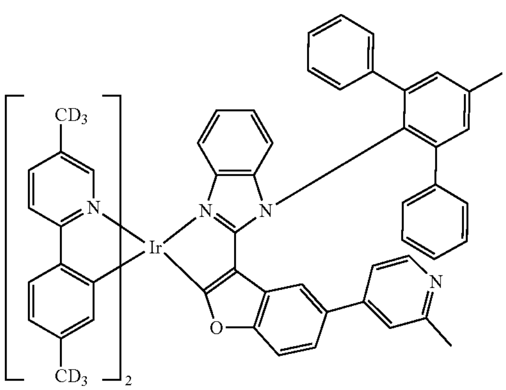
1951
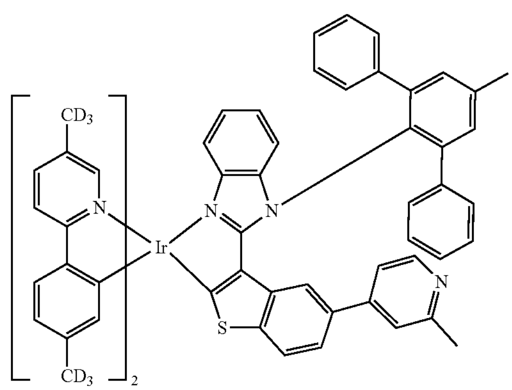
1952
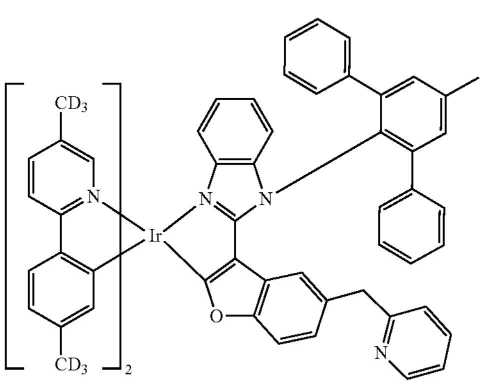
1953
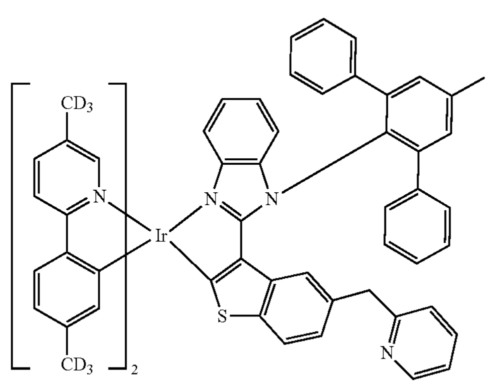

-continued
1954
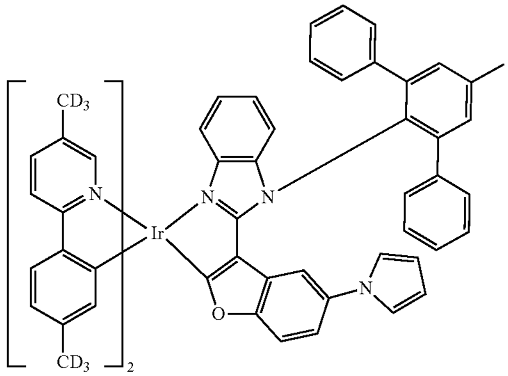
1955
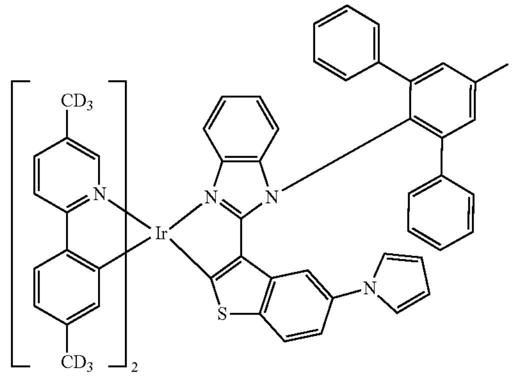
1956
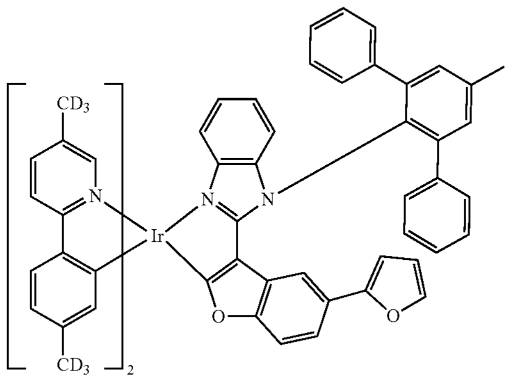
1957
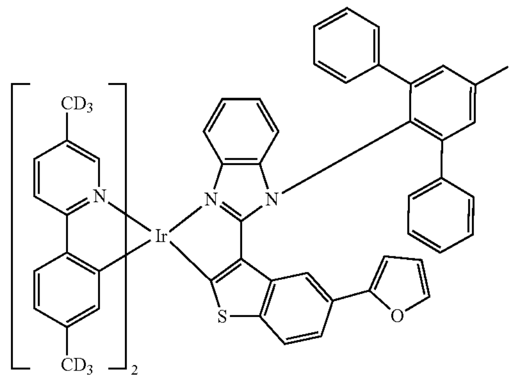
1958
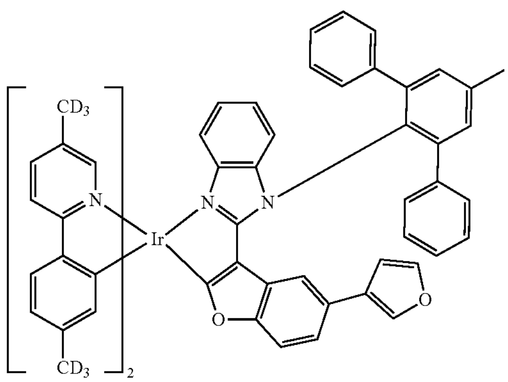
1959
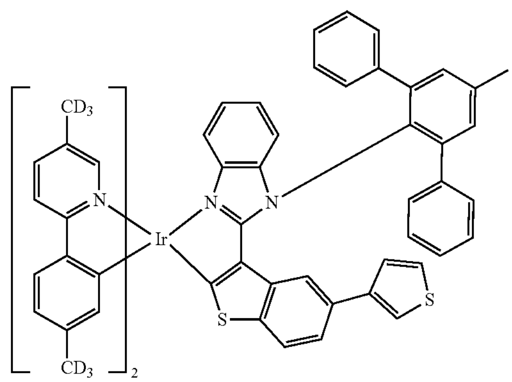
1960
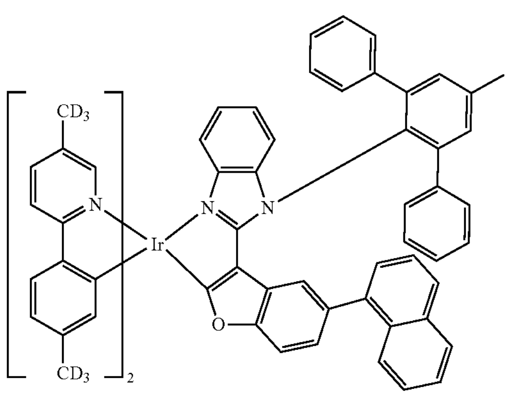
1961
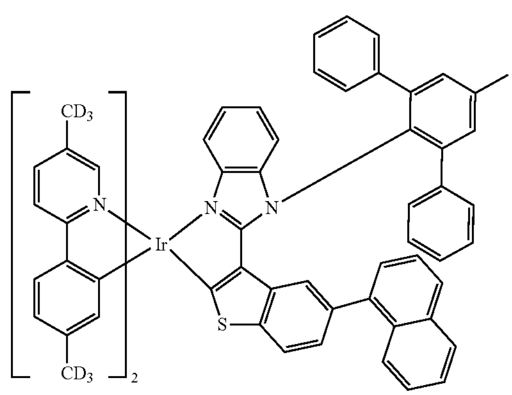

-continued
1962
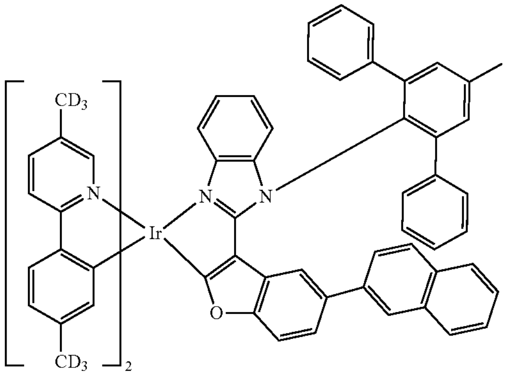
1963
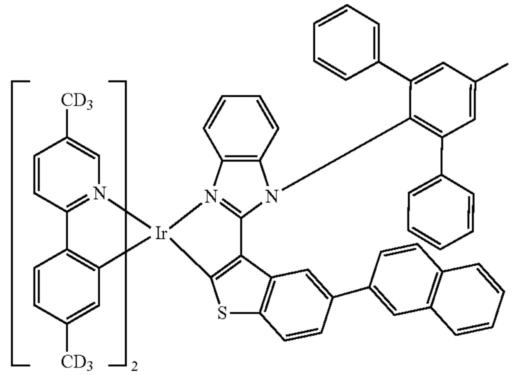
1964
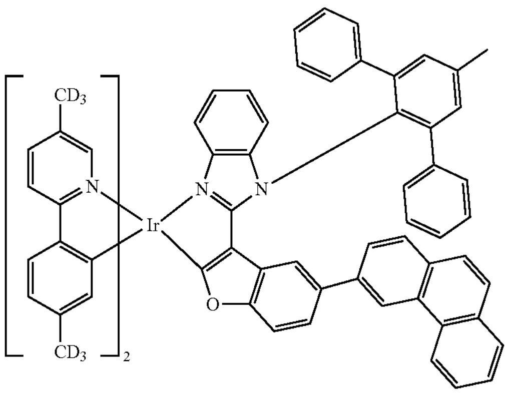
1965
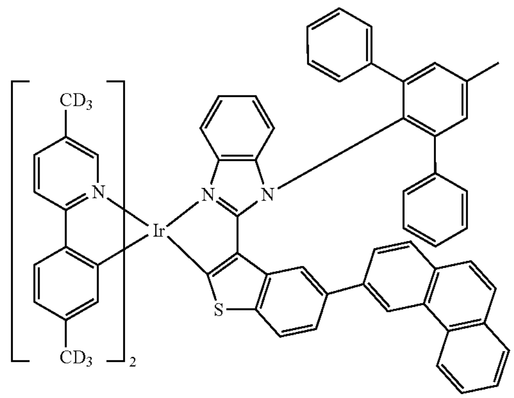
1966
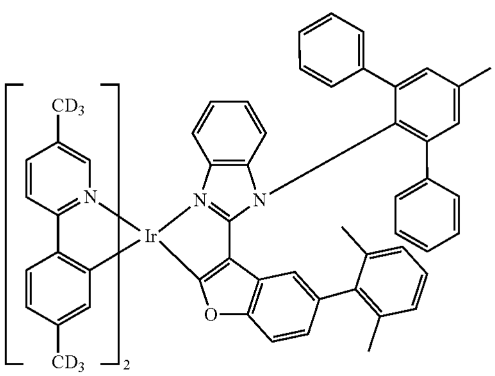
1967
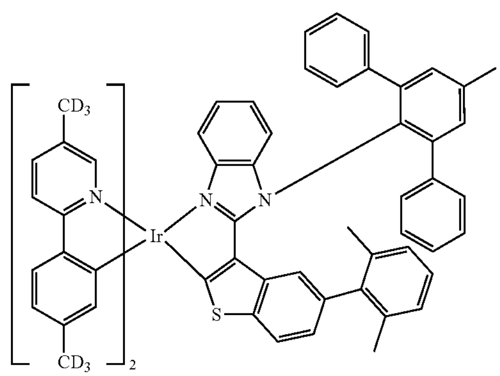
1968
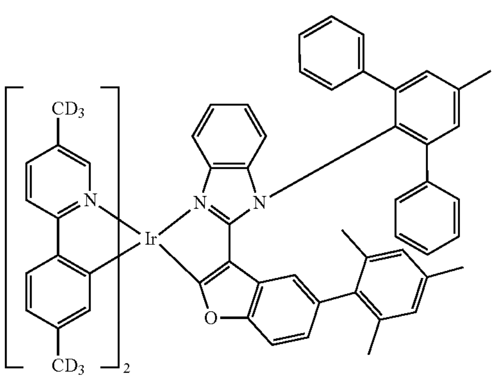
1969
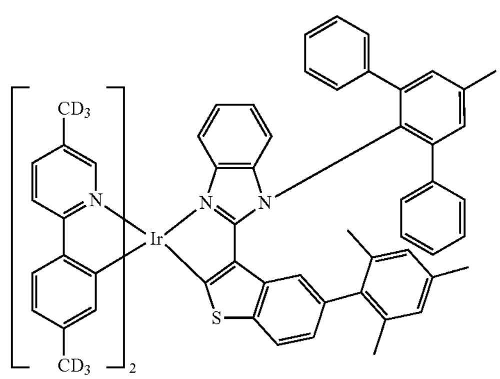

-continued
1970
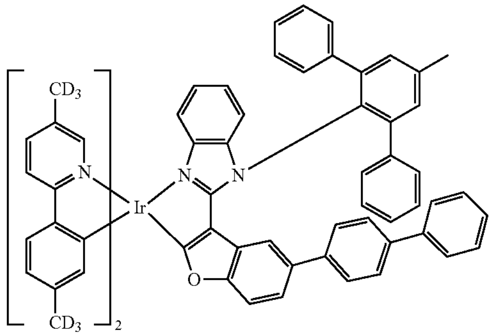
1971
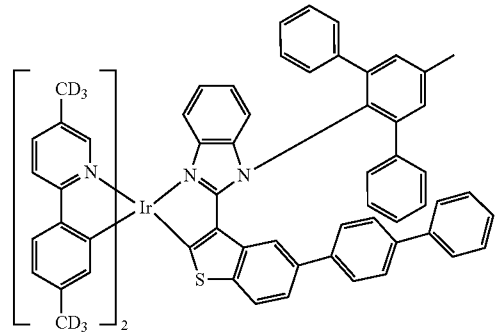
1972
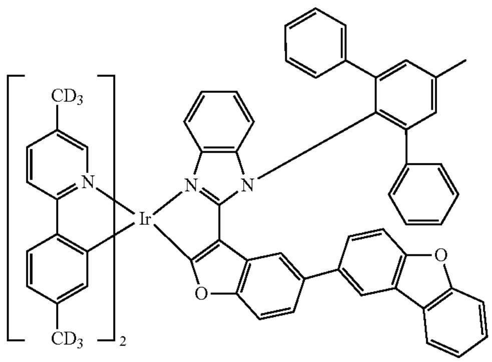
1973
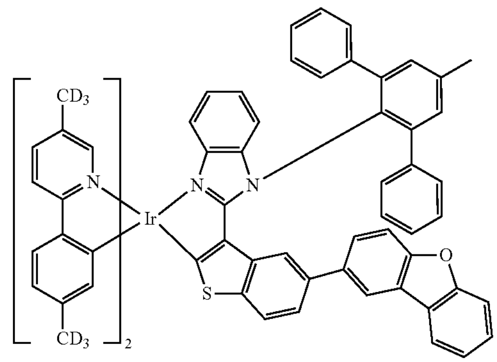
1974
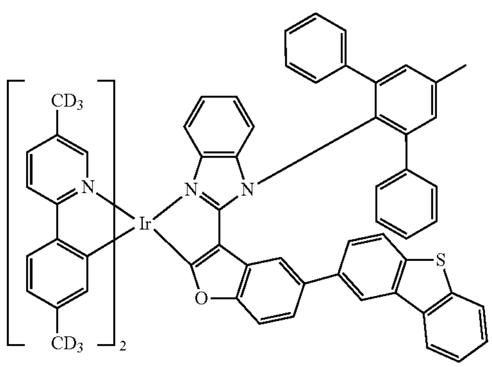
1975
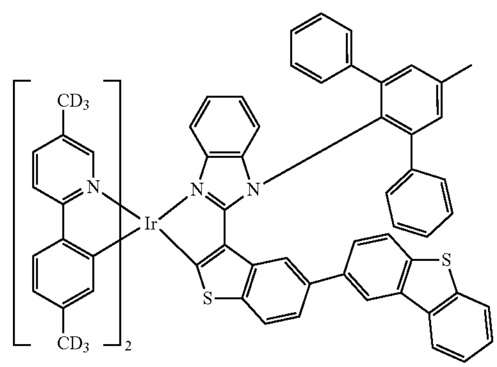
1976
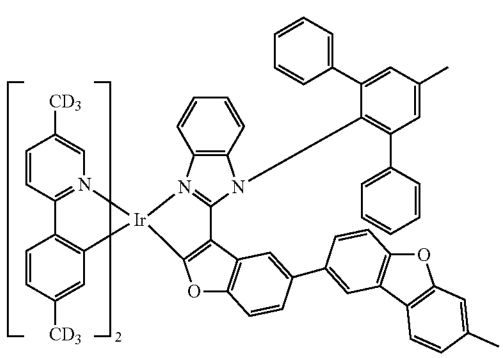
1977
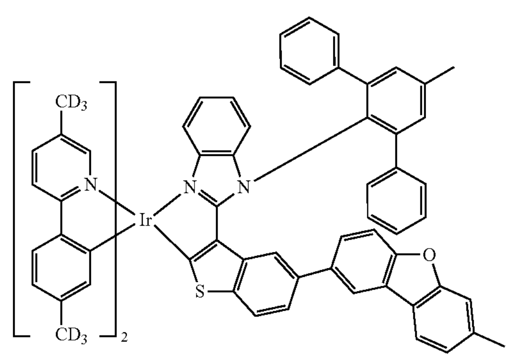

-continued
1978
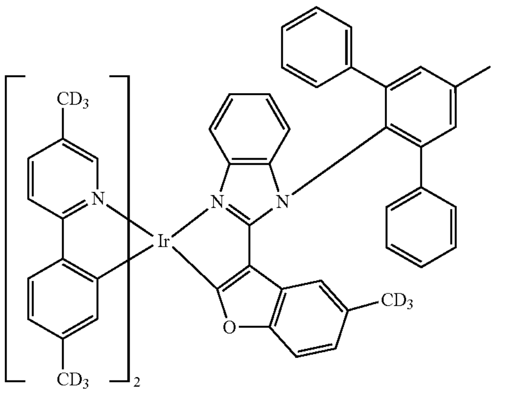
1979
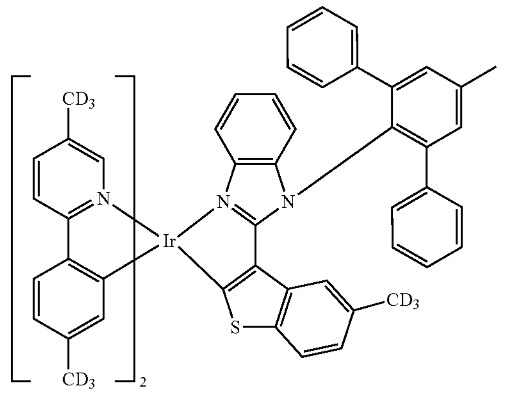
1980
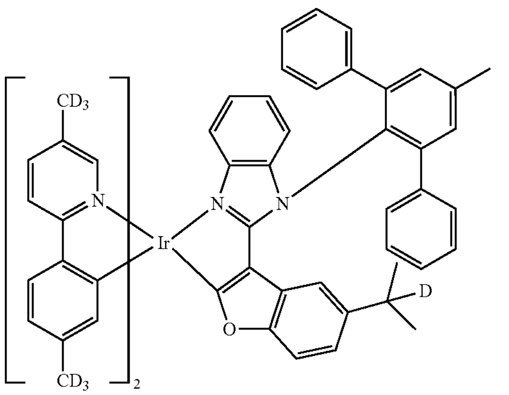
1981
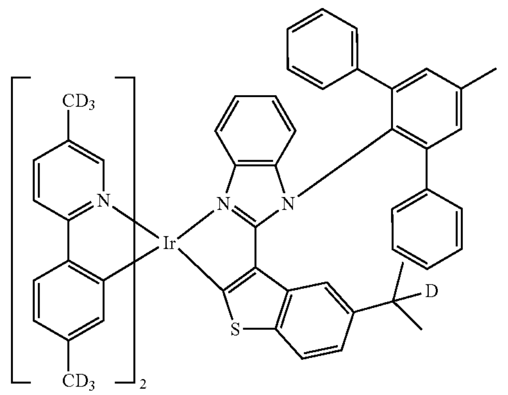
1982
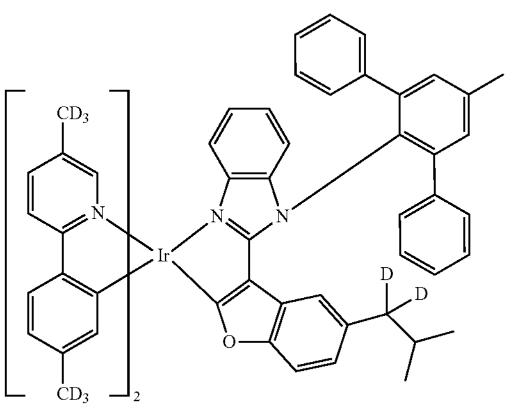
1983
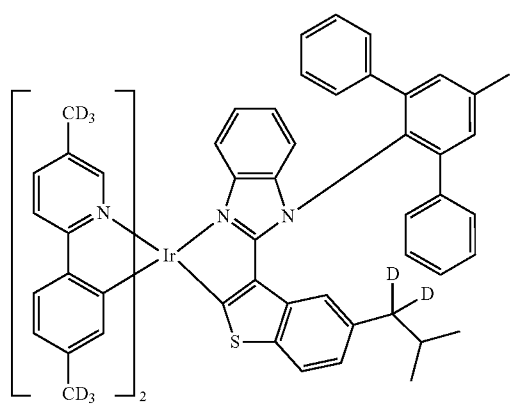
1984
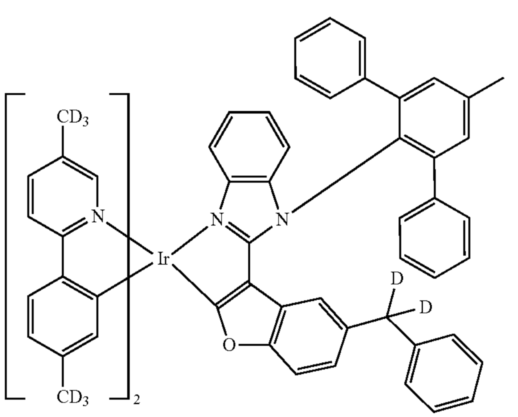
1985
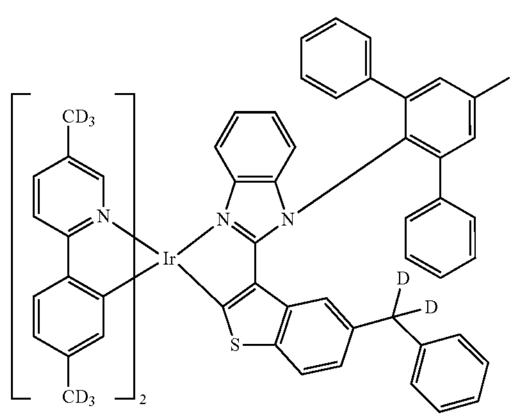

-continued
1986
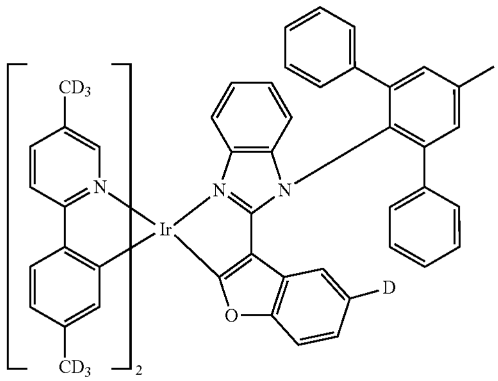
1987
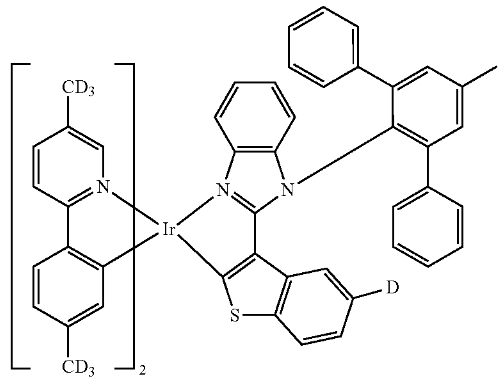
1988
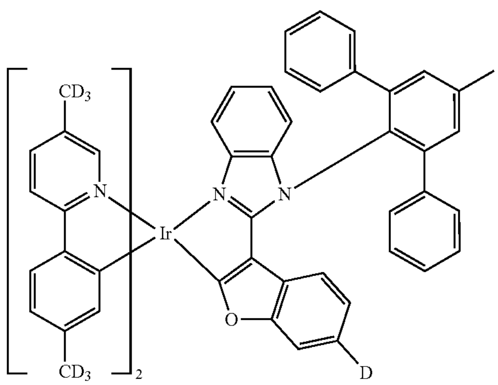
1989
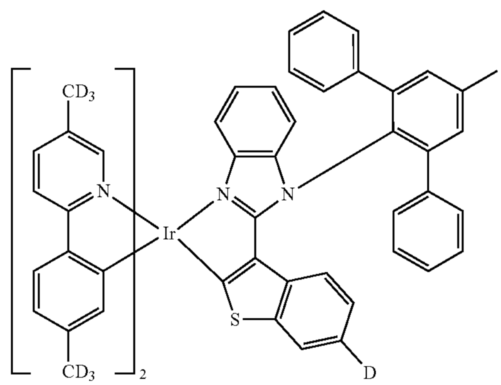
1990
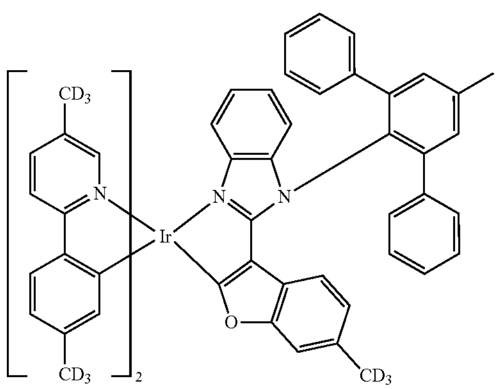
1991
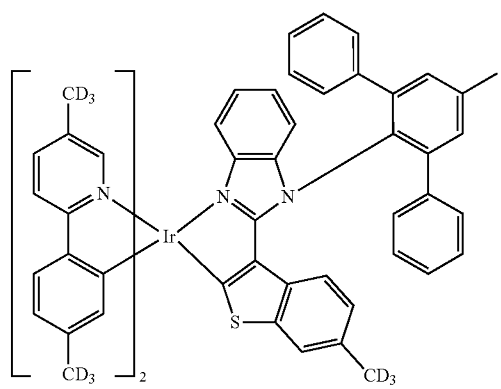
1992
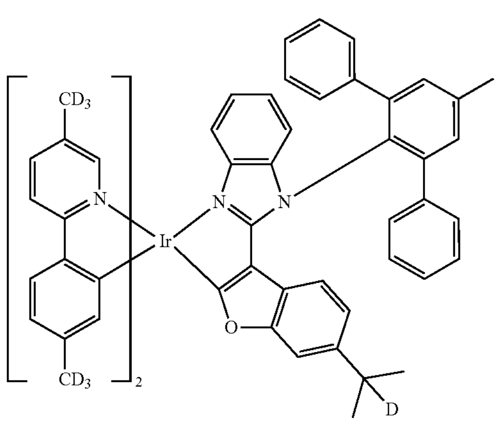
1993
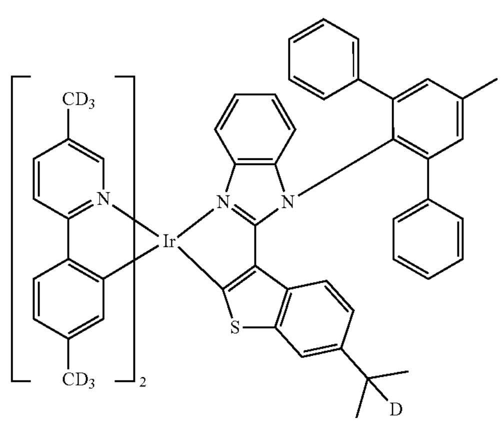

-continued
1994
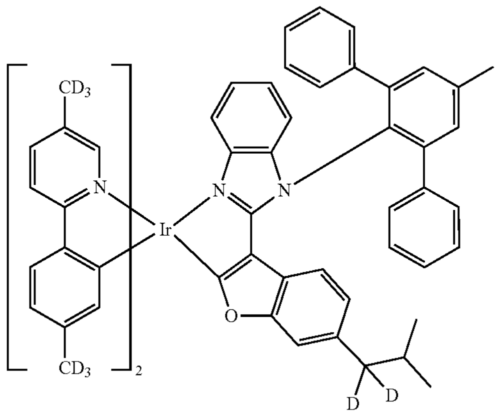
1995
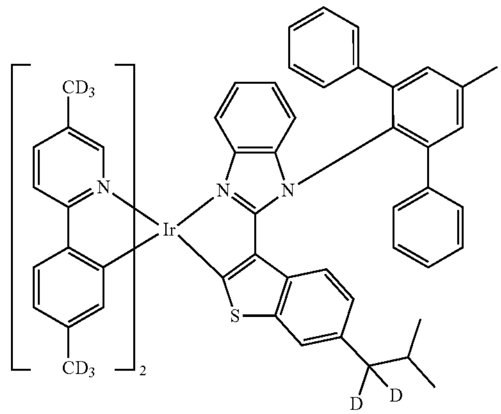
1996
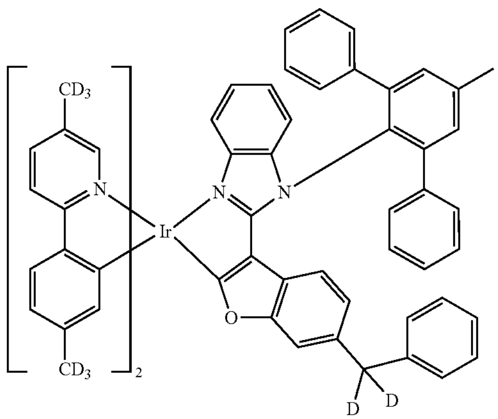
1997
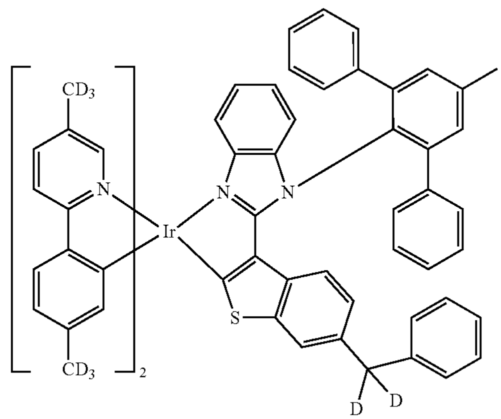
1998
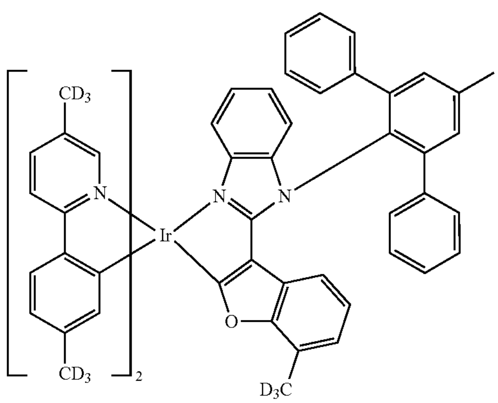
1999
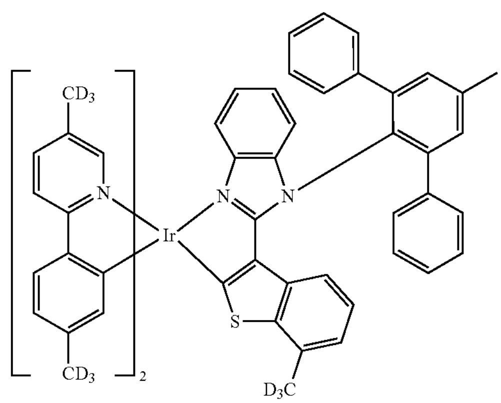
2000
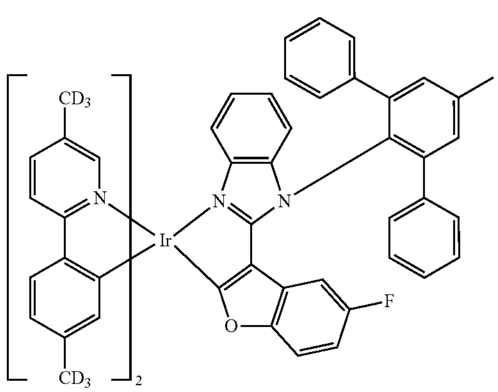
2001
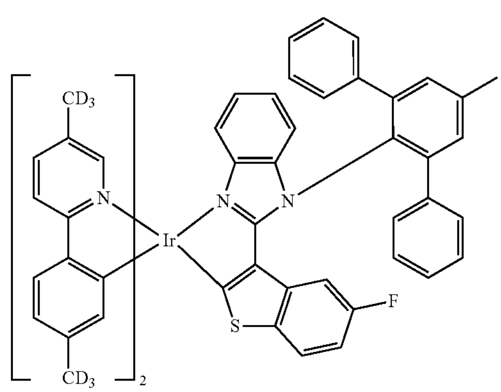

-continued
2002
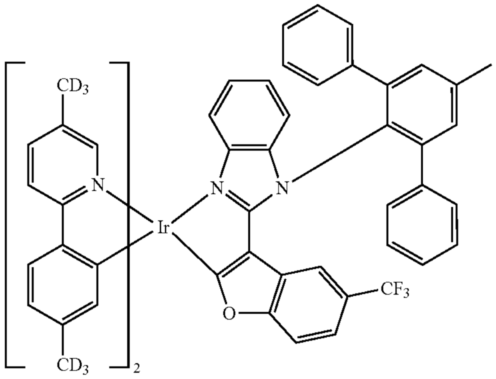
2003
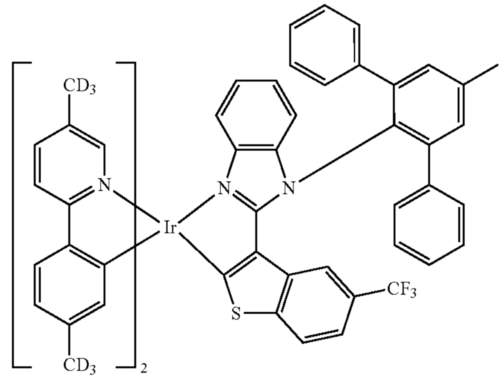
2004
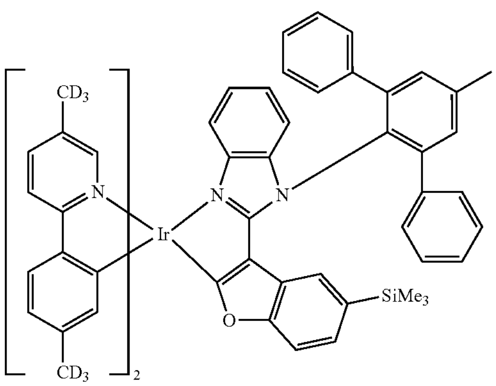
2005
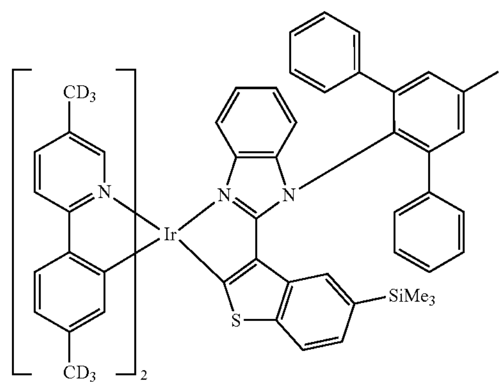
2006
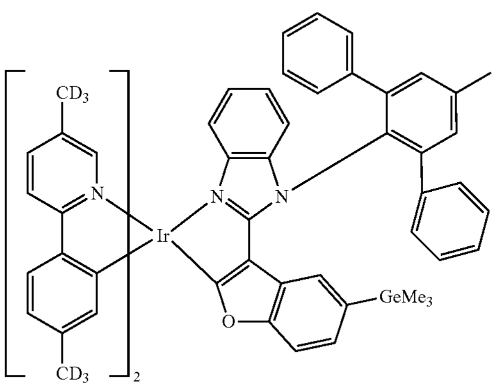
2007
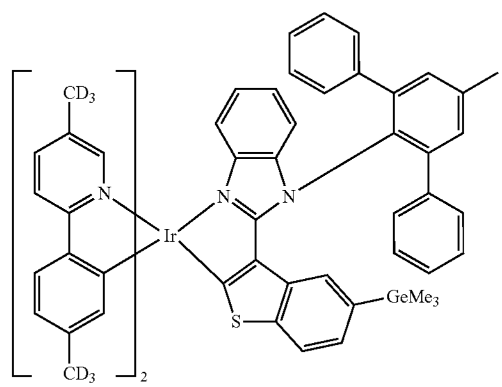
2008
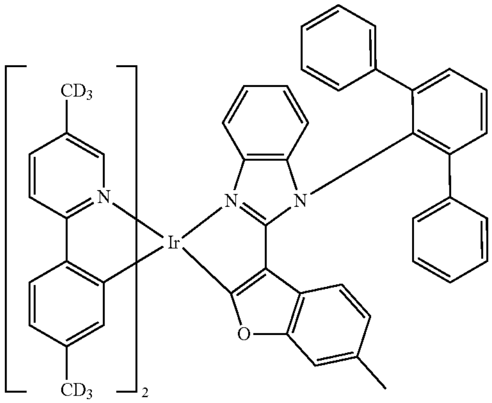
2009
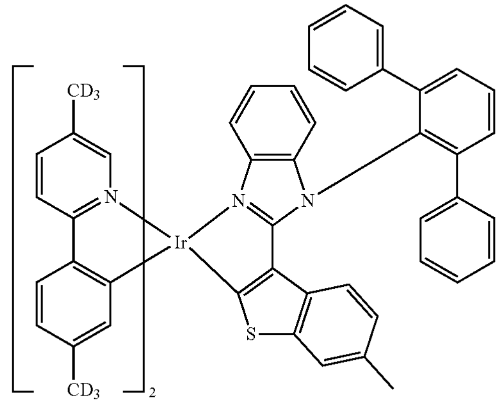

-continued
2010
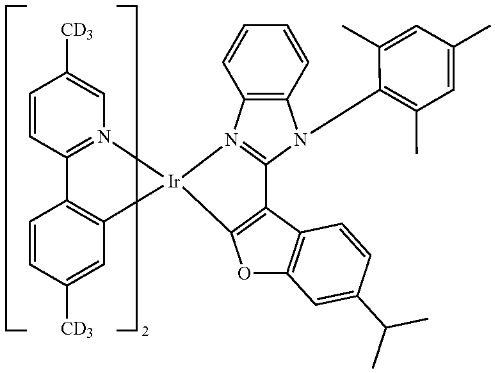
2011
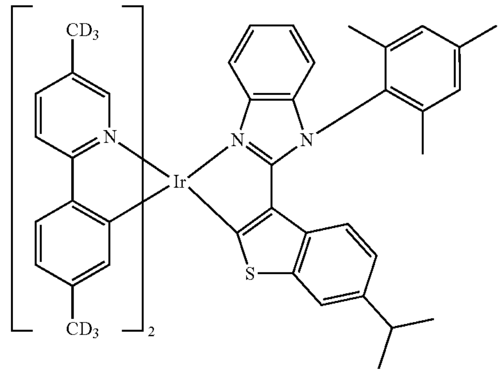
2012
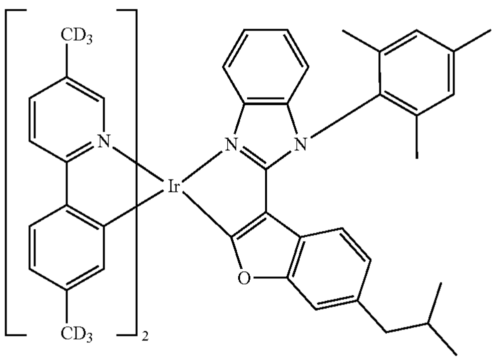
2013
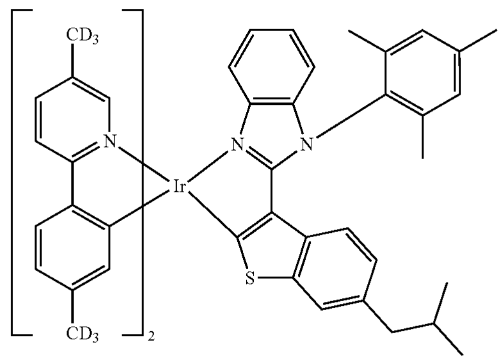
2014
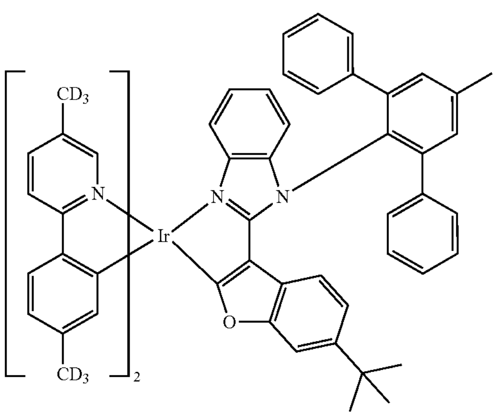
2015
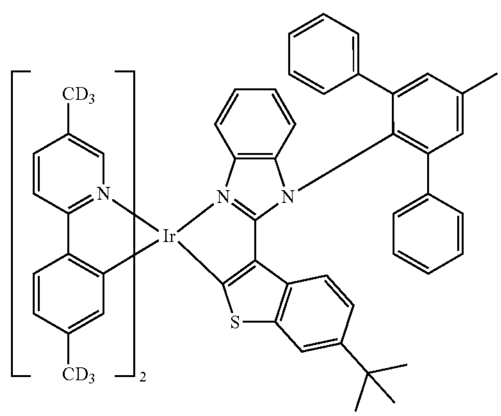
2016
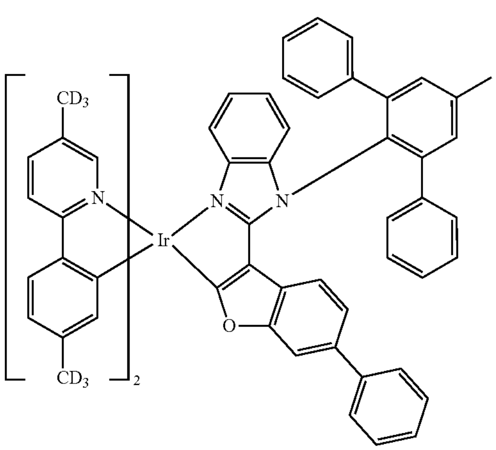
2017
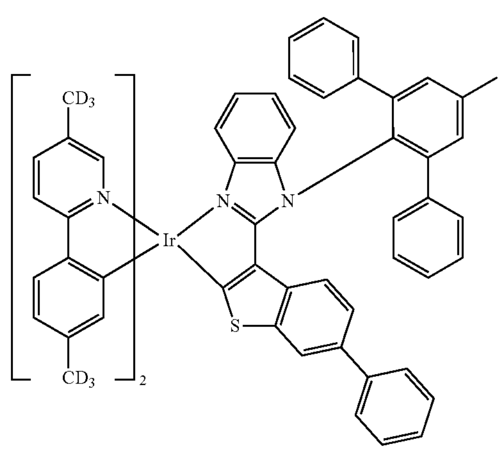

-continued

2018

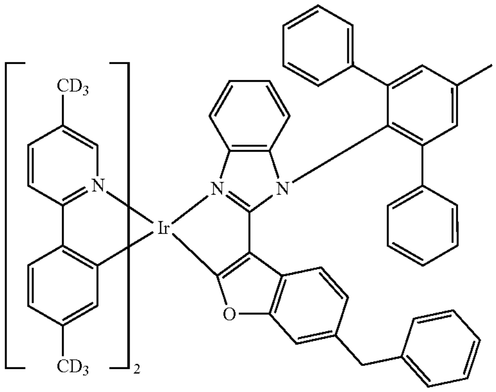

2019

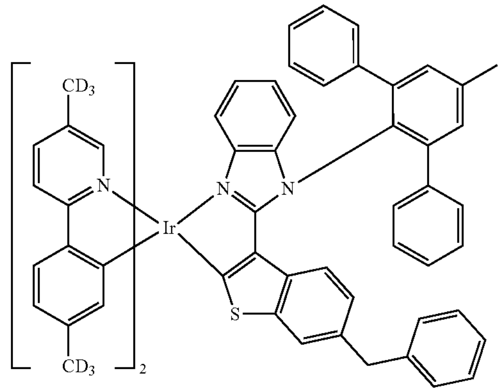

2020

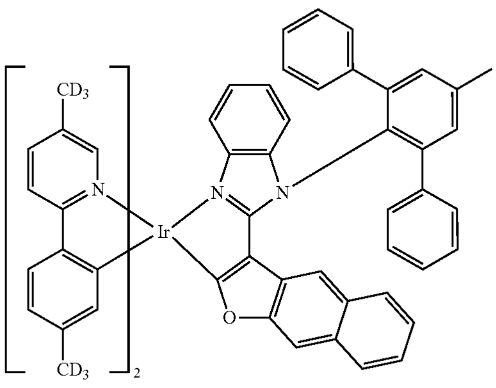

2021

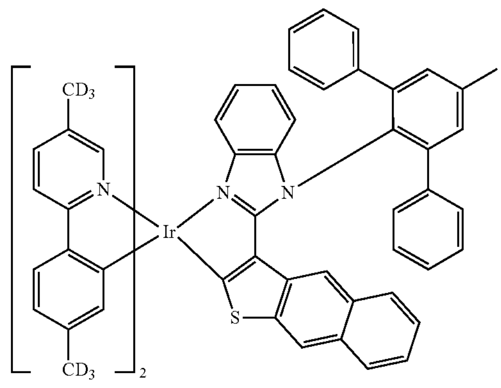

2022

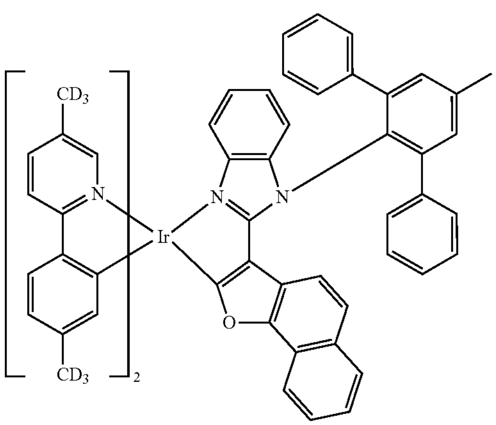

2023

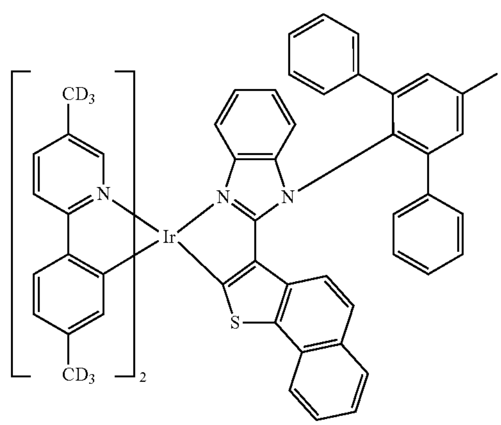

The group $L_1$ in the organometallic compound represented by Formula 1 may be a ligand represented by Formula 2, and n1, i.e., the number of $L_1$ groups, may be 1, 2, or 3. That is, the organometallic compound may essentially include at least one ligand represented by Formula 2, as a ligand bonded to metal M.

In the ligand represented by Formula 2, ring A may be a condensed ring in which a 6-membered ring is condensed with an imidazole ring, and ring B may be a condensed ring in which ring $CY_1$ is condensed with a 5-membered ring including $X_1$ (see Formula 2' below). By including ring A having excellent stability and ring B having a long conjugation length, the organometallic compound represented by Formula 1 may have improved stability, and the organometallic compound represented by Formula 1 may have relatively small full widths at half maximum (FWHM) of emission peaks of a photoluminescence (PL) spectrum and/or electroluminescence (EL) spectrum. Thus, an electronic device, e.g., an organic light-emitting device, including the organometallic compound represented by Formula 1 may have improved lifespan.

Formula 2′

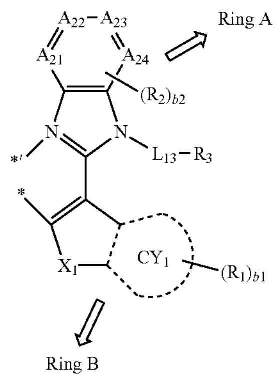

The highest occupied molecular orbital (HOMO) energy level, lowest unoccupied molecular orbital (LUMO) energy level, Si energy level, and $T_1$ energy level of some of the organometallic compounds represented by Formula 1 were evaluated by using Gaussian 09 program that performs molecular structure optimizations according to density functional theory (DFT) at a degree of B3LYP. The results thereof are shown in Table 1.

TABLE 1

| Compound No. | HOMO (eV) | LUMO (eV) | $S_1$ (eV) | $T_1$ (eV) |
|---|---|---|---|---|
| 1 | −4.592 | −1.178 | 2.797 | 2.635 |
| 2 | −4.559 | −1.183 | 2.777 | 2.642 |
| 3 | −4.658 | −1.209 | 2.824 | 2.643 |
| 4 | −4.618 | −1.191 | 2.809 | 2.639 |
| 5 | −4.529 | −1.172 | 2.758 | 2.636 |
| 822 | −4.493 | −1.134 | 2.776 | 2.480 |
| 823 | −4.642 | −1.242 | 2.784 | 2.647 |

Referring to the results shown in Table 1, the organometallic compound represented by Formula 1 was found to have suitable electrical characteristics for use as a dopant in an electronic device, e.g., an organic light-emitting device.

A method of synthesizing the organometallic compound represented by Formula 1 may be apparent to one of ordinary skill in the art by referring to Synthesis Examples provided herein.

The organometallic compound represented by Formula 1 may be suitable for use in an organic layer of an organic light-emitting device, e.g., as a dopant in the organic layer. Thus, according to another aspect, there is provided an organic light-emitting device that may include a first electrode; a second electrode; and an organic layer disposed between the first electrode and the second electrode and including an emission layer, wherein the organic layer may include at least one organometallic compound represented by Formula 1.

Since the organic light-emitting device has an organic layer including the organometallic compound represented by Formula 1, the organic light-emitting device may have a low driving voltage, high external quantum efficiency, and a low roll-off ratio.

The organometallic compound represented by Formula 1 may be used between a pair of electrodes of an organic light-emitting device. For example, the organometallic compound represented by Formula 1 may be included in the emission layer. In this embodiment, the organometallic compound may serve as a dopant and the emission layer may further include a host (that is, an amount of the organometallic compound represented by Formula 1 may be smaller than that of the host). The emission layer may emit red light or green light.

As used herein, the expression the "(organic layer) includes at least one organometallic compound" may be construed as meaning the "(organic layer) may include one organometallic compound of Formula 1 or two different organometallic compounds of Formula 1".

For example, Compound 1 may only be included in the organic layer as an organometallic compound. In this embodiment, Compound 1 may be included in the emission layer of the organic light-emitting device. In some embodiments, Compounds 1 and 2 may be included in the organic layer as organometallic compounds. In this embodiment, Compounds 1 and 2 may both be included in the same layer (for example, both Compounds 1 and 2 may be included in the emission layer).

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region disposed between the first electrode and the emission layer and an electron transport region disposed between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single and/or a plurality of layers disposed between the first electrode and the second electrode in an organic light-emitting device. The "organic layer" may include not only organic compounds but also organometallic complexes including metals.

The FIGURE illustrates a schematic cross-sectional view of an organic light-emitting device 10 according to an embodiment. Hereinafter, a structure of an organic light-emitting device according to one or more embodiments and a method of manufacturing the organic light-emitting device will be described with reference to the FIGURE. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by depositing or sputtering, onto the substrate, a material for forming the first electrode 11. The first electrode 11 may be an anode. The material for forming the first electrode 11 may include a material with a high work function for easy hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO.

The organic layer 15 may be on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum-deposition, for example, the vacuum deposition may be performed at a temperature in a range of about 100° C. to about 500° C., at a vacuum degree in a range of about $10^{-8}$ torr to about 10-3 torr, and at a rate in a range of about 0.01 Angstroms per second (Å/sec) to about 100 Å/sec, though the conditions may vary depending on a compound used as a hole injection material and a structure and thermal properties of a desired hole injection layer.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer.

The conditions for forming a hole transport layer and an electron blocking layer may be inferred from the conditions for forming the hole injection layer.

The hole transport region may include at least one of m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor-sulfonic acid (PANI/CSA), polyaniline/poly(4-styrene sulfonate) (PANI/PSS), a compound represented by Formula 201, a compound represented by Formula 202, or a combination thereof:

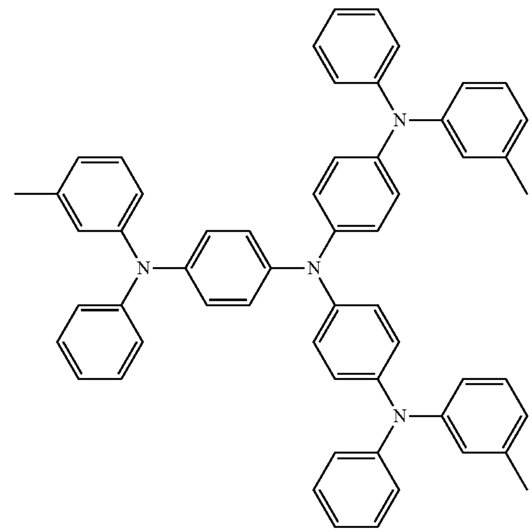

m-MTDATA

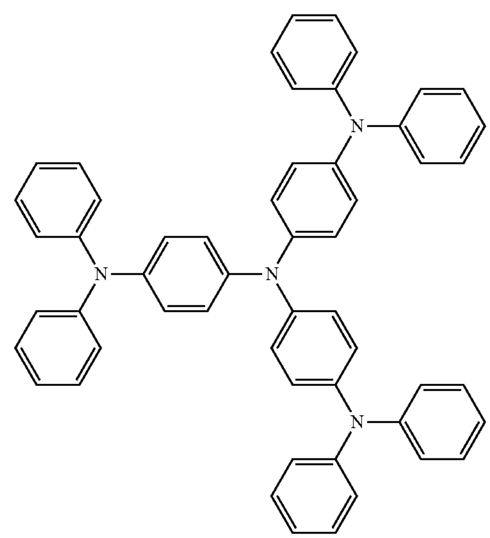

TDATA

-continued
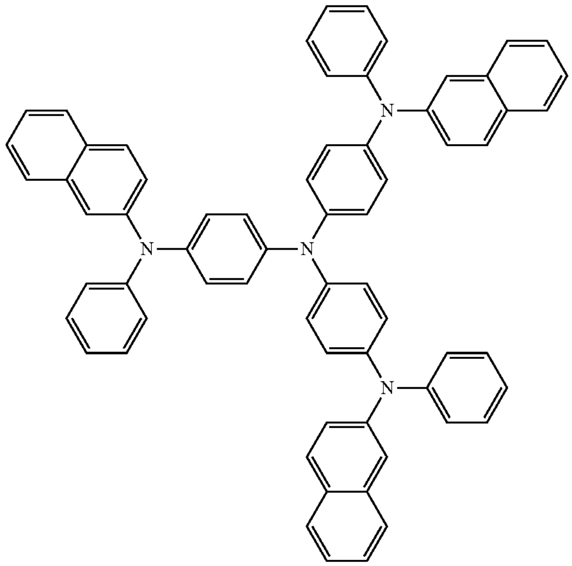
2-TNATA
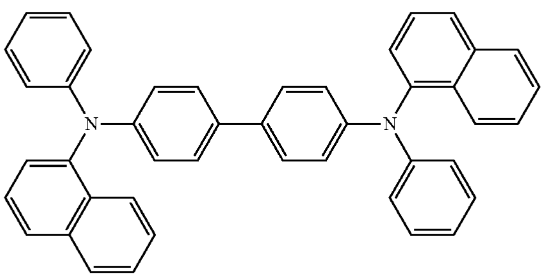
NPB
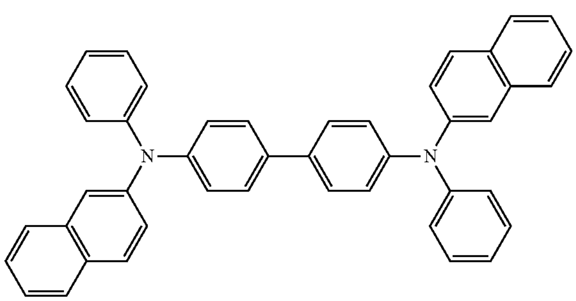
β-NPB
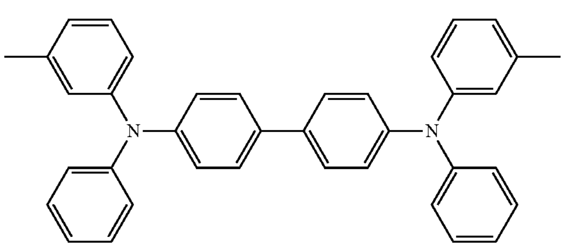
TPD
-continued
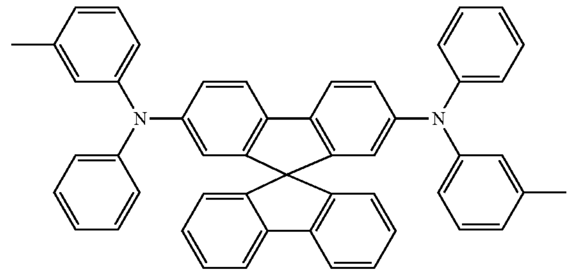
Spiro-TPD
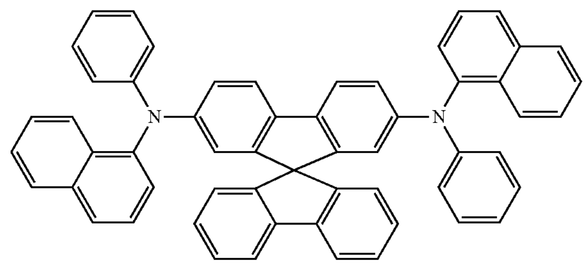
Spiro-NPB
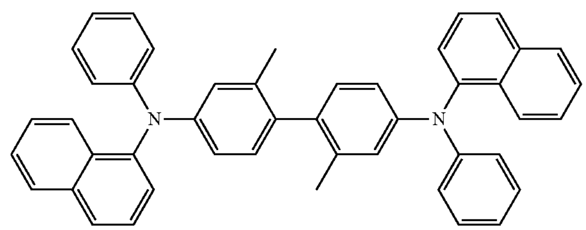
methylated NPB
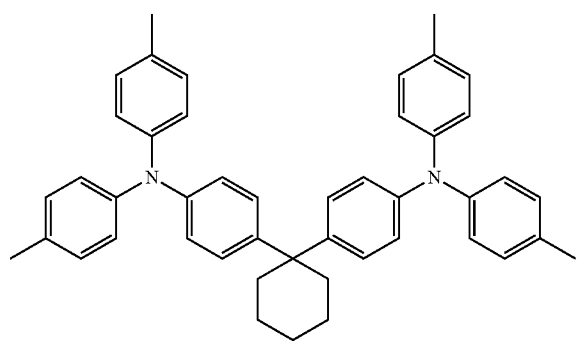
TAPC
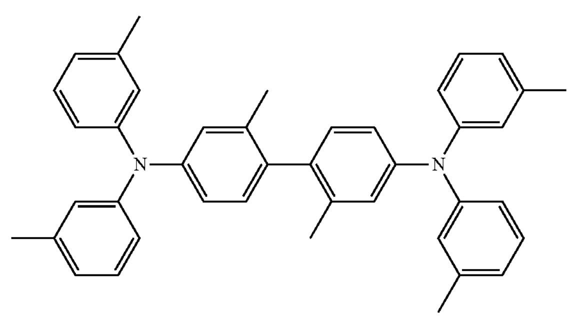
HMTPD -continued Formula 201

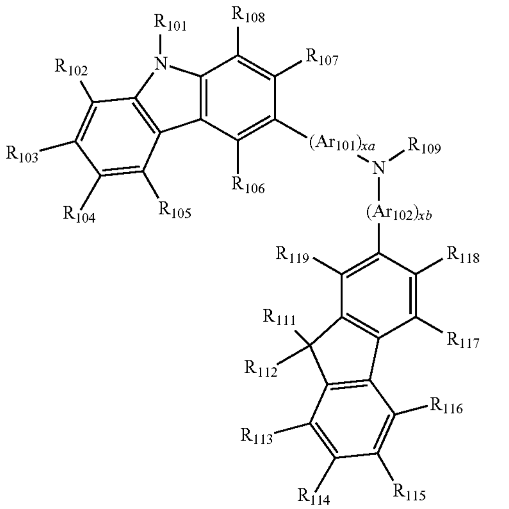

Formula 202

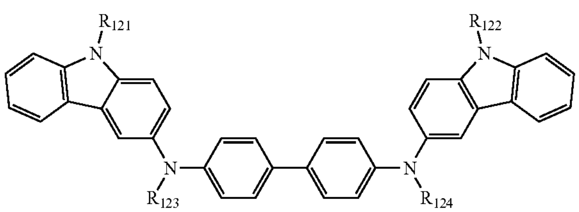

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

In Formula 201, xa and xb may each independently be an integer from 0 to 5. In some embodiments, xa and xb may each independently be an integer from 0 to 2. In some embodiments, xa may be 1, and xb may be 0.

In Formulae 201 and 202, $R_{101}$ to $R_{108}$, $R_{111}$ to $R_{119}$, and $R_{121}$ to $R_{124}$ may each independently be: hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group or a $C_1$-$C_{10}$ alkoxy group, each substituted with deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or a combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In some embodiments, the compound represented by Formula 201 may be represented by Formula 201A:

Formula 201A

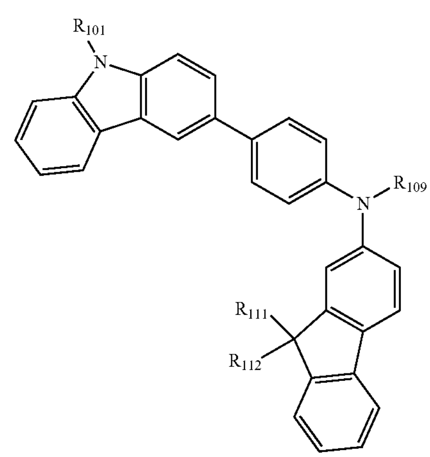

wherein, in Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In some embodiments, the hole transport region may include at least one of Compounds HT1 to HT20:

-continued
HT1
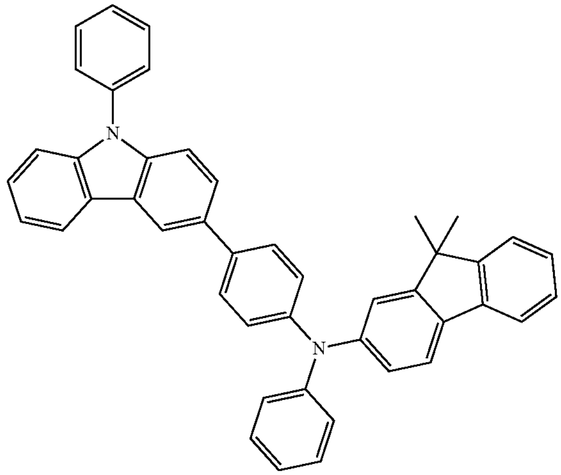
HT2
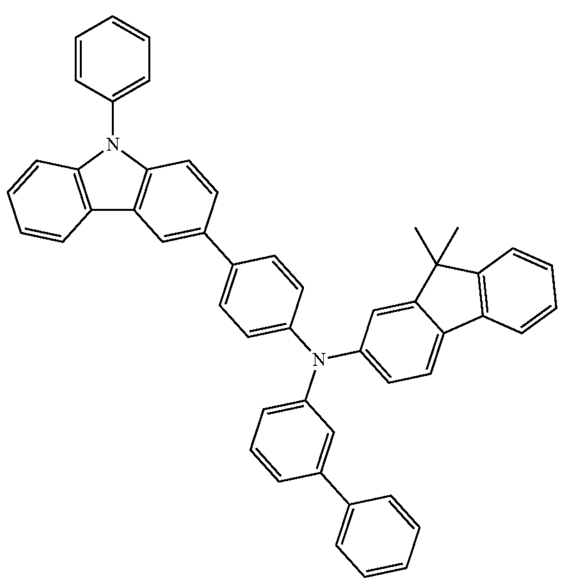
HT3
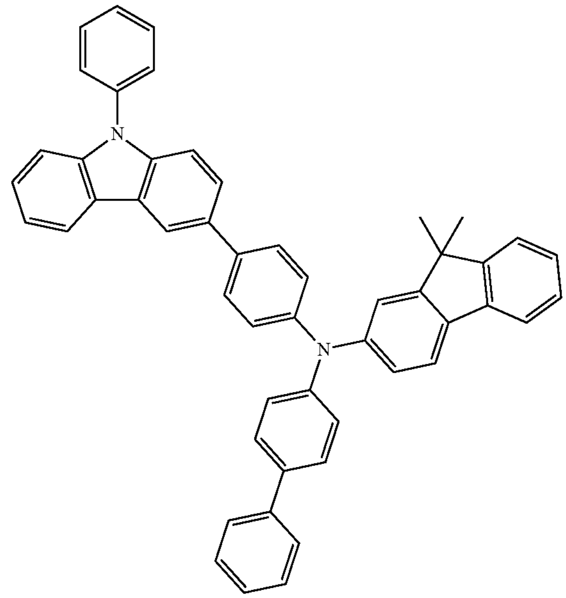
HT4
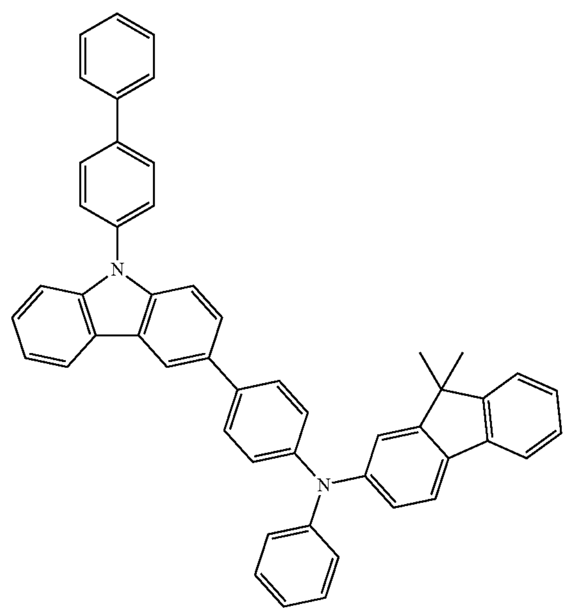

-continued
HT5
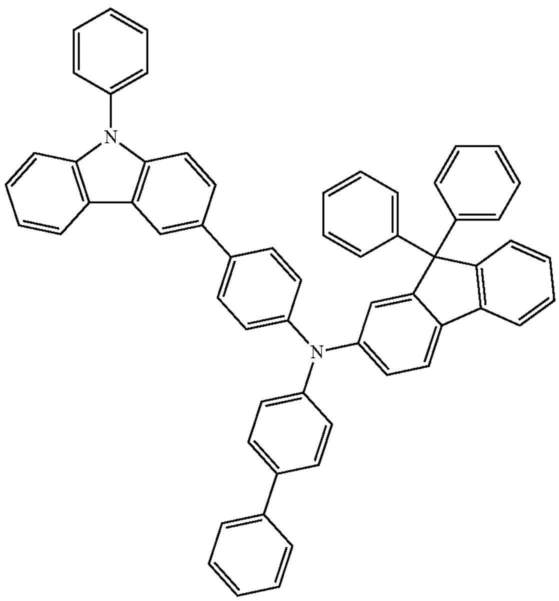
HT6
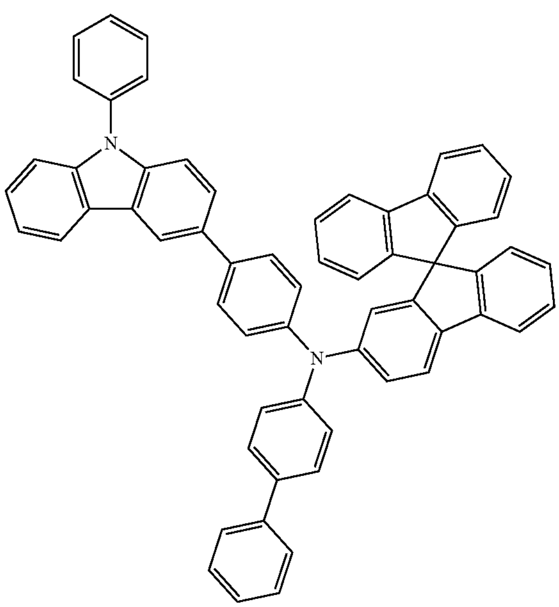
-continued
HT7
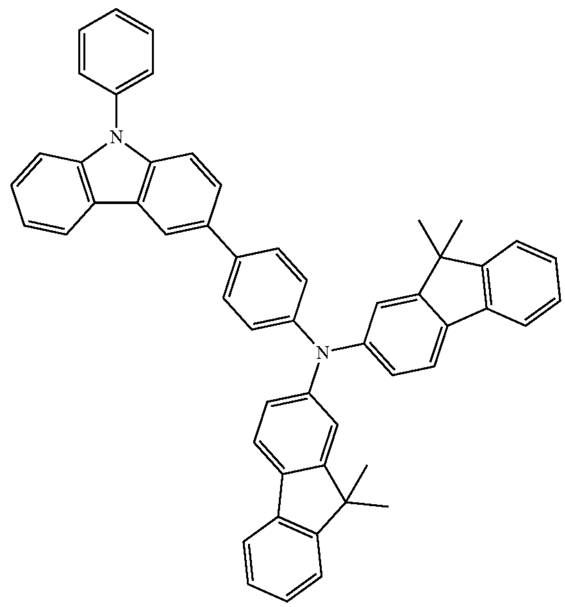
HT8
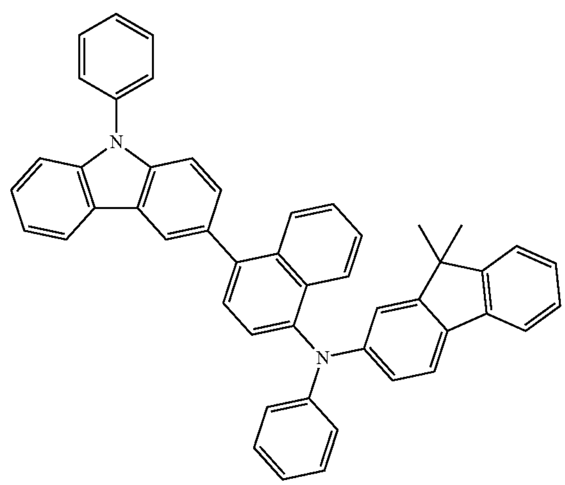
HT9
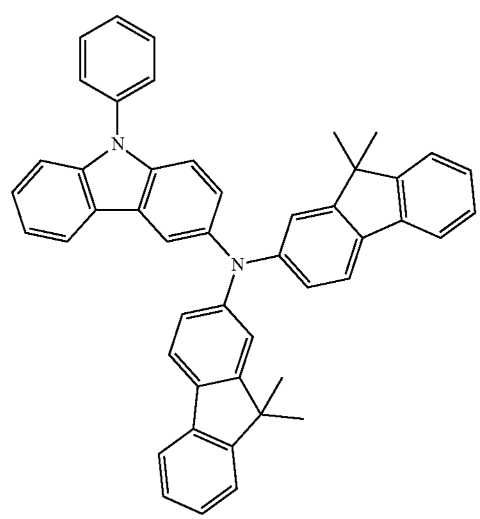

-continued
HT10
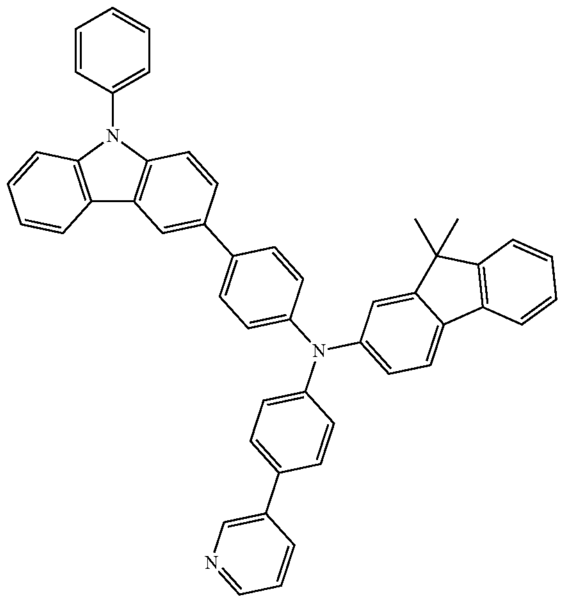
HT11
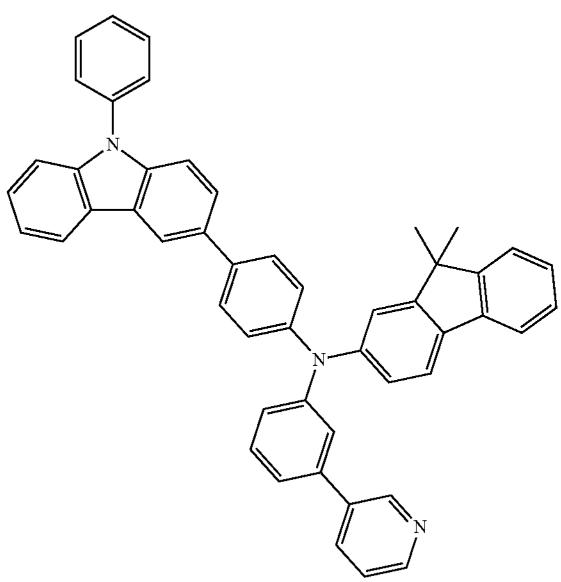
-continued
HT12
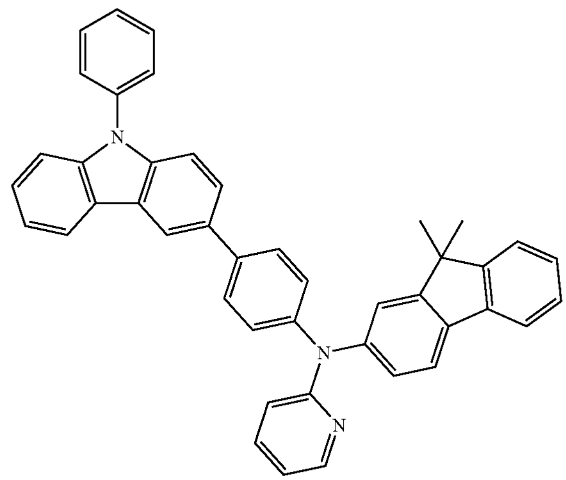
HT13
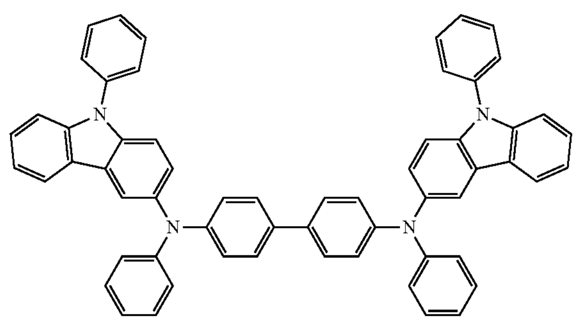
HT14
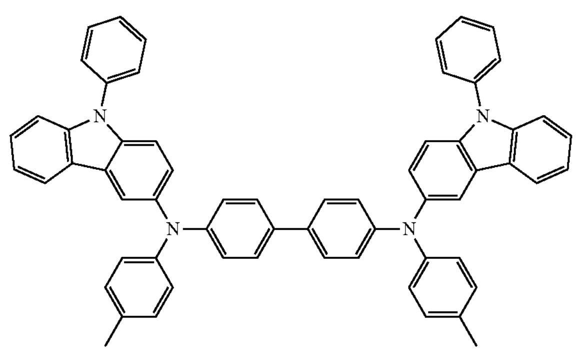
HT15
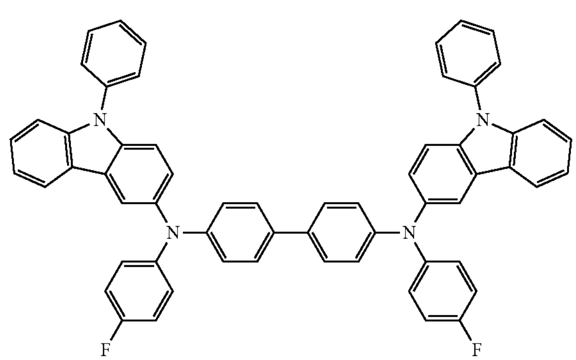

-continued

HT16

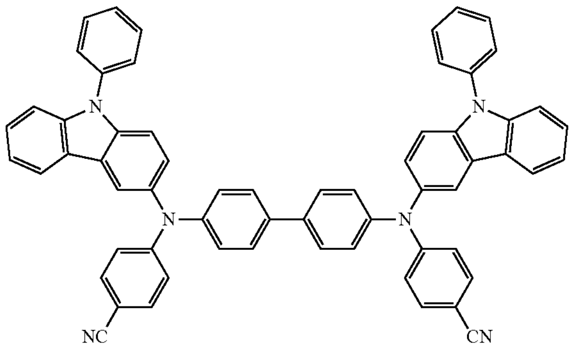

HT17

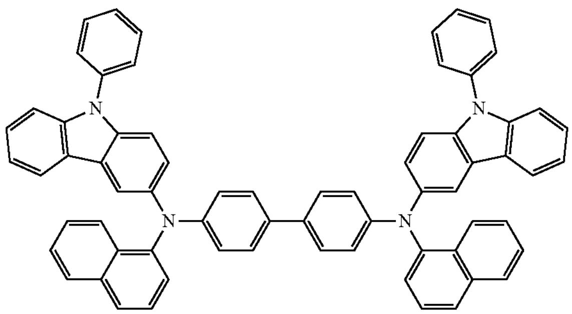

HT18

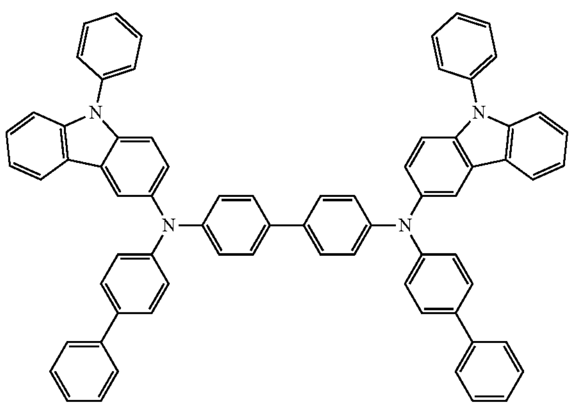

HT19

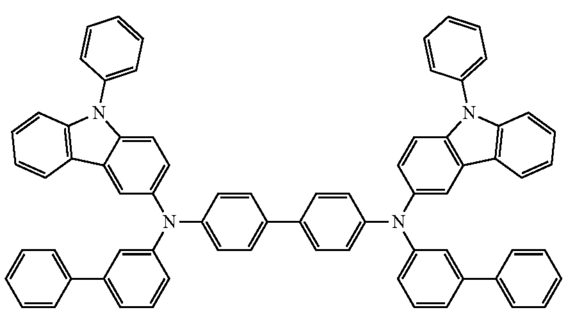

-continued

HT20

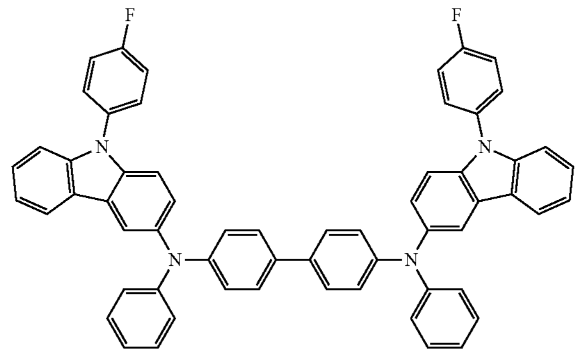

The thickness of the hole transport region may be in a range of about 100 Angstroms (Å) to about 10,000 Å, for example, about 100 Å to about 1,000 Å. When the hole transport region includes a hole injection layer, a hole transport layer, or a combination thereof, the thickness of the hole injection layer may be in a range of about 100 Å to about 10,000 Å, for example, about 100 Å to about 1,000 Å, the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may include one of a quinone derivative, a metal oxide, and a compound containing a cyano group. For example, non-limiting examples of the p-dopant include a quinone derivative, such as tetracyanoquinodimethane (TCNQ), 2,3,5,6-tetrafluoro-tetracyano-1,4-benzoquinonedimethane (F4-TCNQ), or F6-TCNNQ; a metal oxide, such as a tungsten oxide or a molybdenum oxide; and a compound containing a cyano group, such as Compound HT-D1:

HT-D1

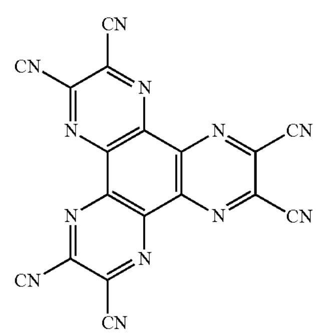

-continued

F4-TCNQ

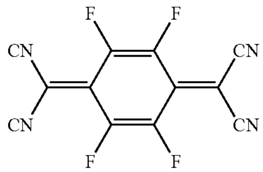

F6-TCNNQ

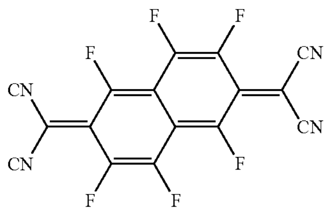

The hole transport region may further include a buffer layer.

The buffer layer may compensate for an optical resonance distance depending on a wavelength of light emitted from the emission layer to improve the efficiency of an organic light-emitting device.

When the hole transport region includes an electron blocking layer, a material for forming the electron blocking layer may include the material for forming a hole transport region, the host material described herein, or a combination thereof. In some embodiments, when the hole transport region includes an electron blocking layer, mCP described herein may be used for forming the electron blocking layer.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to those conditions for forming a hole injection layer, though the conditions may vary depending on a compound that is used.

The emission layer may include a host and a dopant, and the dopant may include the organometallic compound represented by Formula 1.

The host may include TPBi, TBADN, ADN (also known as "DNA"), CBP, CDBP, TCP, mCP, Compound H50, Compound H51, or a combination thereof:

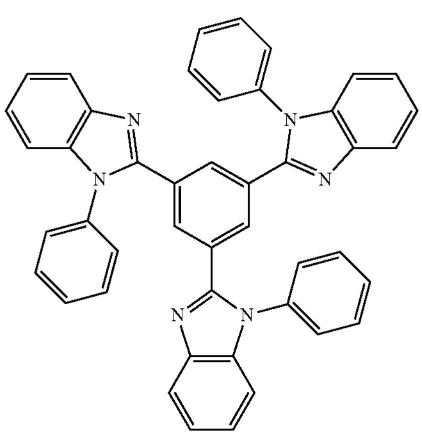

TPBi

-continued

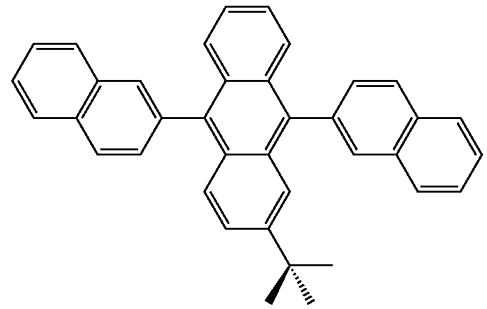

TBADN

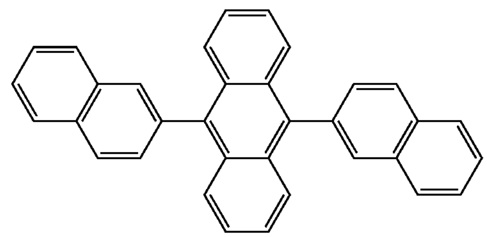

ADN

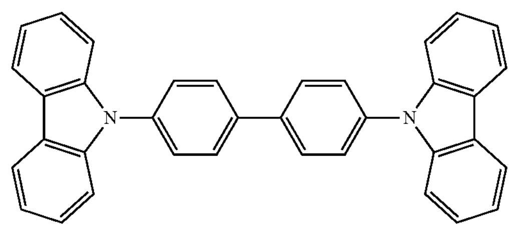

CBP

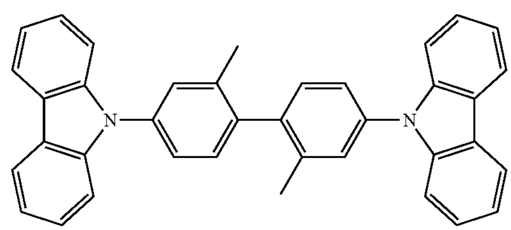

CDBP

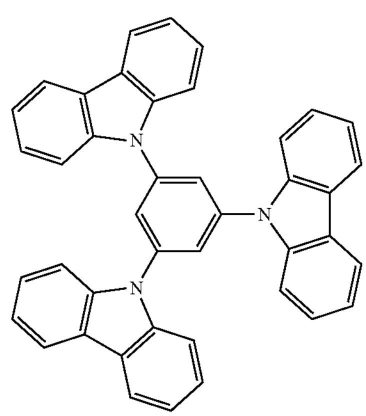

TCP

-continued

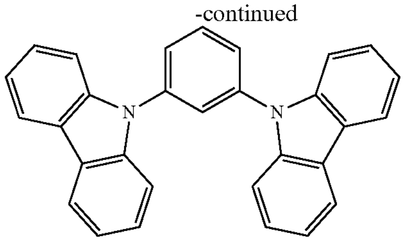

mCP

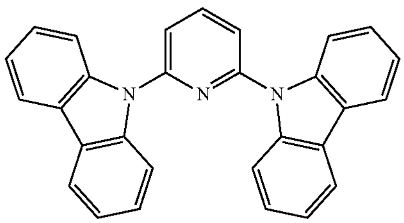

H50

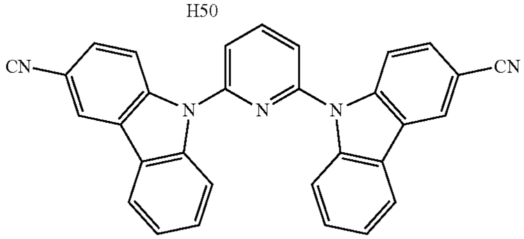

H51

When the organic light-emitting device 10 is a full-color organic light-emitting device, the emission layer may be patterned into a red emission layer, a green emission layer, and/or a blue emission layer. In some embodiments, the emission layer may have a structure in which the red emission layer, the green emission layer, and/or the blue emission layer are layered to emit white light. In some embodiments, the structure of the emission layer may vary.

When the emission layer includes the host and the dopant, an amount of the dopant may be in a range of about 0.01 parts to about 15 parts by weight based on about 100 parts by weight of the host.

The dopant may be the organometallic compound represented by Formula 1 described herein. In some embodiments, the dopant may be a green phosphorescent dopant.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

An electron transport region may be over the emission layer.

The electron transport region may include a hole blocking layer, an electron transport layer, an electron injection layer, or a combination thereof.

In some embodiments, the electron transport region may have a hole blocking layer/an electron transport layer/an electron injection layer structure or an electron transport layer/an electron injection layer structure. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, BCP, BPhen, BAlq or a combination thereof:

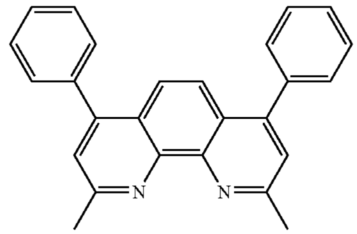

BCP

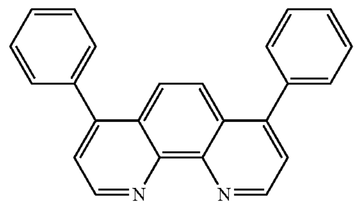

Bphen

The thickness of the hole blocking layer may be in a range of about 20 Å to about 1,000 Å, for example, about 30 Å to about 300 Å. When the thickness of the hole blocking layer is within any of these ranges, excellent hole blocking characteristics may be obtained without a substantial increase in driving voltage.

The electron transport layer may include BCP, BPhen, $Alq_3$, BAq, TAZ, NTAZ, or a combination thereof:

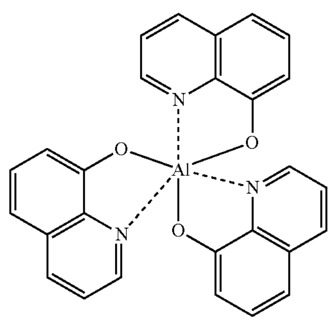

$Alq_3$

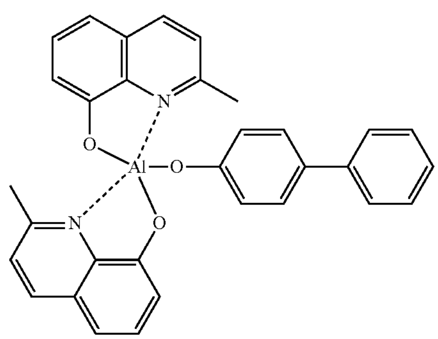

BAlq

-continued
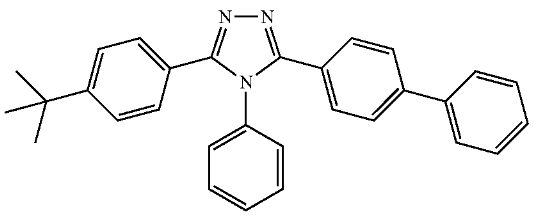
TAZ
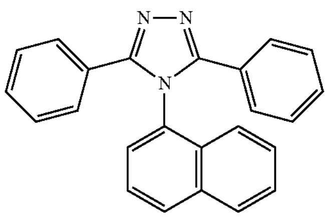
NTAZ
In some embodiments, the electron transport layer may include at least one of Compounds ET1 to ET25:
ET1
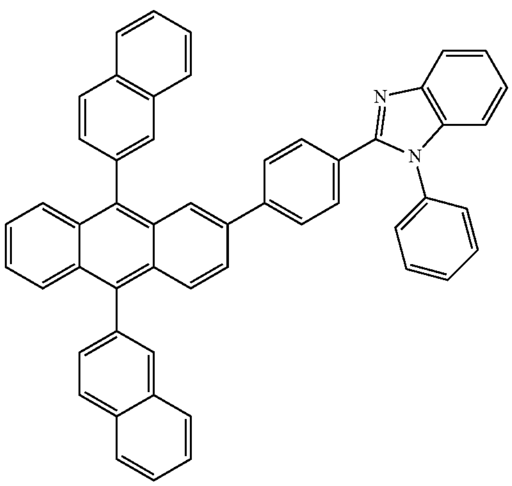
ET2
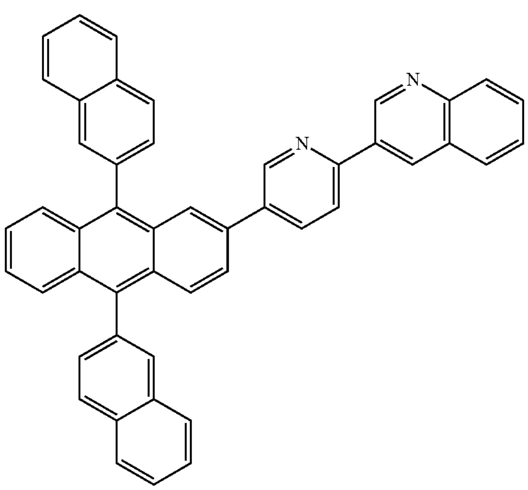
-continued
ET3
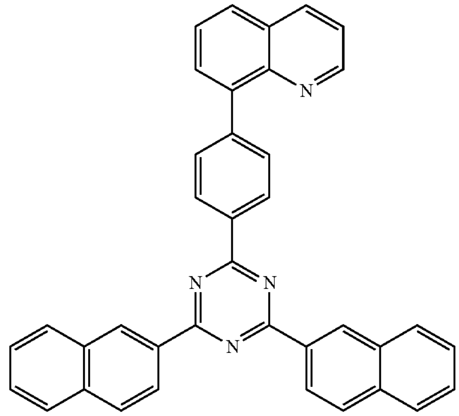
ET4
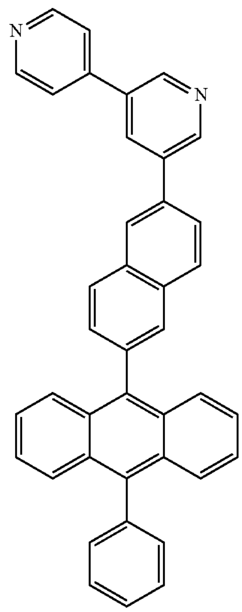
ET5
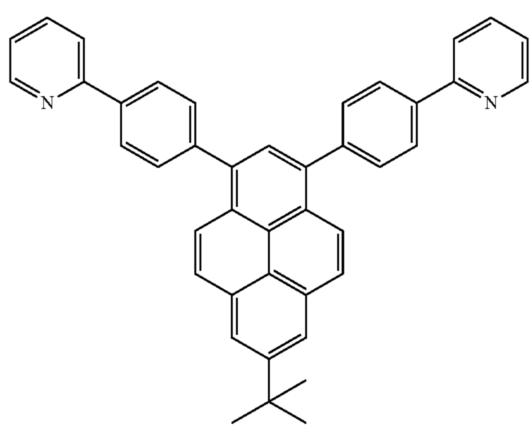

ET6
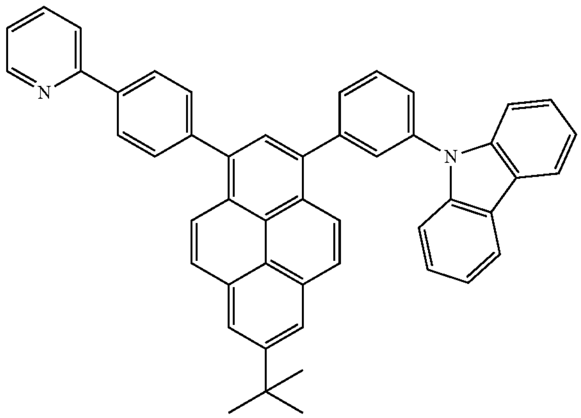
ET7
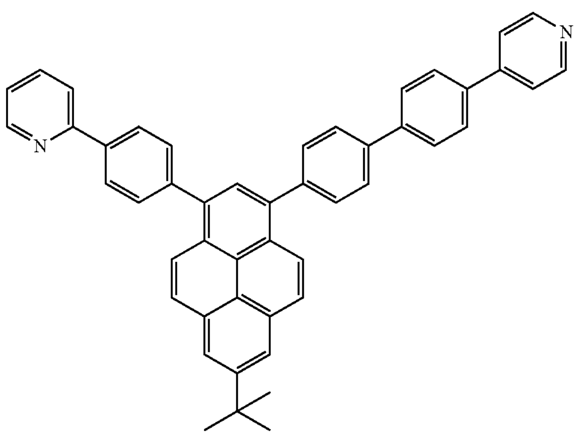
ET8
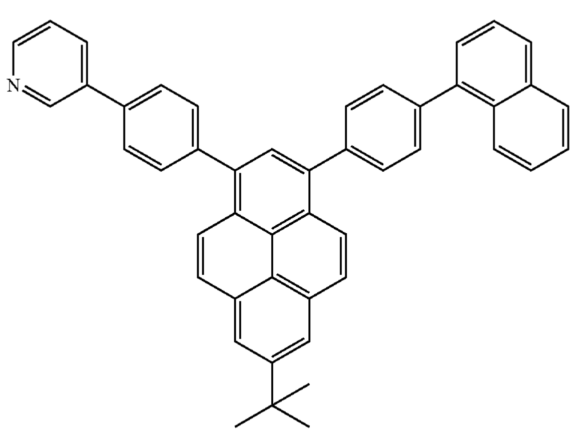
ET9
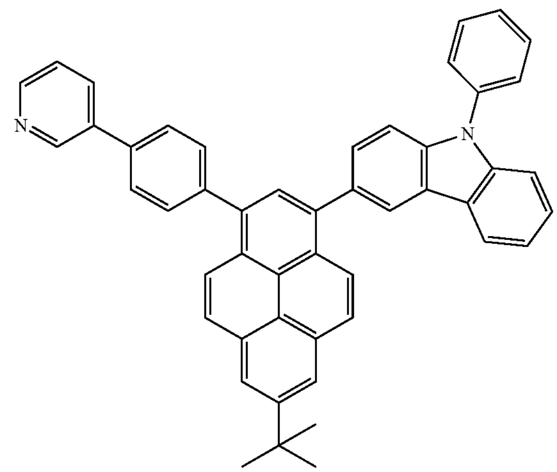
ET10
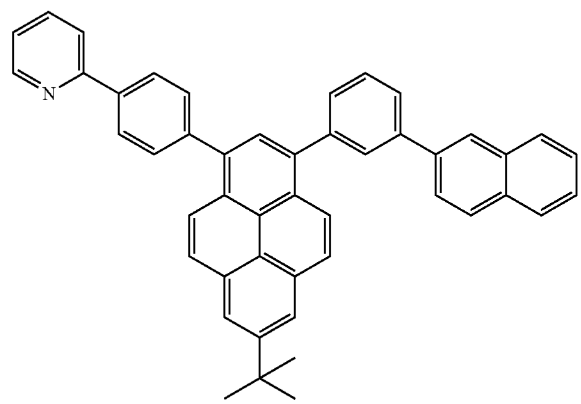
ET11
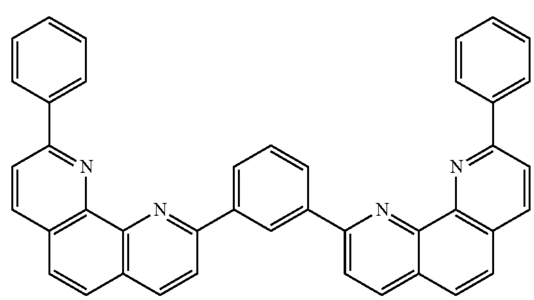
ET12
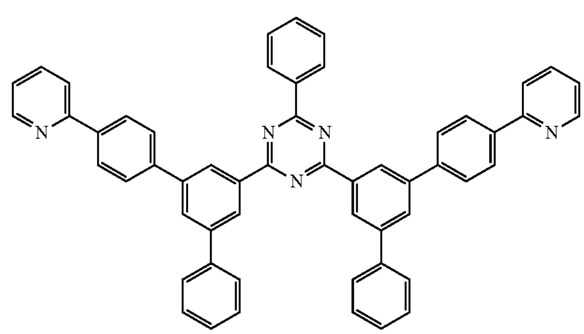

-continued
ET13
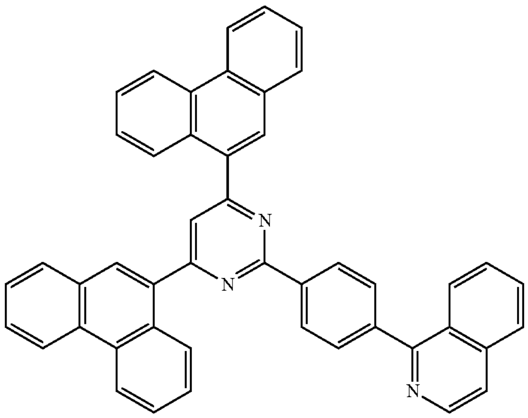
ET14
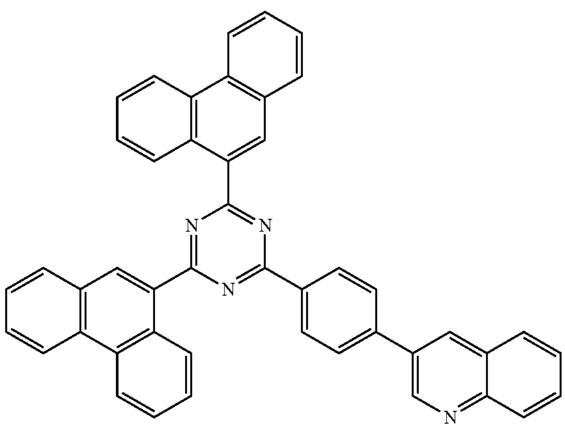
ET15
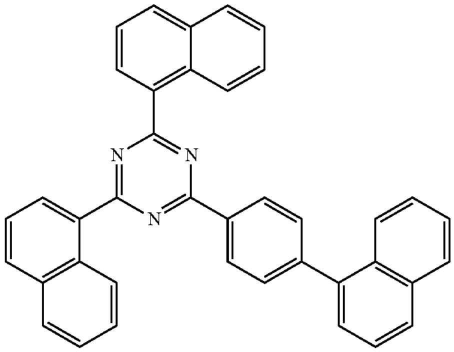
-continued
ET16
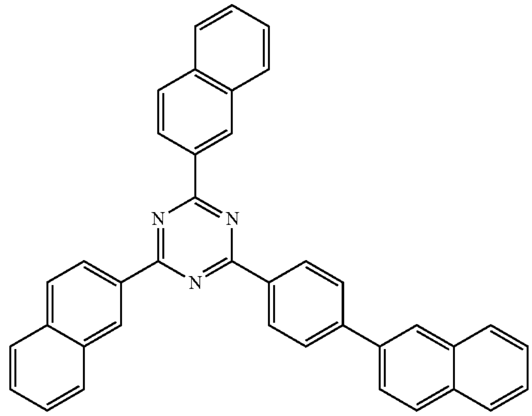
ET17
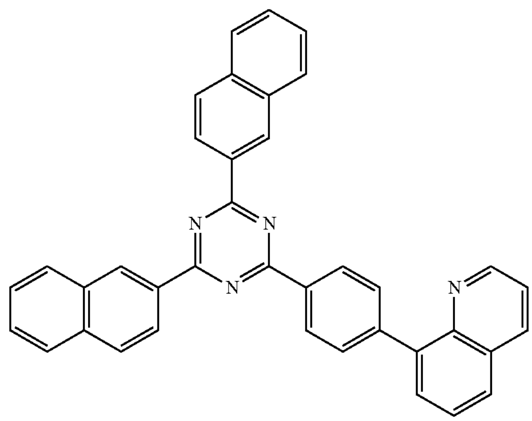
ET18
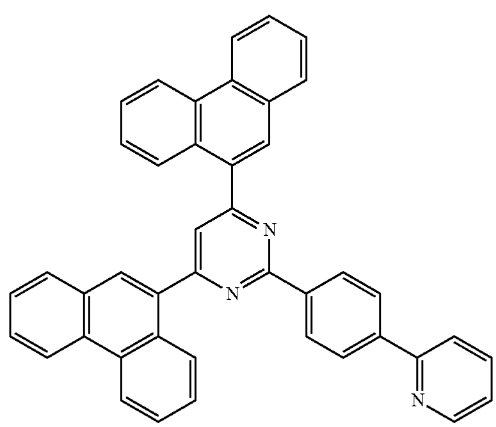

-continued
ET19
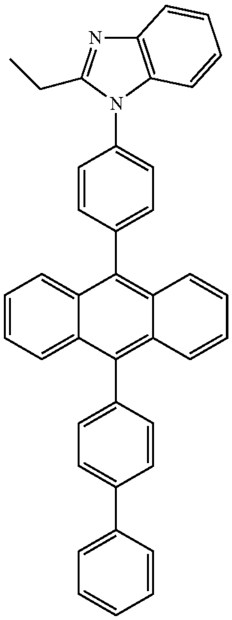
ET20
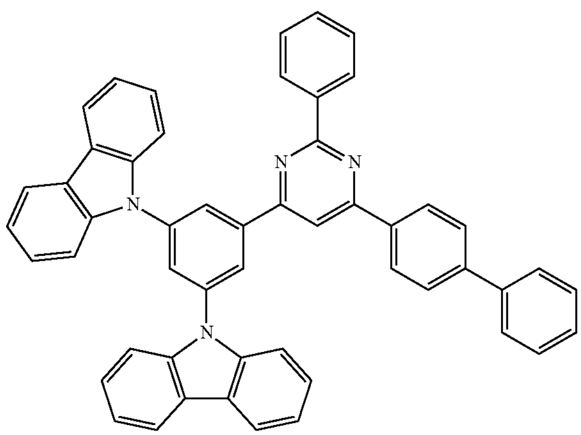
ET21
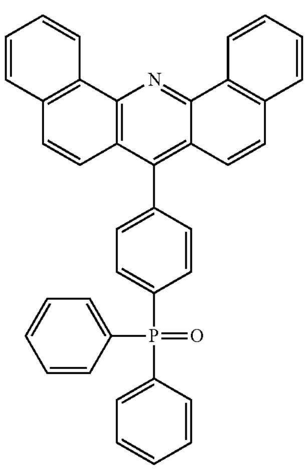
-continued
ET22
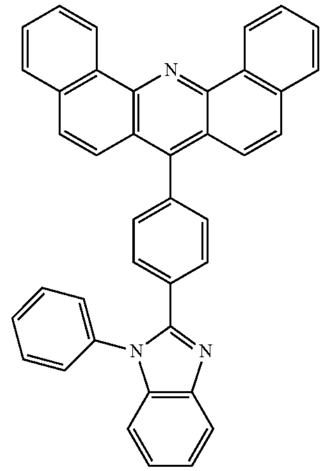
ET23
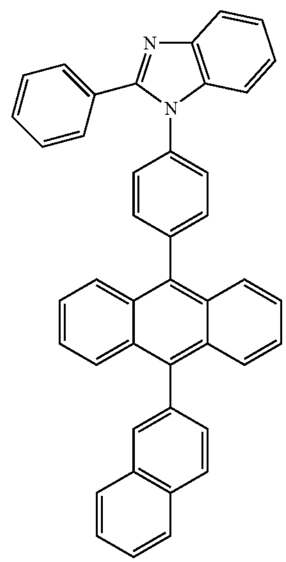
ET24
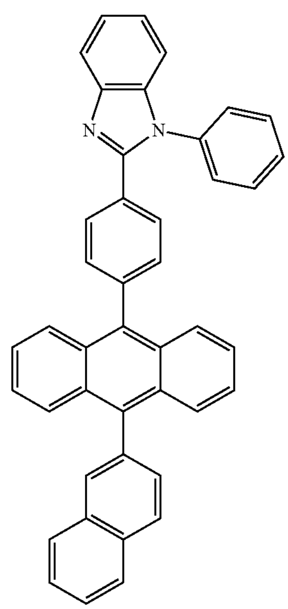

-continued

ET25

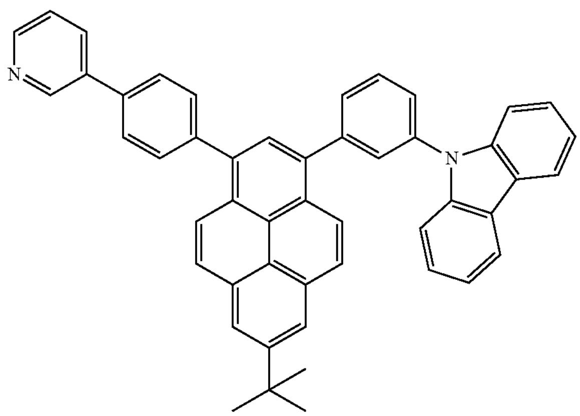

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a Li complex. The Li complex may include, e.g., Compound ET-D1 (LiQ) or Compound ET-D2:

ET-D1

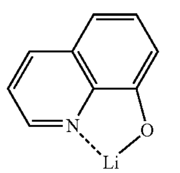

ET-D2

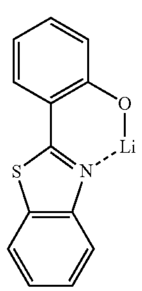

The electron transport region may include an electron injection layer that facilitates electron injection from the second electrode 19.

The electron injection layer may include LiF, NaCl, CsF, $Li_2$, BaO, or a combination thereof.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, or a mixture thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to the FIGURE, but embodiments are not limited thereto.

According to an aspect of another embodiment, an electronic apparatus including the organic light-emitting device may be provided. The electronic apparatus may be used for various purposes such as a display, lighting, and a mobile phone.

According to an aspect of still another embodiment, a diagnostic composition may include at least one organometallic compound represented by Formula 1.

Since the organometallic compound represented by Formula 1 provides high luminescence efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

The term "$C_1$-$C_{60}$ alkyl group" as used herein refers to a linear or branched saturated aliphatic hydrocarbon monovalent group having 1 to 60 carbon atoms. The term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or a combination thereof. In some embodiments, Formula 9-33 may be a branched C alkyl group. Formula 9-33 may be a tert-butyl group substituted with two methyl groups.

The term "$C_1$-$C_{60}$ alkoxy group" as used herein refers to a monovalent group represented by —$OA_{101}$ (wherein $A_{101}$ is a $C_1$-$C_{60}$ alkyl group).

Examples of the $C_1$-$C_{60}$ alkoxy group, the $C_1$-$C_{20}$ alkoxy group, or the $C_1$-$C_{10}$ alkoxy group as used herein may include a methoxy group, an ethoxy group, a propoxy group, a butoxy group, or a pentoxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent cyclic saturated hydrocarbon group including 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, or a bicyclo[2.2.2]octyl group.

The term "$C_1$-$C_{10}$ heterocycloalkyl group" as used herein refers to a monovalent monocyclic group including at least one heteroatom that can be N, O, P, Si, Se, Ge, B, or S as a ring-forming atom and 1 to 10 carbon atoms. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom that is N, O, P, Si, Se, Ge, B, or S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having at least one heteroatom that is N, O, P, Si, Se, Ge, B, or S as a ring-forming atom and 1 to 60 carbon atoms. The term "$C_1$-$C_{60}$ heteroarylene group" as used herein refers to a divalent group having a heterocyclic aromatic system having at least one heteroatom that is N, O, P, Si, Se, Ge, B, or S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group). The term "$C_1$-$C_{60}$ alkylthio group" as used herein is represented by —$SA_{104}$ (wherein $A_{104}$ is the $C_1$-$C_{60}$ alkyl group).

The term "$C_1$-$C_{60}$ heteroaryloxy group" as used herein refers to —$OA_{106}$ (wherein $A_{106}$ is the $C_1$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{106}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom that is N, O, P, Si, Se, Ge, B, or S and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a norbornane group (a bicyclo[2.2.1]heptane group), a bicyclo[1.1.1]pentane group, a bicyclo[2.1.1]hexane group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, or a fluorene group, each (unsubstituted or substituted with at least one $R_{10a}$).

The term "$C_1$-$C_{30}$ heterocyclic group" as used herein refers to saturated or unsaturated cyclic group including 1 to 30 carbon atoms and at least one heteroatom that is N, O, P, Si, Se, Ge, B, or S as ring-forming atoms. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophenegroup, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$).

The "deuterated $C_1$-$C_{60}$ alkyl group (or, deuterated $C_1$-$C_{20}$ alkyl group, deuterated $C_2$-$C_{20}$ alkyl group, or the like)" as used herein refers to a $C_1$-$C_{60}$ alkyl group substituted with at least one deuterium (or, a $C_1$-$C_{20}$ alkyl group substituted with at least one deuterium, a $C_2$-$C_{20}$ alkyl group substituted with at least one deuterium, or the like). Examples of the "deuterated $C_1$ alkyl group (e.g., a deuterated a methyl group)" include —$CD_3$, —$CD_2H$, and —$CDH_2$.

The "deuterated $C_3$-$C_{10}$ cycloalkyl group" as used herein refers to a $C_3$-$C_{10}$ cycloalkyl group substituted with at least one deuterium. Examples of the "deuterated $C_3$-$C_{10}$ cycloalkyl group" include Formula 10-501.

The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" may include —$CF_3$, —$CF_2H$, and —$CFH_2$. The "fluorinated $C_1$-$C_{60}$ alkyl group (or fluorinated $C_1$-$C_{20}$ alkyl group or the like)", "fluorinated $C_3$-$C_{10}$ cycloalkyl group", or "fluorinated $C_1$-$C_{60}$ heterocycloalkyl group" may respectively be: i) a fully fluorinated $C_1$-$C_{60}$ alkyl group (or fully fluorinated $C_1$-$C_{20}$ alkyl group or the like), fully fluorinated $C_3$-$C_{10}$ cycloalkyl group, or fully fluorinated $C_1$-$C_{60}$ heterocycloalkyl group, in which all hydrogen atoms are substituted with fluoro groups; or ii) a partially fluorinated $C_1$-$C_{60}$ alkyl group (or partially fluorinated $C_1$-$C_{20}$ alkyl group or the like), partially fluorinated $C_3$-$C_{10}$ cycloalkyl group, or partially fluorinated $C_1$-$C_{60}$ heterocycloalkyl group, in which some of hydrogen atoms are substituted with fluoro groups.

The "($C_1$-$C_{20}$ alkyl)'X' group" refers to a 'X' group substituted with at least one $C_1$-$C_{20}$ alkyl group. For example, The "($C_1$-$C_{20}$ alkyl)$C_3$-$C_{60}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

As used herein, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a heterocyclic ring in which at least one ring-forming carbon atom is replaced with a nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alklythio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$S(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof.

In the formulae of the present disclosure, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{60}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group, a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

Hereinafter, an exemplary compound and an exemplary organic light-emitting device according to one or more embodiments will be described in detail with reference to Synthesis Examples and Examples. However, the present disclosure is not limited thereto. The wording "compound B was used instead of compound A" used in describing Synthesis Examples means that an amount of compound B used was identical to an amount of compound A used based on molar equivalence, wherein components A and B are not the same.

EXAMPLES

Synthesis Example 1(Synthesis of Compound 1)

The synthesis of Compound 1 is shown in Scheme 1.

Scheme 1

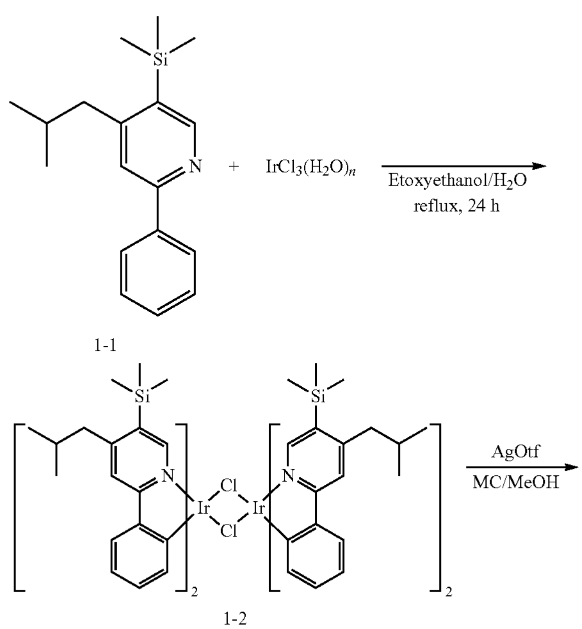

-continued

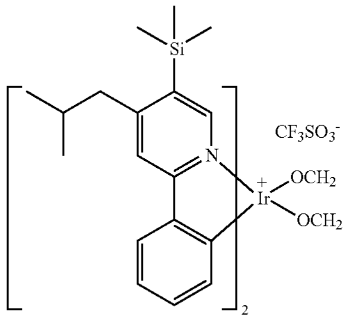

1-3

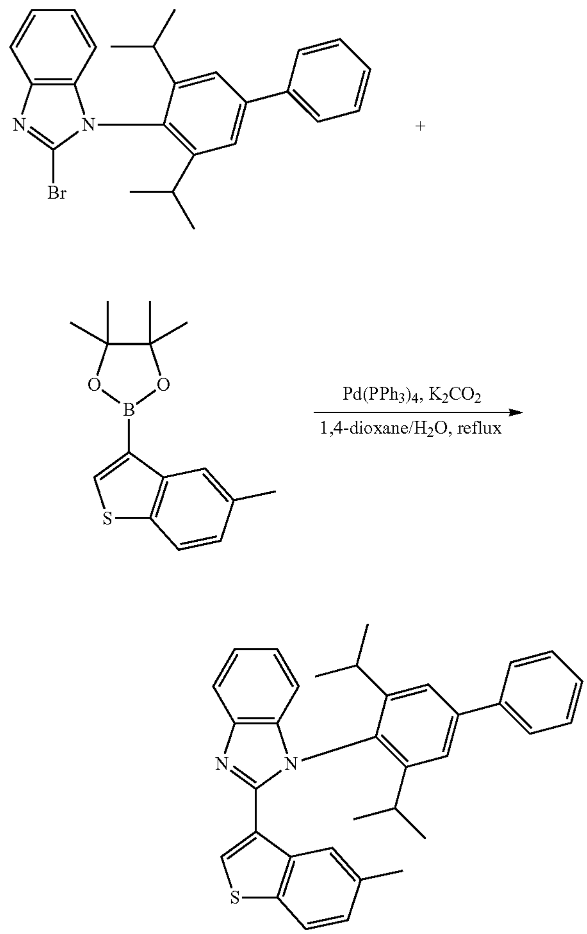

1-4

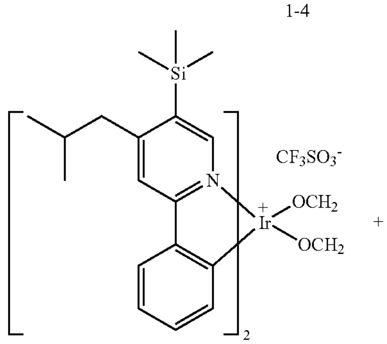

1-3

-continued

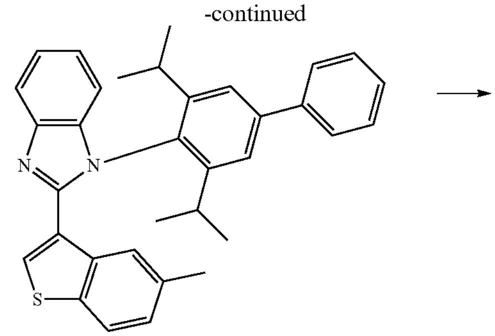

1-4

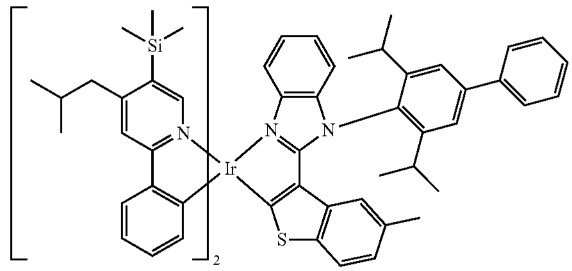

1

Synthesis of Compound 1-2

10 grams (g) (35.33 millimoles, mmol) of Compound 1-1 and 6.17 g (17.50 mmol) of iridium chloride were mixed with 90 milliliters (mL) of ethoxyethanol and 30 mL of distilled water. Then, the mixture was stirred under reflux for 24 hours, and then the temperature was dropped to room temperature. A solid was formed therefrom and separated by filtration. The solid was sufficiently washed with water, methanol, and hexane in this stated order and dried in a vacuum oven to thereby obtain 11.5 g of Compound 1-2 (83%).

Synthesis of Compound 1-3

45 mL of methylene chloride (MC) was mixed with 5.00 g (3.16 mmol) of Compound 1-2, and a mixture of 1.70 g (6.62 mmol) of silver triflate (AgOTf) and 15 mL of methanol was added thereto. Then, the mixture was stirred for about 18 hours at room temperature while blocking light by using an aluminum foil. The resultant was filtered using diatomaceous earth to remove a solid formed therefrom and filtered under reduced pressure to thereby obtain a solid (Compound 1-3). The solid was used in the following reaction without any further purification.

Synthesis of Compound 1-4

10 g (23.07 mmol) of 2-bromo-1-(3,5-diisopropyl-[1,1'-biphenyl]-4-yl)-1H-benzo[d]imidazole), 6.33 g (23.07 mmol) of 4,4,5,5-tetramethyl-2-(5-methylbenzo[b]thiophen-3-yl)-1,3,2-dioxaborolane, 0.80 g (0.69 mmol) of $Pd(PPh_3)_4$, and 15.94 g (117.27 mmol) of $K_2CO_3$ were mixed with 80 mL of 1,4-dioxane and 40 mL of distilled water. Then, the mixture was stirred for 18 hours under reflux. Once the temperature was dropped to room temperature, an organic layer was extracted using MC, and anhydrous magnesium sulfate ($MgSO_4$) was added thereto to dry the organic layer. The resultant was filtered, and the solvent in the resulting filtrate was removed under reduced pressure. The residual was purified through column chromatography using ethyl acetate (EA) and hexane at a ratio of 1:3 to thereby obtain 10.51 g of Compound 1-4 (91%).

Synthesis of Compound 1

5.00 g (5.15 mmol) of Compound 1-3 and 2.84 g (5.67 mmol) of Compound 1-4 were mixed with 50 mL of 2-ethoxyethanol and 50 mL of N,N-dimethylformamide. Then, the mixture was stirred under reflux for 18 hours at 120° C. to carry out the reaction. Then, the temperature was dropped. The resulting mixture was filtered to obtain a solid. Then, the solid was sufficiently washed with ethanol and hexane. Then, the solid was purified by column chromatography using EA and hexane at a ratio of 1:50 to thereby obtain 2.20 g of Compound 1 (31%). The resulting compound was identified by using mass spectroscopy and high-performance liquid chromatography (HPLC) analysis. HRMS(MALDI) calculated for $C_{70}H_{79}IrN_4SSi_2$: m/z 1256.5193, Found: 1256.5198.

Synthesis Example 2 (Synthesis of Compound 2)

The synthesis of Compound 2 is shown in Scheme 2.

Scheme 2

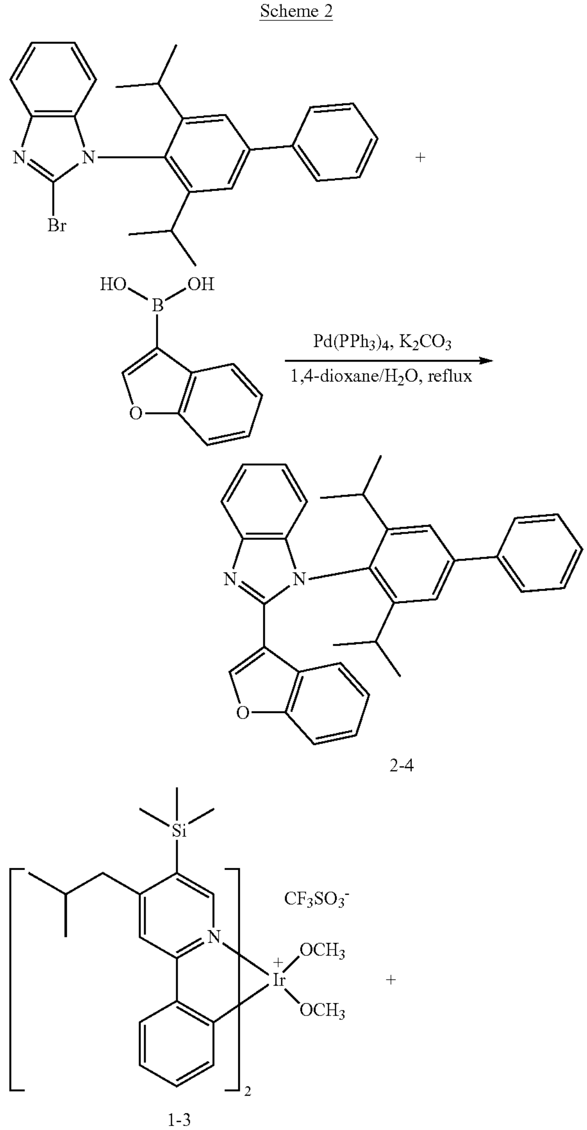

-continued

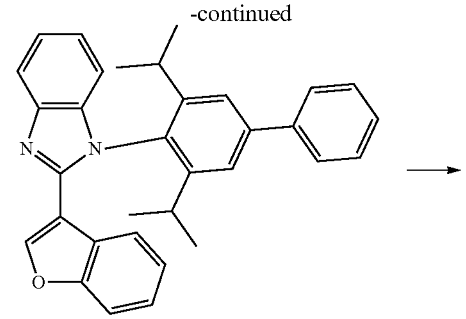

2-4

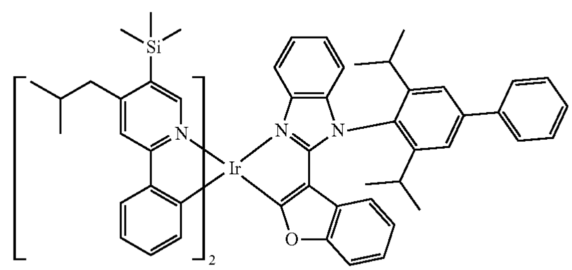

2

Synthesis of Compound 2-4

10 g (23.07 mmol) of 2-bromo-1-(3,5-diisopropyl-[1,1'-biphenyl]-4-yl)-1H-benzo[d]imidazole), 3.74 g (23.07 mmol) of benzofuran-3-ylboronic acid, 0.80 g (0.69 mmol) of $Pd(PPh_3)_4$, and 15.94 g (117.27 mmol) of $K_2CO_3$ were mixed with 80 mL of 1,4-dioxane and 40 mL of distilled water. Then, the mixture was stirred for 18 hours under reflux. Once the temperature was dropped to room temperature, an organic layer was extracted using MC, and anhydrous magnesium sulfate ($MgSO_4$) was added thereto to dry the organic layer. The resultant was filtered, and the solvent in the resulting filtrate was removed under reduced pressure. The residual was purified through column chromatography using EA and hexane at a ratio of 1:3 to thereby obtain 8.69 g of Compound 2-4 (80%).

Synthesis of Compound 2

3.00 g (3.09 mmol) of Compound 1-3 and 1.60 g (3.40 mmol) of Compound 2-4 were mixed with 50 mL of 2-ethoxyethanol and 50 mL of N,N-dimethylformamide. Then, the mixture was stirred under reflux for 18 hours at 120° C. to carry out the reaction. Then, the temperature was dropped. The resulting mixture was filtered to obtain a solid. Then, the solid was sufficiently washed with ethanol and hexane. Then, the solid was purified by column chromatography using EA and hexane at a ratio of 1:50 to thereby obtain 1.06 g of Compound 2 (28%). The resulting compound was identified by using mass spectroscopy and high-performance liquid chromatography (HPLC) analysis. HRMS(MALDI) calcd. for $C_{69}H_{77}IrN_4OSi_2$: m/z 1226.5265, Found: 1226.5269.

Synthesis Example 3 (Synthesis of Compound 3)

The synthesis of Compound 3 is shown in Scheme 3.

Scheme 3

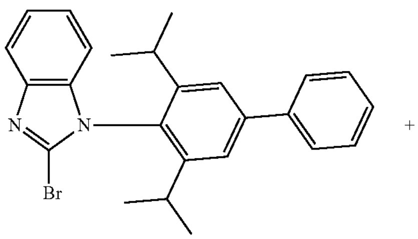

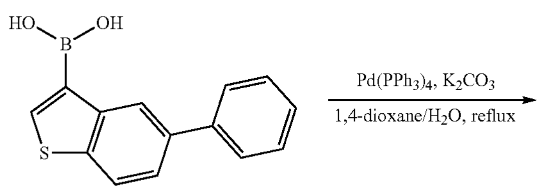

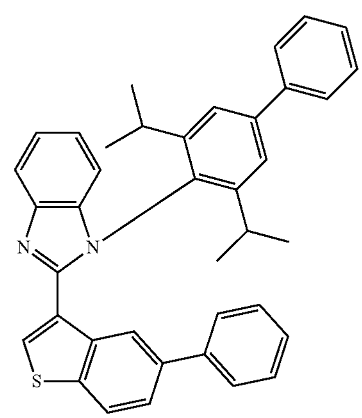

3-4

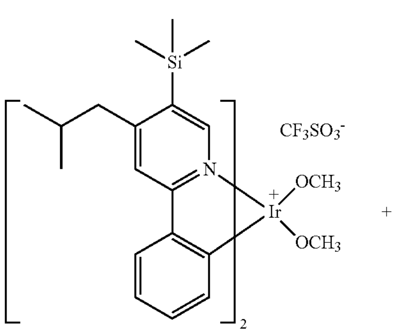

1-3

-continued

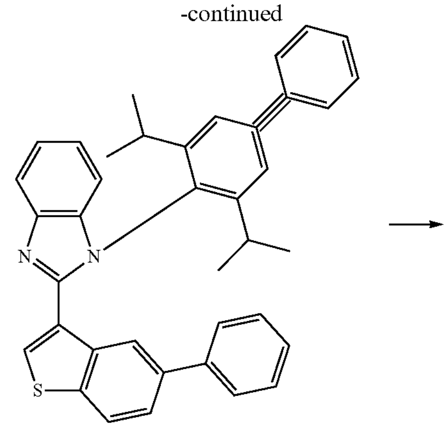

3-4

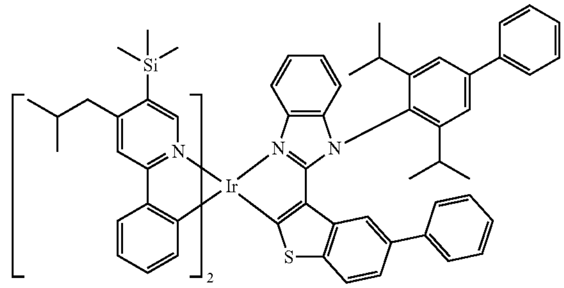

3

Synthesis of Compound 3-4

5 g (11.54 mmol) of 2-bromo-1-(3,5-diisopropyl-[1,1'-biphenyl]-4-yl)-1H-benzo[d]imidazole), 2.93 g (11.54 mmol) of 5-phenylbenzothiophene-3-ylboronic acid, 0.40 g (0.35 mmol) of $Pd(PPh_3)_4$, and 7.97 g (58.63 mmol) of $K_2CO_3$ were mixed with 80 mL of 1,4-dioxane and 40 mL of distilled water. Then, the mixture was stirred for 18 hours under reflux. Once the temperature was dropped to room temperature, an organic layer was extracted using MC, and anhydrous magnesium sulfate ($MgSO_4$) was added thereto to dry the organic layer. The resultant was filtered, and the solvent in the resulting filtrate was removed under reduced pressure. The residual was purified through column chromatography using EA and hexane at a ratio of 1:3 to thereby obtain 5.46 g of Compound 3-4 (84%).

Synthesis of Compound 3

2.20 g (2.27 mmol) of Compound 1-3 and 1.41 g (2.50 mmol) of Compound 3-4 were mixed with 50 mL of 2-ethoxyethanol and 50 mL of N,N-dimethylformamide. Then, the mixture was stirred under reflux for 18 hours at 120° C. to carry out the reaction. Then, the temperature was dropped. The resulting mixture was filtered to obtain a solid. Then, the solid was sufficiently washed with ethanol and hexane. Then, the solid was purified by column chromatography using EA and hexane at a ratio of 1:50 to thereby obtain 0.87 g of Compound 3 (29%). The resulting compound was identified by using mass spectroscopy and high-performance liquid chromatography (HPLC) analysis. HRMS(MALDI) calcd. for $C_{75}H_{81}IrN_4SSi_2$: m/z 1318.5350, Found: 1318.5352.

Synthesis Example 4 (Synthesis of Compound 4)

The synthesis of Compound 4 is shown in Scheme 4.

Scheme 4

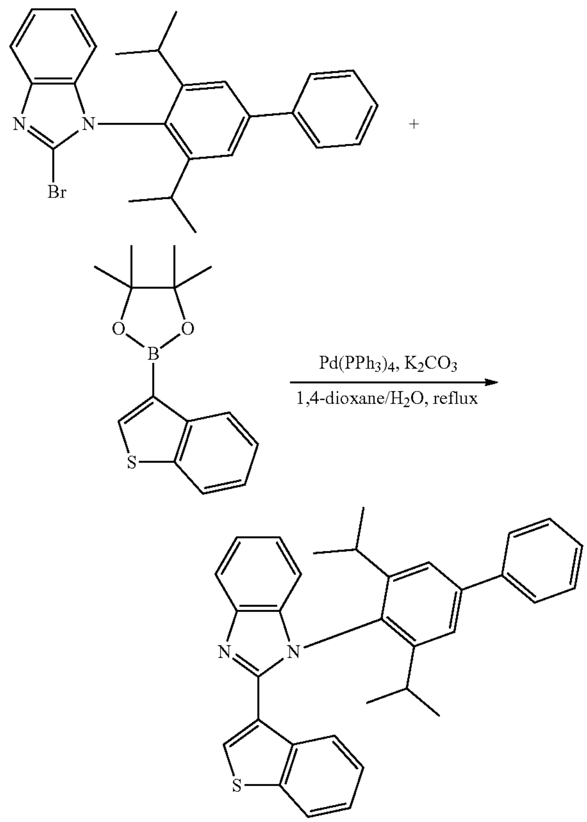

4-4

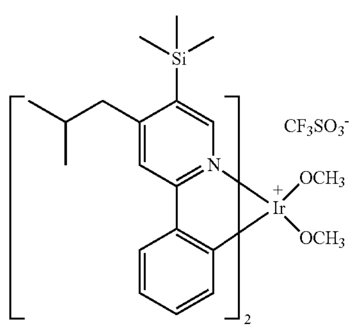

1-3

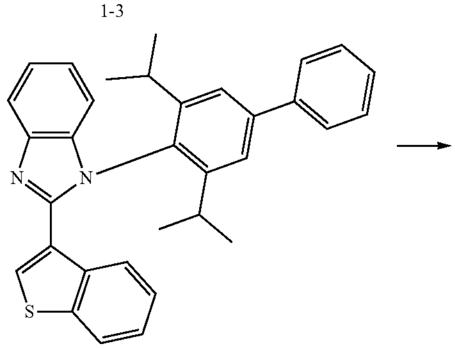

4-4

-continued

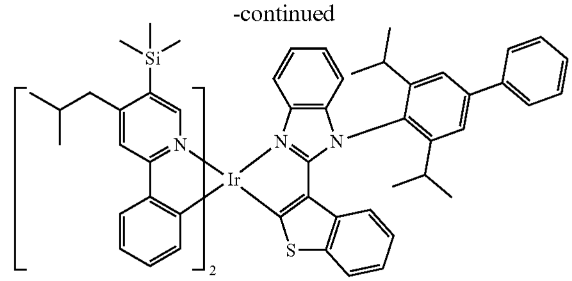

4

Synthesis of Compound 4-4

6.32 g (14.59 mmol) of 2-bromo-1-(3,5-diisopropyl-[1,1'-biphenyl]-4-yl)-1H-benzo[d]imidazole), 3.80 g (14.59 mmol) of 2-(benzo[b]thiophen-3-yl)-4,4,5,5-tetramethyl-1,3,2-dioxaborolane, 0.42 g (0.36 mmol) of $Pd(PPh_3)_4$, and 10.08 g (72.95 mmol) of $K_2CO_3$ were mixed with 80 mL of 1,4-dioxane and 40 mL of distilled water. Then, the mixture was stirred for 18 hours under reflux. Once the temperature was dropped to room temperature, an organic layer was extracted using MC, and anhydrous magnesium sulfate ($MgSO_4$) was added thereto to dry the organic layer. The resultant was filtered, and the solvent in the resulting filtrate was removed under reduced pressure. The residual was purified through column chromatography using EA and hexane at a ratio of 1:3 to thereby obtain 5.33 g of Compound 4-4 (75%).

Synthesis of Compound 4

1.50 g (1.55 mmol) of Compound 1-3 and 0.75 g (1.55 mmol) of Compound 4-4 were mixed with 50 mL of 2-ethoxyethanol and 50 mL of N,N-dimethylformamide. Then, the mixture was stirred under reflux for 18 hours at 120° C. to carry out the reaction. Then, the temperature was dropped. The resulting mixture was filtered to obtain a solid. Then, the solid was sufficiently washed with ethanol and hexane. Then, the solid was purified by column chromatography using EA and hexane at a ratio of 1:50 to thereby obtain 0.40 g of Compound 4 (21%). The resulting compound was identified by using mass spectroscopy and HPLC analysis. HRMS (MALDI) calcd. for $C_{69}H_{77}IrN_4SSi_2$: m/z 1242.5037, Found: 1242.5041.

Synthesis Example 5 (Synthesis of Compound 5)

The synthesis of Compound 5 is shown in Scheme 5.

Scheme 5

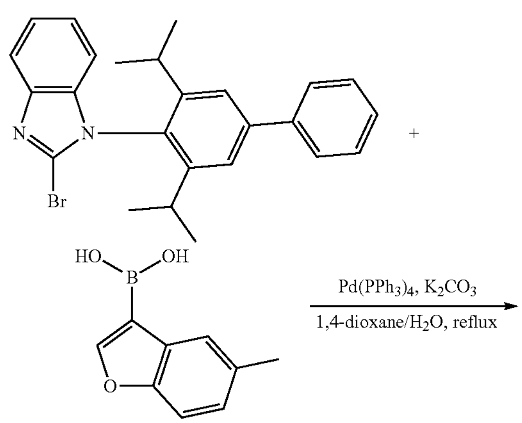

-continued

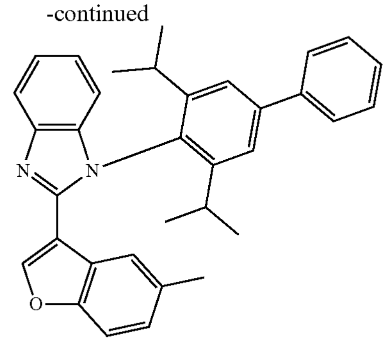

5-4

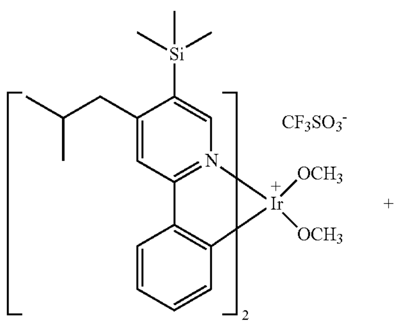

1-3

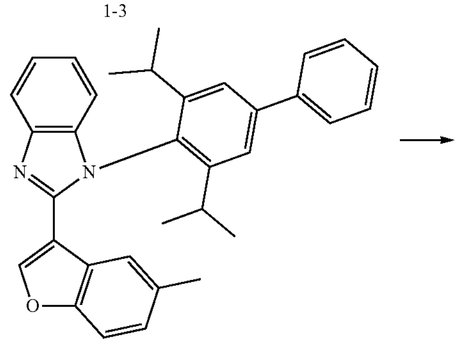

5-4

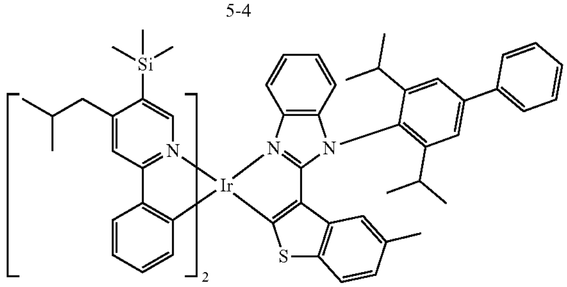

5

Synthesis of Compound 5-4

3.00 g (6.92 mmol) of 2-bromo-1-(3,5-diisopropyl-[1,1'-biphenyl]-4-yl)-1H-benzo[d]imidazole), 1.22 g (6.92 mmol) of (5-methylbenzofuran-3-yl)boronic acid, 0.16 g (0.14 mmol) of $Pd(PPh_3)_4$, and 4.78 g (34.60 mmol) of $K_2CO_3$ were mixed with 80 mL of 1,4-dioxane and 40 mL of distilled water. Then, the mixture was stirred for 18 hours under reflux. Once the temperature was dropped to room temperature, an organic layer was extracted using MC, and anhydrous magnesium sulfate ($MgSO_4$) was added thereto to dry the organic layer. The resultant was filtered, and the solvent in the resulting filtrate was removed under reduced pressure. The residual was purified through column chromatography using EA and hexane at a ratio of 1:3 to thereby obtain 2.92 g of Compound 5-4 (87%).

Synthesis of Compound 5

2.00 g (2.06 mmol) of Compound 1-3 and 1.10 g (2.27 mmol) of Compound 5-4 were mixed with 50 mL of 2-ethoxyethanol and 50 mL of N,N-dimethylformamide. Then, the mixture was stirred under reflux for 18 hours at 120° C. to carry out the reaction. Then, the temperature was dropped. The resulting mixture was filtered to obtain a solid. Then, the solid was sufficiently washed with ethanol and hexane. Then, the solid was purified by column chromatography using EA and hexane at a ratio of 1:50 to thereby obtain 0.89 g of Compound 5 (35%). The resulting compound was identified by using mass spectroscopy and HPLC analysis. HRMS (MALDI) calcd. for $C_{70}H_{79}IrN_4OSi_2$: m/z 1240.5422, Found: 1240.5422.

Synthesis Example 6 (Synthesis of Compound 821)

The synthesis of Compound 821 is shown in Scheme 6.

Scheme 6

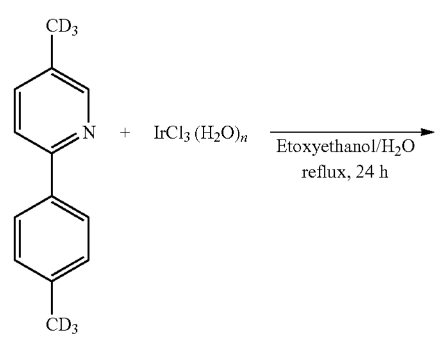

821-1

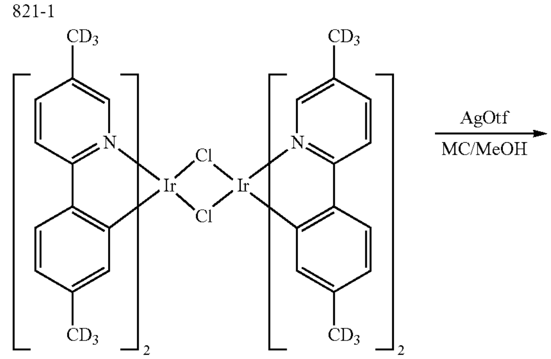

821-2

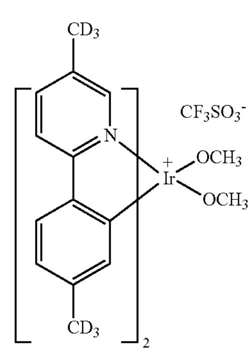

821-3

-continued

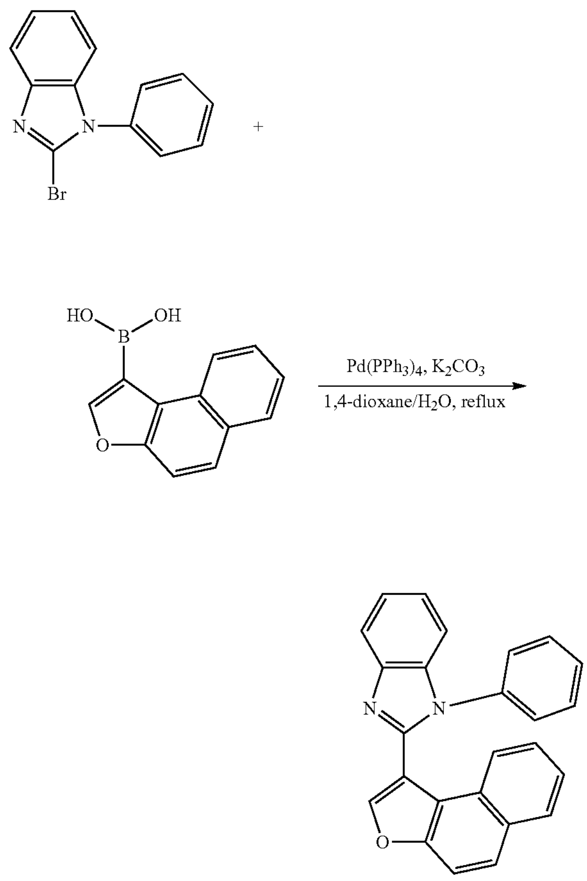

821-4

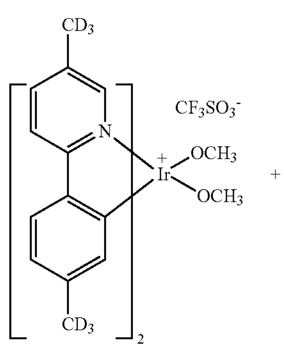

821-3

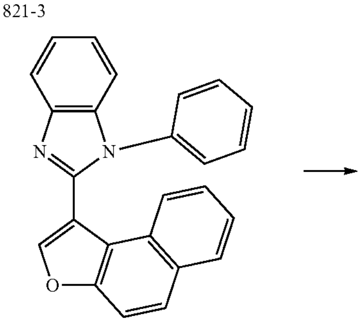

821-4

-continued

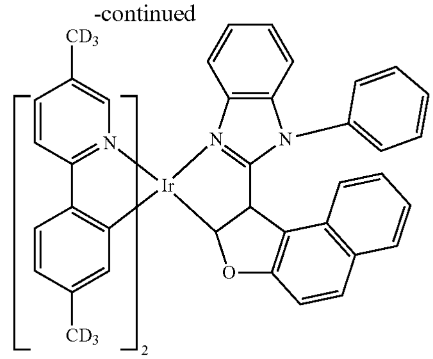

821

Synthesis of Compound 821-2

10 g (52.83 mmol) of Compound 821-1 (5-(methyl-d3)-2-(4-(methyl-d3)phenyl)pyridine) and 8.47 g (24.01 mmol) of iridium chloride were mixed with 90 mL of ethoxyethanol and 30 mL of distilled water. Then, the mixture was stirred under reflux for 24 hours to carry out the reaction, and then the temperature was dropped to room temperature. A solid was formed therefrom and separated by filtration. The solid was sufficiently washed with water, methanol, and hexane in this stated order and dried in a vacuum oven to thereby obtain 12.04 g of Compound 821-2 (83%).

Synthesis of Compound 821-3

45 mL of MC was mixed with 3.00 g (2.48 mmol) of Compound 821-2, and a solution, in which 1.40 g (5.46 mmol) of AgOTf is dissolved in 15 mL of methanol, was added thereto. Then, the mixture was stirred for about 18 hours to carry out a reaction at room temperature while blocking light by using an aluminum foil. The resultant was filtered using diatomaceous earth to remove a solid formed therefrom and filtered under reduced pressure to thereby obtain a solid (Compound 821-3). The solid was used in the following reaction without any further purification.

Synthesis of Compound 821-4

3 g (10.98 mmol) of 2-bromo-1-phenyl-1H-benzo[d]imidazole, 2.33 g (10.98 mmol) of 4-naphtho[2,1-b]furan-1-ylboronic acid, 0.25 g (0.22 mmol) of $Pd(PPh_3)_4$, and 7.59 g (54.90 mmol) of $K_2CO_3$ were mixed with 80 mL of 1,4-dioxane and 40 mL of distilled water. Then, the mixture was stirred for 18 hours under reflux. Once the temperature was dropped to room temperature, an organic layer was extracted using MC, and anhydrous magnesium sulfate ($MgSO_4$) was added thereto to dry the organic layer. The resultant was filtered, and the solvent in the resulting filtrate was removed under reduced pressure. The residual was purified through column chromatography using EA and hexane at a ratio of 1:3 to thereby obtain 2.57 g of Compound 821-4 (65%).

Synthesis of Compound 821

3 g (2.56 mmol) of Compound 821-3 and 1.02 g (2.82 mmol) of Compound 821-4 were mixed with 50 mL of 2-ethoxyethanol and 50 mL of N,N-dimethylformamide. Then, the mixture was stirred under reflux for 18 hours at 120° C. to carry out the reaction. Then, the temperature was dropped. The resulting mixture was filtered to obtain a solid. Then, the solid was sufficiently washed with ethanol and hexane. Then, the solid was purified by column chromatography using EA and hexane at a ratio of 1:50 to thereby obtain 0.74 g of Compound 821 (31%). The resulting compound was identified by using mass spectroscopy and HPLC analysis. HRMS (MALDI) calcd. for $C_{51}H_{27}D_{12}IrN_4O$: m/z 928.3506, Found: 928.3504.

Synthesis Example 7 (Synthesis of Compound 822)

The synthesis of Compound 822 is shown in Scheme 7.

Scheme 7

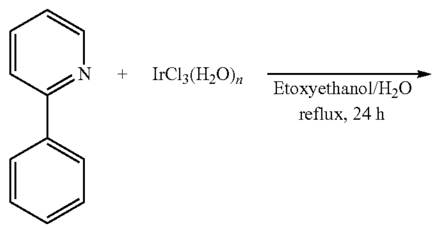

822-1

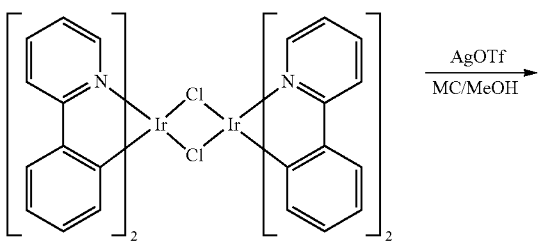

822-2

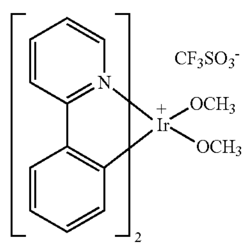

822-3

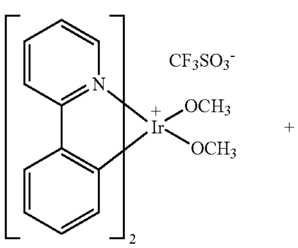

822-3

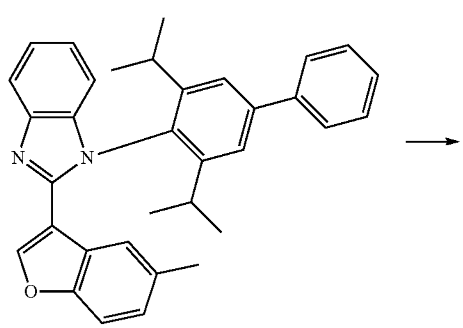

2-4

-continued

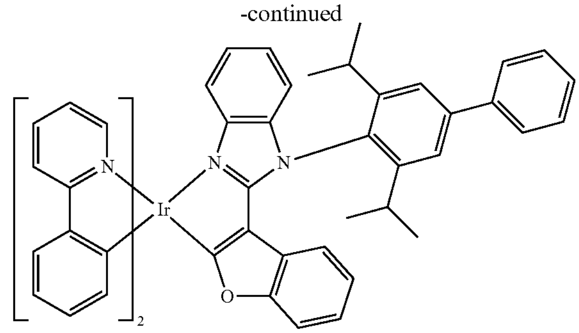

822

Synthesis of Compound 822-2

5 g (32.22 mmol) of Compound 822-1 (2-phenylpyridine) and 5.17 g (14.65 mmol) of iridium chloride were mixed with 90 mL of ethoxyethanol and 30 mL of distilled water. Then, the mixture was stirred while refluxing for about 24 hours to carry out a reaction, and then the temperature was dropped to room temperature. A solid was formed therefrom and separated by filtration. The solid was sufficiently washed with water, methanol, and hexane in this stated order and dried in a vacuum oven to thereby obtain 5.50 g of Compound 822-2 (70%).

Synthesis of Compound 822-3

45 mL of MC was mixed with 3.00 g (2.80 mmol) of Compound 822-2, and a solution, in which 1.29 g (5.02 mmol) of AgOTf is dissolved in 15 mL of methanol, was added thereto. Then, the mixture was stirred for about 18 hours to carry out a reaction at room temperature while blocking light by using an aluminum foil. The resultant was filtered using diatomaceous earth to remove a solid formed therefrom and filtered under reduced pressure to thereby obtain a solid (Compound 822-3). The solid was used in the following reaction without any further purification.

Synthesis of Compound 822

2 g (2.80 mmol) of Compound 822-3 and 1.45 g (3.08 mmol) of Compound 2-4 were mixed with 50 mL of 2-ethoxyethanol and 50 mL of N,N-dimethylformamide. Then, the mixture was stirred under reflux for 18 hours at 120° C. to carry out the reaction. Then, the temperature was dropped. The resulting mixture was filtered to obtain a solid. Then, the solid was sufficiently washed with ethanol and hexane. Then, the solid was purified by column chromatography using EA and hexane at a ratio of 1:50 to thereby obtain 0.54 g of Compound 822 (20%). The resulting compound was identified by using mass spectroscopy and HPLC analysis. HRMS (MALDI) calcd. for $C_{55}H_{45}IrN_4O$: m/z 970.3223, Found: 970.3227.

Synthesis Example 8 (Synthesis of Compound 767)

The synthesis of Compound 767 is shown in Scheme 8.

The resulting compound was identified by using mass spectroscopy and HPLC analysis. HRMS (MALDI) calcd. for $C_{73}H_{71}IrN_4O_2S_2$: m/z 1292.4648, Found: 1292.4644.

Scheme 8

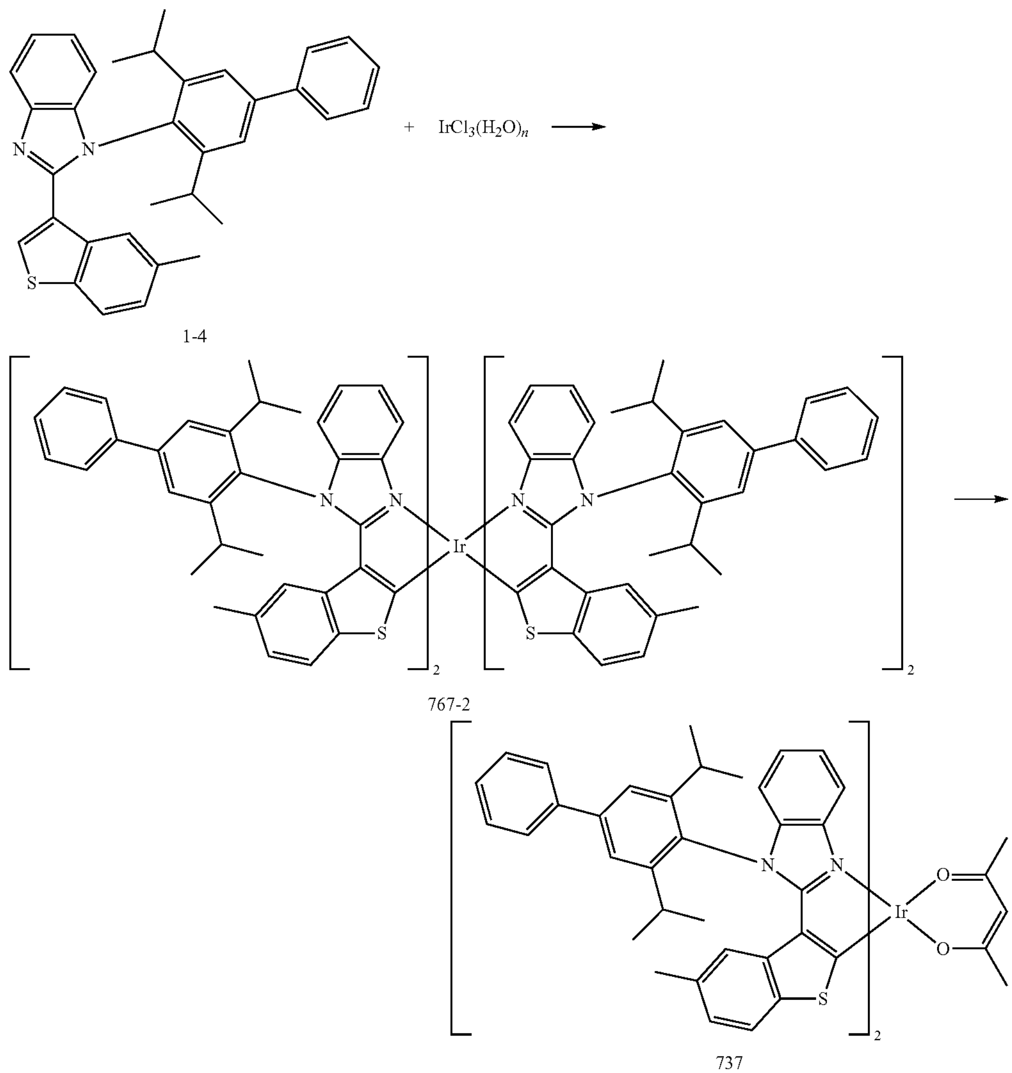

Synthesis of Compound 767-2

5 g (9.99 mmol) of Compound 1-4 and 1.76 g (5.00 mmol) of iridium chloride were mixed with 90 mL of ethoxyethanol and 30 mL of distilled water. Then, the mixture was stirred under reflux for 24 hours to carry out the reaction, and then the temperature was dropped to room temperature. A solid was formed therefrom and separated by filtration. The solid was sufficiently washed with water, methanol, and hexane in this stated order and dried in a vacuum oven to thereby obtain 4.91 g of Compound 767-2(80%).

Synthesis of Compound 767

4 g (1.63 mmol) of Compound 767-2 and 1.80 g (18 mmol) of acetylacetone, and 2.49 g (18 mmol) of $K_2CO_3$ were added to 60 mL of 2-ethoxyethanol, followed by stirring at room temperature for 24 hours. The resulting solid product was removed therefrom by filtration, followed by performing column chromatography using ethyl acetate and hexane to thereby obtain 0.63 g of Compound 767 (30%).

Example 1

A glass substrate, on which ITO is patterned as an anode, was cut to a size of 50 millimeters (mm)×50 mm×0.5 mm, sonicated in isopropyl alcohol and water for 5 minutes each, and cleaned by exposure to ultraviolet rays and ozone for 30 minutes. Subsequently, the glass substrate was mounted on a vacuum-deposition device.

Compound HT3 and Compound F6-TCNNQ were co-vacuum-deposited on the anode at a weight ratio of 98:2 to form a hole injection layer having a thickness of 100 Å. Compound HT3 was then vacuum-deposited on the hole injection layer to form a hole transport layer having a thickness of 1,650 Å.

Subsequently, Compound CBP (as a host) and Compound 1 (as a dopant) were co-deposited on the hole transport layer at a weight ratio of 95:5 to form an emission layer having a thickness of 400 Å.

Compound ET3 and Compound ET-D1 were co-deposited at a volume ratio of 50:50 on the emission layer to form an electron transport layer having a thickness of 350 Å, Compound ET-D1 was deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

HT3

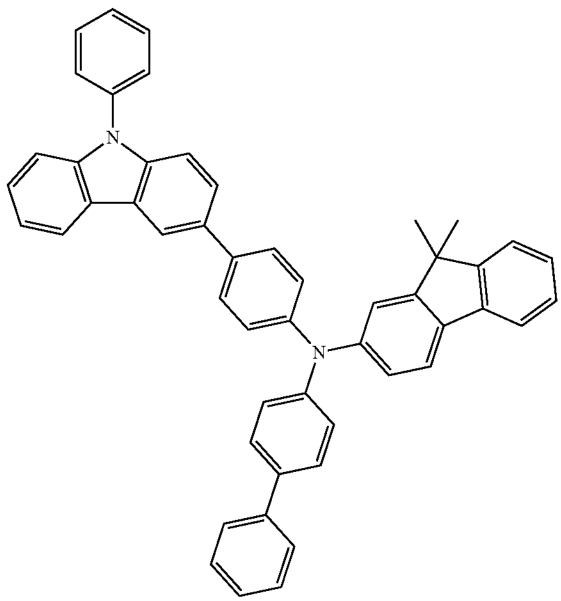

F6-TCNNQ

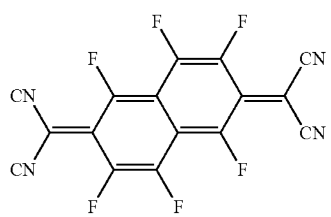

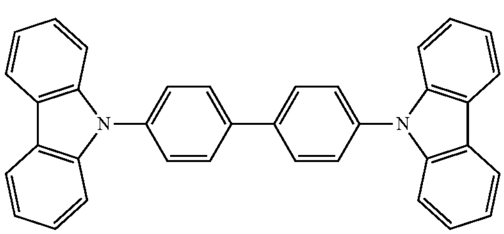

CBP

-continued

ET3

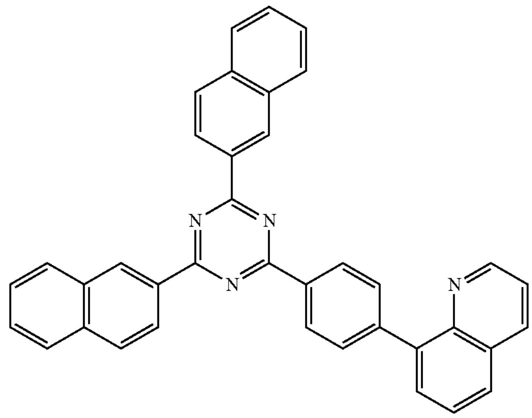

ET-D1

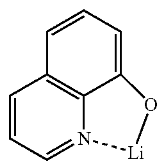

Examples 2 to 7 and Comparative Example A

Organic light-emitting devices were manufactured in substantially the same manner as in Example 1, except that the compounds shown in Table 2 were used instead of Compound 1 as a dopant in the formation of an emission layer.

Evaluation Example 1

The driving voltage (V), the maximum external quantum efficiency (Max EQE, %), and the roll-off ratio (%) of the organic light-emitting devices manufactured in Examples 1 to 7 and Comparative Example A were evaluated. The evaluation results are shown in Table 2. A Keithley 2400 current voltmeter and a luminance meter (Minolta Cs-1000A) were used in evaluation. The roll-off ratio was calculated by Equation 20. The max EQE in Table 2 are shown in relative values (%).

$$\text{Roll-off ratio}=\{1-(\text{efficiency(at 8,000 nit)/maximum luminescence efficiency})\}\times 100\% \qquad \text{Equation 20}$$

TABLE 2

| | Dopant in emission layer | Driving voltage (V) | Max EQE (relative value, %) | Roll-off ratio (%) |
|---|---|---|---|---|
| Example 1 | 1 | 4.1 | 100 | 13 |
| Example 2 | 2 | 4.1 | 83 | 18 |
| Example 3 | 3 | 3.9 | 96 | 14 |
| Example 4 | 4 | 4.0 | 100 | 14 |
| Example 5 | 5 | 4.2 | 87 | 18 |
| Example 6 | 821 | 4.3 | 74 | 20 |
| Example 7 | 822 | 4.3 | 78 | 15 |
| Comparative Example A | A | 4.6 | 65 | 25 |

TABLE 2-continued

| | Dopant in emission layer | Driving voltage (V) | Max EQE (relative value, %) | Roll-off ratio (%) |
|---|---|---|---|---|

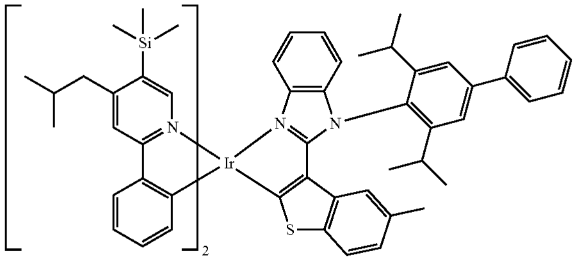

1

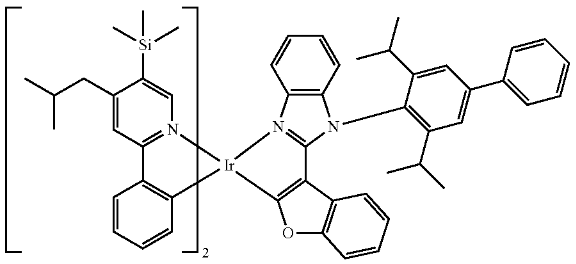

2

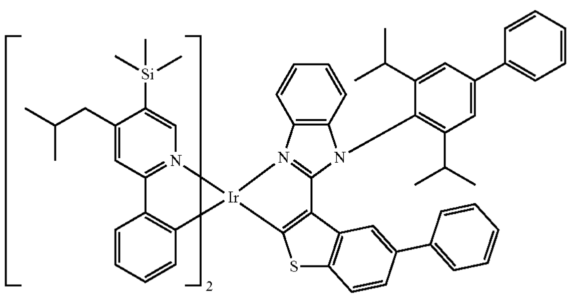

3

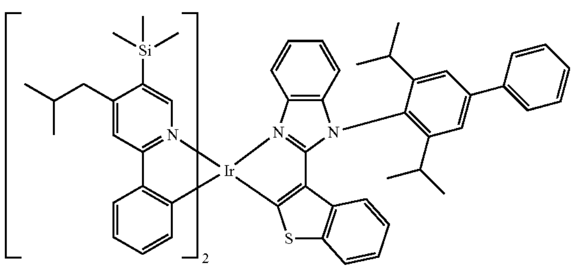

4

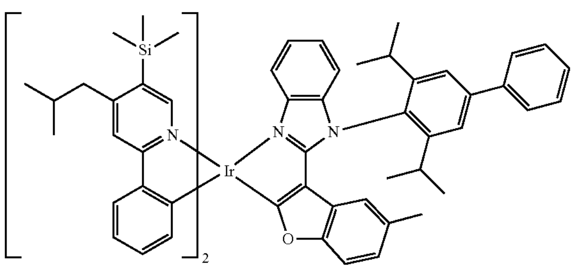

5

TABLE 2-continued

| | Dopant in emission layer | Driving voltage (V) | Max EQE (relative value, %) | Roll-off ratio (%) |
|---|---|---|---|---|

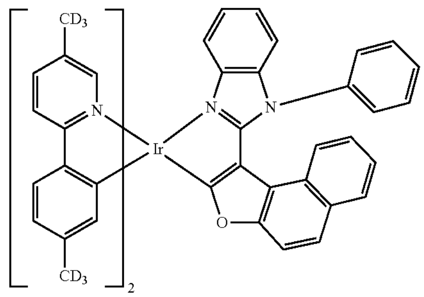

821

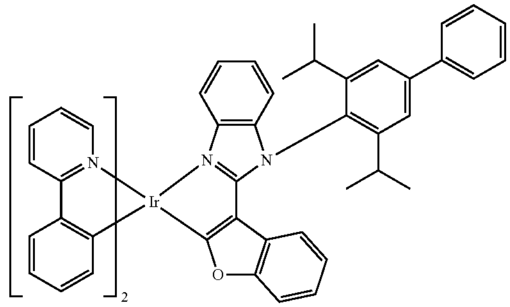

822

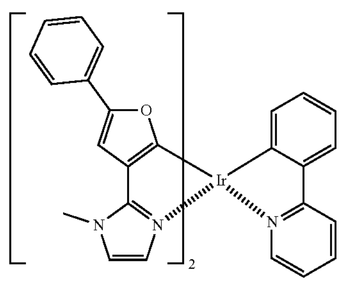

A

Referring to Table 2, the organic light-emitting devices of Examples 1 to 7 were found to have improved driving voltage, improved external quantum efficiency, and improved roll-off ratio, as compared with the organic light-emitting device of Comparative Example A.

Example 8 and Comparative Example B

Organic light-emitting devices were manufactured in substantially the same manner as in Example 1, except that the compounds shown in Table 3 were used instead of Compound 1 as a dopant in the formation of an emission layer.

Evaluation Example 2

The driving voltage (V), the Max EQE (%), and the roll-off ratio (%) of the organic light-emitting devices manufactured in Example 8 and Comparative Example B were evaluated in substantially the same manner as in Evaluation Example 1. The evaluation results are shown in Table 3. The Max EQE in Table 3 are shown in relative values (%).

TABLE 3

| | Dopant in emission layer | Driving voltage (V) | Max EQE (relative value, %) | Roll-off ratio (%) |
|---|---|---|---|---|
| Example 8 | 767 | 4.5 | 100 | 23 |
| Comparative Example B | B | 4.8 | 84 | 29 |

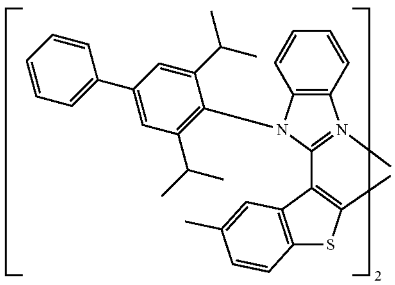

767

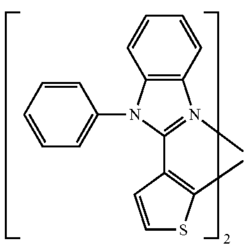

B

Referring to Table 3, the organic light-emitting device of Example 8 was found to have improved driving voltage, improved external quantum efficiency, and improved roll-off ratio, as compared with the organic light-emitting device of Comparative Example B.

As apparent from the foregoing description, the organometallic compound may have excellent electrical characteristics, and thus, an electronic device, e.g., an organic light-emitting device, including the organometallic compound may have improved driving voltage, improved external quantum efficiency, and/or improved roll-off ratio characteristics.

It should be understood that the exemplary embodiments described herein should be considered in a descriptive sense only and not for purposes of limitation. Descriptions of features or aspects within each exemplary embodiment should be considered as an available feature or aspect of other exemplary embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound, represented by Formula 1:

Formula 1

$$M(L_1)_{n1}(L_2)_{n2} \qquad \text{Formula 1}$$

wherein, in Formula 1,

M is a transition metal, $L_1$ is a ligand represented by Formula 2, n1 is 1, 2, or 3, and when n1 is 2 or greater, at least two $L_1$ groups are identical to or different from each other, $L_2$ is a monodentate ligand, a bidentate ligand, a tridentate ligand, or a tetradentate ligand, n2 is 0, 1, 2, 3, or 4, and when n2 is 2 or greater, at least two $L_2$ groups are identical to or different from each other, and $L_1$ is different from $L_2$, Formula 2

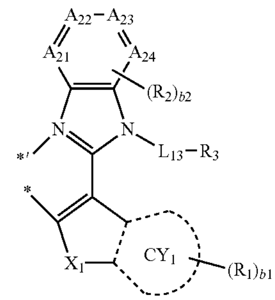

wherein, in Formula 2, $A_{21}$ to $A_{24}$ are each independently N or C, $X_1$ is O or S, $L_{13}$ is a divalent group that is a benzene group, a naphthalene group, a pyridine group, a dibenzofuran group, a dibenzothiophene group, or a carbazole group, each substituted with at least two $R_{10b}$, wherein each $R_{10b}$ is independently deuterium, —F, a cyano group, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, or a substituted or unsubstituted $C_1$-$C_{60}$ heteroaryl group, ring $CY_1$ is a $C_5$-$C_{30}$ carbocyclic group or a $C_1$-$C_{30}$ heterocyclic group, $R_2$ is hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, $R_1$ is each independently deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), $R_3$ is deuterium, —F, a cyano group, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, or a substituted or unsubstituted $C_1$-$C_{60}$ heteroaryl group, b1 is an integer from 0 to 20, b2 is an integer from 0 to 4, at least two groups from a plurality of $R_1$ groups are optionally bonded together to form a $C_5$-$C_{30}$ carbocyclic group unsubstituted or substituted with at least one $R_{10a}$, or at least two groups from a plurality of $R_1$ groups are optionally bonded together to form a $C_1$-$C_{30}$ heterocyclic group unsubstituted or substituted with at least one $R_{10a}$, at least two groups from a plurality of R2 groups are optionally bonded together to form a $C_5$-$C_{30}$ carbocyclic group unsubstituted or substituted with at least one $R_{10a}$, or at least two groups from a plurality of R2 groups are optionally bonded together to form a $C_1$-$C_{30}$ heterocyclic group unsubstituted or substituted with at least one $R_{10a}$, $R_1$ and $R_2$ are optionally bonded to each other to form a $C_5$-$C_{30}$ carbocyclic group unsubstituted or substituted with at least one $R_{10a}$, or $R_1$ and $R_2$ are optionally bonded to each other to form a $C_1$-$C_{30}$ heterocyclic group unsubstituted or substituted with at least one $R_{10a}$, $R_{10a}$ is as defined for $R_1$,

* and *' each indicate a bonding site to M in Formula 1, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group are each independently:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group, a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group, and wherein a group represented by

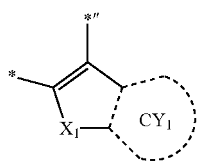

in Formula 2 is represented by one of Formulae 2(5) to 2(13), each optionally substituted with one or more $R_1$:

2(5)

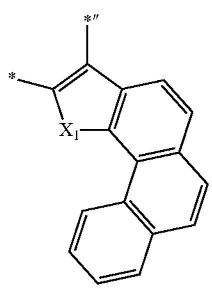

2(6)

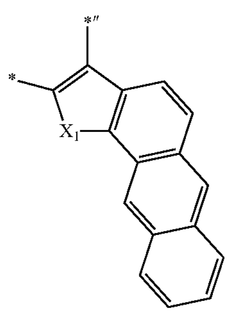

2(7)

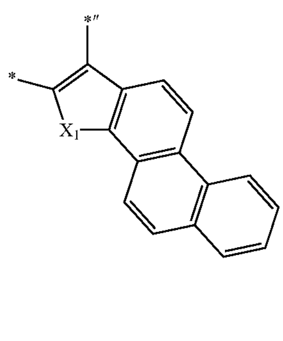

-continued

2(8)

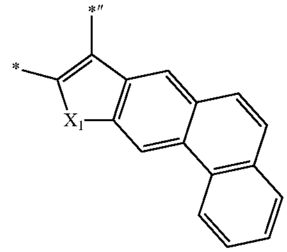

2(9)

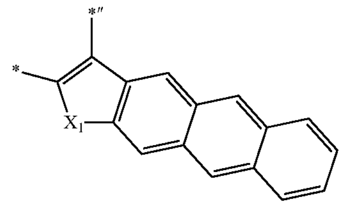

2(10)

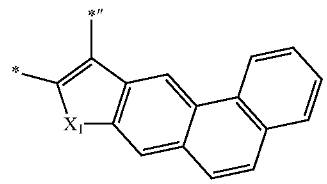

2(11)

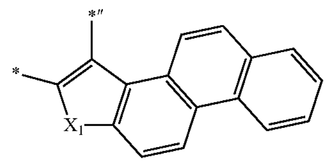

2(12)

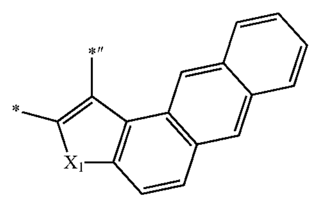

2(13)

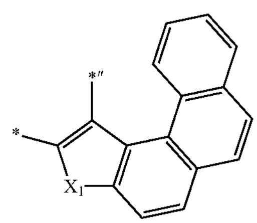

wherein in Formulae 2(5) to 2(13), $X_1$ is O or S,

* indicates a bonding site to M in Formula 1, and

*" indicates a bonding site to an adjacent carbon atom.

2. The organometallic compound of claim 1, wherein, if $L_2$ in Formula 1 is a group represented by Formula 3A, then ring $CY_1$ is a cyclopentane group, a cyclohexane group, a cycloheptane group, a cyclopentene group, a cyclohexene group, a cycloheptene group, an adamantane group, a norbornane group, a norbornene group, a bicyclo[1.1.1]pentane group, a bicyclo[2.1.1]hexane group, a bicyclo[2.2.2]octane group, a benzene group, a naphthalene group, an anthracene group, a phenanthrene group, a triphenylene group, a pyrene group, a chrysene group, a 1,2,3,4-tetrahydronaphthalene group, a pyrrole group, borole group, a phosphole group, a cyclopentadiene group, a silole group, a germole group, a thiophene group, a selenophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophenegroup, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a benzoquinoline group, a benzoisoquinoline group, a quinoxaline group, a quinazoline group, a phenanthroline group, a pyrazole group, an imidazole group, a triazole group, an azaborole group, an azaphosphole group, an azacyclopentadiene group, an azasilole group, an azagermole group, an azaselenophene group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

3. The organometallic compound of claim 1, wherein $R_2$ is:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, a $C_1$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), wherein $Q_1$ to $Q_9$ are each independently:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or a combination thereof, and wherein $R_1$ is:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), and $R_3$ is:

deuterium, —F, a cyano group, a $C_1$-$C_{20}$ alkyl group;

a $C_1$-$C_{20}$ alkyl group substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), wherein $Q_1$ to $Q_9$ are each independently:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or a combination thereof.

4. The organometallic compound of claim 1, wherein $R_2$ is hydrogen, deuterium, —F, a cyano group, a substituted or unsubstituted $C_1$-$C_{60}$ alkyl group, a substituted or unsubstituted $C_3$-$C_{10}$ cycloalkyl group, —Si($Q_3$)($Q_4$)($Q_5$), or —Ge($Q_3$)($Q_4$)($Q_5$), and $R_3$ is a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_6$-$C_{60}$ aryloxy group, or a substituted or unsubstituted $C_1$-$C_{60}$ heteroaryl group.

5. The organometallic compound of claim 1, wherein, if $L_2$ in Formula 1 is a group represented by Formula 3A,

3A

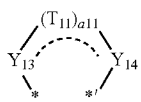

wherein $Y_{13}$ is O, N, N($Z_1$), P($Z_1$)($Z_2$), or As($Z_1$)($Z_2$); $Y_{14}$ is O, N, N($Z_3$), P($Z_3$)($Z_4$), or As($Z_3$)($Z_4$); $T_{11}$ is a single bond, a double bond, *—C($Z_{11}$)($Z_{12}$)—*'*—C($Z_{11}$)═C($Z_{12}$)—*'*═C($Z_{11}$)—*', *—C($Z_{11}$)═*', *═C($Z_{11}$)-C($Z_{12}$)═C($Z_{13}$)—*', *—C($Z_{11}$)═C($Z_{12}$)-C($Z_{13}$)═** *—N($Z_{11}$)—*', or a $C_5$-$C_{30}$ carbocyclic group unsubstituted or substituted with at least one $Z_{11}$; a11 is an integer from 1 to 10, and when a11 is 2 or greater, at least two $T_{11}$ groups is identical to or different from each other; and $Z_1$ to $Z_4$ and $Z_{11}$ to $Z_{13}$ are each independently the same as defined in connection with $R_1$ in Formula 2, then a group represented by:

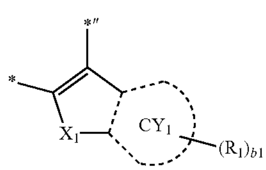

in Formula 2 is represented by one of Formulae 2-53 to 2-57:

2-53

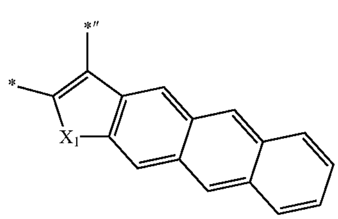

-continued 2-54

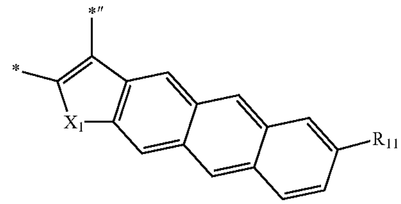

2-55

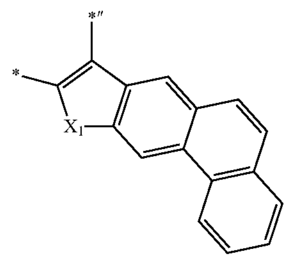

2-56

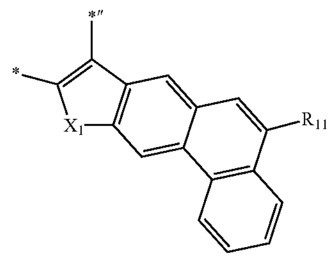

2-57

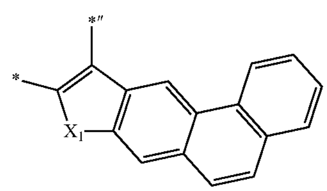

wherein, in Formulae 2-53 to 2-57, $R_{11}$ is as defined for $R_1$,

* indicates a bonding site to M in Formula 1, and

*" indicates a bonding site to an adjacent carbon atom.

6. The organometallic compound of claim 1, wherein $L_2$ in Formula 1 is a group represented by 3-1:

3-1

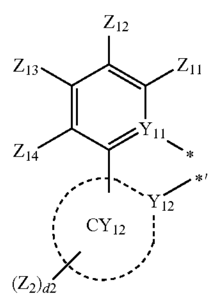

wherein in Formula 3-1, $Y_{11}$ and $Y_{12}$ are each independently C or N, ring $CY_{12}$ is a $C_5$-$C_{30}$ carbocyclic group or a $C_1$-$C_{30}$ heterocyclic group, $Z_2$ and $Z_{11}$ to $Z_{14}$ are as defined for $R_2$, d2 is an integer from 0 to 20,

*and *' each indicate a bonding site to M in Formula 1, and at least one of $Z_2$, $Z_{11}$, $Z_{12}$, $Z_{13}$, or $Z_{14}$ in Formula 3-1 is each independently:

deuterium;

—$Si(Q_3)(Q_4)(Q_5)$;

—$Ge(Q_3)(Q_4)(Q_5)$; or a $C_1$-$C_{60}$ alkyl group substituted with at least one deuterium.

7. The organometallic compound of claim 6, wherein $Z_{12}$ in Formula 3-1 is —$Si(Q_3)(Q_4)(Q_5)$ or —$Ge(Q_3)(Q_4)(Q_5)$, and $Z_{13}$ is not hydrogen or a methyl group.

8. The organometallic compound of claim 6, wherein a group represented by

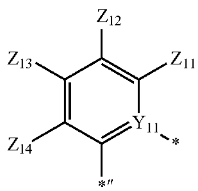

in Formula 3-1 is represented by one of Formulae 3-1-1 to 3-1-16, and a group represented by

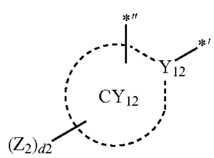

in Formula 3-1 is represented by one of Formulae 3-1(1) to 3-1(16):

3-1-1

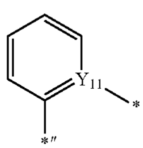

3-1-2

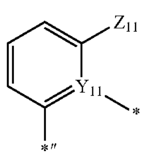

3-1-3

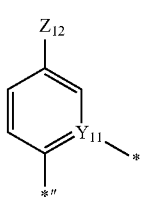

3-1-4

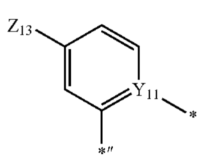

-continued 3-1-5

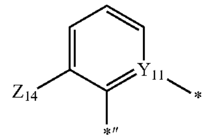

3-1-6

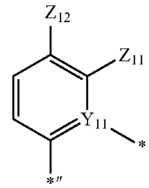

3-1-7

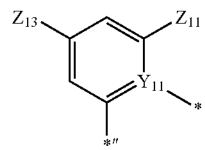

3-1-8

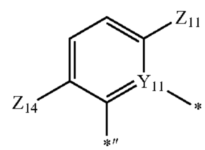

3-1-9

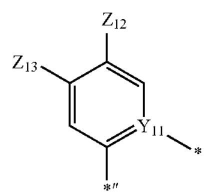

3-1-10

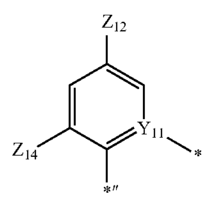

3-1-11

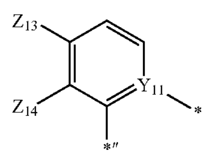

3-1-12

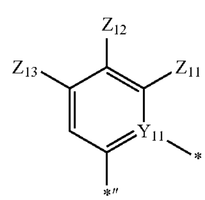

3-1-13

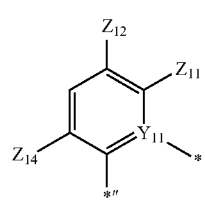

-continued
3-1-14
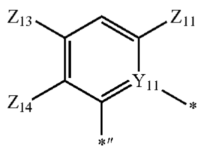
3-1-15
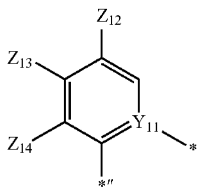
3-1-16
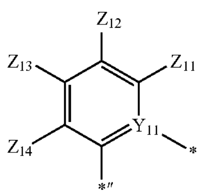
3-1(1)
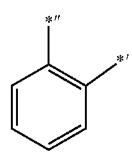
3-1(2)
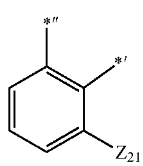
3-1(3)
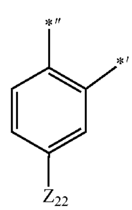
3-1(4)
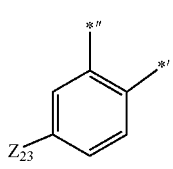
3-1(5)
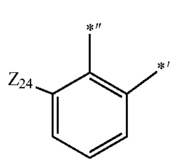
-continued
3-1(6)
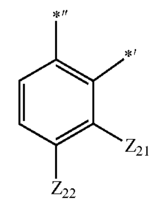
3-1(7)
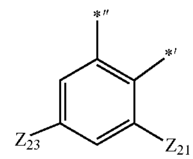
3-1(8)
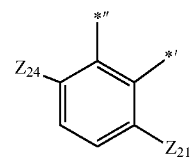
3-1(9)
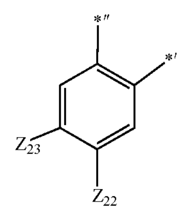
3-1(10)
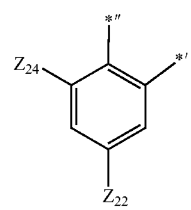
3-1(11)
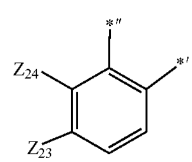
3-1(12)
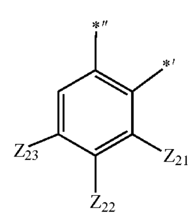
3-1(13)
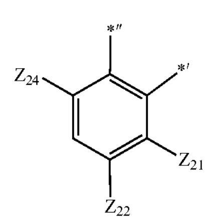

-continued 3-1(14)

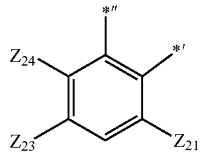

3-1(15)

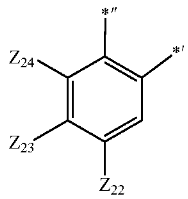

3-1(16)

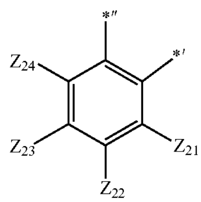

wherein, in Formulae 3-1-1 to 3-1-16 and 3-1(1) to 3-1(16), $Z_{21}$ to $Z_{24}$ are each as defined for $Z_2$, wherein $Z_{11}$ to $Z_{14}$ and $Z_{21}$ to $Z_{24}$ are not hydrogen,

*and *' each indicate a bonding site to M in Formula 1, and

*" indicates a bonding site to an adjacent atom.

9. The organometallic compound of claim 1, comprising: at least one deuterium atom.

10. An organic light-emitting device, comprising:

a first electrode;

a second electrode; and an organic layer disposed between the first electrode and the second electrode and comprising an emission layer;

wherein the organic layer comprises at least one organometallic compound of claim 1.

11. The organic light-emitting device of claim 10, wherein the first electrode is an anode, the second electrode is a cathode, and the organic layer further comprises a hole transport region disposed between the first electrode and the emission layer and an electron transport region disposed between the emission layer and the second electrode, the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

12. The organic light-emitting device of claim 10, wherein the emission layer comprises the at least one organometallic compound.

13. An electronic apparatus, comprising the organic light-emitting device of claim 12.

* * * * *